United States Patent
Bowen

(10) Patent No.: US 6,691,301 B2
(45) Date of Patent: Feb. 10, 2004

(54) SYSTEM, METHOD AND ARTICLE OF MANUFACTURE FOR SIGNAL CONSTRUCTS IN A PROGRAMMING LANGUAGE CAPABLE OF PROGRAMMING HARDWARE ARCHITECTURES

(75) Inventor: Matt Bowen, Littlemore (GB)

(73) Assignee: Celoxica Ltd., Abingdon (GB)

( * ) Notice: Subject to any disclaimer, the term of this patent is extended or adjusted under 35 U.S.C. 154(b) by 336 days.

(21) Appl. No.: 09/772,616

(22) Filed: Jan. 29, 2001

(65) Prior Publication Data

US 2003/0046671 A1 Mar. 6, 2003

(51) Int. Cl.[7] ................................................ G06F 9/45
(52) U.S. Cl. ........................ 717/114; 716/16; 712/15
(58) Field of Search ................................ 717/114, 116, 717/153; 713/400, 501, 600; 716/16; 712/15

(56) References Cited

U.S. PATENT DOCUMENTS

| | | | | |
|---|---|---|---|---|
| 4,241,418 A | * | 12/1980 | Stanley ........................ 713/501 |
| 5,659,484 A | * | 8/1997 | Bennett et al. ................ 716/16 |
| 5,778,237 A | * | 7/1998 | Yamamoto et al. ......... 713/322 |
| 5,802,290 A | * | 9/1998 | Casselman .................. 709/201 |
| 5,996,083 A | * | 11/1999 | Gupta et al. ................ 713/322 |
| 6,308,311 B1 | * | 10/2001 | Carmichael et al. .......... 716/16 |
| 6,345,384 B1 | * | 2/2002 | Sato ........................... 717/160 |
| 6,412,061 B1 | * | 6/2002 | Dye ............................ 712/32 |
| 6,560,665 B1 | * | 5/2003 | Resler et al. ............... 710/305 |
| 6,567,837 B1 | * | 5/2003 | Robinson ....................... 709/1 |
| 6,587,385 B2 | * | 7/2003 | Ooishi ........................ 365/191 |
| 2001/0003844 A1 | * | 6/2001 | Cliff et al. .................... 716/16 |
| 2003/0028690 A1 | * | 2/2003 | Appleby-Alis et al. ........ 710/8 |

* cited by examiner

Primary Examiner—John Chavis
(74) Attorney, Agent, or Firm—Carlton Fields, P.A.

(57) ABSTRACT

A system, method and article of manufacture are provided for using a dynamic object in a programming language. In general, an object is defined with an associated first value and second value. The first value is used in association with the object during a predetermined clock cycle. The second value is used in association with the object before or after the predetermined clock cycle.

18 Claims, 117 Drawing Sheets

5700

| ROM entry | Value | ROM entry | Value |
|---|---|---|---|
| b [0] [0] [0] | 1 | b [0] [0] [1] | 2 |
| b [0] [1] [0] | 3 | b [0] [1] [1] | 4 |
| b [1] [0] [0] | 5 | b [1] [0] [1] | 6 |
| b [1] [1] [0] | 7 | b [1] [1] [1] | 8 |
| b [2] [0] [0] | 9 | b [2] [0] [1] | 10 |
| b [2] [1] [0] | 11 | b [2] [1] [1] | 12 |
| b [3] [0] [0] | 13 | b [3] [0] [1] | 14 |
| b [3] [1] [0] | 15 | b [3] [1] [1] | 16 |

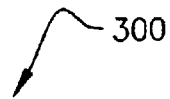

| Workspace window | The area where you organise your projects. A project consists of all the files you need, plus information about what target you are compiling for. When you have assembled all the information that you need for a project, you can compile it. When you start Handel-C, the default position of the workspace window is on the left. |
|---|---|
| Code editor | Where you create and edit Handel-C source files. When you create or open a file, the default position of the code editor window is on the right. |
| Output window | When you compile a file, error messages and warnings are displayed in the output window. The default position of the output window is at the bottom of the screen. The output window has tabs for build messages and debug messages. |
| Debug windows | When your file has compiled, you can simulate it. The simulation steps the program through clock cycles, and allows you to look at the contents of any variables that are in scope. These are displayed in the Variables window.<br><br>You can select variables to display in the debug Watch window. The default position of the watch window is the bottom left-hand corner of the screen.<br><br>The call stack (the route by which you have called a function) is displayed in the Call Stack window.<br><br>You can see clock cycles in the Clocks window and current executing threads in the Threads window. |

| a chip☐, system☐ or board☐ | Not targeted to a particular system or product |
|---|---|
| a core☐ | A discrete piece of code, compiled to a specific architecture, that may be used as part of a larger design |
| a library☐ | Pre-compiled Handel-C code that may be re-used or sold elsewhere |
| a pre-defined chip, system or board | Targeted to a known product. These systems will be optimised for that product, and should only be placed and route onto that product. |

FIG.6

| Tab | Item | Meaning | Value | Default |
|---|---|---|---|---|
| General | | | | |
| | Intermediate files | The sub-directory where intermediate files are stored | Directory path name relative to the project directory | configuration name |
| | Output files | The sub-directory where the final output is stored (.dll, netlist etc.) | Directory path name relative to the project directory | configuration name |
| Chip | | | | |
| | Family | The family containing the part you are targeting | Select family from drop-down list | As required |
| | Part | The part number you are targeting | Type in part number | Depends on project |

FIG. 9A

| Preprocessor | | | | |
|---|---|---|---|---|
| | Preprocessor definitions(-D) | Equivalent to the #define directive | Set as required | DEBUG NDEBUG, SIMULATE |
| | Additional include directories (-I) | Add directories to the search path for include directories | Set as required | None |
| | Additional preprocessor options (-cpp) | Add any cpp commands | See the pre-processor manual | None |
| Compiler | | | | |
| | Generate debug information (-g) | Get the compiler to produce information for the debugger | Check for Yes | Checked |
| | Generate warning messages (-W) | Get the compiler to produce warning messages | Check for Yes | Checked |
| | Generate estimation information (-e) | Get the compiler to generate HTML files giving depth and timing information | Check for Yes | Unchecked |
| Optimisations | | | | |
| | Various levels of optimizations | Check as needed | Depends on target | |
| Linker | | | | |
| | Output format | Select the target for the compiler | Determined by target settings | As required |
| | Save browse info | Store information needed to browse symbols | Checked | Checked |
| | Additional Library Path | Directory path to search for libraries | Set as required | |
| | Command line for building simulator Dll (-cl) | Directory path to search for libraries | Define how the C compiler is called to compile simulator .dll | Installed all, of settings. (Debug and Release only) |
| | Object library modules | Specify modules to include in build | Set as required | |
| Debugger | | | | |
| | Working directory | Directory that the simulator uses as the current working directory | Directory path name relative to the project directory | Defaults to current project directory(.) |
| Build commands | | | | |
| | Compilation commands | Not yet implemented | | None |

FIG. 9B  ↙900

| | Output files | Not yet implemented | | None |

900

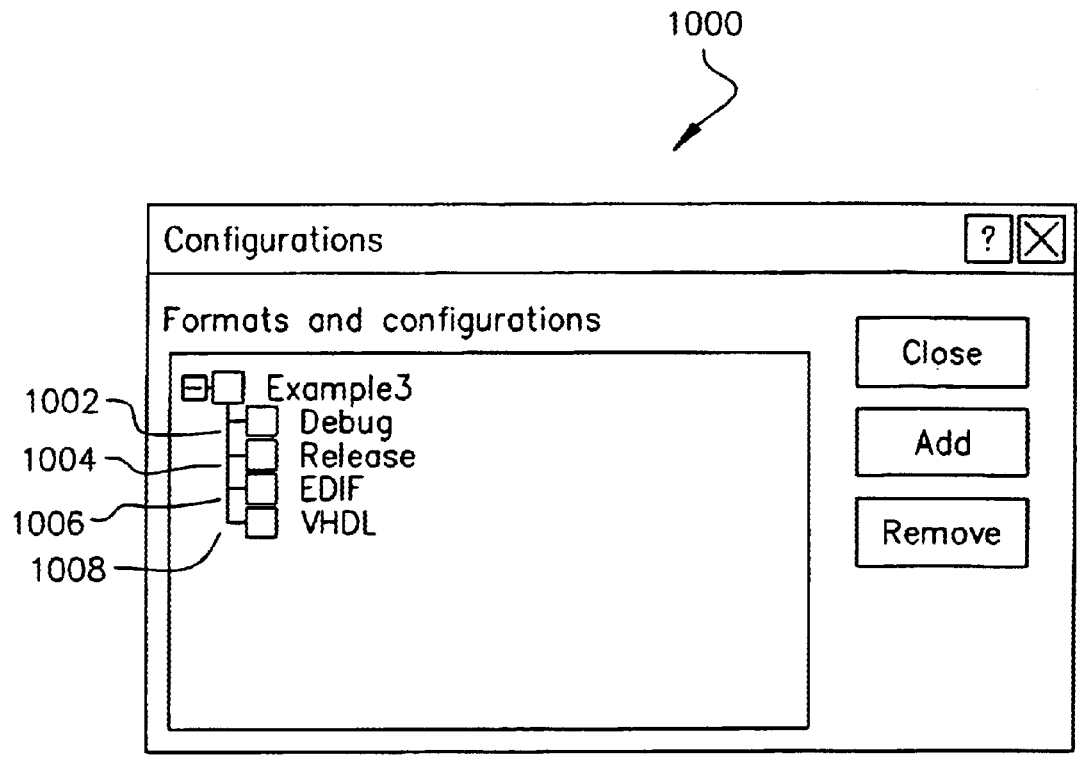
Enter a name for your new configuration, and select the configuration type that you wish to use as a base in the Copy settings from box.
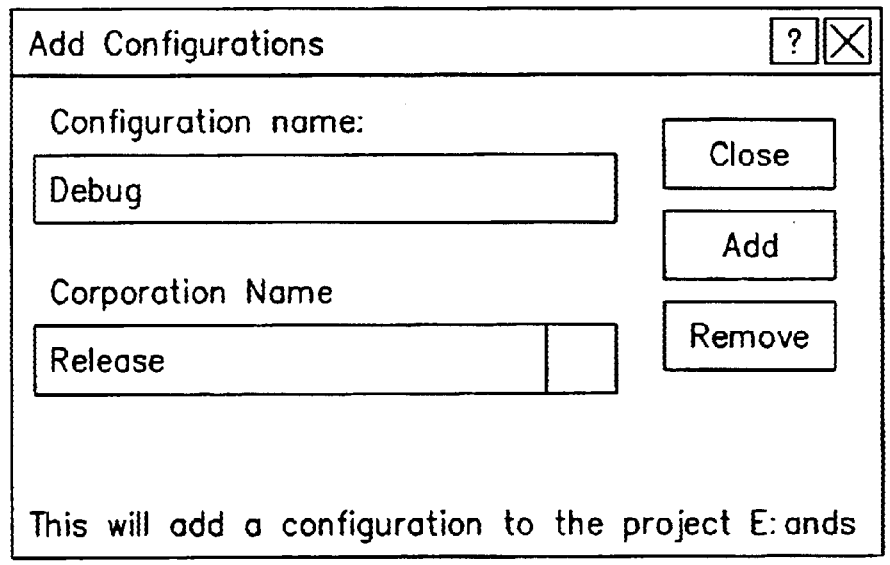
FIG. 10

Browsing

1600

| Button | Command | Function |
|---|---|---|
| ◨ | Go to Definition | Jump to the source code line where the variable is defined |
| ◨ | Go to Reference | Jump to the first source code line where the variable is used |
| ◨ | Previous Definition/Reference | Jump to previous definition or reference |

FIG. 16A

| | Next Definition/Reference | Jump to next definition or reference |
|---|---|---|
| | Pop context | Returns you to your original position before you started browsing |

1600

1700

| Command | Shortcut | Function |
|---|---|---|
| Undo | Ctrl+Z | Reverse a recent change to the active document or to the workspace |
| Redo | Ctrl+Y | Reverse a recent undo |
| Cut | Ctrl+X | Copy the current selection and delete it |
| Copy | Ctrl+C | Copy the current selection to the clipboard |
| Paste | Ctrl+V | Copy the clipboard to the current selection |
| Delete | Del | Delete the current selection |
| Find | Ctrl+F | Find a string or regular expression in the current file |
| Find in files | | Find a string or regular expression in selected files |
| Replace | Ctrl+H | Replace one string or regular expression with another in current file |

The Edit menu also has Bookmarks and Browse sub-menus and the Breakpoints command

| Regular Expression | Description |
|---|---|
| (x) | The characters or expressions between the parentheses |
| . | (Period.) Any single character. |
| ^ | Start of line. |
| $ | End of line. |
| \t | Tab character. |
| x\|y | A match for either x or y. For example, a(team\|class) will match either ateam or aclass |
| x* | Zero, one or many copies of x. For example, ba*c matches bac, baac, baaac and bc. |
| x? | None or one x. For example, ba?c matches bac or bc. |
| x+ | At least one or more of x. For example, ba+c matches bac, baac, baaac, but not bc |
| [xyz]<br>[x-y] | Matches one character from the set in the brackets. Use a dash (-) to include all characters in a range (e.g., [_A-Za-z] matches an underscore or any letter, and [_A-Za-z][_A-Za-z0-9]* matches an alphanumeric string that can include underscores). Use [xyz-] or [-xyz] if you want to include a dash in the set. If you need a ] in the set use []xyz]. |
| [^xyz] | Matches one character that is not in the brackets. For example, x[^0-9] matches xa, but not x0 or x2. |
| \x | Matches the character x, even if x is one of the magic characters ^$[].*+? listed above. For example, ^pig matches pig at the start of a line, but \^pig matches the string ^pig anywhere on a line. |

| Directory | File | File type |
|---|---|---|
| Where saved | prog.c | Source file |
| Workspace directory | prog.hw | Workspace |
| Project directory | example1.hp | Your project file |
| Output directory | example1.dll | Part of the simulator |
| | example1.lib | Part of the simulator |
| | example1.hb | The project browse file for the symbol view window |
| | example1.exp | Part of the simulator |
| | prog.hb | A program browse file used for symbol view |
| Intermediate directory | prog.obj | Handel-C object file built during compilation |

FIG. 19

| Command | Shortcut | Function |
|---|---|---|
| Compile | Ctrl+F7 | Run the compiler on the active document (which must be a .c file), to generate its .obj file. |
| Build project | F7 | Build this project: Run the compiler on all .c files that are newer than their .obj files, than run the linker on the .obj files to make the .dll, EDIF or VHDL file. |
| Rebuild All | | Rebuild all the files in this project: like Build, except that all .c files are compiled. |
| Clean | | Delete all the files that are created by Build. |
| Start Debug | | Pop-up menu |
| Go | F5 | (Build project if not built.) Run the simulator at full speed (until a breakpoint or other stop is reached) |
| Step Into | F11 | (Build project if not built:) Run to the first statement in the function or macro invoked in the current line. If the current line is not a function or macro invocation, run to the next statement. |
| Run to Cursor | Ctrl+F1 | (Build project if not built.) Run up to the line containing the text cursor. |
| Set Active Configuration | | Shows a dialogue box where the user can choose the active configuration |
| Configurations... | | Shows a dialogue box where the user can add, remove or edit configurations. |

FIG. 22

2300 

| Command | Shortcut | Function |
|---|---|---|
| Go | F5 | Run the simulator at full speed (until a breakpoint or other stop) |
| Restart | Ctrl+Shift+F5 | Run the simulator, starting at the first line of the program. |
| Stop Debugging | Shift+F5 | Stop the simulation |
| Break | | Pause the simulation (when it is running) |
| Show Next Statement | Alt+ keypad* | Display the statement in the current thread that will be executed on the next clock cycle |
| Step Into | F11 | Run to the first statement in the function invoked in the current line. If the current line is not a function invocation, run to the next statement on a complete clock cycle. |
| Step Over | F10 | Run until the start of the next statement (step over a function) |
| Step Out | Shift+F11 | Run until the start of the statement after the line which invoked the current function (step out of a function) |

| Run to Cursor | Ctrl+F10 | Run until the line containing the text cursor is reached. |
|---|---|---|
| Advance | Ctrl+F11 | Advance a partial clock cycle, to the next code line |

| Window | Shortcut to open | Function |
|---|---|---|
| Editor window | Appears by default | The code editor window for the secure code that you are debugging, marked to show the current execution points and breakpoints. |
| Watch | Alt+9 | A window with four tabs, in which you can view the contents of selected variables. |
| Call Stack | Alt+7 | A window that shows the calling path to the function you are in. |
| Variables | Alt+4 | Variables window. |
| Clocks | Alt+9 | Display all current clocks and their values. |
| Threads | Alt+5 | Display all current threads with a unique identifier and allows you to select one to view. |

```
void blib(unsigned 0 i)
{
    chanout screen:
++i.
``` blib () line 121
main () line 78
(top | line 44

FIG. 26

| | |
|---|---|
| Strong typing | Handel-C has variables which can be defined to be of any width. |
| | Casting can't change width. |
| | There are no automatic conversions between signed and unsigned values. Instead, values must be 'cast' between types to ensure that the programmer is aware that a conversion is occurring that may alter the meaning of a value. |
| | Pointers can only be cast to void and back, between signed and unsigned and between similar structs. You cannot cast pointers to any other type |
| True parallelism | You can have multiple main functions in a project. Each Handel-C main function must be associated with a clock |
| | Although implicitly sequential, Handel-C has parallel constructs which allow you to speed up your code |
| Width of variables | Handel-C has variables which can be defined to be of any width. |
| | In ISO-C, bit fields are made up of words, and only the specified bits are accessed, the rest are padded. Since there are no words in Handel-C, no form of packing can be assumed. |
| | If you have an array[4] and you use its index as a counter, the index width will be assumed by the Handel-C compiler to be two bits wide (to hold the values 0-3). It will not be able to hold the value 4. |
| No side-effects allowed | Instead of writing complex single statements, it is more efficient in Handel-C to write multiple single statements and run them in parallel |
| | You cannot perform two assignments in one statement. |
| | Auto variables cannot be initialised, as that means that hidden clock cycles are required. Instead, they must be explicitly assigned to in a separate statement. |

FIG. 30

|  | |
|---|---|
|  | You cannot have empty loops in Handel-C |
| Constrained functions | Functions may not be recursive. |
|  | Variable length parameter lists are not supported. |
|  | Old-style function declarations are not supported. |

| In Both | In Conventional C Only | In Handel-C Only |
|---|---|---|
| int | double | chan |
| unsigned | float | ram |
| char | union | rom |
| long | | wom |
| short | | mpran |
| enum | | signal |
| register | | chanin |
| static | | chanout |
| extern | | undefined |
| struct | | interface |
| volatile | | <> |
| void | | inline |
| const | | typeof |
| auto | | |
| signed | | |
| typedef | | |
| void | | |
| volatile | | |

FIG.32

| In Both | In Conventional C Only | In Handel-C Only |
|---|---|---|
| (;) | | par |
| switch | | delay |
| do ... while | | ? |
| while | | ! |
| if ... else | | prialt |
| for (;;) | | seq |
| break | | ifselect |
| continue | | |
| return | | |
| goto | | |
| assert | | |

| In Both | In Conventional C Only | In Handel-C Only |
|---|---|---|
| * (pointer indirection) | double | select(...) |
| & (address of) |  | width(...) |
| − |  | @ |
| + |  | \\ |
| * (multiplication) |  | < |
| / |  | [:] |
|  |  | let...in |
| : |  |  |
| << |  |  |
| >> |  |  |
| > |  |  |
| < |  |  |
| >= |  |  |
| <= |  |  |
| == |  |  |
| != |  |  |
| & (bitwise and) |  |  |
| ^ |  |  |
| \| |  |  |
| ? : |  |  |
| [] |  |  |
| ! |  |  |
| && |  |  |
| ~ |  |  |
| \|\| |  |  |
| .= |  |  |

FIG. 34

```
                                              ⟋─ 3800
                                             ⤾ interface port_in(int 4 signals_to_HC with
                         {busformat="B[1]}) read();

would produce wires
    signals_to_HC[0]
    signals_to_HC[1]
    signals_to_HC[2]
    signals_to_HC[3]
```

| Keyword | Function | Default |
|---------|----------|---------|
| base | specify display base for variables in debugger | 10 |
| extlib | specify external plugin for simulator | None |
| extfunc | specify external simulator function for this port | PlugInSet or PlugInGet |
| extpath | specify any direct logic (combinatorial logic) connections to another port | None |
| extinst | specify connection to external code | None |

| warn | disable compiler warnings | No |

| When used | Function call | How often |
|---|---|---|
| First use of simulator in Handel-C session | PlugInOpen | once per plugin |
| Start of simulation | PlugInOpenPort | once per interface port using the plugin |

|  | PlugInOpenInstance | once per instance (copy) of plugin |
|---|---|---|
| Simulator data transfer | PlugInSet | called when data on a port sending data TO the plugin changes |
|  | PlugInGet | called whenever the simulator wishes to read data FROM the plugin |
| Start of simulated clock cycle | PlugInStartCycle |  |
| Middle of cycle | PlugInMiddleCycle | called immediately before the simulator variables are updated |
| End of cycle | PlugInEndCycle |  |
| End of simulation | PlugInClosePort | once per interface port using the plugin |
|  | PlugInCloseInstance | once per instance of the plugin |
| End of Handel-C session | PluiginClose | once per plugin |

|  | Possible Values | Default | Meaning |
|---|---|---|---|
| extlib | Name of a plugin .dll | None | Specify external plugin for simulator |
| extfunc | Name of a function within the plugin | PlugInSet or PlugInGet depending on port direction | Specify external function within the simulator for this port |
| extinst | Instance name (with optional parameters) | None | Specify simulation instance used |

| Option | Meaning |
|---|---|
| -c | Compile only. Do not generate netlist. Output .obj file |
| -s | Target simulator |
| -clCommandLine | Specify command line for compiling simulator output |
| -fFamily | Specify target family |
| -pPart | Specify target path |
| -edif | Target EDIF output |
| -vhdl | Target VHDL output |
| -lpm Width | Use LPMs for data paths wider than Width |
|  |  |
| -b | Generate browse info database file |
| -rFilename | Specify browse info database file name |
| -oFilename | Specify output file name |
| -xcFilename | Treat file as Handel-C source file |
| -xlFilename | Treat file as Handel-C library file |
| -xoFilename | Treat file as Handel-C object file |
| -LPathname | Add pathname to library path |
|  |  |
| -cpp Option | Pass Option to preprocessor |
| -DSymbol | Define preprocessor symbol |
| -E | Preprocessor source only |
| -IPathname | Add pathname to preprocessor include path |
| -USymbol | Undefine preprocessor symbol |
|  |  |
| -O | Turn on maximum optimisations |
| -O- | Turn off all optimisations |
| -O+optimise | Turn on optimise optimisation |
| -O-optimise | Turn off optimise optimisation |
|  | Possible values for optimise |
|  | cr       Conditional rewriting optimisations |

FIG. 45A

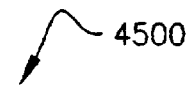

| | cse | CSE optimisations |
|---|---|---|
| | high | High-level optimisations |
| | pcse | Partitioning CSE optimisations |
| | rcse | Repeated CSE optimisations |
| | rcr | Repeated conditional rewriting optimisations. |
| | retime | Retiming optimisations |
| | rewrite | Rewrting optimisations |
| -e | Estimate logic depth and area. (Generate HTML files) | |
| -g | Compile with debug information | |
| -w | Show all warning messages | |
| -help | Print help screen | |

FIG. 45B

| Command | Shortcut | Function |
|---|---|---|
| Edit | | |
|    New... | Ctrl+N | Display the New dialog |
|    Open... | Ctrl+O | Display the File Open dialog |
|    Save... | Ctrl+S | Save the active document |
|    Print | Ctrl+P | Reverse the most recent change to the active document or to the workspace |
|    Undo | Ctrl+Z | Reverse the most recent undo |
|    Redo | Ctrl+Y | Reverse the most recent undo |
|    Cut | Ctrl+X | Copy the current selection and delete it |
|    Copy | Ctrl+C | Copy the current selection to the clipboard |
|    Paste | Ctrl+V | Copy the clipboard to the current selection |
|    Delete | Del | Delete the current selection |
|    Breakpoints... | Alt+F9 | Display project's breakpoints dialog box |
| View | | |
|    Workspace | Alt+0 | Hide or show the Workspace window |
|    Output | Alt+2 | Hide or show the Output window |
|    Debug Windows | | |
|    Watch | Alt+3 | Hide or show the Watch window |
|    Call Stack | Alt+7 | Hide or show the Call Stack window |
|    Memory | Alt+6 | Hide or show the Memory window |
|    Variables | Alt+4 | Hide or show the Variables window |
|    Clocks | Alt+9 | Hide or show the Clocks window |
|    Threads | Alt+5 | Hide or show the Threads window |
|    Properties | Alt+Enter | Display properties of the current document or selection |
| Project | | |
|    Settings... | Alt+F7 | Shows the Project Settings dialog box |
| Build | | |
|    Compile | Ctrl+F7 | Compiler selected file |
|    Build | F7 | Build this project |

FIG.46A

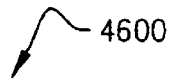

| Debug | | |
|---|---|---|
| Go | F5 | Run the simulator at full speed (until a breakpoint etc.) |
| Restart | Ctrl+Shift+F5 | Run the simulator from the beginning |
| Stop Debugging | Shift+F5 | Stop the simulation |
| Show Next Statement | Alt+Num* | Run until the line containing the next text cursor is reached |
| Step Into | F11 | Run to the first statement in the function invoked in the current line. If the current line is not a function invocation, just run until the next statement. |
| Step Over | F10 | Run until the start of the next statement |
| Step Out | Shift+F11 | Run until the start of the statement after the line which invoked the current function |
| Run to Cursor | Ctrl+F10 | Run until the line containing the text cursor is reached |
| Advance | Ctrl+F11 | Run until the line containing the text cursor is reached |
| Tools | | |
| Source Browser | Alt+F12 | Show a symbol browser dialogue box |
| Help | | |
| Help Topics | F1 | List the Help topics |
| | | |
| Output Window | | |
| | Double click | Takes you to line in source code |
| | F4 | Next error |
| | Shift+F4 | Previous error |
| Windows control | | |
| | F6 | Next pane |
| | Shift+F6 | Previous pane |

Directory browsing
- Folder
- Network disc
- Removable disc
- RAM disc
- Folder (open)
- Fixed disc
- CDROM

Output window
- Information
- User assert statement
- Error (in your program)
- Position stack
- Warning (about your program)
- Internal error in the compiler
- Position

Source window
- Current active point
- Other statements executed in current thread on current clock cycle
- Active point in different thread
- Position of current error
- Breakpoint
- Disabled breakpoint

Toolbar
- New Text File
- New...
- Open
- Save
- Save All
- Print
- Cut
- Copy
- Paste
- Undo
- Redo
- Show Workspace window
- Show Output window
- Show properties
- Compile one file
- Build project
- Stop a build in progress
- Run program in simulator
- Add or remove breakpoint
- Show about box

FIG. 47A

Debug
- Restart
- Stop debugging
- Step in
- Step out
- Run to cursor
- Show watch windows
- Show call stack window
- Clock in clocks window
- Thread in threads window

- Pause
- Step over
- Advance

- Show variable windows

Workspace window
    File view
- Handel-C workspace (.hw file)
- Handel-C system project (.hp file)
- Handel-C board project (.hp file)
- Handel-C chip project (.hp file)
- Handel-C core project (.hp file)
- Library project (.hp file)
- Document (.txt, .h)
- Source file (.c file)
- Folder
- Folder (open)

Symbol view
- Target (used for configurations)
- Function or shared proc or expr
- In-line function, macro
- Variable
- RAM, ROM or WOM variable
- Channel (chan, chanin or chanout)
- Signal
- Interface
- Position stack
- Position Browsing
- Go to definition
- Go to reference
- Previous
- Next
- Return to original context
- File outline
- Definitions and references

FIG. 47C

| Raw file bit number | Colour bit |
|---|---|
| 7 (Most significant) | Red 7 |
| 6 | Green 7 |
| 5 | Blue 7 |
| 4 | Blue 6 |
| 3 | Green 6 |
| 2 | Red 6 |
| 1 | Green 5 |
| 0 (Least significant) | Green 4 |

5200

| Operator | Meaning | ISO-C | Change in Version 3 |
|---|---|---|---|
| [ ] | array index delimiters, bit selection | Extended | Array index may be a variable, bit selection may not |
| + | structure union and multi-port RAM member operator, interface port operator | Yes | struct variables have been added |
| * | indirection operator | Yes | New |
| & | address operator | Yes | New |
| / | division operator | Yes | Extended: division of variables |
| % | modulus operator | Yes | Extended: modulus of variables |
| << | left-shift operator | Yes | Extended: shift by variable amounts |
| >> | right shift operator | Yes | Extended: shift by variable amounts |

| Keyword | Meaning | ISO-C | Change in v.3 |
|---|---|---|---|
| <> | disambiguator | No | New |
| auto | auto variable | Yes | New |
| const | specify that variable's value will not change | Yes | New |
| enu | enumeration constant | Yes | New |
| extern | define global variable | Yes | New |
| inline | declaration of inline function | No | New |
| interface | declaration of off-chip interface | No | Extended: you can now create interfaces to foreign code |
| mpram | declare a multi-port RAM | No | Create dual-ported RAMs |
| ram | declare a RAM | No | Extended to specify Xilinx block memory |
| register | declare register variable | Yes | New |
| rom | declare a ROM | No | Extended to specify Xilinx block memory |
| signal | declare a signal object | No | New |
| signed | declare a signed variable | Yes | New |
| static | specify variable with limited scope | Yes | New |
| struct | declare a structure variable | Yes | New |
| typedef | define type | Yes | New |
| void | specify void return type or empty parameter list | Yes | New |
| volatile | declare volatile variable | Yes | New |
| wom | declare a WOM (array) | No | Specify an area of write-only memory |

FIG. 53

Statements

| Statement | Meaning | ISO-C | Change in v.3 |
|---|---|---|---|
| assert | diagnostic macro to print to stderr | Not standard | Print string to standard error channel |
| continue | continue execution outside code block | Yes | New |
| goto | jump to specified label | Yes | New |
| ifselect | conditional execution on compile time selection | No | Compile following code if selected, else... |
| par | execute statements in parallel | No | Extended: parallel statements can be replicated |
| return | return from function | Yes | New |
| seq | execute statements in sequence | No | New: seq blocks can also be replicated |
| typeof | return type of operator | No | As in GNU C |

Macros

| Keyword | Meaning | ISO-C | Change in v.3 |
|---|---|---|---|
| in | define scope for local macro expression declaration | No | New: let macro expr name = expression in macro expression |
| let | start declaration of local macro expression | No | New: let macro expr name = expression in macro expression |

Clocks

| Keyword | Meaning | ISO-C | Change in v.3 |
|---|---|---|---|
| internal | use internal clock | No | Extended: can use any expression |
| Internal_divide | use divided internal clock | No | Extended: can use any expression |
| __clock | use current clock | No | New |

| Predefined bus interface specs: | | Default |
|---|---|---|
| data | list the pins used for transferring data, MSB to LSB | None |
| speed | set buffer speed (output) | Xilinx = 3<br>Altera = 1 |
| pull | set pull-up or pull-down for bus pins (not Altera) | None |
| infile | set file source for input bus data | None |
| outfile | set file destination for output bus data | None |

| All interface specs: | | Default |
|---|---|---|
| base | specify display base for variables in debugger | 10 |
| extlib | specify external plugin for simulator | None |
| extfunc | specify external simulator function for this port | PluginSet or PluginGet |
| extpath | specify any direct logic (combinatorial logic) connections to another port | None |
| extinst | specify connection to external code | None |
| warn | disable some compiler warnings | No |

| ROM entry | Value | ROM entry | Value |
|---|---|---|---|
| b [0] [0] [0] | 1 | b [0] [0] [1] | 2 |
| b [0] [1] [0] | 3 | b [0] [1] [1] | 4 |
| b [1] [0] [0] | 5 | b [1] [0] [1] | 6 |
| b [1] [1] [0] | 7 | b [1] [1] [1] | 8 |
| b [2] [0] [0] | 9 | b [2] [0] [1] | 10 |
| b [2] [1] [0] | 11 | b [2] [1] [1] | 12 |
| b [3] [0] [0] | 13 | b [3] [0] [1] | 14 |
| b [3] [1] [0] | 15 | b [3] [1] [1] | 16 |

FIG.57

5800

| Statement | Timing |
|---|---|
| {...} | Sum of all statements in sequential block |
| par {...} | Length of longest branch in clock |
| Function(), break, goto, continue | No clock cycles |
| return (Expression); | 1 clock cycle if Expression is assigned on return, otherwise none. |
| Variable = Expression; | 1 clock cycle |
| Variable ++; | 1 clock cycle |
| Variable --; | 1 clock cycle |
| ++ Variable; | 1 clock cycle |
| -- Variable; | 1 clock cycle |
| Variable += Expression; | 1 clock cycle |
| Variable -= Expression; | 1 clock cycle |
| Variable *= Expression; | 1 clock cycle |
| Variable /= Expression; | 1 clock cycle |
| Variable %= Expression; | 1 clock cycle |
| Variable <<= Expression; | 1 clock cycle |
| Variable >>= Expression; | 1 clock cycle |
| Variable &= Expression; | 1 clock cycle |
| Variable |= Expression; | 1 clock cycle |
| Variable ^= Expression; | 1 clock cycle |
| Channel ? Variable; | 1 clock cycle when transmitter is ready (in same clock domain) |

| Statement | Timing |
|---|---|
| Channel ! Expression; | 1 clock cycle when receiver is ready (in some clock domain) |
| if (Expression) {...} else {...} | Length of executed branch |
| while (Expression) {...} | Length of loop body * number of iterations |
| do {...} while (Expression); | Length of loop body * number of iterations |
| for (Init; Test; Iter) {...} | Length of Init + (Length of body + length of Iter) * number of iterations |
| switch (Expression) {...} | Length of executed case branch |
| prialt {...} | 1 clock cycle for case communication when other party is ready plus length of executed case branch<br>or length of default branch if present and no communication case is ready<br>or infinite if no default branch and no communication case is ready |
| delay; | 1 clock cycle |

FIG. 58B

| Clock | in | x[0] | x[1] | x[2] | out |
|---|---|---|---|---|---|
| 1 | 5 | 0 | 0 | 0 | 0 |
| 2 | 6 | 5 | 0 | 0 | 0 |
| 3 | 7 | 6 | 5 | 0 | 0 |
| 4 | 8 | 7 | 6 | 5 | 0 |
| 5 | 9 | 8 | 7 | 6 | 5 |
| 5 | 10 | 9 | 8 | 7 | 6 |
| 6 | 11 | 10 | 9 | 8 | 7 |
| 7 | 12 | 11 | 10 | 9 | 8 |
| 8 | 13 | 12 | 11 | 10 | 9 |

| Location | Meaning |
|---|---|
| internal Frequency<br>internal Expression | Clock from internal clock generator (Xilinx 4000 series devices only). |
| internal_divide Frequency Factor<br>internal_divide Expression | Clock from internal clock generator with integer division (Xilinx 4000 series devices only). |
| external [Pin] | Clock from device pin. |
| external_divide [Pin] Factor | Clock from device pin with integer division. |

| Family Name | Description |
|---|---|
| Xilinx4000E | 4000E series Xilinx FPGAs |
| Xilinx4000L | 4000L series Xilinx FPGAs |
| Xilinx4000EX | 4000EX series Xilinx FPGAs |
| Xilinx4000XL | 4000XL series Xilinx FPGAs |
| Xilinx4000XV | 4000XV series Xilinx FPGAs |
| XilinxVirtex | Virtex Xilinx FPGAs |
| Altera10K | Flex10K series Altera FPGAs |
| Altera20K | Flex20K series Altera FPGAs |

| Sort Identifier | Description |
|---|---|
| bus_in | Input bus from pins |
| bus_latch_in | Registered input bus from pins |
| bus_clock_in | Clocked input bus from pins |
| bus_out | Output bus to pins |
| bus_ts | Bi-directional In-state bus |
| bus_ts_latch_in | Bi-directional In-state bus with registered input |
| bus_ts_clock_in | Bi-directional In-state bus with clocked input |
| port_in | Input port from logic |
| port_out | Output port to logic |

FIG. 75

| Specification | Possible Values | Default | Applies to | Meaning |
|---|---|---|---|---|
| show | 0, 1 | 1 | variables channels o/p buses In-state buses | Show variable during simulation |
| base | 2, 8, 10, 16 | 10 | variables o/p channels o/p buses In-state buses | Print variable in specified base |
| infile | Any valid filename | None | chanins I/p buses tri-state buses | Redirect from file |
| outfile | Any valid filename | None | chanouts o/p buses tri-state buses | Redirect to file |
| warn | 0, 1 | 1 | variables memories channels buses | Enable warnings for object |
| speed | 0, 1, 2, 3 | Xilinx = 3 Altera = 1 | o/p or tri-state bus | Set buffer speed |
| intime | Any floating point ns delay | None | input port or bus or In-state bus external RAMs | Maximum allowable delay between interface and variable |
| outtime | Any floating point ns delay | None | input port or bus or In-state bus external RAMs | Maximum allowable delay between variable and interface |
| extlib | Name of a plugin .dll | None | interface or port | Specify external plugin for simulator |

FIG. 78A

| Specification | Possible Values | Default | Applies to | Meaning |
|---|---|---|---|---|
| extfunc | Name of a function within the plugin | PluginSet or PluginGet depending on port direction | interface or port | Specify external function within the simulator for this port |
| extpath | Name of port TO Handel-C on the same interface | None | port FROM Handel-C | Specify any direct logic (combinatorial logic) connections to another port |
| extinst | Instance name (with optional parameters) | None | interface or port | Specify simulation instance used |
| busformat | Format string | B_1 | interface, port or memories in external logic | Specify the way that wire names are formatted in EDIF |
| pull | 0, 1 | None | Xilinx buses | Add pull up or pull down resistor(s) |
| data | Any valid pin list | None | memories buses | Set data pins |
| offchip | 0, 1 | 0 | memories | Set RAM/ROM to be off chip |
| ports | 0, 1 | 0 | memories | Set RAM/ROM to be in external code |
| block | 0, 1 | Xilinx = 0 Altera = 1 | memories (on-chip) | Set RAM/ROM to be in block memory |
| wegate | -1, 0, 1 | 0 | RAMs | Place write enable signal |
| westart | 0 to clock division -1 | None | RAMs | Position write enable signal |
| welength | 1 to clock division | None | RAMs | Set length of write enable signal |
| rclkpos | Any number of cycles or half-cycles | None | SSRAM | Set read cycle position of SSRAM clock |
| wclkpos | Any number | None | SSRAM | Set write cycle |

| Specification | Input bus | Output bus | Tri-state bus | RAM | ROM |
|---|---|---|---|---|---|
| addr | | | | ✓ | ✓ |
| data | ✓ | ✓ | ✓ | ✓ | ✓ |
| we | | | | ✓ | |
| cs | | | | ✓ | ✓ |
| oe | | | | ✓ | ✓ |
| clk | | | | ✓ | |

FIG. 78D

| Signal Name | FPGA pin | Description |
|---|---|---|
| D3..0 | 1, 2, 3, 4 | Data Bus |
| Write | 5 | Write strobe |
| Read | 6 | Read strobe |
| WriteRdy | 7 | Read strobe |
| ReadRdy | 8 | Able to write to device |

| Type | Width |
|---|---|
| [signed \| unsigned] char | 8 bits |
| [signed \| unsigned] short | 16 bits |
| [signed \| unsigned] long | 32 bits |
| [signed \| unsigned] int | See note 1 |
| [signed \| unsigned] int n | n bits |
| [signed \| unsigned] int undefined | Compiler infers width |
| typeof (Expression) | Yields type of object |

Note 1: Width will be inferred by compiler unless the 'set intwidth = n' command appears before the declaration

| Prefix | Object |
|---|---|
| chan | Channel |
| chanin | Simulator channel |
| chanout | Simulator channel |
| ram | Internal or external RAM |
| rom | internal or external ROM |
| signal | Wire |
| wom | WOM within multi-port memory |

The compound types are

| Prefix | Object |
|---|---|
| struct | Structure |
| mpram | Multi-port memory |

8400

| Statement | Meaning |
|---|---|
| par {...} | Parallel composition |
| seq {...} | Sequential execution |
| par (init ; Test ; Iter) {...} | Parallel replication |
| seq (init ; Test ; Iter) {...} | Sequential replication |
| Variable = Expression; | Assignment |
| Variable ++; | Increment |
| Variable --; | Decrement |
| ++ Variable; | Increment |
| -- Variable; | Decrement |
| Variable += Expression; | Add and assign |
| Variable -= Expression; | Subtract and assign |
| Variable *= Expression; | Multiply and assign |
| Variable /= Expression; | Divide and assign |
| Variable %= Expression; | Modulus and assign |
| Variable <<= Expression; | Shift left and assign |
| Variable >>= Expression; | Shift right and assign |
| Variable &= Expression; | AND and assign |
| Variable \|= Expression; | OR and assign |
| Variable ^= Expression; | XOR and assign |
| Channel ? Variable; | Channel input |
| Channel ! Expreesion; | Channel output |
| if (Expression) [{...} else {...}] | Conditional execution |
| ifselect (Expression) [{...} else {...}] | Conditional compilation |
| while (Expression) {...} | Iteration |
| do {...} while (Expression); | Iteration |
| for (Init ; Test ; Iter) {...} | Iteration |
| break; | Loop and switch termination |
| continue; | Resume execution |
| return[([Expression])]; | Return from function |
| goto label; | Jump to label |
| switch (Expression) {...} | Selection |
| prialt {...} | Channel alternation |
| delay; | Single cycle delay |

Note: RAM and ROM elements, signals and array elements are included in the set of variables in this table.

FIG.84

| Operator | Meaning |
|---|---|
| select (Constant, Expr, Expr,) | Compile-time selection |
| Expression [Expression]<br>Expression [Constant]<br>Expression [Constant:Constant]<br><br>functionName (Arguments)<br>pointertostructure->member<br>structureName, member | Array or memory subscripting<br>Bit selection<br>Bit range extraction. One of the two constants may be omitted<br>Function call<br>Structure reference<br>Structure reference |
| ! Expression<br>~ Expression<br>- Expression<br>+ Expression<br>& object<br>* pointer<br><br>(Type) Expression<br>width(Expression) | Logical NOT<br>Bitwise NOT<br>Unary minus<br>Unary plus<br>Yields pointer to operand<br>Yields object or function that the operand points to<br>Type casting<br>Width of expression |
| Expression <- Constant<br>Expression \\ Constant | Take LSBs<br>Drop LSBs |
| Expression * Expression<br>Expression / Expression<br>Expression % Expression | Multiplication<br>Division<br>Modulus arithmetic |
| Expression + Expression<br>Expression - Expression | Addition<br>Subtraction |
| Expression << Expression<br>Expression >> Expression | Shift left<br>Shift right |
| Expression @ Expression | Concatenation |
| Expression < Expression<br>Expression > Expression | Less than<br>Greater than |

| Operator | Meaning |
|---|---|
| Expression <= Expression<br>Expression >= Expression | Less than or equal<br>Greater than or equal |
| Expression == Expression<br>Expression != Expression | Equal<br>Not equal |
| Expression & Expression | Bitwise AND |
| Expression ^ Expression | Bitwise XOR |
| Expression \| Expression | Bitwise OR |
| Expression && Expression | Logical AND |
| Expression \|\| Expression | Logical OR |
| Expression ? Expr : Expr | Conditional selection |

| Keyword | Meaning | ISO-C | New in version 3 |
|---|---|---|---|
| = | assignment operator | Yes | |
| ; | statement terminator | Yes | |
| , | C only | Yes | |
| { } | code block delimiters | Yes | |
| <> | type specialisation | No | New |
| ( | open delimiter | Yes | |
| ) | close delimiter | Yes | |
| [] | array index delimiters, bit selection | Yes | Array index may be variable |
| [:] | bit range selection | No | Extended |
| ! | logical NOT operator | Yes | |
| ! | output to channel | No | |
| ~ | bitwise NOT | Yes | |
| + | addition operator | Yes | |
| - | subtraction operator | Yes | |
| - | unary minus operator | Yes | |
| * | multiplication operator | Yes | |
| / | division operator | Yes | Extended |
| % | modulus operator | Yes | Extended |
| \\ | drop LSB | No | |
| <- | take LSBs | No | |
| ? | read from channel | No | |
| ? | conditional expression | Yes | |
| ^ | Bitwise XOR | Yes | |
| & | Bitwise AND | Yes | |
| \| | Bitwise OR | Yes | |

FIG.86A

| Keyword | Meaning | ISO-C | New in version 3 |
|---|---|---|---|
| && | Logical AND | Yes | |
| \|\| | Logical OR | Yes | |
| . | structure member operator | Yes | New |
| << | left-shift operator | Yes | Extended |
| >> | right-shift operator | Yes | Extended |
| < | less than operator | Yes | |
| > | greater than operator | Yes | |
| <= | less or equal operator | Not standard | |
| >= | greater or equal operator | Not standard | |
| == | equality operator | Not standard | |
| != | inequality operator | Not standard | |
| ++ | increment operator | Not standard | |
| -- | decrement operator | Not standard | |
| += | assignment operator | Not standard | |
| -= | assignment operator | Not standard | |
| *= | assignment operator | Not standard | |
| /= | assignment operator | Not standard | |
| %= | assignment operator | Not standard | |
| <<= | assignment operator | Not standard | |
| >>= | assignment operator | Not standard | |
| &= | assignment operator | Not standard | |
| \|= | assignment operator | Not standard | |
| *= | assignment operator | Not standard | |
| ... | Reserved. Not valid in Handel-C | C only | |
| -> | structure pointer operator | Yes | New |
| @ | concatenation operator | No | |

| Keyword | Meaning | ISO-C | New in version 3 |
|---|---|---|---|
| assert | diagnostic macro to print to stderr | Not standard | New |
| auto | auto variable | Yes | New |
| break | immediate exit from code block | Yes | |
| case | selection within switch | Yes | |
| chan | define channel variable | No | |
| chanin | simulator channel in | No | |
| chanout | simulator channel out | No | |
| char | 8=bit variable | Yes | |
| clock | define clock | No | |
| const | specify that variable's value will not change | Yes | New |
| continue | force next iteration of loop | Yes | New |
| default | default case within switch, prialt | Yes | |
| delay | wait one clock tick | No | |
| do | start do while loop | Yes | |
| double | Reserved. Not valid in Handel-C | Yes | |
| else | conditional execution | C-only | |
| enum | enumeration constant | Yes | New |
| expr | define macro as expression | No | |
| extern | define global variable | Yes | New |
| external | clock from device pin | No | Extended |
| external_divide | clock from device pin with integer division | No | Extended |
| family | define target device's family | No | |
| float | Reserved. Not valid in Handel-C | C-only | |
| for | for loop iteration | Yes | |
| goto | jump to specified label | Yes | New |
| if | conditional execution | Yes | |
| ifselect | conditional compilation on compile-time selection | No | New |
| in | define scope for local macro expression declaration | No | New |
| inline | declaration on inline function | No | New |

FIG.86C

| Keyword | Meaning | ISO-C | New in version 3 |
|---|---|---|---|
| int | definable width variable | Yes | |
| interface | declaration of off-chip interface | No | Extended |
| internal | use internal clock | No | Extended |
| internal_divide | internal clock with integer division | No | Extended |
| intwidth | set integer width | No | |
| let | start declaration of local marco expression | No | New |
| long | declare 32-bit variable | Yes | |
| macro | declare a marco | No | |
| mpram | declare a multi-port RAM | No | New |
| par | execute statements in parallel | No | Extended |
| part | define target hardware | No | |
| prialt | execute first ready channel | No | |
| proc | define macro as procedure | No | |
| ram | declare a RAM (array) | No | |
| register | declare register variable | Yes | New |
| return | return from function | Yes | New |
| rom | declare a ROM (array) | No | |
| select | select expression or macro expr at compile time | No | |
| set | specify int width, target or clock | No | |
| seq | execute statements in sequence | No | New |
| shared | declare a shared expression | No | |
| short | declare 16-bit variable | Yes | |
| signal | declare a signal object | No | New |
| signed | declare a signed variable | Yes | New |
| sizeof | | | |
| sizeof | Reserved. Not valid in Handel-C | Yes | |
| static | specify variable with limited scope | Yes | New |
| struct | declare a structure variable | Yes | New |
| switch | switch statement (between cases) | Yes | |
| typedef | define type | Yes | New |
| typeof | return type of operator | No | New |

| Keyword | Meaning | ISO-C | New in version 3 |
|---|---|---|---|
| undefined | specify a variable of underfined width | No | |
| union | | | |
| unsigned | declare an unsigned variable | Yes | |
| void | specify void return type | Yes | New |
| volatile | declare volatile variable | Yes | New |
| while | loop statement | Yes | |
| width | return integer width | No | |
| with | specify interface, signals channels, ram and rom types, variables etc. | No | |
| wom | declare a WOM (array) | No | New |

| Escape Code | ASCII Value | Meaning |
|---|---|---|
| \a | 7 | Bell (alert) |
| \b | 8 | Backspace |
| \f | 12 | Form feed |
| \t | 9 | Horizontal tab |
| \n | 10 | Newline |
| \v | 11 | Vertical tab |
| \r | 13 | Carriage return |
| \" | — | Double quote mark |
| \0 | 0 | String terminator |
| \\ | — | Backslash |
| \* | — | Single quote mark |
| \? | — | Question mark |

FIG. 87A

Typical Address Packet

SYSTEM, METHOD AND ARTICLE OF MANUFACTURE FOR SIGNAL CONSTRUCTS IN A PROGRAMMING LANGUAGE CAPABLE OF PROGRAMMING HARDWARE ARCHITECTURES

FIELD OF THE INVENTION

The present invention relates to programmable hardware architectures and more particularly to programming field programmable gate arrays (FPGA's).

BACKGROUND OF THE INVENTION

It is well known that software-controlled machines provide great flexibility in that they can be adapted to many different desired purposes by the use of suitable software. As well as being used in the familiar general purpose computers, software-controlled processors are now used in many products such as cars, telephones and other domestic products, where they are known as embedded systems.

However, for a given function, a software-controlled processor is usually slower than hardware dedicated to that function. A way of overcoming this problem is to use a special software-controlled processor such as a RISC processor which can be made to function more quickly for limited purposes by having its parameters (for instance size, instruction set etc.) tailored to the desired functionality.

Where hardware is used, though, although it increases the speed of operation, it lacks flexibility and, for instance, although it may be suitable for the task for which it was designed it may not be suitable for a modified version of that task which is desired later. It is now possible to form the hardware on reconfigurable logic circuits, such as Field Programmable Gate Arrays (FPGA's) which are logic circuits which can be repeatedly reconfigured in different ways. Thus they provide the speed advantages of dedicated hardware, with some degree of flexibility for later updating or multiple functionality.

In general, though, it can be seen that designers face a problem in finding the right balance between speed and generality. They can build versatile chips which will be software controlled and thus perform many different functions relatively slowly, or they can devise application-specific chips that do only a limited set of tasks but do them much more quickly.

SUMMARY OF THE INVENTION

A system, method and article of manufacture are provided for using a dynamic object in a programming language. In general, an object is defined with an associated first value and second value. The first value is used in association with the object during a predetermined clock cycle. The second value is used in association with the object before or after the predetermined clock cycle.

In an aspect of the present invention, the object may be used to split up an expression into sub-expressions. As an option, the sub-expressions may be reused. In another aspect, the first value may be assigned to and read from the object during the predetermined clock cycle. In a further aspect, the programming language may be adapted for programming a gate array. As an option, the programming language may include Handel-C.

BRIEF DESCRIPTION OF THE DRAWINGS

The invention may be better understood when consideration is given to the following detailed description thereof. Such description makes reference to the annexed drawings wherein:

FIG. 3 illustrates the Handel-C development environment, in accordance with one embodiment of the present invention;

FIG. 6 illustrates the various types of new projects, in accordance with one embodiment of the present invention;

FIGS. 9A, 9B, and 9C illustrate available settings;

FIG. 10 illustrates a configurations graphical user interface, in accordance with one embodiment of the present invention;

FIGS. 16A and 16B illustrate browsing commands, in accordance with one embodiment of the present invention;

FIG. 17 is a table of editing commands, in accordance with one embodiment of the present invention;

FIG. 18 is a table of regular expressions, in accordance with one embodiment of the present invention;

FIG. 19 is a table of various project files, in accordance with one embodiment of the present invention;

FIG. 22 illustrates table showing a build menu, in accordance with one embodiment of the present invention;

FIGS. 23A and 23B illustrate the various commands associated with the debug menu, in accordance with one embodiment of the present invention;

FIG. 24 illustrates a table showing the various windows associated with the debugger interface, in accordance with one embodiment of the present invention;

FIG. 26 illustrates the current positioning function blib, and the related call stack window;

FIGS. 30 and 31 illustrate a table showing various differences between Handel-C and the conventional C programming language, in accordance with one embodiment of the present invention;

FIG. 32 illustrates a table of types, type operators and objects, in accordance with one embodiment of the present invention;

FIG. 34 illustrates a table of expressions, in accordance with one embodiment of the present invention;

FIG. 38 illustrates the wires that would be produced when specifying floating wire names, in accordance with one embodiment of the present invention;

Figure 40B:
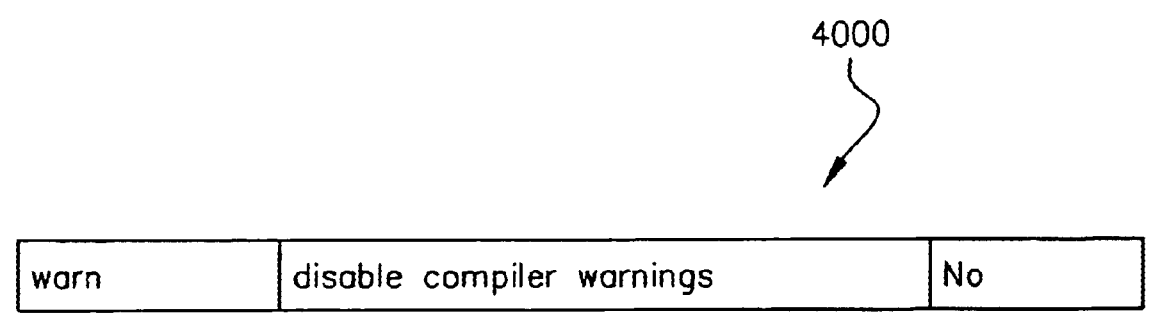

FIGS. 40A and 40B illustrate a table of possible specifications, in accordance with one embodiment of the present invention;

FIGS. 42A and 42B illustrate various function calls and the various uses thereof, in accordance with one embodiment of the present invention;

FIG. 43 illustrates a plurality of possible values and meanings associated with libraries of the present invention;

FIGS. 45A and 45B summarize the options available on the compiler;

FIGS. 46A and 46B illustrate various commands and debugs, in accordance with one embodiment of the present invention;

FIGS. 47A through 47C illustrate various icons that may be utilized, in accordance with one embodiment of the present invention;

FIGS. 52, 53 and 54 illustrate a table of operators, statements, and macros respectively, along with alternate meanings thereof;

FIG. 56 illustrates the various specifications for the interfaces of the present invention;

FIG. 57 illustrates a table showing the ROM entries, in accordance with one embodiment of the present invention;

FIG. 57A-1 illustrates a method for using extensions to execute commands in parallel;

FIG. 57A-2 illustrates a method for parameterized expressions, in accordance with various embodiments of the present invention;

FIGS. 58A and 58B illustrate a summary of statement timings, in accordance with one embodiment of the present invention;

FIG. 59 illustrates various I/O based on clock cycles, in accordance with one embodiment of the present invention;

FIG. 60 illustrates a table showing the various locations, in accordance with one embodiment of the present invention;

FIG. 61 illustrates the various family names, in accordance with one embodiment of the present invention;

FIG. 75 is a table of pre-defined interface sorts, in accordance with one embodiment of the present invention;

FIGS. 78A through 78C illustrate a table showing the specification of various keywords, in accordance with one embodiment of the present invention;

FIG. 78D illustrates the manner in which an pin outs are specified, in accordance with one embodiment of the present invention;

FIG. 79 illustrates the various signals employed by the present invention;

FIG. 82 illustrates a table that lists the most common types that may be associated with a variable, in accordance with one embodiment of the present invention;

FIG. 84 illustrates a table that lists all statements in the Handel-C language, in accordance with one embodiment of the present invention;

FIGS. 85A and 85B illustrate a table that lists all operators in the Handel-C language, in accordance with one embodiment of the present invention;

FIGS. 86A through 86E illustrate a table that lists keywords, in accordance with one embodiment of the present invention;

FIG. 87A illustrates escape codes and their associated meanings, in accordance with one embodiment of the present invention;

DETAILED DESCRIPTION OF THE PREFERRED EMBODIMENTS

A preferred embodiment of a system in accordance with the present invention is preferably practiced in the context of a personal computer such as an IBM compatible personal computer, Apple Macintosh computer or UNIX based workstation. A representative hardware environment is depicted in FIG. 1, which illustrates a typical hardware configuration of a workstation in accordance with a preferred embodiment having a central processing unit 110, such as a microprocessor, and a number of other units interconnected via a system bus 112.

Figure 1:
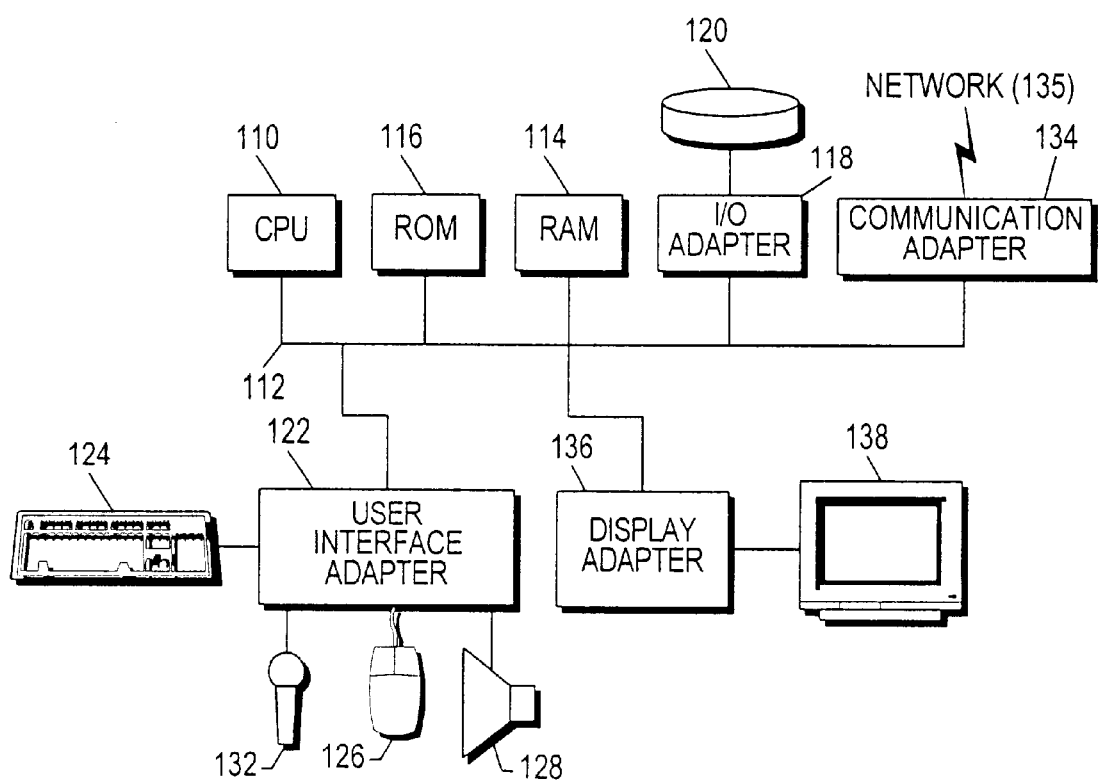
FIG. 1 is a schematic diagram of a hardware implementation of one embodiment of the present invention.

The workstation shown in FIG. 1 includes a Random Access Memory (RAM) 114, Read Only Memory (ROM) 116, an I/O adapter 118 for connecting peripheral devices such as disk storage units 120 to the bus 112, a user interface adapter 122 for connecting a keyboard 124, a mouse 126, a speaker 128, a microphone 132, and/or other user interface devices such as a touch screen (not shown) to the bus 112, communication adapter 134 for connecting the workstation to a communication network (e.g., a data processing network) and a display adapter 136 for connecting the bus 112 to a display device 138.

The workstation typically has resident thereon an operating system such as the Microsoft Windows NT or Windows/95 Operating System (OS), the IBM OS/2 operating system, the MAC OS, or UNIX operating system. Those skilled in the art may appreciate that the present invention may also be implemented on platforms and operating systems other than those mentioned.

In one embodiment, the hardware environment of FIG. 1 may include, at least in part, a field programmable gate array (FPGA) device. For example, the central processing unit 110 may be replaced or supplemented with an FPGA. Use of such device provides flexibility in functionality, while maintaining high processing speeds.

Examples of such FPGA devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc. and which are herein incorporated by reference for all purposes. It should be noted, however, that FPGA's of any type may be employed in the context of the present invention.

An FPGA device can be characterized as an integrated circuit that has four major features as follows.

(1) A user-accessible, configuration-defining memory means, such as SRAM, PROM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM) although this is not a popular approach.

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means.

Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means.

In some instances, FPGA devices may additionally include embedded volatile memory for serving as scratchpad memory for the CLB's or as FIFO or LIFO circuitry. The embedded volatile memory may be fairly sizable and can have 1 million or more storage bits in addition to the storage bits of the device's configuration memory.

Modern FPGA's tend to be fairly complex. They typically offer a large spectrum of user-configurable options with respect to how each of many CLB's should be configured, how each of many interconnect resources should be configured, and/or how each of many IOB's should be configured. This means that there can be thousands or millions of configurable bits that may need to be individually set or cleared during configuration of each FPGA device.

Rather than determining with pencil and paper how each of the configurable resources of an FPGA device should be programmed, it is common practice to employ a computer and appropriate FPGA-configuring software to automatically generate the configuration instruction signals that may be supplied to, and that may ultimately cause an unprogrammed FPGA to implement a specific design. (The configuration instruction signals may also define an initial state for the implemented design, that is, initial set and reset states for embedded flip flops and/or embedded scratchpad memory cells.)

The number of logic bits that are used for defining the configuration instructions of a given FPGA device tends to be fairly large (e.g., 1 Megabits or more) and usually grows with the size and complexity of the target FPGA. Time spent in loading configuration instructions and verifying that the instructions have been correctly loaded can become significant, particularly when such loading is carried out in the field.

For many reasons, it is often desirable to have in-system reprogramming capabilities so that reconfiguration of FPGA's can be carried out in the field.

FPGA devices that have configuration memories of the reprogrammable kind are, at least in theory, 'in-system programmable' (ISP). This means no more than that a possibility exists for changing the configuration instructions within the FPGA device while the FPGA device is 'in-system' because the configuration memory is inherently reprogrammable. The term, 'in-system' as used herein indicates that the FPGA device remains connected to an application-specific printed circuit board or to another form of end-use system during reprogramming. The end-use system is of course, one which contains the FPGA device and for which the FPGA device is to be at least once configured to operate within in accordance with predefined, end-use or 'in the field' application specifications.

The possibility of reconfiguring such inherently reprogrammable FPGA's does not mean that configuration changes can always be made with any end-use system. Nor does it mean that, where in-system reprogramming is possible, that reconfiguration of the FPGA can be made in timely fashion or convenient fashion from the perspective of the end-use system or its users. (Users of the end-use system can be located either locally or remotely relative to the end-use system.)

Although there may be many instances in which it is desirable to alter a pre-existing configuration of an 'in the field' FPGA (with the alteration commands coming either from a remote site or from the local site of the FPGA), there are certain practical considerations that may make such in-system reprogrammability of FPGA's more difficult than first apparent (that is, when conventional techniques for FPGA reconfiguration are followed).

A popular class of FPGA integrated circuits (IC's) relies on volatile memory technologies such as SRAM (static random access memory) for implementing on-chip configuration memory cells. The popularity of such volatile memory technologies is owed primarily to the inherent reprogrammability of the memory over a device lifetime that can include an essentially unlimited number of reprogramming cycles.

There is a price to be paid for these advantageous features, however. The price is the inherent volatility of the configuration data as stored in the FPGA device. Each time power to the FPGA device is shut off, the volatile configuration memory cells lose their configuration data. Other events may also cause corruption or loss of data from volatile memory cells within the FPGA device.

Some form of configuration restoration means is needed to restore the lost data when power is shut off and then re-applied to the FPGA or when another like event calls for configuration restoration (e.g., corruption of state data within scratchpad memory).

The configuration restoration means can take many forms. If the FPGA device resides in a relatively large system that has a magnetic or optical or opto-magnetic form of non-volatile memory (e.g., a hard magnetic disk)—and the latency of powering up such a optical/magnetic device and/or of loading configuration instructions from such an optical/magnetic form of nonvolatile memory can be tolerated—then the optical/magnetic memory device can be used as a nonvolatile configuration restoration means that redundantly stores the configuration data and is used to reload the same into the system's FPGA device(s) during power-up operations (and/or other restoration cycles).

On the other hand, if the FPGA device(s) resides in a relatively small system that does not have such optical/magnetic devices, and/or if the latency of loading configuration memory data from such an optical/magnetic device is not tolerable, then a smaller and/or faster configuration restoration means may be called for.

Many end-use systems such as cable-TV set tops, satellite receiver boxes, and communications switching boxes are constrained by prespecified design limitations on physical size and/or power-up timing and/or security provisions and/or other provisions such that they cannot rely on magnetic or optical technologies (or on network/satellite downloads) for performing configuration restoration. Their designs instead call for a relatively small and fast acting, non-volatile memory device (such as a securely-packaged EPROM IC), for performing the configuration restoration function. The small/fast device is expected to satisfy application-specific criteria such as: (1) being securely retained within the end-use system; (2) being able to store FPGA configuration data during prolonged power outage periods; and (3) being able to quickly and automatically re-load the configuration instructions back into the volatile configuration memory (SRAM) of the FPGA device each time power is turned back on or another event calls for configuration restoration.

The term 'CROP device' may be used herein to refer in a general way to this form of compact, nonvolatile, and fast-acting device that performs 'Configuration-Restoring On Power-up' services for an associated FPGA device.

Unlike its supported, volatilely reprogrammable FPGA device, the corresponding CROP device is not volatile, and it is generally not 'in-system programmable'. Instead, the CROP device is generally of a completely nonprogrammable type such as exemplified by mask-programmed ROM IC's or by once-only programmable, fuse-based PROM IC's. Examples of such CROP devices include a product family that the Xilinx company provides under the designation 'Serial Configuration PROMs' and under the trade name, XC1700D.TM. These serial CROP devices employ one-time programmable PROM (Programmable Read Only Memory) cells for storing configuration instructions in non-volatile fashion.

A preferred embodiment is written using Handel-C. Handel-C is a programming language marketed by Celoxica Limited. Handel-C is a programming language that enables a software or hardware engineer to target directly FPGAs (Field Programmable Gate Arrays) in a similar fashion to classical microprocessor cross-compiler development tools, without recourse to a Hardware Description Language. This allows the designer to directly realize the raw real-time computing capability of the FPGA.

Handel-C allows one to use a high-level language to program FPGAs. It makes it easy to implement complex algorithms by using a software-based language rather than a hardware architecture-based language. One can use all the power of reconfigurable computing in FPGAs without needing to know the details of the FPGAs themselves. A program may be written in Handel-C to generate all required state machines, while one can specify storage requirements down to the bit level. A clock and clock speed may be assigned for working with the simple but explicit model of one clock cycle per assignment. A Handel-C macro library may be used for bit manipulation and arithmetic operations. The program may be compiled and then simulated and debugged on a PC similar to that in FIG. 1. This may be done while stepping through single or multiple clock cycles.

When one has designed their chip, the code can be compiled directly to a netlist, ready to be used by manufacturers' place and route tools for a variety of different chips.

As such, one can design hardware quickly because he or she can write high-level code instead of using a hardware description language. Handel-C optimizes code, and uses efficient algorithms to generate the logic hardware from the program. Because of the speed of development and the ease of maintaining well-commented high-level code, it allows one to use reconfigurable computing easily and efficiently.

Handel-C has the tight relationship between code and hardware generation required by hardware engineers, with the advantages of high-level language abstraction. Further features include:

C-like language allows one to program quickly

Architecture specifiers allow one to define RAMs, ROMs, buses and interfaces.

Parallelism allows one to optimize use of the FPGA

Close correspondence between the program and the hardware

Easy to understand timing model

Full simulation of owner hardware on the PC

Display the contents of registers every clock cycle during debug

Rapid prototyping

Convert existing C programs to hardware

Works with manufacturers' existing tools

Rapid reconfiguration

Logic estimation tool highlights code inefficiencies in colored Web pages

Device-independent programs

Generates EDIF and XNF formats (and XBLOX macros)

Handel-C is thus designed to enable the compilation of programs into synchronous hardware; it is aimed at compiling high level algorithms directly into gate level hardware. The Handel-C syntax is based on that of conventional C so programmers familiar with conventional C may recognize almost all the constructs in the Handel-C language. Sequential programs can be written in Handel-C just as in conventional C but to gain the most benefit in performance from the target hardware its inherent parallelism may be exploited. Handel-C includes parallel constructs that provide the means for the programmer to exploit this benefit in his applications. The compiler compiles and optimizes Handel-C source code into a file suitable for simulation or a net list which can be placed and routed on a real FPGA.

More information regarding the Handel-C programming language will now be set forth. For further information, reference may be made to "EMBEDDED SOLUTIONS Handel-C Language Reference Manual: Version 3," "EMBEDDED SOLUTIONS Handel-C User Manual: Version 3.0," "EMBEDDED SOLUTIONS Handel-C Interfacing to other language code blocks: Version 3.0," and "EMBEDDED SOLUTIONS Handel-C Preprocessor Reference Manual: Version 2.1," each authored by Rachel Ganz, and published by Embedded Solutions Limited, and which are each incorporated herein by reference in their entirety.

The present description is divided in a plurality of sections set forth under the headings:

HANDEL-C COMPILER AND SIMULATOR
   HANDEL-C LANGUAGE
   PREPROCESSOR
   FPGA-BASED CO-PROCESSOR API
   FIXED AND FLOATING POINT LIBRARY
   WAVEFORM ANALYSIS

HANDEL-C COMPILER AND SIMULATOR

Conventions

A number of conventions are used throughout this description. These conventions are detailed below. Hexadecimal numbers appear throughout this description. The convention used is that of prefixing the number with '0x' in common with standard C syntax.

Sections of code or commands that one may type are given in typewriter font as follows:

"void main( );"

Information about a type of object one may specify is given in italics as follows:

"copy SourceFileName DestinationFileName"

Menu items appear in narrow bold text as follows:

"insert Project into Workspace"

Elements within a menu are separated from the menu name by a >so Edit>Find means the Find item in the Edit menu.

Introduction

Handel-C is a programming language designed to enable the compilation of programs into synchronous hardware. The Handel-C compiler and simulator will now be described. The Handel-C language may be described hereinafter in greater detail.

The present description contains:

Getting started
   User interface overview
   Compiler and simulator overview
   Examples of compiler and simulator use
   Notes on using Handel-C and porting C code to Handel-C
   Description of interfacing with VHDL code
   Guide to the API (Application Programmers Interface)
   Descriptions of the bitmap to data conversion utilities used by the
   examples.

Overview

Design Flow Overview

Figure 2:
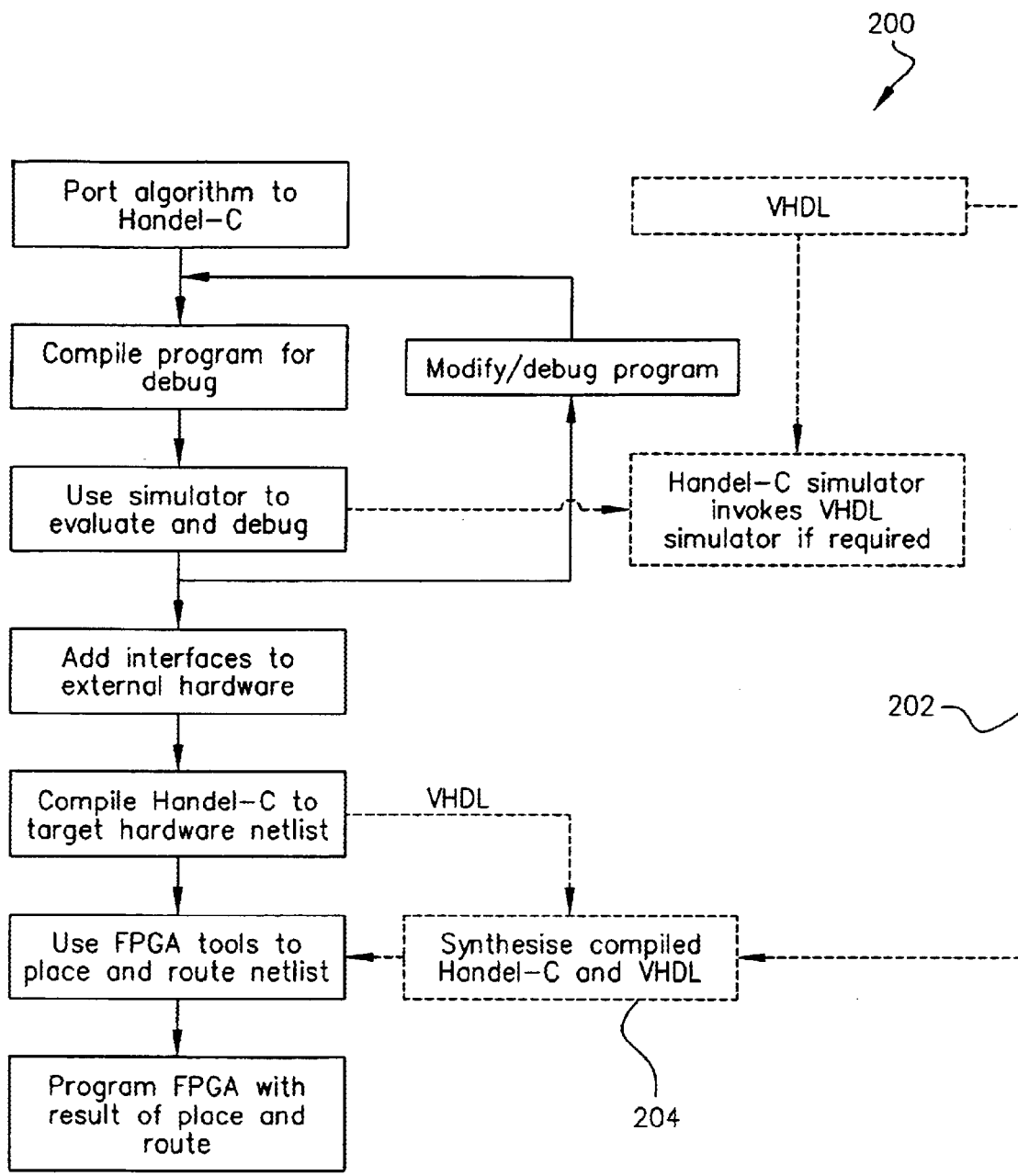
FIG. 2 illustrates a design flow overview, in accordance with one embodiment of the present invention.

FIG. 2 illustrates a design flow overview 200, in accordance with one embodiment of the present invention. The dotted lines 202 show the extra steps 204 required if one wishes to integrate Handel-C with VHDL.

Getting Started.

Introduction

The present section gives a brief description of how to use the Handel-C compiler and simulator.

The Handel-C Development Environment

FIG. 3 illustrates the Handel-C development environment 300, in accordance with one embodiment of the present invention. The Handel-C development environment is a standard Windows development environment. It is in four main parts. The windows and toolbars are standard Windows dockable windows and customizable toolbars.

Expected Development Sequence

The normal development sequence for a single-chip project is as follows:

1. Create a new project.
2. Configure the project.
3. Add the empty source code files to the project.
4. Create source code.
5. Link to any required libraries.
6. Set up the files for debug.
7. Compile the project for debug.
8. Debug the project.
9. Compile the project for target chip.
10. Export the target file to a place and route tool.
11. Place and route.

There is not necessarily information on placing and routing within the Handel-C documentation.

The steps are described below.

Invoking the Environment.

Figure 4:
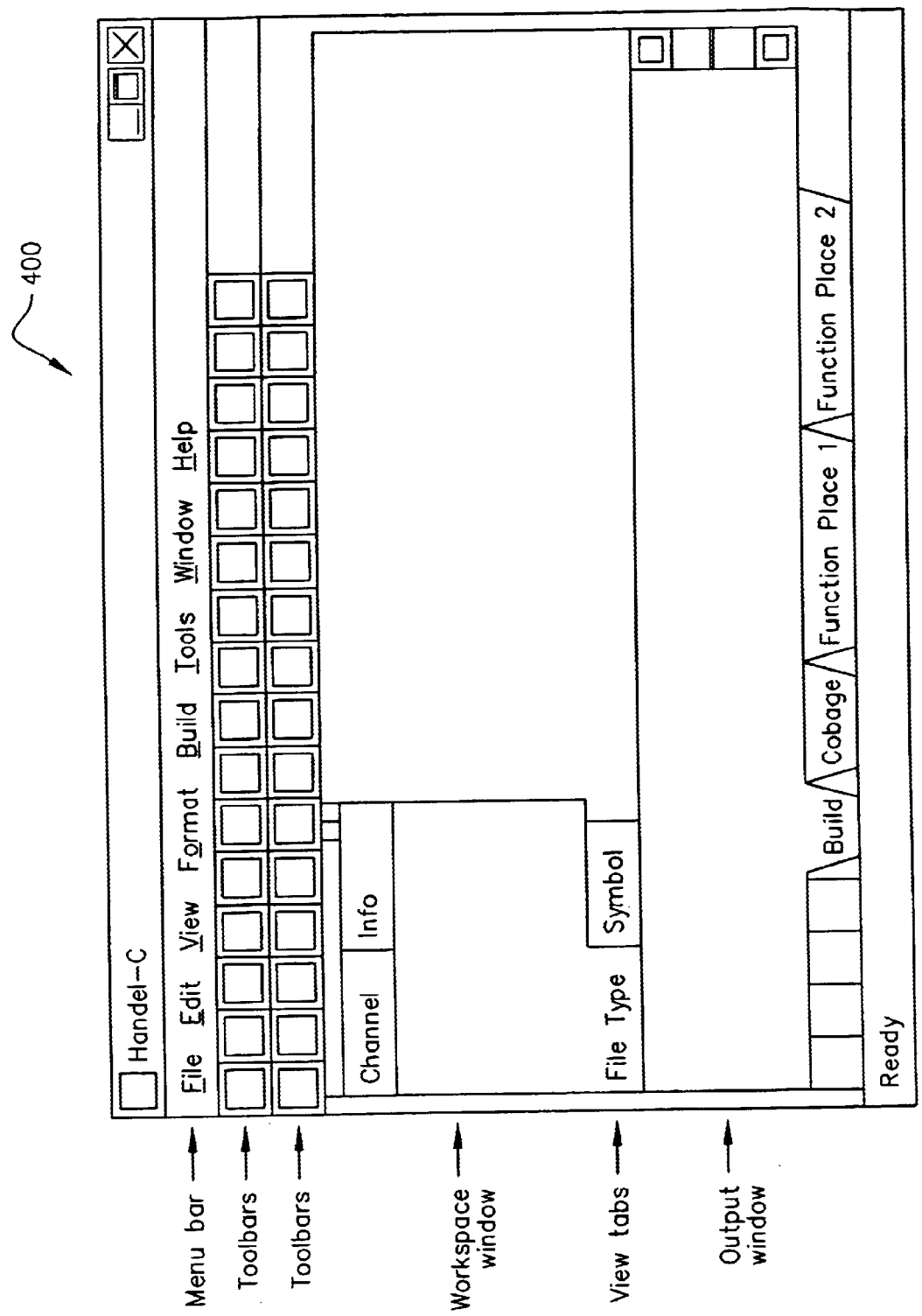
FIG. 4 illustrates a graphical user interface shown if one starts the program with an empty workspace.

One starts Handel-C by doing one of:
   selecting Start>Programs>Handel-C>Handel-C
   double-clicking on an existing Handel-C workspace file (files with the extension .hw)
   double-clicking the Handel-C icon FIG. 4 illustrates a graphical user interface 400 shown if one starts the program with an empty workspace.

Creating the Project

Figure 5:
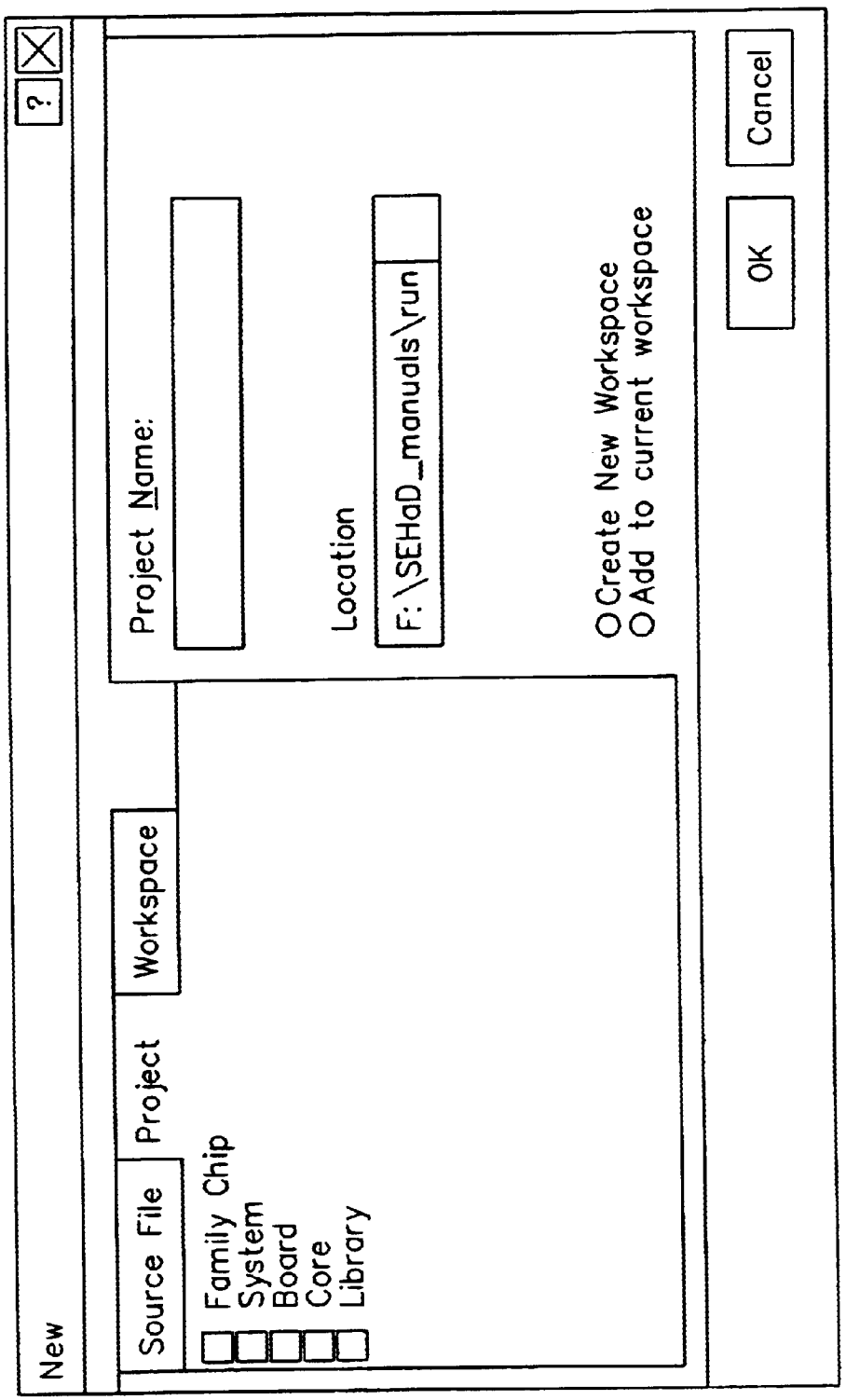
FIG. 5 illustrates a graphical user interface used to create a project, in accordance with one embodiment of the present invention.

FIG. 5 illustrates a graphical user interface 500 used to create a project, in accordance with one embodiment of the present invention.

Select New from the File menu.
   Select the Project tab in the dialog that appears.
   One may be asked for the name and location (pathname for the directory that it is stored in) for the project. One can look for a directory by clicking the . . . button to the right of the Location box.

By default, a new workspace is created for the project in the same directory as the project. Workspace files have .hw extensions. Project files have .hp extensions. When one starts a new project, one may have to define its type. FIG. 6 illustrates the various types 600 of new projects, in accordance with one embodiment of the present invention.

Common pre-defined project types are supplied with Handel-C.

Select the appropriate project type from the types listed in the Project pane.
   Click OK.

Configuring the Project

Once a person has created a project, one should configure its settings. These settings define what type of chip is targeted, and how the compiler, pre-processor and optimizer work. The default settings are correct for a new project that one wishes to debug.

Adding Files to the Project

Add a Handel-C source file to the new project. This may be one that a person has already written, or a new, empty one.

Creating a New File

Select File>New, and click the Source File tab.
   Select whether it's a header file or a source file in the left-hand pane.
   Select the project the file should belong to from the drop-down list of current projects.
   Set the location (the directory path where the file is stored), either by typing the pathname in the box, or selecting a directory by clicking the . . . button.

The code editor window may open.

Adding an Existing File

Select Project>Add to Project>Files and browse the directory tree for the files one wishes to add.

One can add multiple files from a directory by selecting them all. OR

Right-click the mouse on the project, and select Add Files to Folder from the shortcut menu.

Removing Files from a Project

One can remove files from a project by selecting the file in the workspace window and pressing the Delete key or selecting Edit>Delete. This does not delete the file from the hard disk.

Opening an existing source code file does not add it to the project. It may not be built or compiled. One may explicitly add files to the project.

Writing Source Code

One may write Handel-C source code in the source code editor. Code is indented at the same level as the line above it and is syntax highlighted.

Having a file open in the source code editor does not mean that it is part of the project. The only files that may be compiled and built are those that may have been added to the project.

Setting up for Debug

There are several methods of coding Handel-C to help one debug a project.

They fall into two kinds:

Code which may automatically be discarded by the compiler if one does not compile a project for debug, e.g., the with {infile="file"} directive Code where one supplies alternatives to be compiled for debug and release or target compilations. In these cases, one can use the #ifdef DEBUG, #ifdef NDEBUG and #ifdef SIMULATE directives.

By default, DEBUG and SIMULATE may be defined if one compiles for debug, and NDEBUG may be defined for all other compilations. For example:

.ifdef SIMULATE sim_chan ? var; // Read from simulator .else

HardwareMacroRead(var); // Real HW interface .endif

Summary of coding techniques used for debug:

Substitute simulator channels for hardware interface channels

Use the assert directive to stop a compilation if a condition is untrue.

Substitute file input for external channel input

Export the contents of variables into files

Build and Compile for Debug

Debug is the default compilation target. It is unlikely that one would need to make any changes to the project settings at this stage. The compiler creates a file which is in turn compiled into native PC code using Microsoft Visual C++. This creates the chip simulation.

To build and compile the project, select Build from the Build menu. Messages from the compiler may appear in the Build tab of the output window Debug and Simulation Select Start debug from the Build menu. The Debug menu may replace the Build menu. A person can step through the code from execution point to execution point. Statements that are completed at the end of the current clock cycle are marked with an arrow.

The arrows are color coded as follows:

Yellow current point

White other points in this thread executed in this cycle

Grey points in other threads executed in this cycle

Figure 7:
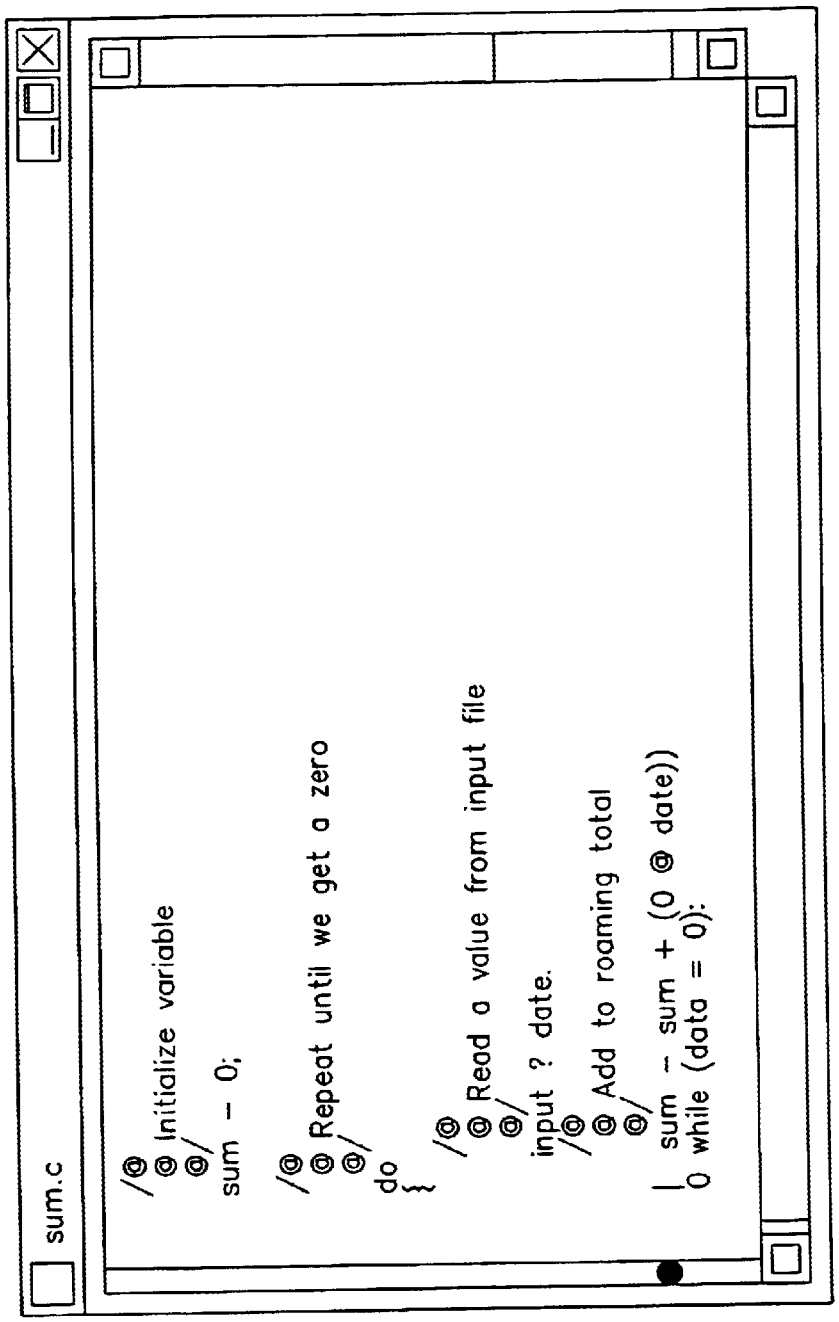
FIG. 7 illustrates a breakpoint, in accordance with one embodiment of the present invention.

To set a breakpoint, click in the code editor on the line where one wishes to set the breakpoint and then click the breakpoint button . A red circle may appear at the beginning of that line. When the debugger reaches that line, it may stop. FIG. 7 illustrates a breakpoint 700, in accordance with one embodiment of the present invention.

Optimize Code as Necessary

One can examine the depth and speed of the code by compiling with the -e option selected in the Compiler tab of the Project Settings dialog. This creates:

an html file for the project, project.html an html file for each file in the project files_c.html.

These files highlight the code according to the code area and timing. The project.html file has links to all the html files highlighting the source code. It also links to the 5 top areas and 5 top delays in the project. One can use this as a basis for optimizing the code. An example of progressive optimization is given later.

Compile for Release

When one is satisfied with the project, select Build>Set Active Configuration and choose the type of build required from the available configurations. Release allows one to simulate the project without the delays inherent in debug. It also allows one to compile Handel-C libraries without debug information to protect intellectual property. Target is one of VHDL and EDIF. These are files that are ready to be placed and routed. By default, most optimizations may be turned on.

Project Settings

Figure 8:
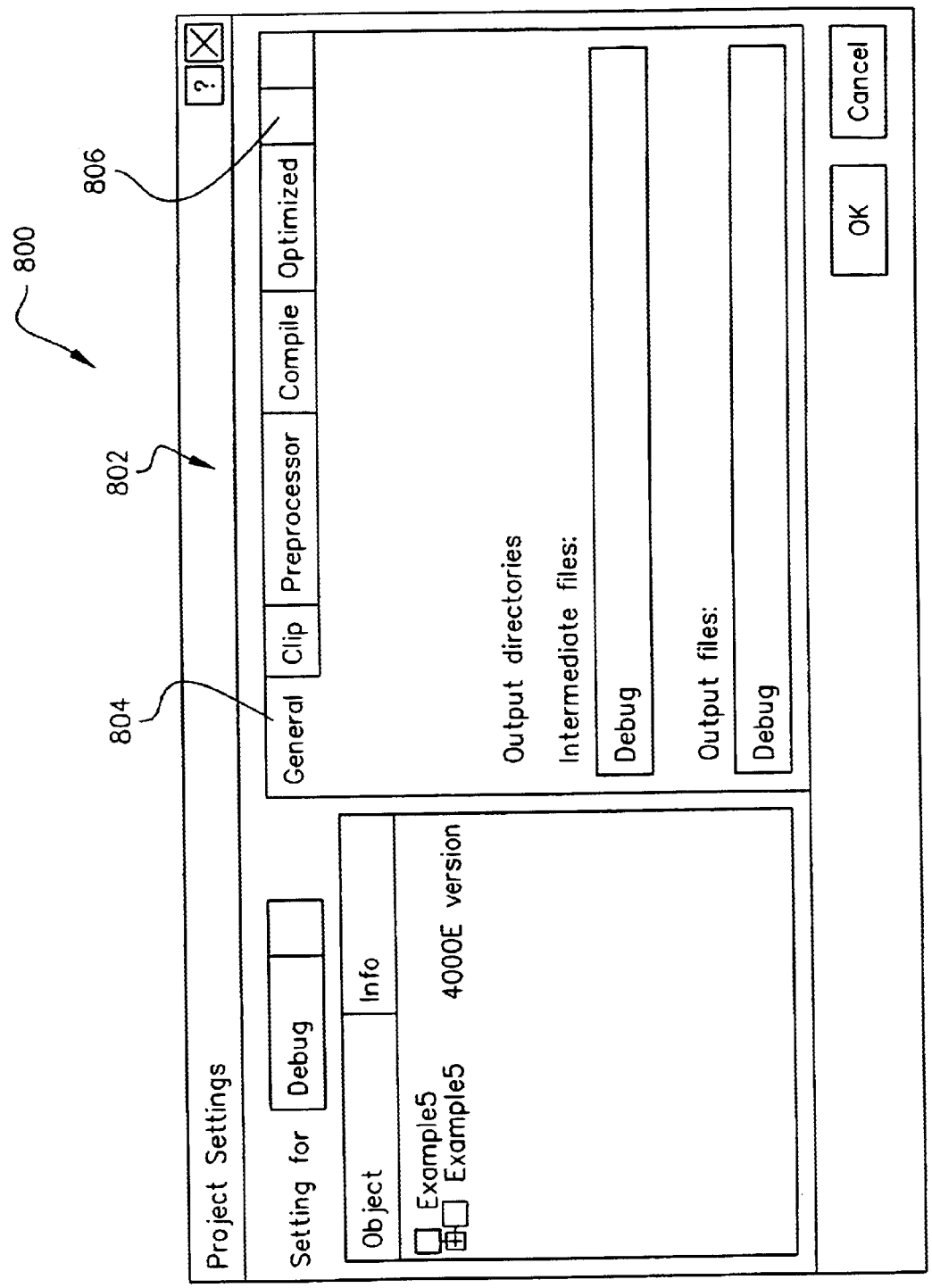
FIG. 8 illustrates a project settings interface, in accordance with one embodiment of the present invention.
Figure 9C:

FIG. 8 illustrates a project settings interface 800, in accordance with one embodiment of the present invention. Project settings define how projects are compiled and built. Select Project>Settings to see the Project settings dialog box. The different settings 802 are available via tabs 804. If one can't see the tab one want, then scroll the tabs by clicking on the arrows 806 at the end of the tabs. Note that some tabs are not available for an empty project. FIGS. 9A, 9B, and 9C illustrate available settings 900.

Independent Settings for Files

One can create independent settings for a file. A person might wish to do this if one wanted to change the optimization level for a particular file. Project settings for a file override the general project settings.

To create settings for a file, open the Project Settings dialog (either right-click the file in the File View and select Settings, or select Project>Settings).

Select the name of the file that one wishes to affect in the file pane of the Project Settings dialog.

Make the appropriate changes.

Configurations

There are three types of configuration that one can select from to build the application Debug (default)

Release

Target (VHDL, EDIF etc.)

Debug is used to build a configuration that can be simulated and debugged on the PC. In debug mode, one can view the contents of registers and step through the program's source code.

Release mode is used to create Handel-C intellectual property (libraries). It creates compiled code that has no debug messages and can be used in another program. Release mode can also be used for high-speed simulation.

In target mode, one gets a list of gates, ready to be placed and routed on an FPGA.

Defining Configurations

FIG. 10 illustrates a configurations graphical user interface 1000, in accordance with one embodiment of the present invention. One can save a particular combination of settings as a project configuration using the Build>Configurations menu item. This user-defined configuration can only be used in the project. Handel-C comes with four default configurations: Build 1002, Debug 1004, VHDL 1006 and EDIF 1008. One can copy one of these configurations and then make changes to it.

Select Build>Configurations . . .

Click the Add button in the dialog that appears.

Enter a name for the new configuration, and select the configuration type that one wishes to use as a base in the Copy settings from box.

More Complex Configurations

If one knows that he or she is going to have multiple projects (perhaps one needs to have two independent circuits on the same chip), it is better to create a workspace first and then add the projects to it.

If one has an existing workspace set up, it may be opened. Otherwise, select New from the File menu. Create a new workspace to store the project(s). One may be asked for its name and location (pathname for the directory that it may be stored in). Either type the pathname in the Location box, or use the . . . button to browse for a directory. Workspace files have .hw extensions.

Adding an Existing Project to a Workspace

Select Insert Project into Workspace from the Project menu.

Creating a Complex Project

If a project is a board or system, it may contain subprojects. When one creates a new complex project type (by writing a new .cf file) a dialog box appears when one clicks OK. The New Project Components dialog box asks what projects one wishes to use for the components of the project. One can either create a new project or select one within the workspace from the drop-down list. If the project exists but is not in the workspace, one can add it using the Insert Project button.

To ensure that the subprojects are built when one builds the complex project, he or she can set up the subprojects as dependent. Select Project>Dependencies . . .

One may be offered a list of the projects in the workspace. Check the ones that are desired to be rebuilt when building the complex project.

Dependencies

Dependencies are used to ensure that files that are not part of the project are updated during a build. They also specify the order that files may be compiled and built.

There are three types of dependencies used in Handel-C:

Project dependencies

File dependencies

External dependencies

The only one that can be changed directly is Project Dependencies. The others show information calculated by the compiler.

Project Dependencies

The Project>Dependencies . . . dialog allows one to select other projects within the workspace that this project is dependent on. Projects listed here may be rebuilt as necessary when the project is rebuilt.

If one is building a complex project, such as a board or system that has several chips on it, he or she can create a separate project for each chip, and make the system project dependent upon them.

File Dependencies

File dependencies are listed in the file properties. They specify the user include files that are not included in the project which are needed to compile and build a selected file. They also specify what other files within the project may be compiled before this file.

These dependencies are generated when one compiles a file. One can examine them by selecting a file in the File View pane of the workspace window and typing Alt+Enter or right-clicking the file name and selecting Properties from the shortcut menu.

External Dependencies

The External Dependencies folder appears in the workspace window after a project has been built. It contains a list of the header files required by the project that are not included in the project.

User Interface

The Workspace Window

The workspace window contains workspaces and projects. A workspace is simply an area that one keeps projects in. It allows one to organize the files that one need for each project. One could generally use one workspace per system (a system is the configuration that one are targeting).

A project consists of everything one need to create one or more net list files ready to be placed and routed on an FPGA, together with the project settings. Project settings provide information about where the files for the project are stored, the target chip for the project, how the compilation may work, and optimization requirements. Projects can be libraries (compiled Handel-C that is not targeted for a particular output), cores (a piece of code, such as a function), complete net lists for a chip, boards (net lists for several chips in a specified configuration) or systems (a combination of boards etc.). In one embodiment, the core may optionally be compiled to a net list.

The workspace window has two views:

File view

Symbol view

File View

Figure 11:
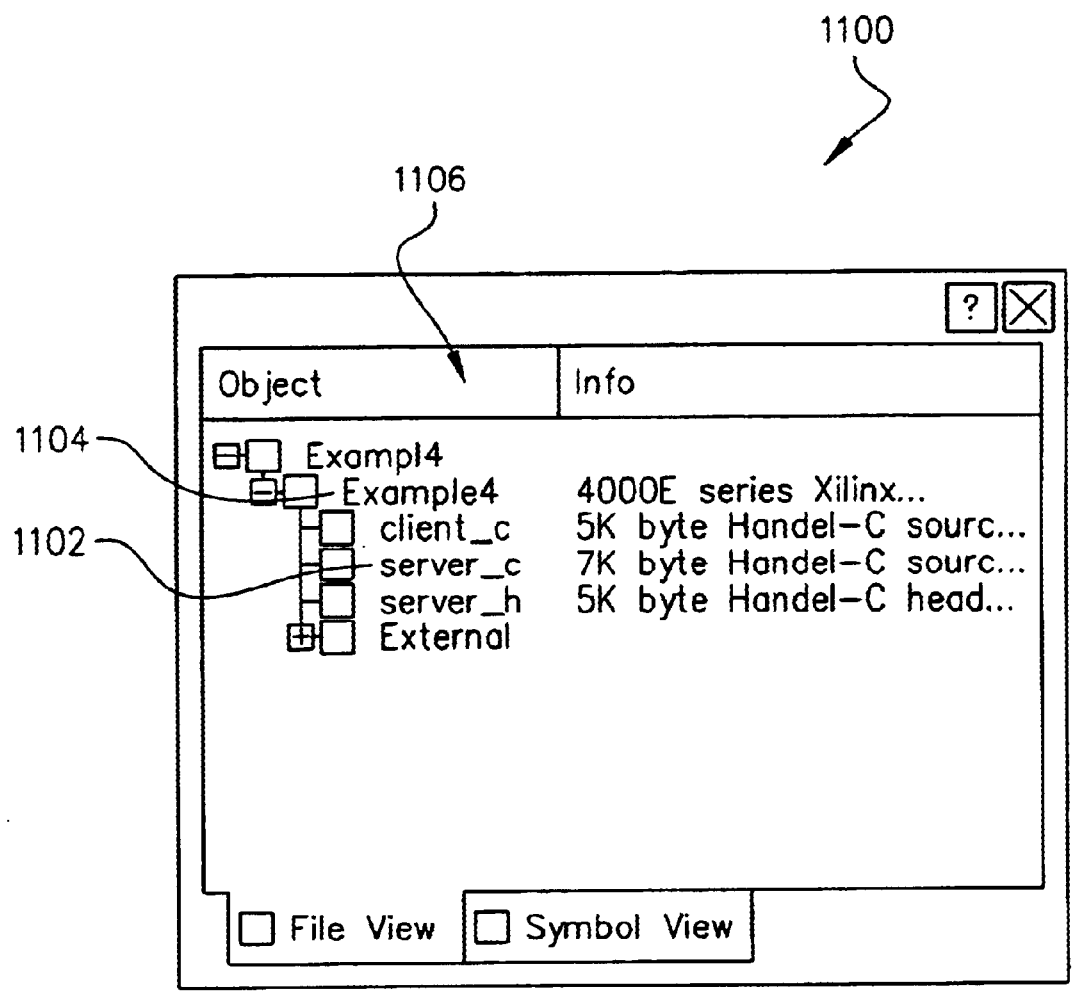
FIG. 11 illustrates a file view interface, in accordance with one embodiment of the present invention.

FIG. 11 illustrates a file view interface 1100, in accordance with one embodiment of the present invention. File view shows the workspace, its projects, and their source files and folders 1102. If there are multiple projects in a single workspace, the current project name 1104 may be in bold. The file view gives the structure of files in the project. It has no relationship to the way one has stored files on a hard disk. It allows one to set up dependencies (what files are needed for this project and what files or projects they depend upon) and manage the project by seeing which files are used within it.

One can adjust the space given to the Object and Info columns 1106 by dragging the edge of the column heading. Double-clicking on a source file opens it in the code editor. Double clicking on anything else expands or contracts that branch of the workspace tree. Right-clicking on a filename or directory gives one a list of commonly-used commands.

File Properties

Figure 12:
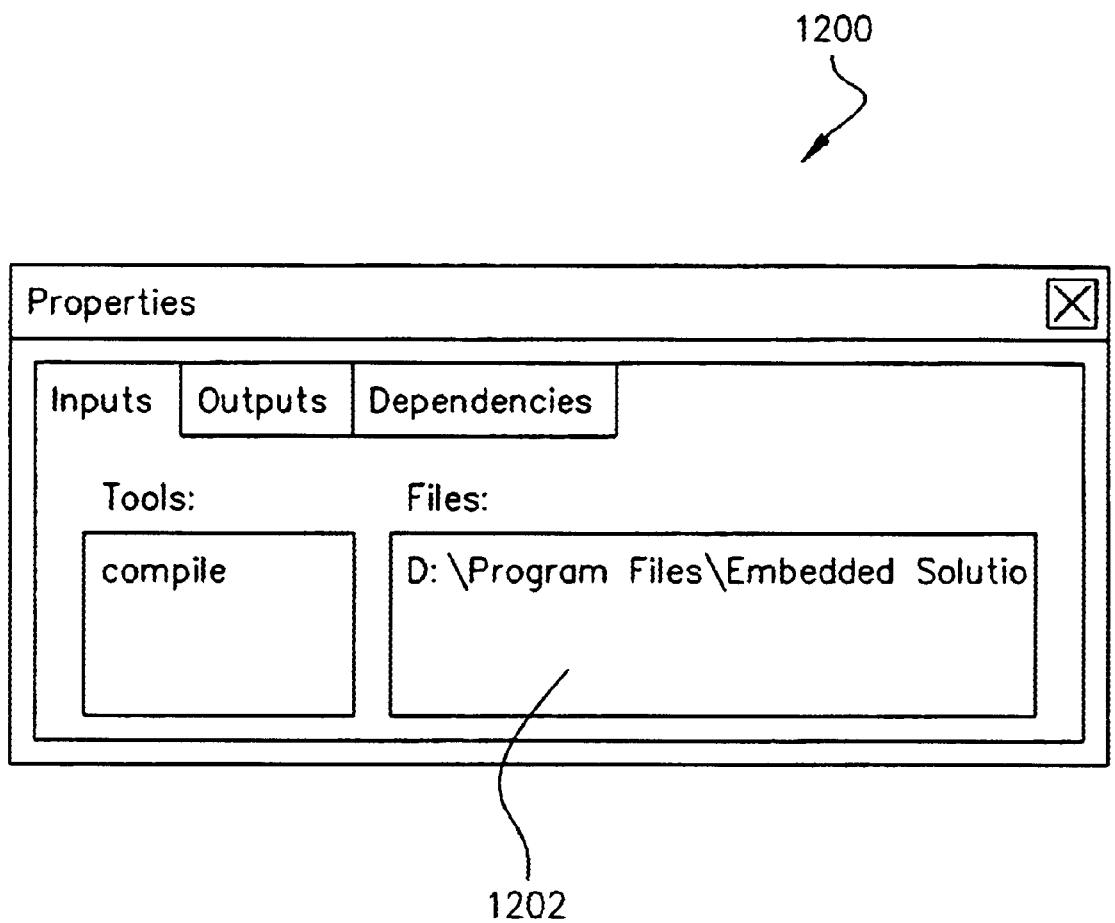
FIG. 12 illustrates a file properties, in accordance with one embodiment of the present invention.

FIG. 12 illustrates a file properties 1200, in accordance with one embodiment of the present invention. To operate, one may select a file or directory in the workspace window 1202, then select View>Properties. This displays:

Inputs The tools used and the source file pathname(s) that tool requires

Outputs The output files generated by the specified tool

Dependencies The header files (dependencies) this file requires.

Managing the Project Files

One can order the files within the project into folders. These folders are only used to organize the files. They do not exist as folders on the hard disk and have no effect on the directory structure.

Select Project>Add to Project>New Folder

Type the name of the folder in the dialog box that appears

Type the extension for the file types it should contain. One can leave the box blank.

Click OK

A new folder appears in the file view window.

Drag the files that are desired to be moved across to the folder.

Symbol View

Figure 13:
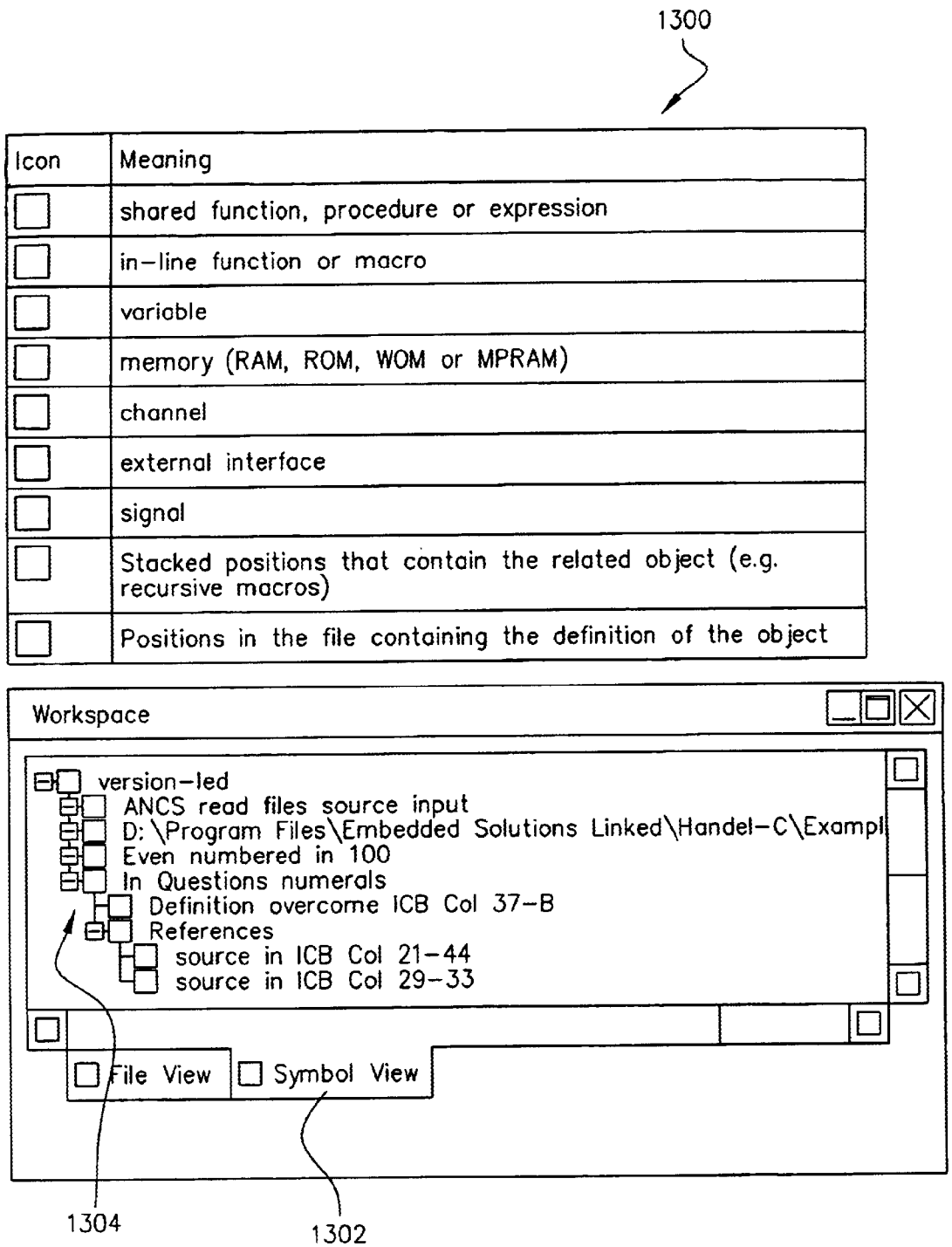
FIG. 13 illustrates a workspace interface and the associated icons, in accordance with one embodiment of the present invention.

FIG. 13 illustrates a workspace interface 1300 and the associated icons, in accordance with one embodiment of the present invention. A symbol is anything defined by the user (functions, variables, macros, typedefs, enums etc.). Symbol view allows one to see what one has in a project. It is empty before one builds a project. When one builds the project with the browse information enabled (set by default in the Debug configuration), a symbol table is created that allows one to examine the symbols defined and used in the project. Selecting the Symbol View tab 1302 of the workspace window then shows icons 1304 representing logic and architectural variables, functions and procedures.

Each icon is identified by its definition and use (references). External symbols (external variables and function names) appear in alphabetical order.

Double-clicking on a symbol expands it if it is expandable: if not, it opens the relevant source code file, with the appropriate line tagged Local symbols appear in alphabetical order within the function or procedure where they are defined.

Figure 14:
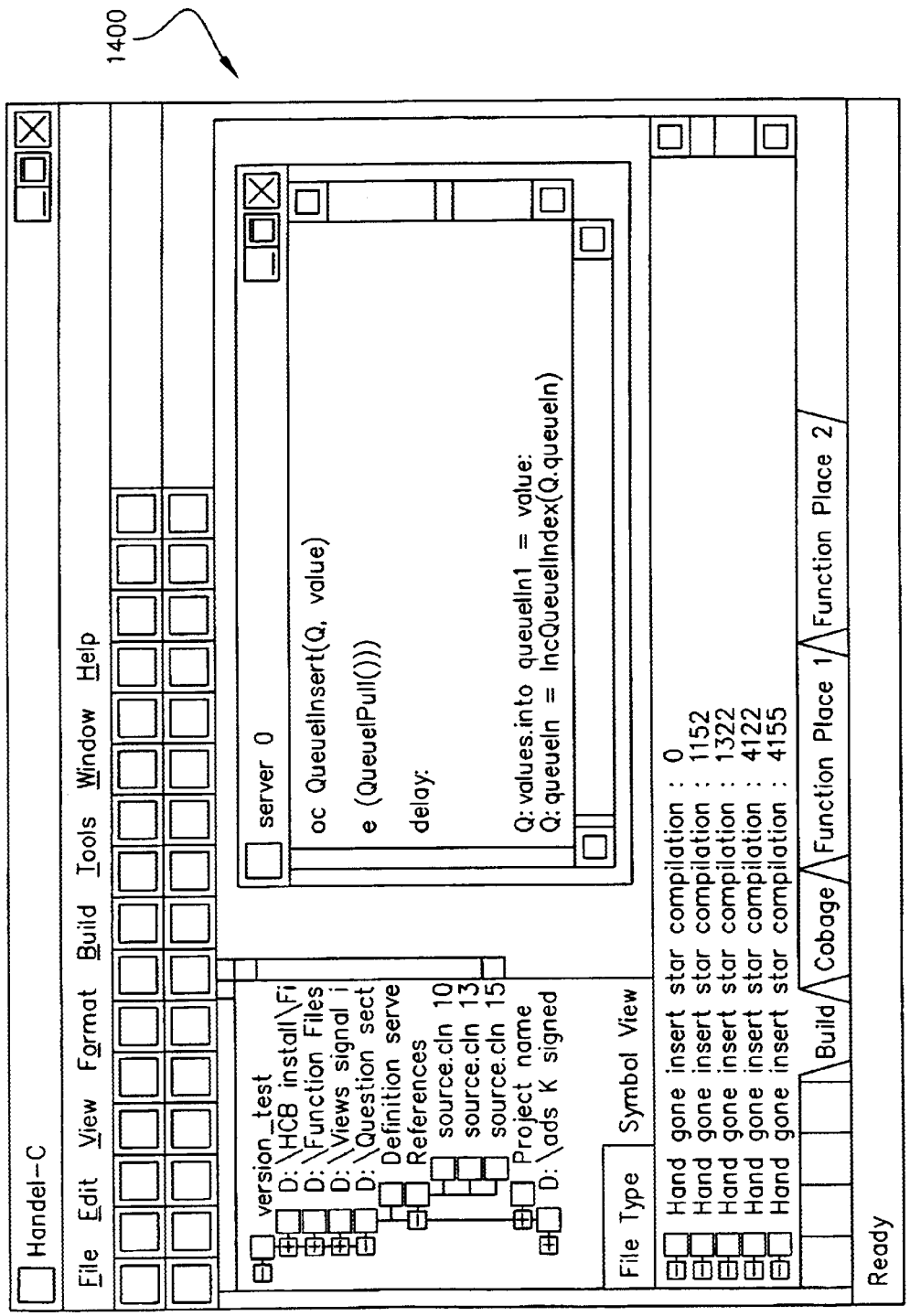
FIG. 14 illustrates a version test interface, in accordance with one embodiment of the present invention.

FIG. 14 illustrates a version test interface 1400, in accordance with one embodiment of the present invention.

The Source Browser

Figure 15:
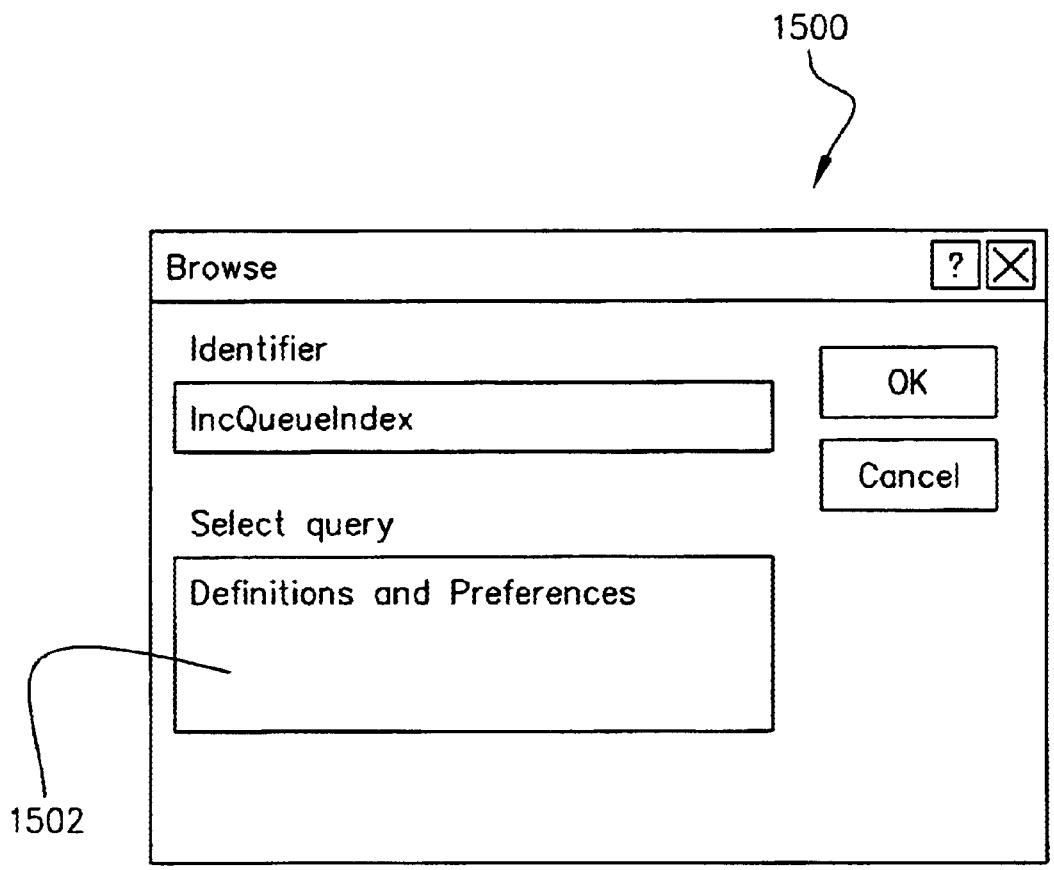
FIG. 15 illustrate a browse and associated results interface, in accordance with one embodiment of the present invention.

FIG. 15 illustrate a browse and associated results interface 1500, in accordance with one embodiment of the present invention. One can browse for definitions and references 1502 without using symbol view. When one selects the Source Browser command from the Tool menu, one is given a Browse dialog box.

Enter the symbol being searched for, and a dialog box may be shown giving its definition and references to it.

Browse Commands

Figure 16B:

If one selects a symbol name in a source file, one can use the browse commands and buttons to find its definitions and references in all the files used in a project. FIGS. 16A and 16B illustrate browsing commands 1600, in accordance with one embodiment of the present invention.

Editing

The Code Editor

The code editor is a simple editor that resides in its own window. The syntax is color coded. One can change the color codes by selecting the Format tab from the Tools>Options dialog box. The default values are:

Comments green

Handel-C keywords blue

Number black

String black

Operator black

One can use standard editing commands within the code window. These are accessible from the Edit menu. FIG. 17 is a table of editing commands 1700, in accordance with one embodiment of the present invention. The Edit menu also has the Bookmarks and Browse sub-menus and the Breakpoints command.

Find Commands

Handel-C has simple Find and Replace commands that allow one to search for text in the current file, and the Find in Files command, which allows one to search for a string in all the files in a directory. The output from this command can be sent to two different window panes, allowing one to view the results of two searches. To choose which pane is selected check or uncheck the Output to pane 2 box in the Find in Files dialog.

These searches work line by line, which means that one cannot match text that spans more than one line. One can also search using regular expressions. To do this, check Regular expression in the Find and Find in Files dialog box. The regular expressions supported are listed below. FIG. 18 is a table of regular expressions 1800, in accordance with one embodiment of the present invention.

Bookmarks Submenu

The Bookmarks submenu allows one to set and clear bookmarks within the files. Once one has set bookmarks in the file, one can move through the bookmarks by selecting Next Bookmark (F2) or Previous Bookmark (Shift F2).

To Set a Bookmark

Select the line where one wishes to place the bookmark

Press the toggle bookmark button OR

Right-click the line and select Toggle bookmark from the shortcut menu that appears OR Select Edit>Bookmarks>Toggle Bookmark (Ctrl F2).

To Move to a Bookmark

Select Edit>Bookmarks>Next Bookmark (F2) or press the next bookmark button to move forward through the bookmarks Select Edit>Bookmarks>Previous Bookmark (Shift F2) or press the previous bookmark button to move backwards.

To Remove a Bookmark

Select the line where one wishes to clear the bookmark

Press the toggle bookmark button OR

Right-click the line and select Toggle bookmark from the shortcut menu that appears OR Select Edit>Bookmarks>Toggle Bookmark (Control F2).

To Remove All Bookmarks

Select Edit>Bookmarks>Clear All Bookmarks (Control Shift F2) or press the clear all bookmarks button to clear all bookmarks Breakpoints Command The Breakpoints command allows one to set, enable and disable breakpoints. Breakpoints are fully discussed hereinafter in greater detail.

Breakpoints Alt+F9 Display a dialogue box for editing the breakpoints list for this project.

Browse Submenu

The Browse submenu allows one to find definitions of and references to selected variables or other symbols. If one makes a change to a variable, this is a quick way of finding everywhere that the variable is used.

To Find the Definition of a Variable or other Symbol

Select the symbol name in an edit window.

Select Edit>Browse>Go to Definition or click the button

To Find the First Reference to a Variable or other Symbol

Select the symbol name in an edit window.

Select Edit>Browse>Go to Reference or click the button

To Move through the References to and Definitions of a Variable or other Symbol

Select the symbol name in an edit window.

To move forward, select Edit>Browse>Next Definition Reference or click the button To move backward, select Edit>Browse>Previous Definition Reference or click the button To Return to the Position before Starting Browsing Select Edit>Browse>Pop Context or click the button Saving Changes If one has not saved changes to a file, an asterisk appears after the filename on the title bar. One may be asked if he or she wishes to save changes when a file is closed.

Files and Paths

The current directory is the directory containing the current project's .hp file. All relative pathnames are calculated from that current directory.

Project Files Generated

When one creates a workspace, a directory is created for that workspace. Projects within the workspace may be in the same directory or a sub-directory. When one builds a project, a directory is created for the build results. The default directory name is the name of the build type (Debug, Release, VHDL or EDIF). One can change this by setting the Output Directory values in the General tab of the Project Settings dialog.

These are the files built for a workspace prog.hw, containing a project example 1, consisting of one Handel-C file, prog.c that has been compiled for simulation. The files may all be stored in the Debug folder. FIG. 19 is a table of various project files 1900, in accordance with one embodiment of the present invention.

Search Paths

Code files that one has added to the project workspace may be compiled and built. Header files may only be found by the pre-processor if they exist on a known path.

The directories searched are in the following order:

1. Directory containing the Handel-C file that has the #include directive (if within quotes).
2. Directories listed in Project>Settings>Preprocessor>Additional include directories (in the order specified)
3. Directories listed in the Directories pane of the Tools>Options dialog (in the order specified)
4. Directories in the HANDELC_CPPFLAGS environment variable (in the order specified)

Windows and Toolbars

The Handel-C user interface has standard scrollable windows and customizable toolbars. One can customize:

The way the edit and build environment is laid out (position of workspace and output windows etc.)

The way document windows are laid out (this is specific to each workspace)

The debugger layout (the way windows look when you're in the debugger)

These layouts are stored. The edit and build and the debug layouts are kept for the copy of Handel-C. If one changes them, he or she changes them for every project. The document window layout is kept with the workspace, and can change whenever he or she changes the current workspace.

Window Types

Document windows are movable within the Handel-C window. One can resize them and drag them about. Docking windows can either be docked at one of the window margins, or can float above the other windows. When a window is docked it has no title-bar. If one has docked a code editor window, the file name appears in brackets after the project title in the Handel-C title bar. To float a docked window, double-click its border. To dock a floating window, either double-click its border, or drag its title bar to a docking position.

Splitting Windows

One can split text windows by dragging the small box immediately above the vertical scroll bar.

The Windows Menu

The windows menu allows one to control the size and display of editing windows. It has the following commands:

New window Create a copy of the current window

Split Split the window into two or four views.

Docking view Enable/disable docking view of selected dockable window

Close Close current window

Close All Close all windows

Next Move to next pane of a split window

Previous Move to previous pane of a split window

Cascade Cascade all open windows with title bars visible

Tile Horizontally Display all windows, splitting the viewing area horizontally

Tile Vertically Display all windows, splitting the viewing area vertically

Arrange Icons Arrange minimized window icons along bottom of viewing area

Windows . . . Open Windows dialog

Windows Dialog

The Windows dialog gives the names of all open edit windows. A person can make one of them the current window, or select a group of windows to be saved, closed or tiled.

Full Screen Display

The Full Screen command on the Edit menu displays the code editor pane at maximum size. The normal menu bars and toolbars are not visible. To return to a normal view, click the no full screen button.

Toolbars

When one starts Handel-C, toolbars appear under the menu bar. They are:

The standard toolbar

Build mini-bar

Browse mini-bar

Debug mini-bar

Bookmark mini-bar.

Standard Toolbar Buttons

The standard toolbar buttons are a frequently used subset from the File, Edit and View menus.

Changing Toolbars

The toolbars in Handel-C are dockable. They can be docked at one of the edges of the Handel-C window, or they can float. One can change a toolbar from docked to floating and back by double clicking on it. One can move them by dragging the title bar or the double bar.

The Status Bar

The status bar is visible at the bottom of the Handel-C window. It displays information about items when the mouse is over them.

The Tools Menu

The tools menu has the Source Browser command and commands to customize the copy of Handel-C.

The Source Browser Command

The Source Browser command allows one to search for names of variables and functions within the code. It directs one to their definition and lists references to them. Its use is more fully discussed hereinafter in greater detail.

Customizing the Interface

Figure 20:
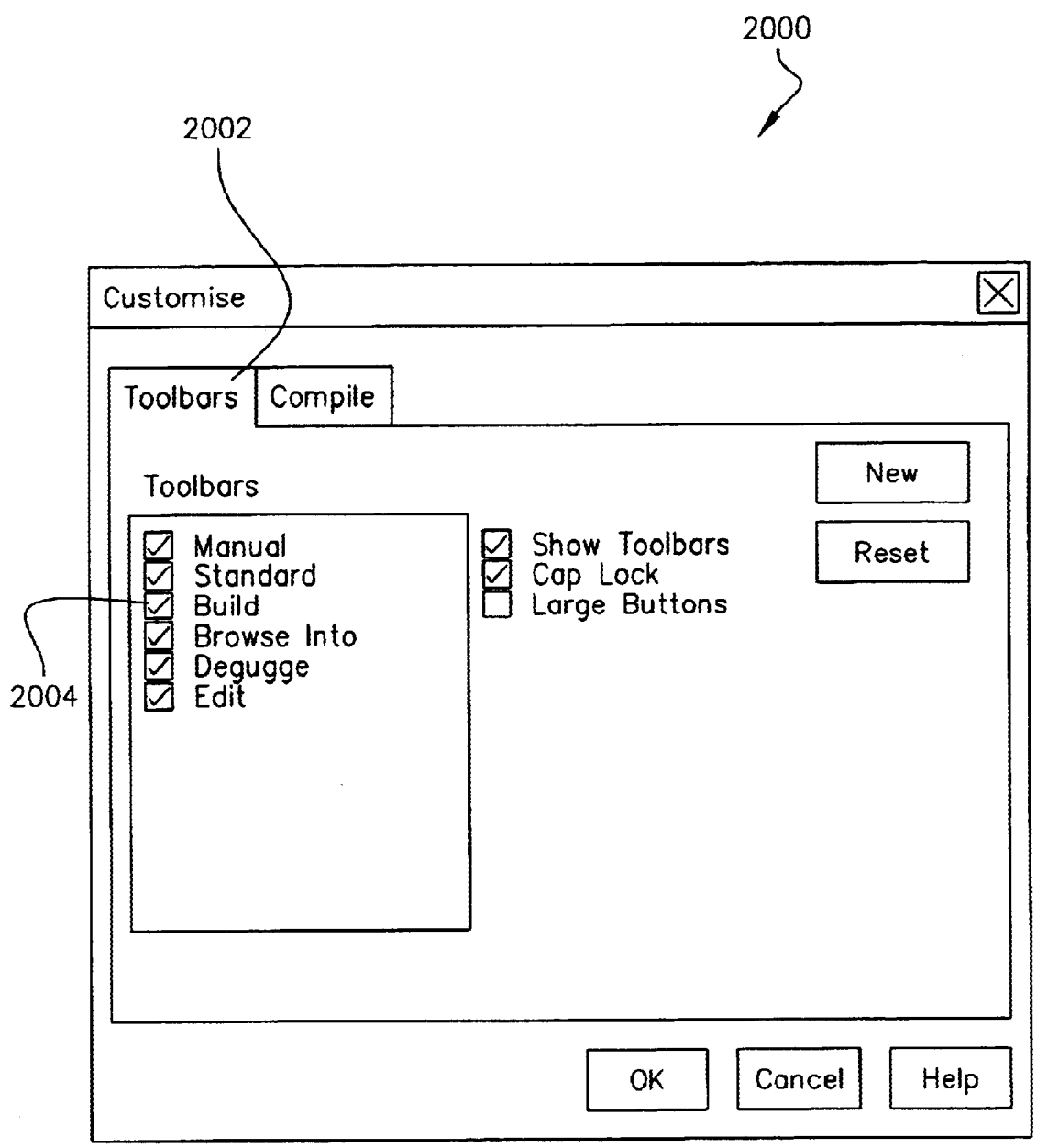
FIG. 20 illustrates a GUI for customizing the interface, in accordance with one embodiment of the present invention.

FIG. 20 illustrates a GUI 2000 for customizing the interface, in accordance with one embodiment of the present invention. The Customize . . . command brings up the Customize dialog. The Toolbar tab 2002 allows one to change the display of toolbars utilizing various options 2004, as shown. To use, one may check a toolbar in the toolbar pane to display it, uncheck it to hide it.

Show Tooltips Check this to popup the purpose of a button when the mouse cursor is over it.

Cool Look Check this to make the buttons appear two-dimensional

Large Buttons Check this to increase the button size

Large Icons Check this to have large icons on large buttons.

The Command tab allows one to add menus and buttons to the toolbar and menu bar. The right-hand pane displays the buttons and Menu commands available.

Select the button or menu that one wishes to add and drag it to the toolbar or menu bar. If one drags a menu command to a toolbar, it appears as a button. If one drags it to an empty area, it appears as a new floating window.

Removing Buttons and Menus

One can remove buttons from a toolbar by opening the Tools>Customize dialog and then dragging them off the toolbar. One can remove menus from the menu bar by opening the Tools>Customize dialog and dragging the menu name off the toolbar.

To restore a toolbar to its previous state, select the Toolbars tab of the Tools>Customize dialog. Select the toolbar (under the Toolbars tab) or the menu (under the Commands tab)

Options

The Tools>Options command allows one to set options:

Editor Set the window options for the editor. Define when files are saved.

Tabs Define how tabs are handled and whether Auto-Indent is used.

Debug Set the default base used to display numbers in the debug windows. This information is over-ruled by the Handel-C show specification.

Format Define the color and font of text and markers in windows.

Workspace Set the number of recently opened workspaces in the workspace list.

Directories Set the directories that may be searched for include and library files used in projects.

Editor

Vertical scroll bar Check to display vertical scroll-bar

Horizontal scroll bar Check to display horizontal scrollbar

Automatic window recycling Display files opened by the IDE (integrated development environment) in an existing window Selection margin Use a selection margin in the editor window to enable one to select paragraphs, etc.

Drag and drop text editing Edit by selecting an area, and dragging it to a new position Save before running tools Save files before running tools defined in the Tools menu Prompt before saving files Ask before saving Automatic reload of externally modified files If a file is open in Handel-C, and then modified by something outside Handel-C, load changes from disk automatically.

Tabs

File type Define settings for specified file types or define default settings.

Tab size Equivalent number of spaces per tab

Insert spaces/Keep tabs Select whether to use spaces or tabs in file

Auto indent Check to auto-indent text to above line's indent

Debug

Base for numbers Select default display base in debug windows

Format

Category Select window type(s) to modify

Font Select font to display text in

Size Select display font size

Colors Select text type to modify

Foreground: Set foreground color

Background: Set background color.

Sample Display sample text in selected settings

Reset All Return to default settings

Workspace

Default workspace list Set number of recent workspaces in the File>Recent Workspaces command Directories Show directories for: Select include path list or Library path list Add or remove directory paths to search for include files or library files.

Compiler

Figure 20A:
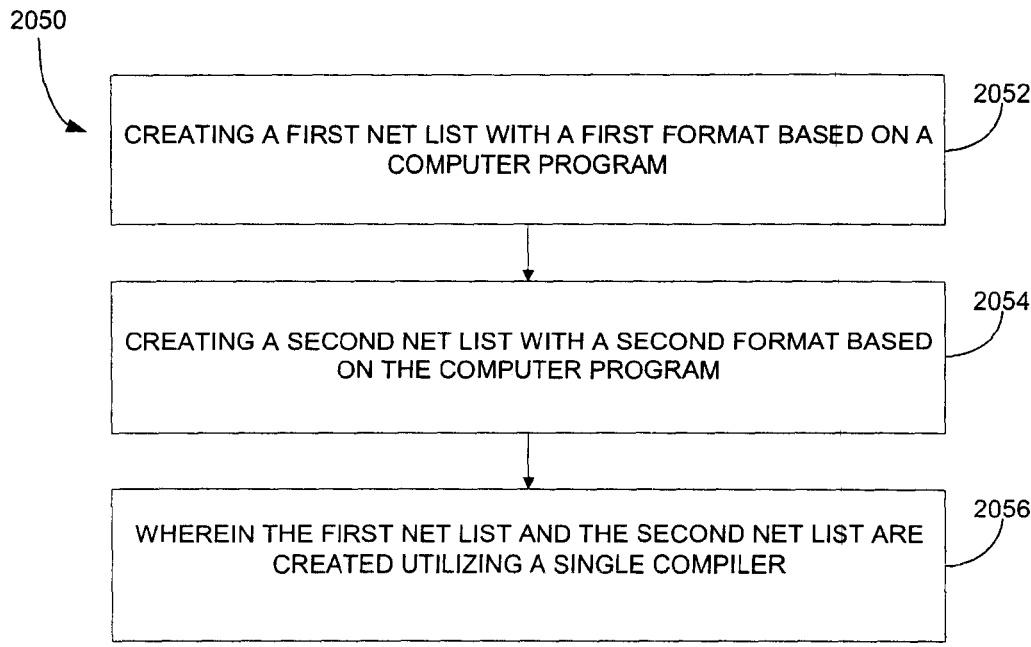
FIG. 20A illustrates a method for compiling a computer program for programming a hardware device.

FIG. 20A illustrates a method 2050 for a compiler capable of compiling a computer program for programming a hardware device. In general, in operation 2052, a first net list is created with a first format based on a computer program. Further, in operation 2054, a second net list is created with a second format based on the computer program. In an aspect of the present invention, the first format may include EDIF. As another aspect, the second format may include VDHL, XNF, etc. It should be noted, however, that any other formats may be employed per the desires of the user.

It is important to note that the first net list and the second net list are created utilizing a single compiler. Note operation 2056. As an option, the computer program from which the first net list was created may be the same as the computer program from which the second net list was created. More information regarding the compiler will now be set forth.

The Handel-C compiler compiles and optimizes Handel-C source code into a file suitable for simulation or a net list file which can be placed and routed on a real FPGA. The compiler is normally invoked automatically when the user selects an option from the Build menu.

Once the compile has completed, an estimate of the number of NAND gates estimate required to implement the design is displayed in the output window. The compiler uses the GNU preprocessor. Flags can be passed to the preprocessor using the Preprocessor tab of the Project>Settings dialog box. If one wishes to run the compiler from a command line, one may do so by using the command handelc. A complete list of the command line options is set forth hereinafter.

The Build Process

Figure 21:
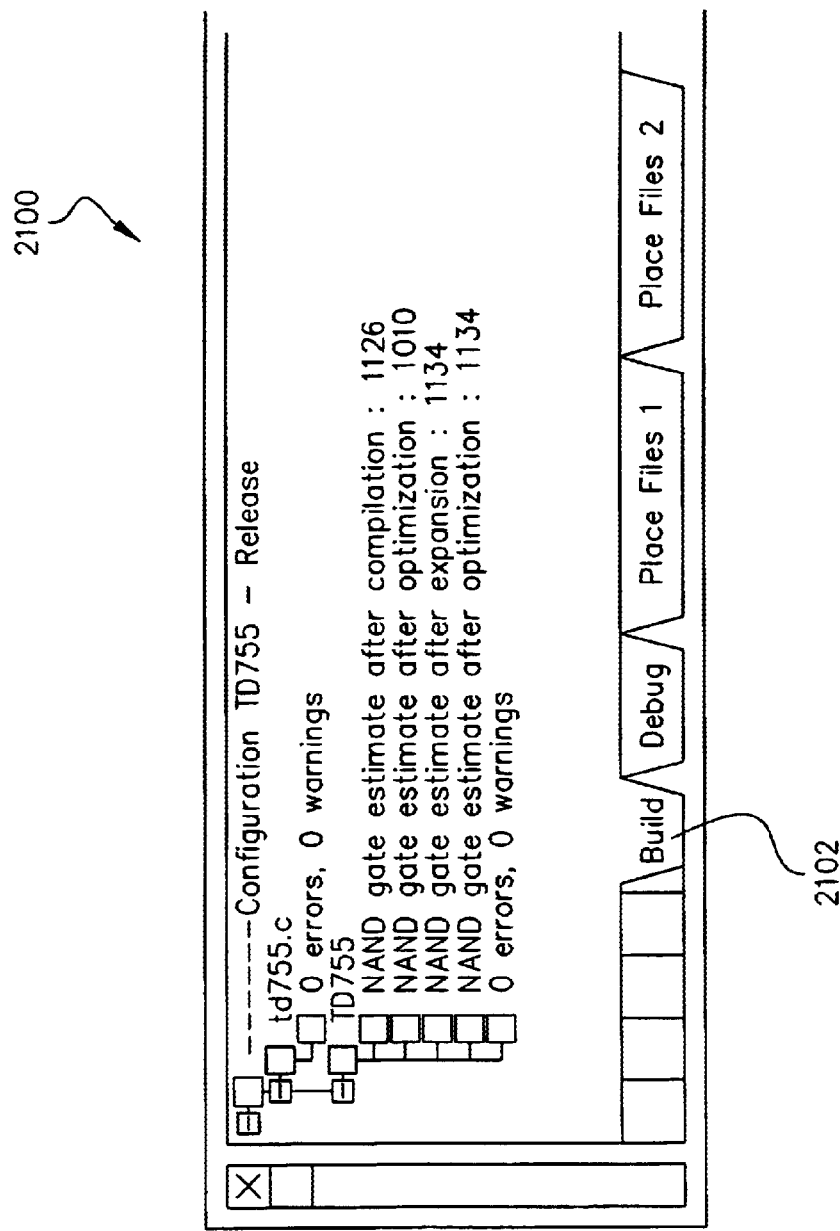
FIG. 21 illustrates a build interface, in accordance with one embodiment of the present invention.

FIG. 21 illustrates a build interface 2100, in accordance with one embodiment of the present invention. A build happens when:

one click on the build button 2102.

one has uncompiled files and one select one of the Start Debug commands in the Build menu.

one selects Build or Rebuild All from the Build menu This should:

preprocess header files and compile dependent header files compile any files that have been added, changed and saved since the last compilation and also compile any files dependent upon them.

compile all dependent projects.

link the compiled files together calculate the number of gates used build a symbol table generate a simulatable file or a net list.

If one changes the configuration for a project, he or she may need to compile all the files. Select the Build>Rebuild All command to ensure that all the files are recompiled.

The results of the compilation and build are displayed in the Build window. Double-clicking an error takes one to the appropriate line in the source file.

Checking Code Depth and Speed

One can examine the depth and speed of the code by compiling using the -e option. This creates:

an html file for the project, project.html an html file for each file in the projectfiles_c.html. These highlight areas of code according to how much area or delay may be required to implement it.

One can look at these files by opening them in any Internet browser. project.html.

The project.html file has links to all the files_c.html files that highlight the source code. It also links to the 5 top areas and 5 top delays in the project.

file_c.html

The html versions of the source files show two versions of the source code. The first is colored according to the area required to implement the code; the second according to the amount of delay. Cool colors (blues and greens) indicate a small area or delay; hot colors (red and yellow) show where there are large areas or delays. There are full color tables at the end of each section. The five largest delays and areas are underlined and tagged with the number of gates or logic levels needed. These estimates are only a guide since full place and route is needed to get exact logic area and timing information.

The Build Menu

FIG. 22 illustrates table showing a build menu 2200, in accordance with one embodiment of the present invention.

Debugger and Simulator

Figure 22A:
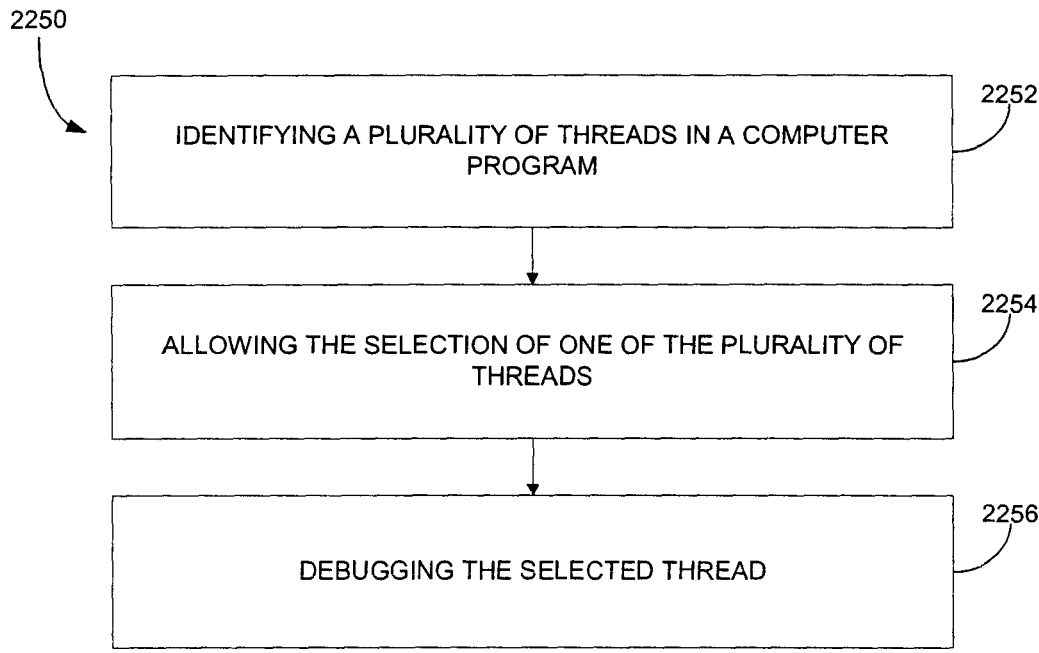
FIG. 22A illustrates a method for debugging a computer program, in accordance with one embodiment of the present invention.

FIG. 22A illustrates a method 2250 for debugging a computer program, in accordance with one embodiment of the present invention. In general, in operation 2252, a plurality of threads is identified in a computer program.

Selection of one of the threads is allowed in operation 2254. In another aspect, the thread may be selected by inserting a breakpoint in the computer program. As may soon become apparent, this or any other desired method may be used to carry out the selection. As such, the user can choose to jump between threads existing in the same clock cycle. Note use of the "follow" command hereinafter.

The selected thread is then debugged. See operation 2256. In one aspect of the present invention, a default thread may be initially debugged without user action (automatically). As an option, the default thread may be a thread that is first encountered in the computer program. In a further aspect, the debugging may utilize a clock associated with the selected thread.

The simulator thus allows one to test the program without using real hardware. It allows one to see the state of every variable (register) in the program at every clock cycle. One can select which variables are to be displayed by using the Watch and Variable windows. One can see the current threads running in the Threads window and the current clocks used in the Clocks window. A person can see the current function, and what functions were called to reach it, in the Call Stack window.

One can run the code in the simulator in several ways:

Run until the end (never ends on a continuous program loop)

Run until one reaches the current cursor position

Run until one reaches a user-defined breakpoint

Step through the code.

When one is using the debugger one can be running the simulation (run mode) or pausing the simulation (break mode). When the simulation has paused (in one of the ways given above or by using the Break command) one can easily examine variables, change window displays, or set breakpoints. When the simulation is in run mode, one can only observe.

When one starts the debugger, a Debug menu appears. FIGS. 23A and 23B illustrate the various commands 2200 associated with the debug menu, in accordance with one embodiment of the present invention.

One can also set breakpoints on valid code lines. When the debugger reaches a breakpoint it may pause until one requests it to continue.

The Debugger Interface

The debugger interface consists of a plurality of windows. FIG. 24 illustrates a table 2400 showing the various windows associated with the debugger interface, in accordance with one embodiment of the present invention.

Symbols in the Editor Window

The statements associated with the current clock tick are marked with arrows. All of these statements execute together. If there is a par statement in the code, the execution may split into separate threads, one for each branch of the par statement. The threads execute in parallel. When one is debugging, one can only follow one thread at a time. The current thread has arrows marked in yellow and white. White arrows show combinatorial code that may be executed on the next clock tick. A yellow arrow shows the current point.

The other threads have the points that may be executed on the current clock cycle in dark gray. If one single-steps through the Handel-C code, one may see the arrows move.

The Variables Window

Figure 25:
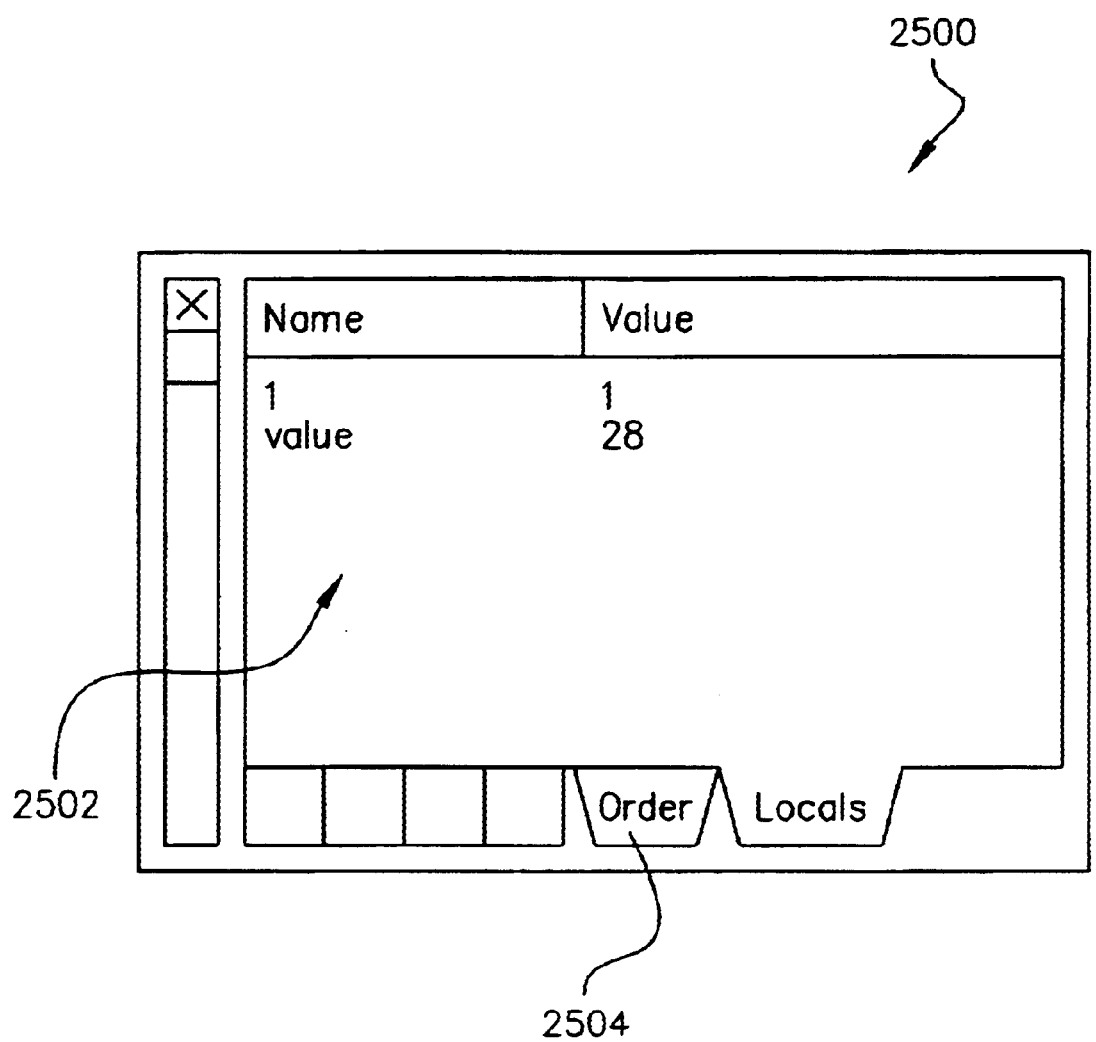
FIG. 25 illustrates a variables window interface, in accordance with one embodiment of the present invention.

FIG. 25 illustrates a variables window interface 2500, in accordance with one embodiment of the present invention. The Variables window always shows the current variables 2502. When their values change, the color changes from black to red. The window has two tabs 2504, Auto and Locals. The Auto tab shows variables that have been automatically selected. They are variables used in the current and previous statement in the current thread. It also displays return values when one comes out of or step overs a function.

The Locals tab shows the variables that are local to the current function or macro.

The Watch Windows

There are four watch windows. One can select variables to be displayed in each window, and look at their values at any breakpoint or as one step through the program.

One can add a variable to the watch window by typing its name. The watch window has an expression evaluator. If one types in an expression, the result may be evaluated.

The Call Stack Window

FIG. 26 illustrates the current positioning function blib 2600, and the related call stack window. The functions called on the way to the current function are displayed in the Call Stack window. This shows the current function at the top of the window, and the functions that have not yet completed beneath.

The current function in the current thread is marked with a yellow arrow. If multiple threads that are running different functions, the other current functions are marked with green arrows.

The Threads Window

Figure 27:
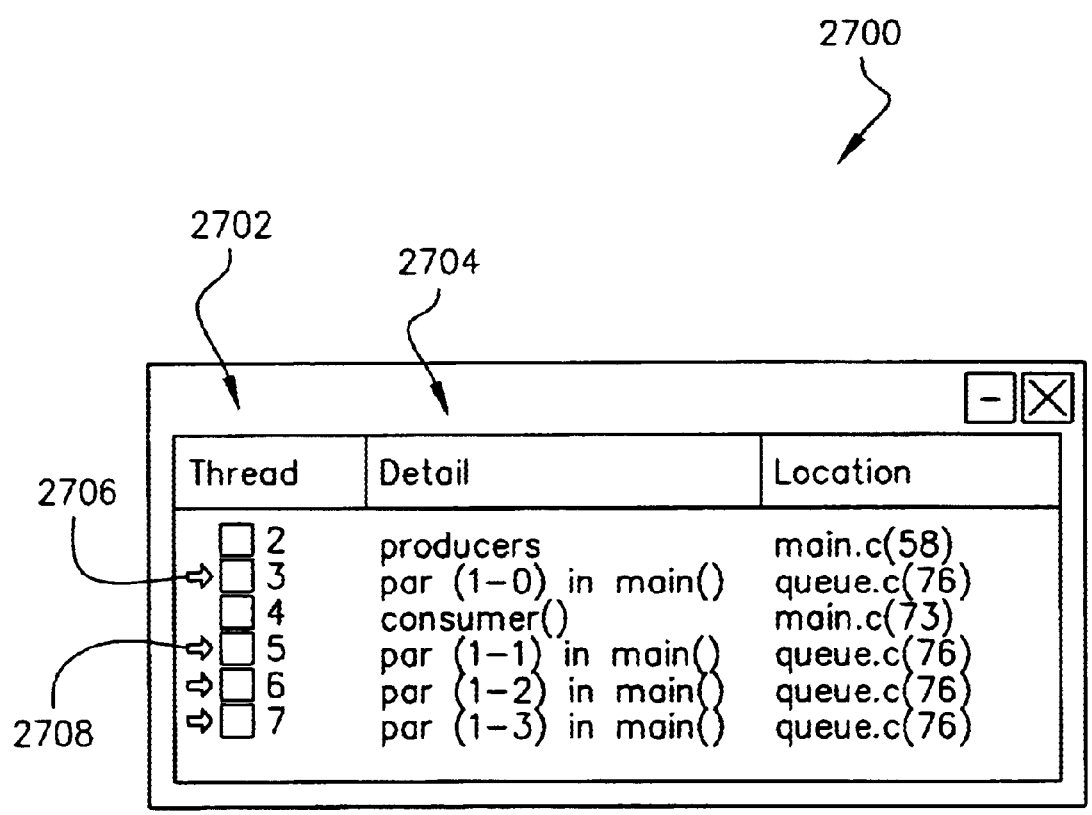
FIG. 27 illustrates a threads window interface, in accordance with one embodiment of the present invention.

FIG. 27 illustrates a threads window interface 2700, in accordance with one embodiment of the present invention. All threads 2702 are displayed in the Threads window.

The thread column shows the thread ID 2704 (how the simulator identifies the thread) The yellow arrow 2706 indicates the current thread. The grey arrows 2708 indicate threads with the same clock as the current thread. The Detail column gives an outline of the provenance of this thread. The picture shows four threads that are branches of the replicated par in queue.c. They are distinguished here by the par (i=XXX) detail. The Location column tells one the current line number of that thread in the code.

Right-click in the Threads window to see a menu:
Show Location shows one the source file and scrolls to the right position
Follow tells the debugger to follow that thread (make it the current thread)

The Clocks Window

Figure 28:
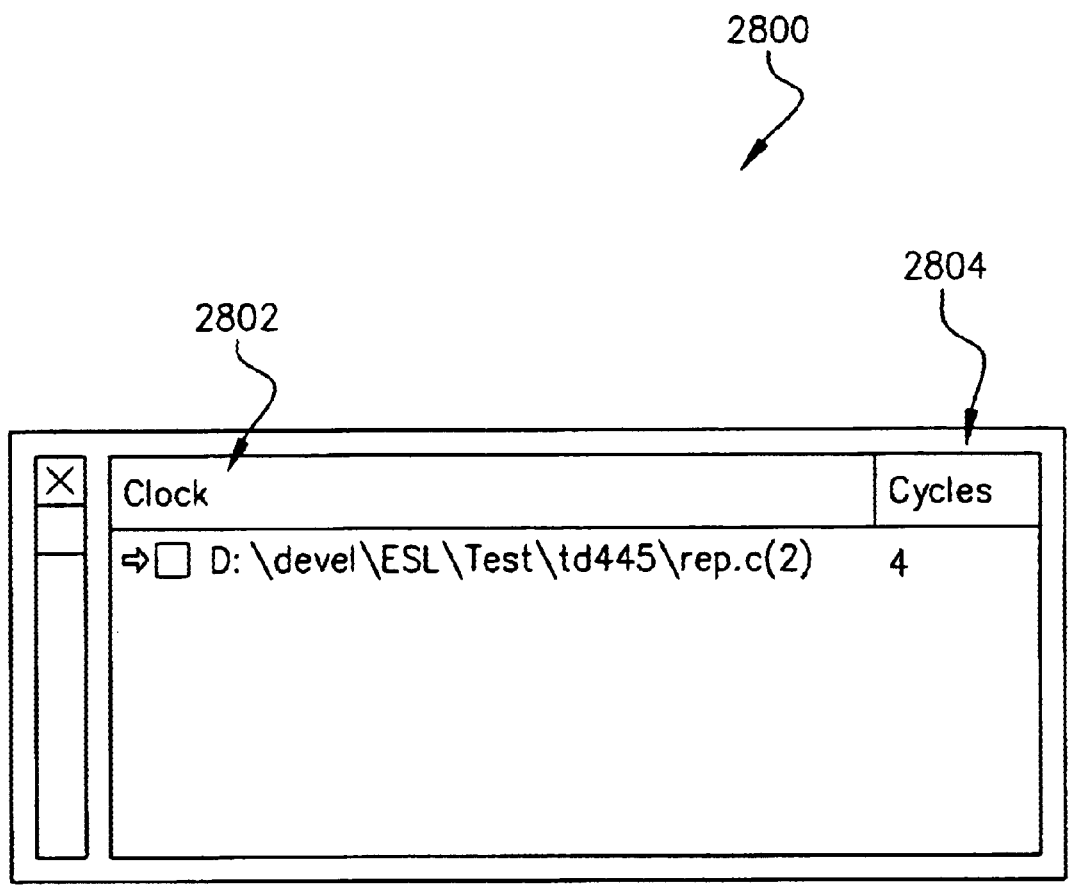
FIG. 28 illustrates a variables window interface, in accordance with one embodiment of the present invention.

FIG. 28 illustrates a variables window interface 2800, in accordance with one embodiment of the present invention. All clocks 2802 used are displayed in the Clocks window. The current clock is marked with a yellow arrow. It is identified by the full pathname of the file referencing it. The clock cycle count 2804 is also displayed in the Clocks window. Double-clicking a clock takes one to the clock definition.

Using the Debugger Commands

One can use the debugger commands to go through every line of the code, step over functions and macros, or the run the code until a breakpoint has been reached.

Single Stepping

The simulator steps through the program, one clock cycle at a time. Essentially, assignments, and reads and writes to channels take one clock cycle, everything else is 'free'. In a sequential language, such as ISO-C, one can step through code one line at a time, and one stop at an execution point. Because Handel-C is a parallel language, there can be multiple execution points. Because parallel threads are implemented as separate pieces of logic, multiple statements may execute on the same clock tick.

Single stepping through the program does not mean stepping through it one line at a time, or one statement at a time.

One can choose to Step Into, Step Out of or Step Over functions and macros. If one wants to move forward a single line, rather than a complete clock cycle, one can use the Advance command.

Using Breakpoints

Figure 29:
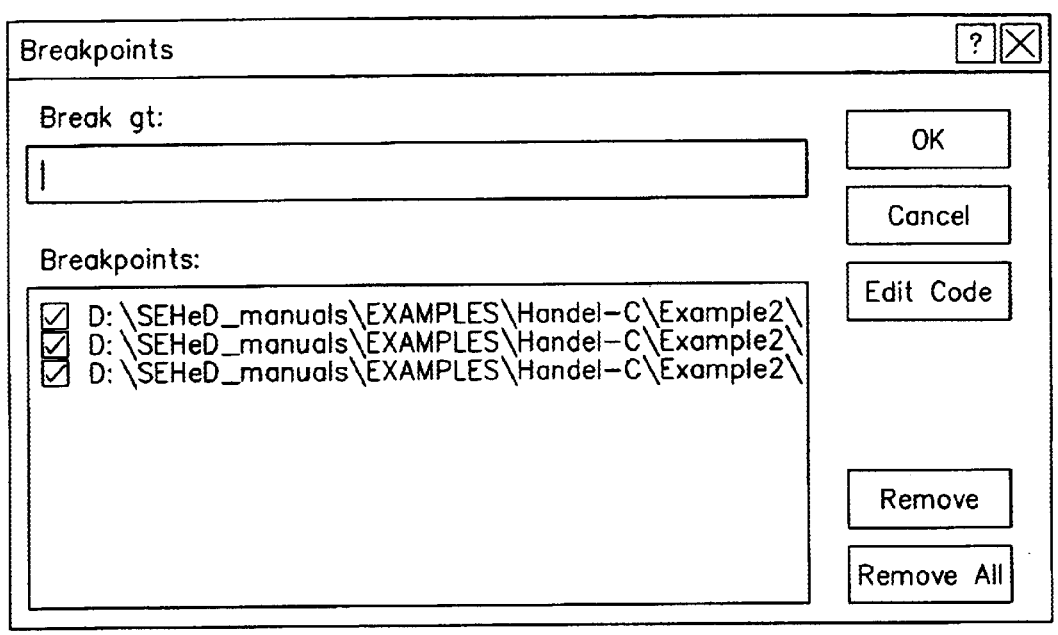
FIG. 29 illustrates a breakpoints window interface, in accordance with one embodiment of the present invention.

FIG. 29 illustrates a breakpoints window interface 2900, in accordance with one embodiment of the present invention. If a person does not wish to single-step through the code, one can run until he or she reaches a breakpoint.

Setting Breakpoints
Select the line of code where one wishes the simulator to pause. (Use Edit>Find to hunt for known names.)
Click the breakpoint button OR
Select Break from the Debug menu. OR
Right-click the mouse and select Insert Breakpoint Disabling Breakpoints
Breakpoints can be active or inactive. If one wishes to keep a breakpoint but not to stop at it,
Find the line of code where the breakpoint is set; right-click the mouse and select Disable Breakpoint
All breakpoints are listed in the Edit>Breakpoints dialog box. One can also disable a breakpoint by unchecking its box in this dialog.

Removing Breakpoints
Find the line of code where the breakpoint is set.
Click the breakpoint button OR
Right-click the mouse and select Remove Breakpoint OR
Open the breakpoints dialog (Edit>Breakpoints), select the
breakpoint(s) to be removed and click Remove.

Breakpoints in Replicated Code
If one sets a breakpoint in replicated code, a breakpoint may be set in every copy of the code. When one steps through it, the arrows may not appear to advance, but one can see the thread changing in the Threads window.

Breakpoints in Macros and Inline Functions
One cannot set breakpoints in macro expressions. If a person sets a breakpoint in an inline function or a macro procedure, the breakpoint may occur every time that the code is used.

Following Threads
The default thread followed is the one that appears first in the code. One can follow another thread by:
Selecting the code to follow in the code editor, right-clicking the mouse and selecting Follow Thread OR
Opening the Threads window, selecting a thread, right-clicking and selecting Follow Thread OR
By setting a breakpoint within that thread.
Setting a breakpoint in a thread makes that the current thread when the breakpoint is reached.

Selecting Clocks
The clock used is the one associated with the current thread. One can change the clock domain followed by:
following a different thread
setting a breakpoint within the thread to be followed
All clocks used are displayed in the Clocks window. The current clock is marked with a yellow arrow. It is identified by the full pathname of the file referencing it.
The current clock cycle count is also displayed in the Clocks window.

Following Function Calls
The way a function has been called is displayed in the Call Stack window. This shows the current function at the top of the window, and the uncompleted functions that called it beneath. The current function in the current thread is marked with a yellow arrow. If multiple threads are running different functions, the other current functions are marked with green arrows. If a function has stopped at a breakpoint, the breakpoint marker is shown in the Call Stack window.

Examining Variables
There are two windows for examining variable values
Watch
Variables
By default variables are displayed in decimal. One can change the base by right-clicking within the window and selecting a new value from the pop-up menu. One can change the display base of an individual variable using the Handel-C specification with {base=n}. One can turn off the display of a variable by using the Handel-C specification with {show=0}.
Int 32 Pike with {Show=0};

Arrays and structures are displayed with a +button next to the name. Click on this button to display individual array elements or structure members.

Configuration

In debug mode, the project configuration for debug is set by default.

Debug Configuration

The settings specific to debug are:

Preprocessor defines the variables DEBUG and SIMULATE. This allows one to set up the code (see examples below) according to whether a person is using the simulator, e.g. use simulator channels instead of real interfaces.

Compiler Generate Debug and Generate warning boxes checked

Linker Output format set to Simulator; Save browse info box checked; Generate estimation information option (create html files) switched off.

Debugger Working directory for debugger set to current (.).

Optimizations High-level optimization switched on.

Hardware Embodiments

If one is approaching Handel-C from a hardware background, one should be aware of these points:

Handel-C is halfway between RTL and a behavioral HDL. It is a high-level language that requires one to think in algorithms rather than circuits.

Handel-C uses a zero-delay model and a synchronous design style.

Handel-C is implicitly sequential. Parallel processes may be specified.

All code in Handel-C (apart from the simulator chanin and chanout commands) can be synthesized. so one may ensure that he or she disables debug code when he or she compiles to target real hardware.

Signals in Handel-C are different from signals in VHDL; they are assigned to immediately, and only hold their value for one clock cycle.

Handel-C has abstract high-level concepts such as pointers.

Points of Difference

If one is an experienced C user, he or she may be caught unawares by some of the differences between C and Handel-C. The differences are summarized hereinafter.

Figure 31:
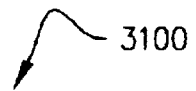

FIGS. 30 and 31 illustrate a table showing various differences 3100 between Handel-C and the conventional C programming language, in accordance with one embodiment of the present invention.

Porting C to Handle-C

Introduction

This section illustrates the general process of porting an existing conventional C routine to Handel-C. The general issues are discussed first and then illustrated with the particular example of an edge detection routine. This example illustrates the whole conversion process from conventional C program to optimized Handel-C program and also shows how to map conventional C onto real hardware. There is also a section detailing the differences between conventional C and Handel-C.

General Porting Issues

In general, there are a number of stages to porting and mapping a conventional C program to hardware. These are:

1. Decide on how the software system maps onto the target hardware platform. For example, external RAM connected to the FPGA can be used to hold buffers used in the conventional C program. This mapping may also include partitioning the algorithm between multiple FPGAs and, hence, splitting the conventional C into multiple Handel-C programs.
2. Convert the conventional C program to Handel-C and use the simulator to check correctness. Remember that there may be optimizations that can be made to the algorithm given that a Handel-C program can use parallelism. For example, one can sort numbers more quickly in parallel by using a sorting network. This form of coarse grain parallelism can provide massive performance gains so time should be spent on this step.
3. Modify code to take advantage of extra operators available in Handel-C. For example, concatenation and bit selection can be used where conventional C programs may use shifts and masks. Simulate again to ensure program is still correct.
4. Add fine grain parallelism such as making parallel assignments or executing individual instructions in parallel to fine-tune performance. Again, simulate to ensure that the program still functions correctly.
5. Add the hardware interfaces necessary for the target architecture and map the simulator channel communications onto these interfaces. If possible, simulate to ensure mapping has been performed correctly.
6. Use the FPGA place and route tools to generate the FPGA image(s).

These steps are obviously guidelines only—some of the stages may not be relevant to the design or one may require extra stages if the design does not fit this example flow. This list provides a starting point and guidelines for how to approach the process of porting the code. A full example follows after the section comparing C and Handel-C.

One of the most important factors in selecting a good partitioning of a program between hardware and software is to take into account the cost of communicating data between the two halves of the partition. The communication link between the hardware and software is determined by a number of parameters particular to a given target. These parameters include bandwidth, latency, and (per-message) overhead.

For some languages, it is possible to determine exactly the amount of data that would be transferred by an operation such as a function call, since all the data is passed in one direction by the arguments, and in the other direction by the return value. However, many other languages (including C) pass data implicitly using pointers. For these languages static analysis techniques cannot yield usefully accurate results. It is in this situation that the techniques presented are applicable.

One technique relies on dynamic analysis of the source program. The source program is compiled to platform independent bytecode. A suitable bytecode interpreter is augmented such that accesses to memory (typically load and store instructions) can be traced. In this way the memory use behavior of each part of the source program can be examined by executing the program and analyzing the generated trace. A simplistic implementation of this technique suffers from the problem of generating a very large amount of profiling data. The present embodiment uses two alternative techniques to solve this problem:

1. During execution of a single function (or set of functions grouped as a domain) the present embodiment records a map of all the memory accessed. At the end of execution of the function outputs only a compressed version of this map (compressed using a technique such as run-length encoding). Since functions may typically tend to use blocks of memory in ranges, rather than a fully random access pattern, this results in significant savings in the size of the generated output. The output is then analyzed post-hoc to determine where memory transfers would have taken place between domains of a partitioned system.
2. Alternatively, some of the analysis can happen on-line during the execution of the program. In this case, a memory map of the program is kept which records which functions (or groups of functions) have valid copies of small ranges of memory (micropages). When a function reads for an area of memory, this map is checked to see which functions have a valid copy of the data. If the current function has a valid copy no further action is taken. If no function has a valid copy of the data then it is taken as coming from an external source function. Otherwise a transfer from one of the other functions to the current function is recorded, and the map records that the current function now has a valid copy of the micropage. When a write occurs, exactly the same action takes place except the ownership of the micropage becomes only the current function, no other functions now possess valid (up-to-date) copies of the data in the given page. The result of the execution of a program in this way is a 2-dimensional table recording data transfers from functions to functions. This data can then be further analyzed to give estimates for the performance of given partitions, be used to decide partitions, or be presented in a graphical form (such as a directed graph). It has been assumed in the above that the compiled code is executed within a virtual machine. It is possible via modification to the compiler to generate native code with appropriate traps on memory accesses and calls to functions implemented either of the above strategies. This results in an improvement in performance over the bytecode alternative.

Comparison between Conventional C and Handel-C

This section details the types, operators, and statements available in conventional C and Handel-C. The tables should be used to get an idea of which parts of the conventional C program need to be altered. Differences in implementation between Handel-C and ISO-C:

Functions may not be recursive.

Old-style function declarations are not necessarily supported.

Variable length parameter lists are not necessarily supported.

One may not necessarily change the width of a variable by casting

One cannot convert pointer types except to and from void, between signed and unsigned and between similar structs Floating point is not necessarily supported, but may be supported (optionally) in some embodiments Statements in Handel-C may not cause side-effects. This has the following consequences:
local initializations are not supported.
the initialization and iteration phases of for loops may be statements, not expressions.

shortcut assignments (e.g. +=) may appear as standalone statements.

Types, Type Operators and Objects

FIG. 32 illustrates a table of types, type operators and objects 3200, in accordance with one embodiment of the present invention.

Statements

Figure 33:
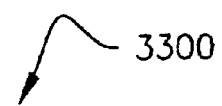
FIG. 33 illustrates a table of statements, in accordance with one embodiment of the present invention.

FIG. 33 illustrates a table of statements 3300, in accordance with one embodiment of the present invention.

Expressions

FIG. 34 illustrates a table of expressions 3400, in accordance with one embodiment of the present invention.

In Both/in Conventional C Only/in Handel-C Only

The Edge Detector Example (C to Handel-C)

The edge detector consists of a number of versions of the same application that detail the process of porting a conventional C application to a Handel-C application. All but the final stage (targeting real hardware) are presented as complete examples that may be simulated with the Handel-C simulator. They are stored as separate projects within a single workspace.

The original C code is supplied in source and compiled versions. One can execute this code, and simulate the different versions of the ported code. Note that the examples use specific hard-coded filenames for the image data. The image data filenames may be exactly the same as those given in the examples, or the source code may be edited and recompiled.

The Original Program

The example used in this section to illustrate the porting process is that of a simple edge detector. Each of the stages outlined in the previous section is illustrated with complete code listings. The original conventional C program is given below.

```
#include <stdio.h>
#include <stdlib.h>
/*
*Define name of input/output files
*/
#define SourceFileName "../Data/source.raw"
#define DestFileName "../Data/dest.raw"
/*
*Define parameters of image and threshold for edges
*/
#define WIDTH 256
#define HEIGHT 256
#define THRESHOLD 16
/*
*Edge detector procedure
*/
void edge_detect(unsigned char *Source, unsigned char
    *Dest)
{
int x, y;.Targeting Hardware
/*
*Loop round for every pixel
*/
for (y=1; y<HEIGHT; y++)
for (x=1; x<WIDTH; x++)
{
/*
```

```
*Determine whether there is an edge here
*/
if (abs(Source[x+y*WIDTH]-
Source[x-1+y*WIDTH])>THRESHOLD ||
abs(Source[x+y*WIDTH]-
Source[x+(y-1)*WIDTH])>THRESHOLD)
Dest[x+y*WIDTH]=0xFF;
else
Dest[x+y*WIDTH]=0;
}
}
/*
*Main program
*/
int main(void)
{
unsigned char *Source=malloc(WIDTH*HEIGHT);
unsigned char *Dest=malloc(WIDTH*HEIGHT);
FILE *FilePtr;
/*
*Read image from file
*/
FilePtr=fopen(SourceFileName, "rb");
fread(Source, sizeof(unsigned char), WIDTH*HEIGHT,
    FilePtr);
fclose(FilePtr);
/*
*Do edge detection
*/
edge_detect(Source, Dest);
/*
*Write results back to file
*/
FilePtr=fopen(DestFileName, "wb");
fwrite(Dest, sizeof(unsigned char), WIDTH*HEIGHT,
    FilePtr);
fclose(FilePtr);
return 0;
}
```

The file reads data from a raw data file into a buffer. The function edge_detect then performs a simple edge detection and stores the results in a second buffer which is stored in a second file. The edge detection is performed by subtracting the pixel values for adjacent horizontal and vertical pixels, taking the absolute values and thresholding the result. The source and destination images are both 8 bit per pixel greyscale images. The conventional C source file and a compiled version are provided along with an example image (source.bmp). One can run the program now to see the results. This is done using the following commands:

1. Convert the example BMP file to raw data with the bmp2raw utility.
   bmp2raw-b source.bmp source.raw 8bppdest.rgb
2. Execute the conventional C edge detector.
   edge_c
3. Convert the output from the edge detector back to a BMP file using the raw2bmp utility:
   raw2bmp -b 256 dest.raw dest_c.bmp 8bppsrc.rgb One can use the standard Windows 98 and NT Paint utility to display the source and destination BMP files to compare results.

First Attempt Handel-C Program

The first step is to port the conventional C to Handel-C with as few changes as possible to ensure that the resulting program works correctly. The file handling sections of the original program are modified to read data from a file and write data back to a file using the Handel-C simulator. The resulting program is given below.

The following points should be noted about the port:

1. The Source and Dest buffers have been replaced with two RAMs.
2. An abs ( ) macro expression provided in stdlib.h has been used to replace the standard C function.
3. The x and y variables have been given widths equal to the number of address lines required for the RAMs to simplify the index of the RAM. Without this, each variable would have to be padded with zeros in its MSBs to avoid a width conflict when accessing the RAM.
4. Temporary variables have been used for the three pixels read from RAM to avoid the restriction on only one access per RAM per clock cycle. Without these variables, the condition for the if statement would require multiple accesses to the Source RAM.
5. The pixel values may be extended by one bit to ensure the subtract does not underflow.
6. The Input and Output channels are declared to read from and write to files for simulation. The file name is given using the with specification, e.g. chanin unsigned Input with {infile="../Data/source.dat"};

To execute the Handel-C code:

1. Convert the example BMP file to text data with the bmp2raw utility by typing:
   bmp2raw source.bmp source.dat 8bppdest.rgb
2. Open the Handel-C edge detector workspace (Examples/Handel-C/Examples/ExampleC/ExampleC.hw) by double-clicking on it. Build and run the project.
3. Convert the output from the edge detector back to a BMP file using the raw2bmp utility by typing:
   raw2bmp 256 dest.dat dest $_{13}$v1.bmp 8bppsrc.rgb.

Example Code Version 1
```
/***********************************************
 *****************
*Description*
*Handel-C edge detector example program—First pass.*
**
*To test open the workspace file 'ExampleC.hw'.*
**
 ***********************************************
 *****************
/
*
*Define a clock
*/
set clock=external "P1";
/*
*Define parameters of image and threshold for edges
*/
#define LOG2_WIDTH 8
#define WIDTH 256
#define LOG2_HEIGHT 8
#define HEIGHT 256
#define THRESHOLD 16
```

```
/*
*Declare RAMs for source and destination images
*/
ram unsigned char Source[WIDTH*HEIGHT];
ram unsigned char Dest[WIDTH*HEIGHT];
/*
*Declare a macro for absolute value
*/
macro expr abs(a)=(a<0? -a: a);
/*
*Edge detector procedure
*/
void edge_13 detect( )
{
unsigned (LOG2_WIDTH+LOG2_HEIGHT) x;
unsigned (LOG2_WIDTH+LOG2_HEIGHT) y;
int 9 Pixel1, Pixel2, Pixel3;
/*
*Loop round for every pixel
/*
for (y=1; y<HEIGHT; y++)
γ
for (x=1; x<WIDTH; x++)
{
Pixel1=(int)(0 @ Source[x+y*WIDTH]);
Pixel2=(int)(0 @ Source[x-1+y*WIDTH]);
Pixel3=(int)(0 @ Source[x+(y-1)*WIDTH]);
/*
*Determine whether there is an edge here
*/
if (abs(Pixel1-Pixel2)>THRESHOLD ||
abs(Pixel1-Pixel3)>THRESHOLD)
{
Dest[x+y*WIDTH]=0xFF;
}
else
{
Dest[x+y*WIDTH]=0;
}
}
}
}
/*
*Main program
*/
void main(void)
{
chanin unsigned Input with {infile="../Data/source.dat"};
chanout unsigned Output with {outfile="../Data/dest.dat"};
unsigned (LOG2_WIDTH+LOG2_HEIGHT) i;
unsigned (LOG2_WIDTH+LOG2_HEIGHT) j;
/*
*Read image from file
/*
for (i=0; i<HEIGHT; i++)
for (j=0; j<WIDTH; j++)
Input ? Source[j+i*WIDTH];
/*
*Do edge detection
*/
edge_detect( );
/*
*Write results back to file
*/
for (i=0; i<HEIGHT; i++)
for (j=0; j<WIDTH; j++)
Output ! Dest[j+i*WIDTH];
delay;
}
```

First Optimizations of the Handel-C Program

The next development stage is to change some of the operators familiar in C to operators more suitable for Handel-C. In the above example, every time the Source or Dest RAM is accessed, a multiplication is made by the constant WIDTH. The Handel-C optimizer simplifies this to a shift left by 8 bits but one could easily do this by hand to reflect the hardware more accurately and reduce compilation times. New macros may also be introduced to access the RAMs given x and y co-ordinates:

```
macro expr ReadRAM(a, b)=
((unsigned 1)0)@
Source[(0@a)+((0@b)<<8)];
macro proc WriteRAM(a, b, c)
Dest[(0@a)+((0@b)<<8)]=c;
```

Notice how the macros pad both the result and the co-ordinate expressions with zeros. This allows one to reduce the width of the x and y counters to 8 bits each and reduces clutter in the rest of the program. This width reduction does mean that the loop conditions may be altered because x and y are no longer wide enough to hold the constant 256. Instead, one could test against zero since the counters may wrap round to zero after 255.

The modified edge_detect function is shown below:

Example Code Version 2

```
void edge_detect( )
{
unsigned LOG2_WIDTH x;
unsigned LOG2_HEIGHT y;
int 9 Pixel1, Pixel2, Pixel3;
/*
*Loop round for every pixel
*/
for (y=1; y!=0; y++)
{
for (x=1; x!=0; x++)
{
Pixel1=(int)ReadRAM(x, y);
Pixel2=(int)ReadRAM(x-1, y);
Pixel3=(int)ReadRAM(x, y-1);
/*
*Determine whether there is an edge here
*/
if (abs(Pixel1-Pixel2)>THRESHOLD ||
abs(Pixel1-Pixel3)>THRESHOLD)
WriteRAM(x, y, 0xFF);
else
```

WriteRAM (x, y, 0);
}
}
To execute this version of the Handel-C code:

1. Make the version 2 project current within the ExampleC workspace by selecting Project>Set Active Project>Edge_v2:
2. Build and run the project by selecting Build>Build Edge_v2 followed by F5.
3. Convert the output from the edge detector back to a BMP file using the raw2bmp utility by opening a Command Prompt or MS-DOS window. Change to the Version 2 project directory and type: raw2bmp 256 dest.dat dest_v2. bmp 8bppsrc.rgb Adding Fine Grain Parallelism There are two areas in this program that can be modified to improve performance. The first is to replace for loops with while loops and the second solves the problem of multiple accesses to external RAM in single clock cycles.

The for loop expands into a while loop inside the compiler in the following way:

for (Init; Test; Inc)
Body;
becomes:
{
Init;
while (Test)
{
Body;
Inc;
}
}

This is normally not efficient for hardware implementation because the Inc statement is executed sequentially after the loop body when in most cases it could be executed in parallel. The solution is to expand the for loops by hand and use the par statement to execute the increment in parallel with one of the statements in the loop body.

The second optimization concerns the three statements required to read the three pixels from external RAM. Without the restriction on multiple accesses to RAMs the loop body of the edge detector could be executed in a single cycle whereas our current program requires four cycles, three of which access the RAM. What is needed is a modification to eliminate as many of these RAM accesses as possible.

Since it is not possible to access the external RAM more than once in one clock cycle, the only way to improve this program is to access multiple RAMs in parallel. It should also be clear that the current program accesses most locations in the external RAM three times. For example, when x is 34 and y is 56 the three pixels read are at co-ordinates (34,55), (33,56) and (34,56).

The first of these is also read when x is 34 and y is 55 and when x is 35 and y is 55 whereas the second is also read when x is 33 and y is 56 and when x is 33 and y is 57. If one can devise a scheme whereby pixels are stored in two extra RAMs when they are read from the main external RAM for the first time then they could simply access these additional RAMs to get pixel values in the main loop.

The first step is to store the previous line of the image in an internal RAM on the FPGA. This allows the pixel above the current location to be read at the same time as the external RAM is accessed. The second step is to store the pixel to the left of the current location in a register. The loop body then looks something like this:

Pixel1=ReadRAM(x, y);
Pixel2=PixelLeft;
Pixel3=LineAbove[x];
LineAbove[x]=Pixel1;
PixelLeft=Pixel1;

At first glance, it looks like things have been worse by increasing the number of clock cycles but one can now add parallelism to make it look like this:

par
{
Pixel1=(int)ReadRAM(x, y);
Pixel2=PixelLeft;
Pixel3=(int)LineAbove[x];
}
par
{
LineAbove [x]=Pixel1;
PixelLeft=Pixel1;
}

Note the LineAbove RAM may be initialized at the start of the image to contain the first line of the image and the PixelLeft variable may be initialized at the start of each line with the left hand pixel on that line. Since the second of these par statements and the if statement are not dependent on each other they can be executed in parallel. Putting all these modifications together gives an edge_detect procedure shown below.

Notice that the increment of y has been moved from the end of the loop to the start and the start and end values have been adjusted accordingly. This allows the increment to be executed without additional clock cycles which would have been required if it were placed at the end of the loop.

To execute this version of the Handel-C code:

1. Make the version 3 project current within the ExampleC workspace by selecting Project>Set Active Project>Edge_v3;
2. Build and run the project by selecting Build>Build Edge_v3 followed by F5.
3. Convert the output from the edge detector back to a BMP file using the raw2bmp utility by opening a Command Prompt or MS-DOS window. Change to the Version 3 project directory and type: raw2bmp 256 dest.dat dest_v3.bmp 8bppsrc.rgb Example Code Version 3
void edge_detect( )
{
unsigned LOG2_WIDTH x;
unsigned LOG2_HEIGHT y;
int 9 Pixel1, Pixel2, Pixel3, PixelLeft;
ram LineAbove[ ];
/*
*Initialise the LineAbove RAM
*/
x=1;
while (x!=0)
{
par
{

```
LineAbove [x]=ReadRAM(x, (unsigned LOG2_
    HEIGHT)0);
x++;
}
}
/*
*Loop for every line
*/
y=0;
while (y!=255)
{
/*
*Initialise the PixelLeft register
*/
par
{
x=1;
PixelLeft=(int)ReadRAM((unsigned LOG2_WIDTH)0,
    y+1);
y++;
}
/*
*Loop for every column
/*
while (x!=0)
{
/*
*Update pixel registers
*/
par
{
Pixel1=(int)ReadRAM(x, y);
Pixel2=PixelLeft;
Pixel3=(int)LineAbove[x];
}
/*
*Determine whether there is an edge here
*/
par
{
LineAbove[x]=(unsigned)Pixel1;
PixelLeft=Pixel1;
if (abs(Pixel1-Pixel2)>THRESHOLD
abs(Pixel1-Pixel3)>THRESHOLD)
WriteRAM(x, y, 0XFF);
else
WriteRAM(x, y, 0);
x++;
}
}
```

Further Fine Grain Parallelism

The core loop body has now been reduced from five clock cycles (including the loop increment) to 2 clock cycles. One can even do better because one should be able to access the two off-chip banks of RAM in parallel. Thus, the two parallel statements in the loop body could be executed simultaneously if one could organize the data flow correctly.

The program has been modified because the LineAbove internal RAM is accessed in both clock cycles. Paralleling the two statements is not permitted because it would involve two accesses to the same internal RAM in a single clock cycle. The solution is to increase the number of internal RAMs. The current line can be copied into one internal RAM while the previous line is read from a second internal RAM. The two internal RAM banks can then be swapped for the next line.

By also removing the Pixel1, Pixel2 and Pixel3 intermediate variables, the two statements in the loop body can be rolled into one. A person may use the LSB of the y coordinate to determine which line buffer to read from and which line buffer to write to. The external RAM read is done using a shared expression (RAMPixel) since one needs the value from the RAM in multiple places but only want to perform the actual read once.

The new version of the edge detector is shown below. The core loop is now only one clock cycle long and is executed 255 times per line. One extra clock cycle is required per line for the initialization of variables and 255 lines are processed. In addition, 255 cycles are required to initialize the on-chip RAM and one extra clock cycle per frame is required for variable initialization. This gives a grand total of 65536 clock cycles per frame or an average of exactly one pixel per clock cycle. Since there is no way of getting the image into or the results out from the FPGA any faster than this one can conclude that the fastest possible solution to our problem has been reached.

Example Code Version 4

```
void edge_detect( )
{
unsigned LOG2_WIDTH x;
unsigned LOG2_HEIGHT y;
int 9 PixelLeft;
ram unsigned char LineAbove0[ ], LineAbove1[ ];
unsigned 5 i;
/*
Initialise the x and y counters and the LineAbove RAM
*/
par
{
x=1;
y=0;
}
while (x!=0)
{
par
{
LineAbove0[x]=ReadRAM(x, (unsigned LOG2_
    HEIGHT)0)<-8;
x++;
}
}
/*
*Loop for every line
*/
while (y!=255)
{
/*
*Initialise the PixelLeft register
*/
par
```

```
{
x=1;
PixelLeft=(int)ReadRAM((unsigned LOG2_WIDTH)0,
    y+1);
Y++;
}
/*
*Loop for every column
*/
while (x !=0)
{
par
{
shared expr RAMPixel=(int)ReadRAM(x, y);
shared expr PixelAbove=(int)(y[0]==0 ? 0@LineAbove0
    [x]
0@LineAbove1[x]);
macro expr abs(a)=(a<0? -a: a);
/*
*Update pixel registers
*/
if (y[0]==1)
LineAbove0[x]=(unsigned)(RAMPixel<-8);
else
LineAbove1[x]=(unsigned)(RAMPixel<-8);
PixelLeft=RAMPixel;
/*
*Determine whether there is an edge here
*/
if (abs(RAMPixel-PixelLeft)>THRESHOLD ||
abs (RAMPixel-PixelAbove)>THRESHOLD)
WriteRAM(x, y, 0xFF);
else
WriteRAM(x, y, 0);
x++;
}
}
}
}
```
To execute this version of the Handel-C code:

1. Make the version 4 project current within the ExampleC workspace by selecting Project>Set Active Project>Edge_v4:
2. Build and run the project by selecting Build>Build Edge_v4 followed by F5
3. Convert the output from the edge detector back to a BMP file using the raw2bmp utility by opening a Command Prompt or MS-DOS window. Change to the Version 4 project directory and type: raw2bmp 256 dest.dat dest_v4.bmp 8bppsrc.rgb Adding the Hardware Interfaces Once the program has been simulated correctly one may add the necessary hardware interfaces. The interface with the host requires the same signals and timings as the example set out hereinafter. The code will now be taken from that example and used to produce two macro procedures—one to read a word from the host and one to write a word to the host. (These could also be implemented as functions) The suitably modified code looks like this:

```
// Read word from host
macro proc ReadWord(Reg)
{
while (ReadReady==0);
Read=1; // Set the read strobe
par
{
Reg=dataB.in; // Read the bus
Read=0; // Clear the read strobe
}
}
// Write one word back to host
macro proc Writeword (Expr)
{
par
{
while (WriteReady==0);
dataBOut=Expr;
}
par
{
En=1; // Drive the bus
Write=1; // Set the write strobe
}
Write=0; // Clear the write strobe
En=0; // Stop driving the bus
}
```

One also needs to define the pins for the external RAMs and remove the RAM declarations added to simulate the RAMs. The main program also needs to be modified to include the code to synchronies the frame grabber with the edge detector. The project settings need to be changed in the GUI. Set the configuration to VHDL or EDIF. This code is not designed for a specific device. One would need to know the appropriate pins for the device one are targeting. The pin definitions given are examples only and do not reflect the actual pins available on any particular device. The code excluding the edge detection and host interface macros is given below.

```
#define LOG2_WIDTH 8
#define WIDTH 256
#define LOG2_HEIGHT 8
#define HEIGHT 256
set clock=external "P1";
unsigned 8 Threshold;
// External RAM definitions/declarations
ram unsigned 8 Source[65536] with {
offchip=1,
data={"P1", "P2", "P3", "p4",
"P5", "P6", "P7", "p8"},
addr={"P9", "P10", "P11", "P12",
"P13", "P14", "P15", "P16",
"P17", "P18", "P19", "P20",
"P21", "P22", "P23", "P24"},
we={"P25"}, oe={"P26"}, cs={"P27"}};
ram unsigned 8 Dest[65536] with {
offchip=1,
data={"P28", "P29", "P30", "P31",
```

"P32", "P33", "P34", "P35"},
addr={"P36", "P37", "P38", "P39",
"P40", "P41", "P41", "P43",
"P44", "P45", "P46", "P47",
"P48", "P49", "P50", "P51"},
we={"P52"}, oe={"P53"}, cs={"54"}}};
macro expr ReadRAM(a, b)=
((unsigned 1)0) @ Source[(0@a)+((0@b) <<8)];
macro proc WriteRAM(a, b, c) Dest[(0@a)+((0@b) <<8)]=c;
ifndef SIMULATE
// Host bus definitions/declarations
unsigned 8 dataBOut;
int 1 En=0;
interface bus_ts_clock_in(int 4) dataB(dataBOut, En== 1) with
{data={"P55", "P56", "P57", "P58"}};
int 1 Write=0;
interface bus_out( ) writeB(Write) with
{data={"P59"}};
int 1 Read=0;
interface bus_out ( ) readB(Read) with
{data={"P60"}};
interface bus_clock_in(int 1) WriteReady( ) with
{data={"P61"}};
interface bus_clock_in(int 1) ReadReady( ) with
{data={"P62"}};
endif
Insert edge_detect, ReadWord and WriteWord function and macro
definitions here
void main(void)
{
ReadWord(Threshold);
while(1)
{
unsigned Dummy;
ReadWord(Dummy);
edge_detect( );
WriteWord (Dummy);
}

SUMMARY

The aim of this section has been to show the development of a real Handel-C program from conventional C to a full program targeted at hardware. Is has also shown the performance benefits of the Handel-C approach by demonstrating a real time application executing with a great deal of parallelism.

Targeting Hardware
Targeting Hardware via VHDL

If one is integrating Handel-C code with raw VHDL code, one would compile the Handel-C for debug, and use ModelSim to compile the VHDL for simulation. One could then compile the Handel-C to VHDL and use Simplify LeonardoSpectrum or FPGA Express to synthesize the code. One would then use Xilinx or Altera tools to place and route it.

Linking to the Handel-C VHDL Library

The HandelC.vhdl file may be supplied which supports all Handel-C VHDL files. To use Handel-C VHDL, one may compile the HandelC.vhdl file into a library called HandelC. (Consult the documentation for the synthesis or simulation tool on compiling library files.) A person also needs to compile the supplied file ROC.vhdl into the work library for simulation.

Connecting Handel-C EDIF to VHDL

If one compiles a Handel-C file to EDIF and wish to connect it to a VHDL, he or she may be aware that the ports in EDIF and VHDL are different. EDIF ports consist of a collection of single wires. VHDL ports are normally described as n-bit wide cables. To ensure that the generated EDIF can connect to the VHDL, the VHDL ports may be listed as single-bit wires.

VHDL Component Within Handel-C Project

Handel-C code
set clock=external "D17";
unsigned 4 x;
interface vhdl_component(unsigned 4 return_val)
vhdl_component_instance(unsigned 1 clk=_clock,
unsigned 4 sent_value=x);
etc . . .
unsigned 4 y;
y=vhdl_component_instance; // Read from VHDL component
x=y; // Write to VHDL component VHDL Code The VHDL entity may need an interface like this to be compatible with the Handel-C.
entity vhdl_component is
port (
clk: in std_logic;
sent_value_0: in std_logic;
sent_value_1: in std_logic;
sent_value_2: in std_logic;
sent_value_3: in std_logic;
return_val_0: out std_logic;
return_val_1: out std_logic;
return_val_2: out std_logic;
return_val_3: out std_logic
);
end;

Note that all the ports are 1-bit wide, standard_logic types. This is because when the Handel-C is compiled to EDIF, this is how the expanded interface appears. (EDIF cannot represent n-bit wide cables, only single wires).

Handel-C Component within VHDL Project

The Handel-C needs to have ports to its top level, so that the VHDL can connect to them.
unsigned 4 x;
interface port_in(unsigned 1 clk) ClockPort( );
interface port_in(unsigned 4 sent_value) InPort( );
interface port_out( ) OutPort(unsigned 4 return_value= x);
set clock=internal ClockPort.clk;
etc . . .
unsigned 4 y;
y=InPort.sent_value; // Read from top-level VHDL
x=y; // Write to top-level VHDL VHDL code The top level VHDL may need to instantiate the Handel-C like this:
component handelc_component
port (
  clk: out std_logic;
  clk: in std_logic;
  sent_value_0: in std_logic;
  sent_value_1: in std_logic;
  sent_value_2: in std_logic;
  sent_value_3: in std_logic;
  return_val_0: out std_logic;
  return_val_1: out std_logic;
  return_val_2: out std_logic;
  return_val_3: out std_logic
);
end component;.

Targeting Hardware via EDIF

To target hardware via EDIF, one may set up the project to target EDIF using the Build>Set Active Configuration command. This compiles directly to an .edf file which can be passed to the place and route tools.

Port Renaming for Debug

To aid in debugging the generated EDIF, one can rename the EDIF nets within the net list such that the Handel-C declaration name appears before the EDIF unique identifier.

To do so, select the Project>Settings . . . command. In the Project Settings dialog that opens, ensure that the EDIF is the type of settings that is being edited.

In the Compiler tab, check the Generate debug information box.

Setting up Place and Route Tools

Figure 35:
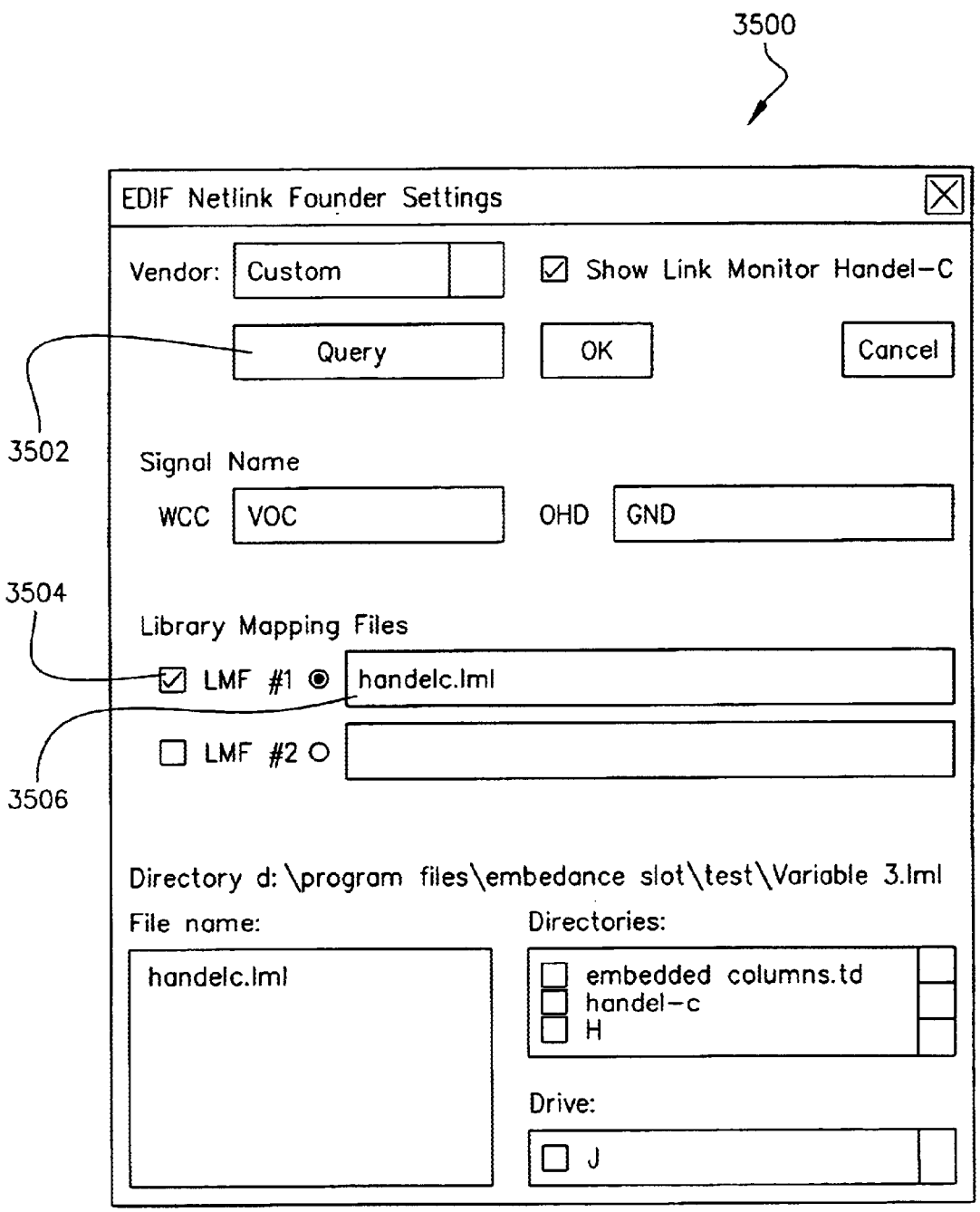
FIG. 35 illustrates a net list reader settings display, in accordance with one embodiment of the present invention.

FIG. 35 illustrates a net list reader settings display 3500, in accordance with one embodiment of the present invention. The Altera EDIF compiler requires a library mapping file. This is supplied as handelc.lmf.

Setting up MaxPlus II to use handelc.lmf
  Start MaxPlus II
  Open MaxPlus II>Compiler
  With the compiler selected, select Interfaces>EDIF Net list Reader Settings.
  In the dialog box, specify Vendor as Custom.
  Click the Customize>>button (3502)
  Select the LMF #1 radio button (3504). Set up the pathname (3506) for the handelc.lmf file.
  (Installed in Handel-C installation root\lmf.)

Setting up Quartus 2000 to use handelc.lmf

Figure 36:
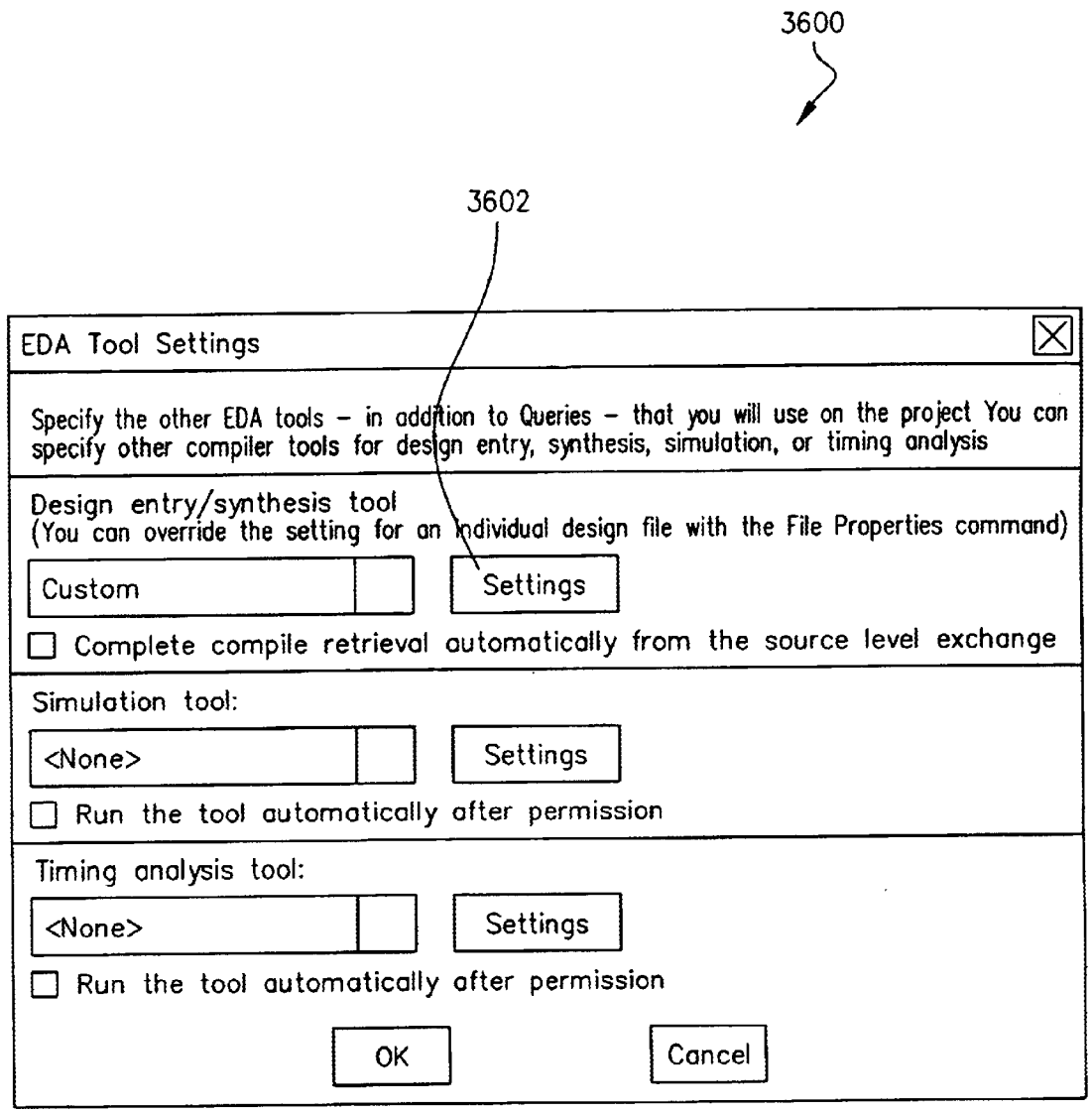
FIGS. 36 and 37 illustrate a tool settings display, in accordance with one embodiment of the present invention.
Figure 37:
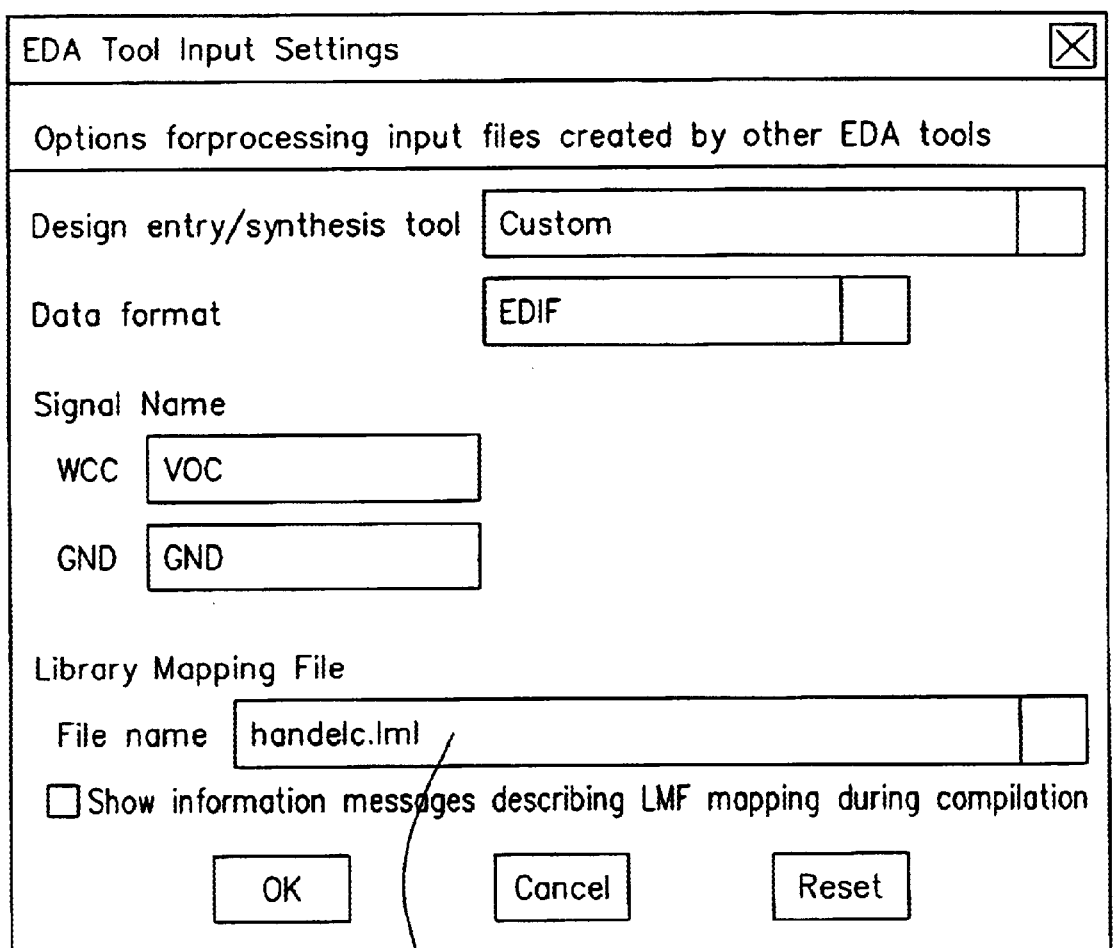

FIGS. 36 and 37 illustrates a tool settings display 3600 and 3700, in accordance with one embodiment of the present invention.
  Start Quartus.
  Select the Project>EDA Tool Settings menu command.
  In the dialog box, use the pull-down list to set Custom as the Design entry/synthesis tool.
  Click Settings. (3602) (Note FIG. 37.)
  Set the File name 3702 for the Library Mapping File, click the . . . button to browse for handelc.lmf. (Installed in Handel-C installation root\lmf.)

Setting up Wire Names

One can specify the format of floating wire names in EDIF using the Handel-C bus format specification. This allows one to use the formats B1 B_1 B[1]B(1) where B represents the bus name, and 1 the wire number.
  interface port_in(int 4 signals_to_HC with
  {busformat="B[1]) read( );

FIG. 38 illustrates the wires 3800 that would be produced when specifying floating wire names, in accordance with one embodiment of the present invention.

Connecting to VHDL Blocks

Requirements

If one wishes to connect Handel-C code to VHDL blocks and simulate the results, one may require the following objects:
  A VHDL simulator (currently ModelSim)
  The cosimulator plugin (e.g. PlugInModelSim.dll) to allow the VHDL simulator to work in parallel with the Handel-C simulator. This file is provided with the copy of Handel-C
  The file plugin.vhdl to connect the VHDL to the cosimulator plugin. This file is included with the copy of Handel-C
  A VHDL wrapper file to connect the VHDL entity ports to the Handel-C simulator and to VHDL dummy signals. (One may write this)
  The VHDL entity and architecture files (one may provide or write these)
  A Handel-C code file that includes an interface definition in the Handel-C code to connect it to the VHDL code. (One may write this.)

Simulation Requirements

Before one can simulate the code he or she may:

1. Set up ModelSim so that the work library refers to the library containing this wrapper component.
2. Check that the plugin has been installed in the same place as the other Handel-C components. If one has moved it, he or she may ensure that its new location is on the PATH.
3. Compile the VHDL model to be integrated with Handel-C into the VHDL simulator.
4. Compile plugin.vhdl.
5. Compile the wrapper.
6. Compile the Handel-C code and run the Handel-C simulator. This may invoke any VHDL simulations required.

Batch Files

Sample batch files that carry out these tasks have been supplied with the examples:
  handelc_vhdl.bat Sets up environment variables for ModelSim. Run once before first co-simulating
  reg32x1k_vhdl.bat Compiles all the components for the register example. Run once before co-simulating the example. Run again if the VHDL code is changed
  ttl7446_vhdl.bat Compiles all components for the combinatorial logic example. Run before co-simulating and if the VHDL code is changed.

Figure 39:
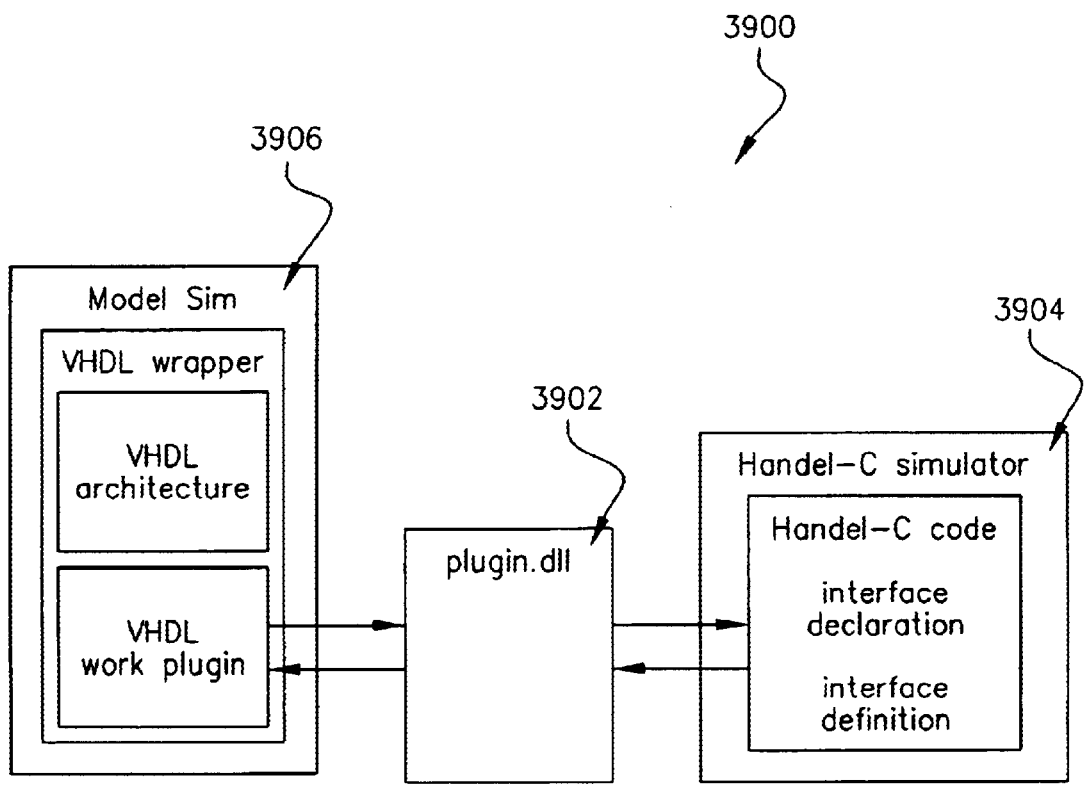
FIG. 39 illustrates an interface between Handel-C and VHDL for simulation, in accordance with one embodiment of the present invention.

FIG. 39 illustrates an interface 3900 in the form of a plug-in 3902 between Handel-C 3904 and VHDL 3906 for simulation, in accordance with one embodiment of the present invention.

Place and Route Requirements

If one wishes to compile the Handel-C code and VHDL blocks and place and route the results, he or she may need to:
  Compile the Handel-C code to VHDL.
  Pass the compiled Handel-C and the VHDL model to an RTL synthesis tool (such as FPGAExpress).
  Run the place and route.

Writing Handel-C to Communicate with VHDL

The code needed in the Handel-C program is in two parts. First, one needs an interface declaration. This prototypes the interface sort and is of the format:

Interface
VHDL_entity_sort (VHDL_to_HC_port
{,VHDL_to_HC_port })
(VHDL_from_HC_port
{, VHDL_from_HC_port});

where:
VHDL_entity_sort is the name of the VHDL entity. This name may be used as the interface sort.
VHDL_to_HC_port is the type and name of a port bringing data to the Handel-C code (output from VHDL) precisely as specified in the unwrapped VHDL entity
VHDL_from_HC_port is the type and name of a port sending data from the Handel-C code (input to VHDL) precisely as specified in the unwrapped VHDL entity.
Note that ports are seen from the VHDL side, so port names may be confusing. In Handel-C, the ports that input data TO the Handel-C may be specified first.
One then needs an interface definition. This creates an instance of that interface sort, and defines the data that may be transmitted. This is of the format:
Interface
VHDL_entity_sort (VHDL_to_HC_port [with portSpec]
{, VHDL_to_HC_port [with portSpec]})
interface_Name (VHDL_from_HC_data=from_HC_data
[with portSpec]
{, VHDL_from_HC_data=from_HC_data
[with portSpec]})
with {extlib="PluginModelSim.dll",
extinst="instanceName; model=entity_wrapper;
clock=clockName:period; delay=units"};
where:
VHDL_entity_sort is the interface sort that one previously declared.
VHDL_to_HC_port is the type and name of a port bringing data to the Handel-C code (output from VHDL). This may have the same type as defined in the interface declaration
interface_Name is the name for this instance of the interface.
VHDL_from_HC_port is the type and name of a port sending data from the Handel-C code (input to VHDL). This may have the same type as defined in the interface declaration
VHDL_from_HC_data is an expression that is output from the Handel-C to the VHDL.
with portSpec is an optional port specification. FIGS. 40A and 40B illustrate a table of possible specifications 4000, in accordance with one embodiment of the present invention. The with list after the port listings gives the specifications for all the ports on the instance. These general specifications may be overruled by any individual port specifications.
extlib="PluginModelSim.dll" specifies the cosimulator used. The extinst string gives the parameters to the cosimulator plugin. The parameters for PluginModelSim.dll are as follows:
instanceName is a unique name representing that instance of the VHDL entity. It is recommended that this is the same as the interface_Name.
entity_wrapper is the name of the VHDL wrapper component.
clock=clockName: period is only needed in clocked circuits. It defines the port and period of the clock input to the VHDL from Handel-C. clockName is the name of the port that carries the clock signal. period is the number of simulator time units per clock tick. The simulation time in ModelSim is advanced by this time delay every clock cycle.
delay=units is optional. It gives the combinational delay to be used by the simulator to allow a combinational input to propagate to an output. For zero delay models as used in RTL synthesis, a single time unit is all that is required. The default value is 1.

ModelSim may be automatically started when the Handel-C model is run and may be automatically closed when the Handel-C model is closed. Error messages relating to the VHDL model may appear in the ModelSim message window, but may also be reflected back to the Handel-C debug window.

Clocked Circuit Simulation

The simulator time units are determined by ModelSim's preferences, which may be found in a modelsim.ini file in the local directory. (It is created on first use of the simulator in any directory —one can then edit it to modify the settings). The default time unit is ns. If one has the values: clock=ck:25; delay=1. Clock rising edges may occur at 25 ns, 50 ns, 75 ns and the outputs may be sampled at 26 ns, 51 ns, 76 ns and so on. Clocks are assumed to have equal mark:space ratios. However, ModelSim can only deal with delays that are integral multiples of the time unit. If the period is odd (as in this case), the high time may be shorter than the low time, so in this case the clock may have a 12:13 ratio.

Interfacing the VHDL with the Handel-C Simulator

Figure 41:
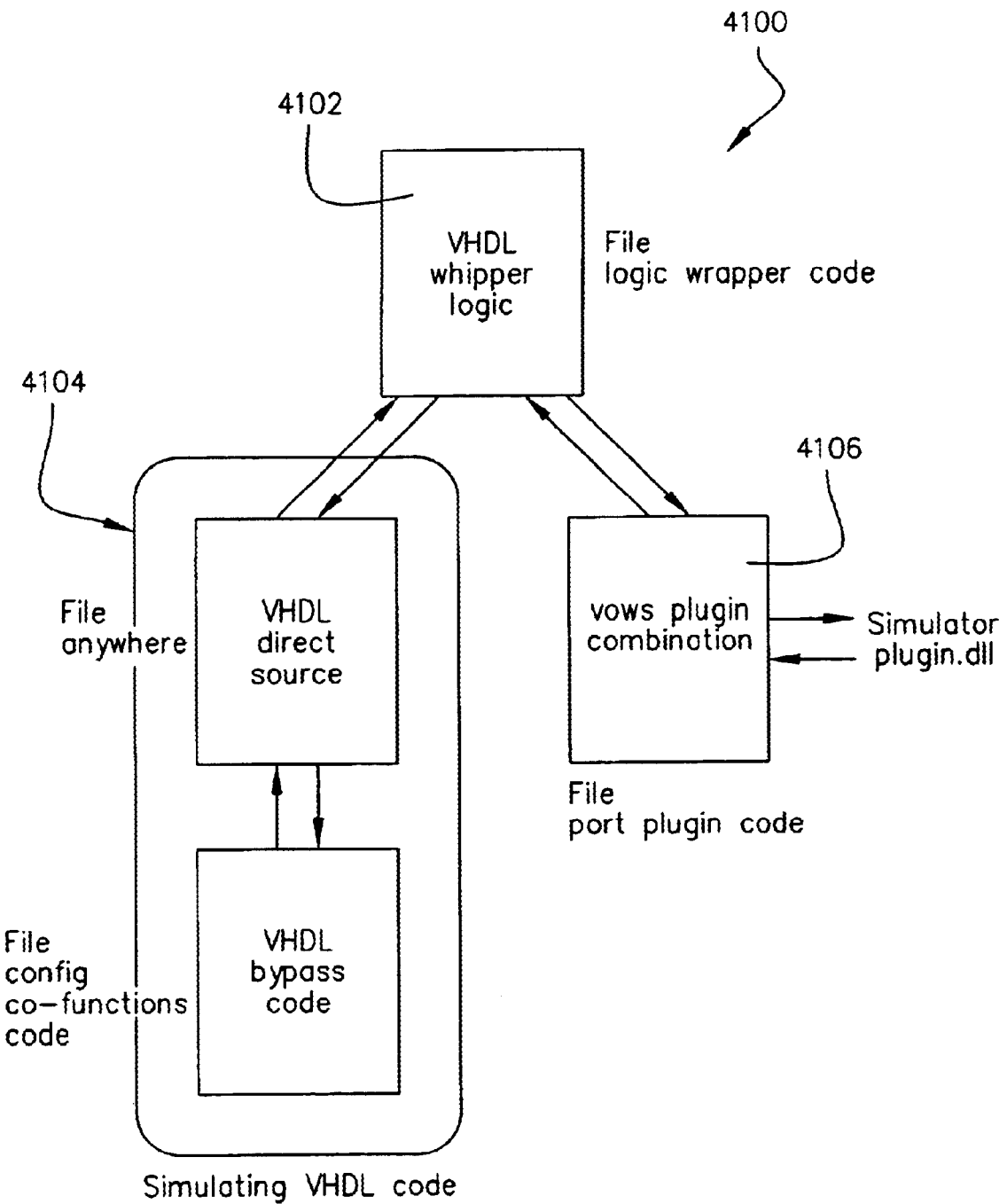
FIG. 41 illustrates the use of various VHDL files, in accordance with one embodiment of the present invention.

FIG. 41 illustrates the use of various VHDL files 4100, in accordance with one embodiment of the present invention. One needs to provide a wrapper file 4102 for VHDL code 4104. The wrapper file wraps the VHDL code, connecting the entity ports to dummy signals and provides the interface to the Handel-C simulator plugin 4106. The wrapper code is only required in the simulation phase, not in the synthesis phase. The following information assumes that one has two VHDL files, the object code for the architecture file (entity_architecture.vhdl) and the source code for the interface to the behavior file (entity.vhdl).

One needs to examine the ports defined in the entity file, and ensure that each port is connected to a signal in a wrapper file. A sample wrapper file is provided. It assumes that the plugin, entity and wrapper file have all been compiled to the default work library.

entity name_wrapper is
end;
--do standard library stuff
library ieee;
use ieee.std_logic_1164.all;
use ieee.std_logic_arith.all;
architecture top_level of name_wrapper is
signal name: type;
(repeat as necessary)
begin
pluginName: entity work.plugin; --connect to Handel-C link
entityName. entity work.entity port map (signal_names);
end;

To use the file, replace the sections in italics as follows
name_wrapper replace with the appropriate wrapper name.

entity_wrapper is recommended.

signal name: type; replace with a list of dummy signals that connect to the entity ports for compilation purposes. These signals can have any name, but the format and order of the ports may be exactly as specified in the VHDL pluginName is a user-defined name for that instance of the plugin that connects the signals through the simulators entityName is a user-defined name for that instance of the entity signalnames is a comma-separated list of the dummy signals.

Note that a limited number of port types are supported:
1-bit types in Handel-C may be implemented by std_logic
n-bit unsigned and signed types in Handel-C may be implemented by std_logic_arith.unsigned No other types may be used. If the circuit uses other types one may need to create another VHDL wrapper containing type conversions to these three types between the plugin wrapper and the circuit to be integrated.

EXAMPLE

The following example shows the code for a trivial VHDL entity file simple.vhdl. This describes the interface for the simple architecture.

```
library ieee;
use ieee.std_logic_1164.all;
use ieee.std_logic_arith.all;
entity simple is
port (input: in unsigned(63 downto 0);
output: out unsigned(63 downto 0);
simtime: out unsigned(31 downto 0));
end;
architecture behavior of simple is
begin
process (input)
begin
output<=conv_unsigned(input*conv_unsigned(2, input'length),
output'length);
simtime<=conv_unsigned(input, 32);
end process;
end;
```

Wrapper File

This shows the code for the wrapper file for simple.vhdl. This file would be called simple_wrapper.vhdl.

```
entity simple_wrapper is
end;
library ieee;
use ieee.std_logic_1164.all;
use ieee.std_logic_arith.all;
architecture top_level of simple_wrapper is
signal x: unsigned (63 downto 0);
signal z: unsigned (63 downto 0);
signal t: unsigned (31 downto 0);
begin
plugin1: entity work.plugin;
simple1: entity work.simple port map (x, z, t);
end;
```

Handel-C Code

This is the interface to the VHDL. Note that the interface sort is simple and the port names are identical to the input and output entity names in the VHDL.

```
set clock=external "P1";
unsigned 64 x;
interface simple(int 64 output, int 32 simtime)
t1(int 64 input=x) with
{extlib="PluginModelSim.dll",extinst="simple_wrapper"};
void main(void)
{
unsigned 64 y;
unsigned 32 now;
x=1;
while(1)
{
par
{
y=t1.output; //set y to the vhdl output
now=t1.simtime; // and now to simtime
}
x=y;
}
}
```

Compiling and Simulating the Examples

These examples are installed in the subdirectory Handel-C\Examples\VHDL. There are two projects. Example1 contains the combinatorial circuit and Example2 contains the registers example. Supplied with each example is a batch file that compiles the VHDL for ModelSim. To run the examples one may set up ModelSim for interfacing with Handel-C, compile the VHDL and compile the Handel-C.

Setting up ModelSim

Go to the project directory and double click on the batch file handelc_vhdl.bat to run it. This only has to be done once.

Compiling the VHDL

Double click the appropriate project batch file (ttl7446_vhdl.bat for the combinatorial logic project and reg32x1k_vhdl.bat for the registers project). This compiles the VHDL. If one changes the VHDL code, he or she may need to recompile it.

Compiling and Simulating the Handel-C

Double-click on the workspace file (e.g. Example1.hw) to start Handel-C. Click the Build button or select Build>Build to compile and build the example. Once it has built, select Debug>Go or Debug>Step Into to start the simulation.Connecting to VHDL blocks A Simple Combinatorial Circuit Example The VHDL code The VHDL code for the combinatorial circuit is in the file ttl7446.vhdl

```
library ieee;
use ieee.std_logic_1164.all;
use ieee.std_logic_arith.all;
entity TTL7446 is
port (ltn: in std_logic;
rbin: in std_logic;
digit: in unsigned(3 downto 0);
bin: in std_logic;
segments: out unsigned(0 to 6);
rbon: out std_logic);
end;
architecture behavior of TTL7446 is
begin
```

```
process(ltn, rbin, bin, digit)
begin
rbon<='1';
if bin='0' then
segments<="1111111";
elsif ltn='0' then
segments<="1000000";
else
case digit is
when "0000"=>segments <="0000001";
if rbin='0' then
segments<="1111111";
rbon<='0';
end if;
when "0001"=>segments <="1001111";
when "0010"=>segments <="0010010";
when "0011"=>segments <="0000110";
when "0100"=>segments <="1001100";
when "0101"=>segments <="0100100";
when "0110"=>segments <="1100000";
when "0111"=>segments <="0001111";
when "1000"=>segments <="0000000";
when "1001"=>segments <="0001100";
when "1010"=>segments <="1110010";
when "1011"=>segments <="1100110";
when "1100"=>segments <="1011100";
when "1101"=>segments <="0110100";
when "1110"=>segments <="1110000";
when "1111"=>segments <="1111111";
when others =>segments<="XXXXXXX";
end case;
end if;.
```

A Sample Wrapper for the Combinatorial Circuit

The VHDL wrapper code for the combinatorial circuit is in the file ttl7446_wrapper.vhdl

```
entity TTL7446_wrapper is
end;
library ieee;
use ieee.std_logic_1164.all;
use ieee.std_logic_arith.all;
architecture HandelC of TTL7446_wrapper is
signal ltn: std_logic;
signal rbin: std_logic;
signal digit: unsigned(3 downto 0);
signal bin: std_logic;
signal segments: unsigned(0 to 6);
signal rbon: std_logic;
begin
plugin1: entity work.plugin;
ttl: entity work.TTL7446 port map (ltn, rbin, digit, bin, segments, rbon);
end;
```

This shows the two instances. It also shows each port of the circuit to be integrated connected to a signal which is not connected to anything else. This is not a requirement of the plugin, but a requirement of VHDL. Note that VHDL'93 features have been used to create direct instantiations of the components.

Example Handel-C Using the Combinatorial Circuit

This is in the file ttl7446_test.c

```
// Set chip details
set clock=external "D17";
set part="V1000BG560-4";
// Interface declaration
interface TTL7446(unsigned 7 segments, unsigned 1 rbon)
(unsigned 1 ltn, unsigned 1 rbin, unsigned 4 digit, unsigned 1 bin);
// Main program
void main (void)
{
unsigned 1 ltnVal;
unsigned 1 rbinVal;
unsigned 1 binVal;
unsigned 4 digitVal;.Connecting to VHDL blocks
unsigned 1 rbinVal;
unsigned 20 Delay;
interface TTL7446(unsigned 7 segments, unsigned 1 rbon)
decode(unsigned 1 ltn=ltnVal, unsigned 1 rbin=rbinVal, unsigned 4 digit=digitVal, unsigned 1 bin=binVal)
with {extlib="PluginModelSim.dll",
extinst="decode; model=TTL7446_wrapper; delay=1"};
interface bus_out( ) display(unsigned display= ~decode.segments)
with {extlib="7segment.dll", extinst="0",
data={"AN28", "AK25", "AL26", "AJ24", "AM27", "AM26",
"AK24"}};
par
{
ltnVal=0;
rbinVal=0;
binVal=0;
digitVal=0;
}
while(1)
{
binVal=1;
ltnVal=1;
do
{
do
{
rbinVal=decode.rbon;
digitVal++;
#ifndef SIMULATE
do { Delay++; } while(Delay !=0);
#endif
} while (digitVal !=0);
rbinVal++;
} while (rbinVal !=0);
}
```

Interface Code

One may declare an interface sort that has port names of the same name and type as the VHDL signals in the circuit to be integrated. The interface sort may be the same as the VHDL model's name.

```
interface TTL7446(unsigned 7 segments, unsigned 1
   rbon) (unsigned 1 ltn, unsigned 1 rbin, unsigned 4 digit,
   unsigned 1 bin);
```

An instance of this component is then created one or more times in the Handel-C code. An example of an instantiation is:

```
interface TTL7446(unsigned 7 segments, unsigned 1
   rbon) decode(unsigned 1 ltn=ltnVal, unsigned 1 rbin=
   rbinVal, unsigned 4 digit=digitVal, unsigned 1 bin=
   binVal) with {extlib="PluginModelSim.dll", extinst=
   "decode; model=ttl7446_wrapper; delay=
   1"};.Connecting to VHDL blocks
```

Simple Register Bank Circuit Example
VHDL Code

The VHDL code for the register bank circuit is in the file reg32x1k.vhdl

```
library ieee;
use ieee.std_logic_1164.all;
use ieee.std_logic_arith.all;
entity reg32x1k is
-- simple synchronous register bank, 32 bits wide and 1k
registers deep
port(address:in unsigned(9 downto 0);
data_in:in unsigned(31 downto 0);
ck:in std_logic;
write:in std_logic;
data_out:out unsigned(31 downto 0));
end;
architecture behavior of reg32x1k is
type register_array is array (natural range<>) of unsigned
   (31
downto 0);
signal data:register_array(0 to 1023):=(others=>
   (others=>
'0'));
begin
process (ck)
begin
if ck'event and ck='1' then
if write='1' then
data(conv_integer(address))<=data_in;
end if;
end if;
end process;
data_out<=data(conv_integer(address));
end;
```

VHDL Wrapper for Registers Example

This is the file reg32x1k_wrapper.vhdl.

```
entity reg32x1k_wrapper is
end;
library ieee;
use ieee.std_logic_1164.all;
use ieee.std_logic_arith.all;
architecture HandelC of reg32x1k_wrapper is
signal address:unsigned(9 downto 0):=(others=>'0');
signal data_in:unsigned(31 downto 0):=(others=>'0');
signal ck:std_logic:='0';
signal write:std_logic:='0';
signal data_out:unsigned(31 downto 0):=(others=>'0');
begin
plugin1:entity work.plugin;
registers:entity work.reg32x1k port map (address, data_
   in, ck, write, data_out);
end;
```

Handel-C Code to Interface with Registers

This is the file reg32x1k_test.c.

```
// Set chip details
set clock=external "D17";
set part="V1000BG560-4";
// Interface declaration
interface reg32x1k(unsigned 32 data_out)
(unsigned 10 address, unsigned 32 data_in,
unsigned 1 ck, unsigned 1 write);
// Main program
void main(void)
{
unsigned 32 data_outVal;
unsigned 10 addressVal;
unsigned 32 data_inVal;
unsigned 1 writeVal;
interface reg32x1k(unsigned 32 data_out)
registers(unsigned 10 address=addressVal
with {extpath={data_out}},
unsigned 32 data_in=data_inVal,
unsigned 1 ck=_clock,
unsigned 1 write=writeVal)
with {extlib="PluginModelSim.dll",
extinst="1; model=reg32x1k_wrapper; clock=
   ck:25"};.Connecting to
VHDL blocks
par
{
addressVal=0;
data_inVal=0;
writeVal=0;
}
while(1)
{
par
{
writeVal=1;
addressVal=0;
}
do
{
par
{
addressVal++;
data_inVal+=10;
}
data_outVal=registers.data_out;
} while (addressVal<10);
par
{
writeVal=0;
```

```
addressVal=0;
}
do
{
addressVal++;
data_outVal=registers.data_out;
} while (addressVal<10);
}
```

Application Programmers Interface

Figure 41A:
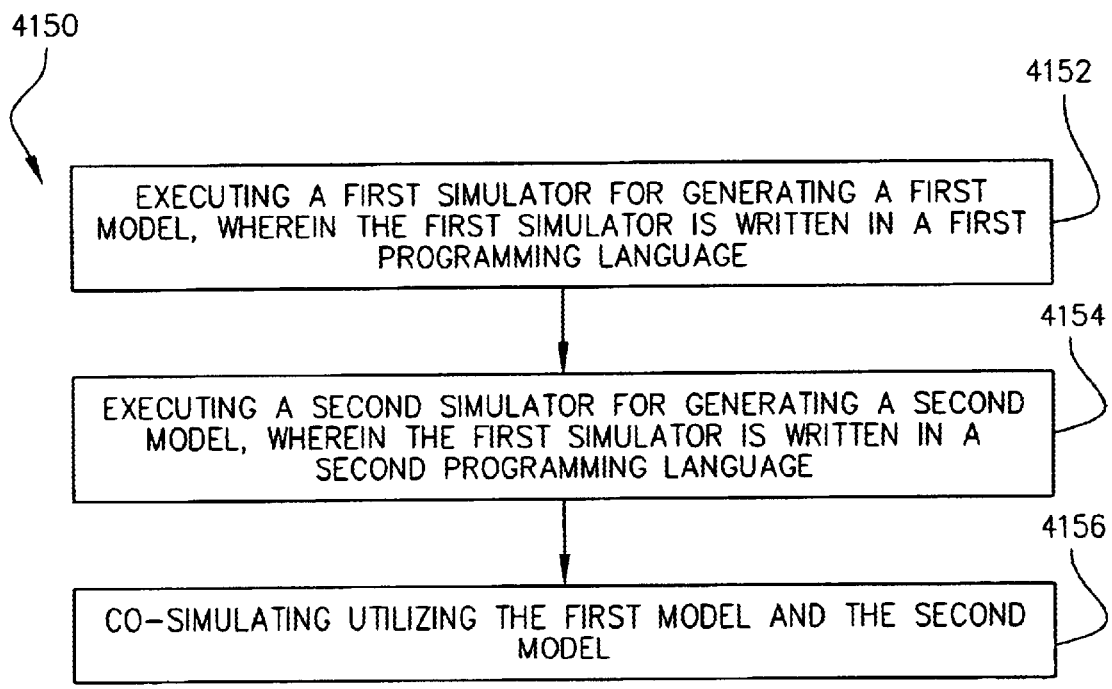
FIG. 41A illustrates a method for equipping a simulator with plug-ins.

FIG. 41A illustrates a method 4150 for equipping a simulator with plug-ins. In general, in operation 4152, a first simulator written in a first programming language is executed for generating a first model. Further, in operation 4154, a second simulator written in a second programming language is executed to generate a second model. In one aspect, the first simulator may be cycle-based and the second simulator may be event-based. More information on such types of simulators will be set forth hereinafter in greater detail during reference to FIG. 44A.

By this design, a co-simulation may be performed utilizing the first model and the second model. See operation 4156. In one aspect of the present invention, the accuracy and speed of the co-simulation may be user-specified. In another aspect, the co-simulation may include interleaved scheduling.

In an additional aspect of the present invention, the co-simulation may include fully propagated scheduling. In a further aspect, the simulations may be executed utilizing a plurality of processors (i.e. a co-processor system). In even another aspect, the first simulator may be executed ahead of or behind the second simulator. In yet an additional aspect, the first simulator may interface with the second simulator via a plug-in. More information regarding such alternate embodiments will be set forth hereinafter in greater detail.

The Application Programmers Interface (API) thus describes how to write plugins to connect to the Handel-C simulator. Plugins are programs that run on the PC and connect to a Handel-C clock or interface. They can be written in any language.

Examples of useful plugins are:
Simulated oscilloscope
Simulated wave-form generators
Selected display and storage of variables for debugging
Co-simulation of other circuits Data Widths in the Simulator The simulator uses 32-bit, 64-bit or arbitrary width arithmetic as appropriate. The interface to the simulator uses pointers to values of defined widths. Where 32 bit or 64 bit widths are used, data is stored in the most significant bits.

Simulator Interface

The plugin is identified to the simulator by:
the name of the compiled .dll (the compiled plugin)
the function calls that pass data between the plugin and the Handel-C program
the instance name These are passed to the simulator using the with specifications extlib Specifies the name of the DLL. No default.
extinst Specifies an instance string. No default.
extfunc Specifies the function to call to pass data to the plugin or get data from the plugin.

Defaults to PlugInSet( ) for passing data to the plugin and PlugInGet( ) to get data from the plugin.

The simulator expects the plugin to support various function calls and some data structures. The simulator also has functions that can be called by the plugin (callback functions). These functions give information about the state of variables in the Handel-C program. FIGS. 42A and 42B illustrate various function calls 4200 and the various uses thereof, in accordance with one embodiment of the present invention.

Function Name Retention in C++

The simulator requires that the function names within the plugin are retained. Since C++ compilers may change function names one may ensure that the function names are identified as C types. To do so, one may either compile the plugin as a C file, or, if he or she is compiling it as C++, he or she may use the extern extension to force the compiler to use the C naming convention. To compile the function as C++ place the string extern "C" immediately before the function definition to ensure that the function names are exported as written, e.g. extern "C"

```
dll void PlugInOpen(HCPLUGIN_INFO*Info, unsigned
    long NumInst)
{
//this function intentionally left blank
//intialising before the first simulation is run
```

Specifying Plugins in the Handel-C Source Code

Plugins are specified in the Handel-C source code using the extlib, extinst and extfunc specifications. These specifications may be applied to clocks or interface definitions. For example:

set clock=external "P1" with {extlib="plugin.dll", extinst="instance0"}; In the case of interface definitions, the specifications may be specified for individual ports or for the interface as a whole. For example:

interface bus_in(unsigned 4 Input) BusName( ) with {extlib="plugin.dll", extinst="some instance string", extfunc="BusNameGetValue"};

interface bus_ts(unsigned 4 Input with {extlib="plugin.dll", extinst="some instance string", extfunc="BusNameGetValue"}

BusName(unsigned 4 Output with {extlib="plugin.dll", extinst="some instance string", extfunc="BusNameSetValue"}, unsigned 1 Enable with {extlib="plugin.dll", extinst="some instance string", extfunc="BusNameEnable"});

Data Structures

Structure Passed on Startup

The following data structure passes essential information from the simulator to the plugin on startup.

HCPLUGIN_INFO
```
typedef struct
{
unsigned long Size;
void*State;
HCPLUGIN_CALLBACKS CallBacks;
} HCPLUGIN_INFO;
```

Members

Size Set to size of(HCPLUGIN_INFO) as a corruption check.

State Simulator identifier which may be used in callbacks from the plugin to the simulator. This value should be passed in future calls to any function in the CallBacks structure.

CallBacks Data structure containing pointers to the callback functions from the plugin to the simulator. See below for details of these functions.

Callback Data Structure

HCPLUGIN_CALLBACKS

The pointers to the callback functions are contained in the following structure, which is a member of the HCPLUGIN_

INFO structure passed to the PlugInOpen( ) function. Size should be set to sizeof(HCPLUGIN_CALLBACKS).

```
typedef struct
{
unsigned long Size;
HCPLUGIN_ERROR_FUNC PluginError;
HCPLUGIN_GET_VALUE_COUNT_FUNC PluginGetValueCount;
HCPLUGIN_GET_VALUE_FUNC PluginGetValue;
HCPLUGIN_GET_MEMORY_ENTRY_FUNC PluginGetMemoryEntry;
}HCPLUGIN_CALLBACKS;
```

Source File Position Structures

A source position consists of a list of individual source code ranges. Each range details the source file and a range of lines and columns. The list of ranges consists of a singly linked list of source code ranges. Lists of positions are generated by some Handel-C source code constructs. For example, a call to a macro proc produces positions for the body elements of the macro proc with two members of the position range list. One points to inside the macro proc body and the other points to the call of the macro proc. Lists of positions are also generated for replicators and arrays of functions. The following data structures are used to represent source positions of objects:

```
HCPLUGIN_POS_ITEM
typedef struct HCPLUGIN_POS_ITEM_tag
{
unsigned long Size;
char*FileName;
long StartLine;
long StartColumn;
long EndLine;
long EndColumn;
struct HCPLUGIN_POS_ITEM_tag*Next;
} HCPLUGIN_POS_ITEM;
```

Members

Size Set to sizeof(HCPLUGIN_POS_ITEM) as a corruption check.

FileName Source file name of position range.

StartLine First line of range. −1 indicates the filename is an object file with no debug information. Line counts start from zero.

StartColumn First column of range. −1 indicates the filename is an object file with no debug information. Column counts start from zero.

EndLine Last line of range. −1 indicates the filename is an object file with no debug information. Line counts start from zero.

EndColumn Last column of range. −1 indicates the filename is an object file with no debug information. Column counts start from zero.

Next Pointer to next position range in list. NULL indicates this is the last position range in the list.

```
HCPLUGIN_POSITION
typedef struct
{
unsigned long Size;
HCPLUGIN_POS_ITEM*SourcePos;
} HCPLUGIN_POSITION
```

Members

Size Set to sizeof(HCPLUGIN_POSITION) as a corruption check.

SourcePos Pointer to first position range in the linked list.

Variable Value Structures

The following data structure is used to pass information on variable values from the simulator to the plugin. The plugin can query and set the values of variables in the simulator using these data structures and the associated callback functions of types HCPLUGIN_GET_VALUE_FUNC and HCPLUGIN_GET$_{13}$_ENTRY_FUNC. Values are accessed via an index using these functions. See below for further details of these functions.

```
HCPLUGIN_VALUE
typedef enum
{
HCPluginValue,
HCPluginArray,
HCPluginStruct,
HCPluginRAM,
HCPluginROM,
HCPluginWOM,
} HCPLUGIN_VALUE_TYPE;
```

The HCPLUGIN_VALUE_TYPE enumerated type is used to define the type of object value contained in the HCPLUGIN_VALUE data structure. The values have the following meanings:

HCPluginValue General value used for registers and signals.

Data.ValueData member of the HCPLUGIN_VALUE structure should be used.

HCPluginArray Array value. Data structure contains a list of value indices in the Data.ArrayData member of the HCPLUGIN_VALUE structure.

HCPluginStruct Structure value. Data structure contains a linked list of values in the Data.StructData member of the HCPLUGIN_VALUE structure.

HCPluginRAM RAM memory value. Data structure contains the number of entries in the memory in the Data.MemoryData member of HCPLUGIN_VALUE.

HCPluginROM ROM memory value. Data structure contains the number of entries in the memory in the Data.MemoryData member of HCPLUGIN_VALUE.

HCPluginWOM WOM memory value. Data structure contains the number of entries in the memory in the Data.MemoryData member of HCPLUGIN_VALUE

```
typedef struct HCPLUGIN_STRUCT_ENTRY_tag
{
unsigned long Size;
HCPLUGIN_POSITION*Position;
char*Name;
unsigned long ValueIndex;
struct HCPLUGIN_STRUCT_ENTRY tag*Next;
} HCPLUGIN_STRUCT_ENTRY;
typedef struct HCPLUGIN_VALUE tag
{
unsigned long Size;
HCPLUGIN_POSITION*Position;
unsigned long Internal[5];
int TopLevel;
char*Name;
HCPLUGIN_VALUE_TYPE Type;
union
{
struct
{
int Signed;
```

```
unsigned long Base;
unsigned long Width;
void*Value;
} ValueData;
struct
{
unsigned long*Elements;
unsigned long Length;
} ArrayData;
HCPLUGIN_STRUCT_ENTRY*StructData;
struct
{
unsigned long Length;
} MemoryData;
Data;
} HCPLUGIN_VALUE;
```

Members of HCPLUGIN_VALUE structure:
- Size Set to sizeof(HCPLUGIN_VALUE) as a corruption check.
- Position Source position of declaration of object.
- Internal Internal data used by the debugger. Do not modify.
- TopLevel Set to 1 if it's a top-level object or 0 otherwise. Examples of objects that are not top level are elements of arrays or members of structures. Used by the debugger.
- Name Identifier of the object.
- Type Type of object that this value represents. See above for details of the HCPLUGIN_VALUE_TYPE enumerated type.
- Data Union containing the value data consisting of Data.ValueData, Data.ArrayData. data.StructData and Data.MemoryData.

Elements of HCPLUGIN_VALUE.Data

Data.ValueData is used to represent basic values (e.g. registers and signals) and contains the following members:
- Signed Zero for an unsigned value, non-zero for a signed value.
- Base Default base used to represent this value (specified using the base spec in the source code). Can be 2, 8, 10 or 16 or 0 for none.
- Width Width of value in bits.
- Value Pointer to value. If Width is less than or equal to 32 bits then this is a long* or unsigned long*. If Width is less than or equal to 64 bits then this is a __int64 * or unsigned_int64*. If Width is greater than 64 bits then this is a NUMLIB_NUMBER **. Data stored in long, unsigned long,__int64 and unsigned__int64 types is left aligned. This means it occupies the most significant bits in the word and not the least significant bits. For example, 3 stored in a 3 bit wide number in a 32-bit word is represented as 0x60000000. Functions using NUMLIB_NUMBER structures are described hereinafter.

Data.ArrayData is used to represent array values and contains the following members:
- Elements Array of value indices of members of array. These indices can be passed to further calls to the get value function.
- Length Number of elements in the array.

Data.StructData is used to represent structure values and points to the head of a NULL terminated linked list of structure member objects. See below for details of the HCPLUGIN_STRUCT_ENTRY structure.

Data.MemoryData is used to represent memory (RAM, ROM and WOM) values and contains the following members:

Length Number of elements in the memory.
Associated Functions
Use the callback function HCPLUGIN_GET_MEMORY_ENTRY_FUNC to access memory elements.

Simulator to Plugin Functions

These functions are called by the simulator to send information to the plugin. They are called when simulation begins and ends, and at points in the simulator clock cycle. The plugin may act upon the call or do nothing. The plugin may implement the function with identical name and parameters.

PlugInOpen
void PlugInOpen(HCPLUGIN_INFO*Info, unsigned long NumInst)

The simulator calls this function the first time that the plugin .dll is used in a Handel-C session. Each simulator used may make one call to this function for each plugin specified in the source code.
- Info Pointer to structure containing simulator call back information.
- NumInst Number of instances of the plugin specified in the source code. One call to PlugInOpenInstance( ) may be made for each of these instances.

PlugInOpenInstance
void*PlugInOpenInstance(char*Name, unsigned long NumPorts)

This function is called each time one starts a simulation. It is called once for each instance of the plugin in the Handel-C source code. An instance is considered unique if a unique string is used in the extinst specification. The plugin should return a value used to identify the instance in future calls from the simulator. This value may be passed to future calls to PlugInOpenPort( ), PlugInSet( ), PlugInGet( ), PlugInStartCycle( ), PlugInMiddleCycle( ), PlugInEndCycle( ) and PlugInCloseInstance( ).
- Name String specified in the extinst specification in the source code.
- NumPorts Number of ports associated with this instance. One call to PlugInOpenPort( ) may be made for each of these ports.

PlugInOpenPort
void*PlugInOpenPort(void*Instance, char*Name, int Direction, unsigned long Bits)

This function is called each time one starts a simulation. It is called once for each interface port associated with this plugin in the source code. The plugin should return a value used to identify the port in future calls from the simulator. This value may be passed to future calls to lugInGet( ), PlugInSet( ), and PlugInClosePort( ).
- Instance Value returned by the PlugInOpenInstance( ) function.
- Name Name of the port from the interface definition in the source code.
- Direction Zero for a port transferring data from plugin to simulator, non-zero for a port transferring data from simulator to plugin.
- Bits Width of port.

PlugInSet
void PlugInSet(void*Instance, void*Port, unsigned long Bits, void*Value)

This function is called by the simulator to pass data from simulator to plugin. It is guaranteed to be called every time the value on the port changes but may be called more often than that.

Instance Value returned by the PlugInOpenInstance( ) function.

Port Value returned by the PlugInOpenPort( ) function.

Bits Width of port.

Value Pointer to value. If Bits is less than or equal to 32 bits then this is a long* or unsigned long*. If Bits is less than or equal to 64 bits then this is an int64 * or unsigned int64*. If Bits is greater than 64 bits then this is a NUMLIB_NUMBER**. Data stored in long, unsigned long,_int64 and unsigned_int64 types is left aligned. This means it occupies the most significant bits in the word and not the least significant bits. For example, 3 stored as a 3 bit wide number in a 32-bit word is represented as 0x60000000. Functions using NUMLIB_NUMBER structures are described hereinafter.

Where 32 bit or 64 bit widths are used, data is stored in the most significant bits.

PlugInGet void PlugInGet(void*Instance, void*Port, unsigned long Bits, void *Value)

This function is called by the simulator to get data from the plugin. One may use any name he or she wishes for this function (specified in by extfunc) but the parameters may remain the same.

Instance Value returned by the PlugInOpenInstance( ) function.

Port Value returned by the PlugInOpenPort( ) function.

Bits Width of port.

Value Pointer to value. If Bits is less than or equal to 32 bits then this is a long* or unsigned long*. If Bits is less than or equal to 64 bits then this is a int64 (Microsoft specific type)* or unsigned_int64*. If Bits is greater than 64 bits then this is a NUMLIB_NUMBER**. Data stored in long, unsigned long,_int64 and unsigned _int64 types is left aligned. This means is occupies the most significant bits in the word and not the least significant bits. For example, 3 stored in a 3 bit wide number in a 32-bit word is represented as 0x60000000. Functions using NUMLIB_NUMBER structures are described hereinafter.

Where 32 bit or 64 bit widths are used, data may be stored in the most significant bits. One may left-shift the number into the MSBs so it may be read correctly by the Handel-C code.

PlugInStartCycle void PlugInStartCycle(void*Instance)

This function is called by the simulator at the start of every simulation cycle.

Instance Value returned by the PlugInOpenInstance( ) function.

PlugInMiddleCycle void PlugInMiddleCycle(void*Instance)

This function is called by the simulator immediately before any variables within the simulator are updated.

Instance Value returned by the PlugInOpenInstance( ) function.

PlugInEndCycle void PlugInEndCycle(void*Instance)

This function is called by the simulator at the end of every simulation cycle.

Instance Value returned by the PlugInOpenInstance( ) function.

PlugInClosePort void PlugInClosePort(void*Port)

The simulator calls this function when the simulator is shut down. It is called once for every call made to PlugInOpenPort( ).

Port Value returned by the PlugInOpenPort( ) function.

PlugInCloseInstance void PlugInCloseInstance(void*Instance)

The simulator calls this function when the simulator is shut down. It is called once for every call made to PlugInOpenInstance( ).

Instance Value returned by the PlugInOpenInstance( ) function.

PlugInClose void PlugInClose(void)

The simulator calls this function when the simulator is shut down. It is called once for every call made to PlugInOpen( ).

Simulator Callback Functions

The simulator callback functions are used by plugins to query the state of variables within the Handel-C program. This can be used to model memory mapped registers or shared memory resources or to display debug values in non-standard representations (e.g. oscilloscope and logic analyzer displays). The plugin receives pointers to these functions in the Info parameter of the PlugInOpen( ) function call made by the simulator at startup.

HCPLUGIN_ERROR_FUNC typedef void (*HCPLUGIN_ERROR_FUNC)(void*State, unsigned long Level,char *Message);

The plugin should call this function to report information, warnings or errors. These messages may be displayed in the GUI debug window. In addition, an error may stop the simulation. State State member from the HCPLUGIN_INFO structure passed to the PlugInOpen( ) function.

Level 0 Information

1 Warning

2 Error.

Message Error message string.

HCPLUGIN_GET_VALUE_COUNT_FUNC typedef unsigned long (*HCPLUGIN_GET_VALUE_COUNT_FUNC) (void*State);

The plugin should call this function to query the number of values in the simulator. This number provides the maximum index for the HCPLUGIN_GET_VALUE_FUNC function.

State State member from the HCPLUGIN_INFO structure passed to the PlugInOpen( ) function.

HCPLUGIN_GET_VALUE_FUNC typedef void (*HCPLUGIN_GET_VALUE_FUNC) (void*State, unsigned long Index, HCPLUGIN_VALUE*Value);

The plugin should call this function to get a variable value from the simulator. State State member from the HCPLUGIN_INFO structure passed to the PlugInOpen( ) function. Index Index of the variable. Should be between 0 and the one less than the return value of the HCPLUGIN_GET_VALUE_COUNT_FUNC function inclusive.

A map of index to variable name can be built up at startup by repeatedly calling this function and examining the Value structure returned.

Value Structure containing information about the value.

HCPLUGIN_GET_MEMORY_ENTRY_FUNC typedef void (*HCPLUGIN_GET_MEMORY_ENTRY_FUNC) (void*State, unsigned long Index, unsigned long Offset, HCPLUGIN_VALUE*Value);

The plugin should call this function to get a memory entry from the simulator.

State State member from the HCPLUGIN INFO structure passed to the PlugInOpen( ) function.

Index Index of the variable. Should be between 0 and one less than the return value of the HCPLUGIN GET_VALUE_COUNT_FUNC function inclusive. A map of index to variable name can be built up at startup by repeatedly calling this function and examining the Value structure returned.

Offset Offset into the RAM. For example, to obtain the value of x[43], Index should refer to x and this value should be 43.

Value Structure containing information about the value.

EXAMPLE

This example consists of three files:

A Handel-C file which invokes the plugin through interfaces

An ANSI-C file containing the plugin functions

An ANSI-C header file defining the plugin structures

Plugin File: plugin-Demo.c

This simple example has one function (MyBusOut) that reads a value from a simulator interface and one function (MyBusIn) that doubles a value and writes it to a simulator interface.

It responds to the calls to PlugInOpenInstance( ) and PlugInOpenPort( ) by returning NULL. All the other required plugin functions have been defined but do nothing.

```
#include "plugin.h"
#define dll _declspec(dllexport)
dll void Pluginopen(HCPLUGIN_INFO*Info, unsigned long NumInst)
{
//this function intentionally left blank
//intialisating before the first simulation is run
}
dll void PlugInClose(void)
{
//tidy-up after final simulation
}
dll void*PlugInOpenInstance(char*Name,unsigned long NumPorts)
{
//invoked when one starts a simulation
//initialize anything required for this simulation
return NULL;
}
dll void PlugInCloseInstance(void*Instance)
{
}
dll void*PlugInOpenPort(void*Instance, char*Name, int Direction, unsigned long Bits)
{
//an opportunity to initialize any data structures associated with
//this port and return the pointer associated with it (which could
//then be passed to PlugInSet, etc.)
return NULL;
}
dll void PlugInClosePort(void*Port)
{
} static long DataIn;
dll void MyBusOut(void*Instance, void*Port, unsigned long Bits, void*Value)
{
DataIn=*(long*)Value;
}
dll void MyBusIn(void*Instance, void*Port, unsigned long Bits, void*Value)
{
*(long*)Value=DataIn*2;
}
dll void PlugInStartCycle(void*Instance)
{
//call after start of clock cycle
//possibly useful with non-standard clocks
}
dll void PlugInMiddleCycle(void*Instance)
{
}
dll void PlugInEndCycle (void*Instance)
{
}
```

C Header File: plugin.h

This is provided on the installation CD. It contains declarations of the required structures.

Handel-C file: plugin-demo.c

```
set clock=internal "1";
int 8 a,b;
macro expr MyOutExpr=a;
interface bus_out( ) MyBusOut(MyOutExpr) with
{extlib="pluginDemo.dll", extinst="0", extfunc="MyBusOut"};
interface bus_in(int 8) MyBusIn( ) with
{extlib="pluginDemo.dll", extinst="0", extfunc="MyBusIn"};
void main(void) {
for(a=1; a<10; a++) {
b=MyBusIn.in;
}
```

Numlib library

The numlib.dll library is provided. This contains a series of routines to deal with values that are greater than 64 bits wide. These numbers are stored in a NUMLIB_NUMBER structure and these routines use this structure to operate on. There are routines to convert NUMLIB_NUMBER structures to 32 and 64-bit values.

These routines can be accessed by including the header file numlib.h. Their functions are: Number allocation and de-allocation EXPORT void NumLibNew(NUMLIB_NUMBER **Num, unsigned long Width) Grab Width space for value indirectly pointed to by Num. Provide pointer to space acquired in Num.

For example:

NUMLIB_NUMBER*Fred;

NumLibNew(&Fred, 453);

EXPORT void NumLibFree(NUMLIB_NUMBER*Num) Free grabbed space for value pointed to by Num.

For example:

NumLibFree(Fred);

General Number Handling Routines

EXPORT void NumLibSet(char*a, NUMLIB_NUMBER*Result) Set value pointed to by Result to the value of string a.

For example:

NUMLIB_NUMBER*Fred;

NumLibNew(&Fred, 453);

NumLibSet("12452164748478321948732050832944", Fred);

EXPORT void NumLibCopy(NUMLIB_NUMBER*Source, NUMLIB_NUMBER*Result) Copy value pointed to by Source to value pointed to by Result.

EXPORT void NumLibPrint(unsigned long Base, int Signed, NUMLIB_NUMBER *Source)Print value pointed to by Source to screen in Base (display as signed or unsigned according to Signed). If Signed is non-zero, number is treated as signed (e.g. "-1"). If Signed is zero, numbers may be treated as unsigned (e.g. "255")

EXPORT void NumLibPrintFile(FILE*FilePtr, unsigned long Base, int Signed, NUMLIB_NUMBER*Source) Write value pointed to by Source to file pointed to by FilePtr as above.

EXPORT unsigned long NumLibPrintString(char*Buffer, unsigned long BufferLength, unsigned long Base, int Signed, NUMLIB_NUMBER*SourceIn). Write value pointed to by SourceIn as string to Buffer in given Base (length of Buffer given in Bufferlength). BufferLength is the maximum length that may be written.

EXPORT void32 NumLibBits(NUMLIB_NUMBER*a) Calculate the width of value pointed to by a and return number of bits (i.e. return the width of a specified in NumLibNew).

EXPORT void NumLibSetBit(NUMLIB_NUMBER*a, uint32 Bit, int Value) Set bit Bit of value pointed to by a to Value (0 or 1).

EXPORT int NumLibGetBit(NUMLIB_NUMBER*a, uint32 Bit) Get value of bit Bit of value pointed to by a.

EXPORT int32 NumLibGetLong(NUMLIB_NUMBER*a) Convert value pointed to by a to 32 bits and return it. The least significant bits are used and the result is right aligned (i.e. normal numbers not plugin style numbers).

EXPORT int64 NumLibGetLongLong(NUMLIB_NUMBER*a) Convert value pointed to by a to 64 bits and return it. The least significant bits are used and the result is right aligned (i.e. normal numbers not plugin style numbers).

EXPORT void NumLibWriteFile(NUMLIB_NUMBER*a, FILE*FilePtr) Write value pointed to by a in binary format to file pointed to by FilePtr.

EXPORT void NumLibReadFile(NUMLIB_NUMBER*a, FILE*FilePtr) Read binary format number from a file pointed to by FilePtr and put the result in a. This is the reverse of NumLibWriteFile. The width of a may be correct.

E.g.

NUMLIB_NUMBER*Fred;

FILE*FilePointer=fopen("file.dat", "rb"); NumLibNew(&Fred, 453);

NumLibReadFile(Fred, FilePointer);

Arithmetic operations

Note that in Handel-C, one can only do signed by signed or unsigned by unsigned division and cannot mix types. All operations are Handel-C like, and require some widths and/or type information.

EXPORT void NumLibUMinus(NUMLIB_NUMBER*a, NUMLIB_NUMBER*b); b=-a

EXPORT void NumLibAdd(NUMLIB_NUMBER*a, NUMLIB_NUMBER*b, NUMLIB_NUMBER*Result) Result=a+b EXPORT void NumLibSubtract(NUMLIB_NUMBER*a, NUMLIB_NUMBER*b, NUMLIB_NUMBER*Result) Result=a-b EXPORT void NumLibMultiply(NUMLIB_NUMBER*a, NUMLIB_NUMBER*b, NUMLIB_NUMBER*Result) Result=a*b EXPORT void NumLibDivide(NUMLIB_NUMBER*a, NUMLIB_NUMBER*b, int Signed, NUMLIB_NUMBER*Result) Result=a/b. All numbers treated as signed or unsigned, depending on the value of Signed.

EXPORT void NumLibMod(NUMLIB_NUMBER*a, NUMLIB_NUMBER*b, int Signed, NUMLIB_NUMBER*Result) Result=a % b. All numbers treated as signed or unsigned, depending on the value of Signed.

EXPORT void NumLibDivMod(NUMLIB_NUMBER*a, NUMLIB_NUMBER*b, int Signed, NUMLIB_NUMBER*DivResult, NUMLIB_NUMBER*ModResult) DivResult=a/b, ModResult=a % b. All numbers treated as signed or unsigned, depending on the value of Signed.

Comparisons

EXPORT unsigned long NumLibCompareEq (NUMLIB_NUMBER*a, char*b) Return result of comparison of number a to string b Equivalent to:

NUMLIB_NUMBER*Temp;

unsigned long Res;

NumLibNew(&Temp, a->Width);

NumLibSet(b, Temp);

NumLibEquals(a, Temp, &Res);

NumLibFree(Temp);

return Res;

EXPORT void NumLibEquals(NUMLIB_NUMBER*a, NUMLIB_NUMBER*b, unsigned long*Result) Return result of (a=b)

EXPORT void NumLibNotEquals(NUMLIB_NUMBER*a, NUMLIB_NUMBER*b, unsigned long*Result); Return result of (a !=b)

EXPORT void NumLibSGT(NUMLIB_NUMBER*a, NUMLIB_NUMBER*b, unsigned long *Result); Return result of (a>b) (a and b signed)

EXPORT void NumLibSGTE(NUMLIB_NUMBER*a, NUMLIB_NUMBER*b, unsigned long *Result) Return result of (a>=b) (a and b signed)

EXPORT void NumLibSLT(NUMLIB_NUMBER*a, NUMLIB_NUMBER*b, unsigned long *Result) Return result of (a<b) (a and b signed)

EXPORT void NumLibSLTE(NUMLIB_NUMBER*a, NUMLIB_NUMBER*b, unsigned long *Result) Return result of (a<=b) (a and b signed)

EXPORT void NumLibUGT(NUMLIB_NUMBER*a, NUMLIB_NUMBER*b, unsigned long *Result) Return result of (a>b) (a and b unsigned)

EXPORT void NumLibUGTE(NUMLIB_NUMBER*a, NUMLIB_NUMBER*b, unsigned long*Result) Return result of (a>=b) (a and b unsigned)

EXPORT void NumLibULT(NUMLIB_NUMBER*a, NUMLIB_NUMBER*b, unsigned long *Result) Return result of (a<b) (a and b unsigned)

EXPORT void NumLibULTE(NUMLIB_NUMBER*a, NUMLIB_NUMBER*b, unsigned long *Result) Return result of (a<=b) (a and b unsigned)

EXPORT void NumLibCond(unsigned long*Condition, NUMLIB_NUMBER*a, UMLIB_NUMBER*b, NUMLIB NUMBER*Result); Return result of Condition ? a: b.

Equivalent to:

if (*Condition==0)
{
NumLibCopy(b, Result);
}
else
{
NumLibCopy(a, Result);
}

Bitwise operations

EXPORT void NumLibNot(NUMLIB_NUMBER*a, NUMLIB_NUMBER*Result) Value pointed to by Result=~a EXPORT void NumLibAnd(NUMLIB_NUMBER*a, NUMLIB_NUMBER*b, NUMLIB_NUMBER*Result) Value pointed to by Result=a&b EXPORT void NumLibOr(NUMLIB_NUMBER*a, NUMLIB_NUMBER*b, NUMLIB_NUMBER*Result) Value pointed to by Result=a|b EXPORT void NumLibXor(NUMLIB_NUMBER*a, NUMLIB_NUMBER*b, NUMLIB_NUMBER*Result) Value pointed to by Result=a^b Concatenation operations In all the functions the int32 and int64 values are left aligned in line with the plugin interface.

EXPORT void NumLibCat64_32(uint64*a, unsigned long wa, unsigned long*b, unsigned long wb, NUMLIB_NUMBER*Result) Concatenate wa bits of 64 bit a and wb bits of 32 bit b and place it in value pointed to by Result. Value pointed to by Result=int wa a @ int wb b EXPORT void NumLibCat32_64(unsigned long*a, unsigned long wa,uint64*b, unsigned long wb, NUMLIB_NUMBER*Result) Concatenate wa bits of 32 bit a and wb bits of 64 bit b and place it in value pointed to by Result. Value pointed to by Result=int wa a @ int wb b EXPORT void NumLibCat64_64(uint64*a, unsigned long wa, uint64*b, unsigned long wb, NUMLIB_NUMBER*Result) Concatenate wa bits of 64 bit a and wb bits of 64 bit b and place it in value pointed to by Result. Value pointed to by Result=int wa a @ int wb b EXPORT void NumLibCat32_n(unsigned long*a, unsigned long wa, NUMLIB_NUMBER *b,NUMLIB_NUMBER*Result) Concatenate wa bits of 32 bit a with value b and place it in value pointed to by Result. Value pointed to by Result=int wa a @ b EXPORT void NumLibCatn_32(NUMLIB_NUMBER*a, unsigned long*b, unsigned long wb, NUMLIB_NUMBER*Result)Concatenate value a with wb bits of 32 bit b and place it in value pointed to by Result. Value pointed to by Result=a @ int wb b EXPORT void NumLibCat64_n(uint64*a, unsigned long wa, NUMLIB_NUMBER*b, NUMLIB_NUMBER*Result) Concatenate wa bits of 64 bit a with value b and place it in value pointed to by Result. Value pointed to by Result=int wa a @ b.

EXPORT void NumLibCatn_64(NUMLIB_NUMBER*a, uint64*b, unsigned long wb, NUMLIB_NUMBER*Result) Concatenate value a with wb bits of 64 bit b and place it in value pointed to by Result. Value pointed to by Result=a @ int wb b EXPORT void NumLibCat(NUMLIB_NUMBER*a, NUMLIB_NUMBER*b, NUMLIB_NUMBER*Result); Concatenate value a with value b and place it in value pointed to by Result. Value pointed to by Result=a @ b Drop Operations EXPORT void NumLibDrop32(NUMLIB_NUMBER*a, unsigned long b, unsigned long *Result) Drop b bits from a and place it in 32-bit Result. Value pointed to by Result=a\\b EXPORT void NumLibDrop64(NUMLIB_NUMBER*a, unsigned long b, uint64*Result) Drop b bits from a and place it in 64-bit Result. Value pointed to by Result=a\\b EXPORT void NumLibDrop(NUMLIB_NUMBER*a, unsigned long b, NUMLIB_NUMBER *Result) Drop b bits from a and place it in Result.Value pointed to by Result=a\\b Take Operations EXPORT void NumLibTake32(NUMLIB_NUMBER*a, unsigned long b, unsigned long *Result) Take b bits from a and place it in 32-bit Result. Value pointed to by Result=a←b EXPORT void NumLibTake64(NUMLIB_NUMBER*a, unsigned long b, uint64*Result) Take b bits from a and place it in 64-bit Result. Value pointed to by Result=a←b EXPORT void NumLibTake(NUMLIB_NUMBER*a, unsigned long b, NUMLIB_NUMBER *Result) Take b bits from a and place it in Result. Value pointed to by Result=a←b Shift Operations EXPORT void NumLibLSL(NUMLIB_NUMBER*a, unsigned long b, NUMLIB_NUMBER *Result) Result=a<<b EXPORT void NumLibLSR(NUMLIB NUMBER*a, unsigned long b, NUMLIB_NUMBER *Result) Result=a>>b. Logical right-shift: the top bits are zero-padded.

EXPORT void NumLibASR(NUMLIB_NUMBER*a, unsigned long b, NUMLIB_NUMBER *Result) Result=a>>b Arithmetic right-shift: the top bits are sign-extended.

Bit Selection Operations

EXPORT void NumLibBitRange32(NUMLIB_NUMBER*a, unsigned long b, unsigned long c, unsigned long*Result) 32 bit value pointed to by Result=a[b-1:c]

EXPORT void NumLibBitRange64(NUMLIB_NUMBER*a, unsigned long b, unsigned long c, uint64*Result) 64 bit value pointed to by Result=a[b-1:c]

EXPORT void NumLibBitRange(NUMLIB_NUMBER*a, unsigned long b, unsigned long c, NUMLIB_NUMBER*Result).Result=a[b-1:c]

Bit Insertion Operations

EXPORT void NumLibInsert32(unsigned long*a, unsigned long wa, unsigned long s, NUMLIB_NUMBER*Result) Insert bits of a into Result with LSB at position s. Width a is wa and a is<=32 bits wide.

EXPORT void NumLibInsert64(uint64*a, unsigned long wa, unsigned long s, NUMLIB_NUMBER*Result) Insert bits of a into Result with LSB at position s. Width a is wa and a is<=64 bits wide.

EXPORT void NumLibInsert(NUMLIB NUMBER*a, unsigned long s, NUMLIB_NUMBER *Result) Insert bits of a into Result with LSB at position s.

Plugins Supplied

The following plugins are supplied to assist in simulating Handel-C programs. sharer.dll allows a port to be used by more than one plugin.

synchroniser.dll synchronizes Handel-C simulations so that they run at the correct rate relative to one another.

connector.dll connects simulation ports together so that data can be exchanged between simulations.

7_segment.dll simulate a 7-segment display.

Sharing a Port between Plugins: sharer.dll

One can share a port between two or more plugins. One can share output ports to distribute the same data to multiple plugins. Input ports can be shared so that more than one plugin can feed data into the program (for example, to simulate tri-state ports). If more than one plugin provides data to the same port on the same clock cycle, the last piece of data fetched is the one used.

Syntax

To share a port, the with specification of the port or interface may contain:

extlib="sharer.dll"

extfunc="SharerGetSet"

extinst="ShareRecords"

The ShareRecords string consists of a Share record for every plugin which a port needs to be connected to. Share records have the following syntax: Share={extlib=<libname>, extinst=<extinst-string>, extfunc=<func-name>} The items within angle brackets have the same meaning as they have when they occur as the extlib, extinst and extfunc fields. FIG. 43 illustrates a plurality of possible values and meanings 4300 associated with libraries of the present invention.

interface bus_out( ) seg7_output(encode_out)
    with {extlib="sharer.dll",
    extinst=" \
    Share={extlib=<7segment.dll>,
    extinst=<A>,
    extfunc=<PlugInSet>}\
    Share={extlib=<connector.dll>,
    extinst=<SS(7)>, \
    extfunc=<ConnectorGetSet>}
    ",
    extfunc="SharerGetSet"
    };

Synchronizing Multiple Simulations: synchroniser.dll

If one wants to simulate multiple programs with different clock periods, one can use the synchroniser.dll. One then informs the synchronizer of their relative clock rates. The synchronizer may suspend simulations until they can complete a cycle in step with other simulations.

If one is single-stepping several synchronized simulations, some may be suspended until he or she has stepped other simulations to a point where the cycles coincide. There may always be at least one simulation that can be stepped.

To complete a simulation that is synchronized with other paused simulations (i.e. in break mode), one may have to single step the paused simulations until the finishing simulation can complete.

Syntax

To invoke synchroniser.dll, one may use the following with specifications in the set clock statement:

extlib="synchroniser.dll"

extfunc="SynchroniserGetSet"

extinst="clockperiod"

The clockPeriod string may contain a positive integer that represents the period of the clock. This is assumed to be in the same time units for all simulations that are to be synchronized.

set clock=external "P1" with
    {extlib="synchroniser.dll",extinst="100",
    extfunc="SynchroniserGetSet"};

Connecting Simulations Together: connector.dll

The connector allows one to connect two simulations together.

Syntax

One may connect a simulation to connector.dll by specifying the following in the with specification for a port.

extlib="connector.dll", extinst="terminalName (width) [[bitRange]]", extfunc="ConnectorGetSet"

Where:

terminalName is the name of the virtual terminal that the port is connected to. It may be any Handel-C identifier. All ports connected to terminalName are connected together. The terminal may be created if it does not exist.

width is the width of the terminal in bits. This may be the same for every occurrence of the same terminal name.

[bitRange] is optional. It specifies which bits of the port are connected to which bits of the terminal. If used, bitRange may specify the connections for all bits within the port.

Port bits are defined by their position within bitRange; terminal bits are specified by value. The first (leftmost) value in bitRange represents the most significant port bit, and the last (rightmost) value the least significant port bit. Terminal bits can be specified as an inclusive range [n:n], or a number. To leave a port bit unconnected, specify X as its terminal bit value.

If bitRange is omitted, bit 0 of the port may be connected to bit 0 of the terminal, bit 1 to bit 1 etc. The string extinst="connect1(16)[13,14,X,X,11:8]" connects an 8-bit port to a 16-bit terminal connect1 with the cross-connections below in Table 1.

TABLE 1

| Port bits | Terminal bits |
| --- | --- |
| 0 | 8 |
| 1 | 9 |
| 2 | 10 |
| 3 | 11 |
| 4 | X |
| 5 | X |
| 6 | 14 |
| 7 | 13 |

// Program A interface interface bus_out( ) seg7_output(encode_out)

with { extlib="connector.dll", extinst="SS(7)", extfunc="ConnectorGetSet"};

// Program B interface interface bus_in(unsigned 7 in) seg7_input( )

with {extlib="connector.dll", extinst="SS(7)", extfunc="ConnectorGetSet"};

Simulating a 7segment display: 7segment.dll

The 7 segment display allows one to connect a simulation of a seven segment display to a 7-bit wide output port.

Syntax

One may connect to 7segment.dll by specifying the following in the with specification for the 7-bit wide output port:

extlib="7segment.dll"

extinst="windowName"

extfunc="PlugInSet"

When the Handel-C program is simulated, a window containing a single 7-segment display appears. The window has the title windowName. The program may invoke any number of 7-segment display windows. The segments correspond to the following bits (where bit 0 is the least significant bit). A bit value of 0 turns the segment on, 1 turns it off The following array encodes the digits 0 to 9 to drive the 7segment.dll.
unsigned 7 encoder[10]={0x01, 0x4f, 0x12,0x06, 0x4c, 0x24, 0x20, 0x0f, 0x00, 0x04};.

EXAMPLE

This example consists of two separate Handel-C projects: Project A and Project B.
Project A:
  Increments a modulo-10 counter every cycle and outputs the value of the counter to the 7segment.dll plugin.
  Outputs the value of the counter to the terminal called SS(7) every cycle.
  Project A's cycles are 100 time units long.
Project B:
  Increments a modulo-10 counter on alternate cycles and outputs the value of the counter to the 7segment.dll plugin.
  Alternate cycles, reads the value from the terminal called SS(7) and outputs it to the 7segment.dll plugin.
  Project B's cycles are 50 time units long.
  Project B may be stepped twice for every step of project A.

Figure 44:
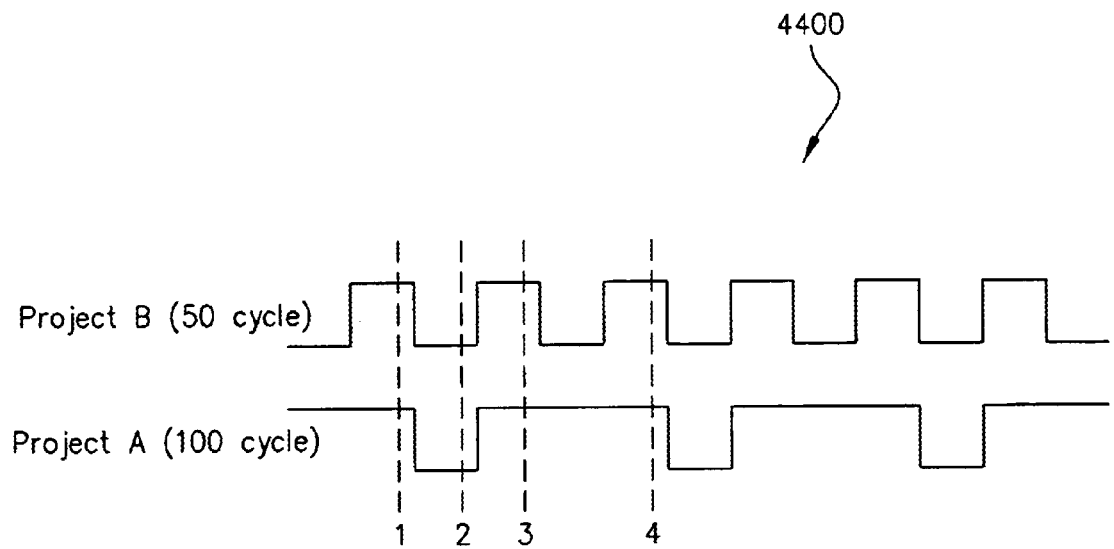
FIG. 44 shows how the synchronization works when single-stepping the two projects in simulation.

FIG. 44 shows how the synchronization 4400 works when single-stepping the two projects in simulation.

At point 1 both simulations are ready to step. If one steps Project B first, it may suspend at point 2, as it cannot continue until A has caught up. A may be stepped. It may suspend before 4, as it waits for B to catch up. Meanwhile, B can complete its first step to reach 3. One can then step B, so that it can catch up with A, and both projects are ready to step. If one steps Project A first, it suspends, as it may wait for B to reach 4 before it can continue. Now he or she may step Project B. When B is stepped, it reaches 3. A may still wait. When B is stepped again, it catches A, and both A and B are ready to continue.

If one single step the example above, two 7 segment display windows appear.

Once both simulations have passed the initialization part and entered the main loop, the windows should display these numbers.
  Time units 0 50 100 150 200 250 200 250 300 350
  A window 0 0 0 1 1 2 2 3 3 4 . . .
  B window 0 1 0 2 1 3 2 4 3 5 . . .
Source File for Project A:
  set clock=external "P1" with
  {extlib="synchroniser.dll",extinst="100",
  extfunc="SynchroniserGetSet"};
  signal unsigned 7 encode_out;
  interface bus_out( ) seg7_output(unsigned 7 output= encode_out)
  with {extlib="sharer.dll",
  extinst="\
  Share={extlib=<7segment.dll>,
  extinst=<A>,
  extfunc=<PlugInSet>} \
  Share={extlib=<connector.dll>,
  extinst=<SS(7)>, \
  extfunc=<ConnectorGetSet>}
  ",extfunc="SharerGetSet"
  };

//Define values to light 7-segment display from 0–9
rom encoder[10]=
  {0x01, 0x4f, 0x12, 0x06, 0x4c, 0x24, 0x20, 0x0f, 0x00, 0x04};
void main(void)
{
unsigned 4 count;
count=0;
while(1)
{
par
}
count=(count==9) ? 0 :(count+1);
encode_out=encoder[count];
}
}
Source file for Project B:
  set clock=external "P1" with {extlib="synchroniser.dll",
  extinst="50", extfunc="SynchroniserGetSet"};
  signal unsigned 7 encode_out;
  interface bus_out( ) seg7_output(unsigned 7 output= encode_out)
  with {extlib="7segment.dll",
  extinst="B",
  extfunc="PlugInSet"};
  interface bus_in(unsigned 7 in) seg7_input( )
  with {extlib="connector.dll",
  extinst="SS(7)",
  extfunc="ConnectorGetSet";
//Define values to light 7-segment display from 0–9
rom encoder[0] =
  {0x01, 0x4f, 0x12, 0x06, 0x4c, 0x24, 0x20, 0x0f, 0x00, 0x04};
void main(void)
{
unsigned 4 count;
count=0;
while(1)
{
par
{
count=(count==9) ? 0:(count+1);
encode_out=encoder[count];
}
encode_out=seg7_input.in;
More information regarding cosimulation will now be set forth.
WP26 Cosimulation Tool
  The present section proposes a number of interfaces to be used to enable multiple simulators to be used together in a generic fashion. First of all the objectives of the present embodiment are explained.

Objectives

This section aims to establish a technique to enable multiple simulators to cosimulate with each other without having to rewrite simulator-specific plugin code.

It should be possible to make simulation-accuracy/ simulation-speed trade-off decisions, so that different parts of the cosimulation execute with the desired degree of accuracy/speed.

Users of the simulators used in cosimulation should be able to write (in Handel-C, VHDL, C or whatever) the models being simulated independently of any other part of a cosimulation arrangement. This may enable reuse of models from one cosimulation arrangement to another.

Issues

Logic Values

High-impedance/tri-state simulation:

Some support for high-impedance states are beneficial for making simulation components modular when buses (or other wires that may be driven by different components at different times) are involved.

Internal resistance:

Helps model pull-up/pull down resistors, and keep models independent for digital circuits three levels should be adequate: zero, infinite, and 'some'.

'Unknown' values:

If a floating input is read the result may be unpredictable, similarly if a circuit with a pull-up resistor is linked to a circuit with a pull-down resistor, there's nothing driving the circuit. In these situations rather than picking an arbitrary result, propagating an 'unknown' result may be more informative.

9 valued logic (U,X,0,1,Z,W,L,H,-)

(uninitialized, strong unknown, strong 0, strong 1, hi impedance, weak unknown, weak 0, weak 1, don't care)

VHDL, Swift/OMI, IEEE 1164

4 valued logic (0,1,Z,X)

Verilog, SystemC 2 valued logic (0,1)

Cynlib, Handel-C 120 valued logic!

Verilog, OMI, IEEE 1364, (Most of these are derived from permutations of different degrees of uncertainty of the values and strengths of values, each value is represented by a strength0 component combined with a strength 1 component. The strengths range from: Supply, Strong, Pull, Large, Medium, Small, HiZ)

Using a two-valued system is fastest, but not entirely accurate. If one wishes to be able to determine if an LED may light up, he or she needs to be able to distinguish high-impedance from a logic zero. Being able to represent high-impedance also enables one to identify if two circuits are trying to drive a wire at the same time and flag this error to the user. High-impedance is also useful when the direction of information flow is not known. This isn't an issue for data-buses for example, as the write-enable line can tell one which way the data is flowing, but if he or she wished to model a switch linking two buses together, a simple two-valued logic system would run into trouble.

For fast simulation of correct circuits where logic values are used purely for passing information (not lighting up LEDs etc) and the direction of information flow is known by the connected circuit elements then two-valued logic is sufficient.

Event-based and Cycle-based Simulation:

Some simulators are event based (ModelSim) some are cycle based (Handel-C, ARMulator, SingleStep). Event based simulation is more general as it determines on-the-fly what needs to be simulated when. State based simulations run according to a predetermined order of execution, this may give them a speed advantage.

Figure 44A:
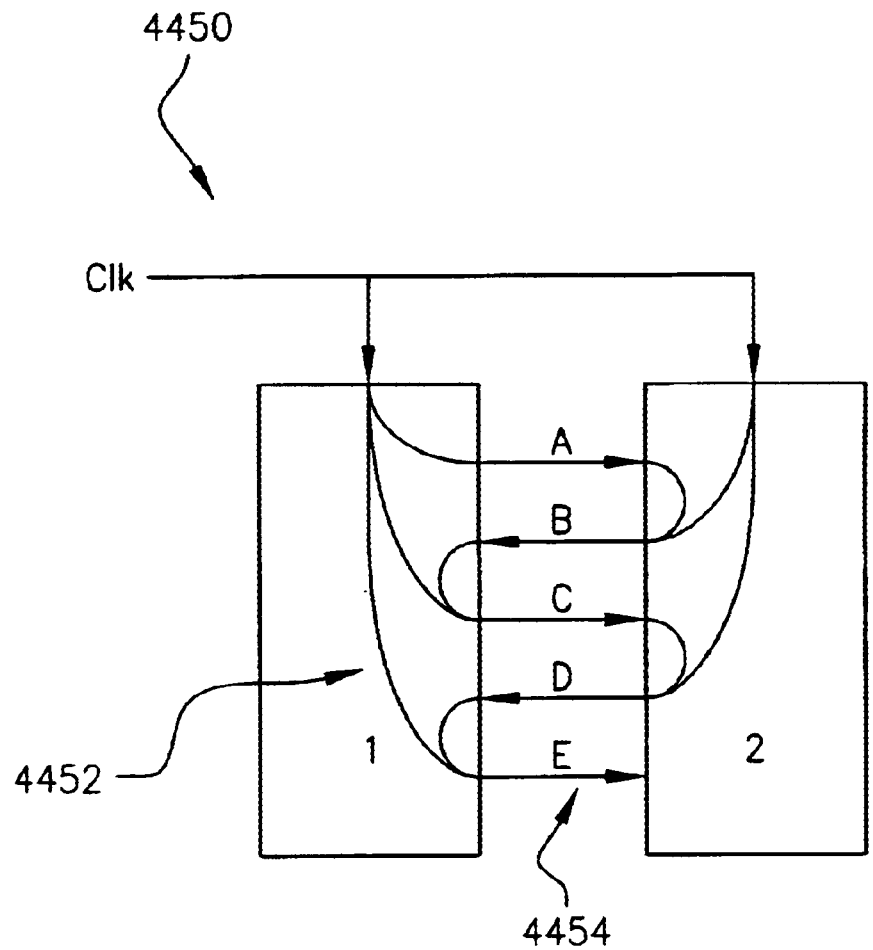
FIG. 44A illustrates a pair of simulators, in accordance with one embodiment of the present invention.

When integrating event-based simulators, the ideal order of execution is not obvious. If one considers the following cosimulation arrangement:

FIG. 44A illustrates a pair of simulators 4450, in accordance with one embodiment of the present invention. In this diagram, the dotted line 4452 represents dependencies, and the solid arrows 4454 are connections between simulators. If both simulators were cycle-based then the ideal order of execution would be one which didn't require either simulator to repeat a simulation cycle. This is achieved by synchronizing the simulators at a fine-grain enough level for changes in A to propagate down through to E in one simulation cycle. This scheduling order can be referred to as being Interleaved.

If both the simulators in the above arrangement were event-based, the natural order of evaluation would be to have each simulator wait for changes on their inputs, and then propagate the effects of these changes to their outputs. Thus simulators 1 and 2 each execute three and four times respectively. This scheduling order can be referred to as Fully-propagated.

If one simulator were cycle-based and one event-based, then the cycle-based simulator may be quicker if one uses a relatively fine-grained level of synchronization and only simulate the cycle once. However the event-based simulator may benefit from getting all its inputs at once and not one at a time. The work required by an event-based simulator to propagate the effects of the input-events to the outputs may be duplicated by feeding inputs in one at a time. Also if multiple input-events occur at once, they may cancel each other out in a way that saves an expensive computation. For example, if two inputs are fed into an xor gate, the output of which triggers some expensive computation, then if both inputs to the xor change, it makes a big difference if they occur simultaneously or sequentially.

When cosimulating with event-based and cycle-based simulators it may be desirable to enable the user to decide whether the simulator scheduling used should be most suited to cycle-based or event-based simulators. One can make an event-based simulator look like a cycle-based one, and a cycle-based simulator look like an event-based one, the question is which approach is best, and the answer is likely to be different in different circumstances. Supporting hardware emulators:

Using hardware to emulate a target board is common practice. However co-simulation is done, it shouldn't preclude the possibility of mixing hardware emulation with software simulation.

Multi-processor Systems:

The cosimulation methods used should be able take advantage of multiple processors and possibly multiple computers. The extent to which parallelism can be exploited is influenced by the proportion of computation to communication/syncronisation. Synchronization over a network is viable, despite potentional of communications overhead. A cost-benefit analysis may be necessary prior to implementation. For very fast simulators, the communications overhead of synchronizing the simulators may be greater than the benefits gained when dealing with two processes on the same multiprocessor computer. However without radical restructuring of the implementations of all (but one) of the simulators being used, one may incur the possible synchronization overhead.

Buffering Communication Between Simulators:

When the degree of communication between simulators is low, allowing the simulators to run ahead of each other can reduce the amount of context switching between processes and increase simulation speed. Using a cosimulation scheme which doesn't preclude such optimizations may be beneficial. When debugging, having simulators running ahead of each other may cause problems, if the simulator lagging behind reaches a breakpoint before catching up with the other simulator, then the user may see the two simulators in an inconsistent state.

Starting and Identifying Simulators:

Whether the user should manually start each simulator or whether a co-simulation program should launch them is also an issue. If two instances of the same simulator are automatically started then they can be passed arguments through environment variables so they identify themselves to the co-simulator program. If the simulators are manually started from the start menu, they may gain their identity after they establish communication with the cosimulation program.

A pool of simulators could be used to avoid repeated starting and quitting of simulators. When a cosimulation sessions ends, the simulators would enter a pool of available simulators ready for another cosimulation session. Simulators typically provide a window where arbitrary output can be sent, this would be used to indicate which simulator was doing what.

Automatically Controlling the Simulators

Ideally the state of a simulator could be controlled on startup and during execution. For example to simulate the Kompressor board on startup one doesn't want to have to require the user to load up three different programs for the two FPGAs and the processor.

Similarly when the one FPGA or the processor reconfigures the other FPGA one doesn't want to involve the user. SingleStep and ModelSim both provide scripting languages which may help in these situations. The memory in the ARMulator can be set by plugins, but there doesn't appear to be a way for plug ins to change the associated symbol tables and debugging information. Handel-C doesn't enable plugins to change the circuit currently being simulated.

Integrating Simulator GUIs

It's relatively easy to co-simulate simulators together by having each pretend to be peripheral hardware plugged into the others. Each simulator thinks it's in charge, and has no knowledge that other fully fledged simulators with their own GUIs are being used for the plugin peripheral hardware. If one wishes to be able to use the debugging functions of one GUI to control all the simulators, then the plugins need a way to pause and resume the simulators. A fudge would be to have the plug ins prompts the user to pause and resume the simulators, but this would quickly become tedious and annoying. ModelSim enables plugins to pause the simulation, but it doesn't enable them to resume simulation. Other simulators (Handel-C, ARMulator, SingleStep) don't allow plug ins to pause simulation.

Another issue arises from the different simulators allowing simulation to stop at different times. SingleStep only allows simulation to stop between instructions. Handel-C only allows simulation to stop between clock cycles, ModelSim allows simulation to stop anywhere. This would be a problem for example when one wishes to advance time by less than a clock cycle in ModelSim, if the ModelSim simulation relied on asynchronous circuits simulated by Handel-C then the Handel-C GUI would not be available mid clock cycle. It may also be a problem when cosimulating two microprocessors if the instructions on different microprocessors don't start and finish on the same clock cycles.

Depending on the level of communication between two simulators, it may be possible to allow one to run ahead of another so both can be stopped, this may be confusing for the user though, as each simulator would have a different idea of what the time was.

Integrate with other Vendors Cosimulation Tools

Synopsys, Mentor Graphics, Cadence, Innoveda and Arexsys all provide cosimulation tools (Eaglei, Seamless, Affirma HW/SW Verifier, Virtual-CPU and CosiMate respectively). These enable the integration of a variety of HDL simulators with Instruction Set Simulators (ISS).

The cosimulation tools from Synopsys' Eaglei, Mentor Graphics' Seamless and Arexsys' CosiMate all provide support for a wide range of HDL simulators. Processor support for Synopsys' Eaglei and Mentor Graphics' Seamless is provided mostly though Mentor Graphics' XRA Y debuggers, and Arexsys' CosiMate support "a wide range of C debuggers". Integrating the Handel-C simulator into one or all of these cosimulation tools is possible.

There's a fair amount of documentation on Mentor Graphics Seamless CVE (Co verification Environment). One important aspect of Seamless is the way it can speed up execution by reducing the amount of time spent simulating hardware. This enables the ISS to proceed unhindered for a significant amount of time. Minimizing hardware simulation is done through a number of optimizations: data access optimizations, instruction fetch optimizations and time optimizations. The data access and instruction fetch optimizations prevent the hardware simulator from seeing bus activity during bus-cycles it is not interested in. The hardware simulator is however still advanced in time. The time optimizations effectively stop the hardware simulator seeing clock changes during bus-cycles it is not interested in, this enables the ISS to be run for many cycles at a time without context switching.

For a cycle-based simulator like Handel-C, the data access and instruction fetch optimizations would make no difference, the simulator has just as much work to do whether it sees changes on the bus or not. The time optimizations would make a difference. Knowing when it is safe to use time optimizations is not easy, Seamless CVE allows the user to enable or disable time optimizations according to how the memory is being accessed, whether this still maintains simulation accuracy is left to the user to decide. If it were possible to automatically know when a simulator had reached a stable-state then the time optimizations could be made more reliably and generically, rather than relying on CPU memory access to give hints. Possibly a user could modify their design to tell the cosimulation tools when their design had reached a stable-state and would only need to see another clock change when something else changed in a relevant way as well.

Cosimulation Via OMI

The Object Model Interface is an interfacing standard (IEEE 1499), which enables models written using one tool to be incorporated into another. Tools known as Model Compilers or Model Packagers take a VHDLNerilog/C description of a model and turn it into object code which is OMI compliant and can be imported into other simulation tools. OMI provides a means for IP vendors to provide simulation models of their IP without giving away the source code. By being an open standard OMI also increases interoperability.

OMI was created by the Open Model Forum. Synopsys, Mentor Graphics and Cadence were all involved in the process. OMI combines two API's, a simulator-API and a model-API. The simulator-API is based on SWIFT from Synopsys and deals with interfacing models to the rest of a simulation. The model-API is based on a proposal from Cadence and is concerned with the internal workings of the models. Cadence products already support OMI, several other vendors have pledged to support it soon. Use of SWIFT is currently more common than OMI, but SWIFT may become a legacy standard.

OMI is a relatively complex standard and supporting it would be a sizeable undertaking. It doesn't provide specific support for cosimulation and would quite possibly be a hindrance in optimizing cosimulation to run faster. It would be possible to involve OMI models in a cosimulation, but to use OMI interfaces as the sole means of communication in cosimulation would most likely be overly restrictive Cosimulation with SystemC It would be possible to use models written in SystemC in a cosimulation arrangement. It may also be possible to use SystemC as the means of integration of a number of models not written in SystemC. However as with OMI restricting integration to just that that can be achieved via SystemC is likely to be overly restrictive. Although the source to SystemC is freely available, modifications to it can only be distributed back to the SystemC committee. So improving SystemC to better support cosimulation of non-systemC models is not likely to be possible.

Proposed Architecture

Two categories of simulation models are proposed, light-weight thread-sharing models and heavy-weight process-hogging models. They each have the following characteristics:

Light-weight thread-sharing models:
Implemented as a dll.
No blocking functions.
Able to instantiate and interconnect sub-models.
Heavy-weight process-hogging models:
Implemented as a separate process, requiring IPC for synchronization/communication.
Not able to instantiate sub-models.

Light and heavy refer to the communication overhead of using these models, and not the simulation overhead of the models. Light weight models would typically be used for implementing very simple glue logic, clocks and optimization logic (see later). Heavy weight models would typically be used for wrapping up existing simulators which have a plug-in interface. However there would be no disadvantage in a computationally intensive model using the light-weight model interface, in fact it would give the advantage of added flexibility when deciding which computations should be performed in which processes.

Execution of the cosimulation environment would consist a number distinct stages: instantiation, analysis and simulation. Instantiation begins with a single root model, which would typically be a light-weight model which instantiates and connects up other models. This root-model could be a simple 'C' program or an elaborate GUI which allowed the user to interactively instantiate and connect up models. The models instantiated have a hierarchical relationship, there is no global naming policy for the ports on a model. Models are only able to communicate via ports they have been given by their parent or children.

After initialization is complete an automatic analysis stage begins. The hierarchical relationship becomes irrelevant and the interconnections between models are analyzed as an unstructured network. At this stage the cosimulation tool builds up any structures it may need at simulation time. Optimizations like static scheduling decisions belong here. During simulation dynamic scheduling decisions are made, process-hogging models are synchronized with each other, communication between models is handled.

Processes and DLLs

Figure 44B:
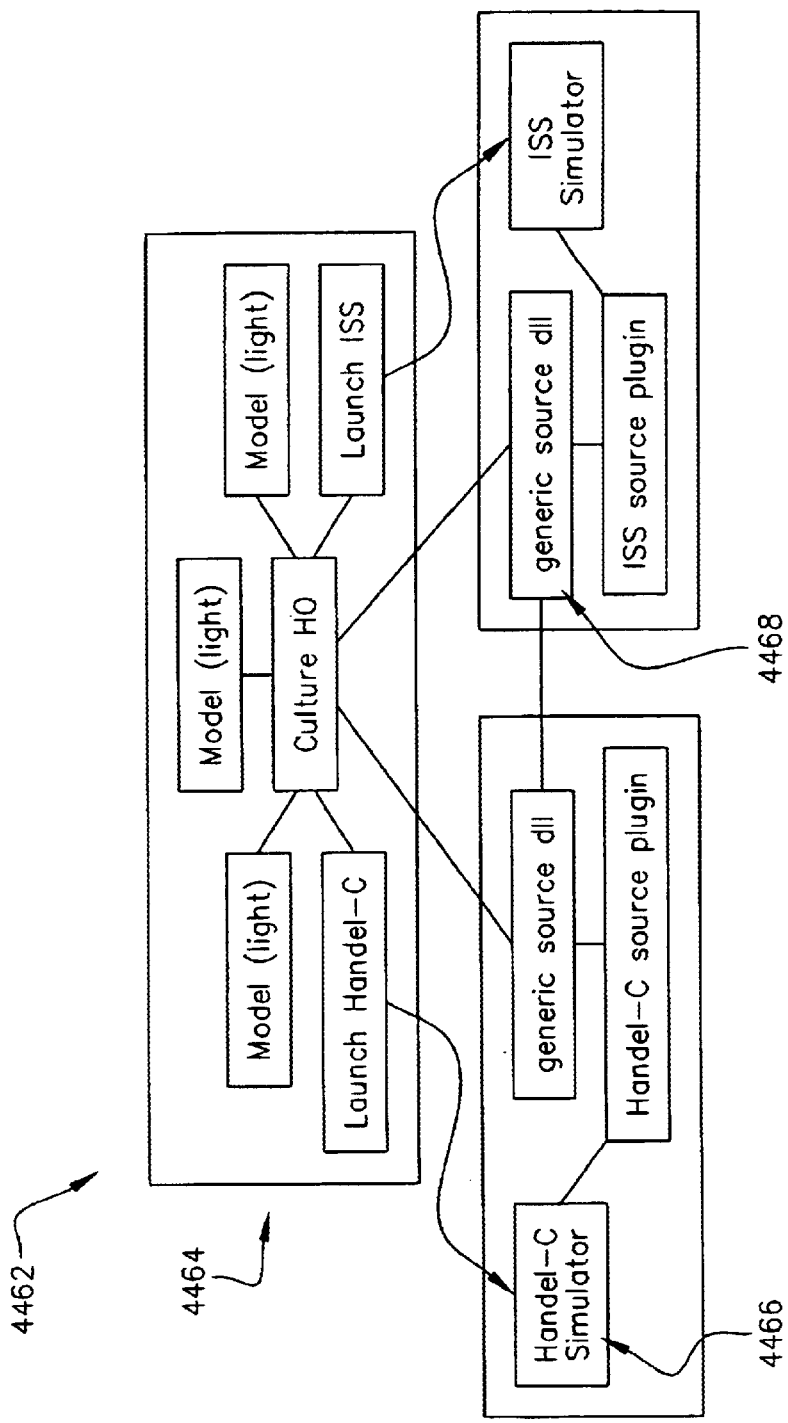
FIG. 44B illustrates a cosimulation arrangement including processes and DLLs.

FIG. 44B illustrates a cosimulation arrangement 4462 including processes and DLLs. The present figure shows three processes 4464, each process contains a program 4464 and a number of dlls 4468.

The Cosim HQ program starts everything off. It starts off the root model which is a light-weight model existing as a dll in the same process as the Cosim HO program. This model then instantiates and connects other models. Other light-weight models are simply loaded into the same process.

Starting up process-hogging models is a little more involved. For a light-weight model to instantiate a process-hogging model, the light-weight model may know the name of a simulator specific launcher dll. This name is passed to Cosim HO which gives the launcher dll details of how IPC is to be achieved. The launcher dll then loads up the simulator which may at some point load up the simulator specific cosim plugin, which loads up a generic cosim dll. The simulator specific launcher and cosim plugins may cooperate is passing the IPC connection information from Cosim HO to the generic cosim dll. Once this has been achieved communication between the two processes can take place. The techniques described here avoid the simulator specific plugins needing to know how IPC takes place, and avoids the cosimulation program needing to know how to start up and pass parameters to every different kind of simulator.

Communication may take place between processes on one machine, or between multiple machines across a network, only cosimulation specific code needs to be concerned with this. The simulator specific code needn't be concerned.

Similarly any mechanism may be used to pass connection details from the launcher dll to the generic cosim plugin, such as command line arguments, environment variables, shared memory, files or whatever, and only the simulator specific code needs to know about it, not the cosimulation code.

Light-weight Models

Light-weight models can be used for models which are computationally cheap and which one wants to keep isolated from other models. For example a clock, one wouldn't want a separate process just to contain a clock model, but he or she wouldn't want to have to arbitrarily pick another model in which to put the clock, as this would hinder interoperability between models. Light-weight models can also be used for optimizations such as preventing a hardware simulator seeing the clock when a CPU is doing something unrelated to the hardware.

Light-weight models needn't exist in the same process as the Cosim HO program. The Cosim HO program and the generic cosim dlls may conspire between them to achieve the desired execution order in anyway they please. One could migrate light-weight models out to other processes. For example if an ISS is able to simulate many cycles without a hardware simulator being involved, it would be desirable for the clock generation code to be in the same process as the ISS. If the generic cosimulation dll is clever enough then communication between the process-hogging simulators and the cosim HO may be reduced or eliminated altogether, thus reducing the number of context switches. Each process loading the generic cosim dll may become capable of direct communication with other simulators, communication needn't go via the cosim HO.

Optimizations

Light-weight models can be used to shield a hardware simulator from details it doesn't need to see. If a light-weight model is placed between ISS and hardware simulator, then with some configuration the light-weight model can use address decoding to determine whether the hardware simulator needs to run or not. Knowing when its safe to not clock the hardware simulator is application specific. A pathologically unoptimizable example would be using hardware to profile a CPUs activity, in most cases though significant optimizations should be possible.

Application Programming Interfaces Exchanging Interfaces

The interfaces between programs and dlls are defined by a number of header files. There may be a number of interfaces between a given program-dll/d li-dll pair. Each program or dll provides a mechanism by which an interfacing program/dll may request access to a named interface. Before an interface may be requested though, the mechanisms by which interfaces are obtained are exchanged between the communicating program/dlls.

typedef void*GetInterfaceT(void*state, char*ifname);
int ExchangeInterfaces(GetInterfaceT*, void*, GetInterfaceT, void);

The dll being loaded implements ExchangeInterfaces, the initiating program Idll calls ExchangeInterfaces with a function which the dll being loaded may call to obtain interfaces. It also passes a void pointer which should be passed to the GetInterface function whenever it is called. This void pointer may point to anything the initiating program Idll wants, including NULL if the initiating program Idll has no use for it. The initiating program Idll also receives back a corresponding GetInterface function and associated void pointer.

Accessing interfaces by name makes it possible to add new interfaces and support multiple versions of an interface. If interface names were ever to be created outside Celoxica, the names could incorporate GUIDs (Globally Unique IDentifiers) but this seems unlikely to be necessary.

Interfaces

For interfacing between models there are three kinds of interface:

Init—for initialization and termination

CommSync—for communication and synchronization

Control—for cross-model breakpointlstop/start control

These interfaces are implemented for each of the three model types:

Light

Event

Cycle

Each interface has two sides a simulator side and a cosimulation side. Also there is an interface for using the launching dlls. This gives a total of 19 interfaces. Each interface has a structure containing function pointers to the functions that interface may support. To implement an interface the programmer may create an instance of the required structure. The 19 interface structure types are listed here:

Init-CoCycle-IFT

Init-SimCycle-IFT

CommSync-CoCycle-IFT

CommSync-SimCycle-IFT.Control-CoCycle-IFT

Control-SimCycle-IFT Init CoEvent IFT

Init SimEvent IFT --

CommSync-CoEvent-IFT

CommSync-SimEvent-IFT Control CoEvent IFT

Control SimEvent IFT --

Init-CoLight-IFT

Init-SimLight-IFT commSync-CoLight-IFT

CommSync-SimLight-IFT .Control__SimLight__IFT

Launch SimProcess IFT

The functions defined in these interfaces are detailed in the header files: cosim-light .h, cosim-event.h, cosim-cycle.h, cosim-launch.h. If the ability to simultaneously save and restore state across a number of simulators is to be implemented then further interfaces may be defined.

Datatypes

Initially this embodiment may only support 2 and 4 valued logic values. When ports are declared the they may have a type associated with them. These types are represented by abstract C values, these are either predefined e.g. hitType , logic4Type, logic9Type, int64Type , int32Type, int16Type, int8Type, realType, douhleType. Also there are a number of functions enabling the user to create vector types e.g. mkBitVectorT (uint) , mkLogic4VectorType (uint), mkLogic9VectorType (uint) Finally if the user wishes to use another type altogether they may create their own type with the function userType (char*name, int size), so long as other parts of a cosimulation arrangement agree on how large this user type is, the cosimulation tool may allow them to do what they like with data of this type.

Values are given the abstract type ValueT. This is a void pointer, for bit-vector types it may point to a memory location containing bits packed into bytes, i.e. a 32-bit long bit-vector may just be 4 bytes in memory. For 4-valued logic vectors, ValueT may point to a Logic4 VectorT struct containing two more pointers hitKind and hitValue. hi tKind and hitValue each point to bits packed into bytes in memory for a given bit location the values in hi tKind and hi tValue determine the 4-valued logic value as follows in Table 2.

TABLE 2

| HitKind | hitValue | 4-valued logic |
|---|---|---|
| 0 | 0 | Z |
| 0 | 1 | X |
| 1 | 0 | 0 |
| 1 | 1 | 1 |

This enables very quick checks to be performed to see if an entire logic-vector consists of Os or ls, or to check if an entire vector is in a HiZ state. This is useful as typically a bus may either be fully driven or fully floating. (The implementation of SystemC makes this sort of check a much slower process). The header file cosim-types .h contains the type declarations and function prototypes for declaring and using types in cosimulation.

When converting from 4-valued logic to 2-valued logic one have some freedom in converting X and Z values. Options include always converting them to 0, converting them to the previous value so as to minimize events, and converting them to a random value in order to stress test a model. Or one could consider an attempt to read an X or Z to be an error, and flag it at run-time.

Initialization

Cosimulation always starts off with one root model. As only light models can instantiate child-models the root model may be a light model if any more than one model is to run. During instantiation a model may create ports of any type and declare dependencies between these ports. Once a child model is instantiated, the parent may examine which ports the child created, and may then connect the ports to any other (type-compatible) ports.

Simulation

After the hierarchy of models created during initialization have been flattened out to a non-hierarchical network, simulation can begin. Cycle based models call functions in the CommSync interface to read and write ports when ever they want, synchronization is achieved by blocking the returns of these functions calls. Event based simulators, output when ever they want, and request to be informed of input events when they are ready for them. Light-weight models are implemented as event-based models, and no functions are allowed to block. Simulators are able to register wake-up calls for simulating internally timed logic, the simulators may be woken up earlier if another simulator triggers off an event.

Launching

It is the responsibility of the programmer integrating a simulator with the cosimulation tool to write a launch dll. This dll would typically startup a new simulator process but it doesn't have to, it could pick an already existing simulator from a pool if idle simulators. If a simulator disconnects from a cosimulation arrangement early, then the launch dll may be called in the middle of simulation to resurrect the disconnected simulator. This resurrection would be necessary in situations like a user resetting a Handel-C program. Handel-C terminates all plugins and then restarts them when resetting a program. For this not to have adverse effects on the cosimulation, the cosimulation tool may allow a simulator to disconnect and reconnect as long as it declares just the same ports with the same names, types and dependencies. One could use the dynamic relaunching as a means of hot-swapping simulators, but that's not what it's meant for.

The launching dll should assume it is to start the simulation process on the same computer it is running on. If the Cosimulation tool wishes to run a simulator on another host, the cosimulation tool may itself be responsible for running the launching dll on the remote host. The launching dll may be given connection info which should be passed on via the simulator and the simulator specific plugin to the generic cosim dll, which may understand the connection info and establish a connection back to the cosim tool over the network, and possibly other generic cosim dlls on other hosts.

Alternatives

Instead of allowing child models to declare whichever ports they want, and have the parent model figure out how to wire the ports up, one could have the parent declare a number of signals and pass these to child processes. By passing the same signal to more than one child model a connection would implicitly be made. It would then be the responsibility of the child to check the signals passed in were appropriate. Declaring signals first is less suited to an interactive graphical instantiation and connection tool. A user would probably find it easier to instantiate a model and see which ports they got back, rather than having to correctly predict which ports a child model may want. One could provide both techniques together. SystemC allows signals to be passed into and ports to be passed back from a model being instantiated, CynApps only allows signals to be passed into a model. Its probably best to stick to the relatively simple technique of allowing child models to create which ever ports they like, until advantages of enabling both techniques are found in practice.

SystemC allows models to be implemented in either a non-blocking way similar to the light-weight models described here, or to use cooperative non-preemptive multi-threading to allow multiple models to execute in a relatively light-weight manner without OS calls. This kind of multi-threading may make it easier to write more complex light-weight models, however apparently it makes execution slower. This kind of light-weight threading may be worth supporting if people outside Celoxica are going to write moderately complex light-weight models.

Further Work

There are three different levels of user for this cosimulation tool:

People integrating new simulators

People writing light-weight models

The final users of a cosimulation arrangement

Documentation needs to be provided for each of these types of user. The documentation for the final users may contain simulator and arrangement specific parts. Different kinds of optimizations need to be experimented with. Optimizations in other cosimulation tools have arisen out of necessity following experiences with simulation that just run too slow.

Cosimulation Algorithms and Programming Interfaces

This section explores different algorithms that could be used for cosimulating any number event-based and cycle-based simulators and the implications this has on the programming interfaces used. The present section considers three types of simulator:

Event-based, such as ModelSim

Cycle-based synchronous, such as SingleStep and ARMulator where simulation of asynchronous logic is not performed and cycles cannot be repeated Cycle-based asynchronous, such as Handel-C and probably other Cycle-based simulators such as Cyclone (Synopsys HDL simulator), here asynchronous logic can be simulated, and simulation cycles can be repeated as necessary.

If cosimulation with simulators which simulate asynchronous logic, but don't allow cycles to be repeated is required, then some cosimulation arrangements may be unsimulatable, it may be necessary to give compile-time or run-time errors in these circumstances. All simulators may either only simulate untimed logic or may provide a means by which a cosimulation plug in can find out when the next event is due and provide earlier stimulus if necessary.

These different types of simulator may be wrapped up so as to enable communication between different simulators. This wrapping may make each simulator look like an event based simulator and may contain additional information and interfaces to help in scheduling simulator execution.

Scheduling Event-based Simulators

Wrapping up event based simulators to look like event based simulators is relatively easy. Issues involve propagating input events and detecting output events. It doesn't appear to be possible for a plugin to instruct ModelSim to process all current events without advancing simulation time. Advancing simulation time by a very small amount is one solution to this, so long as repeated simulation doesn't result in these small amounts adding up to something significant. ModelSim can be instructed to call callback routines whenever a signal changes.

Scheduling Cycle-based Synchronous Simulators

Cycle-based synchronous simulators (such as an Instruction Set Simulator(ISS)have a very fixed idea of the order in which evaluation should proceed. Fortunately as they do not simulate asynchronous logic it is never necessary to request such a simulator to resimulate a cycle. Cycle-based synchronous simulators are sensitive only to active clock-edges, all other changes can be ignored. Wrapping such a simulator up as an event-based simulator is straight forward.

Scheduling Cycle-based Asynchronous Simulators

There are a number of different ways for execution of a cycle-based asynchronous simulator to proceed. Here one can explore some different scheduling policies.

Ideally when wrapping such a simulator up as an event-based simulator the clock input shouldn't be treated as a special case. A simple approach would be to wait for an input event to arrive, and then advance the simulator far enough for the effects of the input change to propagate to all dependent outputs. If there are no current input events pending then advance simulation time, until the next future event is scheduled, this may typically cause a clock input to a cycle-based simulator to change, but in general it could be any input.

ASAP I Eager Simulation

One need not know which outputs depend on which inputs, one can be conservative and assume all outputs depend on all inputs. When a simulator gets the chance to run again, it can check to see if any inputs have changed and if so advance far enough for all outputs to be updated.

This approach to simulation makes no assumptions about the order in which the cycle-based simulator gets and sets inputs and outputs, it makes no assumptions about the dependencies between inputs and outputs. It does not require the concept of a start of simulation cycles and the end of a simulation cycle. As each outputs is recomputed by the simulator, one can check to see if it has changed, and if so propagate the effects to other simulators. The order in which the simulators execute is not too critical. One could run just one at a time, or all simultaneously.

Simulation in Turns

If running just one simulator at a time, all simulators but one would be stopped using OS-level wait operations, just one would proceed. When finished one can check if any other simulators need to execute, if so pick one arbitrarily to go next, otherwise advance simulation time.

Simultaneous (Multi-processor) Simulation

If cosimulating two low-computation/high-communication simulators on a multiprocessor system then one could get away with fewer OS-level calls. One could have a simulator running on each processor. No synchronization would be needed for passing word sized data between the simulators. For larger data transfers, busy-wait mutual exclusion techniques would be an efficient mechanism for maintaining data integrity. Each simulator would loop as fast as it liked until none of its inputs changed, then it would use an OS-level wait function to wait to see if any of the other simulators subsequently changed the inputs.

When all simulators reach this waiting state then simulation time can advance, typically causing a clock signal to change. Semantic implications of evaluation order These two techniques could result in different results being computed depending on the order in which simulators execute. For example if one simulator is going to change two outputs from (1, 0) to (0, 1), and another simulator is going to AND these two values together, the order in which the two simulators read and write these values may affect the result. The output of the AND may pulse high for an infinitesimally short length of time, or it might not. If some circuit counts these pulses then the implication could compound. These problems could only occur in badly designed circuits, the issues involved are inherent in true hardware as well and so may be in any simulation of it. (VHDL is able to claim to have precisely defined semantics by dictating what is computed when. However this results in what might be thought of as semantics preserving transformations such as splitting a signal in two, not being semantics preserving. Again this is only an issue for badly designed circuits).

Just-in-time I Lazy I Interleaved Simulation

Busy waiting might be worth while when one has at least as many processors as simulators wishing to busy wait, and one doesn't want to use the computer for anything else at the same time, but for most circumstances it would be unsuitable.

Figure 44C:
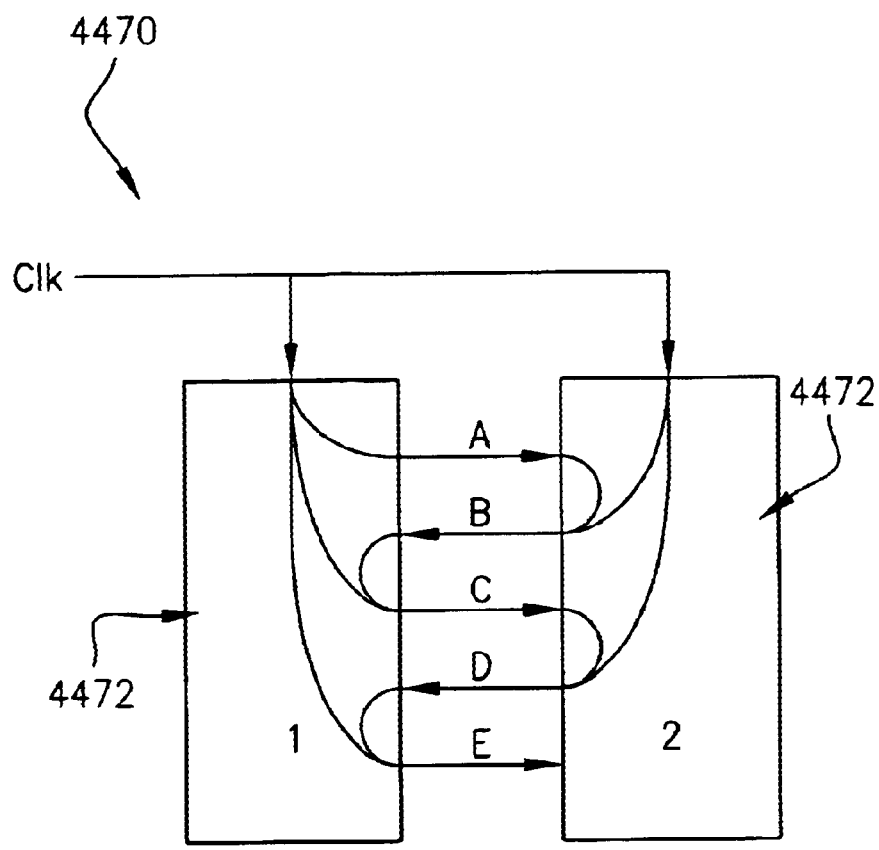
FIG. 44C illustrates an example of a simulator reengagement, in accordance with one embodiment of the present invention.

The simulation-in-turns approach while simple and general could result in much more work being done than required. FIG. 44C illustrates an example of a simulator reengagement 4470, in accordance with one embodiment of the present invention.

These two blocks represent hardware simulated by two connected cycle-based asynchronous simulators 4472. The dashed lines represent asynchronous logic, although at the cosimulation level one may not know where the asynchronous logic is. If one uses a simulation-in-turns scheduling policy then one updates all outputs from simulator 1 and then update all outputs from simulator 2. If it is assumed that each simulator reads and writes their inputs and output in the order A,B,C,D,E, then the input B to simulator 1 may change after both simulators have simulated one cycle, so another simulation cycle of simulator 1 is performed, which triggers another simulation cycle in simulator 2 and so on. In all each simulator has to repeat the same simulation cycle three times.

In the example above it seems obvious that each simulator need only simulate each cycle once, one just need to use a finer level of synchronization. However it's not always the case that each simulation cycle need only be performed once. If the inputs and outputs of the asynchronous logic was fed to a device which was being clocked differently then it may be necessary to repeat a simulation cycle. Instead of repeating a simulation cycle every time an input changes, one can delay calculating outputs until the output is required. This enables one to ignore changes to the inputs if no one is going to read the outputs. This is safe as long as the asynchronous logic is non-cyclic and is thus unable to form latches or registers, if registers existed in the asynchronous logic then the logic could count the number of times an input changed, however this falls within the realms of badly designed hardware.

In the course of simulating one cycle, an input could change: zero times, once or many times. There's little point waiting for any input change before allowing a simulator to advance, a better scheme would be to wait until an output is required before advancing simulation. Simulation output is required whenever time advances or another simulator wishes to read the simulator's output. When an output is required and new inputs have arrived since the last time that output occurred, the simulation is allowed to proceed to the point where that output is produced.

In the above example evaluation proceeds in the following order: the clock changes, this invalidates outputs from the simulators, logic between the clock and all outputs is assumed, (if there were no such logic, that is if the outputs were purely dependent in inputs and not registers, then evaluation would proceed in the same order but for slightly different reasons). sim1 advances past outputting A and blocks on reading B, there's no point in delaying outputting A as it may be the same however long one waits, but it may be worth while delaying reading B to avoid reading in a value which is going to change. Sim2 blocks on reading A, until sim1 attempts to read B (if sim1 has already reached this point then sim2 doesn't block). Once sim1 is blocked on reading B, and sim2 is blocked on reading A, sim2 is allowed to proceed until it tries to read C. The key here is that simulators may be suspended while trying to read input until the input is upto date. An input is out of date if it was produced by a simulator that has received new input more recently that it produced the output. If only one simulator is trying to read upto date input, that simulator proceeds, if more than one simulator is trying to read upto date input, then one could pick one or both to proceed. If all simulators are trying to read out of date input, there may be some asynchronous cyclic logic, one may pick one simulator to proceed, some asynchronous cyclic logic can be used in a well defined manor where race conditions don't apply, if it is then which simulator goes first doesn't matter, otherwise one has another case of badly designed hardware, and the output in practice as well as in simulation would be unpredictable.

So far we've assumed that within one cycle, all outputs are dependent on all inputs. Assuming the outputs are depend on all inputs may be overly cautious, and may force more simulation cycles to be repeated than necessary. If the cosimulation API were able to capture details of such dependencies then the need to repeat simulation cycles can be more accurately calculated.

Cosimulation Programming Interface

The information required by a cosimulation backplane to correctly schedule simulators include:

Type of simulator: event based, cycle-based synchronous, cycle-based asynchronous.

Dependencies between inputs and outputs in models (optional)

The optional items may help more accurately calculate when simulation cycles need to be repeated, but an approximation can be used if the optional info is unavailable.

Its also necessary for the cosimulation backplane to know what hardware interfaces are being modeled by a simulator. For a hardware simulator the hardware interfaces being used could be almost anything, even for an instruction set simulator there is some configurability, such as bus widths and interrupt interfacing methods. There are two ways in which this information could be used by a cosimulation backplane: statically or dynamically. The implication of this is that when writing code used by a cosimulation backplane to indicate how the simulated models are connected together, one could either have details of the models hardware interfaces checked at compile-time or run-time.

Compile-time checking would require automatic generation of CIC++ header files from various simulator plugins, this scheme has the benefit that coding mistakes resulting in hardware interface mismatches are spotted earlier, it wouldn't however result in faster simulation, since it may still be necessary to check the actual hardware interfaces used by a simulator are the same as the ones expected by the cosimulation backplane. A static hardware interface connecting approach may result in syntactically nicer code as actual CIC++ identifiers and struct names could be used and not just names in strings to be connected up later.

Using a dynamic approach to hardware interface connections would remove the need for automatic GIG++ header file generation, all interface names would be stored in strings and checked for validity later. A dynamic approach would also be more suitable if the cosimulation backplane is to be configured using a GUI and not a CIC++ program. The whole issue of how one starts up different simulators is likely to be a matter of personal taste, its probably best that the cosimulation API doesn't prohibit any mechanism, either by supporting a number of startup techniques or by being neutral to the issue.

Cosimulation User Documentation

The present section explains how to use the cosimulation server program, and how to use the client library.

Cosimulation Architecture

Figure 44D:
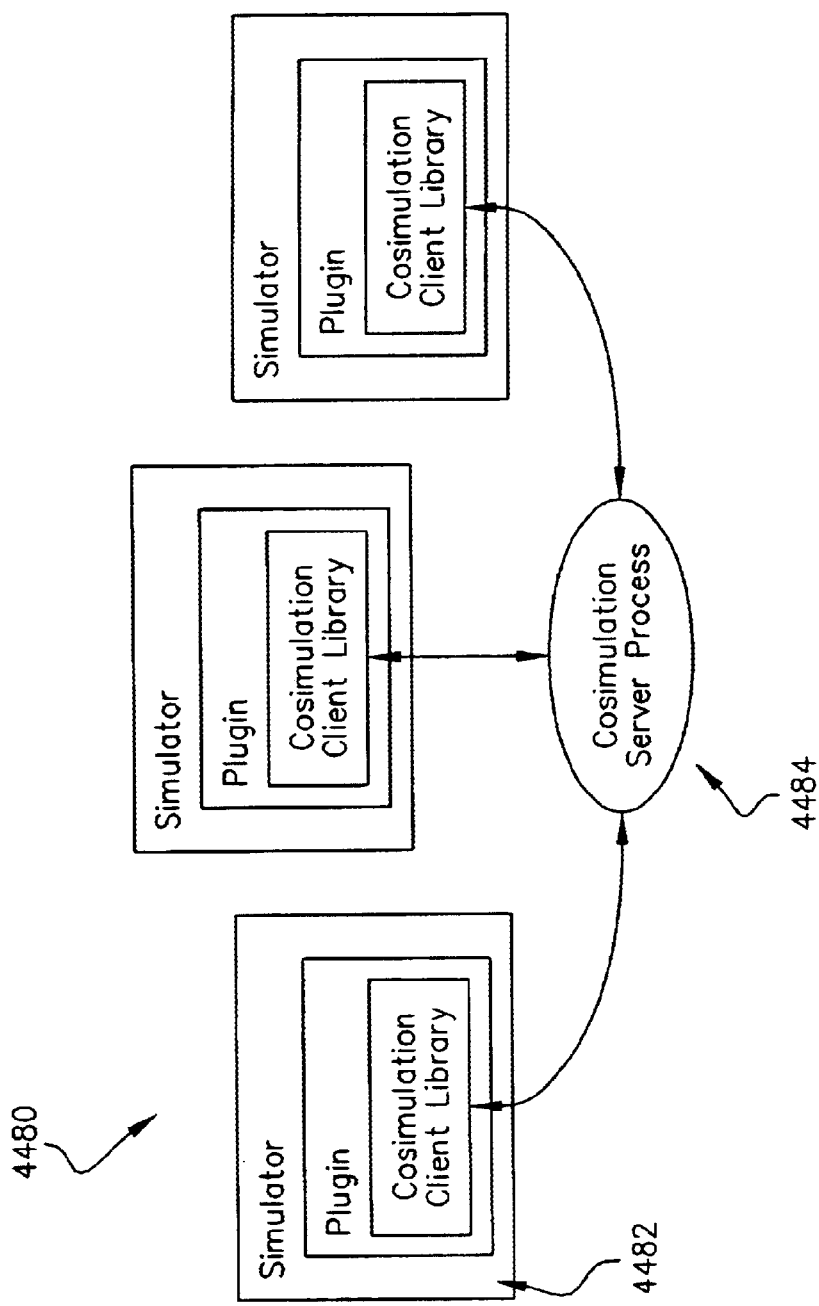
FIG. 44D illustrates a schematic of exemplary cosimulation architecture.

FIG. 44D illustrates a schematic of exemplary cosimulation architecture 4480. Cosimulation is split into two parts: a client 4482 and a server 4484. The server co-ordinates the allocation of synchronization points (or sync-points) and shared memory. The clients are the simulators one may want to use in cosimulation with plugins using the cosimulation client library. To start cosimulating, first the cosimulation server may be started, then clients may start and finish, allocate and deallocate cosimulation resources asynchronously with respect to each other. Typically a cosimulation client may first make a connection to the cosimulation server, then it may register any sync-points it wishes to use to synchronize with other simulators, and attach any shared memory it wishes to use to share data with other simulators. The simulators may then communicate via the shared memory and synchronize using the sync-points before detaching from the server.

Data Types

The following data types are used in the cosimulation client library:

typedef void CosimConnection;

typedef void SyncPoint;

typedef void (*CosimErrorHandler) (char*error);

CosimConnection and SyncPoint are actually structs but the user of the cosimulation client library may only be dealing with pointers to them, CosimErrorHandler is used to register an optional error handler.

Connections

CosimConnection*CosimConnect(char*servername, CosimErrorHandler errorHandler);

This function establishes a connection from the client to the server.

Servername

Specifies the name of the server, if null is passed "CosimServer" is used.

Errorhandler

Specifies a function the clients library functions should call when an error occurs. The error handling function is passed a text string explaining the error. When the error handling function returns, the cosimulation library may terminate the process. If a null value is given a default error handling function is called which pops up a message box explaining the error.

Return

Returns a pointer to the opaque CosimConnection structure.

void CosimDisconnect(CosimConnection*connection};

This function closes a connection from the client to the server. Any cosimulation resources (e.g. sync-points and shared memory) that have been allocated but not explicitly deal located may be automatically deal located when the client disconnects from the server. [the server may automatically clean up if a client terminates without disconnecting first, this prevents one crashed simulator bringing the remaining simulators to a stand-still]

Connection

The pointer returned by CosimConnect

Synchronization Points

Sync-points enable a number of simulators to synchronize with each other at various points. When a number of simulators all wish to synchronize at a certain point, the desired effect is that none of the simulators proceed past that point until all the simulators concerned have reached that point. Not all simulators have to synchronize at once, one can have only a subset of the simulators synchronizing. For a simulator to synchronize it may first register interest in a sync-point. When synchronization on that sync-point is desired all the simulators which registered the sync-point may call CosimSync with that sync-point, only when they have all called this function may the function return. During registration sync-points are identified by integers, these integers would typically be defined by an enum in a common header file. [If the cosimulation becomes deadlocked, for example by two interdependent simulators blocking on different sync-points, the cosimulation server may report a deadlock, this indicates a bug in the use of the cosimulation client library]

SyncPoint*CosimRegisterSyncPoint (CosimConnection*connection, int syncpointld);

This function registers a simulators interest in a particular sync-point.

connection The pointer returned by CosimConnect syncPointld For two simulators to synchronize at some point they may both register SyncPoints with the same numeric id, these ids would typically be defined by an enum in a shared header file.

return Returns a SyncPoint pointer. This pointer is used in calls to CosimSync.

void CosimUnregisterSyncPoint (CosimConnection*connection, SyncPoint*syncPoint);

This function is used by a simulator to unregister sync-points, unregistering sync-points is handled automatically when CosimDisconnect is called [and also when a simulator crashes], so calls to this function are not typically needed.

Connection The pointer returned by CosimConnect

SyncPoint The pointer returned by CosimRegisterSyncPoint void CosimSync(SyncPoint*syncPoint);

This function is called by a simulator when it wishes to synchronize with all the other simulators which registered this sync-point. Until all the simulators which have registered a particular sync-point call this function with that sync-point, none of the calls may return.

syncPoint The SyncPoint pointer returned by CosimRegisterSyncpoint

Shared Memory

Functions are provided to assist in sharing memory between simulators. Simulators may attach and detach shared memory. When attaching memory the memory is identified by an integer. This integer would typically be defined by an enum in a common header file. When different simulators attach to memory using the same memory identifier integer, they gain access to the same shared memory. The cosimulation server issues a warning if the same memory is requested but with different sizes. Typically detaching is unnecessary as all resources are deal located automatically when a simulator disconnects from the cosimulation server [and when any simulators crash].

So long as at least one simulator has a given piece of memory attached, that memory is available to be shared by other simulators, when no simulators have a given piece of memory attached that memory is lost, and new requests for memory by the same memory identifier integer may result in new memory being allocated, possibly with a different size.

void*CosimAttachMemory(CosimConnection*connection, unsigned memld, unsigned size);

This function attaches a simulator to shared memory identified by the integer memld.

connection The pointer returned by CosimConnect memld An integer used to identify a piece of shared memory size The desired size of the shared memory return A pointer to the shared memory void CosimDetachMemory(CosimConnection*connection, void*memptr);

This function detaches a piece of shared memory from a simulator. Calling it is typically unnecessary as shared memory is automatically detached when CosimDisconnect is called.

Connection The pointer returned by CosimConnect

MemPtr The pointer returned by CosimAttachMemory

Cosimulation Server

The cosimulation server is a command line program which takes one optional argument, the name of the cosimulation server. This name defaults to "CosimServer". By specifying a different name, the multiple instances of the same cosimulation environment can be run at the same time without interfering with each other. A maximum of 63 clients may connect to one cosimulation server. The cosimulation server may warn if simulators try to attach the same piece of shared memory but specify different sizes for that shared memory.

Multithreading

The CosimConnection pointer may be passed between threads within the process that called CosimConnect but not between processes. It is not safe in general to use the same cosimulation connection in two calls of cosimulation client library functions at the same time, multiple connections from the same process may be established.

SingleStep/Handel-C Integration Possibilities

Using the SingleStep MMK interface its possible to have Handel-C model a memory mapped device, raise interrupts, operate in a DMA fashion, and as a coprocessor communicating via special processor registers. It's also possible to override any SingleStep implementation of MMUs, Caches and Bus Interface Units.

Cosimulating by keeping two simulators running in lock-step provides a clock cycle accurate simulation of a CPU and FPQA. Also, it enables unusual things like non-invasive profiling of the CPU to see which instructions and memory are most heavily used. A custom-made memory management unit may also be enabled.

Improvements that Would Make Simulators More Amenable to Cosimulation

As an option, it may be one object of the present invention to provide an interface which would enable information about and control of a simulators debugging interface. Before starting a cycle, a debugger should check with all other debuggers that they do not wish to break on this cycle. If one breaks, they all break.

When the user instructs one simulator to resume execution, all should resume execution. This is slightly more complex to achieve. A simple approach would be to have each debugger, when suspended, poll a plugin function every 0.1 seconds to see if execution should be resumed. The figure, 0.1 seconds, is a compromise between user interface latency and wasting CPU cycles. A more responsive, less wasteful but more complex solution would be to have each debugger support some form of asynchronous interaction with their plugins. Such asynchronous communication could be achieved by having plugins spawn a new thread which is permitted to send a Windows user message to the debugger, indicating that some plugin function should be called. Thus messages from the plugin can be received in the same queue as QUI messages. It is probably also possible to have the debugger simultaneously wait for windows messages in a queue and wait for an event to become signaled.

As an option, it may also be an object of the present invention to decouple a debuggers QUI from its simulator back-end. This would make further architectural changes easier, such as placing multiple simulators in the same process and using inter-process communication to communicate between each simulator and its respective QUI. For simulators with a high degree of communication relative to computation, placing the simulators in the same process would be helpful. A suitable decoupling of QUI's from simulators would enable a variety of cosimulation arrangements possible. Another possible arrangement suitable for multi-processor machines would be to use busy waiting to synchronies simulators. So long as one has as many processors as one does simulators, execution may proceed faster then using OS based synchronization primitives. The point here really is that many cosimulation architectural arrangements are possible. A suitable decoupling of QUI from simulator may prevent being tied to anyone arrangement and enable a variety to be used as future environments require.

As an option, it may be still another object of the present invention to make a simulator suitable for a wide variety of cosimulation architectures. The simulator should in effect be turned inside-out. That is, the simulator should provide a number of functions which each return as quickly as possible, these functions are then called by a host program which may be responsible for ensuring a suitable order of evaluation. It would be the host program that would be responsible for integrating two simulators in one thread. The host program may also use multiple threads and communicate either via OS-based synchronization primitives or busy waiting. The simulators would have no awareness of the environment in which they are executing, and thus could be used in a variety of environments. If a simulator wishes to wait for something such as user interaction or a network connection, it should do so in a non-blocking fashion by telling the host program (via a return value or call-back). This enables multiple simulators to be waiting at the same time.

Generic Cosimulation Architecture

As a further option, it may be an object of the present invention to link a number of simulators together in a generic way. Such an ability could be provided via a programming interface and/or a GUI. A number of issues are involved here. Two important issues include identifying what hardware a simulator is simulating, and ensuring execution proceeds in a suitable order. Most simulators are capable of simulating a number of hardware components. Even something as specialized as a microprocessor simulator can model processors which have different bus widths or a different number of interrupt lines. This means one may not know until the simulators are running that they are compatible with each other. For example, one may assume a bus is 16-bits wide and another may assume the bus is 32-bits wide. Having a means to automatically determine the external characteristics (such as bus widths) of a hardware model is desirable. This may or may not require the execution of the simulator.

It should be noted that enabling a plugin to load up a different program in a processor/net list in an FPGA could also be useful.

Cosimulation Via SystemC

It may be possible to cosimulate using SystemC for joining up simulators. However, there are a couple of issues which can't be answered without looking further into the implementation of SystemC. A first issue involves whether the time at which SystemC verifies that the components being plugged together are compatible. If this is at compile-time, new C++ code may have to be generated for different hardware models, e.g. processors with different bus-widths. Also, one doesn't have much control over the order in which SystemC evaluates things. It may be desirable to modify SystemC to improve this matter. Unfortunately, SystemC licensing restrictions prohibit the distribution of modified SystemC code other than back to the SystemC committee.

Hardware Emulators Support

It might be worth looking into co-emulation That is, it may be useful to consider using a processor and an FPGA on PCI boards. This may be accomplished using either the same or different boards. Both SingleStep and ARM Developer Studio provide a similar environment for monitoring the state of emulation hardware as they do for monitoring simulation software.

Clearly, the majority of the work would be on Handel-C. If the CPU and FPGA are communicating over the PCI bus instead of being on the same board or communicating via a dedicated link between the two boards, it may be even more beneficial to enable either the FPGA or the CPU to run ahead of the other. While it may be possible to implement a MMU in an FPGA, one doesn't want to restrict simulation/emulation speed to lock-step speed just in case it might be needed. A hybrid simulation/emulation environment would also be a possibility.

Specific Improvements to SingleStep

It may be another optional object to provide better support for console interaction, and have a debugger jump to the front when a breakpoint is reached. This would provide better interaction when a memory access keeps returning MMKR-NOT-READYiO.

It may also be desirable to provide a call-back or mmk-access return value which enables a mmk plugin to indicate the debugger should behave as though it has reached a break point. The MMK plugin should be able to instruct the debugger to break on any clock cycle, even those in the middle of a multi-clock cycle instruction.

One may also wish to make the GUI respond to a custom Windows user message which tells it to call a MMK plugin function. This function may then tell the debugger to advance one clock, or advance over next assembler instruction/C line of code.

Plugins may be equipped with the ability to change the symbol table used by single step. In settings where an FPGA is going to change the program code of a processor, it may be useful to have the C source code reflect that change.

SingleStep has support for Multi-Tasking Debugging (Mill). This gives SingleStep awareness of an operating system. An OS specific library may be used. There also exists a Mill Library Kit which enables one to provide support for any OS. The SingleStep for MCore Targets manual gives partial documentation of the MTD Library Kit. It provides call back function which enables a library to call any command-line command. By issuing commands such as step and go, it may be possible to gain some of the capabilities called for above.

Integrating the Handel-C Simulator with SingleStep

SingleStep provides two different API's for interfacing external logic simulators to the CPU processors, the Peripheral API and the Memory Modeling Kit.

Memory Modeling Kit

The MMK API is an optional extra (presumably costing more). It enables the user to replace the entire memory with their own implementation. The interface is clock cycle accurate. Further, the SingleStep debugger calls a MMK library function such as mmk-access to access memory. The MMK library function returns a value indicating how many clock cycles the call took, and how successful it was.

For slow memory, the mmk-access function may either return the total number of clock cycles required, or it can return a smaller number of clock cycles, such as 1. Further, it may indicate that the memory access isn't over. SingleStep may then call mmk-access repeatedly until the memory access completes. The mmk-access function may also return indicating that no clock cycles have passed. This can be used to allow the SingleStep debugger to respond to user interaction and update windows. The MMK library may model just the memory logic external to the CPU. In the alternative, it may also include some of the MMU, the Cache and the Bus Interface Unit if the user wishes to use their own implementation instead of the SingleStep implementation or if SingleStep doesn't provide an implementation of these for a particular processor.

The MMK API provides call back functions enabling the MMK library to create windows and add menu items. The MMK Library may update data structures and use call-backs to inform SingleStep when the interrupt status has changed. This enables clock-cycle accurate simulation of interrupts.

Peripheral API

The Peripheral API enables the user to integrate their external logic with SingleSteps' own memory implementation. SingleSteps' own memory implementation allows one to specify which types of memory are where in the memory map. Also included are details such as RAM/ROM/WOM, access speed, burst read capabilities, whether the memory should be cached, and what mode the processor should be in to be able to access the data: user/supervisor, instruction fetch/data fetch.

The Peripheral API functions are only called between instructions. The functions are told which clock cycles they have been called on, so clock cycle accurate synchronization is still possible. Not being able to stop SingleStep on arbitrary clock cycles would limit the users interaction with the debugger. It seems unlikely that the SingleStep GUI may be responsive while a peripheral library is blocking, (given that the MMK API provides an explicit means to allow the GUI to be responsive during long peripheral simulation and the Peripheral API doesn't).

The Peripheral API provides call back functions, enabling the Peripheral library to create windows. The Peripheral Library may update data structures to inform SingleStep that the status of interrupts has changed. The library cannot indicate when the change occurred, so simulation of mid-instruction interrupts may not be possible.

General Comparison

The Peripheral API is implemented using some C++ class interface apparently inspired by COM. It may be quite easy to use once a dummy library library has been implemented. The ease with which the Peripheral API allows one to combine SingleStep implemented memory with peripherals makes the Peripheral API good for prototyping and experimenting with architectures before one is committed to one. The MMK interface would require either changing the library code each time the memory model changed, or essentially a reimplementaiton of SingleSteps own memory model within a MMK library.

The MMK API is quite straight forward to use. It provides both generic memory access routines and specialized ones. The user may implement at least one generic access function and any of the specialized ones they wish. SingleStep may automatically decide whether to use a generic or specialized access function. There are limits on where memory can sensibly be implemented. The SingleStep debugger needs to be able to access the contents of memory to update windows/disassemble machine code. If the implementation of the memory isn't aware of the debuggers needs, the debuggers may not be able to browse memory contents. This makes implementing memory in another simulator undesirable.

Command Line Compiler

Environment Variables

The Handel-C compiler has three environment variables associated with it. HANDELC_SIM_COMPILE is an alternative to the -cl command line option. It is used to create the simulation file when compiling using the command line. HANDELC_LIBPATH is the search path for libraries. The value of HANDELC_CPPFLAGS is passed as command line options to the preprocessor each time the compiler is executed.

The Handel-C installation sets the HANDELC_CPPFLAGS variable to contain the -C option and to add the include directory to the search path for the preprocessor. The -C option passes source code comments through to the compiler.

One is free to change the value of the HANDELC_CPPFLAGS and the HANDELC_LIBPATH to whatever he or she requires. To change the environment variables use the facilities described in the installation instructions.

Temporarily Changing the Environment Variables

One can temporarily alter the value of the variable by typing the following at the DOS prompt (Windows 98) or the command prompt (Windows NT):

set HANDELC_CPPFLAGS=Command Line Options

For example:

set HANDELC_CPPFLAGS=-C -Iinclude -DDEBUG.

Summary of Command Line Options

This present section details all the command line options of the Handel-C compiler and stand-alone simulator. FIGS. 45A and 45B summarize the options 4500 available on the compiler.

Target Options

The Handel-C compiler can target the simulator or hardware. Only one target option (-s, -vhdl or -edif) may be specified on the command line.

Target Simulator

To target the simulator, use the -s option on the compiler command line. handelc -sfile.c To enable debugging, use the -g option. handelc -s -gfile.c Optimiser Options The -O option enables all optimizations. For example, to compile the program prog.c with all optimizations, one could type:

handelc -s -O prog.c

Enabling all optimizations may substantially add to compilation time. If no optimizer command line options are specified then some optimizations are disabled to reduce compilation times at the expense of a few additional gates in the netlist.

Debugging Options

Various options are provided to aid with debugging Handel-C programs.

Turning on all Warnings

The -W option tells the compiler to display all warnings during compilation. By default, some less interesting warnings may be disabled and may not be displayed by the compiler.

Estimating Logic Area and Depth

The Handel-C compiler -e option gives feedback on logic usage and depth to help with optimizing the Handel-C designs. The feedback consists of an HTML file for the project and an HTML file for each source file in the project. These highlight parts of the source code with colors which relate to the logic depth and usage. These estimates are provided as a guide only since full place and route is needed to get exact logic area and timing information. Nevertheless, they provide a valuable starting point for optimization. To generate an HTML file, use the -e option. For example: handelc -e test.c This may generate two files test.html (summarizing the project) and test_c.html (estimating logic usage) which can be loaded into a Web browser such as Internet Explorer or Netscape. The project file links to the other html files of highlighted source code, and to the lines with the highest area or delays. The source code estimation is in two parts: estimates of logic area and estimates of logic delay (i.e. logic depth). The code is colored from blue (low) through yellow to red (high) to indicate area or delay. Optimization should concentrate on red areas first.

Compilation Control Options

Two options are provided to control compilation.

Pass Options to Preprocessor

The -cpp option can be used to pass options to the preprocessor. For example, to add the directory include to the search path, one could type:

handelc -s -cpp -Iinclude prog.c

-I, -D and -U can be used directly and do not have to be passed to the preprocessor with -cpp . . . 13 Example programs.

Introduction

This section details the basic example programs supplied with the Handel-C compiler and describes how to compile and simulate them.

Basic Examples

Example 1 Simple accumulator example

Shows the use of file input and output in simulation.

Example 2 Pipelined multiplier example

Shows the use of a replicator.

Example 3 Queue example

Shows the use of multiple mains in different files and how to take advantage of this Handel-C feature to test programs.

Example 4 Clients/server example

Shows the use of prialt, mpram, arrays of functions and separate clocks.

Example 5 Preprocessor example

Builds a program which calculates Fibonacci numbers.

Example C: Edge Detector Example

This is a series of programs showing how to port conventional C routines to Handel-C. Each of the programs is in a separate project within a single workspace.

Files Required for the Examples

The example project settings have been set up to reference the standard macro library (stdlib.lib) and its associated header file. If one moves the project or use the files in a different project, he or she may need to have the following project settings.

Preprocessor

Set the pathname handel-c root pathname\include in the Additional include directories pane Linker Add stdlib.lib to the Object/library modules pane Set the pathname handel-c root pathname\Lib in the Additional library path.

EXAMPLE 1

The Accumulator Example

This program takes a number of values from a file and calculates the sum of those values. It illustrates the basics of producing a Handel-C program and demonstrates the use of the simulator.

Compiling and Simulating the Program

Open the workspace file (HandelC\Examples\Handel-C\Example1\Example1.hw) by double-clicking on it.

Handel-C may start with the Example1 workspace open. Check that file view is the current view, and click on the + sign to the left of the chip icon to see what files are within the project. If one wishes to examine the code, double-click the file sum.c in the workspace pane. If one cannot see it, he or she can make the workspace pane larger by dragging its border, or make the space allocated to filenames larger by dragging the border of the Object button.

Build the project, by selecting Build Example1 from the Build menu. Messages from the compiler may appear in the output window. They may give an approximation of the number of hardware gates required to implement the program.

One can then start the debugger and simulator by typing F11 (to step through it) or F5 to run to the end. The simulator then starts immediately and reads the contents of values from the file sum_in.dat, sums them, and writes the result to the file sum_out.dat. One can watch the accumulation progressing in the variable sum by opening a Watch window (select View>Debug Windows>Watch or type Alt 3) and typing sum in the window. The simulator may not terminate at the end of the program. To stop simulation, go to Debug>Stop Debugging. Examine the files to ensure that the output file contains the correct result. If one wishes to change the values in sum_in, ensure that each value is placed on a line of its own.

EXAMPLE 2

The Pipelined Multiplier Example

This program performs multiplication using a replicated parallel structure to create a pipeline.

The operands used are the initialization values to the arrays of leftOps and rightOps, such that the result[n]= leftOps[n]*rightOps[n].

This multiplier calculates the 16 LSBs of the result of a 16 bit by 16 bit multiply using long multiplication. The multiplier produces one result per clock cycle with a latency of 16 clock cycles. This means that although any one result takes 16 clock cycles, one gets a throughput of 1 multiply per clock cycle. Since each pipeline stage is very simple, combinatorial logic is shallow and a much higher clock rate is achieved than would be possible with a complete single cycle multiplier.

At each clock cycle, partial results pass through each stage of the multiplier in the sum array. Each stage adds on 2 n multiplied by the b operand if required. The LSB of the a operand at each stage tells the multiply stage whether to add this value or not.

Operands are fed in on every clock cycle on signals leftOp and rightOp. Results appear 16 clock cycles later on every clock cycle on signal result.

Code Details

```
\*
*Index at end of array macro
*\
#define IndexAtArrayEnd(Index, ArrayLimit) \
 select(exp2(width(Index))==(ArrayLimit), !(Index), \
   ((Index)==\
 (ArrayLimit)))
```

The IndexAtArrayEnd macro tests if the index of size ArrayLimit is at the end of an array, whatever width the index counter has been assigned by the compiler. In most cases, this is a normal comparison, but if the index overflows, the test may compare the overflow value. An example is an index of size 4. The compiler may assign the index a width of 2 bits (to store the values 0–3). When it is compared against 4, it the index may hold the value 0 (as the most significant bit has been lost). In this case, the IndexAtArrayEnd macro compares against 0 instead of against 4. This implies that such a comparison cannot be made at the start of the cycle, when element zero is being processed, but only at the end of the cycle after the index has been incremented.

Compiling and Simulating the Program

One can compile and simulate the program by opening the workspace in the examples\Handel-C\Example2 directory and selecting Build Example2 from the Build menu. A person can then start the debugger.

Example 3

The Queue Example

The program is in three files: queue.c handles the queue function, while main.c provides I/O facilities. Definitions common to both files are given in queue.h. They both have a clock set (in this case, the same clock source is used for both functions).

The queue function code illustrates the use of parallel tasks and channel communications by implementing a simple four place queue. Each task holds one piece of data and has an input channel connected to the previous queue location and an output channel connected to the next queue location.

At each iteration, the data moves one place up the queue. The program executes an infinite loop, and one may use Stop Debugger to terminate the simulation.

DETAILED EXPLANATION

This example uses four parallel tasks each containing one word of data. At each iteration, one word is passed from one task to another in a chain. The links between the processes are entries in the links array of channels while the input and output to and from the system is handled by the main function.

Communication between the two functions is handled by an array of channels. The queue only reads data and writes data on every other clock cycle. A replicated pipeline is used to implement the queue. The first and last entries in the pipeline are treated differently by using a select statement to differentiate them at compile time. To watch the queue in the debugger, start the debugger, and add the queue variables to the watch window, (state etc.) If one adds an array name to the watch window, a + sign appears. Click on the + to get a list of the array elements.

SUMMARY

This example has shown how to create parallel tasks and how to communicate between those tasks. It has also illustrated arrays of variables and arrays of channels. The example shows a project containing independent main functions which are implemented independently in hardware.

Also, the queue presented here is parameterized on the width of the input and output channels because the width of all internal variables are undefined and inferred by the compiler.

Running the Example

Double-click on the workspace file Example3.hw in the examples/Handel-C/Example3 directory.

Compile and build it by selecting Build>Build Example3.

Step into the program within the debugger by pressing F11.

One may be asked to select a clock for the debugger to use. In this case they are both identical. Select one and click OK.

View local variables by selecting View>Debug Windows>Variables (or press Alt 4) and select the Locals tab.

The variables local to the function may be visible in the Debug window.

One can watch the values change as he or she steps through the code (repeatedly press F11).

Example 4

The Client/Server Example

The clients and server are implemented as independent pieces of hardware, communicating via channels. The server reads data from an array of channels from the client and puts the results in a queue as they arrive. They are read from the queue by a dummy service routine. This is where the client requests could be processed by a real server routine. The server clock runs at half the speed of the client clock to allow time for complex assignments during request processing. There is a pair of identical client functions. These functions merely select valid requests from an array and send them to the server.

Code Details

The internal queue is implemented in a structure consisting of two counters (queueIn and queueOut) which are used to test how full the queue is, and an mpram containing the queued data. Use of an mpram allows the queue to be written to and read from in the same clock cycle.

```
typedef struct {
unsigned int queueIn;
unsigned int queueOut;
mpram
{
won int DataWidth in[MaxQueue];
rom int DataWidth out[MaxQueue];
} values;
} Queue;
```

Running the Example

Double-click on the workspace file Example4.hw in the examples/Handel-C/Example4 directory.

Compile and build it by selecting Build>Build Example4.

Step into the program within the debugger by pressing F11

Example 5

The Microprocessor Example

In this example, Handel-C implements a simple microprocessor. This microprocessor executes a program stored in ROM to calculate members of the Fibonacci number sequence.

Compiling and Simulating the Program

Compile and link the program by opening the workspace in the examples\Handel-C\Example5 directory and then building the project. Simulate the program by starting the debugger (press F11 to single-step).

Detailed Explanation

The system described in this example consists of a ROM containing the program to execute, a RAM containing some scratch variables and a processor that understands 10 opcodes. Each instruction is made up of a 4 bit opcode and a 4 bit operand. The __asm__preprocessor macro is the assembler for this language and is used to fill in the entries in the program ROM declaration.

The processor has three registers:

a program counter, pc, that points to the next instruction to be fetched from the ROM an instruction register, ir, containing the instruction being executed an accumulator register, x, used as one input to the 'ALU'

The instructions that the processor can execute are:
Opcode Description

| | |
|---|---|
| HALT | Stop processing |
| LOAD | Load a value from RAM into x |
| LOADI | Load a constant into x |
| STORE | Store x to RAM |
| ADD | Add a value from RAM to x |
| SUB | Subtract a value from RAM from x |
| JUMP | Unconditional jump to a ROM location |
| JUMPNZ | Jump to a ROM location if x is not 0 |
| INPUT | Read a value into x |
| OUTPUT | Write x to user |

Using these instructions, a ROM is built containing a program to generate the Fibonacci numbers. The execution unit of the processor simply fetches instructions from the program ROM and executes them using a switch statement. While it may appear to be a simple example it should be easy to see how this example could be extended to implement a more complex processor. What has been produced is a processor which contains the instructions necessary to calculate Fibonacci numbers. It is equally possible to produce processors which contain specialized instructions for any application. Thus, one could use Handel-C to develop processors capable of executing programs for specialized applications with the minimum of effort. FIGS. 46A and 46B illustrate various commands and debugs 4600, in accordance with one embodiment of the present invention.

FIGS. 47A through 47C illustrate various icons 4700 that may be utilized, in accordance with one embodiment of the present invention.

Utilities

Introduction

The Handel-C compiler package also contains the following utilities.

bmp2raw converts BMP image files to a format suitable for input to the Handel-C simulator.

raw2bmp generates BMP image files from a file generated by the Handel-C simulator.

The edge detector example requires an image as its source and generates an image as its results. The bmp2raw utility and its partner raw2bmp are provided with the Handel-C compiler to perform conversions between BMP image files and the file format suitable for the Handel-C simulator. They are not restricted for use with the edge detector example and may be used for converting files for the image processing applications.

These utilities can handle both raw binary and text file formats. This is useful if, as with the edge detector, a conventional C program requires raw binary input and output whereas the simulator requires text input and output. The raw data format can be configured to have the color bits in any order to allow simulation of applications requiring non-standard bit patterns (e.g. 5-6-5 bit RGB format).

The bmp2raw Utility

The general usage of the bmp2raw utility is as follows:
bmp2raw [-b] BMPFile RAWFile RGBFile Here BMPFile is the source image file, RA WFile is the destination raw data file and RGBFile is a file describing the format of the pixels in the raw data file.

Adding the -b flag as the first command line option causes the utility to generate a raw binary file rather than a text file. To see the difference, consider a file containing the numbers 0 to 3. The text version (no -b option) would look like this:

0×00
0×01
0×02
0×03

The binary version (created with -b option) would not be visible when loaded into an editor. Instead, a hex dump of the file might look like this: 00000000 00 01 02 03    . . . **** The format of the raw data file can be controlled with the RGBFile specified on the command line. This tells the utility where to place each color bit in the words in the raw data file. Internally, the pixels in the BMP file are expanded to 8 bits for each of red, green and blue. The RGB description file has the general format:

Red
    Location for bit 7 of red
    Location for bit 6 of red
    Location for bit 5 of red
    Location for bit 4 of red
    Location for bit 3 of red
    Location for bit 2 of red
    Location for bit 1 of red
    Location for bit 0 of red
Green
    Location for bit 7 of green
    Location for bit 6 of green
    Location for bit 5 of green
    Location for bit 4 of green
    Location for bit 3 of green
    Location for bit 2 of green
    Location for bit 1 of green
    Location for bit 0 of green
Blue
    Location for bit 7 of blue
    Location for bit 6 of blue
    Location for bit 5 of blue
    Location for bit 4 of blue
    Location for bit 3 of blue
    Location for bit 2 of blue
    Location for bit 1 of blue
    Location for bit 0 of blue The file works by starting counting at bit 7 of the color specified by the identifier word and works down through the bits of that color placing each bit in the specified location in the destination word. The destination word may automatically be created wide enough to contain the most significant bit specified (up to 32 bits wide in total).

Figure 48:
FIG. 48 illustrates the various raw file bit numbers and the corresponding color bits.

One need not specify 8 locations for each color. The least significant bits of each color may be dropped if fewer than 8 locations are specified. In the example below, the least significant 6 bits of red and blue and the least significant 4 bits of green are dropped. FIG. 48 illustrates the various raw file bit numbers and the corresponding color bits 4800.

Such values use the following RGBFile:
Red
    7
    2
Green
    6
    3
    1
    0
Blue
    5
    4

Each pixel number and identifier (Red, Green or Blue) may appear on a separate line. One may also specify multiple identifiers of the same color. The bit counter may continue to count down from the value reached for that color each time one specifies the color again. For example, the above file could also be written as follows:
Red
7
Green
6
Blue
5
Red
2
Green
3
1
Blue
4
Green
0

RGBFile Example

There is an example file provided with the utilities to perform a common conversion.
8BPPdest.rgb Extracts red component from source image and generates 8 bit per pixel raw image. Useful for greyscale images The raw2bmp Utility The raw2bmp utility is the reverse of the bmp2raw utility. It converts raw text or binary files to BMP image files. The main use of the raw2bmp utility is to allow viewing of the output from image processing applications with the standard Windows 98 or NT Paint utilities.

The general usage of the raw2bmp utility is as follows:
raw2bmp [-b] Width RA WFile BMPFile RGBFile.
Width the width of the image (the height may be calculated from this parameter and the source file length).
RAWFile source file containing raw data.
BMPFile destination image file.
RGBFile file describing the format of the pixels in the raw data file.

Adding the -b flag as the first command line option causes the utility to read a raw binary file rather than a text file.

The format of the RGBFile describing where each bit is located in the raw data word is similar to the file used by the bmp2raw utility. Indeed, for some pixel formats (including the example presented in the previous section) a common file may be used. As an example of where a different file may be required, consider the conversion of 8 bit per pixel greyscale images to a BMP image. Here, each bit may be duplicated in the red, green and blue components of the destination BMP file. For example:
red
7
6
5
4
3
2
1
0
green
7
6
5
4
3
2
1
0
blue
7
6
5
4
3
2
1
0

RGBFile Example

An example file is provided with the utility:
8BPPsrc.rgb Duplicates each bit of 8 bit per pixel raw file to red, green and blue components. Useful for greyscale images.

Error Messages.

Introduction

Most error messages should be obvious. Some of the less obvious ones may be due to system problems, such as files being corrupted, unavailable or in the wrong format, or the system not having enough disk space to write to a file Error messages that do not fall into these categories are listed below with a brief explanation.

Handel-C Environment

"Handel-C cannot continue with Find in Files. Details:"
File could not be open or read
"Handel-C could not insert the project file in to the workspace. Details:"
File could not be open or read
"Handel-C could not load the browse-info database file"
File could not be open or read
"Handel-C could not start the simulator. Details:"
File could not be open or read
"None of the simulator DLLs have any clocks defined."
One has no main programs associated with clocks in the compiled code.
"The simulator 'NN' does not have any clocks defined."
One has built a function with no clock and attempted to simulate it. One should have a clocked main function that interfaces to the unclocked function.
"The symbol 'NN' is not defined."
The cursor is not on a known symbol or a symbol has not been selected in the file "There is no browse information for the project NN."
One did not have generate browse information selected when he or she compiled the file Compiler Error Messages "Attempt to access partial struct/union 'NN'"
Struct or union not fully defined. E.g.
struct S;
S x;
x.Bill;
without the definition.
struct S
{
int Bill;
"Cannot compile object—not all information is known"
Could not infer a width or type etc. E.g. int undefined x;
"Cannot target EDIF—not all information is known"
Could not infer a width or type etc. E.g. int undefined x;
"Cannot target RTL level VHDL—not all information is known"
Could not infer a width or type etc. E.g. int undefined x;
"Cannot target simulator—not all information is known"
Could not infer a width or type etc. E.g. int undefined x;

"Could not determine which clock to use for '% s'.

An object requiring a clock was built but the compiler couldn't work out which clock it should be connected to. Probably caused by an unused object (the compiler finds clocks from an object's use and not its declaration).

"Could not infer information about this object"

Could not infer a width or type etc. E.g. int undefined x;

"Design contains an unbreakable combinational cycle"

Compiler could not break a combinatorial code loop.

"Error while compiling simulation output (%s)"

The back end simulation compiler (e.g. VC++) failed to compile the simulation output. (E.g. not enough disk space, could not find file, illegal option specified in -cl, internal compiler error etc.).

"External tool not found (preprocessor or backend C compiler not in path)"

Error when the compile cannot run the C preprocessor or the C compiler used to compile the simulation.dll.

"Illegal use of identifier '% s'"

Probably caused by using a typedef name as a variable.

"Memory forms do not match"

Caused by comparing two types of memory (e.g. one is ram int x[1] and the other is rom int y[1]

"Syntax error"

Syntax error in source code

"Variable '%s' is used from more than one clock domain"

Data may be passed to different clock domains using a channel or an interface. Variables cannot be shared between clock domains Simulator error messages Illegal base specification base specification not 2, 8, 10 or 16

Invalid input file infile in wrong format

The simulator also forwards errors from plugins that have been written using the API.

Handel-C Language

This section deals with some of the basics behind the Handel-C language. Handel-C uses the syntax of conventional C with the addition of inherent parallelism. One can write sequential programs in Handel-C, but to gain maximum benefit in performance from the target hardware one may use its parallel constructs. These may be new to some users.

If one is familiar with conventional C he or she may recognize nearly all the other features. Handel-C is designed to allow one to express the algorithm without worrying about how the underlying computation engine works. This philosophy makes Handel-C a programming language rather than a hardware description language. In some senses, Handel-C is to hardware what a conventional high-level language is to microprocessor assembly language.

It is important to note that the hardware design that Handel-C produces is generated directly from the source program. There is no intermediate 'interpreting' layer as exists in assembly language when targeting general purpose microprocessors. The logic gates that make up the final Handel-C circuit are the assembly instructions of the Handel-C system.

Handel-C Programs

Since Handel-C is based on the syntax of conventional C, programs written in Handel-C are implicitly sequential. Writing one command after another indicates that those instructions should be executed in that exact order.

Just like any other conventional language, Handel-C provides constructs to control the flow of a program. For example, code can be executed conditionally depending on the value of some expression, or a block of code can be repeated a number of times using a loop construct.

Parallel Programs

Because the target of the Handel-C compiler is low-level hardware, massive performance benefits are made possible by the use of parallelism. It is possible (and indeed essential for writing efficient programs) to instruct the compiler to build hardware to execute statements in parallel. Handel-C parallelism is true parallelism—it is not the time-sliced parallelism familiar from general purpose computers.

When instructed to execute two instructions in parallel, those two instructions may be executed at exactly the same instant in time by two separate pieces of hardware.

Figure 49:
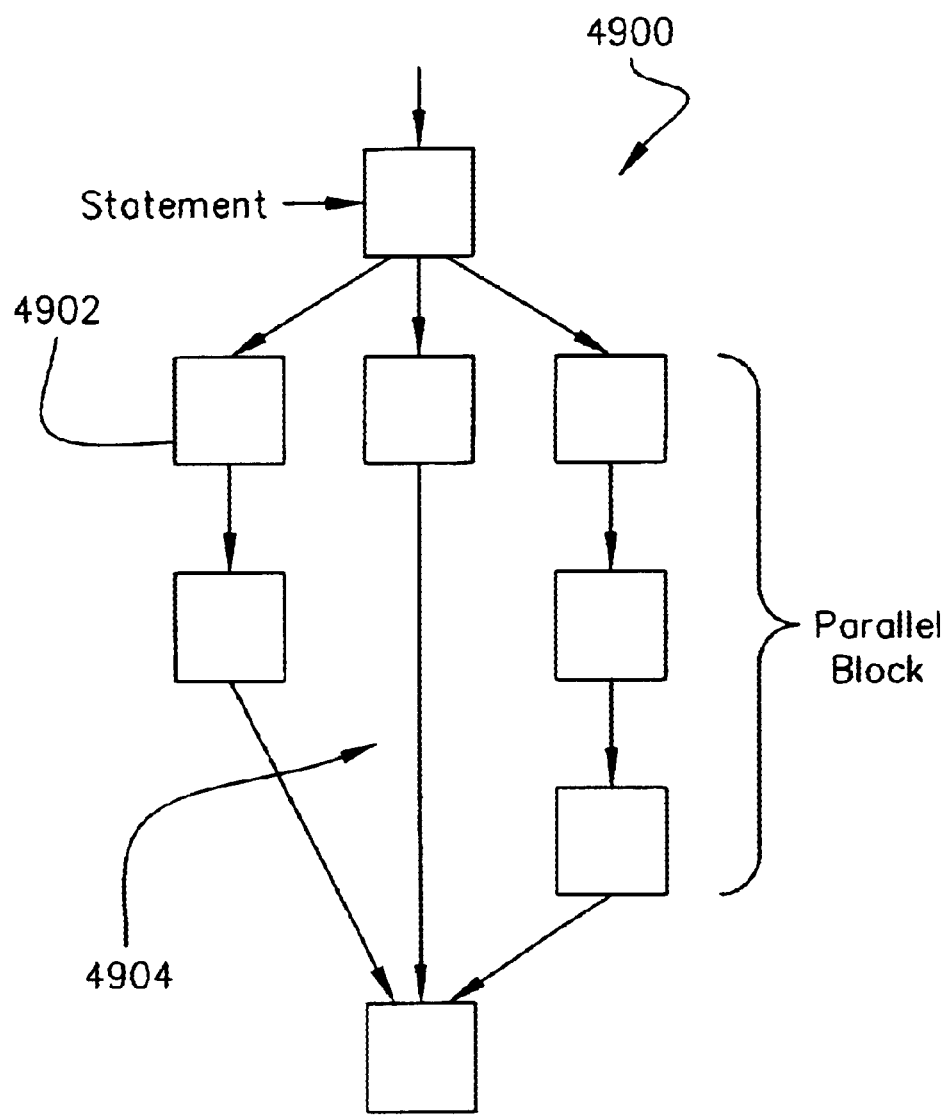
FIG. 49 illustrates the manner in which branches that complete early are forced to wait for the slowest branch before continuing.

When a parallel block is encountered, execution flow splits at the start of the parallel block and each branch of the block executes simultaneously. Execution flow then re-joins at the end of the block when all branches have completed. FIG. 49 illustrates the manner 4900 in which branches that complete early are forced to wait for the slowest branch before continuing.

FIG. 49 illustrates the branching and re-joining of the execution flow. The left hand branch 4902 and middle branch 4904 may wait to ensure that all branches have completed before the instruction following the parallel construct can be executed.

Channel Communications

Figure 50:
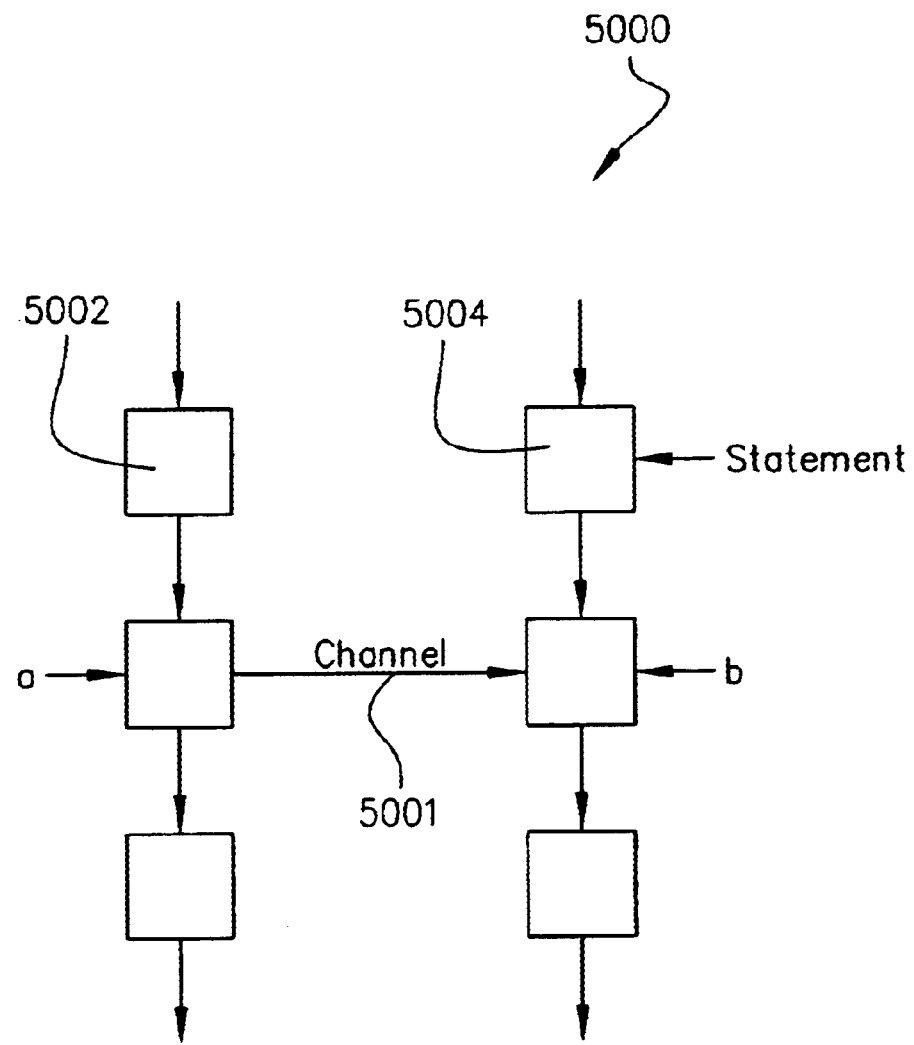
FIG. 50 illustrates the link between parallel branches, in accordance with one embodiment of the present invention.

FIG. 50 illustrates the link 5000 between parallel branches, in accordance with one embodiment of the present invention. Channels 5001 provide a link between parallel branches. One parallel branch 5002 outputs data onto the channel and the other branch 5004 reads data from the channel. Channels also provide synchronization between parallel branches because the data transfer can only complete when both parties are ready for it. If the transmitter is not ready for the communication then the receiver may wait for it to become ready and vice versa.

Here, the channel is shown transferring data from the left branch to the right branch. If the left branch reaches point a before the right branch reaches point b, the left branch waits at point a until the right branch reaches point b.

Scope and Variable Sharing

Figure 51:
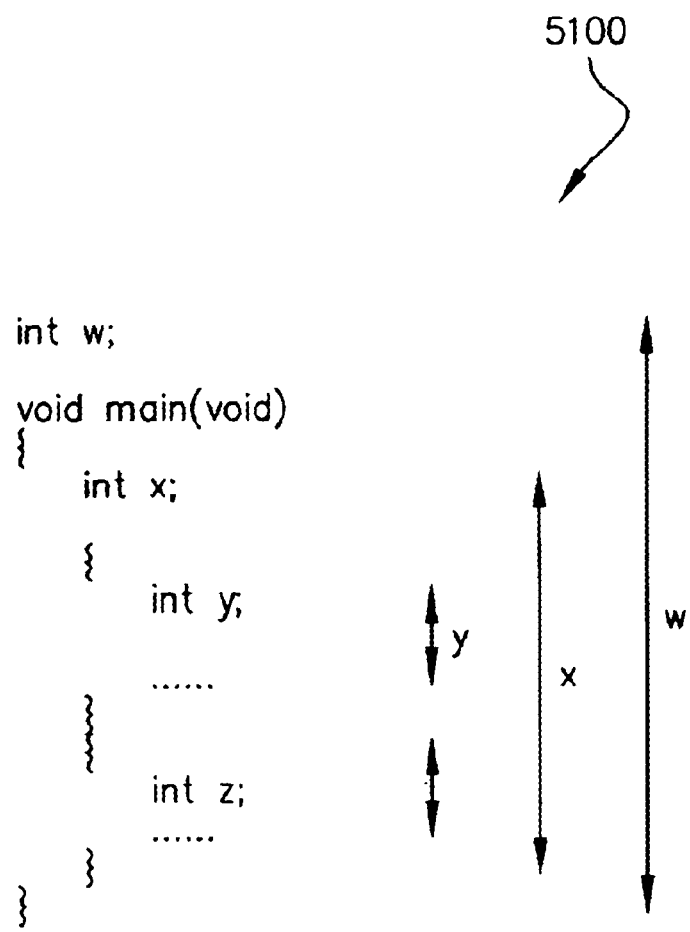
FIG. 51 illustrates the scope of variables, in accordance with one embodiment of the present invention

FIG. 51 illustrates the scope 5100 of variables, in accordance with one embodiment of the present invention. The scope of declarations is, as in conventional C, based around code blocks. A code block is denoted with { . . . } brackets. This means that:

Global variables may be declared outside all code blocks.

An identifier is in scope within a code block and any sub-blocks of that block.

Since parallel constructs are simply code blocks, variables can be in scope in two parallel branches of code. This can lead to resource conflicts if the variable is written to simultaneously by more than one of the branches. Handel-C syntax states that a single variable may not be written to by more than one parallel branch but may be read from by several parallel branches. This provides some powerful operations to be described later.

If one wishes to write to the same variable from several processes, the correct way to do so is by using channels which are read from in a single process. This process can use a prialt statement to select which channel is ready to be read from first, and that channel is the only one which may be allowed to write to the variable while (1)

prialt

{

```
case chan1 ? y:
break;
case chan2 ? y:
break;
case chan3 ? y:
break;
}
```

In this case, three separate processes can attempt to change the value of y by sending data down the channels, chan1, chan2 and chan3. y may be changed by whichever process sends the data first. A single variable should not be written to by more than one parallel branch.

Alternate Embodiments

Introduction

This section summarizes the new features in Handel-C version 3 for those familiar with previous versions. It also details incompatibilities between the current version and Handel-C version 2.1. The following constructs have been added or changed. Terms specific to Handel-C have been given in bold. All other terms are fully compatible with ISO-C (ISO/IEC 9899:1999) unless otherwise stated. (ISO-C was previously known as ANSI-C.)

Operator Meaning ISO-C Change in Version 3

FIGS. 52, 53 and 54 illustrate a table of operators, statements, and macros respectively, along with alternate meanings thereof.

Linker Changes

Multiple files can be linked together and loaded into a single FPGA. This allows one to create and access library files. One can load a single chip with multiple main functions. This means that one can have independent logic blocks using different clocks running within the same FPGA. The clock can be internal or external. External clocks may be user specified.

Language Changes

ISO-C compatible extensions:

Compatibility with ISO standard C has been increased, so most standard types and derived types are supported. This includes pointers and structures but does not include floats; goto, continue and return are supported. (Note that one cannot use goto, continue or break to enter or exit from a par statement.) Handel-C now supports functions. These can be used instead of macros.

Functions can be immediately expanded using the inline keyword. To support the multiple files system, prototypes are supported, as are the ISO-C keywords, extern and static. One can send messages to the standard error channel using the assert directive.

Macro Changes

One can now declare local variables inside a macro expression. There is a new directive, ifselect, which permits conditional compilation according to the result of a test at compile time.

Statements

The Handel-C language has been extended to allow code to be replicated using a construct similar to a for loop. This means that one can generate multiple identical copies of the same block of code, either in sequence or in parallel.

Architecture

There is a new type to represent signals. One can have multi-dimensional arrays of RAMs and dual-ported RAMs. Interfaces have been extended to allow one to connect to undefined input or output ports. One can also define the sorts of interface and use them to link to blocks of external code (currently VHDL or EDIF). Interfaces declarations have changed, and the previous style is deprecated.

Pins no longer need to be assigned. One can omit the data specification to leave the pin assignment unconstrained. In this case, the place and route tools may assign the pins. A person can have multiple clocks within a system, and refer to the current clock by using___clock.

Compiler Changes

Figure 55:
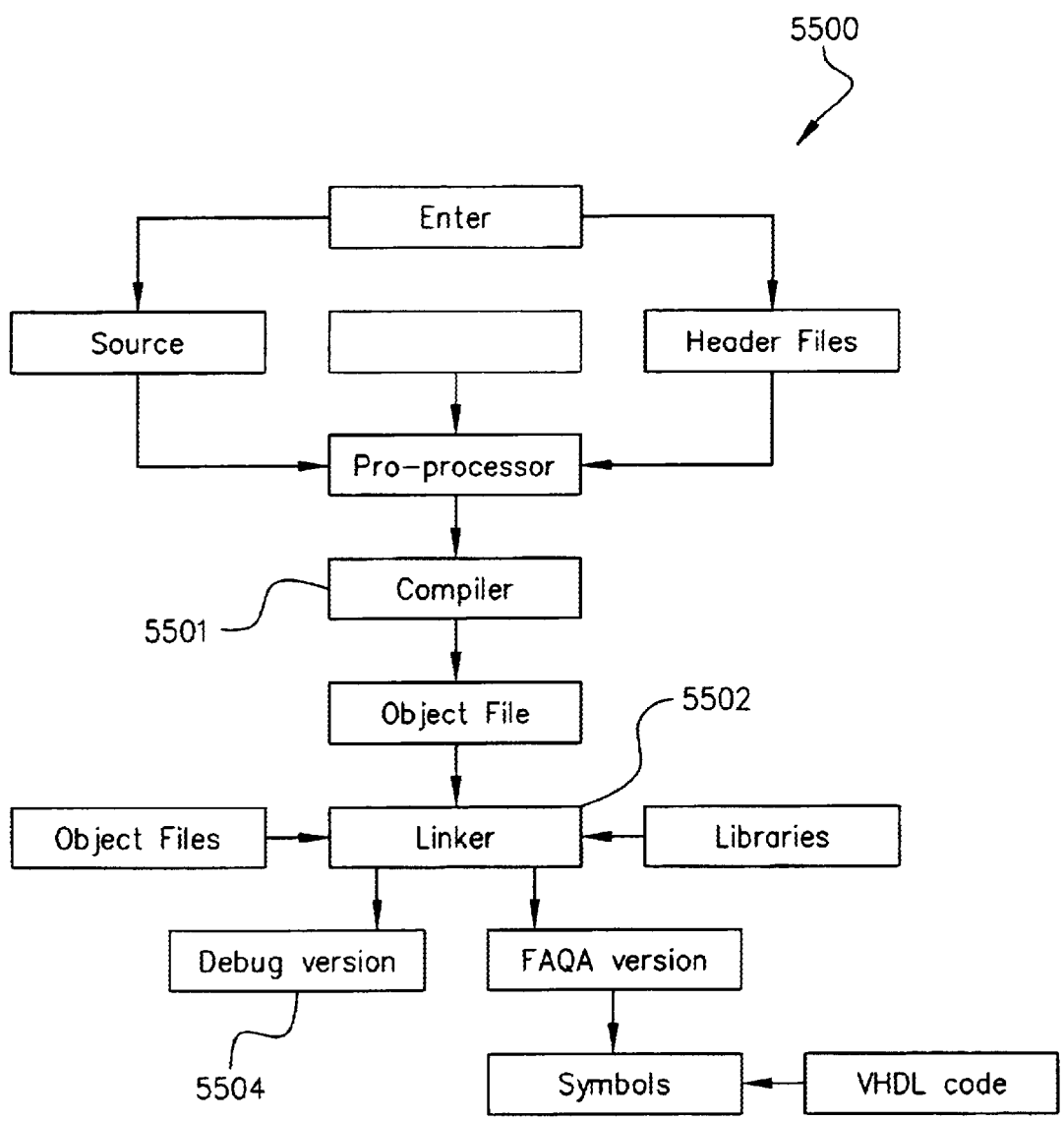
FIG. 55 illustrates a compiler, in accordance with one embodiment of the present invention.

FIG. 55 illustrates a system 5500 including a compiler 5501, in accordance with one embodiment of the present invention. The new compiler has a linker 5502, allowing one to have multiple input files 5504 and links to library files. Multiple files can now be linked into a single output module. These files can be pre-compiled core modules, libraries, header files, or pieces of VHDL code. The extern keyword allows one to reference a function or variable in another file. Linking is carried out during a build.

Incompatibilities with Version 2.1

Symbol Scoping Rules

The rules for scoping for macro expr and macro proc constructs have changed between version 2.1 and 3.0. Version 2.1 expands macros in the scope of their use. Version 3.0 expands macros in the scope of their declaration. This is consistent with C scoping rules. For example:

```
nt x; // Version 3.0 may use this x
macro expr a=x;
void main(void)
{
int x; // Version 2.1 may use this x
y=a;
}
```

This may lead to undeclared identifier errors. For example, the following code is valid in version 2.1 but not in version 3.0:

```
macro proc a(x)
{
b(x);
}
macro proc b(y)
{
Y++;
}
void main(void)
{
int 4 z;
a(z);
}
```

Using Macro Expressions in Widths

Version 3.0 requires disambiguating brackets around macro expressions used in variable widths. For example:

int log2ceil(64) x;

may be rewritten as:

int (log2ceil(64)) x;

New Keywords Clashing With Variable Names

Version 3.0 contains a number of new keywords which may clash with variable names in version 2.1 code.

The list of new keywords is:

assert auto const continue double enum extern float goto ifselect in inline let mpram register return seq signal sizeof static.

Struct typedef typeof union volatile worn

Additional Combinational Loops

Version 2.1 uses approximations when checking for combinatorial loops in the generated logic. Version 3.0 does not use such approximations and may report unbreakable combinational loops in programs which compile with version 2.1.

Clock is Required for Simulation

Version 3.0 requires that a clock is specified when generating simulation output. A dummy clock such as 'set clock=external "P1";' is valid.

Language Basics

Introduction

This section of the present description deals with the basics of producing Handel-C programs Program Structure Sequential Structure As in a conventional C program, a Handel-C program consists of a series of statements which execute sequentially. These statements are contained within a main( ) function that tells the compiler where the program begins. The body of the main function may be split into a number of blocks using {. . . } brackets to break the program into readable chunks and restrict the scope of variables and identifiers.

Handel-C also has functions, variables and expressions similar to conventional C. There are restrictions where operations are not appropriate to hardware implementation and extensions where hardware implementation allows additional functionality.

Parallel Structure

Unlike conventional C, Handel-C programs can also have statements or functions that execute in parallel. This feature is crucial when targeting hardware because parallelism is the main way to increase performance by using hardware. Parallel processes can communicate using channels. A channel is a one-way point-to-point link between two processes.

Overall Structure

The overall program structure consists of one or more main functions, each associated with a clock. One would only use more than one main function if he or she needed parts of the program to run at different speeds (and so use different clocks). A main function is defined as follows:

```
Global Declarations
Clock Definition
void main(void)
{
Local Declarations
Body Code
}
```

The main( ) function takes no arguments and returns no value. This is in line with a hardware implementation where there are no command line arguments and no environment to return values to. The argc, argv and envp parameters and the return value familiar from conventional C can be replaced with explicit communications with an external system (e.g. a host microprocessor) within the body of the program.

Using the Preprocessor

As with conventional C, the Handel-C source code is passed through a C preprocessor before compilation. Therefore, the usual #include and #define constructs may be used to perform textual manipulation on the source code before compilation.

Handel-C also supports macros that are more powerful than those handled by the preprocessor.

Comments

Handel-C uses the standard /* . . . */ delimiters for comments. These comments may not be nested. For example:

/*Valid comment*/
/* This is /*NOT*/valid*/

Handel-C also provides the C++ style//comment marker which tells the compiler to ignore everything up to the next newline. For example:

x=x+1; // This is a comment

Comments are handled by the preprocessor.

Declarations

Introduction

This section of the present description details the types of declarations that can be made and the way that the type system in Handel-C differs from that of conventional C.

Handel-C Values and Widths

A crucial difference between Handel-C and conventional C is Handel-C's ability to handle values of arbitrary width. Since conventional C is targeted at general purpose microprocessors it handles 8, 16 and 32 bit values well but cannot easily handle other widths. When targeting hardware, there is no reason to be tied to these data widths and so Handel-C has been extended to allow types of any number of bits. Handel-C has also been extended to cope with extracting bits from values and joining values together to form wider values. These operations require no hardware and can provide great performance improvements over software.

When writing programs in Handel-C, care should be taken that data paths are no wider than necessary to minimize hardware usage. While it may be valid to use 32-bit values for all items, a large amount of unnecessary hardware is produced if none of these values exceed 4 bits. Care may also be taken that values do not overflow their width. This is more of an issue with Handel-C than with conventional C because variables should be just wide enough to contain the largest value required (and no wider).

Constants

Constants may be used in expressions. Decimal constants are written as simply the number while hexadecimal constants may be prefixed with 0x or 0X, octal constants may be prefixed with a zero and binary constants may be prefixed with 0b or 0B. For example:

w=1234; /*Decimal*/
x=0x1234; /*Hexadecimal*/
y=01234; /*Octal*/
z=0b00100110; /*Binary*/

The width of a constant may be explicitly given by 'casting'. For example:

x=(unsigned int 3) 1;

Casting may be necessary where the compiler is unable to infer the width of the constant from its usage.

Types

Handel-C uses two kinds of objects: logic types and architecture types. The logic types specify variables. The architecture types specify variables that require a particular sort of hardware architecture (e.g., ROMs, RAMs and channels). Both kinds are specified by their scope (static or extern), their size and their type. Architectural types are also specified by the logic type that uses them.

Both types can be used in derived types (such as structures, arrays or functions) but there may be some restrictions on the use of architectural types.

Specifiers

The type specifiers signed, unsigned and undefined define whether the variable is signed and whether it takes a default defined width. One can use the storage class specifiers extern and static to define the scope of any variable.

Functions can have the storage class inline to show that they are expanded in line, rather than being shared.

Type Qualifiers

Handel-C supports the type qualifiers const and volatile to increase compatibility with ISO-C. These can be used to further qualify logic types.

Disambiguator

Handel-C supports the extension <>. This can be used to clarify complex declarations of architectural types.

Logic Types

The basic logic type is an int. It may be qualified as signed or unsigned. Integers can be manually assigned a width by the programmer or the compiler may attempt to infer a width from use. Enumeration types (enums) allow one to define a specified set of values that a variable of this type may hold. There are derived types (types that are derived from the basic types). These are arrays, pointers, structs bit fields, and functions. The non-type void enables one to declare empty parameter lists or functions that do not return a value. The typeof type operator allows one to reference the type of a variable.

Int

There is only one fundamental type for variables: int. By default, integers are signed. The int type may be qualified with the unsigned keyword to indicate that the variable only contains positive integers or 0. For example:

int 5 x;
  unsigned int 13 y;

These two lines declare two variables: a 5-bit signed integer x and a 13-bit non-negative integer y. In the second example here, the int keyword is optional. Thus, the following two declarations are equivalent.

unsigned int 6 x;
  unsigned 6 x;

One may use the signed keyword to make it clear that the default type is used. The following declarations are equivalent.

int 5 x;
  signed int 5 x;
  signed 5 x;

The range of an 8-bit signed integer is −128 to 127 while the range of an 8-bit unsigned integer is 0 to 255 inclusive. This is because signed integers use 2's complement representation. One may declare a number of variables of the same type and width simultaneously. For example:

int 17 x, y, z;

This declares three 17-bit wide signed integers x, y and z.

Supported Types for Porting

Handel-C provides support for porting from conventional C by allowing the types char, short and long. For example:

unsigned char w;
  short y;
  unsigned long z;

The widths assumed for each of these types is as follows:

Type Width char 8 bits (signed)
  short 16 bits
  long 32 bits

Smaller and more efficient hardware may be produced by only using variables of the smallest possible width.

More about Widths

The Handel-C compiler can sometimes infer the width of variables from their usage. It is therefore not always necessary to explicitly define the width of all variables and the undefined keyword can be used to tell the compiler to try to infer the width of a variable. For example:

int 6 x;
  int undefined y;
  x=y;

In this example the variable x has been declared to be 6 bits wide and the variable y has been declared with no explicit width. The compiler can infer that y may be 6 bits wide from the assignment operation later in the program and sets the width of y to this value. If the compiler cannot infer all the undefined widths, it may generate errors detailing which widths it could not infer. The undefined keyword is optional, so the two definitions below are equivalent:

int x;
  int undefined x;

Handel-C provides an extension to allow one to override this behavior to ease porting from conventional C. This allows one to set a width for all variables that have not been assigned a specific width or declared as undefined.

This is done as follows:

set intwidth=16;
  int x;
  unsigned int y;.

This declares a 16-bit wide signed integer x and a 16-bit wide unsigned integer y. Any width may be used in the set intwidth instruction, including undefined. One can still declare variables that may have their width inferred by using the undefined keyword. For example:

set intwidth=27;
  unsigned x;
  unsigned undefined y;

This example declares a variable x with a width of 27 bits and a variable y that has its width inferred by the compiler. This example also illustrates that the int keyword may be omitted when declaring unsigned integers. One may also set the default width to be undefined:

set intwidth=undefined;

Syntax

[signed|unsigned]int[undefined|n]Name

Arrays

One can declare arrays of variables in the same way that arrays are declared in conventional C. For example:

int 6 x[7];

This declares 7 registers each of which is 6 bits wide. Accessing the variables is exactly as in conventional C. For example, to access the fifth variable in the array:

x[4]=1;

Note that as in conventional C, the first variable has an index of 0 and the last has an index of n-1 where n is the total number of variables in the array. One can also declare multi-dimensional arrays of variables. For example:

unsigned int 6 x[4][5][6];

This declares 4*5*6=120 variables each of which is 6 bits wide. Accessing the variables is as expected from conventional C. For example:

y=X[2][3][1];

EXAMPLE

This loop initializes all the elements in array ax to the value of index.

unsigned int 6 ax[7];
  unsigned index;
  index=0;
  do
  {
  ax[index]=(0 @ index);
  index++;
  }
  while (index <=6);

Note that the width of index has to be adjusted in the assignment. This is because its width may be inferred to be 3, from the array dimension (the array has 7 elements, so "index" may only ever need to count as far as 6).

Enum enum specifies a list of constant integer values, e.g. enum weekdays {MON, TUES, WED, THURS, FRI}; The first name (in this case MON) has a value of 0, the next 1, and so on, unless explicit values are specified. If not all values are specified, values increment from the last specified value. To specify enum values enum weekdays {MON=9, TUES, WED, THURS, FRI}; In the beta release, one cannot declare a variable of type enum, (for example, enum weekdays x; is not allowed). One can assign enum values to a variable (e.g. int x=MON;)

struct struct defines a data structure; a grouping together of variables under a single name. The format of the structure can be identified by a type name. The variable members of the structure may be of the same or different types. Once a structure has been declared, its type name can be used to define other structures of the same type. Structure members may be accessed individually using the construct struct_Name.member_Name Syntax A structure type is declared using the format struct [type_Name]
{
member-list
}[instance_Names];.

member-list is a list of variable definitions terminated by semi-colons. The use of instance_Names declares variables of that structure type. Alternatively, one may declare variables as follows:

struct type_Name instance_Name;

Storage

Structures may be passed through channels and signals. Structures may be stored in internal memory elements. Structures cannot be stored in offchip rams. If a structure contains a memory element, a channel, or a signal, it cannot be stored in another memory element, it cannot be passed to a function "by value", it cannot be assigned to and it cannot be passed through a channel or a signal. If a structure contains a memory element with more than one member, it cannot be assigned (or assigned to) another structure as the assignment cannot be performed in a single clock cycle. Whole structures may not be sent directly to interfaces.

EXAMPLE struct human // Declare human struct type
{
unsigned int 8 age; // Declare member types
int 1 sex;
char name[25];
}; // Define human type
struct human sister;
sister.age=25;

bit field

A bit field is a type of structure member consisting of a specified number of bits. The length of each field is separated from the field name by a colon (:). Each element can be accessed independently. Since Handel-C allows one to specify the width of integers in bits, a bit field is merely another way of specifying a standard structure. In ISO-C, bit fields are made up of words, and only the specified bits are accessed, the rest are padded. Padding in ISO-C is implementation dependent. Nothing can be assumed about padding in Handel-C.

Syntax struct
{
field_Type field_Name:field_Width
...
}

EXAMPLE

This example defines an array of flags named flags as a structure and as a bit field struct structure
{
unsigned int 1 LED;
unsigned int 1 signal;
unsigned int 1 switch;
}outputs;
struct bitfield
{
unsigned int LED : 1;
unsigned int signal:1;
unsigned int switch:1;
}signals;
union united
{
unsigned char chis[2];
unsigned short shis;
};
union united unity;
unsigned a;
par
{
unity.chis[0]=2;
unity.chis[1]=50;
}
unity.shis=33;.

Pointers and Addresses

Pointers in Handel-C are similar to those in conventional C. They provide the address of a variable or a piece of code. This enables one to access variables by reference rather than by value. The indirection operator*is the same as it is in ISO-C. It is used to declare pointers to objects, and to de-reference pointers (i.e. to access objects pointed to by pointers).

The "address of" operator (&) works as it does in ISO-C (although technically Handel-C variables are not usually stored in memory locations that need to be addressed).

Pointers

A pointer declaration consists of the indirection operator (*), the name of the pointer and the type of the variable that it points to. type *Name They are used to point to variables in conjunction with the unary operator &, which gives the address of an object. To set a pointer to point to a variable, one may assign the address of the variable to the pointer. For example:

int 8*ptr; // declare a pointer to an int 8
int 8 object, x;
object=6;

x=10;
ptr=&object // assigns the address of
// object to pointer
x=*pointer // x is now 6
*pointer=12; // object is now 12

In Handel-C, one may only cast null pointers (void *pointerName) to a different type. All other pointers may only be cast to change the sign of an object pointed to, and whether it is const or volatile. These restrictions are the standard casting restrictions in Handel-C. One can change a null pointer's type by casting, assignment or comparison.

Valid pointer operations include:

Assign a pointer to another pointer of the same type

Add or subtract a pointer and an integer

Subtract or compare a pointer to an array member with another pointer to a member of the same array Assign or compare a pointer to NULL.

Pointers to Functions

If one points to code (a function), the address operator is not required. The syntax is returnType (*pointerName) (parameter list) The parentheses at the end of the declaration declare the pointer to be the pointer to a function. The indirection operator before the pointerName declares it to be a pointer declaration. There is the standard C type ambiguity between the declaration of a function returning a pointer and a pointer to a function. To ensure that indirection operator is associated with the pointer name rather than the return type, one needs to use parentheses int 8 *functionName( ); // function returning pointer and int 8 (*pointerName)( ); // pointer to function operator/& operator The indirection operator * is the same as it is in ISO C. It is used to declare pointers to objects, and to de-reference pointers (i.e. to access objects pointed to by pointers). The address operator (&) works as it does in ISO-C (although technically Handel-C variables are not usually stored in memory locations that need to be addressed).

unsigned char cha, chb, *chp;
chp=&cha;
cha=90;
chb=*chp;
chp=&chb;

The first line declares two unsigned variables (cha and chb), and a pointer to an unsigned (chp). The second line assigns the address of cha to pointer chp. In other words, pointer chp now points to variable cha. The third line simply assigns a value to cha. The fourth line dereferences pointer chp, to access what it's pointing to, which is cha. In other words, chb is assigned the value of the object pointed to by chp. The last line assigns the address of chb to pointer chp. In other words, pointer chp now points to variable chb. The following can also be used: pointers to arrays, pointers to channels, pointers to signals, pointers to memory elements, pointers to structures and unions, pointers to pointers, arrays of pointers. For instance:.

struct S
{
int 6 a, b;
}s1, s2, *sp, **spp;
sp=&s1;
spp=&sp;
s2=**spp;

This declares two variables of type struct S (s1 and s2), a pointer to a variable of this type (sp), and a pointer to a pointer to a variable of this type (spp). The next line assigns the address of structure s1 to pointer sp (pointer sp to point to structure s1). The following line assigns the address of pointer sp to pointer spp (pointer spp to point to pointer sp). The last line dereferences pointer spp twice, and it assigns the dereferenced value, which is sl, to structure s2 (i.e. s2 now equals s1).

Structure Pointers

The structure pointer operator (→) can be used, as in ISO-C. It is used to access the members of a structure or union, when the structure/union is referenced through a pointer.

struct S
{
int 18 a, b;
}S, *Sp;
sp=&s;
s.a=26;
sp→b=sp→a;

The last line accesses the member variables of structure s through pointer sp. Because the pointer is being used to access the structure, the → operator is used to refer to the member variables.

sp→a ≡(*sp).q

One can cast structure pointers between structures with the same member types. For example:

struct S1
{
int 6 x;
}
struct S2
{
int 6 y;
}
struct S1*strctptr=&S1;
S2.y=(struct S2*)strctPtr→y.

Architectural Types

The architectural types are channels (used to communicate between parallel processes), interfaces (used to connect to pins or provide signals to communicate with external code), memories (rom , ram, wom and mpram) and signal (declares a wire). The disambiguator <> has been provided to help clarify the definitions of memories, channels and signals.

Channels

Handel-C provides channels for communicating between parallel branches of code. One branch writes to a channel and a second branch reads from it. The communication only occurs when both tasks are ready for the transfer at which point one item of data is transferred between the two branches. Channels are declared with the chan keyword. For example:

chan int 7 link;

As with variables, the Handel-C compiler can infer the width of a channel from its usage if it is declared with the undefined keyword. Channels can also be declared with no explicit type. The compiler infers the type and width of the channel from its usage. For example:

set intwidth=undefined;

chan int Link1;

chan unsigned undefined Link2;

chan Link3;

Syntax
    chan[logicType]Name
Arrays of Channels
   Handel-C allows arrays of channels to be declared. For example:
    chan unsigned int 5 x[6];
   This is equivalent to declaring 6 channels each of which is 5 bits wide. A channel can be accessed by specifying its index. As with variable arrays, the index for the nth element is n-1. For example:
    x[4] ! 3; // Output 3 on channel x[4]
    x[3] ? y; // Input to y from channel x[3]
   It is also possible to declare multi-dimensional arrays of channels. For example:.
    chan unsigned int 6 x[4][5][6];
   This declares 4*5*6=120 channels each of which is 6 bits wide. Accessing the channels is similar to accessing arrays in conventional C. For example:
    x[2][3][1] ! 4; // Output 4 on channel
Interfaces
   One may use an interface to communicate with an external device or component. An interface consists of data ports, together with information about each port. A port definition consists of the data type that uses it (either defined or inferred from its first use), an optional name and the specification for that port (e.g., input pins for a bus) if needed.
Targeting Hardware
   The different varieties of interfaces are known as sorts. Handel-C provides predefined sorts (bus_in, bus_latch_in, bus_clock_in, bus_out, bus_ts, bus_ts_latch_in, bus_ts_clock_in, port_in and port_out. The Handel-C bus sorts (bus_*) generate the hardware for buses connected to pins. The port_in and port_out sorts generate the hardware for floating ports (buses which are not connected to pins). These can be of any width, and can carry signals between different sections of Handel-C code, or to software or hardware beyond the Handel-C program. One may also define the interface to connect to non-Handel-C objects: Native PC object code used in simulation. Programs that run on the PC for simulation and connect to a Handel-C interface are known as plugins. There are special port specifications to enable one to connect user-defined interfaces with a plugin for simulation. These are extlib, extfunc, extpath and extinst. Hardware descriptions written in another language. Currently only VHDL and EDIF are supported. For a VHDL code interface, the interface sort would be the name of the VHDL entity.
   The style of interface declaration used in Handel-C Version 2 is deprecated, but remains for backward compatibility. The recommended style is to declare an interface sort and then to define instances of that sort. The interface declaration gives the port names and types but no further details about them. The interface definition gives the port specifications (if needed) and assigns data to be transmitted to the output ports.
interface declaration
    interface Sort({data_TO_hc})
    ({send_FROM_hc})
   Sort may be a user-defined name or one of the pre-defined sorts (bus_in bus_latch_in, bus_clock_in, bus_out, bus_ts, bus_ts_latch_in, bus_ts _clock_in, port_in and port_out). data_TO_hc is optional. It consists of one or more prototypes of ports bringing data TO the Handel-C code from the outside world. A port prototype consists of the port type, and the port name send_FROM_hc is optional. It consists of one or more definitions of ports carrying data FROM the Handel-C code to the outside world (port definition as above). At least one port (whether to Handel-C or from Handel-C) may be declared.
interface definition
    interface Sort({port_TO_hc[with {portSpec}]})
    Name({port_FROM_hc=outputDataItem
    [with {portSpec}]})
    with {generalSpecs};
   Sort is a pre-declared interface sort (as above).
   port_TO_hc consists of definitions of the ports bringing data to Handel-C that were prototyped in the interface declaration. These ports may have the type given in the prototype, but may also have port specifications. The most likely use of a port specification is if one were interfacing with an external DLL (dynamic linked library) and needed to specify the external function that this port required (extfunc). Name is a user-defined identifier for that instance of the interface port_FROM_hc consists of definitions of ports sending data from the Handel-C code that were prototyped in the sort declaration. These ports may have the type given in the prototype, but may also have port specifications. Each port_FROM_hc port should be assigned an expression outputDataItem. The value of outputDataItem may be sent to that port. with {generalSpecs} is optional. It consists of one or more port specifications that apply to all the ports within the interface. One might wish to specify the external simulator that handles this type of port (generates input and receives output) using the extlib directive.
   FIG. 56 illustrates the various specifications 5600 for the interfaces of the present invention.
   Note that ports to the code precede the interface Name and ports from it follow it.

EXAMPLE

Further examples of bus interfaces are given later. The present example shows an interface declaration used to connect to a piece of foreign code, and the definition that uses this declaration.
    // Interface declaration
    interface ttl7446 (unsigned 7 segments, unsigned 1 rbon)
    (unsigned 1 ltn, unsigned 1 rbin, unsigned 4 digit,
    unsigned 1 bin);
    // Interface definition
    interface ttl7446 (unsigned 7 segments, unsigned 1 rbon)
    decode (unsigned 1 ltn=ltnVal, unsigned 1 rbin=rbinVal,
    unsigned 4 digit=digitVal, unsigned 1 bin=binVal)
    with {extlib="PluginModelSim.dll",
    extinst="decode; model=ttl7446_wrapper; delay=1"};.
Internal RAMs and ROMs
   RAMs and ROMs may be built from the logic provided in the FPGA using the ram and rom keywords. For example:
    ram int 6 a[43];
    rom int 16 b[4]; ={23, 46, 69, 92 };
   This example constructs a RAM consisting of 43 entries each of which is 6 bits wide and a ROM consisting of 4 entries each of which is 16 bits wide.
   To initialize a static or global ROM, one can use the format
    rom int 16 b[4]={23, 46, 69, 92 };
   The ROM is initialized with the constants given in the following list in much the same way as an array would be initialized in C. In this example, the ROM entries are given the following values:

ROM Entry Value
    b[0] 23
    b[1] 46
    b[2] 69
    b[3] 92

The Handel-C compiler can also infer the widths, types and the number of entries in RAMs and ROMs from their usage. Thus, it is not always necessary to explicitly declare these attributes. For example:
    ram int undefined a[123];
    ram int 6 b[];
    ram c[43];
    ram d[];

RAMs and ROMs are accessed in much the same way as arrays. For example:
    ram int 6 b[56];
    b[7]=4;

This sets the eighth entry of the RAM to the value 4. Note that as in conventional C, the first entry in the memory has an index of 0 and the last has an index of n-1 where n is the total number of entries in the memory.

Note that RAMs differ from arrays in that an array is equivalent to declaring a number of variables. Each entry in an array may be used exactly like an individual variable with as many reads and writes in a clock cycle as required. RAMs, however, are normally more efficient to implement in terms of hardware resources than arrays. Therefore, one should use an array when he or she wishes to access the elements more than once in parallel and he or she should use a RAM when he or she needs efficiency. Accessing internal RAMs can only be done in the way described above on Altera or Xilinx devices with synchronous on-chip RAMs. This includes Altera Flex 10K and APEX, Xilinx 4000E, 4000EX, 4000L, 4000XL, 4000XV, Spartan, Spartan II and Virtex 10K series devices. Other memories may require timing specifications.

RAMs and ROMs may only have one entry accessed in any clock cycle. This restriction is discussed in more detail later.

Multidimensional Arrays

It is possible to create simple multi-dimensional arrays of memory using the ram, rom and wom keywords. The definitions can be made clearer by using the optional disambiguator <>.

Syntax
    ram|rom|wom logicType entry_width Name {[const_expression]}
    [={initialisation strings}];

Possible logic types are ints, structs, pointers and arrays. The last constant expression is the index for the RAM. The other indices give the number of copies of that type of RAM.

EXAMPLE ram<int 6>a[15][43];
    rom<int 16>b[4][2][2]=
    {{{1, 2},
    {3, 4}
    },
    {{5, 6},
    {7, 8}
    },
    {{9, 10},
    {{11, 12}
    },
    {{13, 14},
    {15, 16}
    }
    };

This example constructs 15 RAMs, each consisting of 43 entries of 6 bits wide and 4*2 ROMs, each consisting of 2 entries of 16 bits wide. The ROM is initialized with the constants in the following list in the same way as a multi-dimensional array would be initialized in C. The last index (that of the RAM entry) changes fastest. FIG. 57 illustrates a table 5700 showing the ROM entries, in accordance with one embodiment of the present invention.

Because of their architecture, RAMs and ROMs are restricted to performing operations sequentially. Only one element of a RAM or ROM may be addressed in any given clock cycle and, as a result, familiar looking statements are often disallowed. For example:
    ram<unsigned int 8>x[4];
    x[1]=x[3]+1;

This code is illegal because the assignment attempts to read from the third element of x in the same cycle as it writes to the first element. In a multi-dimensional array, one can access separate elements of the arrays, so long as he or she is not accessing the same RAM (the penultimate array index). For example:
    x[2][1]=x[3][1] is valid
    x[2][1]=x[2][0] is invalid Note that arrays of variables do not have these restrictions but may require substantially more hardware to implement than RAMs depending on the target architecture.

mpram (multi-ported RAMs)

One can create multiple-ported RAMs (MPRAMs) by constructing something like an ISO-C union. One may use the mpram keyword. mprams can be used to connect two independent code blocks. The clock of the mpram port is taken from the function in which it is used. The normal declaration of a MPRAM would be to create a dual-ported RAM by declaring two ports of equal width: for Altera, one port would be read-only and one write-only, for Xilinx 4000 one port would be read/write and one read-only and for Virtex, both ports would be read/write.

Syntax
    mpram MPRAM_name
    {
    ram_Type variable_Type RAM_Name[width];
    ram_Type variable_Type RAM_Name[width];
    };

EXAMPLE

Using an mpram to communicate between two independent logic blocks:
    File 1:
    mpram Fred
    {
    ram<unsigned 8>ReadWrite[256]; // Read/write port
    rom<unsigned 8>Read[256]; // Read only port
    };
    mpram Fred Joan; /*Declare Joan as an mpram like Fred*/
    set clock=internal "F8M"
    void main(void)
    {
    unsigned 8 data;

```
Joan.ReadWrite[7]=data;
}
File 2:
mpram Fred
{
ram<unsigned 8>ReadWrite[256]; // Read/write port
rom<unsigned 8>Read[256]; // Read only port
};
extern mpram Fred Joan;
set clock=external "P2"
void main(void)
{
unsigned 8 data;
data=Joan.Read[7];
```
Mapping of Different Width Ports If the ports of the mpram are of different widths, they may be mapped onto each other according to the specifications of the chip a person is using. If the ports used are of different widths, the widths should have values of 2 n. Different width ports are not available with Altera devices.

Xilinx Bit Mapping

To find the bits that an array element occupies in a Xilinx Virtex or 4000 series RAM, one can use the formula RAM array ram y Name[a] may have a start bit of ((y+1)*a)−1 and an end bit of y*a. Xilinx mapping is little-endian. This means that the address points to the LSB. The bits between the declarations of RAM are mapped directly across, so that bit 27 in one declaration may have the same value as bit 27 in another declaration, even though the bits may be in different array elements in the different declarations.

```
mpram Joan
{
ram<unsigned 4>ReadWrite[256]; // Read/write port
rom<unsigned 8>Read[256]; // Read only port
};
```
Joan.ReadWrite[100] may run from 400 to 403.
Joan.Read[100] may run from 800 to 807.
Joan.Read[50] may run from 400 to 407.
Joan.ReadWrite[100] is equivalent to Joan.Read[50][0:3]

Initialisation of Mprams

The first member of the mpram can be initialized.
```
mpram Fred
{
ram<unsigned 8>ReadWrite[256]; // Read/write port
rom<unsigned 8>Read[256]; // Read only port
}Mary={10,11,12,13};
```
This would have the effect Fred.ReadWrite[0]=10 Fred.ReadWrite[1]=11
Fred.ReadWrite[2]=12 Fred.ReadWrite[3]=13

The other elements of Fred.ReadWrite may not be initialized. In this case, since Fred.Read is the same size as Fred.ReadWrite, elements 0–3 of Fred.Read would be initialized with the same values.

wom (write-only memory)

One can declare a write-only memory using the keyword worm. The only use of a write-only memory would be to declare an element within a multi-ported RAM. Since woms only exist inside multi-port rams, it is illegal to declare one outside a mpram declaration.

Syntax wom variable_Type variable_Size WOM_Name [width]=initialise_Values
  [with {specs}]

EXAMPLE

Figure 57A:
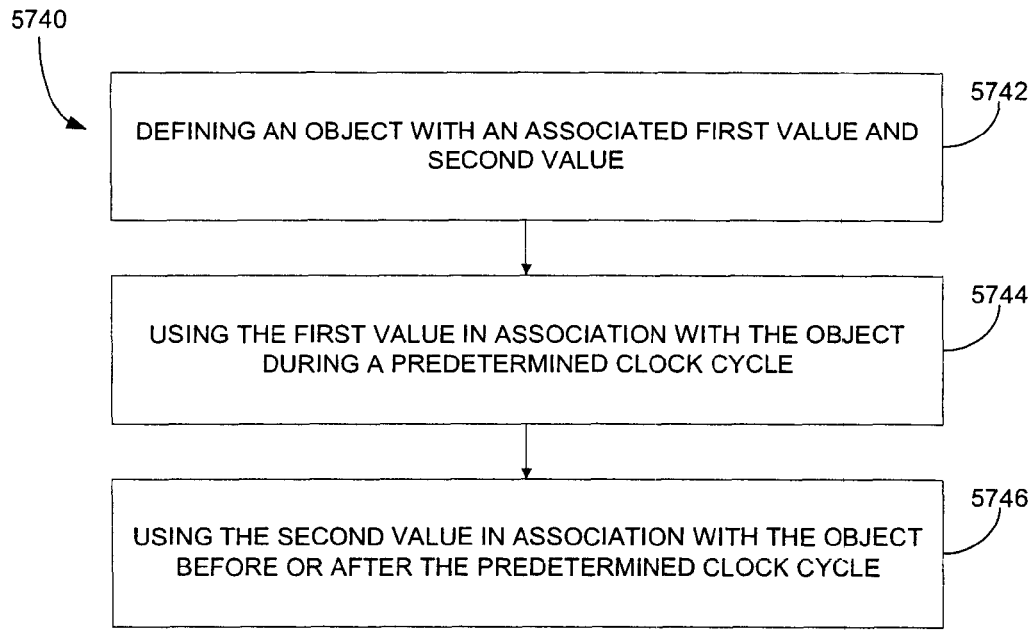
FIG. 57A illustrates a method for using a dynamic object in a programming language.
Figures 1, 57A:
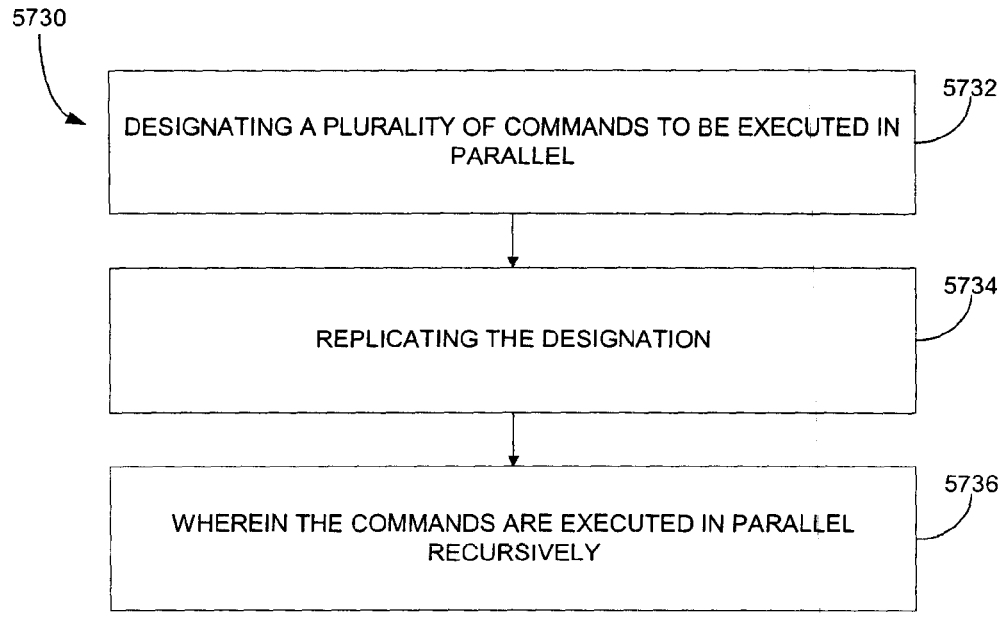
Figures 2, 57A:
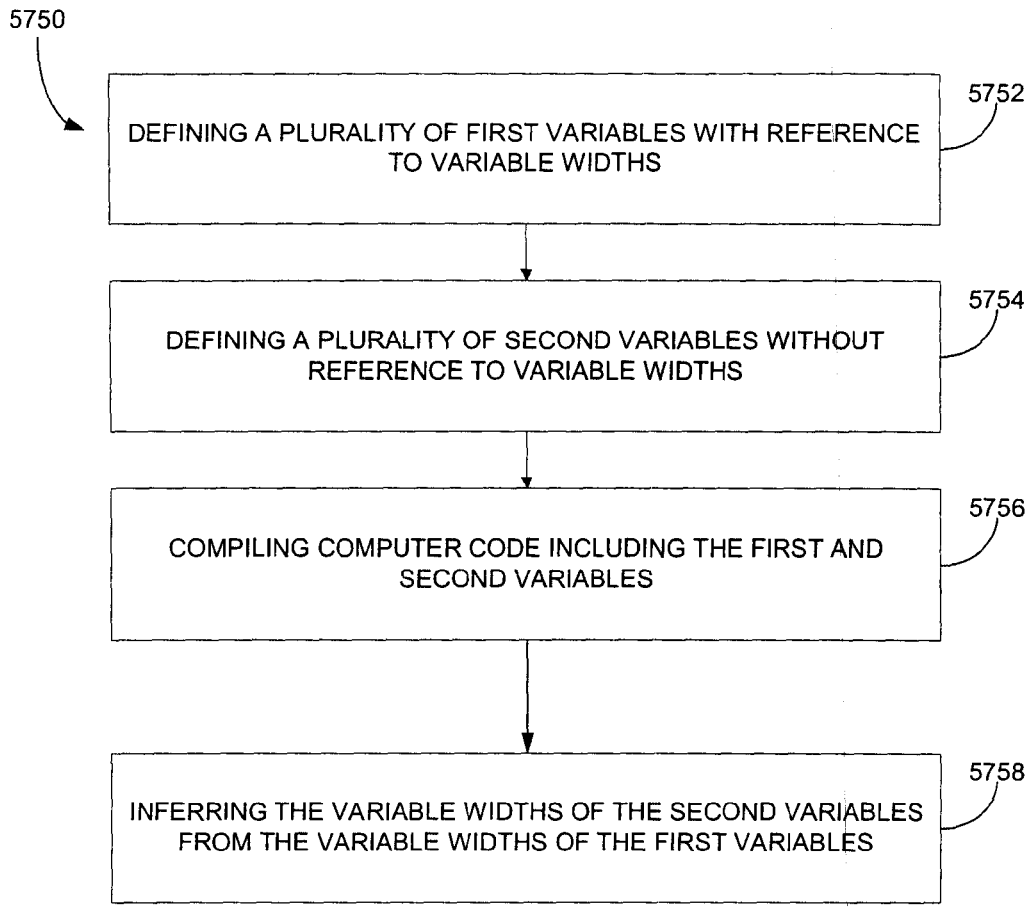

```
mpram connect
{
wom<unsigned 8>Writeonly[256]; // Write only port
rom<unsigned 8>Read[256]; // Read only port
};
```
signal FIG. 57A illustrates a method 5740 for using a dynamic object, i.e. signal, in a programming language. In general, in operation 5742, an object, i.e. signal, is defined with an associated first value and second value. The first value is then used in association with the object during a predetermined clock cycle. See operation 5744. The second value is used in association with the object before or after the predetermined clock cycle, as indicated in operation 5746.

In an aspect of the present invention, the object may be used to split up an expression into sub-expressions. As an option, the sub-expressions may be reused. In another aspect, the first value may be assigned to and read from the object during the predetermined clock cycle. More information regarding the above concept will now be set forth in greater detail.

A signal is an object that takes on the value assigned to it but only for that clock cycle. The value assigned to it can be read back during the same clock cycle. At all other times it takes on its initialisation value. The default initialisation value is 0. The optional disambiguator <> can be used to clarify complex signal definitions.

Syntax signal[<type data-width>]signal_Name;

EXAMPLE

```
int 15 a, b;
signal<int>sig;
a=7;
par
{
sig=a;
b=sig;
}
```
sig is assigned to and read from in the same clock cycle, so b is assigned the value of a. Since the signal only holds the value assigned to it for a single clock cycle, if it is read from just before or just after it is assigned to, one gets its initial value. For example:

```
int 15 a, b;
static signal<int>sig=690;
a=7;
par
{
sig=a;
b=sig;
}
a=sig;
```

Here, b is assigned the value of a through the signal, as before. Since there is a clock tick before the last line, a is finally assigned the signal's initial value of 690.

Using Signals to Split up Complex Expressions

One can split up complex expressions. E.g., b=(((a*2)−55)<<2)+100; could also be written

```
int 17 a, b;
signal s1, s2, s3, s4;
par
s1=a;
s2=s1*2;
```

```
s3=s2-55;
s4=s3<<2;
b=s4+100;
}
```
Breaking up expressions also enables one to re-use sub-expressions:
```
unsigned 15 a, b;
signal sig1;
par
{
sig1=x+2;
a=sig1*3;
b=sig1/2;
```

Type Qualifiers

Handel-C supports the type-qualifiers const and volatile to increase compatibility with ISO-C. These can be used to further qualify logic types.

Const const defines a variable or an array of variables that cannot be assigned to. This means that they keep the initialisation value throughout. They may be initialized in the declaration statement. The const keyword can be used instead of #define to declare constant values. It can also be used to define function parameters which are never modified. The compiler may perform type-checking on const variables and prevent the programmer from modifying it.

EXAMPLE

```
const int i=5;
i=10; // Error
i++; // Error
```

Volatile

In ISO-C, volatile is used to declare a variable that can be modified by something other than the program. It is mostly used for hard-wired registers. volatile controls optimization by forcing a re-read of the variable. It is only a guide, and may be ignored. The initial value of volatile variables is undefined. Handel-C does nothing with volatile. It is accepted for compatibility purposes.

Complex Declarations

It is possible to have extremely complex declarations in Handel-C. One can combine arrays of functions, structs, arrays, and pointers with architectural types. To clarify such expressions, it is wise to use typedef.

Macro Expressions in Widths

If one uses a macro expression to provide the width in a type declaration, one may enclose it in parentheses. This ensures that it may be correctly parsed as a macro.

```
int (mac(x)) y;
```

To declare a pointer to a function returning that type, one gets:

```
int (mac(x) (*f)( );
```

♦ (type clarifier)

<> is a Handel-C extension used to disambiguate complex declarations of architectural types. One cannot use it on logic types. It is good practice to use it whenever a person declares channels, memories or signals, to clarify the format of data passed or stored in these variables.

EXAMPLE

```
struct fishtank
{
int 4 koi;
int 8 carp;
int 2 guppy;
}bowl;
signal<struct fishtank>drip;
chan<int 8 (*runwater)( )>tap;
```

It is required to disambiguate a declaration such as:

```
chan int*x // pointer to channel or
// channel of pointers?
```

This should be declared as

```
chan<int*>x // channel of pointers or
chan<int>*x // pointer to channel.
```

Storage Class Specifiers

Storage class specifiers define how variables are accessed. For compatibility with ISO-C, the specifiers auto and register can be used but have no effect. The scope of a variable is declared by the specifiers extern and static. The expansion of a function is defined by the specifier inline. The typedef specifier allows one to declare new names for existing types.

Auto auto defines a local automatic variable. In Handel-C, all local variables default to auto. One cannot initialize an auto variable, but may assign it a value. The initialisation status of auto variables is undefined.

EXAMPLE

```
auto pig;
pig=15;
``` extern extern declares a variable that can be accessed by name from any function. Extern variables may be defined once outside all functions. (By default, any variable declared outside a function is assumed to be extern.)

If the variable is used in multiple source files, it is good practice to collect all the extern declarations in a header file, included at the top of each source file using the #include headerFileName directive. Note that one cannot access the same variable from different clock domains.

EXAMPLE

```
extern int 16 global_fish;
int global_frog=1234;
main( )
{
global_fish=global_frog;
. . .
}
```

Syntax

```
extern variable declaration;
functionName(parameter-type-list)
``` inline inline causes a function to be expanded where it is called. The logic may be generated every time it is invoked. This ensures that the function is not accessed at the same time by parallel branches of code. By default, functions are assumed to be shared (not inline).

EXAMPLE

```
inline int4 knit(int needle, int stitch)
{
needle=needle+stitch;
return(needle);
}
```

```
int 4 jumper[100];
par(needle=1; needle<100; needle=needle+2)
{
jumper[needle]=knit(needle, 1);
}
```
Syntax inlinefunction_Declaration;

register register has been implemented for reasons of compatibility with ISO-C. register defines a variable that has local scope. Its initial value is undefined.

EXAMPLE

```
register int 16 fish;
fish=f(plop);
``` static static gives a variable static storage (its values are kept at all times). This ensures that the value of a variable is preserved across function calls. It also affects the scope of a variable or a function. Static functions and static variables declared outside functions can only be used in the file in which they appear. static variables declared within an inline function or an array of functions can only be used in the copy of the function in which they appear. static variables are the only local variables (excluding consts) that can be initialized.

EXAMPLE

```
static int 16 local_function (int water, int weed)
static int 16 local_fish=1234;
main( )
{
int fresh, pondweed;
local_fish=local_function(fresh, pondweed);
...
}
```

Syntax static variable declaration;

staticfunctionName(parameter-type-list)

typedef typedef defines another name for a variable type. This allows one to clarify the code. The new name is a synonym for the variable type.

typedef int 4 SMALL_FISH;

If the typedef is used in multiple source files, it is good practice to collect all the type definitions in a header file, included at the top of each source file using the #include headerFileName directive. It is conventional to differentiate typedef names from standard variable names, so that they are easily recognizable.

EXAMPLE

```
typedef int 4 SMALL_FISH;
extern SMALL_FISH stickleback;
``` typeof

The typeof type operator allows the type of an object to be determined at compile time. The argument to typeof may be an expression. Using typeof ensures that related variables maintain their relationship. It makes it easy to modify code by simplifying the process of sorting out type and width conflicts. A typeof-construct can be used anywhere a type name could be used. For example, one can use it in a declaration, in casts or inside typeof.

Syntax typeof( expression)

EXAMPLE

```
unsigned 9 ch;
typeof(ch @ ch) q;
struct
{
typeof(ch) cha, chb;
}s1;
typeof(s1) s2;
ch=s1.cha+s2.chb;
q=s1.chb @ s2.cha;
```

If the width of variable ch were changed in this example, there would be no need to modify any other code. This is also useful for passing parameters to macro procs. The code below shows how to use a typeof definition to deal with multiple parameter types.

```
macro proc swap (a, b)
{
typeof(a) t;
t=a;
a=b;
b=t;
```

Variable Initialization

Global variables (i.e. those declared outside all code blocks) may be initialized with their declaration. For example:

int 15 x=1234;

Variables declared within functions can only be initialized if they have static storage or are consts. All other variables may not be initialized this way. Instead, one may use an explicit sequential or parallel list of assignments following the declarations to achieve the same effect. For example:

```
{
int 4 x;
unsigned 5 y;
x=5;
y=4;
}
```

Global and static variables may only be initialized with constants.

Statements

Introduction

As with conventional C, the execution flow of a Handel-C program is expressed as a series of statements such as assignment, conditional execution and iteration. Handel-C includes most of the statements from conventional C and these are detailed below.

Sequential and Parallel Execution

FIG. 57A-1 illustrates a method 5730 for using extensions to execute commands in parallel. In general, in operation 5732, a plurality of commands to be executed in parallel are designated.

This designation is replicated in operation 5734, and the commands are executed in parallel recursively. Note operation 5736. In one aspect, the commands may be executed in parallel recursively utilizing a FOR loop.

As an option, a first command may be executed simultaneously with a second command. Further, the first command may be executed simultaneously with the second command in a single clock cycle.

Handel-C implicitly executes instructions sequentially but when targeting hardware it is extremely important to make as much use as possible of parallelism. For this reason, Handel-C also has a parallel composition keyword par to allow statements in a block to be executed in parallel.

The following example executes three assignments sequentially:

x=1;
y=2;
z=3;

In contrast, the following example executes all three assignments in parallel and in the same clock cycle:

par
{
x=1;
y=2;
z=3;
}

It should be noted that the second example executes all assignments literally in parallel. This is not the time-sliced pseudo parallelism of a conventional microprocessor implementation but three specific pieces of hardware built to perform these three assignments. Detailed timing analysis may be dealt later, but for now it is enough to state that the first example executes in 3 clock cycles while the second generates a similar quantity of hardware but executes in 1 clock cycle. Therefore, it is obvious that parallelism is a very important construct for targeting hardware. Within parallel blocks of code, sequential branches can be added by using a code block denoted with the { . . . } brackets instead of a single statement. For example:

par
{
x=1;
{
y=2;
z=3;
}
}

In this example, the first branch of the parallel statement executes the assignment to x while the second branch sequentially executes the assignments to y and z. The assignments to x and y occur in the same clock cycle, the assignment to z occurs in the next clock cycle. The instruction following the par { . . . } may not be executed until all branches of the parallel block complete.

Seq

To allow replication, the seq keyword exists. Sequential statements can be written with or without the keyword. The following example executes three assignments sequentially:

x=1;
y=2;
z=3;

as does this:

seq
{
x=1;
y=2;
z=3;
}

Replicated par and seq

One can replicate par and seq blocks by using a counted loop (a similar construct to a for loop). The count is defined with a start point (index_Base below), an end point (index_Limit) and a step size (index_Count). The body of the loop is replicated as many times as there are steps between the start and end points. If it is a par loop, the replicated processes may run in parallel, if a seq, they may run sequentially.

Syntax par|seq (index_Base; index_Limit; index_Count)
{.
Body
} index_Base, index_Limit and index_Count are macro exprs that are implicitly declared. They do not need to be single expressions, for example, one could declare par (i=0, j=23; i!=76; i++, j--).

EXAMPLE par (i=0; i<3; i++)
{
a[i]=b[i];
} expands to:

par
{
a[0]=b[0];
a[1]=b[1];
a[2]=b[2];
}

Replicated pipeline unsigned init;
unsigned q[149];
unsigned 31 out;
init=57;
par (r=0; r<16; r++)
{
ifselect(r==0)
q[r]=init;
else ifselect(r==15)
out=q[r−1];
else
q[r]=q[r−1];
} ifselect checks for the start of the pipeline, the replicator rules create the middle sections and ifselect checks the end. This code expands to:

par
{
q[0]=init;
q[1]=q[0];
q[2]=q[1];
etc . . .
q[14]=q[13];
out=q[14];
}

Assert assert allows one to generate messages at compile-time if a condition is met. They can be used to check compile-time constants and help guard against possible problematic code alterations. The user uses an expression to check the value of a compile-time constant, and if the expression evaluates to false, an error message is sent to the standard error channel in the format filename:(line number):(column number)::Assertion failed: user-defined error string
Syntax assert(condition, [string with format specification(s), (argument(s)}]); If condition is false, string may be sent to the standard error channel, with each format specification replaced by an argument. When assert encounters the first format specification (if any), it converts the value of the first argument into that format and outputs it. The second argument is formatted according to the second format specification and so on. If there are more expressions than format specifications, the extra expressions are ignored. The results are undefined if there are not enough arguments for all the format specifications.

The format specification is one of:

% c Display as a character % s Display as a string

% d Display as a decimal % f Display as a floating point

% o Display as an octal % x Display as a hexadecimal

EXAMPLE

```
int f(int x)
{
assert(width(x)==3, "Width of x is not 3 (it is % d)", width(x));
return x+1;
}
void main(void)
{
int 4 y;
y=f(y);
}
``` x may be inferred to have a width of 4, so the following message may be displayed. F:\proj\test.c(4)(2):Assertion failed:Width of x is not 3 (it is 4).
Continue continue moves straight to the next iteration of a for, while or do loop. For do or while, this means that the test is executed immediately. In a for statement, the increment step is executed. This allows one to avoid deeply nested if . . . else statements within loops

EXAMPLE

```
for (i=100; i>0; i--)
{
x=f( i);
if(x==1)
continue;
y+=x*x;
}
```

One Cannot Use Continue to Jump out of or into Par Blocks
Goto goto label moves straight to the statement specified by label. label has the same format as a variable name, and may be in the same function as the goto. Labels have function scope. Formally, goto is never necessary. It may be useful for extracting from deeply nested levels of code in case of error.

EXAMPLE

```
for( . . . )
{
for( . . . )
{
if(disaster)
goto Error;
{
}
Error:
output ! error_code;
```

One cannot use Goto to Jump out of or into Par Blocks
return [expression]

The return statement is used to return from a function to its caller. return terminates the function and returns control to the calling function. Execution resumes at the line immediately following the function call. return can return a value to the calling function. The value returned is of the type declared in the function declaration. Functions that do not return a value should be declared to be of type void.

EXAMPLE

```
int power(int base, int n)
{
int i, p;
p=1;
for (i=1; i<=n; ++i)
p=p*base;
return(p);
}
```

One Cannot Use Return to Jump out of Par Blocks
Assignments

Handel-C assignments are of the form:
Variable=Expression;
For example:
x=3;
y=a+b;

The expression on the right hand side may be of the same width and type (signed or unsigned) as the variable on the left hand side. The compiler generates an error if this is not the case. The left hand side of the assignment may be any variable, array element or RAM element. The right hand side of the assignment may be any expression described later. Handel-C also provides a number of short cut assignment statements. Note that these cannot be used in expressions as they can in conventional C but only in stand-alone statements. These short cuts are:
Statement Expansion Variable++; Variable=Variable+1;
Variable--; Variable=Variable-1;
++Variable; Variable=Variable+1;
++Variable; Variable=Variable-1;
Variable+=Expression; Variable=Variable+Expression;
Variable-=Expression; Variable=Variable-Expression;.
Variable*=Expression; Variable=Variable*Expression;
Variable/=Expression; Variable=Variable/Expression;
Variable%=Expression; Variable=Variable % Expression;
Variable<<=Expression; Variable=Variable<<Expression;
Variable>>=Expression; Variable=Variable>>Expression;
Variable&=Expression; Variable=Variable & Expression;
Variable|=Expression; Variable=Variable|Expression;
Variable ^=Expression; Variable=Variable ^Expression;
Channel Communication Channels are a way of communicating between processes. When one writes to a channel, a copy of the data he or she writes is sent to the receiving process. This allows information to be shared between processes. Since a variable cannot be written to by multiple processes, one can write to the variable in a single process by reading channels that send data from other processes. Each channel may be written to at one end, and read from at the other. The width and type of data sent down the channel may be the same of the width and type of the channel. The channel can be an entry in an array of channels, or be pointed to by a channel pointer.

As with other variables, if no width or type is given to a channel, (or if it is set as undefined), the compiler can infer the channel width and type from its use. Reading from a channel is done as follows:

Channel ? Variable;

This assigns the value read from the channel to the variable. The variable may also be a signal, an array element, RAM element or WOM element.

Writing to a channel is as follows:

Channel ! Expression;

This writes the value of the expression to the channel. Expression may be any expression described later. No two statements may simultaneously write to or simultaneously read from a single channel.

```
par
{
out ! 3// Parallel write to a channel
out ! 4
}
```

This code is illegal as it attempts to write simultaneously to a single channel. Similarly, the following code is illegal because an attempt is made to read simultaneously from the same channel:

```
par
{
in ? x; // Parallel read from a channel
in ? y;
```

Example

```
set clock=external;
void main(void)
{
signal Fred;
unsigned 8 Res;
chan Bill;
par
{
Bill!23;
Bill?Fred;
Res=Fred;
}
}
``` prialt

The prialt statement selects the first channel ready to communicate. The syntax is similar to a conventional C switch statement.

```
prialt
{
case CommsStatement:
Statement
break;
. . .
case CommsStatement:
Statement
break;
. . .
default:
Statement
break;
}.
``` prialt selects between the communications on several channels depending on the readiness of the other end of the channel.

CommsStatement may be one of the following:

Channel ? Variable

Channel ! Expression

The case whose communication statement is the first to be ready to transfer data may execute and data may be transferred over the channel. The statements up to the next break statement may then be executed. The prialt construct does not allow the same channel to be listed twice in its cases and fall through of cases is prohibited. This means that each case may have its own break statement. If two channels are ready simultaneously, then the first one listed in the code takes priority.

Default prialt with no default case:

execution halts until one of the channels becomes ready to communicate.

prialt statement with default case:

if none of the channels is ready to communicate immediately then the default branch statements executes and the prialt statement terminates.

Conditional Execution (if . . . else)

Handel-C provides the standard C conditional execution construct as follows:

if( Expression)

Statement else

Statement

As in conventional C, the else portion may be omitted if not required. For example:

if(x==1)

x=x+1;

Here, and throughout the rest of the present description, Statement may be replaced with a block of statements by enclosing the block in { . . . } brackets. For example:

```
if (x>y)
{
a=b;
c=d;
}
else
a=d;
c=b;
}
```

The first branch of the conditional is executed if the expression is true and the second branch is executed if the expression is false. Handel-C treats zero values as false and non-zero values as true. As may be seen later, the relational logical operators return values to match this meaning but it is also possible to use variables as conditions. For example:

if (x)

a=b;

else c=d;

This is expanded by the compiler to:

if (x !=0)

a=d;

else c=b;

When executed, if x is not equal to 0 then b is assigned to a. If x is 0 then d is assigned to c.

while Loops

Handel-C provides while loops exactly as in conventional C:

while (Expression)

Statement

The contents of the while loop may be executed zero or more times depending on the value of Expression. While Expression is true then Statement is executed repeatedly. Again, Statement may be replaced with a block of statements. For example:

x=0;

while (x !=45)

{ y=y+5;

x=x+1;

}

This code adds 5 to y 45 times (equivalent to adding 225 to y).

do . . . while loops

Handel-C provides do . . . while loops exactly as in conventional C:

Do

Statement while (Expression);

The contents of the do . . . while loop is executed at least once because the conditional expression is evaluated at the end of the loop rather than at the beginning as is the case with while loops. Again, Statement may be replaced with a block of statements. For example:

do

{ a=a+b;

x=x −1;

} while (x>y);

for loops

Handel-C provides for loops similar to those in conventional C.

for ( Initialisation; Test; Iteration)

Statement

The body of the for loop may be executed zero or more times according to the results of the condition test. There is a direct correspondence between for loops and while loops.

for ( Init; Test; Inc)

Body;

Is directly equivalent to:

{

Init;

while ( Test)

{

Body;

Inc;

}

} unless the Body includes a continue statement. In a for loop continue jumps to before the increment, in a while loop continue jumps to after the increment. Each of the initialisation, test and iteration statements is optional and may be omitted if not required. As with all other Handel-C constructs, Statement may be replaced with a block of statements. For example:

for (; x>y; x++)

{ a=b;

c=d;

}

The difference between a conventional C for loop and the Handel-C version is in the initialisation and iteration phases. In conventional C, these two fields contain expressions and by using expression side effects (such as ++and −−) and the sequential operator ',' conventional C allows complex operations to be performed. Since Handel-C does not allow side effects in expressions the initialisation and iteration expressions have been replaced with statements. For example:

for(x=0;x <20; x=x+1)

{ y=y+2;

}

Here, the assignment of 0 to x and adding one to x are both statements and not expressions. These initialisation and iteration statements can be replaced with blocks of statements by enclosing the block in {. . . } brackets. For example:

for ({x=0; y=23;} ; x<20; {x+=1; x*=2; })

{ y=y+2;

}

56 switch

Handel-C provides switch statements similar to those in conventional C.

switch (Expression)

{ case Constant:

Statement break;

. . .

default:

Statement break;

}

The switch expression is evaluated and checked against each of the case compile time constants. The statement(s) guarded by the matching constant is executed until a break statement is encountered. If no matches are found, the default statement is executed. If no default option is provided, no statements are executed.

Each of the Statement lines above may be replaced with a block of statements by enclosing the block in {. . . } brackets. As with conventional C, it is possible to make execution drop through case branches by omitting a break statement. For example:

switch (x)

{ case 10:

a=b;

case 11:

c=d;

```
break;
case 12:
e=f;
break;
}
```
Here, if x is 10, b is assigned to a and d is assigned to c, if x is 11, d is assigned to c and if x is 12, f is assigned to e.

The values following each case branch may be compile time constants.

Break

Handel-C provides the normal C breaks statement both for terminating loops and separation of case branches in switch and prialt statements.

When used within a while, do . . . while or for loop, the loop is terminated and execution continues from the statement following the loop. For example:

```
for (x=0; x<32; x++)
{
if (a[x]==0)
break;
b[x]=a[x];
}
// Execution continues here
```

When used within a switch statement, execution of the case branch terminates and the statement following the switch is executed. For example:

```
switch (x)
{
case 1:
case 2:
y++;
break;
case 3:
z++;
break;
// Execution continues here
```

When used within a prialt statement, execution of the case branch terminates and the statement following the prialt is executed. For example:

```
prialt
{
case a ? x:
x++;
break;
case b ! y:
y++;
break;
}
// Execution continues here
```

Example

```
int power(int base, int n)
{
int i, p;
p=1;
for (i=1; i<=n; ++i)
p=p*base;
return(p);
}
```

One Cannot Use Return to Jump out of Par Blocks

Delay

Handel-C provides a delay statement not found in conventional C which does nothing but takes one clock cycle to do it. This may be useful to avoid resource conflicts (for example to prevent two accesses to one RAM in a single clock cycle) or to adjust execution timing. Delay can also be used to break combinatorial logic cycles.

Address and Indirection

The address operator (&) is used to access the address of a variable. The indirection operator*is the same as it is in ISO-C. It is used to declare pointers to objects, and to de-reference pointers (i.e. to access objects pointed to by pointers).

Member Operators

The structure member operator (.) is used to access members of a structure or mpram, or to access a port within an interface. The structure pointer operator (→) can be used, as in ISO-C. It is used to access the members of a structure or mpram, when the structure/mpram is referenced through a pointer.

```
mpram Fred
{
ram <unsigned 8> ReadWrite[256]; // Read/write port
rom <unsigned 8> Read[256]; // Read only port
} Joan;
mpram Fred*mpramptr;
mpramPtr=&Joan;
x=mpramPtr→Read[56];
```

If a memory is made up of structures, the structure member operator can be used to reference structure members within the memory.

```
ram struct S compRAM[100];
ram struct S (*ramStructPtr)[];
ramStructPtr=&compRAM;
x=(*ramStructPtr)[10].a;.
```

Expressions

Introduction

Expressions in Handel-C take no clock cycles to be evaluated, and so have no bearing on the number of clock cycles a given program takes to execute. They do affect the maximum possible clock rate for a program—the more complex an expression, the more hardware is involved in its evaluation and the longer it is likely to take because of combinatorial delays in the hardware. The clock period for the entire hardware program is limited by the longest such evaluation in the whole program. More details on timing and efficiency considerations will be set forth hereinafter in greater detail. Because expressions are not allowed to take any clock cycles, expressions with side effects are not permitted in Handel-C. For example;

a=b++; /*NOT PERMITTED*/

This is not permitted because the ++ operator has the side effect of assigning b+1 to b which requires one clock cycle. Note that even the longest and most complex C expression with many side effects can be written in terms of a larger number of simpler expressions. The resulting code is normally easier to read. For example:

a=(b++)+(((c-- ? d++: e--)), f);

can be rewritten as:

```
a=b+f;
b=b+1;
if (c)
d=d+1;
```

```
else
  e=e -1;
  c=c -1;
```
Note that Handel-C provides the prefix and postfix ++ and − operations as statements rather than expressions. For example:
```
a++;
b --;
++c;
--d;
```
This example is directly equivalent to:
```
a=a+1;
b=b-1;
c=c+1;
d=d-1;.
```
Restrictions on RAMs and ROMs Because of their architecture, RAMs and ROMs are restricted to performing operations sequentially. Only one element of a RAM or ROM may be addressed in any given clock cycle and, as a result, familiar looking statements are often disallowed. For example:
```
ram unsigned int 8 x[4];
x[1]=x[3]+1;
```
This code is illegal because the assignment attempts to read from the third element of x in the same cycle as it writes to the first element. Note that the ports within a multi-port RAM are in the same elements of memory so one can only make a single access to any one mpram port in a single clock cycle. The following code is also disallowed:
```
ram unsigned int 8 x[4];
if (x[0]==0)
  x[1]=1;
```
This is because the condition evaluation may read from element 0 of the RAM in the same clock cycle as the assignment writes to element 1. Similar restrictions apply to while loops, do . . . while loops, for loops and switch statements. Note that arrays of variables do not have these restrictions but may require substantially more hardware to implement than RAMs depending on the target architecture.

Operators

Bit Manipulation Operators

The following bit manipulation operators are provided in Handel-C:

| Operator | Meaning |
|---|---|
| << | Shift left |
| >> | Shift right |
| <- | Take least significant bits |
| \\ | Drop least significant bits |
| @ | Concatenate bits |
| [] | Bit selection | width(Expression) Width of Expression

Shift Operators

The shift operators shift a value left or right by a variable number of bits resulting in a value of the same width as the value being shifted. Any bits shifted outside this width are lost. When shifting unsigned values, the right shift pads the upper bits with zeros. When right shifting signed values, the upper bits are copies of the top bit of the original value. Thus, a shift right by 1 divides the value by 2 and preserves the sign. For example:
```
unsigned int 8 x;
int 8 y;
x=192;
y=-8;
x=x>>1;
y=y>>1;
```
This results in x being set to 96 and y being set to −4.

Take Operator

The take operator, →, returns the n least significant bits of a value. The drop operator, \\, returns all but the n least significant bits of a value. n may be a compile-time constant. For example:
```
macro expr four=8/2;
unsigned int 8 x;
unsigned int 4 y;
unsigned int 4 z;
x=0xC7;
y=x→four;
z=x \\ 4;
```
This results in y being set to 7 and z being set to 12 (or 0xC in hexadecimal).

Concatenation Operator

The concatenation operator, @, joins two sets of bits together into a result whose width is the sum of the widths of the two operands. For example:
```
unsigned int 8 x;
unsigned int 4 y;
unsigned int 4 z;
y=0xC;
z=0x7;
x=y @ z;
```
This results in x being set to 0xC7. The left operand of the concatenation operator forms the most significant bits of the result.

Bit Selection

Individual bits or a range of bits may be selected from a value by using the [] operator. Bit 0 is the least significant bit and bit n−1 is the most significant bit where n is the width of the value.

For example:
```
unsigned int 8 x;
unsigned int 1 y;
unsigned int 5 z;
x=0b01001001;
y=x[4];
z=x[7:3];
```
This results in y being set to 0 and z being set to 9. Note that the range of bits is of the form MSB:LSB and is inclusive. Thus, the range 7:3 is 5 bits wide.

Bit selection in RAM, ROM and array elements is also possible. For example:
```
ram int 7 w[23];
int 5 x[4];
int 3 y;
unsigned int 1 z;
y=w[10][4:2];
Z=x[2][0];.
```
Here, the 10 is the entry in the RAM and the 4:2 selects three bits from the middle of the value in the RAM. Similarly, z is set to the least significant bit in the x[2 ] variable.

Width Operator

The width( ) operator returns the width of an expression. It is a compile time constant. For example:

x=y→width(x);

This takes the least significant bits of y and assigns them to x. The width( ) operator ensures that the correct number of bits is taken from y to match the width of x.

Arithmetic Operators

The following arithmetic operators are provided in Handel-C:

| Operator | Meaning |
|---|---|
| + | Addition |
| − | Subtraction |
| * | Multiplication |
| / | Division |
| % | Modulus arithmetic |

Any attempt to perform one of these operations on two expressions of differing widths or types results in a compiler error. For example:

int 4 w;

int 3 x;

int 4 y;

unsigned 4 z;

y=w+x; // ILLEGAL z=w+y; // ILLEGAL

The first statement is illegal because w and x have different widths. The second statement is illegal because w and y are signed integers and z is an unsigned integer. All operators return results of the same width as their operands. Thus, all overflow bits are lost. For example:.

unsigned int 8 x;

unsigned int 8 y;

unsigned int 8 z;

x=128;

y=192;

z=2;

x=x+y;

z=z*y;

This example results in x being set to 64 and z being set to 128. By using the bit manipulation operators to expand the operands, it is possible to obtain extra information from the arithmetic operations. For instance, the carry bit of an addition or the overflow bits of a multiplication may be obtained by first expanding the operands to the maximum width required to contain this extra information. For example:

unsigned int 8 u;

unsigned int 8 v;

unsigned int 9 w;

unsigned int 8 x;

unsigned int 8 y;

unsigned int 16 z;

w=(0 @ u)+(0 @ v);

z=(0 @ x)*(0 @ y);

In this example, w and z contain all the information obtainable from the addition and multiplication operations. Note that the constant zeros do not require a width specification because the compiler can infer their widths form the usage. The zeros in the first assignment may be 1 bit wide because the destination is 9 bits wide while the source operands are only 8 bits wide. In the second assignment, the zero constants may be 8 bits wide because the destination is 16 bits wide while the source operands are only 8 bits wide.

Operator Precedence

Precedence of operators is as expected from conventional C. For example:

x=x+y*z;

This performs the multiplication before the addition. Brackets may be used to ensure the correct calculation order as in conventional C.

Relational Operators

The following relational operators are provided in Handel-C:

| Operator | Meaning |
|---|---|
| == | Equal to |
| != | Not equal to |
| < | Less than |
| > | Greater than |
| <= | Less than or equal |
| >= | Greater than or equal |

These operators compare values of the same width and return a single bit wide unsigned int value of 0 for false or 1 for true. This means that the following conventional C code is invalid:

int 8 w, x, y, z;

w=x+(y>z); // NOT ALLOWED

Instead, one should write:

w=x+(0@(y>z));

Signed/unsigned Compares

Signed/signed compares and unsigned/unsigned compares are handled automatically. Mixed signed and unsigned compares are not handled automatically. For example:

unsigned 8 x;

int 8 y;

if (x>y) // Not allowed

. . .

To compare signed and unsigned values one may sign extend each of the parameters. The above code can be rewritten as:

unsigned 8 x;

int 8 y;

if ((int)(0@x)>(y[7]@y))

. . .

Implicit Compares

The Handel-C compiler inserts implicit compares with zero if a value is used as a condition on its own. For example:

while (1)

{

. . .

} while (1 !=0)

{

. . .

}

Logical Operators

The following logical operators are provided in Handel-C:

| Operator | Meaning |
|----------|---------|
| && | Logical and |
| \|\| | Logical or |
| ! | Logical not |

These operators are provided to combine conditions as in conventional C. Each operator takes 1 -bit unsigned operands and returns a 1-bit unsigned result. Note that the operands of these operators need not be the results of relational operators. For example:

if (x||y>z)
w=0;

In this example, the variable x need not be 1 bit wide—if it is wider, the Handel-C compiler inserts a compare with 0. As in conventional C, the condition of the if statement is true if x is not equal to 0 or y is greater than z. This feature allows some familiar looking conventional C constructs. For example:

while (x||y)
{
...
}

Bitwise Logical Operators

The following bitwise logical operators are provided in Handel-C:

| Operator | Meaning |
|----------|---------|
| & | Bitwise and |
| \| | Bitwise or |
| ^ | Bitwise exclusive or |
| ~ | Bitwise not | these operators perform bitwise logical operations on values. Both operands may be of the same type and width: the resulting value may also be this type and width. For example:

unsigned int 6 w;
unsigned int 6 x;
unsigned int 6 y;
unsigned int 6 z;
w=0b101010;
x=0b011100;
y=w & x;
z=w|x;
w=w^~x;

This example results in y having the value 0b001000, z having the value 0b111110 and w having the value 0b001001.

Conditional Operator

Handel-C provides the conditional expression construct familiar from conventional C. Its format is: Expression ? Expression:Expression The first expression is evaluated and if true, the whole expression evaluates to the result of the second expression. If the first expression is false, the whole expression evaluates to the result of the third expression. For example:

x=(y>z) ? y:z;

This sets x to the maximum of y and z. This code is directly equivalent to:

if(y>z)
x=y;
else
x=z;

The advantage of using this construct is that the result is an expression so it can be embedded in a more complex expression. For example:

x=((y>z) ? y: z)+4;

Casting of Expression Types

The following piece of Handel-C is invalid:

int 4 x; // Range of x: –8 . . . 7
unsigned int 4 y; // Range of y: 0 . . . 15
x=y; // Not allowed This is because x is a signed integer while y is an unsigned integer. When generating hardware, it is not clear what the compiler should do here. It could simply assign the 4 bits of y to the 4 bits of x or it could extend y with an extra zero as its most significant bit to preserve its value and then assign these 5 bits to x assuming x was declared to be 5 bits wide. To see the difference, consider the case when y is 10. By simply assigning these 4 bits to a signed integer, a result of –6 would be placed in x. A better solution might be to extend y to a five bit value by adding a 0 bit as its MSB to preserve the value of 10. The solution adopted by Handel-C is not to allow automatic conversions between signed and unsigned values to avoid this confusion. Instead, values may be 'cast' between types to ensure that the programmer is aware that a conversion is occurring that may alter the meaning of a value. The above example then becomes:

int 4 x;
unsigned int 4 y;
x=(int 4)y;

It is now clear that the value of x is the result of treating the 4 bits extracted from y as a signed integer. One can also cast to a type of undefined width. For example:

int 4 x;
unsigned int undefined y;
x=(int undefined)y;

Here, the compiler may infer that y may be 4 bits wide. Casting cannot be used to change the width of values. For example, this is not allowed:

unsigned int 7 x;
int 12 y;
y=(int 12)x; // Not allowed

Instead, the conversion should be done explicitly:

y=(int 12)(0 @ x);

Here, the concatenation operation produces a 12-bit unsigned value. The casting then changes this to a 12-bit signed integer for assignment to y. Again, this is to ensure that the programmer is aware of such conversions. To illustrate why this is important, consider the following example:

int 7 x;
unsigned int 12 y;
x=–5;
y=(unsigned int 12)x;.

Here, the Handel-C compiler could take two equally viable routes. One would be to sign extend the value of x and produce the result 4091. The second would be to zero pad the value of x and produce the value of 123. Since neither method can preserve the value of x in y Handel-C performs neither automatically. Rather, it is left up to the programmer to decide which approach is correct in a particular situation and to write the expression accordingly Functions Introduction Functions are similar to functions in ISO-C. Handel-C has been extended to provide arrays of functions and inline functions. Arrays of functions provide multiple copies of a function. One can select which copy is used at any time. Inline functions are similar to macros in that they are expanded wherever they are used. Functions take arguments and return values. A function that does not return a value is of type void. The default return type is int undefined.

When a function is declared or defined, it has a parameter list, which describes the type of arguments that it expects to receive. Functions that do not take arguments have void as their parameter list. E.g. void main(void)

As in ISO-C, function arguments are passed by value. This means that a local copy is created that is only in scope within the function. Changes take place on this copy. To access a variable outside the function, one may pass the function a pointer to that variable. A local copy may be made of the pointer, but it may still point to the same variable. This is known as passing by reference. Architectural types (hardware constructs) may be passed by reference (a pointer to or address of the construct). The only architectural type that can be passed to or returned by a function by value is a signal. All others (and structures or unions containing them) may be passed by reference. Arrays and functions can also only be passed by reference.

Function Definitions and Declarations

Functions are defined as in ISO-C. The function declaration consists of the function name, and names and types for its parameters and return value. The definition of a function consists of its declaration plus the code body that it performs when it is called.

returnType Name(parameterList)
{
declarations
statements
}

If the declaration is followed by a semi-colon, it is a function prototype. This tells the compiler the types of arguments that the function expects so it can check that the function is used correctly within the rest of the file.

returnType Name(parameterList);

The names in a function prototype are only in scope in the prototype. One can use different names in the definition of the function and function calls. Functions may be declared (prototyped) in every file that they are used in, though they should only be defined once. It is common to put function prototypes into a header file and #include that in every file where they are used.

Scope

Functions cannot be defined within other functions. By default, functions are extern (they can be used anywhere). Functions can also be defined as static (they can only be used in the file in which they are defined).

Arrays of Functions

An array of functions is a collection of identical functions. It is not the same as an array of function pointers (each of whose elements can point to a different function). Function arrays allow functions to be copied and shared neatly. Here is a declaration of a simple function array:

unsigned func[2](unsigned x, unsigned y)
{
return (x+y);
}

The syntax is a normal function declaration, with square brackets added to specify that this is an array declaration as well as a function declaration. The general form of a function array declaration is:

returnType Name[Size](parameterList)

One can also declare a function array in a prototype. This means that one can declare a function func in one file, and an array of functions of type func in another file void func[n](void);

A function array allows one to run different copies of the function in parallel. Without this construct, the only safe way to run a function in parallel with itself would be to explicitly declare two functions with different names. This would not be so neat and intuitive.

EXAMPLE set clock=external "P1";
// Function array prototype
unsigned func[2](unsigned x, unsigned y);
// Main program
void main (void)
{
unsigned a, b, c, d, e, f;
unsigned short r1, r2, r3, r4;
unsigned result;
par
{
a=12;
b=22;
c=32;
d=42;
e=52;
f=62;
}
par
{
r1=func[0](a, b)
r2=func[1](c, d);
{
par
}
r3=func[0](e, f)
r4=func[1](r1, r2);
{
result=func[0](r3, r4);
}
// Function array definition
unsigned func[2](unsigned x, unsigned y)
{
return (x+y);

Function Pointers

These are a very powerful, yet potentially confusing feature. In situations where any one of a number of functions can be called at a particular point, it is neater and more concise to use a function pointer, where the alternative might be a long if-else chain, or a long switch statement. For example, consider this program:

unsigned 1 check(short int*a, short int*b,
unsigned 1 (*chk)(short int*, short int*));

```
unsigned 1 addeven(const short int*x, const short int*y);
unsigned 1 multeven(const short int*x, const short int*y);
unsigned 1 diveven(const short int*x, const short int*y);
unsigned 1 modeven(const short int*x, const short int*y);
void main(void)
short int m, n;
unsigned 2 choice;
unsigned 1 result;
unsigned 1 (*p)(const short*, const short*);
par
{
m=19;
n=47;
{
do
}
switch (choice)
{
case 0:
p=addeven;
break;
case 1:
p=multeven;
break;
case 2:
p=diveven;
break;
case 3:
p=modeven;
break;
default:
break;
}
par
{
result=check(&m, &n, p);
choice++;
}.Handel-C Language
}
while (choice)
delay;
unsigned 1 check(short int*a, short mt*b,
unsigned 1 (*chk) (short int*, short int*))
{
return (*chk) (a, b);
}
unsigned 1 adeven(const short int*x, const short int*y)
{
return (unsigned) (*x+*y)[0];
}
unsigned 1 multeven(const short int*x, const short int*y)
{
return (unsigned) (*x**y)[0];
}
unsigned 1 diveven(const short int*x, const short int*y)
{
return (unsigned) (*x/*y)[0];
}
unsigned 1 modeven(const short int*x, const short int*y)
return (unsigned) (*x%*y)[0];
```

The function addeven checks whether the sum of two numbers is even. Similar checks are carried out by multeven (product of two numbers), diveven (division) and modeven (modulus). The function check simply calls the function whose pointer it receives, with the arguments it receives. This gives a consistent interface to the xxxeven func tons. Pay close attention to the declaration of check, and of function pointer p. The parentheses around *p (and *chk in the declaration of check) are necessary for the compiler to make the correct interpretation.

Indirection Techniques

Function pointers can be assigned with or without the address operator & (similar to assigning array addresses). Functions pointed to can be called with or without the indirection operator. In the code above, the function name was assigned to the pointer without the & p=addeven;

One may wish to use the & format for clarity:

p=&adeven;

Inside check, the function pointed to by p was called by writing.

(*chk)(a, b);

This could also have written in the shorthand form:

chk(a, b);

The first form is preferable, as it tips off anyone reading the code that a function pointer is being used.

Inside the main program body, check was called like this.

check(&m, &n, p);

It could have been written like this, check(&m, &n, xxxeven);

eliminating the need for an additional pointer variable. Here is the main section written using this form of expression:

```
void main(void)
{
short int m, n;
unsigned 2 choice;
unsigned 1 result;
par
{
m=19;
n=47;
}
do
{
switch (choice)
case 0:
result=check(&m, &n, adeven);
break;
case 1:
result=check(&m, &n, multeven);
break;
case 2:
result=check(&m, &n, diveven);
break;
case 3:
result=check(&m, &n, modeven);
break;
```

```
default:
break;
choice++;
}
while (choice)
delay;
```
Restrictions on Functions
Shared Code Functions may not be shared by two different parts of the program on the same clock cycle. For example:

```
int func(x, y);
par
{
a=func(b, c);
{
b=foo;
d=func(e, f); // NOT ALLOWED
}
}
int func(int x, int y)
{
if (x==y)
delay;
else
{
x=x % y;
}
x*=10;
return(x)
}
```

This is not allowed because part of the single function is used twice in the same clock cycle. This overlapping usage is not detected by the compiler, as it is a run-time error. It is therefore the programmer's responsibility to ensure that code usage does not overlap. This may be done by declaring functions to be inline (are expanded whenever they are used) or declaring an array of functions, one to be used in each parallel branch.

```
inline int func(x, y);
par
{
a=func(b, c);
{
b=foo;
d=func(e, f);
}
}
or
int func[3](x, y)
par
{
a=func[0](b, c);
{
b=foo;
d=func [1] (e, f);
}
}
```

More details on timing of Handel-C programs and more details of how one can tell which clock cycle operations are performed will be set forth later.

Recursion

Due to the absence of a stack in Handel-C, functions cannot be recursive. If a person calls a function within that function's body, the compiler generates an error Macros Introduction As mentioned in previous sections, the Handel-C compiler passes source code through a standard C preprocessor before compilation allowing the use of #define to define constants and macros in the usual manner. There are some limitations to this approach. Since the preprocessor can only perform textual substitution, some useful macro constructs cannot be expressed. For example, there is no way to create recursive macros using the preprocessor.

Handel-C provides additional macro support to allow more powerful macros to be defined (for example, recursive macro expressions). In addition, Handel-C supports shared macros to generate one piece of hardware which is shared by a number of parts of the overall program similar to the way that procedures allow conventional C to share one piece of code between many parts of a conventional program. This section of the present description details how to define macros and shared hardware.

Macro Expressions

Macros may be used to replace expressions to avoid tedious repetition. Handel-C provides some powerful macro constructs to allow complex expressions to be generated simply.

Constant Macro Expressions

Constant macro expressions are of two types:

♦.simple constant equivalent to #define

♦.a constant expression

Constant

This first form of the macro is a simple expression. For example:

```
macro expr DATA_WIDTH=15;
int DATA_WIDTH x;
```

This form of the macro is similar to the #define macro. Whenever DATA_WIDTH appears in the program, the constant 15 is inserted in its place.

Constant Expression

To provide a more general solution, one can use a real expression. For example:

```
macro expr sum=(x+y) @ (y+z);
v=sum;
w=sum;
```

Parameterized Macro Expressions

FIG. 57A-2 illustrates a method 5750 for parameterized expressions, in accordance with various embodiments of the present invention. In general, a plurality of first variables are defined with reference to variable widths. See operation 5752. A plurality of second variables are also defined without reference to variable widths, as indicated in operation 5754. In an aspect of the present invention, the first and second variables may be included in a library.

Computer code is then compiled including the first and second variables. Note operation 5756. As such, the variable widths of the second variables may be inferred from the variable widths of the first variables. See operation 5758. In one embodiment of the present invention, the variable widths of the second variables may be inferred during a routine that reconciles the first variables with the second variables in the library. As an option, a relation may be defined between the first variables and the second variables.

In yet another aspect, the first variables may be further defined with reference to data types, the second variables may be defined without reference to the data types, and the data types of the second variables may be inferred from the data types of the first variables. In even another aspect of the present invention, the first variables may be further defined with reference to array size, the second variables may be defined without reference to the array size, and the array size of the second variables may be inferred from the array size of the first variables. In yet another aspect, the first variables may be further defined with reference to pipeline depth, the second variables may be defined without reference to the pipeline depth, and the pipeline depth of the second variables may be inferred from the pipeline depth of the first variables.

It should be noted that the above concept may be applied in more general contexts per the desires of the user. For example, an application may be defined with a first variable where the first variables' width is unresolved. Thereafter, the application may be stored in a library, and computer code may be compiled including the first variable. In one embodiment of the present invention, a plurality of libraries may be used to organize functional components of predefined functions.

As such, the variable width of the first variable may be resolved as the application is utilized in any desired manner. For example, the variable width of the first variable may be resolved utilizing predefined rules during compilation. Still yet, a plurality of variables may be resolved dynamically during compilation. As yet another option, the variable widths of the first variable may change in response to the compilation in a first application or a second application.

As an option, the first variable may be defined with no reference to a data type. Accordingly, the data type of the first variable is resolved dynamically as the compilation proceeds. In a similar manner, the first variable may be defined without reference to array size. Further, the array size of the second variables may be resolved dynamically during compilation as the first variable is used by an application.

More information regarding the above concept will now be set forth in greater detail.

Handel-C also allows macros with parameters. For example:

macro expr add3(x)=x+3;
y=add3(z);

This is equivalent to the following code:

y=z+3;

Again, this form of the macro is similar to the #define macro in that every time the add3( ) macro is referenced, it is expanded in the manner shown above. In other words, in this example, an adder is generated in hardware every time the add3( ) macro is used.

The Select Operator

Handel-C provides a select( . . . ) operator which is used to mean 'select at compile time' . Its general usage is: select(Expression, Expression, Expression) Here, the first expression may be a compile time constant. If the first expression evaluates to true then the Handel-C compiler replaces the whole expression with the second expression. If the first expression evaluates to false then the Handel-C compiler replaces the whole expression with the second expression. The difference between this and the ? : operators is best illustrated with an example.

w=(width(x)==4 ? y: z);

This example generates hardware to compare the width of the variable x with 4 and set w to the value of y or z depending on whether this value is equal to 4 or not. This is probably not what was intended in this case because both width(x) and 4 are constants. What was probably intended was for the compiler to check whether the width of x was 4 and then simply replace the whole expression above with y or z according to the value. This can be written as follows:

w=select(width(x)==4, y, z);

In this example, the compiler evaluates the first expression and replaces the whole line with either w=y; or w=z;. No hardware for the conditional is generated.

A more useful example can be seen when macros are combined with this feature. For example:

macro expr adjust(x, n)=
select(width(x)<n, (0 @ x), (x→n));
unsigned 4 a;
unsigned 5 b;
unsigned 6 c;
b=adjust(a, width(b));
b=adjust(c, width(b));

This example is for a macro that equalizes widths of variables in an assignment. If the right hand side of an assignment is narrower than the left hand side then the right hand side may be padded with zeros in its most significant bits. If the right hand side is wider than the left hand side, the least significant bits of the right hand side may be taken and assigned to the left hand side.

The select( . . . ) operator is used here to tell the compiler to generate different expressions depending on the width of one of the parameters to the macro. The last two lines of the example could have been written by hand as follows:

b=0 @ a;
b=c→5;

However, the macro comes into its own if the width of one of the variables changes. For example, suppose that during debugging, it is discovered that the variable a is not wide enough and needs to be 8 bits wide to hold some values used during the calculation. By using the macro, the only change required would be to alter the declaration of the variable a. The compiler would then replace the statement b=0 @ a; with b=a→5; automatically.

This form of macro also comes in useful is when variables of undefined width are used. If the compiler is used to infer widths of variables, it may be tedious to work out by hand which form of the assignment is required. By using the select( . . . ) operator in this way, the correct expression is generated without one having to know the widths of variables at any stage.

Ifselect

Syntax ifselect (condition)
statement 1
[else
statement 2]

ifselect checks the result of a compile-time constant expression at compile time. If the condition is true, the following statement or code block is compiled. If false, it is dropped and an else condition can be compiled if it exists. Thus, whole statements can be selected or discarded at compile time, depending on the evaluation of the expression.

The ifselect construct allows one to build recursive macros, in a similar way to select. It is also useful inside replicated blocks of code as the replicator index is a compile-time constant. Hence, one can use ifselect to detect the first and last items in a replicated block of code and build pipelines.

EXAMPLE int 12 a;
int 13 b;

```
int undefined c;
ifselect(width(a)>=width(b))
c=a;
else
c=b;
```
c is assigned to by either a or b, depending on their width relationship.

Pipeline Example

```
unsigned init;
unsigned q[15];
unsigned 31 out;
init=57;
par (r=0; r<16; r++)
{
ifselect(r==0)
q[r]=init;
else ifselect(r==15)
out=q[r-1];
else
q[r]=q[r-1];
}
```

Recursive Macro Expressions

A serious limitation with preprocessor macros (those defined with #define) is their inability to generate recursive expressions. By combining Handel-C macros (those defined with macro expr) and the select( . . . ) operator discussed above, recursive macros can be used to simply express complex hardware. This type of macro is particularly important in Handel-C where the exact form of the macro may depend on the width of a parameter to the macro. As an example, a sign extension of a variable is taken. When assigning a narrow signed variable to a wider variable, the most significant bits of the wide variable should be padded with the sign bit (MSB) of the narrow variable. For example, the 4-bit representation of −2 is 0b1110. When assigned to an 8-bit wide variable, this should become 0b11111110. In contrast, the 4-bit representation of 6 is 0b0110. When assigned to an 8-bit wide variable, this should become 0b00000110. In this example, the following code would suffice:

```
int 8 x;
int 4 y;
x=y[3] @ y[3] @ y[3] @ y[3] @ y;
```

As one can see, this can rapidly become tedious for variables that differ by a significant number of bits. Also, what if the exact widths of the variables are not known? What is needed is a macro to sign extend a variable. For example:

```
macro expr copy(x, n)=
select(n==1, x, (x @ copy(x, n-1)));
macro expr extend(y, m)=
copy(y[width(y)-1], m-width(y)) @ y;
int a;
int b; // Where b is known to be wider than a
b=extend(a, width(b));
```

Here, the copy macro generates n copies of the expression x concatenated together. The macro is recursive and uses the select( . . . ) operator to evaluate whether it is on its last iteration (in which case it just evaluates to the expression) or whether it should continue to recurse by a further level. The extend macro simply concatenates the sign bit of its parameter m-k times onto the most significant bits of the parameter. Here, m is the required width of the expression y and k is the actual width of the expression y. The final assignment correctly sign extends a to the width of b for any variable widths where width(b) is greater than width(a).

Recursive Macro Expressions: A Larger Example

A second example of the use of recursive macro expressions is now given to illustrate the generation of large quantities of hardware from simple macros. The example used is that of a multiplier whose width depends on the parameters of the macro. Although Handel-C includes a multiplication operator as part of the language, this example serves as a starting point for generating large regular hardware structures using macros.

The multiplier generates the hardware for a single cycle long multiplication operation from a single macro. The source code is:

```
macro expr multiply(x, y)=
select(width(x)==0, 0,
multiply(x \\ 1, y << 1)+
(x[0]==1 ? y: 0));
a=multiply (b, c);
```

At each stage of recursion, the multiplier tests whether the bottom bit of the x parameter is 1. If it is then y is added to the 'running total'. The multiplier then recurses by dropping the LSB of x and multiplying y by 2 until there are no bits left in x. The overall result is an expression that is the sum of each bit in x multiplied by y. This is the familiar long multiplication structure. For example, if both parameters are 4 bits wide, the macro expands to:

```
a=((b \\ 3)[0]==1 ? c<<3:0)+
((b \\ 2)[0]==1 ? c<<2:0)+
((b \\ 1)[0]==1 ? c<<1:0)+
(b[0]==1 ? c:0);
```

This code is equivalent to:

```
a=((b & 8)==8 ? c*8:0)+
((b & 4)==4 ? c*4:0)+
((b & 2)==2 ? c*2:0)+
((b & 1)==1 ? c:0);
``` which is a standard long multiplication calculation.

Shared Expressions

By default, Handel-C generates all the hardware required for every expression in the whole program. In many programs, this means that large parts of the hardware may be idle for long periods. The shared expression allows hardware to be shared between different parts of the program to decrease hardware usage. The shared expression has the same format as a macro expression but does not allow recursion. An example program where shared expressions are extremely useful is:

```
a=b*c;
d=e*f;
g=h*i;
```

Here, three multipliers may be generated but each one may only be used once and none of them simultaneously. This is a massive waste of hardware. The way to improve this program is:

```
shared expr mult(x, y)=x*y;
a=mult(b, c);
d=mult(e, f);
g=mult(h, i);
```

In this example, only one multiplier is built and it is used on every clock cycle which is a better use of hardware. (In fact, the above example could be built as three multipliers executing in parallel if the maximum performance is required).

It is not always the case that less hardware is generated by using shared expressions because multiplexers may need to be built to route the data paths. Some expressions use less hardware than the multiplexers associated with the shared expression.

Using Recursion to Generate Shared Expressions

Although shared expressions cannot use recursion directly, macro expressions can be used to generate hardware which can then be shared using a shared expression. For example, to share the recursive multiplier macro example above one could write:

macro expr multiply(x, y)=
select(width(x)==0, 0,
multiply(x \\ 1, y << 1)+
(x[0]==1 ? y:0));
shared expr mult(x, y)=multiply(x, y);
a=mult(b, c);
d=mult(e, f);

Here, the macro expression builds a multiplier and the shared expression allows that hardware to be shared between the two assignments.

Restrictions on Shared Expressions

A limitation to shared expressions is that they may not be shared by two different parts of the program on the same clock cycle. For example:

shared expr mult(x, y)=x*y;
par
{
a=mult(b, c);
d=mult(e, f); // NOT ALLOWED
}

This is not allowed because the single multiplier is used twice in the same clock cycle. This becomes an important skill when using shared expressions.

let . . . in

The Handel-C constructs let and in allow one to declare macro expressions within macro expressions. In this way, complex macros may be broken down into simple ones, whilst still being grouped together in a single block of code. They also provide easy sharing of recursive macros. The let keyword starts the declaration of a local macro; the in keyword ends the declaration and defines its scope.

EXAMPLE macro expr Fred(x)=
let macro expr y=x*2; in
y+3; // Returns x*2+3

The top line defines the macro name and parameters. The second line defines y within the macro definition. The last line expresses the value of the macro in full.

Independent let . . . in Definitions macro expr op(a, b)=
let macro expr t2(x)=x*2; in
let macro expr d3(x)=x/3; in
let macro expr t4(x)=x*4; in
t2(a)+d3(b)+t4(a−b)+t2(b−a);
is equivalent to writing
macro expr op(a, b)=(a*2)+(b/3)+((a−b)*4)+((b−a)*2);

Related let . . . in Definitions macro expr op(a, b)=
let macro expr sum(x, y)=x+y; in
let macro expr mult(x, y)=x*sum(x, y); in
mult(a, b)−(b*b);

sum is defined within the macro definition, then mult is defined using sum. This example is equivalent to:

macro expr op(a, b)=(a*(a+b))−(b*b);

Shared Recursive Macro

A recursive multiplier illustrating the way in which let . . . in can be used to share recursive macros.

shared expr mult(p, q)=
let macro expr multiply(x, y)=
select(width(x)==0, 0, multiply(x \\ 1, y<<1)
+(x[0]==1 ? y: 0)); in
multiply(p, q);.

Macro Procedures

Macros may be used to replace statements to avoid tedious repetition. Handel-C provides simple macro constructs to expand single statements into complex blocks of code. The general syntax of macro procedures is:

macro proc Name(Params) Statement

For example:

macro proc output(x, y)
{
out ! x;
out ! y;
}
output(a+b, c*d);
output(a+b, c*d);

This example writes the two expressions a+b and c*d twice to the channel out. This example also illustrates that the statement may be a code block—in this case two instructions executed sequentially. Macro procedures generate the hardware for their statement every time they are referenced. The above example expands to 4 channel output statements. Macro procedures differ from preprocessor macros in that they are not simple text replacements. The statement section of the definition may be a valid Handel-C statement. For example:

define test(x,y) if (x ! =(y<<2))
test(a,b)
{
a++;
}
else
{
b++;
}

This is a valid preprocessor macro definition. However, the following code is not allowed:

macro proc test(x,y) if (x ! =(y<<2));
test(a,b) // NOT ALLOWED
{
a++;
}
else
{
b++;
}

Here, the macro procedure is not defined to be a complete statement so the Handel-C compiler generates an error. This restriction provides protection against writing code such as these examples which is generally unreadable and difficult to maintain.

Macro Prototypes

As with functions, macros may be prototyped. This allows one to declare them in one file and use them in another. A macro prototype consists of the name of the macro plus a list of the names of its parameters. E.g.

macro proc work(x, y);

shared expr mult(p, q);.10 Timing and efficiency information.

Timing Information

Introduction

A Handel-C program executes with one clock source for each main statement. It is important to be aware exactly which parts of the code execute on which clock cycles. This is not only important for writing code that executes in fewer clock cycles but may mean the difference between correct and incorrect code when using Handel-C's parallelism. Knowing about clock cycles also becomes important when considering interfaces to external hardware. This subject is covered in greater detail later but it is important to understand timing issues before moving on to implementing such interfaces because it likely that the external device may place constraints on when signals should change.

This section of the present description also deals with the subject of overall performance. It shall be seen that avoiding certain constructs has a dramatic influence on the maximum clock rate that the Handel-C program can run at and some guidelines are given for improving the hardware performance. An example is given that covers the considerations for real time constraints on a system.

Clock Cycle Timing of Language Constructs

This section deals with the analysis of a program in terms of the number of clock cycles it takes to execute. The Handel-C language has been designed so that an experienced programmer can immediately tell which instructions execute on which clock cycles. This information becomes very important when the program contains multiple interacting parallel processes.

Statement Timing

The basic rule for working out the number of cycles used in a Handel-C program is:

◆Assignment and delay take 1 clock cycle.

◆Everything else is free.

What this means is that every time one write an assignment statement or a delay statement, one use one clock cycle but one can write any other piece of code and not use any clock cycles to execute it. The only exception is channel communication which takes one clock cycle only if both parties are ready to communicate in the same clock domain. This means that if one parallel branch is ready to output on a channel when another branch is ready to receive then it takes one clock cycle for the data to be assigned to the variable in the input statement. If one of the branches is not ready for the data transfer then execution of the other branch waits until both branches become ready. Even if both branches are ready for the transfer then one clock cycle is used because channel input is a form of assignment. Some simple examples with their timings are shown below.

Statements x=y;

x=(((y*z)+(w*v))<<2)→7;

Each of these statements takes one clock cycle. Notice that even the most complex expression can be evaluated in a single clock cycle. Handel-C simply builds the combinatorial hardware to evaluate such expressions; they do not need to be broken down into simpler assembly instructions as would be the case for conventional C.

Parallel Statements par
{
x=y;
a=b*c;

This code executes in a single cycle because each branch of the parallel statement takes only one clock cycle. This example illustrates the benefits of parallelism. One can have as many non-interdependent instructions as he or she wishes in the branches of a parallel statement. The total time for execution is the length of time that the longest branch takes to execute. For example:

par
{
x=y;
{
a=b;
c=d;
}
}

This code takes two clock cycles to execute. On the first cycle, x=y and a=b take place. On the second clock cycle, c=d takes place. Since both branches of the par statement may complete before the par block can complete, the first branch delays for one clock cycle while the second instruction in the second branch is executed.

While loop x=5;

while (x>0)
{
x--;
}

This code takes a total of 6 clock cycles to execute. One cycle is taken by the assignment of 5 to x. Each iteration of the while loop takes 1 clock cycle for the assignment of x-1 to x and the loop body is executed 5 times. The condition of the while loop takes no clock cycles as no assignment is involved.

For loop for (x = 0; x < 5; x ++)
{
a += b;
b *= 2;

As discussed earlier, this code has an almost direct equivalent:

{
x = 0;
while (x<5)
{
a += b;
b *= 2;
x ++;
}

This code takes 16 clock cycles to execute. One is required for the initialisation of x and three for each execution of the body. Since the body is executed 5 times, this gives a total of 16 clock cycles.

Decision if (a>b)
{
x = a;

}
else
{
x = b;
}

This code takes exactly one clock cycle to execute. Only one of the branches of the if statement is executed, either x = a or x = b. Each of these assignments takes one clock cycle. Notice again that no time is taken for the test because no assignment is made. A slightly different example is:

if (a>b)
{
x = a;
}

Here, if a is not greater than b, there is no else branch. This code therefore takes either 1 clock cycle if a is greater than b or no clock cycles if a is not greater than b.

Channels

Channel communications are more complex. The simplest example is:

par
{
link ! x; // Transmit
link ? y; // Receive
}

This code takes a single clock cycle to execute because both the transmitting and receiving branches are ready to transfer at the same time. All that is required is the assignment of x to y which, like all assignments, takes 1 clock cycle. A more complex example is:

par
{
{// Parallel branch 1
a = b;
c = d;
link ! x;
}
link ? y; // Parallel branch 2

Here, the first branch of the par statement takes three clock cycles to execute. However, the second branch of the par statement also takes three clock cycles to execute because it may wait for two cycles before the transmitting branch is ready. The usage of clock cycles is as follows:

| Cycle | Branch 1 | Branch 2 |
|---|---|---|
| 1 | a = b; | delay |
| 2 | c = d; | delay |
| 3 | Channel output | Channel input |

This approach extends to all the other Handel-C statements. FIGS. 58A and 58B illustrate a summary 5800 of statement timings, in accordance with one embodiment of the present invention.

Avoiding Combinatorial Loops

Consider the following example:

while (x!=3); // WARNING!!

If x is modified in a parallel process then this loop should wait for x to become 3 before allowing the program to continue. However, this code is not allowed in Handel-C because it generates a combinatorial loop in the logic because of the way that Handel-C expressions are built to evaluate in zero clock cycles. This is easier to see if one writes it as:

while (x!=3)
{
// wait until x == 3
}

This loop may be broken by changing the code to:

while (x!=3)
{
delay;
}

This loop takes no longer to execute than the other but does not contain a combinatorial loop because of the clock cycle delay in the loop body. The Handel-C compiler may spots this form of error, insert the delay statement, and generate a warning. It is considered better practice to include the delay statement in the code to make it explicit. Beware of code which may look correct but has the same error. For example:

while (x!=3)
{
if (y>z)
{
a++;
}
}

As seen above, this if statement may take zero clock cycles to execute if y is not greater than z so even though this loop body does not look empty a combinatorial loop is still generated. Again, this is more obvious written as while (x!=3)
{
if (y>z)
{
a++;
}
else
{
// do nothing
}
}

The solution in this example is to add the else part of the if construct as follows:

while (x!=3)
{
if (y>z)
{
a++;
}
else
{
delay;
}
}

Similar problems occur with do . . . while loops and switch statements in similar circumstances. In addition, for loops with no iteration step can cause combinatorial loops.

Parallel Access to Variables

As discussed earlier, Scope and variable sharing, the rules of parallelism state that the same variable may not be accessed from two separate parallel branches. This rule is there to avoid resource conflicts on the variables. However, if care is taken then this rule may be relaxed to state that the same variable may not be assigned to more than once on the same clock cycle but may be read as many times as required. The analysis presented in this section of the present description allows the programmer to determine precisely when an assignment may take place and avoid such conflicts.

This relaxation allows some useful and powerful programming techniques. For example:

```
par
{
a = b;
b = a;
}
```

This code swaps the values of a and b in a single clock cycle. Since exact execution time may be run-time dependant, the Handel-C compiler cannot determine when two assignments are made to the same variable on the same clock cycle. One should therefore check the code to ensure that the relaxed rule of parallelism is still obeyed. Using this technique, a four place queue can be written:

```
while(1)
{
par
{
int x[3];
x[0] = in;
x[1] = x[0];
x[2] = x[1];
out = x[2];
}
}
```

Here, the value of out is the value of in delayed by 4 clock cycles. On each clock cycle, values may move one place through the x array. FIG. 59 illustrates various I/O 5900 based on clock cycles, in accordance with one embodiment of the present invention.

Multiple Simultaneous Use of RAMs and ROMs

Beware of the following code:

x = y>z ? RamA[1] : RamA[2];

This code does not execute correctly because of the multiple use of the RAM in the expression. The solution is to re-write the code as follows:

x = RamA[y>z ? 1: 2];

Here, there is only a single access to the RAM so the problem does not occur.

Detailed Timing Example

Here is an analyzed example that generates signals tied to real-world constraints. The example used is the generation of signals for a real time clock. The signals required are for microseconds, seconds, minutes and hours. The hardware generated may eventually be driven from an external clock. In order to write the program, the rate of this clock may be known so a value of 5 MHz is assumed. The Handel-C program is shown below.

The loop body takes one clock cycle to execute. The Count variable is used to divide the clock by 5 to generate microsecond increments. As each variable wraps round to zero, the next time step up is incremented.

```
void main(void)
{
unsigned 20 Microseconds;
unsigned 6 Seconds;
unsigned 6 Minutes;.
unsigned 16 Hours;
unsigned 3 Count;
par
{
Count = 0;
MicroSeconds = 0;
Seconds = 0;
Minutes = 0;
Hours = 0;
}
while (1)
{
if (Count!=4)
Count++;
else
par
{
Count = 0;
if (MicroSeconds!=999999)
Microseconds++;
else
par
{
MicroSeconds = 0;
if (Seconds!=59)
Seconds++;
else
par
{
Seconds = 0;
if (Minutes!=59)
Minutes++;
else
par
{
Minutes = 0;
Hours++;
}
}
}
}
}
}
```

Time Efficiency of Handel-C Hardware

Handel-C requires that the clock period for a program is longer than the longest path through combinatorial logic in the whole program. This means that, for example, once FPGA place and route has been completed, the maximum clock rate for the system can be calculated from the reciprocal of the longest path delay in the circuit. For example, suppose the FPGA place and route tools calculate that the longest path delay between flip-flops in a design is 70ns. The maximum clock rate that that circuit should be run at is then 1/70 ns = 14.3 MHz. But what if this calculated rate is not fast enough for the system performance or real time constraints? This section deals with optimizations that can be made to the program to reduce the longest path delay and increase the maximum possible clock rate.

Reducing Logic Depth

When designing Handel-C programs, it is important to remember which operations combine to produce deep logic.

Deep logic results in long path delays in the final circuit so reducing logic depth should help to increase clock speed. Some guidelines will now be given for reducing logic depth.

1. Division and modulus operators produce the deepest logic. Multiplication also produces deep logic. A single cycle divide, mod or multiplier produces a large amount of hardware and long delays through deep logic so one should avoid using them wherever possible.

2. Most common division and multiplications can be done with the shift operators. Also consider using a long multiplication with a loop, shift and add routine or a pipelined multiplier.

3. Most common modulus operations can be done with the AND operator.

4. Wide adders require deep logic for the carry ripple. Consider using more clock cycles with shorter adders. For example, to reduce a single, 8-bit wide adder to 3, narrower adders:

```
unsigned 8 x;
unsigned 8 y;
unsigned 5 temp1;
unsigned 4 temp2;
par
{
temp1 = (0 @(x<-4)) + (0@(y<-4));
temp2 = (x \\ 4) + (y \\ 4);
}
x = (temp2+(0@temp 1 [4])) @ temp 1 [3:0];
```

5. Avoid greater than and less than comparisons—they produce deep logic. For example:

```
while (x<y)
{
...
x++;
}
``` can be replaced with:

```
while (x!=y)
{
...
x++;
}
```

The == and != comparisons produce much shallower logic although in some cases it is possible to remove the comparison altogether. Consider the following code:

```
unsigned 8 x;
x = 0;
do
{
...
x = x + 1;
} while (x != 0);
```

This code iterates the loop body 256 times but it can be re-written as follows:

```
unsigned 9 x;
x = 0;
do
{
...
x = x + 1;
} while (!x[8]);
```

By widening x by a single bit and just checking the top bit, one may remove an 8-bit comparison.

6. Reduce complex expressions into a number of stages. For example:

```
x = a + b + c + d + e + f + g + h;
``` reduces to:

```
par
{
temp1 = a + b;
temp2 = c + d;
temp3 = e + f
temp4 = g + h;
}
par
{
temp1 = temp1 + temp2;
temp3 = temp3 + temp4;
}
x = temp1 + temp3;
```

This code takes three clocks cycles as opposed to one but each clock cycle is much shorter and so the rest of the circuit should be speeded up by the faster clock rate permitted.

7. Avoid long strings of empty statements. Empty statements result from, for example, missing else conditions from if statements. For example:

```
if (a>b)
x++;
if (b>c)
x++;
if (c>d)
x++;
if (d>e)
x++;
if (e>f)
x++;
```

If none of these conditions is met then all the comparisons may be made in one clock cycle. By filling in the else statements with delays, the long path through all these if statements can be split at the expense of having each if statement take one clock cycle whether the condition is true or not.

Pipelining

A classic way to increase clock rates in hardware is to pipeline. A pipelined circuit takes more than one clock cycle to calculate any result but can produce one result every clock cycle. The trade off is an increased latency for a higher throughput so pipelining is only effective if there is a large quantity of data to be processed—it is not practical for single calculations. An example of a pipelined multiplier is given below.

```
unsigned 8 sum[8];
unsigned 8 a[8];
unsigned 8 b[8];
chanin inputa;
chanin inputb;
chanout output;
par
{
while(1)
inputa ? a[0];
while(1)
```

```
inputb ? b[0];
while(1)
output ! sum[7];
while(1)
{
par
{
macro proc level(x)
par
{
sum[x] = sum[x - 1] +
((a[x][0] == 0) ? 0: b[x]);
a[x] = a[x -1] >> 1;
b[x] = b[x -1] << 1;
}
sum[0] ((a[0][0] == 0) ? 0 b[0]);
level(1);
level(2);
level(3);
level(4);
level(5);
level(6);
level(7);
}
}
}
```

This multiplier calculates the 8 LSBs of the result of an 8-bit by 8-bit multiply using long multiplication. The multiplier produces one result per clock cycle with a latency of 8 clock cycles. This means that although any one result takes 8 clock cycles, one gets a throughput of 1 multiply per clock cycle. Since each pipeline stage is very simple, combinatorial logic is shallow and a much higher clock rate is achieved than would be possible with a complete single cycle multiplier. At each clock cycle, partial results pass through each stage of the multiplier in the sum array. Each stage adds on 2 n multiplied by the b operand if required. The LSB of the a operand at each stage tells the multiply stage whether to add this value or not. Stages are generated with a macro procedure to avoid tedious repetition of code.

Operands are fed in on every clock cycle through a[0] and b[0]. Results appear 8 clock cycles later on every clock cycle through sum[7]. . . 11 Targeting hardware.

Introduction

The previous sections have covered most aspects of writing Handel-C programs. What has not yet been discussed is how to get data into and out of those programs. A major advantage of the custom hardware that can be produced with Handel-C is its ability to interface directly with external components such as RAM, custom and non-custom buses. This section of the present description deals with getting data into and out from the Handel-C program. It begins with a discussion of using the simulator provided with the Handel-C compiler to ensure that the program is correct and then describes interfacing with real hardware devices connected to the pins of the chip containing the hardware. The simulator executes Handel-C programs on the compiling machine without any additional hardware. It allows output to the screen or a file and input from the keyboard or a file. It is a powerful tool that allows programs to be tested thoroughly before custom hardware is manufactured. While no specific hardware platform is detailed here, a number of examples are given of interfacing to theoretical hardware.

Interfacing with the Simulator

This section of the present description covers how the program communicates with the simulator. This enables one to debug with real data. Code examples are set forth herein. Communication with the simulator takes place over channels. They are declared using the keywords chanin and chanout. It is assumed that simulation channels never block and may always complete a transfer in one clock cycle.

Simulator channels are declared using chanin and chanout instead of chan

Transfers over Channels

The special channels chanin and chanout may be defined for inputting information from the simulator and outputting information back to the simulator. These channels are normally connected to files, although an unconnected channel that outputs data to the simulator may be displayed in the debug window. For example:

chanin unsigned Input with {infile = "../Data/source.dat"};

chanout unsigned Output;

input ? x;

output ! y;

This example declares two channels: one for input from the simulator and one for output to the simulator. The input channel connects to a file managed by the simulator; the output channel connects to the simulator's standard output (the debug window in the Handel-C GUI). Standard channel communication statements can then be used to transfer data. One can declare multiple channels for input and output. For example:

chanin int 8 input_1 with

{infile = "../Data/source_1.dat"};

chanin int 16 input_2 with

{infile = "../Data/source_2.dat"};

chanout unsigned 3 output_1;

chanout char output_2;

input_1 ? a;

input_2 ? b;

output_1 ! (unsigned 3)(((0 @ a) + b) <- 3);

output_2 ! a;

When simulated, such a program displays the name of channels before outputting their value on the simulating computer screen.

Simulator Input File Format

The data input file should have one number per line separated by newline characters (either DOS or Unix format text files may be used). Each number may be in any format normally used for constants by Handel-C. For example:

56

0x34

0654

0b001001

Block Data Transfers

The Handel-C simulator has the ability to read data from a file and write results to another file. For example:

chanin int 16 input with {infile = "in.dat"};

chanout int 16 output with {outfile = "out.dat"};

void main (void)

{ while (1)

{

```
int value;
input ? value;
output ! value+1;
}
}
```
This program reads data from the file in.dat and writes its results to the file out.dat. If the in.dat file consists of:
```
56
0x34
0654
0b001001
```
the out.dat may contain the decimal results as follows:
```
57
53
429
10
```
This feature allows algorithms to be debugged and tested without needing to build actual hardware. For example, an image processing application may store a source image in a file and place its results in a second file. All that need be done outside the Handel-C compiler is a conversion from the image (e.g. JPEG file) into the text file taken by the simulator and a conversion back from the output file to an image format. The results can then be viewed and the correct operation of the Handel-C program confirmed.

Targeting FPGA Devices

The Handel-C language is designed to target real hardware devices. One may supply some important pieces of information to the compiler to allow it to do this. These are: the FPGA family and part that the design may be implemented in .the location of a clock source The FPGA part details are supplied through the Project>Settings dialog in the GUI (Graphical User Interface). They can also be supplied to the command line compiler using the set statement. Ultimately, this information is passed to the FPGA place and route tool to inform it of the device it should target. The clock source is specified using the 'set' command.

Locating the Clock

Since each Handel-C main( ) code block generates synchronous hardware, a single clock source is required for each one. The clock is normally provided on one of the external pins of the FPGA but may also be generated internally on Xilinx 4000 devices. The general syntax of the clock specification is:
set clock = Location;

FIG. 60 illustrates a table 6000 showing the various locations, in accordance with one embodiment of the present invention.

Examples of clocks taken from external device pins are:
set clock = external "P35";
set clock = external_divide "P35" 3;
set clock = external divide 3;.

The first of these examples specifies a clock taken from pin P35. The second of these examples specifies a clock taken from pin P35 which is divided on the FPGA by a factor of 3. The third option shows a clock divided by 3 with no pin number specified. When the pin number is omitted, the place and route tools may choose an appropriate pin. Omitting pin specifications can speed up the design. Examples of clocks taken from the Xilinx 4000 series internal clock generator are:
set clock = internal "F8M";
set clock = internal_divide "F8M" 3;

Currently, the frequency of the internal clock may take one of the following values:

| Specification | String Frequency |
|---|---|
| "F15" | 15 Hz |
| "F490" | 490 Hz |
| "F16K" | 16 kHz |
| "F500K" | 500 kHz |
| "F8M" | 8 MHz |

Note that the tolerance for these values is −50% to +25% so one should not rely on the internal clock being at exactly these frequencies. Internal clocks are only supported on Xilinx 4000 series parts. The clock division specified with the internal_divide and external_divide keywords may be a constant integer.

Targeting Specific Devices Via the Command Line

If one is not using the GUI to specify the target device, he or she may insert lines in the code to specify it. In order to target a specific FPGA, the compiler may be supplied with the FPGA part number. Ultimately, this information is passed to the FPGA place and route tool to inform it of the device it should target. Targeting devices is in two parts: specifying the target family and the target device. The general syntax is:
set family = Family;
set part = Chip Number;

FIG. 61 illustrates the various family names 6100, in accordance with one embodiment of the present invention.

The part string is the complete Xilinx or Altera device string. For example:
set family = Xilinx4000E;
set part = "4010EPC84-1";

This instructs the compiler to target a XC4010E device in a PLCC84 package. It also specifies that the device is a −1 speed grade. This last piece of information is required for the timing analysis of the design by the Xilinx tools.

The family is used to inform the compiler of which special blocks it may generate.

To target Altera Flex 10K devices:
set family = Altera10K;
set part = "EPF10K20RC240-3";

This instructs the compiler to target an Altera Flex 10K20 device in a RC240 package. It also specifies that the device is a −3 speed grade. This last piece of information is required for the timing analysis of the design by the Altera Max Plus II or Quartus tools. Note that when performing place and route on the resulting design, the device and package may also be selected via the menus in the Max Plus II software.

Use of RAMs and ROMs with Handel-C

Handel-C provides support for interfacing to on-chip and off-chip RAMs and ROMs using the ram and rom keywords. One can specify RAMs and ROMs external to the Handel-C code by using the ports specification keyword. One can control the timing for read/write cycles by using specification keywords that define the relationship between the RAM strobe and the Handel-C clock.

The usual technique for specifying timing in synchronous and asynchronous RAM is to have a fast external clock which is divided down to provide the Handel-C clock and used directly to provide the pulses to the RAM Asynchronous RAMs There are three techniques for timing asynchronous RAMs, depending on the clock available
1. Fast external clock. Use the Handel-C westart and welength specifications to position the write strobe
2. External clock at the same speed as the Handel-C clock. Use multiple reads to give the RAM enough time to respond.

Figure 62:
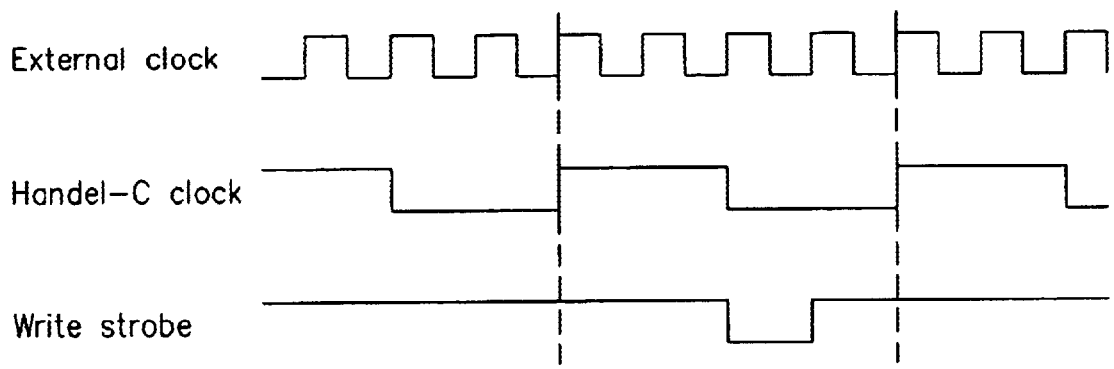
FIG. 62 illustrates a timing diagram showing a signal, in accordance with one embodiment of the present invention.

3. Use the wegate specification to position the write enable signal within the Handel-C clock Fast External Clock If the external clock is faster than the internal clock (i.e. the location of the clock is internal_divide or external_divide with a division factor greater than 1) then Handel-C can generate a write strobe for the RAM which is positioned within the Handel-C clock cycle. This is done with the westart and welength specifications. For example:

set clock external_divide "P78" 4;

ram unsigned 6 x[34] with { westart = 2, welength = 1};

The write strobe can be positioned relative to the Handel-C clock cycle by half cycle lengths of the external (undivided) clock. The above example starts the pulse 2 whole external clock cycles into the Handel-C clock cycle and gives it a duration of 1 external clock cycle. Since the external clock is divided by a factor of 4, this is equivalent to a strobe that starts half way through the internal clock cycle and has a duration of one quarter of the internal clock cycle. FIG. 62 illustrates a timing diagram showing a signal 6200, in accordance with one embodiment of the present invention.

Timing Diagram: Positioned Write Strobe

This timing allows half a clock cycle for the RAM setup time on the address and data lines and one quarter of a clock cycle for the RAM hold times. This is the recommended way to access asynchronous RAMs.

Same Rate External Clock

This method uses multiple Handel-C RAM accesses to meet the setup and hold times of the RAM.

ram unsigned 6 x[34];

Dummy = x[3];

x[3] = Data;

Dummy = x[3];

This code holds the address constant around the RAM write cycle, enabling a write to an asynchronous RAM.

Undivided External Clock

The third method of accessing asynchronous RAMs is a compromise between the two previous methods. wegate is used with an undivided external clock and keeps the write strobe in the first or second half of the clock cycle. It is still necessary to hold the address constant either in the clock cycle before or in the clock cycle after the access. For example:

ram unsigned 6 x[34] with { wegate = 1 };

x[3] = Data;

Dummy = x[3];

This places the write strobe in the second half of the clock cycle (use a value of −1 to put it in the first half) and holds the address for the clock cycle after the write. The RAM therefore has half a clock cycle of setup time and one clock cycle of hold time on its address lines.

Synchronous RAMs

Handel-C timing semantics require that any assignment takes one clock cycle. SSRAMs have a latency of at least one clock cycle. To enable the SSRAM timings to fit with the Handel-C timing constraints, Handel-C uses an independent fast clock (RAMCLK). The generation of this clock requires the use of a fast external clock (CLK), divided to provide the Handel-C clock (HCLK).

The fast clock's pulses can then be placed to clock the SSRAM within a single Handel-C clock tick. The RAMCLK can be carried to an external SSRAM using the clk specification.

Handel-C supports ZBT-compatible (Zero Bus Turnaround) flow-through and pipelined output devices. DDR (double data rate) and QDR (quad data rate) devices are not supported.

The Handel-C compiler checks the block specification to find out what type of RAM is being built and generates the appropriate write-enable signal (e.g. active low for ZBT SSRAM devices and active-high for block RAMs within Xilinx Virtex chips).

SSRAM Read and Write Cycles

Most inputs to SSRAMs are captured on the rising edge of the input clock. During a read cycle there is a latency of at least one clock cycle between an address being captured at the input and data becoming available at the output. This is also true for the write cycle in many devices: an address is captured on one clock cycle, and data on the next.

Figure 63:
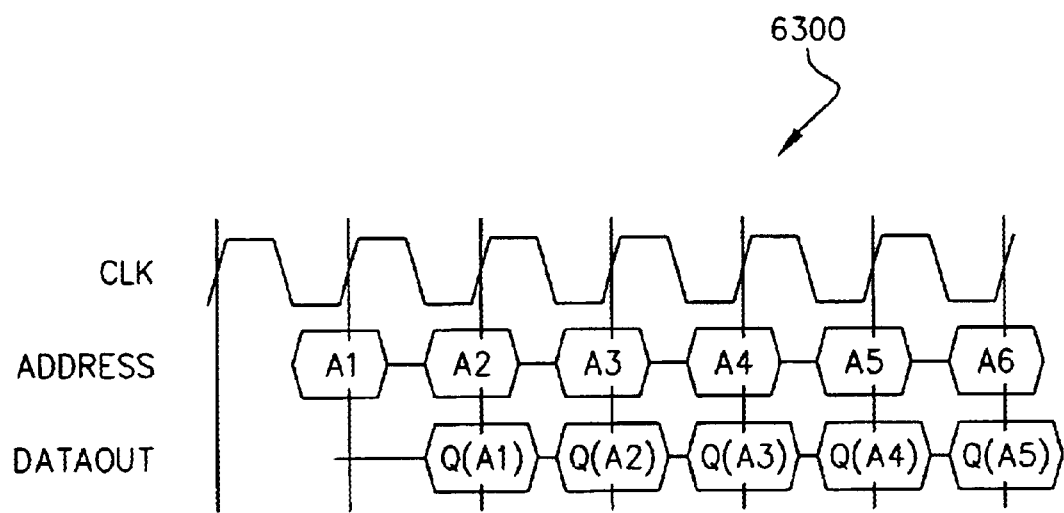
FIG. 63 illustrates a timing diagram showing a SSRAM read and write, in accordance with one embodiment of the present invention.

FIG. 63 illustrates a timing diagram showing a SSRAM read and write 6300, in accordance with one embodiment of the present invention.

Specifying the Timing

One can place the RAM clock pulses at different points within the Handel-C clock in the same way that write-enable strobes can be specified for asynchronous RAM devices. The SSRAM clock (RAMCLK) is generated from the fast clock (CLK) according to the Handel-C specifications: rclkpos, wclkpos and clkpulselen. These specifications can be in whole or half cycles of the external clock.

rclkpos specifies the positions of the clock cycles of clock RAMCLK for a read cycle. These positions are specified in terms of cycles and half-cycles of CLK, counting forwards from a HCLK rising edge.

wclkpos specifies the positions of the clock cycles of RAMCLK for a write cycle. These are also counted forward from an HCLK rising edge.

clkpulselen specifies the length of the RAMCLK pulses in CLK cycles. This is specified once per RAM. It applies to both the read and write clocks.

Timing Diagram: SSRAM Read Cycle Using Generated RAMCLK

Figure 64:
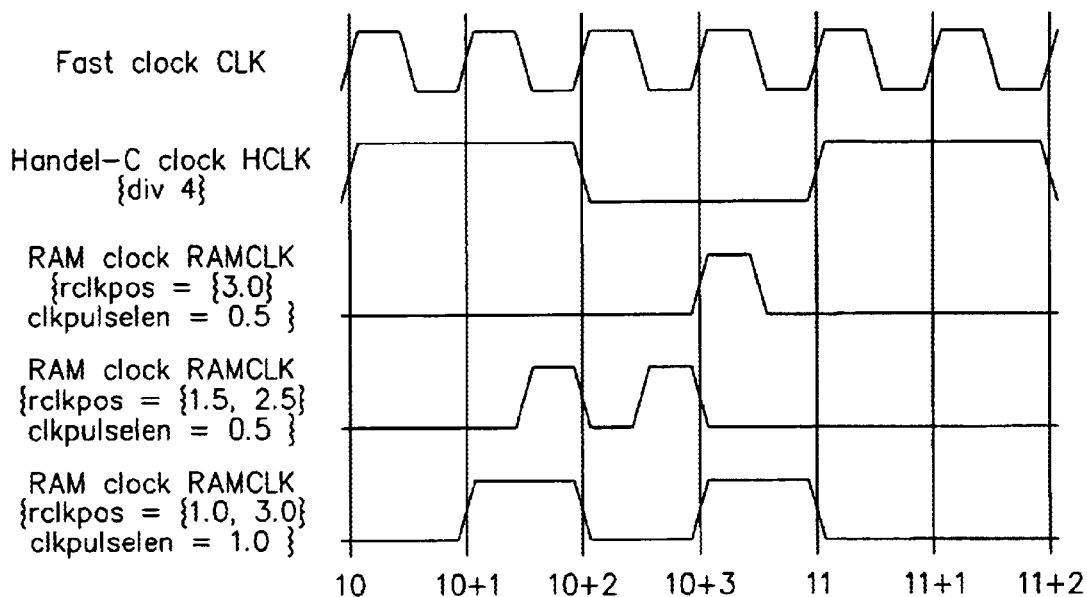
FIG. 64 illustrates a timing diagram showing a SSRAM read cycle using generated RAMCLK, in accordance with one embodiment of the present invention.

FIG. 64 illustrates a timing diagram showing a SSRAM read cycle using generated RAMCLK 6400, in accordance with one embodiment of the present invention. The pulse positions and lengths are specified in cycles and half-cycles of CLK. The westart and welength specs are used to place the write enable strobe where it is required.

EXAMPLES

Flow-through SSRAM

Figure 65:
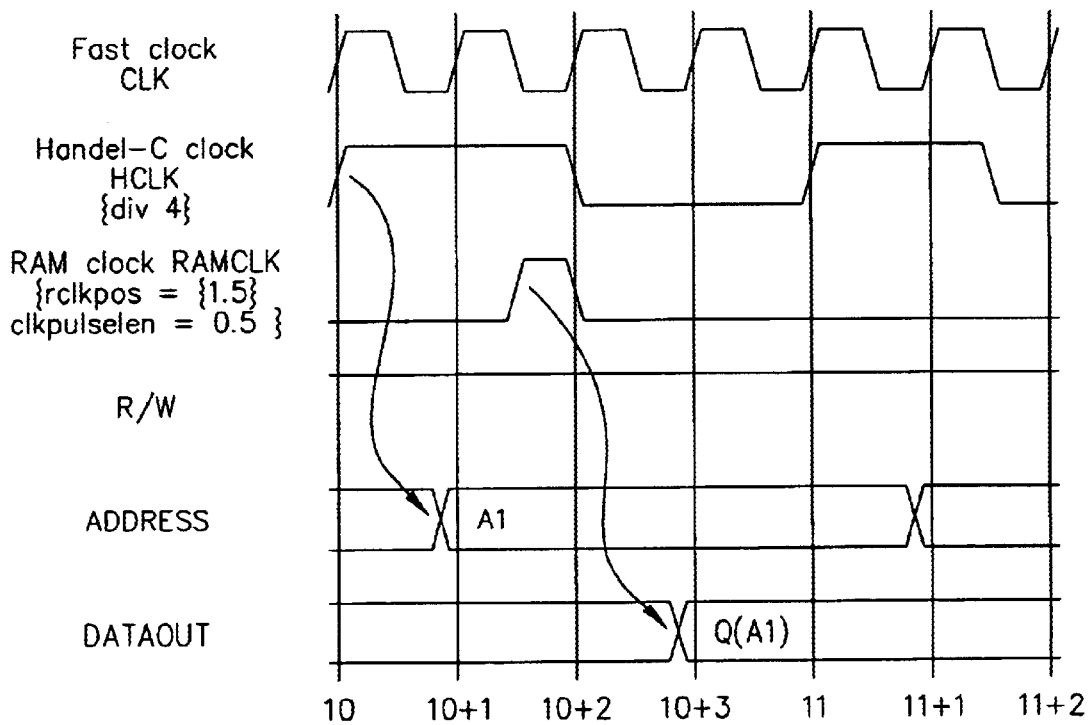
FIG. 65 illustrates a timing diagram showing read-cycle from a flow-through SSRAM within a Handel-C design, in accordance with one embodiment of the present invention.

This example code generates the hardware shown below. It is also applicable for reading from block RAMs in Xilinx and Altera FPGAs.

ram unsigned 18 FlowBank[ 1024] with {block = 1, westart = 2, welength = 1, rclkpos = {1.5}, wclkpos = {2.5, 3.5}, clkpulselen = 0.5};

FIG. 65 illustrates a timing diagram showing read-cycle from a flow-through SSRAM within a Handel-C design 6500, in accordance with one embodiment of the present invention.

The rising HCLK edge at t0 initiates the read cycle. Some time later, the address A1 is set up, which is sampled somewhere in the middle of the HCLK cycle: t0+1.5 in this case. By the time the next HCLK rising edge occurs at t1, the data is available for reading. The cycle completes within one Handel-C clock cycle.

Write Cycle for a Flow-through SSRAM

Figure 66:
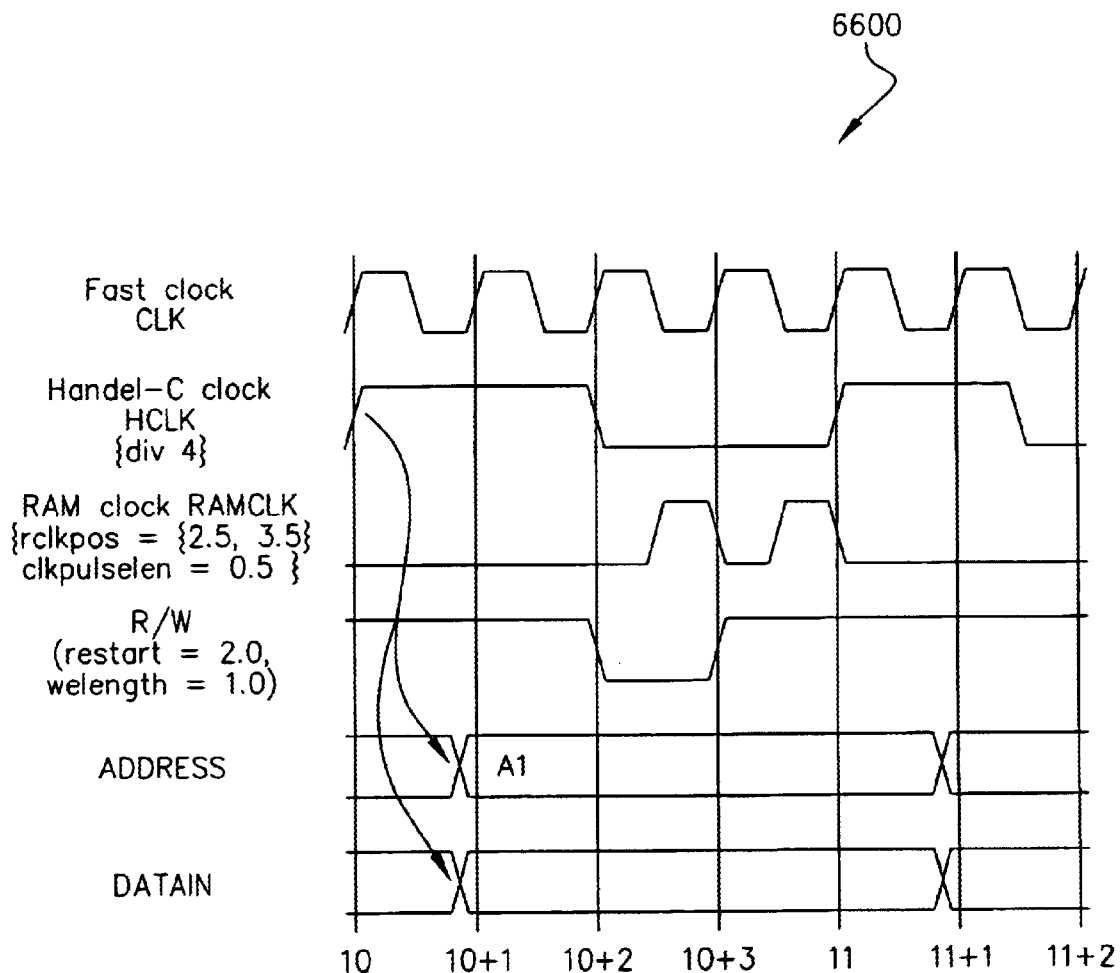
FIG. 66 illustrates a timing diagram showing complete write cycle, in accordance with one embodiment of the present invention.

Flow-through SSRAMs perform a "late" write cycle; the data is clocked in one clock cycle after the address is sampled. FIG. 66 illustrates a timing diagram showing complete write cycle 6600, in accordance with one embodiment of the present invention.

The HCLK rising edge at t0 initiates the write cycle, causing the ADDRESS and DATAIN signals to change. Two cycles of RAMCLK are needed to clock the new data into the RAM at the specified address: the first to sample the address, the second to sample the data. However, since it is not expected to read from the RAM's output, one can wait until the last possible moment. In this case, the two rising edges of RAMCLK occur at t0+2.5 and t0+3.5.

The write enable signal may be low during the rising edge of RAMCLK that samples the address, but not during the one that samples the data. This can be done by setting westart and welength as shown. The entire cycle completes within a single Handel-C clock cycle.

Pipelined-output SSRAM

Figure 67:
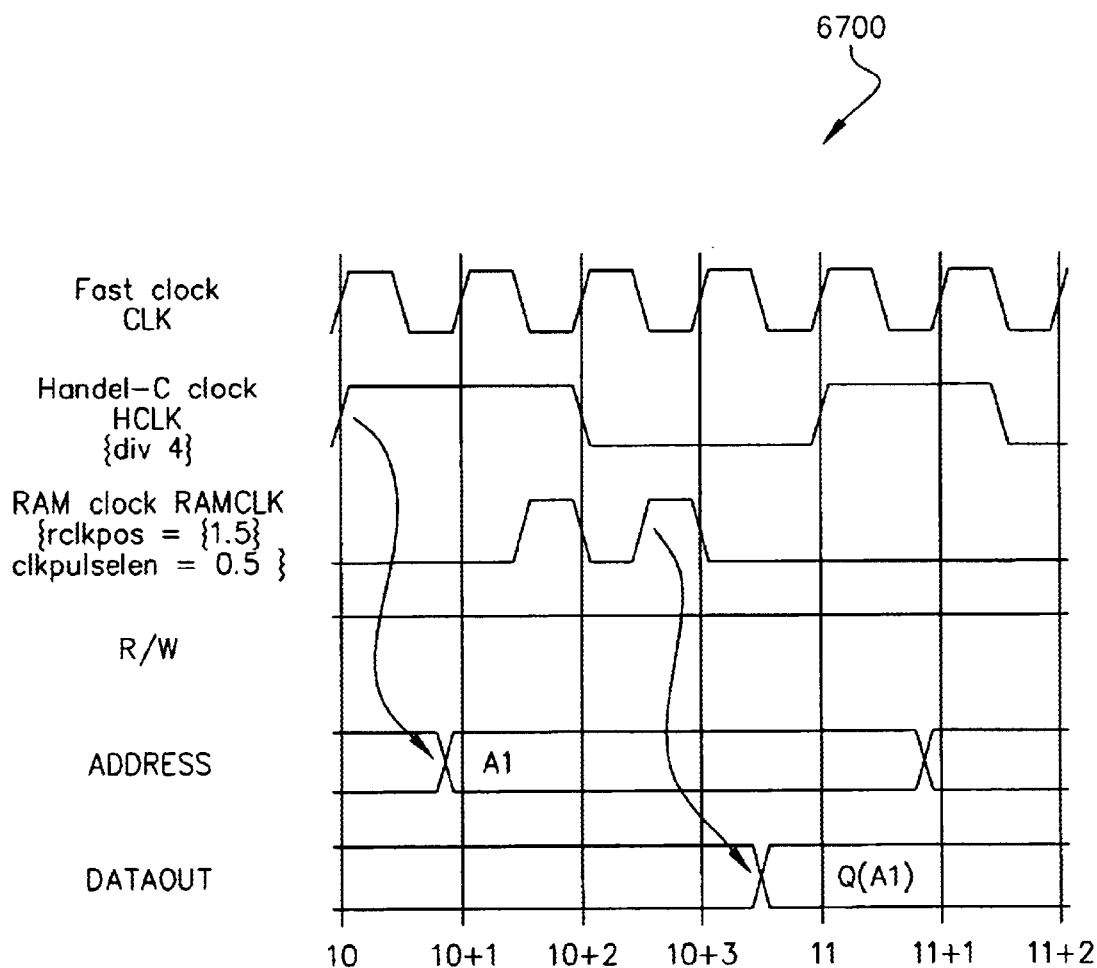
FIG. 67 illustrates a timing diagram showing complete read cycle, in accordance with one embodiment of the present invention.

This example code generates the hardware shown below
ram unsigned 18 PipeBank[1024] with {block 1,
westart = 1.5,
welength = 1,
rclkpos = {1.5, 2.5},
wclkpos = {2, 3, 4},
clkpulselen = 0.5;

FIG. 67 illustrates a timing diagram showing complete read cycle 6700, in accordance with one embodiment of the present invention. This read cycle is very similar to that for a flow through RAM. The rising HCLK edge at t0 initiates the read cycle. Some time later, the address A1 is set up, which is sampled somewhere near the middle of the HCLK cycle: (t0+1.5 in this case). The RAM contents at address A1 are then piped to the RAM's output register; it may be made available at the RAM output. A second RAMCLK pulse (at t0+2.5 in this case) is used to do this. By the time the next HCLK rising edge occurs at t1, the data is available for reading by the Handel-C design. The cycle completes within one Handel-C clock cycle.

Write Cycle for a Pipelined-output SSRAM

Figure 68:
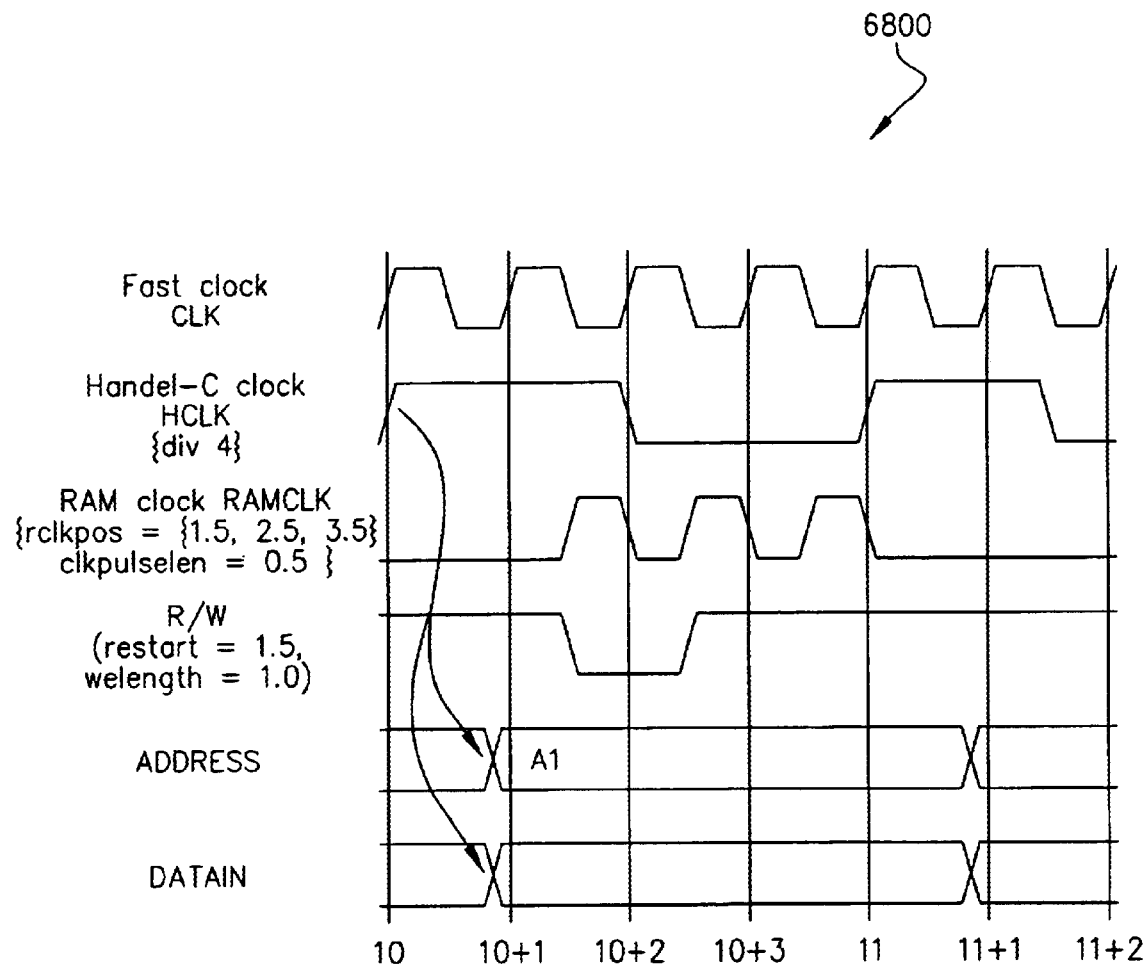
FIG. 68 illustrates a timing diagram showing complete cycle, in accordance with one embodiment of the present invention.

Pipelined-output SSRAMs perform a "late-late" write cycle. This means that data is written to memory two clock cycles after the address is sampled. FIG. 68 illustrates a timing diagram showing complete cycle 6800, in accordance with one embodiment of the present invention. The HCLK rising edge at t0 initiates the write cycle, causing the ADDRESS and DATAIN signals to change. Three cycles of RAMCLK are needed to clock the new data into the RAM at the specified address: the first to sample the address and the third to sample the data. Since one may not read from the RAM on a write strobe, he or she can sample the data as late as possible to give the circuit maximum time to set up the data. In this case, the three rising edges of RAMCLK occur at t0+2.0, t0+3.0 and t0+4.0. The write enable signal may be low during the rising edge of RAMCLK that samples the address, but not during the one that samples the data. This can be done by setting westart and welength as shown. The entire cycle completes within a single Handel-C clock cycle.

Using On-chip RAMs in Xilinx Devices

Xilinx 4000 series devices can implement RAMs and ROMs in the look up tables on the device. Handel-C supports the synchronous RAMs on the 4000E, 4000EX, 4000L, 4000XL, 4000XV and Virtex series parts directly simply by declaring a RAM or ROM in the way described earlier. For example:

ram unsigned 6 x[34];.

This may declare a RAM with 34 entries, each of which is 6 bits wide.

Using On-chip RAMs in Altera Devices

On-chip RAMs in Altera Flex10K devices use the EAB structures. These blocks can be configured in a number of data width/address width combinations. When writing Handel-C programs, one may be careful not to exceed the number of EAB blocks in the target device or the design may not place and route successfully. While it is possible to use RAMs that do not match one of the data width/address width combinations, EAB space may be wasted by such a RAM. As with Xilinx devices, the RAM blocks in Flex 10K parts can be configured to be either synchronous or asynchronous.

Synchronous Access

By default, Handel-C may use a synchronous access by utilizing the falling edge of the clock as the input clock signal to the RAM. This is the recommended method for using RAMs.

Asynchronous Access

If one uses one of the westart, welength or wegate specifications described in the previous section, the Handel-C compiler may generate an asynchronous RAM. This may help with the timing characteristics of the design.

Initialisation

RAM/ROM initialisation files with a .mif extension may be generated on compilation to feed into the Max Plus II software. This process is transparent as long as they are in the same directory as the EDIF (.edf extension) file generated by the Handel-C compiler.

Using External RAMs

Asynchronous RAMs

Handel-C provides support for accessing off-chip static RAMs in the same way as one access internal RAMs. The syntax for an external RAM declaration is:

ram Type Name[Size] with {
offchip = 1,
data = Pins,
addr = Pins,
we = Pins,
oe = Pins,
cs = Pins};

For example, to declare a 16Kbyte by 8-bit RAM:
ram unsigned 8 ExtRAM[16384] with {
offchip = 1,
data = {"P1", "P2", "P3", "P4",
"P5", "P6", "P7", "P8"},
addr = {"P9", "P10", "P11", "P12",
"P13", "P14", "P15", "P16",
"P17", "P18", "P19", "P20",
"P21", "P22"},
we = {"P23"},
oe = {"P24"},
cs = {"P25"};

Note that the lists of address and data pins are in the order of most significant to least significant. It is possible for the compiler to infer the width of the RAM (8 bits in this example) and the number of address lines used (14 in this example) from the RAM's usage. However, this is not recommended since this declaration deals with real external hardware which has a fixed definition. Accessing the RAM is the same as for accessing internal RAM. For example:

ExtRAM[1234] = 23;
y = ExtRAM[5678];

Similar restrictions apply as with internal RAM—only one access may be made to the RAM in any one clock cycle.

Figure 69:
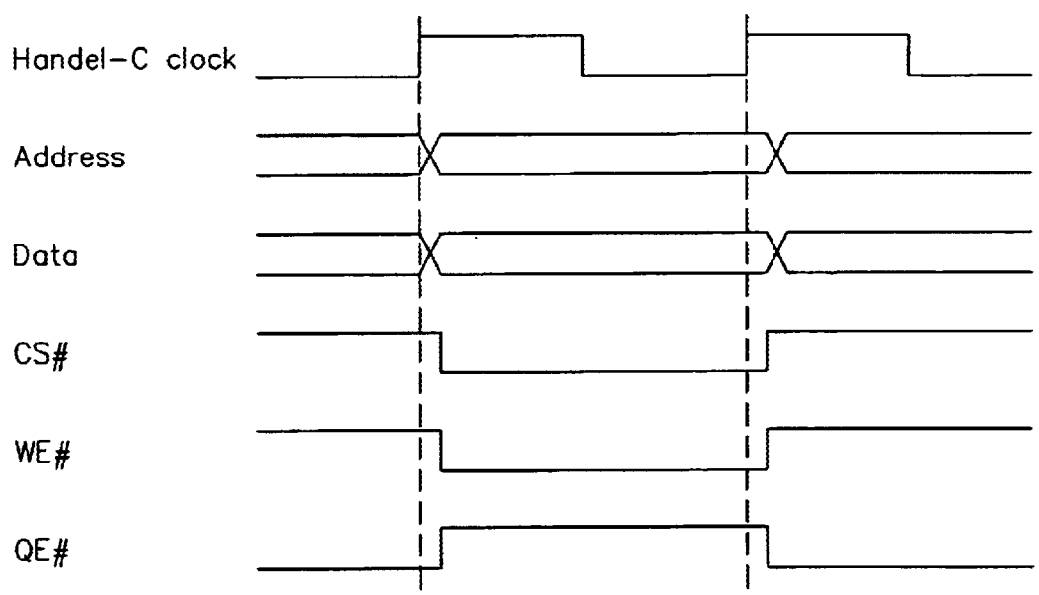
FIG. 69 illustrates a timing diagram showing a cycle for a write to external RAM, in accordance with one embodiment of the present invention.
Figure 70:
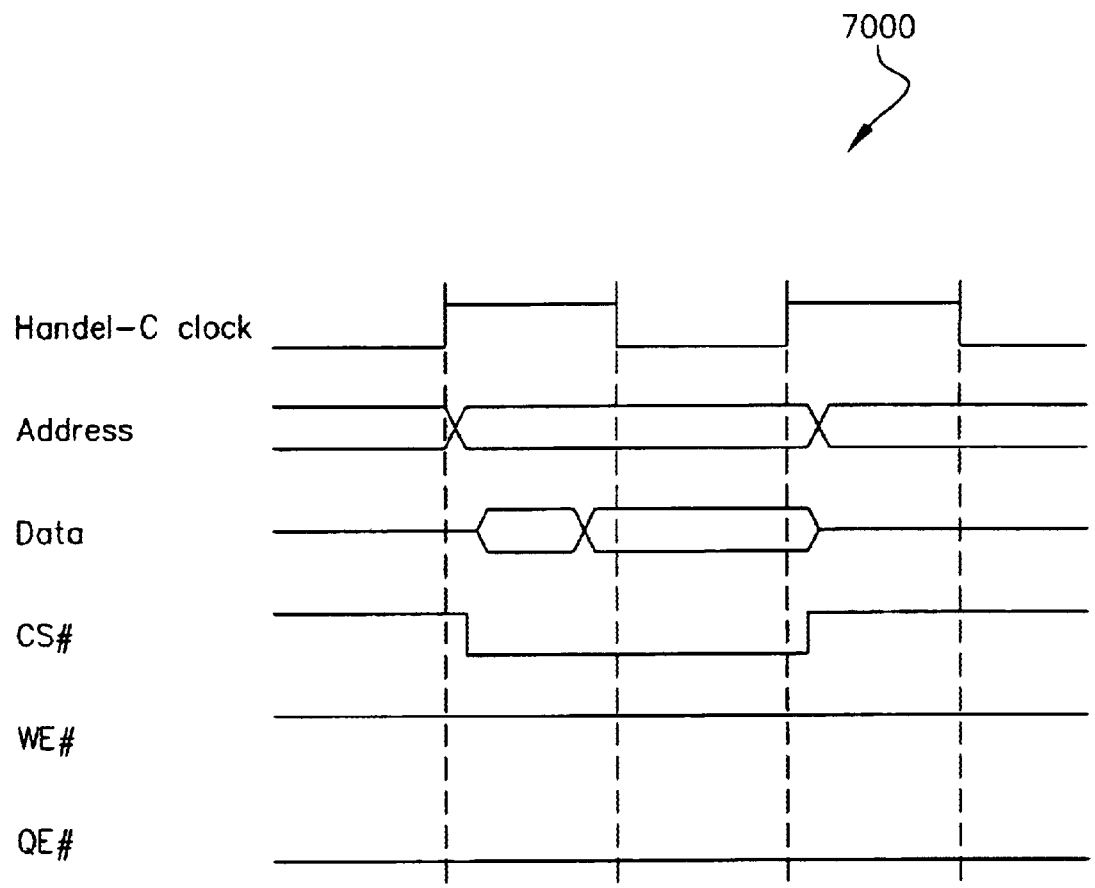
FIG. 70 illustrates a timing diagram showing a cycle for a read from external RAM, in accordance with one embodiment of the present invention.

The compiled hardware generates the following cycle for a write to external RAM. FIG. 69 illustrates a timing diagram showing a cycle for a write to external RAM 6900, in accordance with one embodiment of the present invention. FIG. 70 illustrates a timing diagram showing a cycle for a read from external RAM 7000, in accordance with one embodiment of the present invention.

This cycle may not be suitable for the RAM device in use. In particular, asynchronous static RAM may not work with the above cycle due to setup and hold timing violations. For this reason, the westart, welength and wegate specifications may also be used with external RAM declarations.

Fast External Clock Example

Figure 71:
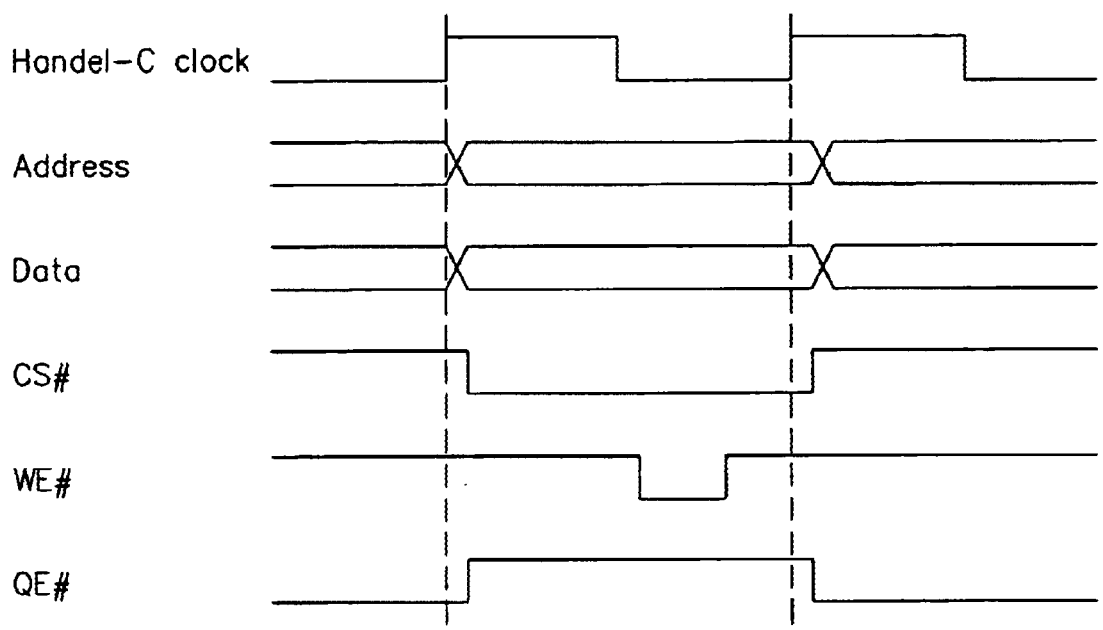
FIG. 71 illustrates a timing diagram showing a cycle for a write to external RAM, in accordance with one embodiment of the present invention.
Figure 72:
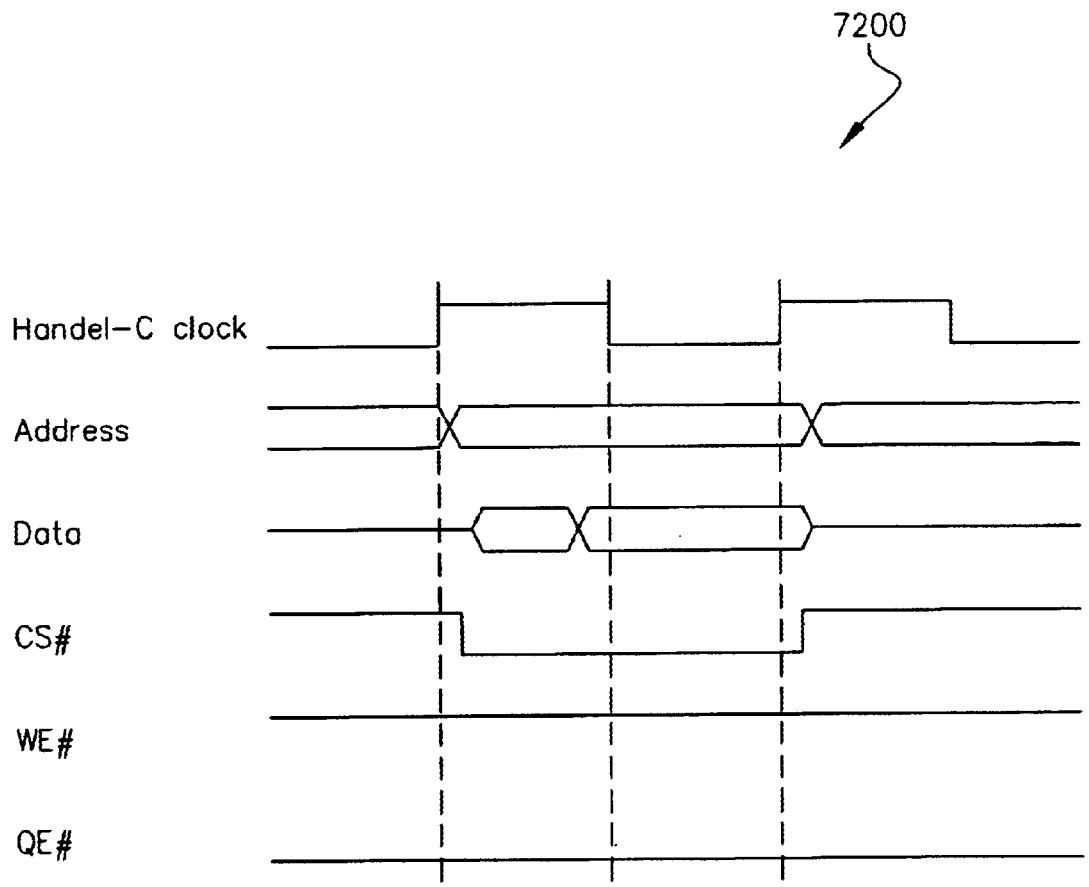
FIG. 72 illustrates a timing diagram showing a cycle for a read from external RAM, in accordance with one embodiment of the present invention.

For example, to declare a 1 6Kbyte by 8-bit RAM:
set clock = external_divide "P99" 4;
ram unsigned 8 ExtRAM[16384] with {
offchip = 1,
westart = 2,
welength = 1,
data = {"P1", "P2", "P3", "P4",
"P5", "P6", "P7", "P8"},
addr = {"P9", "P10", "P11", "P12",
"P13", "P14", "P15", "P16",
"P17", "P18", "P19", "P20",
"P21", "P22"},
we = {"P23"},
oe = {"P24"},
cs = {"P25"56 };

FIG. 71 illustrates a timing diagram showing a cycle for a write to external RAM 7100, in accordance with one embodiment of the present invention. FIG. 72 illustrates a timing diagram showing a cycle for a read from external RAM 7200, in accordance with one embodiment of the present invention.

The compiled hardware generates the following cycle for a write to external RAM.

The compiled hardware generates the following cycle for a read from external RAM:

Accessing the RAM is the same as for accessing internal RAM. For example:
ExtRAM[1234] = 23;
y = ExtRAM[5678];

Similar restrictions apply as with internal RAM—only one access may be made to the RAM in any one clock cycle.

wegate Example wegate specification may be used when a multiplied clock is not available.

Figure 73:
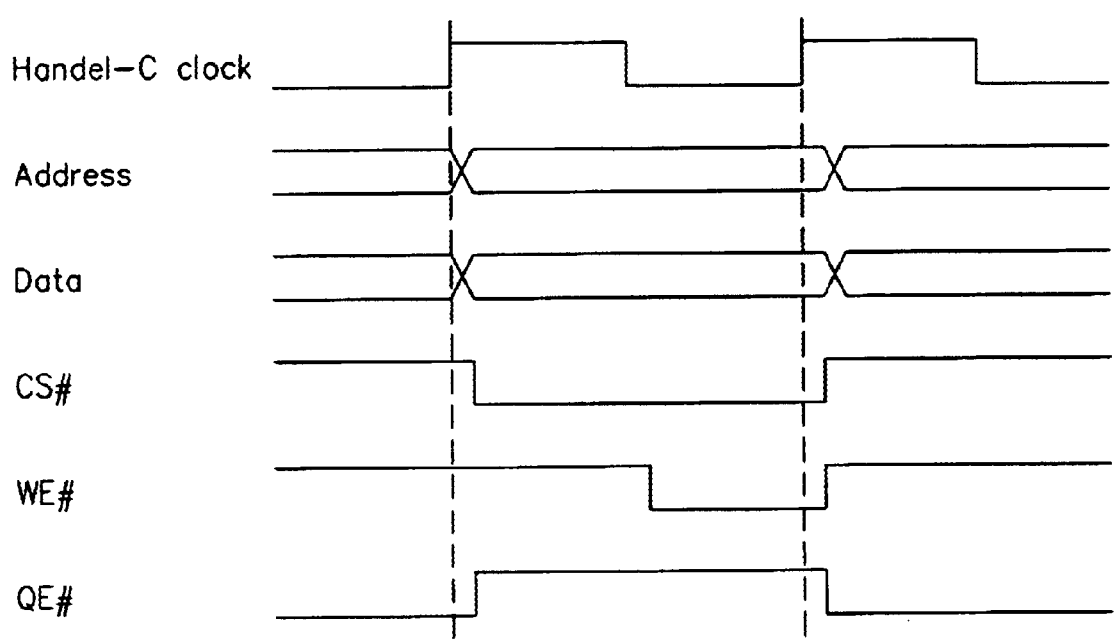
FIG. 73 illustrates a timing diagram showing a cycle for a write to external RAM, in accordance with one embodiment of the present invention.
Figure 74:
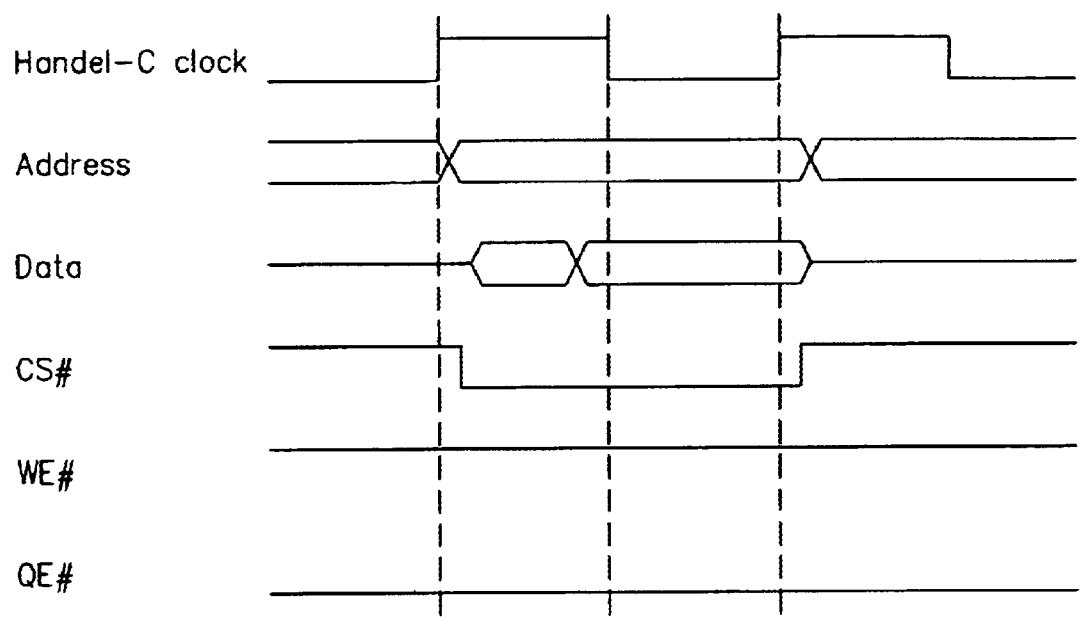
FIG. 74 illustrates a timing diagram showing a cycle for a read from external RAM, in accordance with one embodiment of the present invention.

For example, to declare a 16Kbyte by 8-bit RAM:
ram unsigned 8 ExtRAM[16384] with {
offchip = 1,
welength = 1,
data = {"P1", "P2", "P3", "P4",
"P5", "P6", "P7", "P8"},
addr = {"P9", "P10", "P11", "P12",
"P13", "P14", "P15", "P16",
"P17", "P18", "P19", "P20",
"P21", "P22"},
we = {"P23"},
oe = {"P24"},
cs = {"P25"56 };

FIG. 73 illustrates a timing diagram showing a cycle for a write to external RAM 7300, in accordance with one embodiment of the present invention. FIG. 74 illustrates a timing diagram showing a cycle for a read from external RAM 7500, in accordance with one embodiment of the present invention.

Accessing the RAM is the same as for accessing internal RAM. For example:
ExtRAM[3] = Data;
Dummy = ExtRAM[3];

Similar restrictions apply as with internal RAM—only one access may be made to the RAM in any one clock cycle. Note that the timing diagram above may violate the hold time for some asynchronous RAM devices. If the delay between rising clock edge and rising write enable is longer than the delay between rising clock edge and the change in data or address then corruption in the write may occur in these devices. The two cycle access does not solve this problem since it is not possible to hold the data lines constant beyond the end of the clock cycle. If this causes a problem then a multiplied external clock may be used as described above.

Using the wegate specification may violate the hold time for some asynchronous RAM devices.

Synchronous RAMs

Off-chip synchronous SRAMs can be specified in exactly the same way as on-chip synchronous SRAMs, with the addition of the clk specification. clk specifies the pin on which the generated RAMCLK may appear, when the SSRAM in question is external (offchip = 1).

EXAMPLE macro expr addresspins = {Pin List . . . };
macro expr datapins = {Pin List . . . };
macro expr csPins = {Pin List . . . };
macro expr wepins = {Pin List . . . };
macro expr oepins = {Pin List . . . };
macro expr clkpins = {Pin List . . . };
ram unsigned 32 ExtBank[1024] with {offchip = 1,
addr = addresspins,
data = datapins,
cs = csPins,
we = wepins,
oe = oepins,
westart = 2,
welength = 1,
rclkpos = {1.5, 2.5},
wclkpos = {1.5, 2.5, 3.5},
clkpulselen = 0.5,
clk = clkPins};

Using External ROMs

An external ROM is declared as an external RAM with an empty write enable pin list. For example:
ram unsigned 8 ExtRAM[16384] with {
offchip = 1,
data = {"P1", "P2", "P3", "P4",
"P5", "P6", "P7", "P8"},
addr = {"P9", "P10", "P11", "P12",
"P13", "P14", "P15", "P16",
"P17", "P18", "P19", "P20",
"P21", "P22"},
we = {}, oe = {"P24"},
cs = {"P25"56 };

Note that no westart, welength or wegate specification is required since there is not a write strobe signal on a ROM device.

Connecting to RAMs in Foreign Code

One can create ports to connect to a RAM by using the ports = 1 specification to the memory definition. This may generate VHDL or EDIF wires which can be connected to a component created elsewhere. The ports specification cannot be used in conjunction with the offchip=1 specification, but all other specifications may apply. The interface generated may have separate read (output) and write (data) ports, write enable, data enable and clock wires. This ensures that it can be connected to any device. Pin names provided in the addr, data, cs,we, oe, and clk specifications may be passed through to the generated EDIF. They are not passed through to VHDL, since VHDL interfaces are generated as n-bit wide buses rather than n 1-bit wide wires. This means that it is ambiguous to specify a separate identifier for each wire If they are used when compiling to VHDL, the compiler issues a warning.

A clock port may always be generated.

If one uses the ports specification with an MPRAM, a separate interface may be generated for each port.

EXAMPLES

Example 1: Generating an interface to a foreign code RAM.

```
// Pin name specifications have been commented out
set family = Xilinx4000XV;
set part = "V1000BG560-4";
set clock = external "C1";
macro expr dataPins = {"D1", "D2", "D3", "D4"};
macro expr addrPins = {"A1", "A2"};
macro expr wePins = { "WE1"};
macro expr csPins = {"CS1"};
macro expr oePins = {"OE 1"};
unsigned 4 a;
ram unsigned 4 rax[4] with {ports = 1/*, data = dataPins,
    addr = addrPins, we =
wePins, cs = csPins, oe = oePins*/};
void main(void)
{
static unsigned 2 i = 0;
while(1)
{
par
{
i++;
a++;
rax[i] = a;
a = rax[i];
}
}
}
```

The declaration of rax would produce wires rax__SPPort__addr<0>// Address
rax SPPort addr<1>
rax__SPPort__data__in<0>// Data In
rax__SPPort__data__in<1>
rax__SPPort__data__in<2>
rax__SPPort__data__in<3>
rax__SPPort__data__out<0>// Data Out
rax__SPPort__data__out<1>
rax__SPPort__data__out<2>
rax__SPPort__data__out<3>
rax__SPPort__data__en // Data Enable
rax__SPPort__clk // Clock
rax__SPPort__cs // Chip Select
rax__SPPort__oe // Output Enable
rax__SPPort__we // Data In.

Example 1: Generating an Interface to a Foreign Code MPRAM.

```
// Pin name specifications have been commented out
set family = Xilinx4000XV;
set part = "V1000BG560-4";
set clock = external "C1";
macro expr dataPins = {"D1", "D2", "D3", "D4"};
macro expr addrPins = {"A1", "A2"};
macro expr wePins = {"WE1"};
macro expr csPins = {"CS1"};
macro expr oePins = {"OE1"};
unsigned 4 a;
mpram Mpaz
{
wom unsigned 4 wox[4];
rom unsigned 4 rox[4];
} mox with {ports = 1/*, data = dataPins, addr = addrPins,
    we = wePins, cs =
csPins, oe = oePins*/};
void main(void)
static unsigned 2 i = 0;
while(1)
{
par
{
i++;
a++;
mox.wox[i] = a;
}
a = mox.rox[i];
}
}
```

Using Other RAMs

The interface to other types of RAM such as DRAM should be written by hand using interface declarations described in the following sections. Macro procedures can then be written to perform complex or even multi-cycle accesses to the external device.

Interfacing with External Hardware and Logic

While the simulator allows debugging of Handel-C programs, the real target of the compiler is hardware. It is therefore essential that the compiler can generate hardware that interfaces with external components. These next sections detail the building blocks of such hardware interfaces. All off-chip accesses are based on the idea of a bus which is just a collection of external pins. Handel-C provides the ability to read the state of pins for input from the outside world and set the state of pins for writing to the outside world. Tri-state buses are also supported to allow bi-directional data transfers through the same pins. The pins used may be defined in Handel-C by using the data specification. If this is omitted, the pins may be left unconstrained and can be assigned by the place and route tools. Note that Handel-C provides no information about the timing of the change of state of a signal within a Handel-C clock cycle. Timing analysis is available from the FPGA manufacturer's place-and-route tools. Handel-C programs can also interface to external logic (other Handel-C programs, programs written in VHDL etc.) by using user-defined interfaces or Handel-C ports.

Interfaces

All interfaces other than RAMs are declared with the interface keyword. The general syntax of interfaces is as follows: interface Sort(Types) Name(Args) with {Specs}; Here, the Sort field specifies what sort of interface is required, Types describes the types of values associated with objects coming from the interface, Name specifies an identifier for the interface, Args specifies any parameters that the interface may require and Specs give hardware details of the interface such as chip pin numbers. Further details of the interface syntax were provided earlier.

FIG. 75 is a table of pre-defined interface sorts 7500, in accordance with one embodiment of the present invention.

Reading from External Pins

The bus_in interface sort allows Handel-C programs to read from external pins. Its general usage is:

interface bus_in(typeportName) Name( )
with {data = Pin List}};

A specific example is:

interface bus_in(int 4 To) InBus( ) with {data = {"P1", "P2", "P3", "P4"}};

This declares a bus connected to pins P1, P2, P3 and P4 where pin P1 is the most significant bit and pin P4 is the least significant bit. Reading the bus is performed by accessing the identifier Name.portName as a variable which may return the value on those pins at that clock edge. For example:

int 4 x;
x = InBus.To;

This sets the variable x to the value on the external pins. The type of InBus.To is int 4 as specified in the type list after the bus_in keyword.

If no input port name is given, the port name defaults to in.

Registered Reading from External Pins

The bus_latch_in interface sort is similar to the bus_in interface sort but allows the input to be registered on a condition. This may be required to sample the signal at particular times. Its general usage is:

interface bus_latch_in(typeportName)
Name(type conditionPortName=Condition)
with {data = {Pin List}};.

Its usage is exactly like the bus_in interface sort except that Condition specifies a signal that is used to clock the input registers in the FPGA. The rising edge of this signal clocks the external signal into the internal value. For example:

int 1 get;
nt 4 x;
interface bus_latch_in(int 4 To)
InBus(int 1 condition = get)
with {data = {"P1", "P2", "P3", "P4"}};
get = 0;
get = 1; // Register the external value
x = InBus.To; // Read the registered value Clocked Reading from External Pins The bus_clock_in interface sort is similar to the bus_in interface sort but allows the input to be clocked continuously from the Handel-C global clock. This may be required to synchronize the signal to the Handel-C clock. Its general usage is:

interface bus_clock_in(typeportName) Name( )
with {data = {Pin List}};

Its usage is exactly like the bus_in interface sort. The rising edge of the Handel-C clock clocks the external signal into the internal value. For example:

interface bus_clock_in(int 4 InTo) InBus( ) with {data = {"P1", "P2", "P3", "P4"}};
x = InBus.InTo; // Read flip-flop value Writing to External Pins The bus_out interface sort allows Handel-C programs to write to external pins. Its general usage is:

interface bus_out( ) Name(typeportName=Expression)
with {data = {Pin List}};

A specific example is:

interface bus_out( ) OutBus(int 4 OutPort=x+y)
with {data = {"P1""P2""P3""P4"}};

This declares a bus connected to pins 1, 2, 3 and 4 where pin 1 is the most significant bit and pin 4 is the least significant bit. The value appearing on the external pins is the value of the expression x+y at all times.

Bi-directional Data Transfer

The bus_ts interface sort allows Handel-C programs to perform bi-directional off-chip communications via external pins. Its general usage is:

interface bus_ts (type inPortName)
Name(type outPortName=Value,
type conditionPortName = Condition)
with {data = {Pin List}};

Here, Value and Condition are two expressions. Value refers to the value to output on the pins and Condition refers to the condition for driving the pins. When the second expression is non-zero (i.e. true), the value of the first expression is driven on the pins. When the value of the second expression is zero, the pins are tri-stated and the value of the external bus can be read using the identifier Name.inPortName in much the same way that bus_in interfaces are read. If inPortName is not defined, the port name defaults to in.

A specific example is:

int 1 condition;
int4x;
interface bus_ts(int 4 read)
BiBus(int write=x+1,
int 1 enable= condition)
with {data = {"P1", "P2", "P3", "P4"}};
condition = 0; // Tri-state the pins
x = BiBus.read; // Read the value
condition = 1; // Drive x+1 onto the pins This example reads the value of the external bus into variable x and then drives the value of x + 1 onto the external pins. Take care when driving tri-state buses that the FPGA and another device on the bus cannot drive simultaneously as this may resuft in damage to one or both of them.

Bi-directional Data Transfer with Registered Input

The bus_ts_latch_in interface sort allows Handel-C programs to perform bi-directional off-chip communications via external pins with inputs registered on a condition. Its general usage is:

interface bus_ts_latch_in (type inPortName)
Name(type outPortName=Value,
type conditionPortName = Condition,
type clockPortName = Clock)
with {data = {Pin List}};

Here, Value, Condition and Clock are all expressions. Value refers to the value to output on the pins, Condition refers to the condition for driving the pins and Clock refers to the signal to clock the input from the pins. When the second expression is non-zero, the value of the first expression is driven on the pins. When the value of the second expression is zero, the pins are tri-stated and the registered value of the external bus can be read using the identifier Name.inPortName in much the same way that bus_in interfaces are read. If inPortName is not defined, the port name defaults to in. The rising edge of the value of the third expression clocks the external values through to the internal values on the chip. For example:

int 1 get;
    int 1 condition;
    int 4 x;
    interface bus_ts_latch_in(int 4 read)
    BiBus(int write=x+1,
    int 1 enable = condition,
    int 1 clock = get)
    with {data = {"P1", "P2", "P3", "P4"}};
    condition = 0; // Tri-state external pins
    get = 0;
    get = 1; // Register external value
    x = BiBus.read; // Read registered value
    condition = 1; // Drive x+1 onto external pins This example samples the external bus and reads the registered value into variable x and then drives the value of x + 1 onto the external pins. Take care when driving tri-state buses that the FPGA and another device on the bus cannot drive simultaneously as this may result in damage to one or both of them.

Bi-directional Data Transfer with Clocked Input

The bus_ts_clock_in interface sort allows Handel-C programs to perforn bidirectional off-chip communications via external pins with inputs clocked continuously with the Handel-C clock. Its general usage is:

interface bus_ts_clock_in (type inPortName)
    Name(type outPortName=Value,
    type conditionPortName = Condition)
    with {data = {Pin List}

Here, Value and Condition are expressions. Value refers to the value to output on the pins and Condition refers to the condition for driving the pins. When the Condition is non-zero (i.e. true), the value of Value is driven on the pins. When the value of Condition is zero, the pins are tri-stated and the value of the external bus can be read using the identifier Name.InPortName in much the same way that bus_in interfaces are read.

The rising edge of the Handel-C clock reads the external values into the internal flip-flops on the chip. For example:

int 1 condition;
    int 4 x;
    interface bus_ts_clock_in (int 4 read
    BiBus(int 4 writePort=x+1,
    int 1 enable=condition)
    with {data = {"P1", "P2",4"P3","P4"}};
    condition = 0; // Tri-state external pins
    x = BiBus.read; // Read registered value
    condition = 1; // Drive x+1 onto external pins This example reads the value from the flip-flop into variable x and then drives the value of x + 1 onto the external pins. Take care when driving tri-state buses that the FPGA and another device on the bus cannot drive simultaneously as this may result in damage to one or both of them.

Merging Pins

It is possible to merge pins:
    merge input pins with double declarations of input bus interfaces
    merge tri-state pins Input pins can be merged so that pins can be read simultaneously into multiple variables. This can be done by specifying multiple interfaces (bus_in, bus_clock_in, bus_latch _in) which have some pins in common. If required, a different subset of pins can be specified for each instance of the interface. For example:

interface bus_in(int 8 wide) wideDataBus( ) with
    {data = "P1", "P2", "P3 ", "P4", "P 5",
    "P6", "P7", "P8"}};
    interface bus_in(int 3 thin) thinDataBus( ) with
    {data ={"P3", "P4", "P5"}};

wideDataBus.in would give the values of pins 1-8, whereas thinDataBus.in would give the three bit value on pins 3,4 and 5. Tri-state bus pins can be merged, though doing so may generate a compiler warning, as the compiler cannot detect whether there is a conflict in the use of the merged pins. One might wish to merge output pins for a tri-state bus if he or she wished to switch the circuit connections from one external piece of logic to another. For example:

int 1 en1, en2;
    int4x,y;
    interface bus_ts_clock_in (int 4 read
    BiBus1( int 4 writePort=x+1, en1==1)
    with {data = {"P1", "P2", "P3", "P4"}};
    interface bus_ts_clock_in (int 4 read
    BiBus2(int 4 writePort=y+1, en2==1)
    with {data {"P1", "P2", "P3", "P4"}};

Take care when driving tri-state buses that the FPGA and another device on the bus cannot drive simultaneously as this may result in damage to one or both of them.

Buses and the Simulator

The Handel-C simulator cannot simulate buses directly. The recommended process for debugging is to use the channel method outlined earlier in this section of the present description. This is because the simulation of buses cannot determine when input and output should occur.

By using the #define and #ifdef . . . #endif constructs of the preprocessor, it is possible to combine both the simulation and hardware versions of the program into one. For example:

define SIMULATE
    #ifdef SIMULATE
    input ? value;
    #else
    value = Busln.in;
    #endif Refer to the Handel-C Preprocessor section for details of conditional compilation. Simulation of buses may be important when debugging the interface with the outside world. In this case, one can use the Application Programmers Interface (API) to write a plugin which can be co-simulated. For example, to simulate a tri-state bus:

```
#ifdef SIMULATE
interface bus_ts (uint 32 in with
  {extlib="cosim_hc.dll",extinst="1",extfunc=
    "DataBusIn"})
DataBus (DataOut with {extlib="cosim_hc.dll",
extinst="1", extfunc="DataBusOut"},
!WriteBus.in with {extlib="cosim_hc.dll",
extinst="1", extfunc="DataBusEnable"}
);
#else
interface bus_ts (uint 32 in with {data = pinList})
DataBus (DataOut, !WriteBus.in)
with {data = pinList})
#endif
```

In this case, the functions DataBusIn, DataBusOut and DataBusEnable would be provided in the plugin cosim_hc.dll and called by the simulator. Details of using the API to write plugins are given herein.

Timing Considerations for buses

It is sometimes important to be aware of the timing of the external interfaces. While Handel-C without hardware libraries does not allow one to control exact timings, some care when writing code can allow enough control to make such interfaces work. The first consideration is for bus_in interfaces. This form of bus is built with no register between the external pin and the points inside the FPGA where the data is used. Thus, if the value on the external pin changes asynchronously with the Handel-C clock then routing delays within the FPGA can cause the value to be read differently in different parts of the circuit. For example:

```
interface bus_in(int 1 read) a( ) with
  {data = {"P1"}};
par
{
  x = a.read;
  y = a.read;
}
```

Even though a.read is assigned to both x and y on the same clock cycle, if the delay from pin 1 to the flip-flop implementing the x variable is significantly different from that between pin 1 and the flip-flop implementing the y variable then x and y may end up with different values. This can be seen by considering the timing of some signals.

Figure 76:
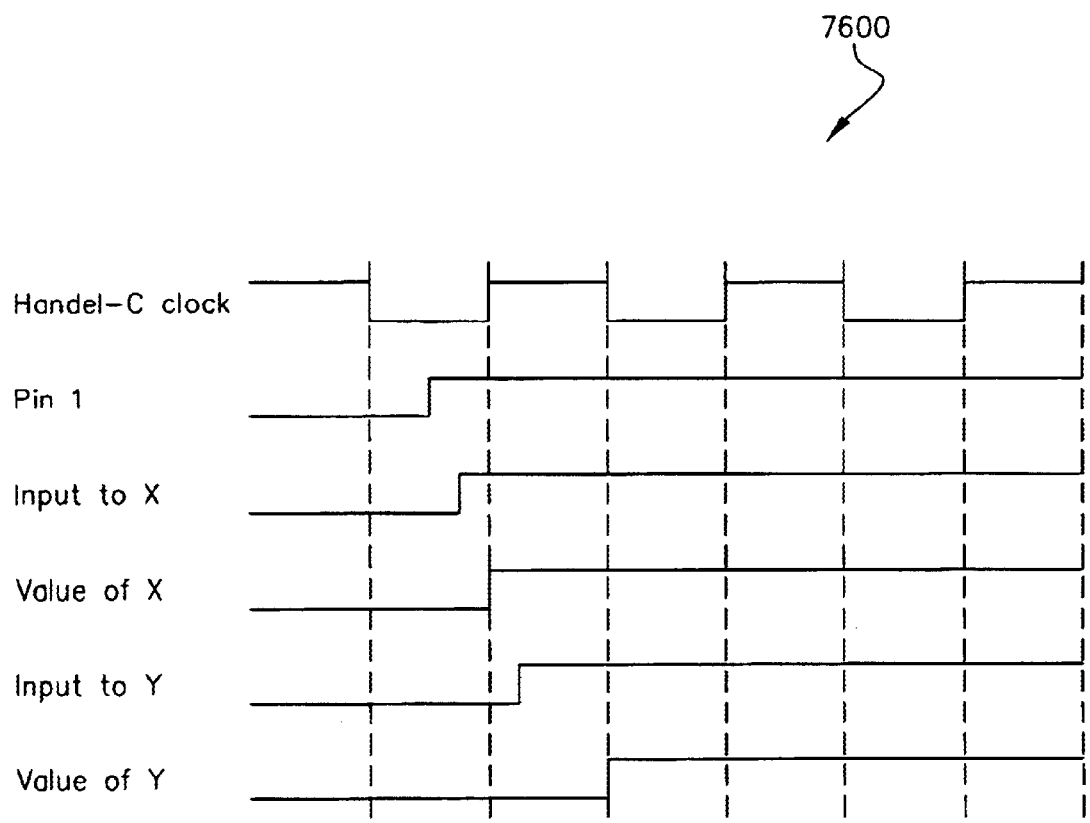
FIG. 76 illustrates a timing diagram, in accordance with one embodiment of the present invention.

Here, the delay between pin 1 and the input of y is slightly longer than the delay between pin 1 and the input to x. As a result, when the rising edge of the clock registers the values of x and y, there is one clock cycle when x and y have different values. FIG. 76 illustrates a timing diagram 7600, in accordance with one embodiment of the present invention.

This effect can also occur in places that are more obscure. For example:

```
interface bus_in(int 1 read) a( ) with
  {data = {"P1"}};
while (a.read==1)
{
  x = x + 1;
}
```

In this example, although a.read is only apparently used once, the implementation of a while loop requires the signal to be routed to two different locations giving the same problem as before. The solution to this problem is to use either a bus_latch_in or a bus_cloc_in interface sort.

There is also a timing issue with output buses that needs care when designing interface hardware. In this case, the value output on pins cannot be guaranteed except at rising Handel-C clock edges. In between clock edges, the value may be in the process of changing.

Since the routing delays through different parts of the logic of the output expression are different, some pins may change before others giving rise to intermediate values appearing on the pins. This is particularly apparent in deep combinatorial logic. For example:

```
int 8 x;
int 8 y;
interface bus_out( ) output(write=x * y)
with {data = {"P1","P2","P3","P4",
"P5", "P6", "P7","P8"}};
```

Here, a multiplier contains deep logic so some of the 8 pins may change before others leading to intermediate values. It is possible to minimize this effect (although not eliminate it completely) by adding a variable before the output. This effectively adds a flip-flop to the output. The above example then becomes:

```
int 8 x;
int 8 y;
int 8 z;
interface bus_out( ) output(write=z)
with {data = {"P1","P2","P3","P4",
"P5","P6","P7", "P8"}};
z = x * y;
```

Care may now be taken because the value of z may be updated whenever the value output on the bus may change. Race conditions within the combinatorial logic can lead to glitches on output pins between clock edges. When this happens, pins may glitch from 0 to 1 and back to zero or vice versa as signals propagate through the combinatorial logic. Adding a flip-flop at the output in the manner described above removes these effects. These considerations should also be taken into account when using bi-directional tri-state buses since these are effectively a combination of an input bus and an output bus.

Metastability

The output of a digital logic gate is a voltage level that normally represents either '0' or '1'. If the voltage is below the low threshold, it represents 0 and if it is above the high threshold, it represents 1. However, if the voltage input to a register or latch is between these thresholds on the clock edge, then the output of that register may be indeterminate for a time before reverting to one of the normal states. The state to which it reverts and the time at which it reverts cannot be predicted. This is called metastability, and can occur when data is clocked into a register during the time when the data is changing between the two normal voltage levels representing 0 and 1. It is therefore an important consideration for Handel-C programs that may clock in data when the data is changing state. The metastability characteristics of digital logic devices vary enormously. For a discussion of Xilinx FPGAs see the Xilinx FPGA data sheet (reference 2). This section puts the problem into perspective. For example a XC4000E device clocking a 1 MHz data signal with a 10 MHz clock is expected only once in a million years to take longer than 3 ns to recover from a metastable state to a stable state. So when designing a system examine the metastability characteristics of the devices under the conditions in which they may be used to determine whether any precautions need be taken.

The ideal system is designed such that when data is clocked into a register it is guaranteed to be stable. This can be achieved by using intermediate buffer storage between the two systems that are transferring data between each other. This storage could be a single dual-port register, dual-port memory, FIFO, or shared memory. Handshaking flags are used to indicate that data is ready, and that data has been read. However even in this situation sampling of the flags could cause metastability. The solution is to clock the flag into the Handel-C program more than once, so it is clocked into one register, and the output of that register is then clocked into another register. On the first clock the flag could be changing state so the output could be metastable for a short time after the clock. However, as long as the clock period is long relative to the possible metastable period, the second clock may clock stable data. Even more clocks further reduce the possibility of metastable states entering the program, however the move from one clock to two clocks is the most significant and should be adequate for most systems.

The example below has 4 clocks. The first is in the bus_clock_in procedure, and the next 3 are in the assignments to the variables x, y, and z.

```
int 4 x,y,z;
interface bus_clock_in(int 4 read) InBus( ) with
{data = {"P1", "P2", "P3", "P4"}};
par
{
while(1)
x = InBus.read;
while(1)
y = x;
{
...
z = y;
}
}
```

Remember to keep the problem in perspective by examining the details of the system to estimate the probability of metastability. Design the system in the first place to minimize the problem by decoupling the FPGA from external synchronous hardware by using external buffer storage.

Metastability Across Clock Domains

There are particular metastability issues when dealing with communications across clock domains. Channels that connect between clock domains are uni-directional point-to-point. The timing between domains is unspecified, but the transmission is guaranteed to occur, and both sides may wait until the transmission has completed. For example:

```
//File: transmit.c
chan 8 c; // channel may have global scope
void main(void)
{
int 8 x, y;
c ! x; //program may wait until data
//successfully transmitted
c ! y;
}
//File: receive.c
extern chan c;
void main(void)
{
int 8 p, q;
c ? p;
c ? q;
}
```

Ports

If one is dealing with hardware components in separate clock domains, one may need to insert resynchronising hardware if it is not included in the components. For example, if data is sent from port_out A in domain bbA and received from port_in B in domain bbB, the data may be resynchronized to the clock in domain bbB. This can be done by using the data at least once in the Handel-C wrapper file.

The example below shows the three files required to connect two EDIF blocks (bbA and bbA) which use different clocks. The small files bbA.c and bbB.c connect to the EDIF code using the port_out from and port_in to interfaces. The metastable.c file generates one flip-flop that resynchronizes the data by reading the value from bbA into a variable.

File: metastable.c

```
/*
* Black box code to resynchronize
* Needs to be clocked from the reading clock
* (i.e. bbB.c's clock)
*/
int 1 x;
interface bbA(int 1 from) A( );
interface bbB( ) B(int 1 to=x);
main( )
{
while(1)
{
/* stabilize the data by adding
* resynchronization FF
*/
x = A.from;
}
}
```

File: bbA.c

```
/*
* Domain bbA
* Connects to bbA.edf
*/
void main(void)
{
int 1 y;
interface port_out( ) from (int 1 from = y);
}
```

File: bbB.c

```
/*
*Domain bbB
* Connects to bbb.edf
*/
void main(void)
{
int 1 q:
interface port in(int 1 to) to( );
par
```

```
{
while(1)
{
q = to.to: // Read data
}
}
}
```
Alternatively, the resynchronising flip-flop can be placed in the file that reads the data from the foreign code block.

File: toplevel.c
```
/*
* Code to connect data between two cores
*/
interface bbA(int 1 from) A( );
interface bbB( ) B(int 1 to=A.from);
```
File: bbA.c
```
/*
* Domain bbA
* Compiles to bbA.edf
*/
void main(void)
{
int 1 y;
interface port_out( ) from (int 1 from = y);
} .Handel-C Language
```
File: bbB.c
```
/*
*Domain bbB
* Complies to bbB.edf
*/
void main(void)
{
int 1 q, y;
interface port_in(int 1 to) to( );
while(1)
{
par
{
q = to.to; // Resynchronize data
y = q
}
}
}
```

Interfacing With External Logic

Handel-C provides the interface sorts port_in and port_out. These allow one to have a set of wires, unconnected to pins, which he or she can use to connect to a simulated device or to another function within the FPGA. It is assumed that Handel-C has supplied an interface declaration for these sorts, and one supply an instance definition.

Port_in

For a port_in, one defines the port(s) carrying data to the Handel-C code and any associated specifications.

interface port_in(Type data_TO_hc [with {port_specs}])

Name( ) [with {Instance_specs}];

For example:

interface port_in(int 4 signals_to_HC) read( );

One can then read the input data from the variable Name.data_TO_hc, in this case read.signals_to_HC Port_out For a port_out, one define the port(s) carrying data from the Handel-C code, the expression to be output over those ports, and any associated specifications.

interface port_out( ) Name(Type data_FROM_hc = output_Expr[with}port_specs}])

[with {Instance_specs}];

For example:

int X_out;

interface port_out( )

drive(int 4 signals_from_HC = X_out);

In this case, the width of X_out would be inferred to be 4, as that is the width of the port that the data is sent to.

Specifying the Interface

Figure 76A:
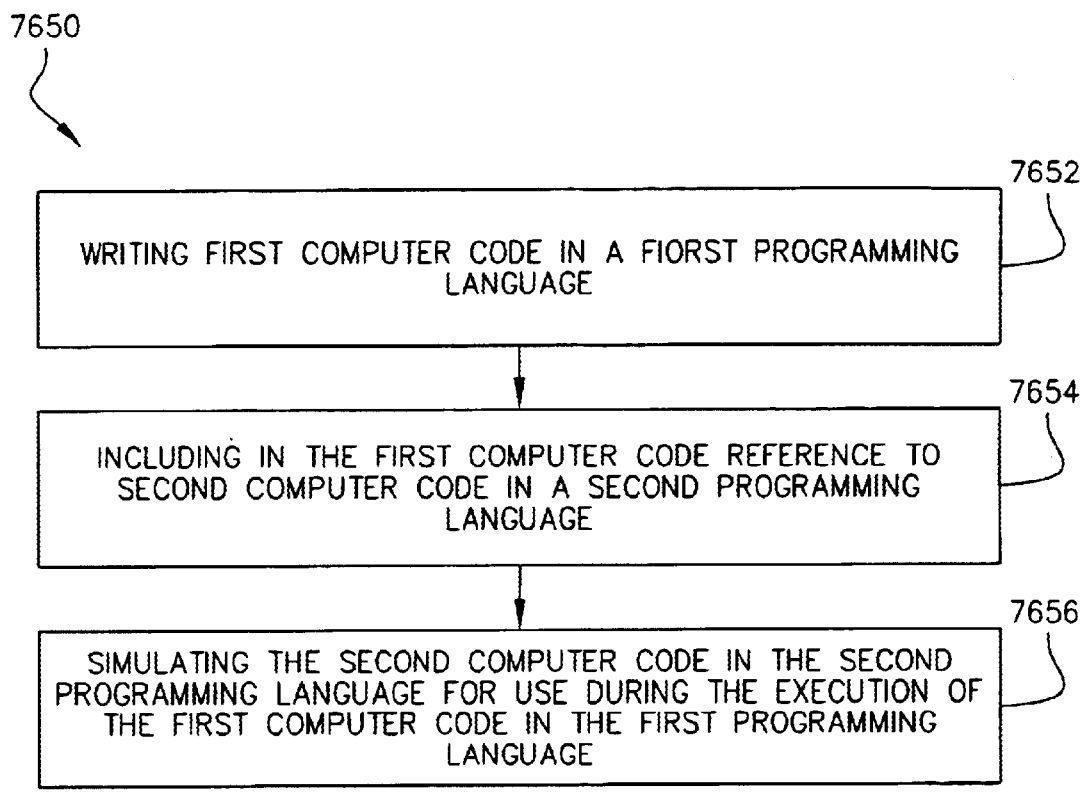
FIG. 76A is a flowchart showing a method for providing a versatile interface.

FIG. 76A is a flowchart 7650 showing a method for providing a versatile interface. First, in operation 7652, computer code is written in a first programming language. Included in the first computer code is reference to second computer code in a second programming language. See operation 7654. In one aspect of the present invention, the reference to the second computer code may include a predetermined command in the first computer code. In yet a further aspect, the second programming language may be either EDIF or VDHL.

The second computer code is simulated in the second programming language for use during the execution of the first computer code in the first programming language. Note operation 7656. In an aspect of the present invention, the second computer code may be simulated by a first simulator module. In such an aspect, the first simulator module may interface a second simulator module. As a further option, the first simulator module may interface the second simulator module via a plug-in module.

Figure 77:
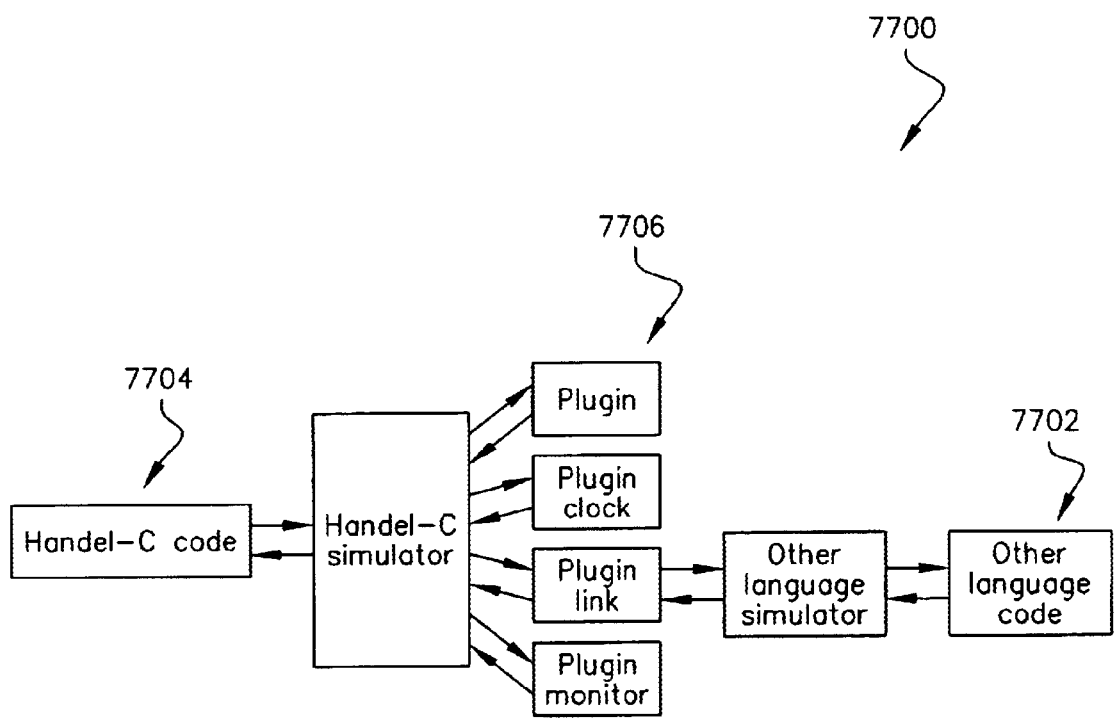
FIG. 77 illustrates the manner in which an interface is specified, in accordance with one embodiment of the present invention.

FIG. 77 illustrates the manner in which an interface 7700 is specified, in accordance with one embodiment of the present invention. One can specify any particular interface format. This allows he or she to communicate with code written in another language 7702 such as VHDL or EDIF and allows the Handel-C simulator 7704 to communicate with an external plugin program 7706 (e.g., a connection to a VHDL simulator). The expected use for this is to allow one to incorporate bought-in or handcrafted pieces of low-level code in the high-level Handel-C program. It also allows the Handel-C program code be incorporated within a large EDIF or VHDL program. One can also use it to communicate with programs running on a PC that simulate external devices.

To use such a piece of code requires that one include an interface declaration in the Handel-C code to connect it to the external code block. This declaration also tells the simulator to call a plugin (which in turn may invoke a simulator for the foreign code).

Handel-C Code Required

The code needed in the Handel-C program is in two parts. First, a person needs an interface declaration. In the simplest form, this is of the format:

interface sort ( { extern_to_HC_port{, extern_to_HC_port} } ) ( { HC_$_{to}$_extern_port{, HC_to_extern_port} } )

where:

sort is the name one gives to this type of interface extern_to_HC_port is the prototype (type and name) of an input port used to communicate from the external code to the Handel-C.

HC_to_extern_port is the prototype (type and name) of an output port used to communicate with the external code from the Handel-C. At least one port (input or output) may be declared. One then needs to define an instance of the interface in the format:

interface sort( { extern_to_HC_port } )
Name( { HC_to_extern_port = data_from_HC_to_extern
[with {portSpec}] {,HC_to_extern_port= data_from_HC_to_extern
[with {portSpec} ] } } )
[ with {extlib="simulator_plugin", specs}]

where:
- sort is the name one gives to this sort of interface
- extern_to_HC_port is the definition of the previously declared port. This definition may include an optional with specification.
- with {portSpec} is optional. It consists of one or more port specifications for a single port in the interface name is the name one gives to this definition of the interface
- HC_to_extern_port is the definition of the previously declared port. This definition may include a with specification.
- data_from_HC_to_extern is an expression which may be sent to the external code from the Handel-C.
- simulator_plugin is the name of a file on the PC which manages the cosimulation. It provides the inputs to and the data from the external code. (This plugin file may in turn invoke another simulator.). Its presence is optional.
- specs are instance specifications required (some of these may depend on the cosimulator file plugin).

Targeting Specific Tools

When compiling to EDIF, Handel-C has the capacity to format the names of wires to external logic according to the different syntaxes used by place and route tools. One can do this using the busformat specification to a port. This allows one to specify how the bus name and wire number are formatted.

To specify a format, one uses the syntax:
port with {busformat = "YormatString"}.

formatstring can be one of the following strings. B represents the bus name, and 1 represents the wire number.
B1
B_1
B[1]
B(1)
B<1>

EXAMPLE interface port_in(int 4 signals_to_HC with {busformat="B[1]") read( );
would produce wires
signals_to_HC[0]
signals_to_HC[1]
signals_to_HC[2]
signals_to_HC[3]
ram unsigned 4 rax[4] with {ports = 1, busforrnat= "B<1>"};
would produce wires
rax_SPPort_addr<0> // Address
rax_SPPort_addr<1>
rax_SPPort_data_in<0> // Data In
rax_SPPort_data_in<1>
rax_SPPort_data_in<2>
rax_SPPort_data_in<3>
rax_SPPort_data_out<0> // Data Out
rax_SPPort_data_out<1>
rax_SPPort_data_out<2>
rax_SPPort_data_out<3>
rax_SPPort_data_en // Data Enable
rax_SPPort_clk // Clock
rax_SPPort_cs // Chip Select
rax_SPPort_oe // Output Enable
rax_SPPort_we // Data In.

Object Specifications

Handel-C provides the ability to add 'tags' to certain objects (variables, channels, ports, buses, RAMs, ROMs, mprams and signals) to control their behavior. These tags or specifications are listed after the declaration of the object using the with keyword. This keyword takes one or more of the following attributes.

Figure 78C:
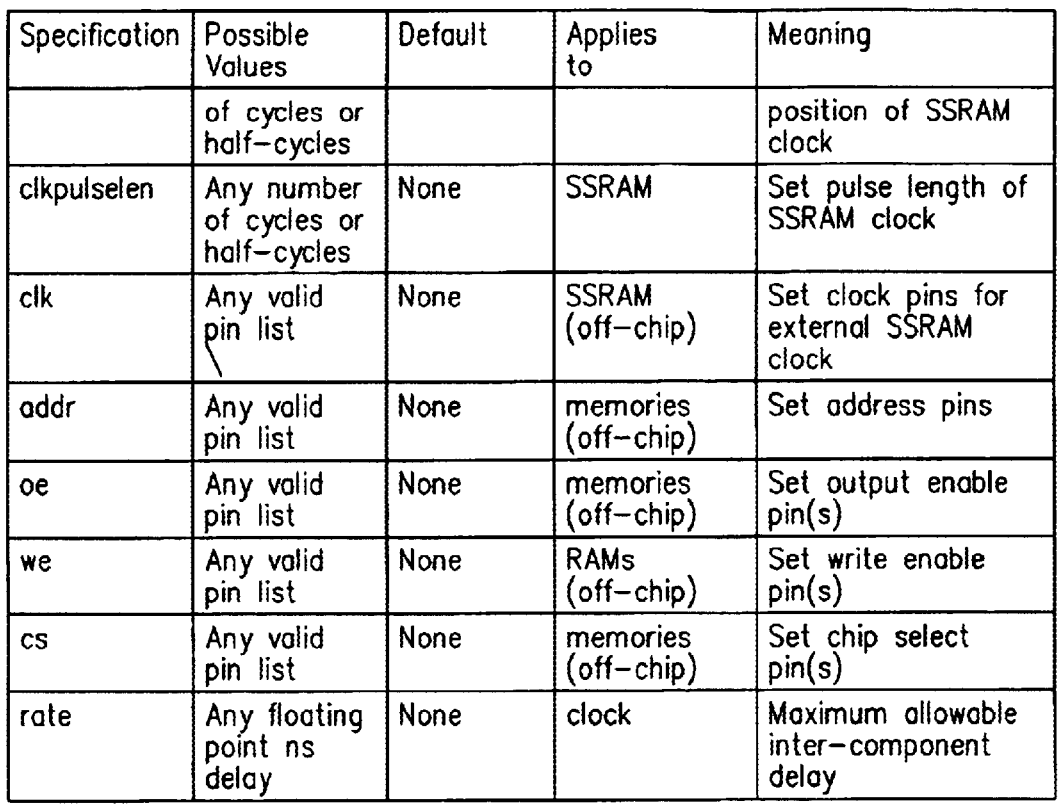

FIGS. 78A through 78C illustrates a table showing the specification of various keywords 7800, in accordance with one embodiment of the present invention. The previous sections have already shown briefly how to use some of these specifications but this section covers these in more detail and also describes the other specifications in the table above.

Specifications can be added to objects as follows:
unsigned 4 w with {show=0};
int 5 x with {show=0, base=2};
chanout char y with {outfile="output.dat"};
chanin int 8 z with {infile="input.dat"};
interface bus_clock_in(int 4 in) InBus( ) with
{ pull = 1,
data = {"P1", "P2", "P3", "P4"}
};

When declaring multiple objects, the specification may be given at the end of the line and applies to all objects declared on that line. For example:
unsigned x, y with {show=0};

This attaches the show specification with a value of 0 to both x and y variables.

Details of each of the specifications are given below.

The Show Specification

The show specification may be given to variable, channel, output bus and tri-state bus declarations. When set to 0, this specification tells the Handel-C simulator not to list this object in its output. This means that it may not appear in the Variables debug window in the GUI.

The default value of this specification is 1.

Reducing the number of items displayed in the output list from the simnulator produces a noticeable speed up in simulation.

The Base Specification

The base specification may be given to variable, output channel, output bus and tri-state bus declarations. The value that this specification is set to tells the Handel-C compiler which base to display the value of the object in. Valid bases are 2, 8, 1 0 and 16 for binary, octal, decimal and hexadecimal respectively. The default value of this specification is 10.

The Infile and Outfile Specifications

The infile specification may be given to chanin, bus_in, bus_latch_in, bus_clock_in, bus_ts, bus_ts_latch_in and bus_ts_clock_in declarations. The outfile specification may be given to chanout, bus_out, bus_ts, bus_ts latch_in and bus_ts_clock_in declarations. The strings that these specifications are set to may inform the simulator of the file that data should be read from (infile) or the file that data should be written to (outfile). When applied to a variable, the state of that variable at each clock cycle is placed in that file when simulation takes place. Note that when applying the outfile specification, it should not be given to multiple variables or channels. For example, the following declarations are not allowed:

int x, y with {outfile="out.dat"};

chanout a, b with {outfile="out.dat"};

For details of connecting channels to files. By default, no input or output files are used.

The Warn Specification

The warn specification may be given to a variable, RAM, ROM, channel or bus. When set to zero, certain non-crucial warnings may be disabled for that object. When set to one (the default value), all warnings for that object may be enabled.

warn=0 The speed specification

The speed specification may be given to an output or tri-state bus. The value of this specification controls the slew rate of the output buffer for the pins on the bus. For Xilinx devices, 0 is slow, 3 is fast, and the default value is 3. For Altera devices, 0 is slow, 1 is fast, and the default value is 1.

Refer to the Xilinx or Altera FPGA data sheets for details of slew rate control.

The Intime and Outtime Specifications

The intime specification may be given to an input port or bus, tri-state bus or off-chip memory. The outtime specification may be given to an output port or bus, tri-state bus or off-chip memory. When applied to Xilinx chips, these specifications cause Handel-C to generate a Netlist Constraints File (NCF) for the design. The place-and-route tools then use this file to constrain the relevant paths.

intime specifies the maximum delay in ns allowed between an interface or memory and the elements it feeds.

outtime specifies the maximum delay in ns allowed between an interface or memory and the elements it is fed from. They can be floating point numbers. For example:

macro expr memoryPins = {"P6", "P7", "P8",
"P9", "P10", "P11", "P12", "P13"};

macro expr datapins = {"P1", "P2", "P3", "P4"};

interface bus-in(unsigned 4) hword( ) with {data = dataPins, intime = 5};

interface port_out( )

(unsigned 4 out = hword.in + 1)

with {outtime = 5.2};

ram int 8 a[15][43] with {outtime = 5.2, offchip = 1, data = memorypins};

The Busformat Specification

The busformat specification may be given to an interface, port or memory that is resident in external logic. When compiled to EDIF, the busformat string defines the format of the wire names. Valid values for the busformat string are:

B1 B_1 B[1] B(1)
B represents the bus name and 1 the wire number.
    The default format is B_1

The Pull Specification

The pull specification may be given to an input or tri-state bus. When set to 1, a pull up resistor is added to each of the pins of the bus. When set to 0, a pull down resistor is added to each of the pins of the bus. When this specification is not given for a bus, no pull up or pull down resistor is used. Altera devices do not have pull-up or pull-down resistors. Refer to the Xilinx FPGA data sheet for details of pull up and pull down resistors. By default, no pull up or pull down resistors are attached to the pins.

The Data Specification

The data specification may be given to an external interface or memory. It consists of a list of pin numbers separated by commas. If the data specification is omitted, the place and route tools may assign the pins.

macro expr memoryPins = {"P6", "P7", "P8",
"P9", "P10", "P11", "P12", "P13"};

macro expr dataPins = {"P1", "P2", "P3", "P4"};

interface bus_in(unsigned 4) hword( ) with {data = dataPins, intime = 5};

ram int 8 a[15][43] with { data = memorypins};

The Offchip Specification

The offchip specification may be given to a RAM or ROM declaration. When set to 1, the Handel-C compiler builds an external memory interface for the RAM or ROM using the pins listed in the addr, data, cs, we and oe specifications (see below). When set to 0, the Handel-C compiler builds the RAM or ROM on the FPGA and ignores any pins given with other specifications.

intime and outtime specifications can also be applied to off-chip RAMs. If they have not been given, the compiler attempts to build them from the rate, westart, and welength specifications. If any of these are missing, the compiler does not calculate time specs for the memory.

ram int 8 a[15][43] with {offchip = 1};

The Ports Specification

The ports specification may be given to a RAM or ROM declaration. When set to 1, the Handel-C compiler builds an external memory interface for the RAM or ROM using the ports defined in the addr, data, cs, we and oe specifications (see below). This allows one to connect to RAMs in external code. The compiler generates an error if the ports and offchip specification are both set to 1 for the same memory. All other specifications can be applied. If the ports specification is applied to an MPRAM, a separate interface may be generated for each port.

The Xilinx Block Specification

The block specification may be given to a RAM or ROM declaration. One can specify that a block RAM is created in a Xilinx Virtex chip by using the specification block = 1. E.g. ram int 8 a[15][43] with {block = 1};

The default block specification is 0 (not in block memory).

The Wegate Specification

The wegate specification may be given to external or internal RAM declarations to force the generation of an asynchronous RAM. When set to 0, the write strobe may appear throughout the Handel-C clock cycle. When set to −1, the write strobe may appear only in the first half of the Handel-C clock cycle. When set to 1, the write strobe may appear only in the second half of the Handel-C clock cycle.

The Westart and Welength Specifications

The westart and welength specifications may be given to internal or external RAM declarations. One can only use these specifications together with external_divide or internal_divide clock types with a division factor greater than 1.

The westart and welength specifications position the write enable strobe within the Handel-C clock cycle.

The rclkpos, wclkpos, clkpulselen and clk Specifications

The rclkpos, wclkpos and clkpulselen may be given to internal or external SSRAM declarations. The clk specification is used for external SSRAM declarations. To use these specifications, one may be using the external_divide or internal_divide clock types with a division factor of 2 or more.

rclkpos specifies the positions of the clock cycles of the new ram clock RAMCLK, for a read cycle. These positions would be specified in terms of cycles of a fast external clock CLK, counting forwards from the rising edge of the Handel-C clock HCLK rising edge.

wclkpos specifies the positions of the clock cycles of the new ram clock RAMCLK, for a write cycle.

clkpulselen specifies the length of the pulses of the new RAM clock RAMCLK, in terms of cycles of CLK. This is specified only once for a RAM. It thus applies to both the read and write clocks.

clk specifies the pin(s) that carry the new RAM clock RAMCLK to the external SSRAM.

Specifying Pin Outs

The addr, data, we, cs and oe specifications each take a list of device pins and are used to define the connections between the FPGA and external devices. FIG. 78D illustrates the manner in which an pin outs are specified 7850, in accordance with one embodiment of the present invention.

Pin lists are always given in the order most significant to least significant. Multiple write enable, chip select and output enable pins can be given to allow external RAMs and ROMs to be constructed from multiple devices. For example, when using two 4-bit wide chips to make an 8-bit wide RAM, the following declaration could be used:

```
ram unsigned 8 ExtRAM[256] with {offchip=1,
    addr={"P1", "P2", "P3", "P4",
    "P5", "P6", "P7", "P8"},
    data={"P9", "P10", "P11", "P12",
    "P13", "P14", "P15", "P16"},
    we={"P17", "P18"},
    cs={"P19", "P20"},
    oe={"P21", "P22"}};
```

The Rate Specifications

The rate specification may be given to a clock to specify the maximum delay in ns allowed between components fed from that clock. This specification causes Handel-C to generate a Netlist Constraints File (NCF) for the design. The place-and-route tools then use this file to constrain the relevant paths so that the part of the design connected to the clock in question can be clocked at the specified rate. rate may be a floating-point number. For example:

```
set clock = external_divide "D17" 4 with
    {rate = =1.4};.
```

Example Hardware Interface

An example, theoretical interface is now described to illustrate the use of buses. The scenario is of an external device connected to the FPGA which may be read from or written to. The device has a number of signals connected to the FPGA. FIG. 79 illustrates the various signals 7900 employed by the present invention.

Figure 80:
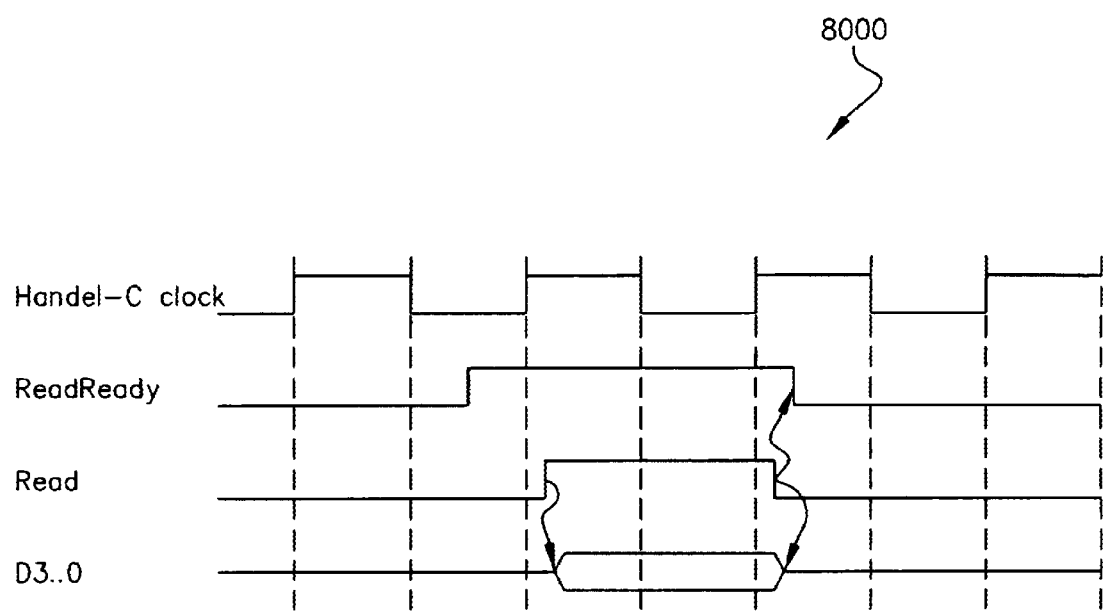
FIG. 80 illustrates a read waveform representative of a cycle, in accordance with one embodiment of the present invention.

A read from the device is performed by waiting for ReadRdy to become active (high). The Read signal is then taken high for one clock cycle and the data sampled on the falling edge of the strobe. FIG. 80 illustrates a read waveform representative of a cycle 8000, in accordance with one embodiment of the present invention.

Figure 81:
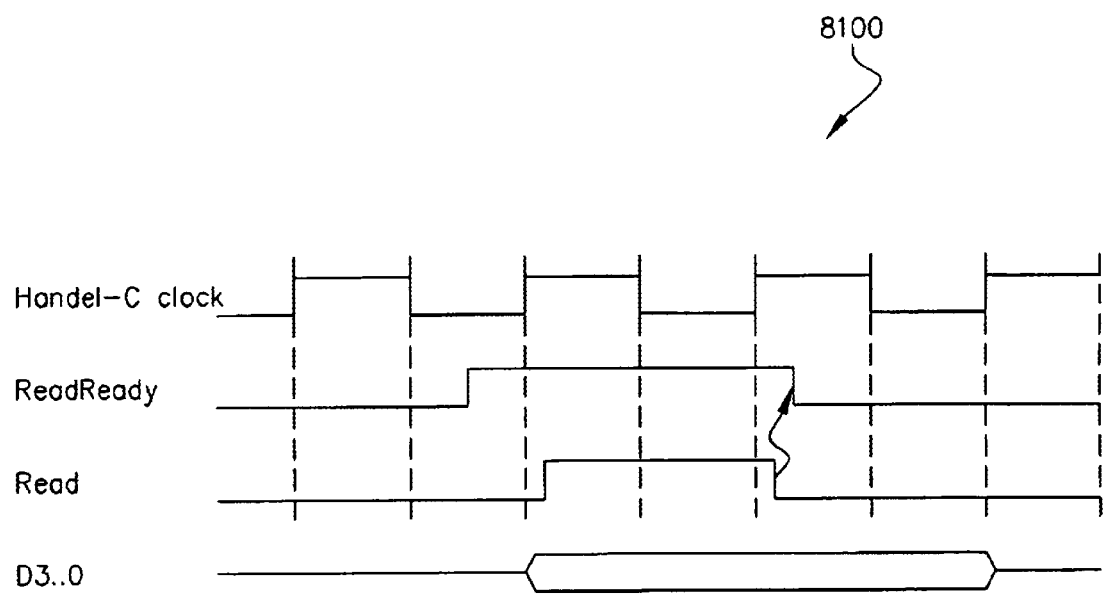
FIG. 81 illustrates a waveform representative of a write cycle, in accordance with one embodiment of the present invention.

A write to the device is performed by waiting for WriteRdy to become active (high). The Write signal is then taken high for one clock cycle while the data is driven to the device by the FPGA. The device samples the data on the falling edge of the Write signal. FIG. 81 illustrates a waveform representative of a write cycle 8100, in accordance with one embodiment of the present invention.

The first stage of the code may declare the buses associated with each of the external signals. The following code does this:

```
int 4 Data;
int 1 En = 0;
interface bus_ts_clock_in(int 4)
dataB(Data, En==1) with
{data = {"P1", "P2", "P3", "P4"}};
int 1 Write = 0;
interface bus_out( ) writeB(Write) with
{data = {"P5"}};
int 1 Read = 0;
interface bus_out( ) readB(Read) with
{data = {"P6"}};
interface bus_clock_in(int 1)
WriteReady( ) with {data = {"P7"};
interface bus_clock_in(int 1) ReadReady( ) with
{data = {"P8"}};
```

The values on the output buses will now be changed by setting the values of the Data, Write and Read variables. In addition, one can drive the data bus with the contents of Data by setting En to 1. Note that the variables that drive buses have been initialized to 0 so these variables may be static or global. This may be important when driving write strobes as in the present case. Care should be taken during configuration that the FPGA pins are disconnected in some way from the external devices because the FPGA pins become tri-state during this time.

The main program reads a word from the external device before writing one word back.

```
void main (void)
{
int 4 Data;
// Read word from external device
while (ReadReady == 0)
delay;
Read = 1; // Set the read strobe
par
{
Data = dataB.in; // Read the bus
Read = 0; // Clear the read strobe
}
// Write one word back to external device
Reg = Data + 1;
while (WriteReady==0)
delay;
par
{
En = 1; // Drive the bus
Write = 1; // Set the write strobe
}
```

Write = 0; // Clear the write strobe
En = 0; // Stop driving the bus
}
Note that during the write phase, the data bus is driven for one clock cycle after the write strobe goes low to ensure that the data is stable across the falling edge of the strobe.

Standard Macro Expressions

Introduction

The Handel-C compiler is provided with a standard header file containing a collection of useful macro expressions. This header file may be used by simply including it in the Handel-C program with the following line:
include <stdlib.h>

Note that this header file is not the same as the conventional C stdlib.h header file but contains a standard collection of definitions useful to the Handel-C programmer.

The definitions themselves are included in the stdlib.lib library, which is supplied in the Handel-C\lib directory. One may ensure that he or she has included this directory in the library include path if he or she uses the macro definitions. The following sections describe each macro in detail.

Constant Definitions

The stdlib.h header file contains the following constant definitions:
Constant Name Definition
TRUE 1
FALSE 0

These definitions often lead to cleaner and more readable code. For example:
int 8 x with { show=FALSE };
while (TRUE)
{
...
}
if (a==TRUE)
{
...

Bit Manipulation Macros

The stdlib.h header file contains a number of macro expressions used to manipulate bits and bit fields listed below.

Adjs
Usage: adjs( Expression, Width)
Parameters:
  Expression Expression to adjust (may be signed integer)
  Width Width to adjust to
Returns:
  Signed integer of width Width.
Description:
  Adjusts width of signed expression up or down.
  Sign extends MSBs of expression when expanding width.
    Drops MSBs of expression when reducing width.

EXAMPLE int 4 x;
int 5 y;
int 6 z;
y = 15;
x = adjs(y, width(x)); // x = 7
y = −4;
z = adjs(y, width(z)); // z ==−4.

Adju
Usage: adju( Expression, Width)
Parameters:
  Expression Expression to adjust (may be unsigned integer)
  Width Width to adjust to
Returns:
  Unsigned integer of width Width.
Description:
  Adjusts width of unsigned expression up or down.
  Zero pads MSBs of expression when expanding width.
    Drops MSBs of expression when reducing width.

EXAMPLE unsigned 4 x;
unsigned 5 y;
unsigned 6 z;
y = 14;
x = adju(y, width(x)); // x = 14
z = adju(y, width(z)); // z = 14.

Copy
Usage: copy( Expression, Count)
Parameters:
  Expression Expression to copy
  count Number of times to copy
Returns:
  Expression duplicated Count times.
  Returned expression is of same type as Expression.
  Returned width is Count * width(Expression).
Description:
  Duplicates a bit field multiple times.

EXAMPLE unsigned 32 x;
unsigned 4 y;
y = 0xA;
x = copy(y, 8); // x = 0xAAAAAAAA.

Lmo
Usage: lmo( Expression)
Parameters:
  Expression Expression to calculate left most one of.
Returns:
  Bit position of left most one in Expression or width (Expression) if Expression is zero. Return value is log2(width(Expression))+1 bits wide.
Description:
  Finds the position of the most significant 1 bit in an expression.

EXAMPLE int 4 x;
int 3 y;
x = 3;
y = lmo(x); // y = 1
x = 0;
y = lmo(x); // y = 4;

lmz
Usage: lmz( Expression)
Parameters:
  Expression Expression to calculate left most zero of.
Returns:
  Bit position of left most zero in Expression or width (Expression) if Expression is all ones.

Return value is log2(width(Expression))+1 bits wide.
Description:
  Finds the position of the most significant 0 bit in an expression.

EXAMPLE int4x;
int 3 y;
x = 3;
y = lmz(x); // y = 2
x = 15;
y = lmz(x); // y = 4;.

Population
Usage: population( Expression)
Parameters:
  Expression Expression to calculate population of.
Returns:
  Value of same type as Expression.
Description:
  Counts the number of 1 bits (population) in Expression.

EXAMPLE int 4 x;
int 3 y;
x = 0b1011;
y = population(x); // y = 3.

Rmo
Usage: rmo( Expression)
Parameters:
  Expression Expression to calculate right most one of.
Returns:
  Bit position of right most one in Expression or width (Expression) if Expression is zero. Return value is log2(width(Expression))+1 bits wide.
Description:
  Finds the position of the least significant 1 bit in an expression.

EXAMPLE int 4 x;
int 3 y;
x= 3;
y = rmo(x); // y = 0
x = 0;
y = rmo(x); // y =4;.

Rmz
Usage: rmz( Expression)
Parameters:
  Expression Expression to calculate right-most zero of.
Returns:
  Bit position of right most zero in Expression or width (Expression) if Expression is all ones. Return value is log2(width(Expression))+1 bits wide.
Description:
  Finds the position of the least significant 0 bit in an expression.

EXAMPLE int 4 x;
int 3 y;
x= 3;
y = rmz(x); // y = 2
x = 15;
y = rmz(x); // y =4;.

Top
Usage: top( Expression, Width)
Parameters:
  Expression Expression to extract bits from.
  Width Number of bits to extract.
Returns:
  Value of same type as Expression.
Description:
  Extracts the most significant Width bits from an expression.

EXAMPLE int 32 x;
int 8 y;
x = 0x12345678;
y = top(x, width(y)); // y = 0x12.

Arithmetic Macros

The stdlib.h header file contains a number of macro expressions for mathematical calculations listed below.

Abs
Usage: abs( Expression
Parameters:
  Expression Signed expression to get absolute value of.
Returns:
  Signed value of same width as Expression.
Description:
  Obtains the absolute value of an expression.

EXAMPLE int 8 x;
int 8 y;
x = 34;
y= –18;
x = abs(x); // x =34
y = abs(y); // y = 18.

Addsat
Usage: addsat( Expression1, Expression2)
Parameters:
  Expression1 Unsigned operand 1.
  Expression2 Unsigned operand 2. May be of same width as Expression 1.
Returns:
  Unsigned value of same width as Expression1 and Expression2.
Description:
  Returns sum of Expression1 and Expression2. Addition is saturated and result may not be greater than maximum value representable in the width of the result.

EXAMPLE unsigned 8 x;
unsigned 8 y;
unsigned 8 z;
x = 34;
y = 18;
z = addsat(x, y); // z = 52 x = 34;
y = 240;
z = addsat(x, y); // z = 255.

Decode
Usage: decode( Expression)
Parameters:
   Expression Unsigned operand.
Returns:
   Unsigned value of width 2 width(Expression
Description:
   Returns 2 Expression.

EXAMPLE unsigned 4 x;
unsigned 16 y;
x = 8;
y = decode(x); // y = 0b100000000.

div
Usage: div( Expression1, Expression2)
Parameters:
   Expression1 Unsigned operand 1.
   Expression2 Unsigned operand 2. May be of the same width as Expression 1.
Returns:
   Unsigned value of same width as Expression1 and Expression2.
Description:
   Returns integer value of Expression1/Expression2.

EXAMPLE unsigned 8 x;
unsigned 8 y;
unsigned 8 z;
x = 56;
y = 6;
z = div(x, y); // z = 9

Warning! Division requires a large amount of hardware and should be avoided unless absolutely necessary.

exp2
Usage: exp2( Constant)
Parameters:
   Constant Operand.
Returns:
   Constant of width width(Constant)+1.
Description:
   Used to calculate 2 Constant. Similar to decode but may be used with constants of undefined width.

EXAMPLE unsigned 4 x;
unsigned (exp2(width(x))) y; // y of width 16 incwrap
Usage: incwrap( Expression1, Expression2)
Parameters:
   Expression1 Operand 1.
   Expression2 Operand 2. May be of same width as Expression 1.
Returns:
   Value of same type and width as Expression1 and Expression2.

Description:
   Used to increment a value with wrap around at a second value. Returns Expression 1+1 or 0 if Expression1+1 is equal to Expression2.

EXAMPLE unsigned 8 x;
x= 74;
x = incwrap(x, 76); // x = 75
x = incwrap(x, 76); // x = 0
x = incwrap(x, 76); // x = 1 log2ceil
Usage: log2ceil( Constant)
Parameters:
   Constant Operand.
Returns:
   Constant value of ceiling(log2(Constant)).
Description:
   Used to calculate log2 of a number and rounds the result up. Useful to determine the width of a variable needed to contain a particular value.

EXAMPLE unsigned (log2ceil(5768)) x; // x 13 bits wide
unsigned 8 y;
y = log2ceil(8); // y = 3
y = log2ceil(7); // y = 3 log2floor
Usage: log2floor( Constant)
Parameters:
   Constant Operand.
Returns:
   Constant value of floor(log2(Constant)).
Description:
   Used to calculate log2 of a number and rounds the result down.

EXAMPLE unsigned 8 y;
y = log2floor(8); // y = 3
y = log2floor(7); // y = 2.

Mod
Usage: mod( Expression1, Expression2)
Parameters:
   Expression1 Unsigned operand 1.
   Expression2 Unsigned operand 2. May be of the same width as Expression 1.
Returns:
   Unsigned value of same width as Expression1 and Expression2.
Description:
   Returns remainder of Expression1 divided by Expression2

EXAMPLE unsigned 8 x;
unsigned 8 y;
unsigned 8 z;
x = 56;
y = 6;
z = mod(x, y); // z = 2

Warning! Modulus arithmetic requires a large amount of hardware and should be avoided unless absolutely necessary.

Sign

Usage: sign( Expression)

Parameters:

Expression Signed operand.

Returns:

Unsigned integer 1-bit wide.

Description:

Used to obtain the sign of an expression. Returns zero if Expression is positive or one if Expression is negative.

EXAMPLE

```
int 8 y;
unsigned 1 z;
y = 53;
z = sign(y); // z = 0
y = -53;
z = sign(y); // z =1
``` subsat

Usage: subsat( Expression1, Expression2)

Parameters:

Expression1 Unsigned operand 1.

Expression2 Unsigned operand 2. May be of same width as Expression1.

Returns:

Unsigned value of same width as Expression1 and Expression2.

Description:

Returns difference between Expression1 and Expression2. Subtraction is saturated and result may not be less than 0.

EXAMPLE

```
unsigned 8 x;
unsigned 8 y;
unsigned 8 z;
x = 34;
y 18;
z = subsat(x, y); // z = 16
x = 34;
y = 240;
z = subsat(x, y); // z = 0.
```

13 Clocks

Multiple Clocks

One can have multiple clocks interfacing with the design. Each main( ) function may be associated with a clock.

Internal Clocks

One can set the clock to be any expression or any expression divided by a given factor. For Xilinx 4000 series chips, he or she can set the clock to be a value read from the on-chip clock generator.

set clock = internal <Expression>;

set clock = internal_divide <Expression>factor;

This allows one to set the clock to a value read from an interface.

EXAMPLE interface port_in(unsigned 1 clk) ClockPort( );

set clock = internal ClockPort.clk;

External clocks

External clocks may be accessed by associating the clock with a specific pin using set clock external = "pin_Name" or set_clock external_divide ="pin_Name" factor.

The pin_Name string is optional. If it is omitted, the pins are unconstrained and the place and route tools can assign the pin. One can also define an interface that reads an external clock. If the clock is associated with a specific pin, one can use the interface sort bus_in. One would only need to do this if the external clock has been divided, otherwise he or she can use the intrinsic _clock (see below).

EXAMPLE interface bus_in(unsigned 1 in) InputBus( ) with {data= {"Pin1"}};

set clock = internal_divide InputBus.in 3;

One can now use InputBus.in to get an undivided external clock. It may be more efficient to omit the pin specification and allow the place and route tools to assign the pin.

interface bus_in(unsigned 1 in) InputBus( );

set clock = internal_divide InputBus.in 3;.

Current Clock

The current clock used by a function can be referenced using the keyword___clock. This allows the function to pass the current clock to an external interface. The value of the system variable_clock may be the value after any divide. The clock may be an internal or an external clock.

EXAMPLE

The code below shows the current clock in an interface.

interface reg32x1k( ) registers(address, data_in,_clock, write) with {extlib="PluginModelSim.dll", extinst="1; model=reg32x1k_wrapper; clock=ck:25"};

Communicating Between Clock Domains

It is not legal to access the same variable from different clock domains. Instead, one may transmit data between clock domains using a channel or a port.

Channels

Channels that connect between clock domains may be uni-directional point-to-point. This means that their first use defines their direction and the domains in which they transmit and receive. If one attempts to re-use the channel in a different direction or to or from a different clock domain the compiler generates an error. Channels used between clock domains may be declared in one file and then referenced as extern in another. The timing between domains is unspecified, but the transmission is guaranteed to occur, and both sides may wait until the transmission has completed. For example:

```
//File: transmit.c
chan 8 c; // channel may have global scope
main( )
{
int 8 x, y;
c ! x; //program may wait until data
//successfully transmitted
c ! y;
}
//File: receive.c
extern chan c;
main( )
{
int 8 p, q;
``` c ? p;
c ? q;

Multi-File Projects

Introduction

One can combine multiple files a single project. The project can have a single main function or several. If there are multiple main functions within a single project, they can be loaded onto the same chip. Each main function can be associated with a different clock. The project can include libraries (pre-compiled Handel-C code) and blocks of foreign code (e.g. VHDL). EDIF and VHDL linking is done by synthesis tools.One can refer to functions, macros and shared expressions that have been defined in another file by prototyping them. One prototype by declaring an object at the top of the file in which it is used.

Function prototypes are in the following format:
return Type functionName(parameterTypeList);
Macro prototypes are like this:
macro expr Name(parameterList);
macro proc Name(parameterList);

Functions and macros may be static or extern. static functions and macros may only be used in the file where they are defined.

One can collect all the prototypes into a single header file and then #include it within the code files.

One can access variables declared in other files by using the extern keyword.

One cannot use variables to communicate between clock domains. Variables are restricted to a single clock domain. The only items that can connect across separate clock domains are channels and MPRAMs

Language Summary

Introduction

This section summarizes the previous sections by listing all the Handel-C types, statements and operators.

Type Summary

Figure 83:
FIG. 83 illustrates a table that lists all prefixes to the above types for different architectural object types, in accordance with one embodiment of the present invention.

FIG. 82 illustrates a table that lists the most common types that may be associated with a variable 8200, in accordance with one embodiment of the present invention. FIG. 83 illustrates a table that lists all prefixes to the above types for different architectural object types 8300, in accordance with one embodiment of the present invention.

Statement Summary

FIG. 84 illustrates a table that lists all statements in the Handel-C language 8400, in accordance with one embodiment of the present invention. The following table lists all statements in the Handel-C language. Note that the assignment group of operations and the increment and decrement operations are included as statements to reflect the fact that Handel-C expressions cannot contain side effects.

Operator Summary

FIGS. 85A and 85B illustrate a table that lists all operators in the Handel-C language 8500, in accordance with one embodiment of the present invention. In this table, entries at the top have the highest precedence and entries at the bottom have the lowest precedence. Entries within the same group have the same precedence. Note that function calls and assignments are not true operators in Handel-C.

Complete Language Syntax

Introduction

In this section of the present description, the complete Handel-C language syntax may be given in BNF-like notation.

Keyword Summary

FIGS. 86A through 86E illustrate a table that lists keywords 8600, in accordance with one embodiment of the present invention. The keywords listed below are reserved and cannot be used for any other purpose. Keywords not in ISO-C are in bold. The following character sequences are also reserved: * */ // #'".

Complete Language Syntax

The conventions used in this language reference are:

Terminal symbols are set in typewriter font like this.

Non-terminal symbols are set in italic font like this.

Square brackets [. . . ] denote optional components.

Braces {. . . } denotes zero, one or more repetitions of the enclosed components.

Braces with a trailing plus sign {. . . } + denote one or several repetitions of the enclosed components.

Parentheses ( . . . ) denote grouping.

Identifiers

Identifiers are sequences of letters, digits and _, starting with a letter. All characters in an identifier are meaningful and all identifiers are case sensitive.

identifier ::=letter {letter | 0 . . . 9}
letter::=A . . . Z | a . . . z |_

Integer Constant integer_constant ::=[−]{1 . . . 9 }+ {0 . . . 9}
| [−](0x | 0X){0 . . . 9 | A . . . F | a . . . f} +
| [−](0){0 . . . 7}
| [−](0b | 0B){0 . . . } +

Character Constants

FIG. 87A illustrates escape codes and their associated meanings 8700, in accordance with one embodiment of the present invention. Character is any printable character or any of the following escape codes.

Strings string ::="{character}"

Floating Point Constants float_constant::=
[{0 . . . 9}+].{0 . . . 9}+[(e | E)[+|−]{0 . . . 9}+][f| F | I | L]
| {0 . . . 9}+.[(e |E)[+|−]{0 . . . 9}+][f | F | I | L]
| {0 . . . 9}+(e |E)[+|−]{0 . . . 9}+[f | F | I | L]

Overview external_declaration ::= function_definition
| declaration
| set_statement;

Functions and Declarations function_definition ::= declaration_specifiers declarator compound_statement [with initialiser ;]
declarator compound_statement [ with initialiser;,]
declaration ::= declaration_specifiers [ init_declarator_list ] [with initialiser]
| interface_declaration
| macro_declaration
declaration_specifiers ::= storage_class_specifier [ declaration_specifiers]
| type_specifier [ declaration_specifiers]
| type_qualifier [ declaration_specifiers]
storage_class_specifier ::= auto
| register
| inline
| typedef
| extern
| static
type_specifier ::= void
| char

| short
| int
| long
| float
| double
| signed.
| unsigned
| typeof ( expression)
| signal_specifier
channel_specifier
ram_specifier
struct_or_union_specifier
enum_specifier
typedef_name
type_qualifier ::= const | volatile
typedef_name ::= identifier
init_declarator_list ::= declarator [= initialiser] { ,declarator [= initialiser]}
Macro/shared Exprs/procs
macro_declaration = macro_proc_decl
| macro_expr_decl
macro_proc_decl ::= [ static | extern] macro_pro_spec identifier
[([macro_param {, macro_param}])]
statement
[with initialiser ;]
macro_expr_decl ::= [ static | extern] macro_expr_spec identifier
[([macro_param{, macro_param} ]
)];
| [static | extern] macro_expr_spec identifier
[([macro_param{, macro_param}])] = let_initialiser
[with initialiser ]
macro_epro_spec ::= macro proc
| shared proc
macro_expr_spec ::= macro expr
| shared expr
let_initialiser ::=initialiser
| let macro_expr_decl in let_initialiser
macro_param ::= identifier
Interfaces
interface_declaration ::= interface identifier ( [ int_parameter_declaration
{ , int_parameter_declaration} ] )
identifier ([ assignment_expr_spec {,
assignment_expr_spec} ] ) [with
initialiser];
I interface_type_declarator
| old_style_interface_declarator
interface_type_declarator :: = interface identifier ( [ int_parameter_proto
{ , int_parameter_proto}])
identifier ( [ int_init_parameter_declaration { ,
int_init_parameter_declaration)} ]
)
This format is deprecated but retained for compatibility reasons
old_style_interface_declarator ::= interface identifier ( [
int_parameter_declaration
{,int_parameter_declaration}])
identifier ([ assignment_expr_spec {,
assignment_expr_spec})
[with initialiser ];
interface ::= [ static | extern] interface
int_parameter_proto:: = declaration_specifiers
| declaration_specifiers declarator
|declaration_specifiers abstract_declarator

| declaration_specifiers width
int_parameter_declaration ::= declaration_specifiers [with initialiser]
declaration_specifiers declarator [with initialiser]
declaration_specifiers abstract_declarator [with initialiser]
| declaration_specifiers width [with initialiser]
int_init_parameter_declaration ::= int_parameter_declaration
| declaration_specifiers declarator [ = initialiser] [with initialiser]
assignment_expr_spec ::= assignment_expression [with initialiser]
Structures and Unions
struct_or_union_specifier ::= aggregate_form [identifier]
{
{struct_declaration}+}
| aggregate_form identifier
aggregate_form ::= struct
| union
| mpram
struct_declaration ::= { type_specifier | type_qualifier}+
{struct_declarator}+[with initialiser ];
struct_declarator :: = declarator
| [declarator]: constant_expression
Enumerated Types
enum_specifier ::= enum [ identifier] { enumerator {,[ enumerator]} }
| enum identifier
enumerator ::= identifier
| identifier = constant_expression
Signal Specifiers
signal_specifier ::= signal < type_name >
| signal
Channel Specifiers
channel_specifier ::= chan [ < type_name > ]
| chanin [ < type_name > ]
| chanout [ < type_name > ]
Ram Specifiers
ram_specifier ::= ram [ < type_name > ]
| rom [ < type name > ]
| wom [ < type_name > ]
Declarators
declarator ::= [width] pointer direct_declarator
width ::= undefined
| primary_expression
direct_declarator ::= identifier
| (pointer direct_declarator )
| direct_declarator [ [constant_expression] ]
| direct_declarator ( [ {parameter_declaration}+ ] )
pointer ::= *
| * type_qualifier
| * pointer
| * type_qualifier pointer
Function Parameters
parameter_declaration ::= declaration_specifiers
| declaration_specifiers width
| declaration_specifiers abstract_declarator
| declaration_specifiers declarator
Type Names and Abstract Declarators
type_name::= { type_specifier | type_qualifier}+
| { type_specifier | type_qualifier}+ abstract_declarator
| { type specifier | type_qualifier}+ width
abstract_declarator ::= [width] pointer direct_abstract_declarator
direct_abstract_declarator ::= (pointer direct_abstract_declarator)
| [direct_abstract_declarator][ [constant_expression] ]

| [direct_abstract_declarator] ([ {parameter_declaration}+
]
)
Statements
statement ::= semi_statement;
| non_semi_statement
semi_statement ::= expression_statement
   |do statement while (expression)
   |jump_statement
   |assert (constant_expression[, assignment_expression{, assignment_expression}])
   |delay
   |channel_statement
   |set_statement
non_semi_statement::=labeled_statement
   |compound_statement
   |selection_statement
   |iteration_statement.
The following statements can appear in for start/end conditions for_statement::=non_semi_statement
   |expression_statement
   |do statement while (expression)
   |assert (constant_expression[, assignment_expression{, assignment_expression}])
   |delay
   |channel_statement
These are the statements that can appear in prialt blocks/
prialt_statement::=semi_statement;
   |non_semi_prialt_statement
non_semi_prialt_statement::=prialt_labeled_statement
   |compound_statement
   |selection_statement
   |iteration_statement
labeled_statement::=identifier:statement
   |case constant_expression:statement
   |default:statement
prialt_labeled_statement::=identifier:prialt_statement
   |case channel_statement:prialt_statement
   |default:prialt_statement
expression_statement::=[expression]
channel_statement::=unary_expression ! expression
   |logical_or_expression ? expression
jump_statement::=goto identifier
   |continue
   |break
   |return
   |return expression
selection_statement::=if (expression) statement %prec if
   |if (expression) statement else statement
   |ifselect (constant_expression) statement %prec if
   |ifselect (constant_expression) statement else statement.
   |switch (expression) statement
   |prialt {[{prialt_statement}+]}
set_statement::=set part=STRING
   |set clock=clock
   |set family=identifier
   |set intwidth=constant_expression
   |set intwidth=undefined
clock::=internal expression[with initialiser]
   |external expression[with initialiser ]
   |internal_divide expression expression[with initialiser]
   |external_divide expression expression[with initialiser]
iteration_statement::=while (expression) statement
   |for ([for_statement];[expression];[for_statement]) statement
Compound Statements with Replicators
compound_statement::=[seq|par] {{declaration}{statement}}
   |[seq|par]([repl_macro_param{, repl_macro_param}];
    constant_expression;
    [repl_update_param {, repl_update_param}])
    {{declaration}{statement}}
Replicator Rules
Replicator Initialisation Definitions
   repl_macro_param::=repl_param =initialiser
   |(repl_param =initialiser)
Replicator Update Definitions
   repl_update_param::=repl_update_param_body
   |(repl_update_param)
   repl_update_param_body::=repl_param assignment_operator initialiser
   |++repl_param
   |repl_param++
   |--repl_param
   |repl_param--
   repl_param::=identifier
   |(repl_param).
Expressions
   constant_expression::=assignment_expression
   expression::=assignment_expression
   |expression, assignment_expression}
   assignment_expression=conditional_expression
   |unary_expression assignment_operator assignment_expression
   assignment_operator::==|*=|/=|%=|+=|-=|<<=|>>=|&=|X|=||=
   initialiser =assignment_expression
   conditional_expression::=logical_or_expression
   |logical_or_expression ? expression:conditional_expression
   logical_or_expression::=logical_and_expression
   |logical_or_expression||logical_and_expression
   logical_and_expression=inclusive_or_expression
   |logical_and_expression && inclusive_or_expression
   inclusive_or_expression::=exclusive_or_expression
   |inclusive_or_expression|exclusive_or_expression
   exclusive_or_expression::=and_expression
   |exclusive_or_expression ^ and_expression
   and_expression::=equality_expression
   |and_expression & equality_expression
   equality_expression::=relational_expression
   |equality_expression==relational_expression
   |equality_expression!=relational_expression
   relational_expression::=cat_expression
   |relational_expression<cat_expression

|relational_expression>cat_expression
|relational_expression<=cat_expression
|relational_expression>=cat_expression
cat_expression::=shift_expression.
|cat_expression @ shift_expression
shift_expression::=additive_expression
|shift_expression<<additive_expression
|shift_expression>>additive_expression
additive_expression::=multiplicative_expression
|additive_expression+multiplicative _expression
|additive_expression−multiplicative_expression
multiplication _expression::=take_drop_expression
|multiplicative_expression*take_drop_expression
|multiplicative_expression/take_drop_expression
|multiplicative_expression % take_drop_expression
take_drop_expression::=cast_expression
|take_drop_expression← cast_expression
|take_drop_expression \\ cast_expression
cast_expression::=unary_expression
|(type_name) cast_expression
unary_expression::=postfix_expression
|++unary_expression
|−−unary_expression
|unary_operator cast_expression
|sizeof unary_expression
|sizeof (type_name)
|width (expression)
unary_operator::=&|+|−|~|!|*
postfix_expression::=select_expression
|postfix_expression[expression ]
|postfix_expression[expression:expression]
|postfix_expression[:expression ]
|postfix_expression[expression: ]
|postfix_expression[ ]
|postfix_expression ([assignment_expression
{, assignment_expression}])
|postfix_expression. identifier
|postfix_expression→identifier
|postfix_expression++.|postfix_expression−−
select_expression::=primary_expression
|select (constant_expression, constant_expression, constant_expression)
primary_expression=identifier
|constant
|(expression)
|{ }
|{[initialiser {, initialiser}[, ]]}
constant::=integer_constant
|character_constant
|string_constant
integer_constant::=NUMBER
character_constant::=CHARACTER
string_constant::=STRING
Program
  The overall syntax for the program is:
  program::={global_declaration}
  void main(void){
    {declaration}
    {statement}
Preprocessor
Introduction
  Handel-C is a programming language designed to enable the compilation of programs into synchronous hardware. Handel-C is not a hardware description language though; rather it is a programming language aimed at expressing algorithms from a high level.
  This second describes the Handel-C preprocessor. The Handel-C compiler may invoke the preprocessor automatically each time it compiles a program.
The GNU Preprocessor
  Handel-C does not use its own preprocessor. Rather it uses the GNU preprocessor written by the Free Software Foundation for the gcc C compiler. Since this section simply contains the text for the GNU C Preprocessor, not all statements may be relevant to the Handel-C compiler. For example, the section detailing the CPU predefined macros does not apply because the Handel-C program may not be executing on a processor at all.
C Preprocessor
Introduction
  The C preprocessor is a macro processor that is used automatically by the C compiler to transform the program before actual compilation. It is called a macro processor because it allows one to define macros, which are brief abbreviations for longer constructs.
  The C preprocessor provides four separate facilities that one can use as he or she sees fit:
    Inclusion of header files. These are files of declarations that can be substituted into the program.
    Macro expansion. One can define macros, which are abbreviations for arbitrary fragments of C code, and then the C preprocessor may replace the macros with their definitions throughout the program.
    Conditional compilation. Using special preprocessing directives, one can include or exclude parts of the program according to various conditions.
    Line control. If one uses a program to combine or rearrange source files into an intermediate file which is then compiled, he or she can use line control to inform the compiler of where each source line originally came from.
  C preprocessors vary in some details. This second discusses the GNU C preprocessor, the C Compatible Compiler Preprocessor.
  The GNU C preprocessor provides a superset of the features of ANSI Standard C. ANSI Standard C requires the rejection of many harmless constructs commonly used by today's C programs. Such incompatibility would be inconvenient for users, so the GNU C preprocessor is configured to accept these constructs by default. Strictly speaking, to get ANSI Standard C, one may use the options '-trigraphs', '-undef' and '-pedantic', but in practice the consequences of having strict ANSI Standard C make it undesirable to do this.
Transformations Made Globally
  Most C preprocessor features are inactive unless one gives specific directives to request their use. But there are three transformations that the preprocessor always makes on all the input it receives, even in the absence of directives.
    All C comments are replaced with single spaces.
    Backslash-Newline sequences are deleted, no matter where. This feature allows one to break long lines for cosmetic purposes without changing their meaning.

Predefined macro names are replaced with their expansions.

The first two transformations are done before nearly all other parsing and before preprocessing directives are recognized. Thus, for example, one can split a line cosmetically with Backslash-Newline anywhere (except when trigraphs are in use; see below).

```
/*
*/#/*
*/defi\
ne FO\
O 10\
20
``` is equivalent to '#define FOO 1020'. One can split even an escape sequence with Backslash-Newline. For example, one can split "foo\bar" between the '\' and the 'b' to get "foo\\
bar"

This behavior is unclean: in all other contexts, a Backslash can be inserted in a string constant as an ordinary character by writing a double Backslash, and this creates an exception. But the ANSI C standard requires it. (Strict ANSI C does not allow Newlines in string constants, so they do not consider this a problem.)

But there are a few exceptions to all three transformations.

C comments and predefined macro names are not recognized inside a '#include' directive in which the file name is delimited with '<' and '>'.

C comments and predefined macro names are never recognized within a character or string constant. (Strictly speaking, this is the rule, not an exception, but it is worth noting here anyway.)

Backslash-Newline may not safely be used within an ANSI "trigraph". Trigraphs are converted before Backslash-Newline is deleted. If one writes what looks like a trigraph with a Backslash-Newline inside, the Backslash-Newline is deleted as usual, but it is then too late to recognize the trigraph.

This exception is relevant only if one use the '-trigraphs' option to enable trigraph processing.

Preprocessing Directives

Most preprocessor features are active only if one uses preprocessing directives to request their use. Preprocessing directives are lines in the program that start with '#'. The '#' is followed by an identifier that is the directive name. For example, '#define' is the directive that defines a macro. Whitespace is also allowed before and after the '#'.

The set of valid directive names is fixed. Programs cannot define new preprocessing directives.

Some directive names require arguments; these make up the rest of the directive line and may be separated from the directive name by whitespace. For example, '#define' may be followed by a macro name and the intended expansion of the macro.

A preprocessing directive cannot be more than one line in normal circumstances. It may be split cosmetically with Backslash-Newline, but that has no effect on its meaning. Comments containing Newlines can also divide the directive into multiple lines, but the comments are changed to Spaces before the directive is interpreted. The only way a significant Newline can occur in a preprocessing directive is within a string constant or character constant. Note that most C compilers that might be applied to the output from the preprocessor do not accept string or character constants containing Newlines.

The '#' and the directive name cannot come from a macro expansion. For example, if 'f0o' is defined as a macro expanding to 'define', that does not make '#f0o' a valid preprocessing directive.

Header Files
Introduction

A header file is a file containing C declarations and macro definitions to be shared between several source files. A person may request the use of a header file in the program with the C preprocessing directive '#include'.

Uses of Header Files

Header files serve two kinds of purposes.

System header files declare the interfaces to parts of the operating system. A person may include them in the program to supply the definitions and declarations he or she needs to invoke system calls and libraries.

The header files contain declarations for interfaces between the source files of the program. Each time a person has a group of related declarations and macro definitions all or most of which are needed in several different source files, it is a good idea to create a header file for them.

Including a header file produces the same results in C compilation as copying the header file into each source file that needs it. But such copying would be time-consuming and error-prone. With a header file, the related declarations appear in only one place. If they need to be changed, they can be changed in one place, and programs that include the header file may automatically use the new version when next recompiled. The header file eliminates the labor of finding and changing all the copies as well as the risk that a failure to find one copy may result in inconsistencies within a program.

The usual convention is to give header files names that end with '.h'. Avoid unusual characters in header file names, as they reduce portability.

The '#include' Directive

Both user and system header files are included using the preprocessing directive '#include'. It has three variants:

include <file>

This variant is used for system header files. It searches for a file named file in a list of directories specified by you, then in a standard list of system directories. One may specify directories to search for header files with the command option '-I'. The option '-nostdinc' inhibits searching the standard system directories; in this case only the directories one specifies are searched.

The parsing of this form of '#include' is slightly special because comments are not recognized within the '<. . . >'. Thus, in '#include <x/*y>' the '/*' does not start a comment and the directive specifies inclusion of a system header file named 'x/*y'. Of course, a header file with such a name is unlikely to exist on Unix, where shell wildcard features would make it hard to manipulate. The argument file may not contain a '<' character. It may, however, contain a '>' character.

include "file"

This variant is used for header files of the program. It searches for a file named file first in the current directory, then in the same directories used for system header files. The current directory is the directory of the current input file. It is tried first because it is presumed to be the location of the files that the current input file refers to. (If the '-I-' option is used, the special treatment of the current directory is inhibited.)

The argument file may not contain "" characters. If backslashes occur within file, they are considered ordinary text characters, not escape characters. None of the character escape sequences appropriate to string constants in C are processed. Thus, '#include "x\n\\y"' specifies a filename containing three backslashes. It is not clear why this behavior is ever useful, but the ANSI standard specifies it.
include anything else This variant is called a computed #include. Any '#include' directive whose argument does not fit the above two forms is a computed include. The text anything else is checked for macro calls, which are expanded. When this is done, the result may fit one of the above two variants—in particular, the expanded text may in the end be surrounded by either quotes or angle braces.

This feature allows one to define a macro which controls the file name to be used at a later point in the program. One application of this is to allow a site-specific configuration file for the program to specify the names of the system include files to be used. This can help in porting the program to various operating systems in which the necessary system header files are found in different places.

How '#include' Works

The '#include' directive works by directing the C preprocessor to scan the specified file as input before continuing with the rest of the current file. The output from the preprocessor contains the output already generated, followed by the output resulting from the included file, followed by the output that comes from the text after the '#include' directive. For example, given a header file 'header.h' as follows, char *test ( );

and a main program called 'program.c' that uses the header file, like this, int x;
    #include "header.h"
    main( )
    {
    printf (test ( ));
    } the output generated by the C preprocessor for 'program.c' as input would be int x;
    char *test ( );
    main( )
    {
    printf (test ( ));
    }

Included files are not limited to declarations and macro definitions; those are merely the typical uses. Any fragment of a C program can be included from another file. The include file could even contain the beginning of a statement that is concluded in the containing file, or the end of a statement that was started in the including file. However, a comment or a string or character constant may not start in the included file and finish in the including file. An unterminated comment, string constant or character constant in an included file is considered to end (with an error message) at the end of the file.

It is possible for a header file to begin or end a syntactic unit such as a function definition, but that would be very confusing, so don't do it.

The line following the '#include' directive is always treated as a separate line by the C preprocessor even if the included file lacks a final newline.

Once-Only Include Files

Very often, one header file includes another. It can easily result that a certain header file is included more than once. This may lead to errors, if the header file defines structure types or typedefs, and is certainly wasteful. Therefore, it is often desired to prevent multiple inclusion of a header file.

The standard way to do this is to enclose the entire real contents of the file in a conditional, like this:

ifndef FILE_FOO_SEEN
    #define FILE_FOO_SEEN
    the entire file
    #endif/*FILE_FOO_SEEN*/

The macro FILE_FOO_SEEN indicates that the file has been included once already. In a user header file, the macro name should not begin with '_'. In a system header file, this name should begin with '_' to avoid conflicts with user programs. In any kind of header file, the macro name should contain the name of the file and some additional text, to avoid conflicts with other header files.

The GNU C preprocessor is programmed to notice when a header file uses this particular construct and handle it efficiently. If a header file is contained entirely in a '#ifndef' conditional, then it records that fact. If a subsequent '#include' specifies the same file, and the macro in the '#ifndef' is already defined, then the file is entirely skipped, without even reading it.

There is also an explicit directive to tell the preprocessor that it need not include a file more than once. This is called '#pragma once', and was used in addition to the '#ifndef' conditional around the contents of the header file. '#pragma once' is now obsolete and should not be used at all.

In the Objective C language, there is a variant of '#include' called '#import' which includes a file, but does so at most once. If one uses '#import' instead of '#include', then he or she doesn't need the conditionals inside the header file to prevent multiple execution of the contents.

'#import' is obsolete because it is not a well designed feature. It requires the users of a header file—the applications programmers—to know that a certain header file should only be included once. It is much better for the header file's implementor to write the file so that users don't need to know this. Using '#ifndef' accomplishes this goal.

Inheritance and Header Files

Inheritance is what happens when one object or file derives some of its contents by virtual copying from another object or file. In the case of C header files, inheritance means that one header file includes another header file and then replaces or adds something.

If the inheriting header file and the base header file have different names, then inheritance is straightforward: simply write '#include "base"' in the inheriting file.

Sometimes it is necessary to give the inheriting file the same name as the base file. This is less straightforward.

For example, suppose an application program uses the system header file 'sys/signal.h', but the version of '/usr/include/sys/signal.h' on a particular system doesn't do what the application program expects. It might be convenient to define a "local" version, perhaps under the name '/usr/local/include/sys/signal.h', to override or add to the one supplied by the system.

One can do this by using the option '-I.' for compilation, and writing a file 'sys/signal.h' that does what the application program expects. But making this file include the standard 'sys/signal.h' is not so easy—writing '#include<sys/signal.h>' in that file doesn't work, because it includes the version of the file, not the standard system version. Used in that file itself, this leads to an infinite recursion and a fatal error in compilation.

'#include</usr/include/sys/signal.h>' would find the proper file, but that is not clean, since it makes an assumption about where the system header file is found. This is bad for maintenance, since it means that any change in where the system's header files are kept requires a change somewhere else.

The clean way to solve this problem is to use '#include_next', which means, "Include the next file with this name." This directive works like '#include' except in searching for the specified file: it starts searching the list of header file directories after the directory in which the current file was found.

Suppose one specify '-I/usr/local/include', and the list of directories to search also includes '/usr/include'; and suppose that both directories contain a file named 'sys/signal.h'. Ordinary '#include<sys/signal.h>' finds the file under '/usr/local/include'. If that file contains '#include_next<sys/signal.h>', it starts searching after that directory, and finds the file in '/usr/include'..4. Macros Introduction A macro is a sort of abbreviation which one can define once and then use later. There are many complicated features associated with macros in the C preprocessor.

Simple Macros

A simple macro is a kind of abbreviation. It is a name which stands for a fragment of code. Some people refer to these as manifest constants.

Before one can use a macro, he or she may define it explicitly with the '#define' directive. '#define' is followed by the name of the macro and then the code it should be an abbreviation for. For example, define BUFFER_SIZE 1020 defines a macro named 'BUFFER_SIZE' as an abbreviation for the text '1020'. If somewhere after this '#define' directive there comes a C statement of the form foo=(char*) xmalloc (BUFFER_SIZE);

then the C preprocessor may recognize and expand the macro 'BUFFER_SIZE', resulting in foo=(char*) xmalloc (1020);

The use of all upper case for macro names is a standard convention. Programs are easier to read when it is possible to tell at a glance which names are macros. Normally, a macro definition may be a single line, like all C preprocessing directives. (One can split a long macro definition cosmetically with Backslash-Newline.) There is one exception: Newlines can be included in the macro definition if within a string or character constant. This is because it is not possible for a macro definition to contain an unbalanced quote character; the definition automatically extends to include the matching quote character that ends the string or character constant. Comments within a macro definition may contain Newlines, which make no difference since the comments are entirely replaced with Spaces regardless of their contents.

Aside from the above, there is no restriction on what can go in a macro body. Parentheses need not balance. The body need not resemble valid C code. (But if it does not, one may get error messages from the C compiler when one uses the macro.)

The C preprocessor scans the program sequentially, so macro definitions take effect at the place write them. Therefore, the following input to the C preprocessor:

foo=X;
define X 4
bar=X;
produces as output foo=X;
bar=4;

After the preprocessor expands a macro name, the macro's definition body is appended to the front of the remaining input, and the check for macro calls continues. Therefore, the macro body can contain calls to other macros. For example, after define BUFSIZE 1020
define TABLESIZE BUFSIZE the name 'TABLESIZE' when used in the program would go through two stages of expansion, resulting ultimately in '1020'. This is not at all the same as defining 'TABLESIZE' to be '1020'. The '#define' for 'TABLESIZE' uses exactly the body one specify—in this case, 'BUFSIZE'—and does not check to see whether it too is the name of a macro. It's only when one uses 'TABLESIZE' that the result of its expansion is checked for more macro names.

Macros with Arguments

A simple macro always stands for exactly the same text, each time it is used. Macros can be more flexible when they accept arguments. Arguments are fragments of code that one supplies each time the macro is used. These fragments are included in the expansion of the macro according to the directions in the macro definition. A macro that accepts arguments is called a function-like macro because the syntax for using it looks like a function call. To define a macro that uses arguments, one writes a '#define' directive with a list of argument names in parentheses after the name of the macro. The argument names may be any valid C identifiers, separated by commas and optionally whitespace. The open parenthesis may follow the macro name immediately, with no space in between.

For example, here is a macro that computes the minimum of two numeric values, as it is defined in many C programs:

define min(X, Y) ((X)<(Y) ? (X):(Y))

To use a macro that expects arguments, one writes the name of the macro followed by a list of actual arguments in parentheses, separated by commas. The number of actual arguments one gives may match the number of arguments the macro expects. Examples of use of the macro 'min' include '(1, 2)' and 'min (x+28, *p)'.

The expansion text of the macro depends on the arguments a person uses. Each of the argument names of the macro is replaced, throughout the macro definition, with the corresponding actual argument. Using the same macro 'min' defined above, 'min (1, 2)' expands into (1)<(2) ? (1): (2)) where '1' has been substituted for 'X' and '2' for 'Y'. Likewise, 'min (x+28, *p)' expands into.

((x+28)<(*p) ? (x+28):(*p))

Parentheses in the actual arguments may balance; a comma within parentheses does not end an argument. However, there is no requirement for brackets or braces to balance, and they do not prevent a comma from separating arguments. Thus, macro (array[x=y, x+1]) passes two arguments to macro: 'array[x=y' and 'x+1]'. If one wants to supply 'array[x=y, x+1]' as an argument, one may write it as 'array[(x=y, x+1)]', which is equivalent C code.

After the actual arguments are substituted into the macro body, the entire result is appended to the front of the remaining input, and the check for macro calls continues. Therefore, the actual arguments can contain calls to other macros, either with or without arguments, or even to the same macro. The macro body can also contain calls to other macros. For example, 'min (min (a, b), c)' expands into this text:

((((a)<(b) ? (a):(b)))<(c)
? (((a)<(b) ? (a):(b)))
:(c))

(Line breaks shown here for clarity would not actually be generated.) If a macro foo takes one argument, and one wants to supply an empty argument, he or she may write at least some whitespace between the parentheses, like this: 'foo ( )'. Just 'foo ( )' is providing no arguments, which is an error if foo expects an argument. But 'foo0 ( )' is the correct way to call a macro defined to take zero arguments, like this:

define foo0( )

If one uses the macro name followed by something other than an open-parenthesis (after ignoring any spaces, tabs and comments that follow), it is not a call to the macro, and the preprocessor does not change what he or she has written. Therefore, it is possible for the same name to be a variable or function in the program as well as a macro, and one can choose in each instance whether to refer to the macro (if an actual argument list follows) or the variable or function (if an argument list does not follow).

Such dual use of one name could be confusing and should be avoided except when the two meanings are effectively synonymous: that is, when the name is both a macro and a function and the two have similar effects. One can think of the name simply as a function; use of the name for purposes other than calling it (such as, to take the address) may refer to the function, while calls may expand the macro and generate better but equivalent code. For example, one can use a function named 'min' in the same source file that defines the macro. If one writes '&min' with no argument list, one refers to the function. If one writes 'min (x, bb)', with an argument list, the macro is expanded. If one writes '(min) (a, bb)', where the name 'min' is not followed by an open-parenthesis, the macro is not expanded, so one winds up with a call to the function 'min'.

One may not define the same name as both a simple macro and a macro with arguments. In the definition of a macro with arguments, the list of argument names may follow the macro name immediately with no space in between. If there is a space after the macro name, the macro is defined as taking no arguments, and all the rest of the line is taken to be the expansion. The reason for this is that it is often useful to define a macro that takes no arguments and whose definition begins with an identifier in parentheses. This rule about spaces makes it possible for one to do either this:

define FOO(x)−1/(x)

(which defines 'FOO' to take an argument and expand into minus the reciprocal of that argument) or this:

define BAR (x)−1/(x).

(which defines 'BAR' to take no argument and always expand into '(x)−1/(x)').

Note that the uses of a macro with arguments can have spaces before the left parenthesis; it's the definition where it matters whether there is a space.

Predefined Macros

Several simple macros are predefined. One can use them without giving definitions for them. They fall into two classes: standard macros and system-specific macros.

Standard Predefined Macros

The standard predefined macros are available with the same meanings regardless of the machine or operating system on which one is using GNU C. Their names all start and end with double underscores. Those preceding __GNUC__ in this table are standardized by ANSI C; the rest are GNU C extensions.

__FILE__

This macro expands to the name of the current input file, in the form of a C string constant. The precise name returned is the one that was specified in '#include' or as the input file name argument.

__LINE__

This macro expands to the current input line number, in the form of a decimal integer constant. While one can call it a predefined macro, it's a pretty strange macro, since its "definition" changes with each new line of source code. This and '__FILE__' are useful in generating an error message to report an inconsistency detected by the program; the message can state the source line at which the inconsistency was detected. For example, fprintf (stderr, "Internal error:"
"negative string length "
"%d at %s, line %d.",
length, __FILE__, __LINE__);

A '#include' directive changes the expansions of '__FILE__' and '__LINE__' to correspond to the included file. At the end of that file, when processing resumes on the input file that contained the '#include' directive, the expansions of '__FILE__' and '__LINE__' revert to the values they had before the '#include' (but '__LINE__' is then incremented by one as processing moves to the line after the '#include').

The expansions of both '__FILE__' and '__LINE__' are altered if a '#line' directive is used.

__DATE__

This macro expands to a string constant that describes the date on which the preprocessor is being run. The string constant contains eleven characters and looks like '"Jan 29 1987"' or '"Apr 1 1905"'.

__TIME__

This macro expands to a string constant that describes the time at which the preprocessor is being run. The string constant contains eight characters and looks like '"23:59:01"'

__STDC__

This macro expands to the constant 1, to signify that this is ANSI Standard C. (Whether that is actually true depends on what C compiler may operate on the output from the preprocessor.)

__STDC_VERSION__

This macro expands to the C Standard's version number, a long integer constant of the form 'yyyymmL' where yyyy and mm are the year and month of the Standard version. This signifies which version of the C Standard the preprocessor conforms to. Like '__STDC__', whether this version number is accurate for the entire implementation depends on what C compiler may operate on the output from the preprocessor.

__GNUC__

This macro is defined if and only if this is GNU C. This macro is defined only when the entire GNU C compiler is in use; if one invokes the preprocessor directly, '__GNUC__' is undefined.

The value identifies the major version number of GNU CC ('1' for GNU CC version 1, which is now obsolete, and '2' for version 2).

__GNUC_MINOR__

The macro contains the minor version number of the compiler. This can be used to work around differences between different releases of the compiler (for example, if gcc 2.6.3 is known to support a feature, one can test for __GNUC__>2||(__GNUC__==2 && __GNUC_MINOR__>= 6)). The last number, '3' in the example above, denotes the bugfix level of the compiler; no macro contains this value.

__GNUG__

The GNU C compiler defines this when the compilation language is C++; use '__GNUG__' to distinguish between GNU C and GNU C++.

__cplusplus

The draft ANSI standard for C++ used to require predefining this variable. Though it is no longer required, GNU C++ continues to define it, as do other popular C++ compilers. One can use '__cplusplus' to test whether a header is compiled by a C compiler or a C++ compiler.
__STRICT_ANSI__

This macro is defined if and only if the '-ansi' switch was specified when GNU C was invoked. Its definition is the null string. This macro exists primarily to direct certain GNU header files not to define certain traditional Unix constructs which are incompatible with ANSI C.
__BASE_FILE__

This macro expands to the name of the main input file, in the form of a C string constant. This is the source file that was specified as an argument when the C compiler was invoked.
__INCLUDE_LEVEL__

This macro expands to a decimal integer constant that represents the depth of nesting in include files. The value of this macro is incremented on every '#include' directive and decremented at every end of file. For input files specified by command line arguments, the nesting level is zero.
__VERSION__

This macro expands to a string which describes the version number of GNU C. The string is normally a sequence of decimal numbers separated by periods, such as '"2.6.0"'.

The only reasonable use of this macro is to incorporate it into a string constant.
__OPTIMIZE__

This macro is defined in optimizing compilations. It causes certain GNU header files to define alternative macro definitions for some system library functions. It is unwise to refer to or test the definition of this macro unless one makes very sure that programs may execute with the same effect regardless.
__CHAR_UNSIGNED__

This macro is defined if and only if the data type char is unsigned on the target machine. It exists to cause the standard header file 'limit.h' to work correctly. It is bad practice to refer to this macro; instead, it is best to refer to the standard macros defined in 'limit.h'. The preprocessor uses this macro to determine whether or not to sign-extend large character constants written in octal.
__REGISTER_PREFIX__

This macro expands to a string describing the prefix applied to cpu registers in assembler code. It can be used to write assembler code that is usable in multiple environments. For example, in the 'm68k-aout' environment it expands to the string '""', but in the 'm68k-coff' environment it expands to the string '"%"'.
__USER_LABEL_PREFIX__

This macro expands to a string describing the prefix applied to user generated labels in assembler code. It can be used to write assembler code that is usable in multiple environments. For example, in the 'm68k-aout' environment it expands to the string "_", but in the 'm68k-coff' environment it expands to the string'""'.

Nonstandard Predefined Macros

The C preprocessor normally has several predefined macros that vary between machines because their purpose is to indicate what type of system and machine is in use. This description, being for all systems and machines, cannot tell one exactly what their names are; instead, a list of some typical ones is offered. One can use 'cpp -dM' to see the values of predefined macros.

Some nonstandard predefined macros describe the operating system in use, with more or less specificity. For example, unix 'unix' is normally predefined on all Unix systems.

BSD

'BSD' is predefined on recent versions of Berkeley Unix. Other nonstandard predefined macros describe the kind of CPU, with more or less specificity. For example,
vax 'vax' is predefined on Vax computers.
mc68000

'mc68000' is predefined on most computers whose CPU is a Motorola 68000, 68010 or 68020.
m68k 'm68k' is also predefined on most computers whose CPU is a 68000, 68010 or 68020; however, some makers use 'mc68000' and some use 'm68k'. Some predefine both names. What happens in GNU C depends on the system one is using it on.
M68020

'M68020' has been observed to be predefined on some systems that use 68020 CPUs—in addition to 'mc68000' and 'm68k', which are less specific.
__AM29K, __AM29000

Both '__AM29K' and '__AM29000' are predefined for the AMD 29000 CPU family.
ns32000

'ns32000' is predefined on computers which use the National Semiconductor 32000 series CPU. Yet other nonstandard predefined macros describe the manufacturer of the system. For example,
sun 'sun' is predefined on all models of Sun computers.
Pyr 'pyr' is predefined on all models of Pyramid computers.
Sequent 'sequent' is predefined on all models of Sequent computers.

These predefined symbols are not only nonstandard, they are contrary to the ANSI standard because their names do not start with underscores. Therefore, the option '-ansi' inhibits the definition of these symbols.

This tends to make '-ansi' useless, since many programs depend on the customary nonstandard predefined symbols. Even system header files check them and may generate incorrect declarations if they do not find the names that are expected. One might think that the header files supplied for the Uglix computer would not need to test what machine they are running on, because they can simply assume it is the Uglix; but often they do, and they do so using the customary names. As a result, very few C programs may compile with '-ansi'. It is intended to avoid such problems on the GNU system.

What, then, should one do in an ANSI C program to test the type of machine it may run on? GNU C offers a parallel series of symbols for this purpose, whose names are made from the customary ones by adding '__' the beginning and end. Thus, the symbol __vax__ would be available on a Vax, and so on.

The set of nonstandard predefined names in the GNU C preprocessor is controlled (when cpp is itself compiled) by the macro 'CPP_PREDEFINES', which should be a string containing '-D' options, separated by spaces. For example, on the Sun 3, use the following definition is used:

define CPP_PREDEFINES "-Dmc68000 -Dsun -Dunix -Dm68k"

This macro is usually specified in 'tm.h'.
Stringification

Stringification means turning a code fragment into a string constant whose contents are the text for the code fragment. For example, stringifying 'foo (z)' results in '"foo (z)"'.

In the C preprocessor, stringification is an option available when macro arguments are substituted into the macro definition. In the body of the definition, when an argument name appears, the character '#' before the name specifies stringification of the corresponding actual argument when it is substituted at that point in the definition. The same argument may be substituted in other places in the definition without stringification if the argument name appears in those places with no '#'.

Here is an example of a macro definition that uses stringification:

```
#define WARN_IF(EXP)\
do {if (EXP) \
fprintf (stderr, "Warning: " #EXP "\n");}\
while (0)
```

Here the actual argument for 'EXP' is substituted once as given, into the 'if' statement, and once as stringified, into the argument to 'fprintf'. The 'do' and 'while (0)' are a kludge to make it possible to write 'WARN_IF (arg);', which the resemblance of 'WARN_IF' to a function would make C programmers want to do.

The stringification feature is limited to transforming one macro argument into one string constant: there is no way to combine the argument with other text and then stringify it all together. But the example above shows how an equivalent result can be obtained in ANSI Standard C using the feature that adjacent string constants are concatenated as one string constant. The preprocessor stringifies the actual value of 'EXP' into a separate string constant, resulting in text like.

```
do {if (x==0)\
fprintf (stderr, "Warning: " "x==0" "\n");}\
while (0)
``` but the C compiler then sees three consecutive string constants and concatenates them into one, producing effectively

```
do {if(x==0)\
fprintf (stderr, "Warning: x==0\n");}\
while (0)
```

Stringification in C involves more than putting double-quote characters around the fragment; it is necessary to put backslashes in front of all doublequote characters, and all backslashes in string and character constants, in order to get a valid C string constant with the proper contents. Thus, stringifying 'p="foo\n";' results in '"p=\"foo\\n\";"'. However, backslashes that are not inside of string or character constants are not duplicated: 'n' by itself stringifies to '"\n"'. Whitespace (including comments) in the text being stringified is handled according to precise rules. All leading and trailing whitespace is ignored. Any sequence of whitespace in the middle of the text is converted to a single space in the stringified result.

Concatenation

Concatenation means joining two strings into one. In the context of macro expansion, concatenation refers to joining two lexical units into one longer one. Specifically, an actual argument to the macro can be concatenated with another actual argument or with fixed text to produce a longer name. The longer name might be the name of a function, variable or type, or a C keyword; it might even be the name of another macro, in which case it may be expanded.

When one defines a macro, he or she requests concatenation with the special operator '##' in the macro body. When the macro is called, after actual arguments are substituted, all '##' operators are deleted, and so is any whitespace next to them (including whitespace that was part of an actual argument). The result is to concatenate the syntactic tokens on either side of the '##'.

Consider a C program that interprets named commands. There probably needs to be a table of commands, perhaps an array of structures declared as follows:

```
struct command
{
char *name;
void (*function) ( );
};
struct command commands[ ]=
{
{"quit", quit_command},
{"help", help_command},
...
};
```

It would be cleaner not to have to give each command name twice, once in the string constant and once in the function name. A macro which takes the name of a command as an argument can make this unnecessary. The string constant can be created with stringification, and the function name by concatenating the argument with '_command'. Here is how it is done:

```
#define COMMAND(NAME) {#NAME, NAME ## _command}
struct command commands[ ]=
{
COMMAND (quit),
COMMAND (help),
...
};
```

The usual case of concatenation is concatenating two names (or a name and a number) into a longer name. But this isn't the only valid case. It is also possible to concatenate two numbers (or a number and a name, such as '1.5' and 'e3') into a number. Also, multicharacter operators such as '+=' can be formed by concatenation. In some cases it is even possible to piece together a string constant. However, two pieces of text that don't together form a valid lexical unit cannot be concatenated. For example, concatenation with 'x' on one side and '+' on the other is not meaningful because those two characters can't fit together in any lexical unit of C. The ANSI standard says that such attempts at concatenation are undefined, but in the GNU C preprocessor it is well defined: it puts the 'x' and '+' side by side with no particular special results. Keep in mind that the C preprocessor converts comments to whitespace before macros are even considered. Therefore, one cannot create a comment by concatenating '/' and '*':the '/*' sequence that starts a comment is not a lexical unit, but rather the beginning of a "long" space character. Also, one can freely use comments next to a '##' in a macro definition, or in actual arguments that may be concatenated, because the comments may be converted to spaces at first sight, and concatenation may later discard the spaces.

Undefining Macros

To undefine a macro means to cancel its definition. This is done with the '#undef' directive. '#undef' is followed by the macro name to be undefined.

Like definition, undefinition occurs at a specific point in the source file, and it applies starting from that point. The name ceases to be a macro name, and from that point on it is treated by the preprocessor as if it had never been a macro name.

For example,

```
#define FOO 4
x=FOO;
#undef FOO
x=FOO;
``` expands into

```
x 4;
x=FOO;
```

In this example, 'FOO' had better be a variable or function as well as (temporarily) a macro, in order for the result of the expansion to be valid C code.

The same form of '#undef' directive may cancel definitions with arguments or definitions that don't expect arguments. The '#undef' directive has no effect when used on a name not currently defined as a macro.

Redefining Macros

Redefining a macro means defining (with '#define') a name that is already defined as a macro. A redefinition is trivial if the new definition is transparently identical to the old one. One probably wouldn't deliberately write a trivial redefinition, but they can happen automatically when a header file is included more than once, so they are accepted silently and without effect. Nontrivial redefinition is considered likely to be an error, so it provokes a warning message from the preprocessor. However, sometimes it is useful to change the definition of a macro in mid-compilation. One can inhibit the warning by undefining the macro with '#undef' before the second definition. In order for a redefinition to be trivial, the new definition may exactly match the one already in effect, with two possible exceptions:

• Whitespace may be added or deleted at the beginning or the end.• Whitespace may be changed in the middle (but not inside strings). However, it may not be eliminated entirely, and it may not be added where there was no whitespace at all. Recall that a comment counts as whitespace.

Pitfalls and Subtleties of Macros

In this section, some special rules are described that apply to macros and macro expansion, and point out certain cases in which the rules have counterintuitive consequences that one may watch out for.

Improperly Nested Constructs

Recall that when a macro is called with arguments, the arguments are substituted into the macro body and the result is checked, together with the rest of the input file, for more macro calls. It is possible to piece together a macro call coming partially from the macro body and partially from the actual arguments. For example,

```
#define double(x) (2*(x))
#define call_with_1(x) x(1)
``` would expand 'call_with_1 (double)' into '(2*(1))'. Macro definitions do not have to have balanced parentheses. By writing an unbalanced open parenthesis in a macro body, it is possible to create a macro call that begins inside the macro body but ends outside of it. For example,

```
#define strange(file) fprintf (file, "%s %d",
...
strange(stderr) p, 35)
```

This bizarre example expands to 'fprintf (stderr, "%s %d", p, 35)' !

Unintended Grouping of Arithmetic

One may have noticed that in most of the macro definition examples shown above, each occurrence of a macro argument name had parentheses around it. In addition, another pair of parentheses usually surround the entire macro definition. Here is why it is best to write macros that way.

Suppose one defines a macro as follows,

```
#define ceil_div(x, y) (x+y−1)/y
``` whose purpose is to divide, rounding up. (One use for this operation is to compute how many 'int' objects are needed to hold a certain number of 'char' objects.) Then suppose it is used as follows:

```
a =ceil_div (b & c, sizeof (int));
```

This expands into

```
a =(b & c+sizeof (int)−1) sizeof (int);
``` which does not do what is intended. The operator-precedence rules of C make it equivalent to this:

```
a=(b & (c+sizeof(int)−1))/ sizeof(int);
```

But what is desired is this:

```
a=((b & c)+sizeof(int)−1))/sizeof(int);
```

Defining the macro as

```
#define ceil_div(x, y) ((x)+(y)−1)/(y)
``` provides the desired result. However, unintended grouping can result in another way. Consider 'sizeof ceil_div(1, 2)'. That has the appearance of a C expression that would compute the size of the type of 'ceil_div (1, 2)', but in fact it means something very different. Here is what it expands to:

```
sizeof ((1)+(2)−1)/(2)
```

This would take the size of an integer and divide it by two. The precedence rules have put the division outside the 'sizeof' when it was intended to be inside. Parentheses around the entire macro definition can prevent such problems. Here, then, is the recommended way to define 'ceil_div':

```
#define ceil_div(x, y) (((x)+(y)−1)/ (y))
```

Swallowing the Semicolon

Often it is desirable to define a macro that expands into a compound statement. Consider, for example, the following macro, that advances a pointer (the argument 'p' says where to find it) across whitespace characters:

```
#define SKIP_SPACES (p, limit)\
{register char *lim =(limit);\
while (p !=lim){\
if (*p++!=''){\
p−−; break;}}}
```

Here Backslash-Newline is used to split the macro definition, which may be a single line, so that it resembles the way such C code would be laid out if not part of a macro definition. A call to this macro might be 'SKIP_SPACES (p, lim)'. Strictly speaking, the call expands to a compound statement, which is a complete statement with no need for a semicolon to end it. But it looks like a function call. So it minimizes confusion if one can use it. like a function call, writing a semicolon afterward, as in 'SKIP_SPACES (p, lim);'

But this can cause trouble before 'else' statements, because the semicolon is actually a null statement. Suppose one writes:

```
if (*p!=0)
SKIP_SPACES (p, lim);
else
...
```

The presence of two statements—the compound statement and a null statement—in between the 'if' condition and the 'else' makes invalid C code.

The definition of the macro 'SKIP_SPACES' can be altered to solve this problem, using a 'do . . . while' statement. Here is how:

```
#define SKIP_SPACES (p, limit)\
do {register char *lim =(limit);\
```

```
while (p!=lim){\
if (*p++!=' '){\
p--; break;}}}\
while (0)
```
Now 'SKIP_SPACES (p, lim);' expands into
```
do {. . .} while (0);
```
which is one statement.

Duplication of Side Effects

Many C programs define a macro 'min', for "minimum", like this:

define min(X, Y) ((X)<(Y) ? (X):(Y))

When one uses this macro with an argument containing a side effect, as shown here, next=min (x+y, foo (z));

it expands as follows:

next=((x+y)<(foo (z)) ? (x+y): (foo (z)));

where 'x+y' has been substituted for 'X' and 'foo (z)' for 'Y'. The function 'foo' is used only once in the statement as it appears in the program, but the expression 'foo (z)' has been substituted twice into the macro expansion. As a result, 'foo' might be called two times when the statement is executed. If it has side effects or if it takes a long time to compute, the results might not be what one intended. 'min' is declared an unsafe macro. The best solution to this problem is to define 'min' in a way that computes the value of 'foo (z)' only once. The C language offers no standard way to do this, but it can be done with GNU C extensions as follows:

```
#define min(X, Y)\
({typeof (X) __x=(X), __y=(Y);\
(__x<__y) ? __x:__y;})
```

If one does not wish to use GNU C extensions, the only solution is to be careful when using the macro 'min'. For example, one can calculate the value of 'foo (z)', save it in a variable, and use that variable in 'min':

```
#define min(X, Y) ((X)<(Y) ? (X):(Y))
. . .
{
int term=foo (z);
next=min (x+y, tem);
}
```
(where it is assumed that 'foo' returns type 'int').

Self-Referential Macros

A self-referential macro is one whose name appears in its definition. A special feature of ANSI Standard C is that the self-reference is not considered a macro call. It is passed into the preprocessor output unchanged.

Let's consider an example:

define foo (4+foo)

where 'foo' is also a variable in the program.

Following the ordinary rules, each reference to 'foo' may expand into '(4+foo)'; then this may be rescanned and may expand into '(4+(4+foo))'; and so on until it causes a fatal error (memory full) in the preprocessor.

However, the special rule about self-reference cuts this process short after one step, at '(4+foo)'. Therefore, this macro definition has the possibly useful effect of causing the program to add 4 to the value of 'foo' wherever 'foo' is referred to. In most cases, it is a bad idea to take advantage of this feature. A person reading the program who sees that 'foo' is a variable may not expect that it is a macro as well. The reader may come across the identifier 'foo' in the program and think its value should be that of the variable 'foo', whereas in fact the value is four greater.

The special rule for self-reference applies also to indirect self-reference. This is the case where a macro x expands to use a macro 'y', and the expansion of 'y' refers to the macro 'x'. The resulting reference to 'x' comes indirectly from the expansion of 'x', so it is a self-reference and is not further expanded. Thus, after define x (4+y)
define y (2*x)

'x' would expand into '(4+(2*x))'. Clear? But suppose 'y' is used elsewhere, not from the definition of 'x'. Then the use of 'x' in the expansion of 'y' is not a self-reference because 'x' is not "in progress". So it does expand. However, the expansion of 'x' contains a reference to 'y', and that is an indirect self-reference now because 'y' is "in progress". The result is that 'y' expands to '(2*(4+y))'. It is not clear that this behavior would ever be useful, but it is specified by the ANSI C standard, so one may need to understand it.

Separate Expansion of Macro Arguments

It has been explained that the expansion of a macro, including the substituted actual arguments, is scanned over again for macro calls to be expanded.

What really happens is more subtle: first each actual argument text is scanned separately for macro calls. Then the results of this are substituted into the macro body to produce the macro expansion, and the macro expansion is scanned again for macros to expand. The result is that the actual arguments are scanned twice to expand macro calls in them. Most of the time, this has no effect. If the actual argument contained any macro calls, they are expanded during the first scan. The result therefore contains no macro calls, so the second scan does not change it. If the actual argument were substituted as given, with no prescan, the single remaining scan would find the same macro calls and produce the same results. One might expect the double scan to change the results when a self-referential macro is used in an actual argument of another macro: the self-referential macro would be expanded once in the first scan, and a second time in the second scan.

But this is not what happens. The self-references that do not expand in the first scan are marked so that they may not expand in the second scan either.

The prescan is not done when an argument is stringified or concatenated. Thus, define str(s) #s
define foo 4
str (foo)

expands to '"foo"'. Once more, prescan has been prevented from having any noticeable effect. More precisely, stringification and concatenation use the argument as written, in unprescanned form. The same actual argument would be used in prescanned form if it is substituted elsewhere without stringification or concatenation.

define str(s) #s lose(s)
define foo 4
str (foo)

expands to '"foo" lose(4)'.

One might now ask, "Why mention the prescan, if it makes no difference? And why not skip it and make the preprocessor faster?" The answer is that the prescan does make a difference in three special cases:

Nested calls to a macro.

Macros that call other macros that stringify or concatenate.

Macros whose expansions contain unshielded commas.

Nested calls to a macro occur when a macro's actual argument contains a call to that very macro. For example, if 'f' is a macro that expects one argument, 'f(f(1))' is a nested pair of calls to 'f'. The desired expansion is made by expanding 'f(1)' and substituting that into the definition of 'f'. The prescan causes the expected result to happen. Without the prescan, 'f(1)' itself would be substituted as an actual argument, and the inner use of 'f' would appear during the main scan as an indirect self-reference and would not be expanded. Here, the prescan cancels an undesirable side effect (in the medical, not computational, sense of the term) of the special rule for self-referential macros. But prescan causes trouble in certain other cases of nested macro calls. Here is an example:

define foo a,b
define bar(x) lose(x)
define lose(x) (1+(x))
bar(foo)

It is desired that 'bar(foo)' turn into '(1+(foo))', which would then turn into '(1+(a,b))'. But instead, 'bar(foo)' expands into 'lose(a,b)', and one get an error because lose requires a single argument. In this case, the problem is easily solved by the same parentheses that ought to be used to prevent misnesting of arithmetic operations:

define foo (a,b)
define bar(x) lose((x))

The problem is more serious when the operands of the macro are not expressions; for example, when they are statements. Then parentheses are unacceptable because they would make for invalid C code:

define foo {int a, b; ... }.

In GNU C one can shield the commas using the '({...})' construct which turns a compound statement into an expression:

define foo ({int a, b; ... })

Or one can rewrite the macro definition to avoid such commas:

define foo{int a; int b; ... }

There is also one case where prescan is useful. It is possible to use prescan to expand an argument and then stringify it—if one uses two levels of macros. Let's add a new macro 'xstr' to the example shown above:

define xstr(s) str(s)
define str(s) #s
define foo 4
xstr (foo)

This expands into '"4"', not '"foo"'. The reason for the difference is that the argument of 'xstr' is expanded at prescan (because 'xstr' does not specify stringification or concatenation of the argument). The result of prescan then forms the actual argument for 'str'. 'str' uses its argument without prescan because it performs stringification; but it cannot prevent or undo the prescanning already done by 'xstr'.

Cascaded Use of Macros

A cascade of macros is when one macro's body contains a reference to another macro. This is very common practice. For example, define BUFSIZE 1020
define TABLESIZE BUFSIZE.

This is not at all the same as defining 'TABLESIZE' to be '1020'. The '#define' for 'TABLESIZE' uses exactly the body one specifies—in this case, 'BUFSIZE'—and does not check to see whether it too is the name of a macro.

It's only when one uses 'TABLESIZE' that the result of its expansion is checked for more macro names. This makes a difference if one changes the definition of 'BUFSIZE' at some point in the source file. 'TABLESIZE', defined as shown, may always expand using the definition of 'BUFSIZE' that is currently in effect:

define BUFSIZE 1020
define TABLESIZE BUFSIZE
undef BUFSIZE
define BUFSIZE 37

Now 'TABLESIZE' expands (in two stages) to '37'. (The '#undef' is to prevent any warning about the nontrivial redefinition of BUFSIZE.)

Newlines in Macro Arguments

Traditional macro processing carries forward all newlines in macro arguments into the expansion of the macro. This means that, if some of the arguments are substituted more than once, or not at all, or out of order, newlines can be duplicated, lost, or moved around within the expansion. If the expansion consists of multiple statements, then the effect is to distort the line numbers of some of these statements. The result can be incorrect line numbers, in error messages or displayed in a debugger. The GNU C preprocessor operating in ANSI C mode adjusts appropriately for multiple use of an argument—the first use expands all the newlines, and subsequent uses of the same argument produce no newlines. But even in this mode, it can produce incorrect line numbering if arguments are used out of order, or not used at all.

Here is an example illustrating this problem:

define ignore_second_arg(a,b,c) a; c
ignore_second_arg (foo ( ),
ignored ( ),
syntax error);

The syntax error triggered by the tokens 'syntax error' results in an error message citing line four, even though the statement text comes from line five.

Conditionals

Introduction

In a macro processor, a conditional is a directive that allows a part of the program to be ignored during compilation, on some conditions. In the C preprocessor, a conditional can test either an arithmetic expression or whether a name is defined as a macro. A conditional in the C preprocessor resembles in some ways an 'if' statement in C, but it is important to understand the difference between them. The condition in an 'if' statement is tested during the execution of the program. Its purpose is to allow the program to behave differently from run to run, depending on the data it is operating on. The condition in a preprocessing conditional directive is tested when the program is compiled. Its purpose is to allow different code to be included in the program depending on the situation at the time of compilation.

Why Conditionals are Used

Generally there are three kinds of reason to use a conditional.

A program may need to use different code depending on the machine or operating system it is to run on. In some cases the code for one operating system may be erroneous on another operating system; for example, it might refer to library routines that do not exist on the other system. When this happens, it is not enough to avoid executing the invalid code: merely having it in the program makes it impossible to link the program and run it. With a preprocessing conditional, the offending code can be effectively excised from the program when it is not valid.

One may want to be able to compile the same source file into two different programs. Sometimes the difference between the programs is that one makes frequent time-consuming consistency checks on its intermediate data, or prints the values of those data for debugging, while the other does not.

A conditional whose condition is always false is a good way to exclude code from the program but keep it as a sort of comment for future reference.

Most simple programs that are intended to run on only one machine may not need to use preprocessing conditionals.

Syntax of Conditionals

A conditional in the C preprocessor begins with a conditional directive: '#if', '#ifdef' or '#ifndef'. More information on '#ifdef' and '#ifndef' will be set forth hereinafter with only '#if' is explained here.

The '#if' Directive

The '#if' directive in its simplest form consists of if expression
controlled text
endif /*expression*/

The comment following the '#endif' is not required, but it is a good practice because it helps people match the '#endif' to the corresponding '#if'. Such comments should always be used, except in short conditionals that are not nested. In fact, one can put anything at all after the '#endif' and it may be ignored by the GNU C preprocessor, but only comments are acceptable in ANSI Standard C. expression is a C expression of integer type, subject to stringent restrictions. It may contain•

Integer constants, which are all regarded as long or unsigned long.

Character constants, which are interpreted according to the character set and conventions of the machine and operating system on which the preprocessor is running. The GNU C preprocessor uses the C data type 'char' for these character constants; therefore, whether some character codes are negative is determined by the C compiler used to compile the preprocessor. If it treats 'char' as signed, then character codes large enough to set the sign bit may be considered negative; otherwise, no character code is considered negative.

Arithmetic operators for addition, subtraction, multiplication, division, bitwise operations, shifts, comparisons, and logical operations ('&&' and '||').

Identifiers that are not macros, which are all treated as zero(!). Macro calls. All macro calls in the expression are expanded before actual computation of the expression's value begins. Note that 'sizeof' operators and enum-type values are not allowed. enum-type values, like all other identifiers that are not taken as macro calls and expanded, are treated as zero.

The controlled text inside of a conditional can include preprocessing directives. Then the directives inside the conditional are obeyed only if that branch of the conditional succeeds. The text can also contain other conditional groups. However, the '#if' and '#endif' directives may balance.

The '#else' Directive

The '#else' directive can be added to a conditional to provide alternative text to be used if the condition is false. This is what it looks like:

if expression
text-if-true
else /*Not expression*/
text-if-false
endif /*Not expression*/

If expression is nonzero, and thus the text-if-true is active, then '#else' acts like a failing conditional and the text-if-false is ignored. Contrariwise, if the '#if' conditional fails, the text-if-false is considered included.

The '#elif' Directive

One common case of nested conditionals is used to check for more than two possible alternatives. For example, one might have if X==1
...
else /*X!=1*/
if X==2
...
else /*X!=2*/
...
endif /*X!=2*/
endif /*X!=1*/

Another conditional directive, '#elif', allows this to be abbreviated as follows:

if X==1
...
elif X==2
...
else /*X!=2 and X!=1*/
endif /*X!=2 and X!=1*/

'#elif' stands for "else if". Like '#else', it goes in the middle of a '#if'-'#endif' pair and subdivides it; it does not require a matching '#endif' of its own. Like '#if', the '#elif' directive includes an expression to be tested.

The text following the '#elif' is processed only if the original '#if'-condition failed and the '#elif' condition succeeds. More than one '#elif' can go in the same '#if'-'#endif' group. Then the text after each '#elif' is processed only if the '#elif' condition succeeds after the original '#if' and any previous '#elif' directives within it have failed. '#else' is equivalent to '#elif 1', and '#else' is allowed after any number of '#elif' directives, but '#elif' may not follow '#else'.

Keeping Deleted Code for Future Reference

If one replaces or deletes a part of the program but want to keep the old code around as a comment for future reference, the easy way to do this is to put '#if 0' before it and '#endif' after it. This is better than using comment delimiters '/*' and '*/' since those won't work if the code already contains comments (C comments do not nest). This works even if the code being turned off contains conditionals, but they may be entire conditionals (balanced '#if' and '#endif').

Conversely, do not use '#if 0' for comments which are not C code. Use the comment delimiters '/*' and '*/' instead. The interior of '#if 0' may consist of complete tokens; in particular, single quote characters may balance. But comments often contain unbalanced singlequote characters (known in English as apostrophes). These confuse '#if 0'. They do not confuse '/*'.

Conditionals and Macros

Conditionals are useful in connection with macros or assertions, because those are the only ways that an expression's value can vary from one compilation to another. A '#if' directive whose expression uses no macros or assertions is equivalent to '#if 1' or '#if 0'; one might as well determine which one, by computing the value of the expression, and then simplify the program. For example, here is a conditional that tests the expression:

'BUFSIZE==1020', where 'BUFSIZE' may be a macro.
if BUFSIZE==1020

```
printf ("Large buffers!\n");
#endif /*BUFSIZE is large*/
```
(Programmers often wish they could test the size of a variable or data type in '#if', but this does not work. The preprocessor does not understand sizeof, or typedef names, or even the type keywords such as int.)

The special operator 'defined' is used in '#if' expressions to test whether a certain name is defined as a macro. Either 'defined name' or 'defined (name)' is an expression whose value is 1 if name is defined as macro at the current point in the program, and 0 otherwise. For the 'defined' operator it makes no difference what the definition of the macro is; all that matters is whether there is a definition. Thus, for example,

```
#if defined (vax)||defined (ns16000)
```
would succeed if either of the names 'vax' and 'ns16000' is defined as a macro. One can test the same condition using assertion, like this:

```
#if #cpu (vax)||#cpu (ns16000)
```
If a macro is defined and later undefined with '#undef', subsequent use of the 'defined' operator returns 0, because the name is no longer defined. If the macro is defined again with another '#define', 'defined' may recommence returning 1.

Conditionals that test whether just one name is defined are very common, so there are two special short conditional directives for this case.

ifdef name is equivalent to '#if defined (name)'.
ifndef name is equivalent to '#if ! defined (name)'.

Macro definitions can vary between compilations for several reasons.

Some macros are predefined on each kind of machine. For example, on a Vax, the name 'vax' is a predefined macro. On other machines, it would not be defined.

Many more macros are defined by system header files. Different systems and machines define different macros, or give them different values. It is useful to test these macros with conditionals to avoid using a system feature on a machine where it is not implemented.

Macros are a common way of allowing users to customize a program for different machines or applications. For example, the macro 'BUFSIZE' might be defined in a configuration file for the program that is included as a header file in each source file. One would use 'BUFSIZE' in a preprocessing conditional in order to generate different code depending on the chosen configuration.

Macros can be defined or undefined with '-D' and '-U' command options when one compiles the program. One can arrange to compile the same source file into two different programs by choosing a macro name to specify which program one want, writing conditionals to test whether or how this macro is defined and then controlling the state of the macro with compiler command options.

Assertions

Assertions are a more systematic alternative to macros in writing conditionals to test what sort of computer or system the compiled program may run on. Assertions are usually predefined, but one can define them with preprocessing directives or command-line options. The macros traditionally used to describe the type of target are not classified in any way according to which question they answer; they may indicate a hardware architecture, a particular hardware model, an operating system, a particular version of an operating system, or specific configuration options. These are jumbled together in a single namespace. In contrast, each assertion consists of a named question and an answer. The question is usually called the predicate. An assertion looks like this:

predicate (answer)

One may use a properly formed identifier for predicate. The value of answer can be any sequence of words; all characters are significant except for leading and trailing whitespace, and differences in internal whitespace sequences are ignored. Thus, 'x+y' is different from 'x+y' but equivalent to 'x+y'. ')' is not allowed in an answer.

Here is a conditional to test whether the answer is asserted for the predicate: #if # predicate (answer) There may be more than one answer asserted for a given predicate. If one omit the answer, one can test whether any answer is asserted for predicate: #if # predicate Most of the time, the assertions one test may be predefined assertions. GNU C provides three predefined predicates: system, cpu, and machine. system is for assertions about the type of software, cpu describes the type of computer architecture, and machine gives more information about the computer. For example, on a GNU system, the following assertions would be true:

system (gnu)
system (mach)
system (mach 3)
system (mach 3. subversion)
system (hurd)
system (hurd version)

and perhaps others. The alternatives with more or less version information let one ask more or less detailed questions about the type of system software. On a Unix system, one would find #system (unix) and perhaps one of: #system (aix), #system (bsd), #system (hpux), #system (lynx), #system (mach), #system (posix), #system (svr3), #system (svr4), or #system (xpg4) with possible version numbers following.

Other values for system are #system (mvs) and #system (vms). Portability note: Many Unix C compilers provide only one answer for the system assertion: #system (unix), if they support assertions at all. This is less than useful. An assertion with a multi-word answer is completely different from several assertions with individual single-word answers. For example, the presence of system (mach 3.0) does not mean that system (3.0) is true. It also does not directly imply system (mach), but in GNU C, that last may normally be asserted as well.

The current list of possible assertion values for cpu is:

cpu
(a29k), #cpu (alpha), #cpu (arm), #cpu (clipper), #cpu
(convex), #cpu (elxsi), #cpu (tron), #cpu (h8300), #cpu
(i370), #cpu (i386), #cpu (i860), #cpu (i960), #cpu
(m68k),
cpu (m88k), #cpu (mips), #cpu (ns32k), #cpu (hppa),
cpu
(pyr), #cpu (ibm032), #cpu (rs6000), #cpu (sh), #cpu.
(sparc), #cpu (spur), #cpu (tahoe), #cpu (vax), #cpu
(we32000).

One can create assertions within a C program using '#assert', like this:

assert predicate (answer)

(Note the absence of a '#' before predicate.)

Each time one does this, one asserts a new true answer for predicate. Asserting one answer does not invalidate previously asserted answers; they all remain true. The only way to remove an assertion is with '#unassert'. '#unassert' has the same syntax as '#assert'. One can also remove all assertions about predicate like this: #unassert predicate. One can also add or cancel assertions using command options when he or she runs gcc or cpp.
The '#error' and '#warning' Directives The directive '#error' causes the preprocessor to report a fatal error. The rest of the line that follows '#error' is used as the error message.

One would use '#error' inside of a conditional that detects a combination of parameters which he or she knows the program does not properly support. For example, if one knows that the program may not run properly on a Vax, one might write ifdef_vax_
error Won't work on Vaxen. See comments at
get_last_object.
endif

If one has several configuration parameters that may be set up by the installation in a consistent way, he or she can use conditionals to detect an inconsistency and report it with '#error'. For example, if HASH_TABLE_SIZE%2==0||HASH_TABLE_SIZE%3 ==0\
||HASH_TABLE_SIZE%5 ==0
error HASH_TABLE_SIZE should not be divisible by
 a small \
prime
endif The directive '#warning' is like the directive '#error', but causes the preprocessor to issue a warning and continue preprocessing. The rest of the line that follows '#warning' is used as the warning message.

One might use '#warning' in obsolete header files, with a message directing the user to the header file which should be used instead.

Additional Preprocessor Information
Combining Source Files

One of the jobs of the C preprocessor is to inform the C compiler of where each line of C code came from: which source file and which line number.

C code can come from multiple source files if one use '#include'; both '#include' and the use of conditionals and macros can cause the line number of a line in the preprocessor output to be different from the line's number in the original source file. One may appreciate the value of making both the C compiler (in error messages) and symbolic debuggers such as GDB use the line numbers in the source file.

The C preprocessor builds on this feature by offering a directive by which one can control the feature explicitly. This is useful when a file for input to the C preprocessor is the output from another program such as the bison parser generator, which operates on another file that is the true source file. Parts of the output from bison are generated from scratch, other parts come from a standard parser file. The rest are copied nearly verbatim from the source file, but their line numbers in the bison output are not the same as their original line numbers. Naturally one would like compiler error messages and symbolic debuggers to know the original source file and line number of each line in the bison input.

bison arranges this by writing '#line' directives into the output file. '#line' is a directive that specifies the original line number and source file name for subsequent input in the current preprocessor input file '#line' has three variants:
line linenum Here linenum is a decimal integer constant. This specifies that the line number of the following line of input, in its original source file, was linenum.
line linenum filename Here linenum is a decimal integer constant and filename is a string constant. This specifies that the following line of input came originally from source file filename and its line number there was linenum. Keep in mind that filename is not just a file name; it is surrounded by doublequote characters so that it looks like a string constant.
line anything else anything else is checked for macro calls, which are expanded. The result should be a decimal integer constant followed optionally by a string constant, as described above.

'#line' directives alter the results of the '__FILE__' and '__LINE__' predefined macros from that point on.

The output of the preprocessor (which is the input for the rest of the compiler) contains directives that look much like '#line' directives. They start with just '#' instead of '#line', but this is followed by a line number and file name as in '#line'.
Miscellaneous Preprocessing Directives This section describes three additional preprocessing directives. They are not very useful, but are mentioned for completeness. The null directive consists of a '#' followed by a Newline, with only whitespace (including comments) in between. A null directive is understood as a preprocessing directive but has no effect on the preprocessor output. The primary significance of the existence of the null directive is that an input line consisting of just a '#' may produce no output, rather than a line of output containing just a '#'. Supposedly some old C programs contain such lines.

The ANSI standard specifies that the '#pragma' directive has an arbitrary, implementation defined effect. In the GNU C preprocessor, '#pragma' directives are not used, except for '#pragma once'. However, they are left in the preprocessor output, so they are available to the compilation pass. The '#ident' directive is supported for compatibility with certain other systems. It is followed by a line of text. On some systems, the text is copied into a special place in the object file; on most systems, the text is ignored and this directive has no effect. Typically '#ident' is only used in header files supplied with those systems where it is meaningful.
C Preprocessor Output The output from the C preprocessor looks much like the input, except that all preprocessing directive lines have been replaced with blank lines and all comments with spaces. Whitespace within a line is not altered; however, a space is inserted after the expansions of most macro calls.

Source file name and line number information is conveyed by lines of the form linenum filename flags which are inserted as needed into the middle of the input (but never within a string or character constant). Such a line means that the following line originated in file filename at line linenum.

After the file name comes zero or more flags, which are '1', '2', '3', or '4'. If there are multiple flags, spaces separate them. Here is what the flags mean:

'1' This indicates the start of a new file.
'2' This indicates returning to a file (after having included another file).
'3' This indicates that the following text comes from a system header file, so certain warnings should be suppressed.
'4' This indicates that the following text should be treated as C.

Invoking the C Preprocessor
Introduction

Most often when one uses the C preprocessor he or she may not have to invoke it explicitly: the C compiler may do so automatically. However, the preprocessor is sometimes useful on its own. The C preprocessor expects two file names as arguments, infile and outfile. The preprocessor reads infile together with any other files it specifies with '#include'. All the output generated by the combined input files is written in outfile. Either infile or outfile may be '-', which as infile means to read from standard input and as outfile means to write to standard output. Also, if outfile or both file names are omitted, the standard output and standard input are used for the omitted file names.

Command Line Options

Here is a table of command options accepted by the C preprocessor. These options can also be given when compiling a C program; they are passed along automatically to the preprocessor when it is invoked by the compiler.

'-P'

Inhibit generation of '#'-lines with line-number information in the output from the preprocessor. This might be useful when running the preprocessor on something that is not C code and may be sent to a program which might be confused by the '#'-lines.

'-C'

Do not discard comments: pass them through to the output file. Comments appearing in arguments of a macro call may be copied to the output before the expansion of the macro call.

'-traditional'

Try to imitate the behavior of old-fashioned C, as opposed to ANSI C.

Traditional macro expansion pays no attention to single-quote or doublequote characters; macro argument symbols are replaced by the argument values even when they appear within apparent string or character constants.

Traditionally, it is permissible for a macro expansion to end in the middle of a string or character constant. The constant continues into the text surrounding the macro call.

However, traditionally the end of the line terminates a string or character constant, with no error.

In traditional C, a comment is equivalent to no text at all. (In ANSI C, a comment counts as whitespace.)

Traditional C does not have the concept of a "preprocessing number". It considers '1.0e+4' to be three tokens: '1.0e', '+', and '4'.

A macro is not suppressed within its own definition, in traditional C. Thus, any macro that is used recursively inevitably causes an error.

The character '#' has no special meaning within a macro definition in traditional C.

In traditional C, the text at the end of a macro expansion can run together with the text after the macro call, to produce a single token. (This is impossible in ANSI C.)

• Traditionally, '\' inside a macro argument suppresses the syntactic significance of the following character.

'-trigraphs'

Process ANSI standard trigraph sequences. These are three-character sequences, all starting with '??', that are defined by ANSI C to stand for single characters. For example, '??/' stands for '\', so "??/n" is a character constant for a newline. Strictly speaking, the GNU C preprocessor does not support all programs in ANSI Standard C unless '-trigraphs' is used, but if one ever notices the difference it may be with relief.

One doesn't want to know any more about trigraphs.

'-pedantic'

Issue warnings required by the ANSI C standard in certain cases such as when text other than a comment follows '#else' or '#endif'.

'-pedantic-errors'

Like '-pedantic', except that errors are produced rather than warnings.

'-Wtrigraphs'

Warn if any trigraphs are encountered (assuming they are enabled).

'-Wcomment'

Warn whenever a comment-start sequence '/*' appears in a comment.

'-Wall'

Requests both '-Wtrigraphs' and '-Wcomment' (but not '-Wtraditional').

'-Wtraditional'

Warn about certain constructs that behave differently in traditional and ANSI C.

'-I directory'

Add the directory to the head of the list of directories to be searched for header file. This can be used to override a system header file, substituting the version, since these directories are searched before the system header file directories. If one uses more than one '-I' option, the directories are scanned in left-to-right order; the standard system directories come after.

'-I-'

Any directories specified with '-I' options before the '-I-' option are searched only for the case of '#include "file"'; they are not searched for '#include<file>'. If additional directories are specified with '-I' options after the '-I-', these directories are searched for all '#include' directives. In addition, the '-I-' option inhibits the use of the current directory as the first search directory for '#include "file"'. Therefore, the current directory is searched only if it is requested explicitly with '-I.'. Specifying both '-I-' and '-I.' allows one to control precisely which directories are searched before the current one and which are searched after.

'-nostdinc'

Do not search the standard system directories for header files. Only the directories one have specified with '-I' options (and the current directory, if appropriate) are searched.

'-nostdinc++'

Do not search for header files in the C++-specific standard directories, but do still search the other standard directories. (This option is used when building libg++.)

'-D name'

Predefine name as a macro, with definition '1'.

'-D name=definition'

Predefine name as a macro, with definition. There are no restrictions on the contents of definition, but if one is invoking the preprocessor from a shell or shell-like program one may need to use the shell's quoting syntax to protect characters such as spaces that have a meaning in the shell syntax. If one uses more than one '-D' for the same name, the rightmost definition takes effect.

'-U name'

Do not predefine name. If both '-U' and '-D' are specified for one name, the '-U' beats the '-D' and the name is not predefined.

'-undef'

Do not predefine any nonstandard macros.

'-A predicate(answer)'

Make an assertion with the predicate and answer.

One can use '-A-' to disable all predefined assertions; it also undefines all predefined macros that identify the type of target system.

'-dM'

Instead of outputting the result of preprocessing, output a list of '#define' directives for all the macros defined during the execution of the preprocessor, including predefined macros. This gives one a way of finding out what is predefined in the version of the preprocessor; assuming one have no file 'foo.h', the command touch foo.h; cpp -dM foo.h may show the values of any predefined macros.

'-dD'

Like '-dM' except in two respects: it does not include the predefined macros, and it outputs both the '#define' directives and the result of preprocessing. Both kinds of output go to the standard output file.

'-M[-MG]'

Instead of outputting the result of preprocessing, output a rule suitable for make describing the dependencies of the main source file. The preprocessor outputs one make rule containing the object file name for that source file, a colon, and the names of all the included files. If there are many included files then the rule is split into several lines using '\'-newline.

'-MG' says to treat missing header files as generated files and assume they live in the same directory as the source file. It may be specified in addition to '-M'.

'-MM[-MG]'

Like '-M' but mention only the files included with '#include "file"'. System header files included with '#include<file>' are omitted.

'-MD file'

Like '-M' but the dependency information is written to file. This is in addition to compiling the file as specified—'-MD' does not inhibit ordinary compilation the way '-M' does. When invoking gcc, do not specify the file argument. Gcc may create file names made by replacing ".c" with ".d" at the end of the input file names. In Mach, one can use the utility md to merge multiple dependency files into a single dependency file suitable for using with the 'make' command.

'-MMD file'

Like '-MD' except mention only user header files, not system header files.

'-H'

Print the name of each header file used, in addition to other normal activities.

'-imacros file'

Process file as input, discarding the resulting output, before processing the regular input file. Because the output generated from file is discarded, the only effect of '-imacros file' is to make the macros defined in file available for use in the main input.

'-include file'

Process file as input, and include all the resulting output, before processing the regular input file.

'-idirafter dir'

Add the directory dir to the second include path. The directories on the second include path are searched when a header file is not found in any of the directories in the main include path (the one that '-I' adds to).

'-iprefix prefix'

Specify prefix as the prefix for subsequent '-iwithprefix' options.

'-iwithprefix dir'

Add a directory to the second include path. The directory's name is made by concatenating prefix and dir, where prefix was specified previously with '-iprefix'.

'-isystem dir'

Add a directory to the beginning of the second include path, marking it as a system directory, so that it gets the same special treatment as is applied to the standard system directories.

'-lang-c'
'-lang-c89'
'-lang-c++'
'-lang-objc'
'-lang-objc++'

Specify the source language. '-lang-c' is the default; it allows recognition of C++ comments (comments that begin with '//' and end at end of line), since this is a common feature and it may most likely be in the next C standard. '-lang-c89' disables recognition of C++ comments. '-lang-c++' handles C++ comment syntax and includes extra default include directories for C++. '-lang-objc' enables the Objective C '#import' directive. '-lang-objc++' enables both C++ and Objective C extensions. These options are generated by the compiler driver gcc, but not passed from the 'gcc' command line unless one use the driver's '-Wp' option.

'-lint'

Look for commands to the program checker lint embedded in comments, and emit them preceded by '#pragma lint'.

For example, the comment '/*NOTREACHED*/' becomes '#pragma lint NOTREACHED'. This option is available only when one call cpp directly; gcc may not pass it from its command line.

'-$'

Forbid the use of '$' in identifiers. This is required for ANSI conformance. gcc automatically supplies this option to the preprocessor if one specify '-ansi', but gec doesn't recognize the '-$' option itself—to use it without the other effects of '-ansi', one may call the preprocessor directly.

FPGA-Based Co-Processor API

The present section specifies in detail the performance and functional specification of one embodiment of the present invention. The present section describes how the various requirements are to be met. It also documents all the tests necessary to verify that each Handel-C and/or software unit functions correctly and that they integrate to work as one complete application.

In the context of the present section, various embodiments will now be set forth, and further elaborated upon subsequently during reference to FIGS. 88 through 92. It should be noted that the present embodiments are also particularly pertinent to the earlier discussions of parameterized macros under the heading "Parameterized macro expressions" set forth hereinabove during reference to FIG. 57A-2 and subsequent figures.

Figure 87B:
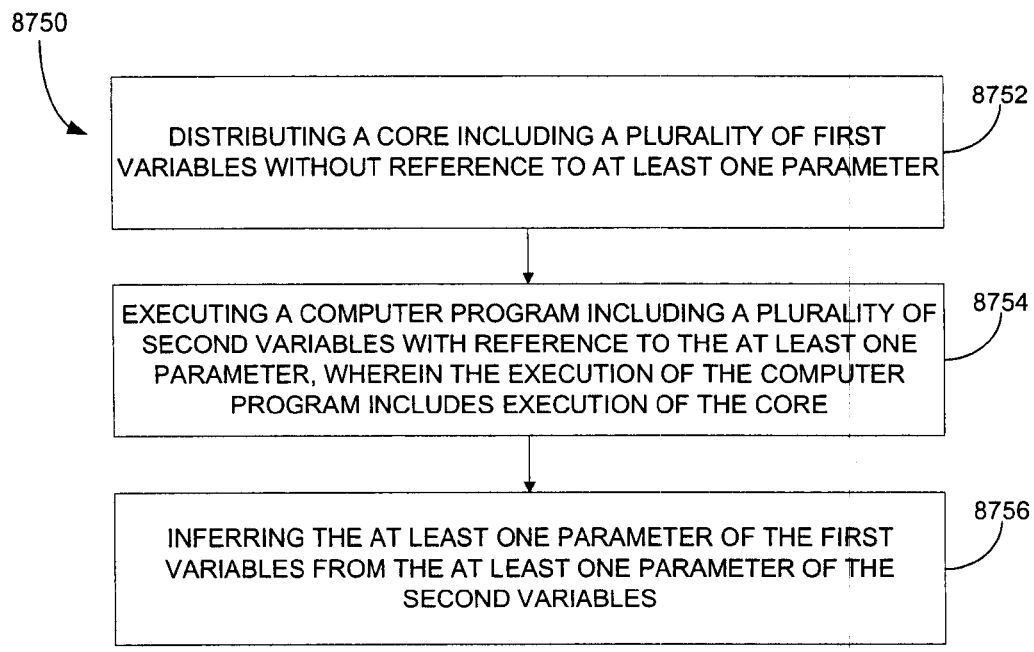
FIG. 87B illustrates a method for distributing cores, in accordance with one embodiment of the present invention.

FIG. 87B illustrates a method 8750 for distributing cores, in accordance with one embodiment of the present invention. In general, in operation 8752, a core that includes a plurality of first variables is distributed without reference to at one or more parameters. In one aspect of the present invention, the core may be distributed over a network. As an option, the network may include the Internet.

In one embodiment, the one or more parameters may include variable width. In further aspect, the one or more parameters may include data type. In even another aspect, the one or more parameters may include array size. In another aspect, the one or more parameters may include pipeline depth.

A computer program is then executed that includes a plurality of second variables with reference to the one or more parameter. See operation 8754. The execution of the computer program includes execution of the core. The one or more parameters of the first variables are then inferred from the one or more parameters of the second variables. See operation 8756.

By this design, the various principles disclosed herein may be used in a distributed environment where cores may be disseminated utilizing a network, and used by various computer applications.

Figure 87C:
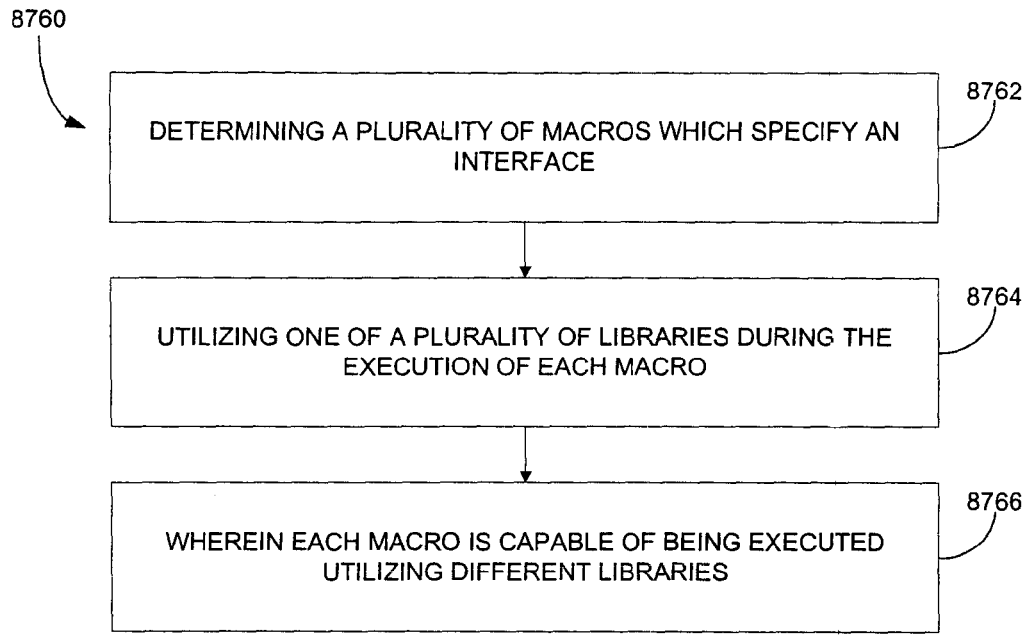
FIG. 87C illustrates a method for using a library map during the design of cores, in accordance with one embodiment of the present invention.

FIG. 87C illustrates a method 8760 for using a library map during the design of cores, in accordance with one embodiment of the present invention. In general, in operation 8762, a plurality of macros which specify an interface is determined. In one aspect, the macros may be compiled in a file.

During the execution of each of macro, one of a plurality of libraries is utilized in operation 8764. Each macro is capable of being executed utilizing different libraries. Note operation 8766. As an option, the macros may be executed on a co-processor which is capable of executing the macros utilizing different libraries.

In one embodiment of the present invention, a plurality of first variables in the macros may also be defined with reference to variable widths, and a plurality of second variables in the macros may be defined without reference to variable widths so that the variable widths of the second variables may be inferred from the variable widths of the first variables.

The present invention is thus adapted for automatically generating libraries for use in distributing software components without requiring the software components to be completely defined. The system receives a behavioral description of the system components and determines the optimal required functionality between hardware and software and provides that functionality while varying the parameters (e.g. size or power) of the hardware and/or software. Thus, for instance, the hardware and the processors for the software can be formed on a reconfigurable logic device, each being no bigger than is necessary to form the desired functions. The codesign system outputs a description of the required processors, machine code to run on the processors, and a net list or register transfer level description of the necessary hardware. It is possible for the user to write some parts of the description of the system at register transfer level to give closer control over the operation of the system, and the user can specify the processor or processors to be used, and can change, for instance, the partitioner, compilers or speed estimators used in the codesign system. Since the library has the latest technology in dynamic widths, the libraries are flexible in their ability to store and dynamically update their components based on the characteristics of a resolved system.

In another aspect of the present invention, a set of macros is initially developed to specify an interface. The hardware interface is thus specified using software macros. For example, a macro that says add A+B=C may translate into an adder with two input ports and an output.

As an option, a Handel-C file and a header file may be implemented with the declarations for the macros or file.

Thereafter, the C file may be compiled into a library. The variables may not be fully resolved at this point. The Handel C compiler may do width inferencing when the library is utilized in a program call. A width of constant values or a whole expression may inferred. External references may also be made to another macro that may not be in that particular library that was resolved to the other library when the call was invoked. Function pointers can also encapsulate a whole piece of hardware which can be resolved at runtime.

For example, in a system with two memory banks connected together in a FPGA, a pointer may point to a function pointer. Then, such function pointer can be assigned to any function and have several (i.e. seven (7)) functions that can be pointed to by the function pointer. Then, at runtime it could be resolved using the Handel-C RAM function to point to different memory banks to implement a multiplexor to any of the memory banks.

In another embodiment, three different graphic adapters could be defined by three different functions that were pointed to by a single function pointer. Such single function pointer could be changed at runtime to point to particular circuitry of the particular adapter that is to be executed. Also, the functionality of the device may be encapsulated in the API structure to switch between various video cards.

One example of such concept will be set forth hereinafter under the heading "Application Layer User Function Interface." Such example utilizes a FPGA co-processor to pass the structure USER API Structure containing function pointers.

In use, when a programmer writes an expression once, he or she does not need to recode it every time. A macro is provided that compiles into a function that does something, but the programmer does not know what it does. One does not need the declarations for this call. Two very different functions are processed: version 1 or version 2; based on which one is enabled. This method is thus very configurable.

An arithmetic logic unit is defined that has a binary library and a floating point library. Then, in a co-processor system, one could point to one or the other of the platforms. The design of two different IP cores may be skipped, since two different versions of the IP Cores may be produced for the two different libraries. The functions may be used to make calls to the various points of the hardware from the pointers in the header file.

Figure 90:
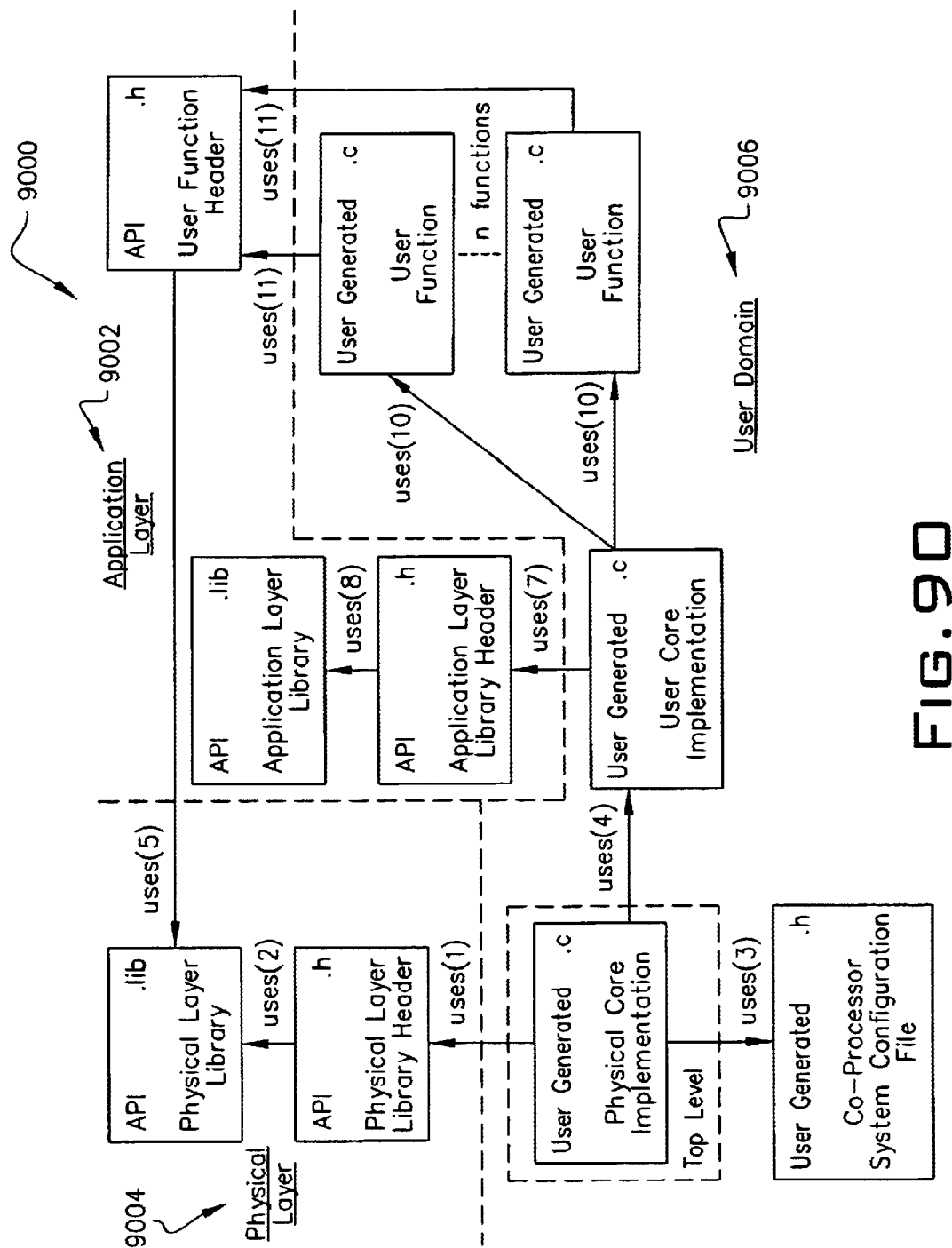
FIG. 90 is a schematic diagram of the application layer, physical layer, and user domain, in accordance with one embodiment of the present invention.

All of this may be done in the context of a co-processor system. As shown in FIG. 90, an Application Layer library and a Physical Layer library are provided. For each platform for which there is memory, one would have a separate library that defines the particular platform and its unique memory handling techniques. Header files that accompany the libraries may be called by User Core Implementation to access the memory of the physical core. It should be noted that the physical layer is set forth hereinafter in greater detail in the section under the heading "Physical Layer Interface."

Figure 87D:
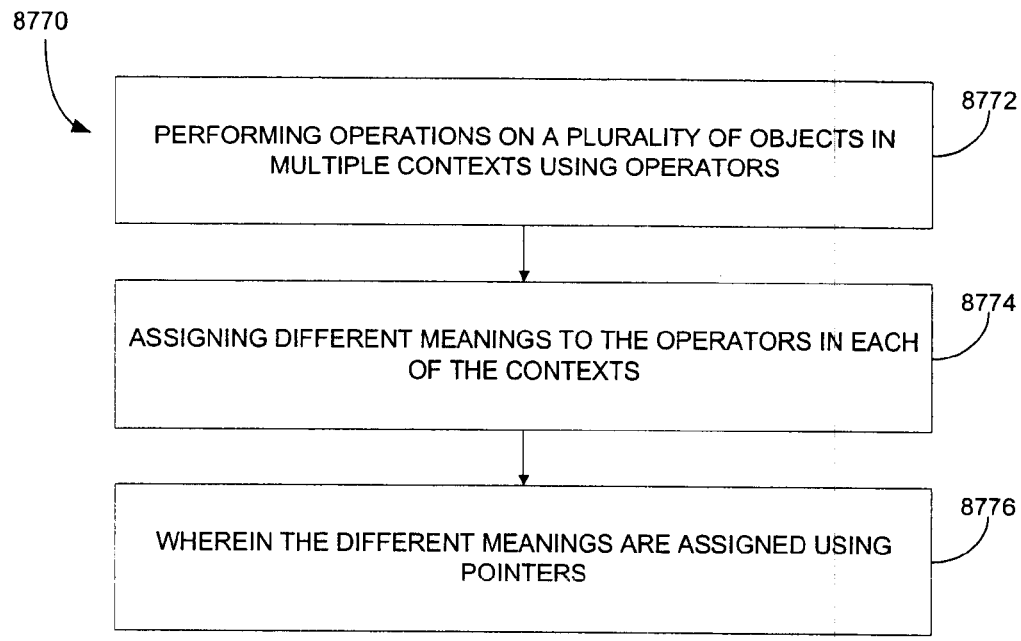
FIG. 87D illustrates a method for providing polymorphism using pointers, in accordance with one embodiment of the present invention.

FIG. 87D illustrates a method 8770 for providing polymorphism using pointers, in accordance with one embodiment of the present invention. Operations are initially performed on a plurality of objects in multiple contexts using operators, as indicated in operation 8772. In one aspect, the operations may include video operations.

In accordance with the concept of polymorphism, different meanings are assigned to the operators in each of the contexts. Note operation 8774. To enhance such concept, the meanings are assigned to the operators in each of the contexts using pointers. Note operation 8776. In one aspect, the meanings may include functions. As an option, the meanings may be assigned during run-time. Further, the meanings may be selected utilizing a multiplexer.

The present embodiment allows mapping of video cards that can each be defined by a separate function. A single function pointer can be changed at runtime to point to any of the various functions. In one embodiment, a multiplexor switch may be used that points to one of a number of the function pointers.

Figure 87E:
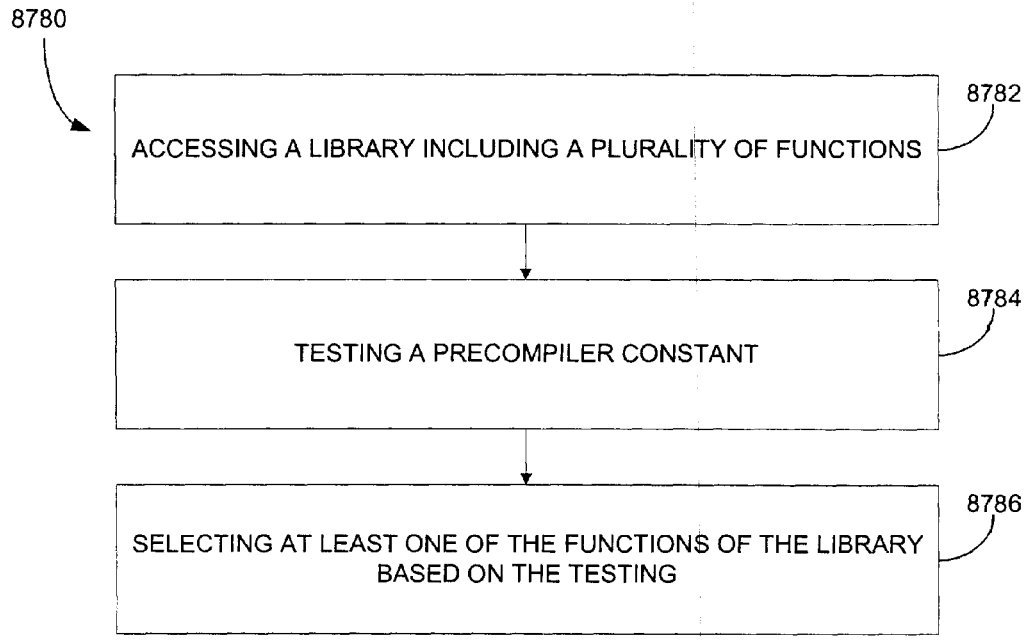
FIG. 87E illustrates a method for generating libraries utilizing pre-compiler macros, in accordance with one embodiment of the present invention.

FIG. 87E illustrates a method 8780 for generating libraries utilizing pre-compiler macros, in accordance with one embodiment of the present invention. In general, in operation 8782, a library is accessed that includes a plurality of functions. A precompiler constant is tested in operation 8784 so that one or more of the functions of the library can be selected based on the testing. Note operation 8786.

In one aspect, the precompiler constant may include a plurality of versions. As an option, the version may be selected utilizing a precompiler macro. In another aspect, the precompiler constant is tested to determine a state of an apparatus on which the functions are executed. In such an aspect, the state of the apparatus may be based on a current bit size.

One example of a program that would use the aforementioned libraries is as follows:

```
//-----------------------------------------------------------------
-----------
-------------------
#ifdef VERSION1
macro expr UnknownThing(a, b) =(a+b);
#elif defined(VERSION2)
macro expr UnknownThing(a, b) =(a@b);
#endif
//-----------------------------------------------------------------
-----------
-------------------
```

In use, a library with an unknown in it can be passed therein at compile time to execute different functions. When a bit size goes above a certain level, one may have to be able to process it differently. As such, a library is created containing different compile time functions as separate macros. Users can set which macro is executed based on the state of the system by testing a precompiler constant. Further, the pre-compiler macro may be used to select which version is utilized.

Figure 87F:
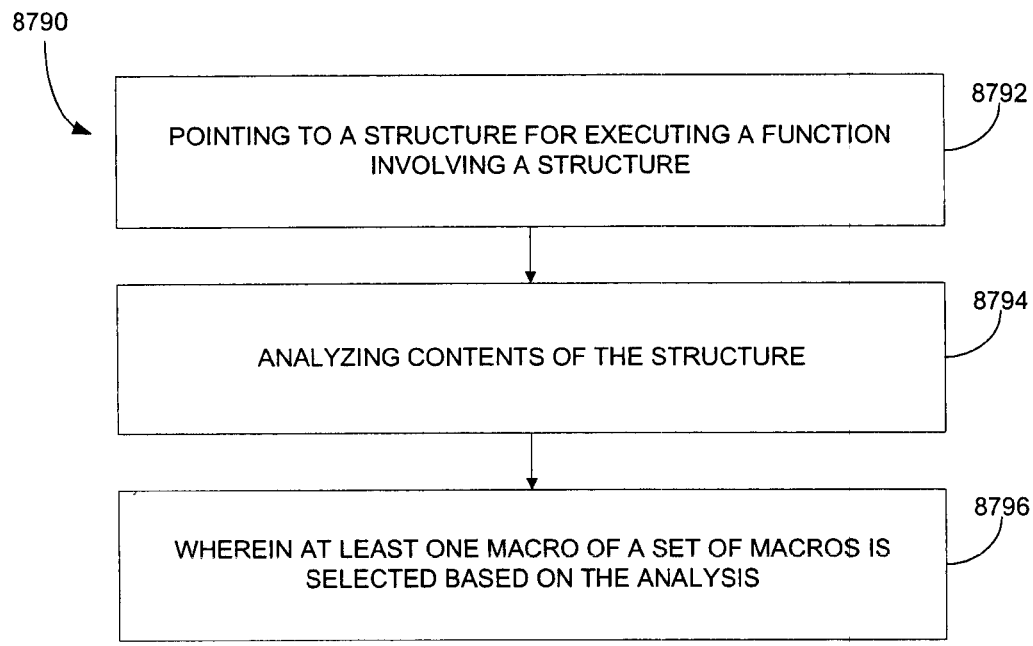
FIG. 87F illustrates a method for mimicking object oriented programming utilizing pointers in a programmable hardware architecture, in accordance with one embodiment of the present invention.

FIG. 87F illustrates a method 8790 for mimicking object oriented programming utilizing pointers in a programmable hardware architecture, in accordance with one embodiment of the present invention. Initially, in operation 8792, a structure is pointed to for executing a function involving a structure. Thereafter, in operation 8794, contents of the structure are analyzed. Further, at least one macro of a set of macros is selected based on the analysis. See operation 8796.

When programming in C++, a person has some data with a hidden pointer to the function. Then, whenever he or she has "this" pointer in Handel C, there is a structure of data that can be pointed at to facilitate the function call.

EXAMPLE

A structure may be defined to have an integer therein. Two macros are provided: one that increments and one that decrements. Based on the contents of the integer, one can utilize the macros to provide incremental or decremental hardware. Further, one can utilize a multitude of these instances to have the macros work on the particular structure, and emulate a hardware register.

When one opens a file in software, a handle for the file is used. Such handle may then be used for each call to the file to provide coordinated transfer of data to the file. The same type of structure may be utilized in Handel C to facilitate transfer of data, and modification of the data based on the correct hardware target.

This could be applied in any context. For example, a set of macros may be defined that contains a structure that has one or more sets of data. With respect to the User API structure, full function pointers may be passed to something to invoke different structures and pass data back and forth. This allows something different to be executed.

More information regarding the foregoing concepts of FIGS. 87B through 87F will now be set forth in greater detail.

An FPGA based co-processor provides a system with a re-configurable sub-processor capable of providing a system with a notable performance increase. A host and client architecture may be used to implement the co-processor system. The co-processor may function primarily as a client but may be capable of performing host operations, if the platform permits such operations. It may be possible for several co-processors to exist in a system. An FPGA based co-processor may not operate as a normal processor would. It may be capable of acting like a separate system depending on the resources available to the FPGA. An FPGA co-processor may also be able to perform complex operations on data with only platform constraints restricting the data quantities handled. The operational functionality of an FPGA based co-processor may not be implemented as sequences of instructions but by dedicated hardware circuits programmed into the FPGA device.

A host may make use of a client by making remote function calls. Co-processors may provide a multitude of re-configurable functionality. The functionality of the co-processor may be provided as a set of functions. Each function may have a unique index to distinguish it from other functions. Functions may normally be independent of each other and totally platform independent. It may be possible for functions to interact within a co-processor, this feature may be provided to the functions via a high level API. A function may have access to all shared resources that the co-processor has available, this feature may be provided to the functions via a high level API. To add new functionality to a co-processor a designer may create a new function. The set of functions available on a co-processor at any given time is entirely at the engineers discretion.

The co-processor may be able to execute all available functions concurrently. This is a demonstration of the true parallelism that hardware provides. If it is required to execute the same function more than once then multiple copies of the function may be required, each with a unique address. Creating multiple copies of a function is easily achievable in Handel-C using function arrays.

Co-processor system functionality may be provided by a set of APIs. There may be a separate API for the host and client. Use of the two APIs may provide the user with total abstraction from the platform. This may allow platform independent code to be generated that interacts with the APIs. The APIs may manage all platform interaction and any communication protocols that are involved. Host programs may be able to use the host API to execute functions on a co-processor. The client co-processor may receive the messages from the host and stream data via the client API to and from its functions as required. The functions may interact with the client API to access co-processor resources.

A host may interact with a clients a follows:

Begin the execution of a function

Send parameters to a function

Retrieve data from a function

Receive data ready notifications from a client

Perform auxiliary functionality

A client may interact with a host as follows:
Execute a function when instructed to do so.
Stream data to a function as required
Stream data from a function as required
Send data ready signals to a host
Provide the address of the function that generated a data ready signal
Perform auxiliary functionality The APIs may be designed to provide an abstraction layer for interfacing software. This may allow user applications to be platform independent in relation to the co-processor API.

Interfacing applications may not be aware of the standards or protocols used by a host and client to communicate. The abstraction allows changes to the co-processor system to be made without significantly effecting user applications.

Host (CPU) API Specification

The host API describes the software that may interact with user application running on the host platform.

The host API may provide a user with all the functionality they need to access and utilize an FPGA based co-processor. The host API may represent an FPGA based co-processor as a set of remote functions. There may be sufficient functionality included in the host API to reduce the overhead of a remote function call to a single standard local function call.

common interfaces may be used as templates for the layers. New implementations can be based on the templates and providing they are functionally compatible; they may be immediately compatible with existing systems.

Application Layer API Public Interface

The public interface provides the basic functions necessary for a user application to use an FPGA based co-processor.

Overlapped execution of remote functions can be achieved by directly accessing the physical layer interface and initiating data transfers to functions.

Call-back functions are used to implement an event driven system. The call-back functions are executed to inform the user application when events have occurred. Call-back functions may be repeatedly used depending on the nature of the event. The last event to be signaled before a transfer is completed would normally be a completion status report or a fatal error. Data is transferred to a call-back function in the form of results structure.

Legacy styled remote function executions are performed using ExecuteFunction Wait. More advanced and overlapped remote function execution is performed using ReadData and WriteData.

API Public Functions

```
TransferResultsStructure ExecuteFunctionWait(   unsigned int FunctionIndex,
                                                unsigned int
DataAmountParameters,
                                                        char *ParameterDataBuffer,
                                                unsigned int ReturnDataAmount,
                                                        char *ReturnDataBuffer
```

An application interfacing with the host API may be able to execute remote functions using two possible methods; execute and wait or execute and continue. The execute and wait mechanism may mimic a normal function call, it may not return until the remote function has completed execution and the results have been retrieved. The execute and continue mechanism may allow several functions to be called without waiting for the results of others.

The host API may notify user applications of events using call-back functions. The call-back functions may be executed when a relevant co-processor event occurs. Use of the execute and continue mechanism allows a function to produce interim results, i.e. produces multiple completion signals with multiple data returns.

API Structure

Figure 88:
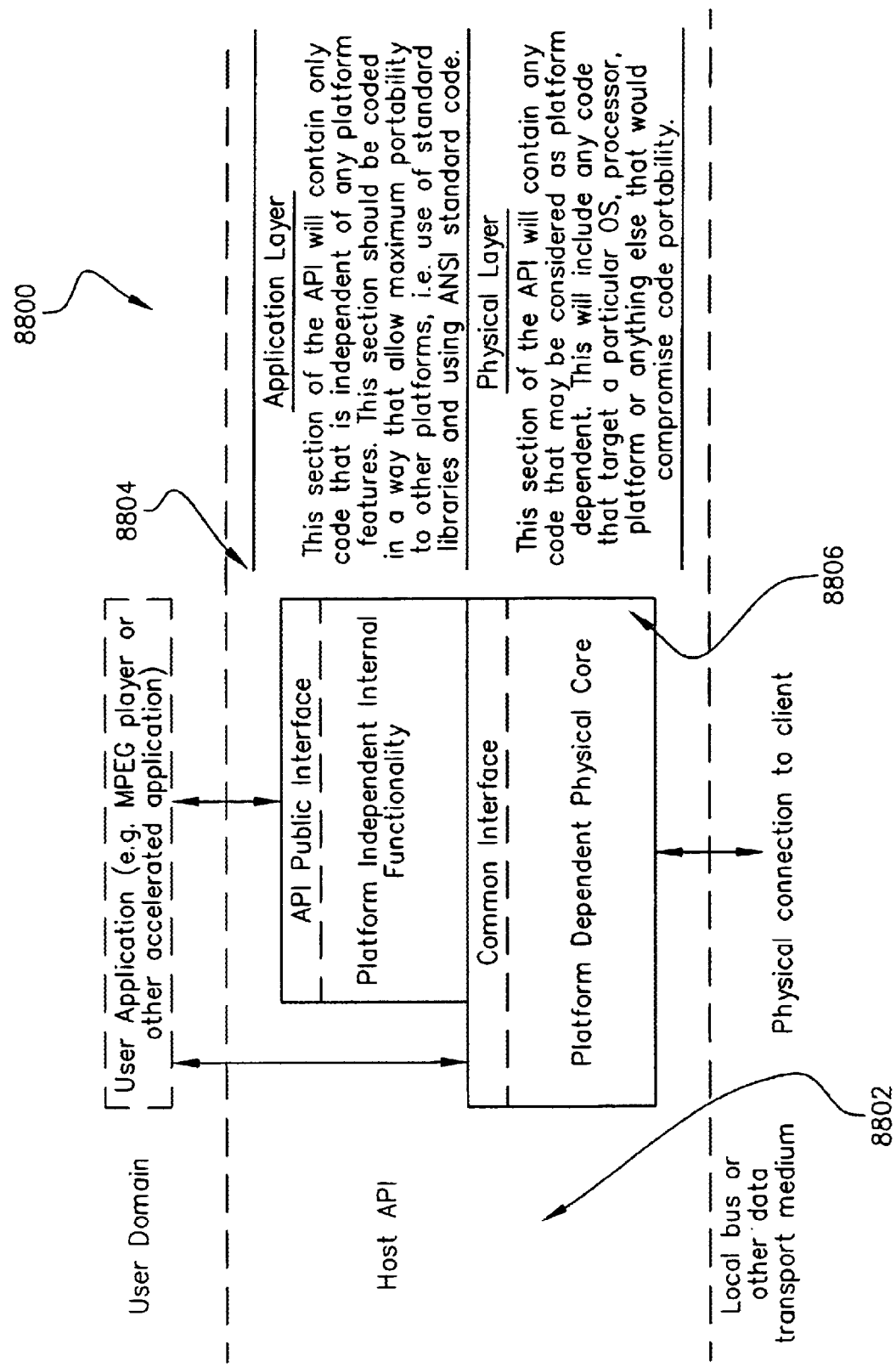
FIG. 88 illustrates an application program interface, in accordance with one embodiment of the present invention, in accordance with one embodiment of the present invention.

FIG. 88 illustrates an application program interface 8800, in accordance with one embodiment of the present invention. The host API 8802 is designed to be constructed from two major sections 8804, 8806. The two sections are present to allow separation of the platform dependent code from the platform independent code. A library may be built from each logical section of the design. This sectioning is done to decrease the effort required to port the API between various platforms. The platform dependent section may provide a common interface and may functionally target the host platform. It may be possible to have a variety of platform dependent sections available to provide support for a variety of different target platforms.

The API design is layered to ease maintenance. Each layer may represent a software library. Each library may provide a set of functions and macros for use within the API core. Each layer may have a common interface. Using common interfaces may increase the flexibility of the API. The Parameters
FunctionIndex
   Index of the function to be executed.
DataAmountParamaters
   Size of the parameter data buffer in bytes.
ParameterDataBuffer
   A data buffer containing the parameters to send to the function to be executed.
ReturnDataAmount
   Size of the return data buffer in bytes.
ReturnDataBuffer
   A data buffer to store the return data from the function to be executed.

Return Value
   The structure returned from this function may contain information about the completion results for the remote function execution.

Figure 91:
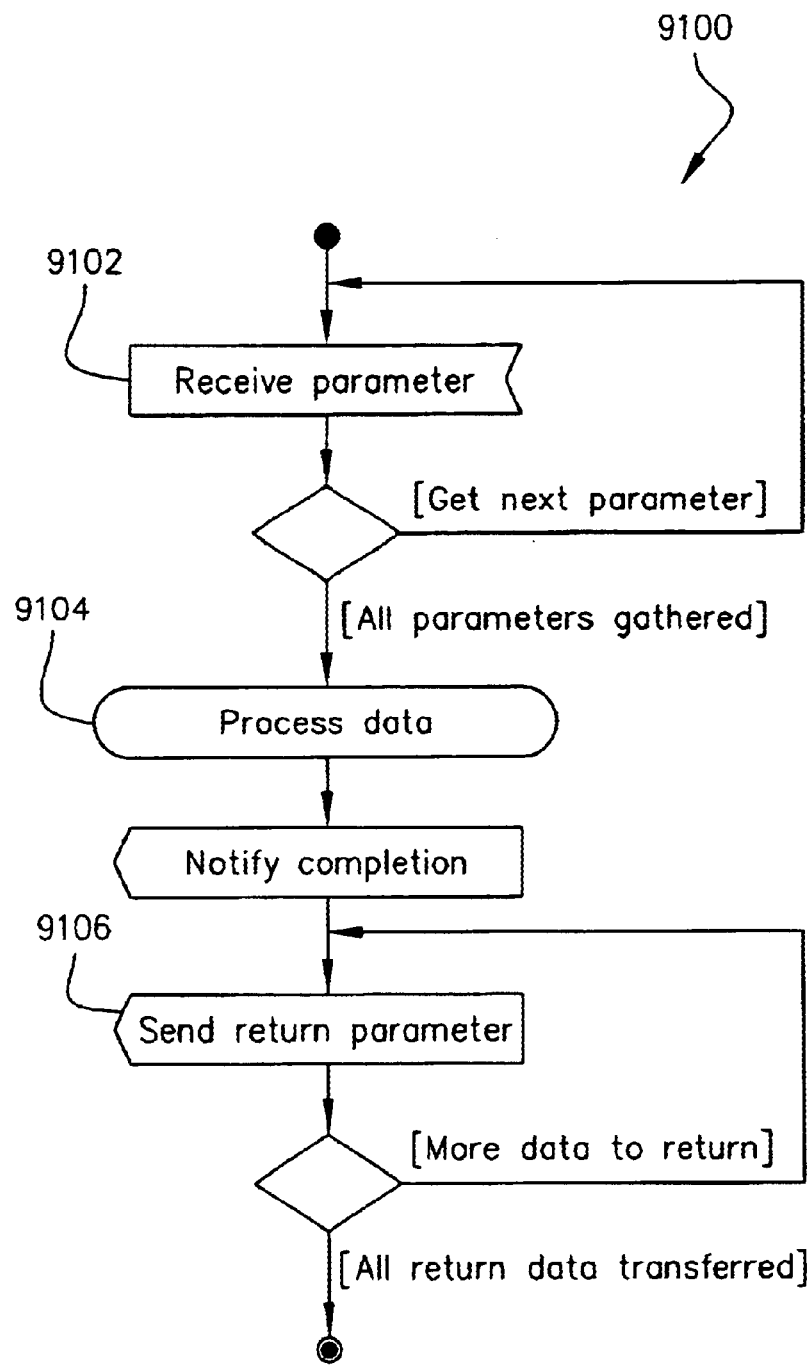
FIG. 91 shows a typical execution flow for a function, in accordance with one embodiment of the present invention.

Remarks
   ExecuteFunction Wait is used to perform a legacy styled function call. The specified remote function may be executed and the contents of ParameterDataBuffer may be transferred to the function. When the data ready signal from the executed from is received the return data may be transferred and stored in the ReturnDataBuffer. This method of remote function execution can only be used on remote functions that have a traditional execution flow. FIG. 91 shows a traditional execution flow for a remote function. The host API may require certain tasks to be performed before any interaction with a co-processor occurs. StartCoprocessorSystem is provided by the host API for user applications to initialize the host APIs subsystems.

void StartCoprocessorSystem(. . .);
Parameters
Remarks
Initializes the API, allocates required system resources. This may be called before any other API function.
To enable a graceful shut down the host API may provide a user application with a method for informing it that it is no longer required. ShutdownCoprocessorSystem is provided by the host API as the shutdown function for the co-processor system.
void ShutdownCoprocessorSystem(. . .);
Parameters
Remarks
Call this when the API functionality is no longer required. This may clean up any system resources being used by the API.
Physical Layer API Public Interface
The physical layer interface provides access to platform dependent features. The features that form the public interface for the physical layer enable a user to perform more advanced functionality than is possible with the application layer public interface.
As an FPGA is a re-configurable device a method for configuring the device is required. This is provided by the physical layer public interface.
Physical Layer Public Functions

| int ConfigureCoprocessor( char *BitFile ); |
| --- |

Parameters
BitFile
Name of a '.bit' file to be loaded into the FPGA co-processor.
Return Value
If the function succeeds the return value is nonzero.
If the function fails the return value is zero.
Remarks
The '.bit' file used may be compatible with the target FPGA device. The client API provides the means to design an FPGA based co-processor in Handel-C. Compiling Handel-C code to EDIF may enable to creation of a '.bit' file using the FPGA vendors software tools.
An FPGA co-processor is capable of supporting advanced functionality. For a user application to use advanced features it may be capable of transferring data from a co-processor whenever it needs to.

| unsigned int ReadData( TransferConfiguration Configuration ); |
| --- |

Parameters
Configuration
A structure that contains all the required data to begin the operation.
Return Value
The return value is a unique identifier for the operation. The identifier may be used during informative communication.
Remarks
This function may transfer data to a remote function. If the target function is not executing it may be executed.
An FPGA co-processor is capable of supporting advanced functionality. For a user application to use advanced features it may be capable of transferring data to a co-processor whenever it needs to.

| unsigned int WriteData( TransferConfiguration *Configuration ); |
| --- |

Parameters
Configuration
A structure that contains all the required data to begin the transfer.
Return Value
The return value is a unique identifier for the transaction.
Remarks
This functions may transfer data from a remote function.
A user application may want to monitor the progress of an active transaction. The host API provides the QueryTransaction function for transaction monitoring purposes. TransferResultsStructure QueryTransaction(unsigned int UniqueIdentifter)
Parameters
UniqueIdentifier
The identifier is used to provide a unique handle for each transaction.
Return Value
The structure returned from this function may contain information about the transaction being queried.
Remarks
Use this function to get intermediate results for an active transaction.
Call Back Functions and Structures
Call back functions are used throughout the API to prevent the need for polling. The use of call back function builds an event driven system. When event occur the call back functions are executed to communicate information about the event. Typical events may be transfer completion, error notification and timeout.
Structures
Several of the physical layer functions require configuration data. The Configuration structure provides encapsulation for the configuration data.

| struct Configuration{<br>    void (*TransferCallback)(TransferResultsStucture TransactionInformation);<br>    unsigned int DataQuantity;<br>    unsigned char *DataBuffer;<br>    unsigned int DestinationAddress;<br>    unsigned int MaxDesiredTransactionTime;<br>} |
| --- |

Members
PhysicalLayerEventHandler
This is the call-back function that is exclusive to the physical layer. The user should create this function and it should be based on the function prototype TransferCallback.
Data Quantity
This value refers to the amount of data in bytes to be transferred.
DataBuffer
A pointer to a data buffer, if receiving data the buffer may be at least as big as DataQuantity bytes.
DestinationAddress
The destination address refers to the index of the function to which the data is to be transferred.
MaxDesiredTransaction Time
This value specifies a length of time in milliseconds. It is used to indicate the maximum desired time for a transaction. This allows transactions to be aborted if they are taking to long.

Remarks

The configuration structure is used when calling functions in the physical layer.

The status results for a particular function are encapsulated in the TransferResultsStructure. This structure is commonly passed to call-back function but is also used by QueryTransaction.

```
struct TransferResultsStructure{
    unsigned int UniqueIdentifier;
    unsigned int QuantityOfDataTransferred;
    TransferResultsCodes ResultCode;
}
```

Members
QuantityOfDataTransferred

This value is used to indicate how many bytes were successfully transferred.
ResultCode The result code may be on of the defined states for the enumerated data type TransferResultsCodes.
Remarks The transfer results structure contains information about a recent transfer request.

Possible values for the status codes are pre-defined using an enumerated data type.

```
enum unsigned int
TransferResultsCodes = {    CPS_COMPLETED=0,
                            CPS_FATAL,
                            CPS_TIMEOUT,
                            CPS_SYSTEM_BUSY,
                            CPS_IN_PROGRESS,
                            CPS_ON_HOLD
                       };
```

Remarks

The results codes are used by the system to indicate transaction results.
Callback Functions Transfer call-back functions are used to generate the event driven system. They are user created function that are passed to the API, they may be based on the TransferCallbackfunction prototype.

void TransferCallback(const TransferResultsStructure TransactionResults)
Parameters
TransactionResults This is a structure that contains information about the reason for executing the call-back function. The transaction is only terminated when one of CPS_COMPLETED, CPS_FATAL or CPS_TIMEOUT is indicated as the result code.
Remarks The transfer call back function is used as the event handler for a transaction. The user may provide this function if they require overlapped co-processor operations.
Host Communication With a Client The methods a host uses to transport data to and from a client are very platform dependent.
Client (FPGA) API Specification The client API deals with the FPGA portion of the co-processor system. Everything described here refers to the hardware required to construct an FPGA based co-processor. Many of the descriptions used in this section use software terminology; this is possible due to the Handel-C programming language that allows hardware to be describe in terms of algorithms using a C styled syntax.

API Structure

The client API may consist of macros and functions for two purposes.

The development of functions that a host may access and execute.

The construction of the hardware required to interact with a host and the platform resources.

To ensure maximum maintainability the client API may be divided into two major sections. The two sections are created to separate platform independent code and platform dependent code.

The platform independent section has been named the 'application layer'. The platform dependent section has been named the 'physical layer'. The physical layer may form the 'physical layer library'. The application layer may form the 'application layer library'.

The client API may enable a user to create hardware for use by a host using Handel-C and representing the hardware as Handel-C functions. The user created hardware for host use may be called 'user functions'. One can apply software terminology to the hardware due to the abstraction that the Handle-C language provides.

The application layer may contain macros and functions that are used by user functions. The application layer may provide user functions with a layer of total platform abstraction. This may allows user functions to be designed once for any platform.

A user may use the API libraries to construct a 'physical core' and one or more 'user cores'. The purpose of a user core may be to reference the user functions and associate the user functions with indexes using platform independent methods.

The purpose of the physical core is to provide a separate file that a user can use to interact with the platform. This may allow the work required to port a co-processor to be limited to only minor modifications of the physical core.

Configuration of platform resources may be possible using the physical layer of the API when creating a physical core.

Figure 89:
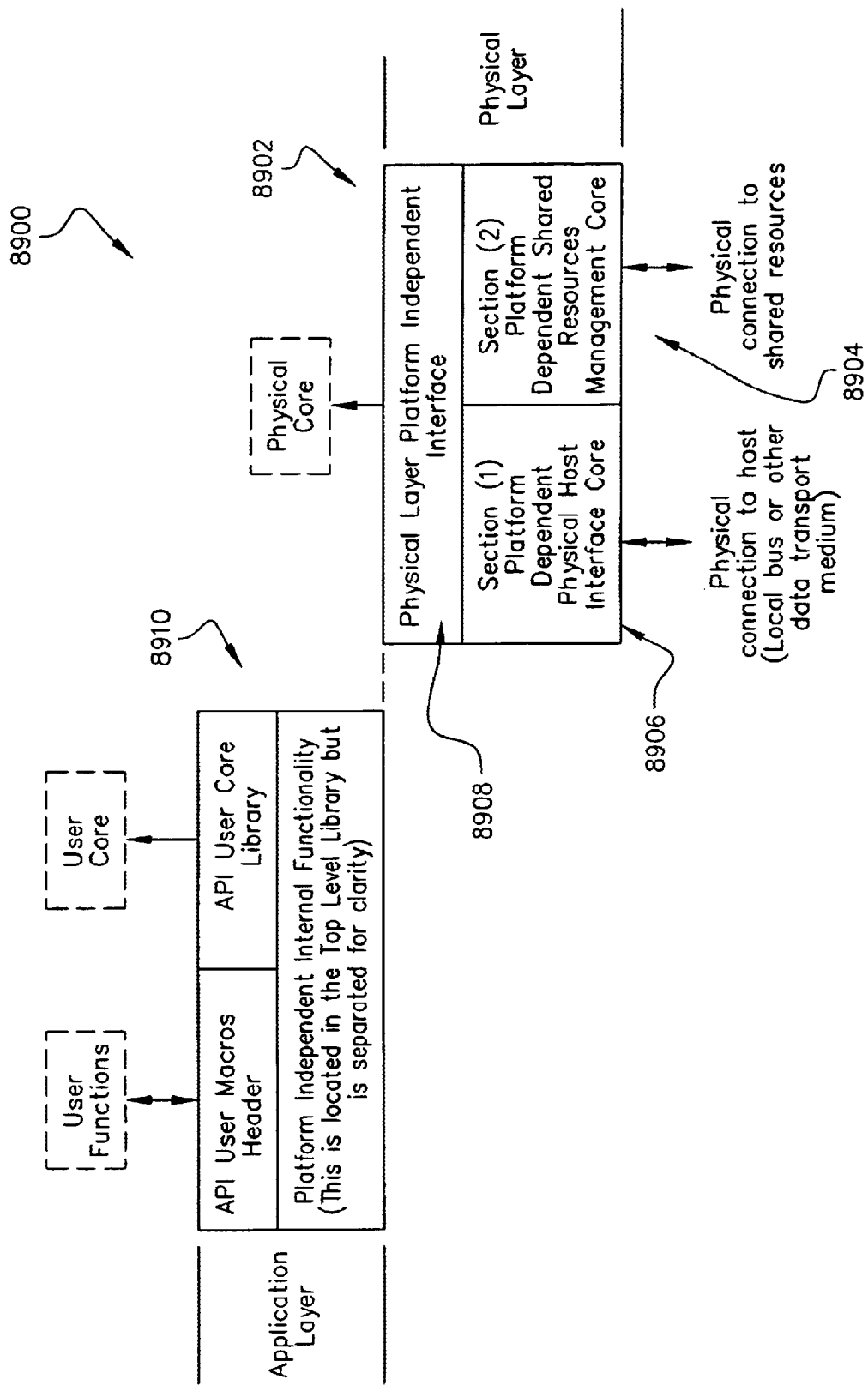
FIG. 89 illustrates that the physical layer is divided into a further two sections, in accordance with one embodiment of the present invention.

FIG. 89 illustrates a schematic 8900 showing that the physical layer 8902 is divided into a further two sections, 8904 an 8906, in accordance with one embodiment of the present invention. Shared resources are handled by section 2 of the physical layer and host interaction is handled by section 1 of the physical layer. The two sections of the physical layer are accessible through a common interface, the 'physical layer platform independent interface'. A common interface 8908 for the physical layer is defined to ensure that different implementations (for different platforms) of the physical layer are compatible with the application layer 8910.

User functions gain access to the application layer API via the parameters passed to the function when it is executed. This may allow the API libraries to distinguish between user functions when API function calls are made. The concept of executing a hardware function relates to a signal changing to indicate 'go'.

A situation may arise where a user function requires direct access to auxiliary I/O on a particular platform. A user function may be able to access auxiliary I/O by accessing a set of macros that form connections to the auxiliary I/O. Use of auxiliary I/O may compromise the portability of a user function but the auxiliary I/O system may be designed to minimize the impact.

The purpose of the physical layer is to provide some abstraction from platform features. This may allow the application layer to expect from the physical layer a common interface with relatively common features. A physical layer library may be constructed for each target platform. The physical layer libraries may contain a set of macro based on the common template provided in the design of the physical layer. API users may be able to create the top level of a co-processor using the relevant API physical layer library.

Use of the Client API Libraries

FIG. 90 is a schematic diagram 9000 of the application layer 9002, physical layer 9004, and user domain 9006, in accordance with one embodiment of the present invention.

The API libraries may provide layers of abstraction to make a co-processor as portable as possible. Any parts of the system that interact solely with the application layer can be considered totally platform independent as the application layer is its self totally platform independent.

User functions may interact with the application layer library using the user function header. The user function header may prototype the API functions that may be passed to a user function when it is executed. The API functions may be encapsulated into a structure and the structure may be passed to the user function when it is executed. This mechanism is used to ensure forward compatibility and to allow the application layer library to distinguish between the user functions in the most efficient method possible.

User cores may be created using the macros of the application layer library. When a user core is constructed the user may reference the functions that may form the co-processor functionality. Indexes may be assigned to the user function when the user core is created.

The purpose of the physical layer library is to provide a common interface to the platform features. Due to the possible diversity of the features a platform may provide a physical layer library may be created for each platform to be supported. This may allow people who use the physical layer libraries to do so knowing that their co-processor may be easy to port to other platforms. The physical layer library is very platform dependent but is intended to enable a user to create a physical core that is not very platform dependent.

Creation of a Co-Processor

To build a co-processor may require a user to generate several files using the API libraries. User functions may use the APIs user function header to access API functionality. The actual co-processor is built by the user creating a physical core. The user may also create at least one user core to accompany the physical core. The user core may be platform independent as it may only interact with the application layer section of the API. The physical core may be classed as platform dependent but the API may provide some abstraction via the physical layer allowing rapid porting of a physical core. The user can configure various features of a platform during creation of a physical core.

The physical core forms the top level for a co-processor implementation.

File Associations

FIG. 90 shows the files that may be required to construct an FPGA based co-processor, in accordance with one embodiment of the present invention.

The uses tags are numbered to allow explanation of the interconnections. See FIG. 90 for the numbered uses tags. A users physical core may include the physical layer library header to gain access to the physical layer library. The physical layer library header may contain declarations that may reference the public contents of the physical layer library. A user physical core should include the system configuration header file. When the physical layer library macros are used they may use the configuration data. A users physical core may be able to link to a number of user cores. A users physical core may provide a user core with a clock and the relevant functionality to enable its operation. The user function header links to the physical layer library to gain access to the names of the auxiliary I/O ports. A user core may include the application layer library header to gain access to the macros in the application layer library.

The application layer library header may contain declarations that link to the macros and functions in the application layer library. The user function header links to the application layer library to provide user function with access to the API. A user core may link to at least one user function. User functions may include the user function header to gain access to the API.

Co-Processor System Configuration

The co-processor API support a large amount of configuration options. The platform configuration may be performed when the user is creating the physical core. The user function index maps are created when the user create a user core.

Common platform configuration options supported by the physical layer library (used when a user is creating a physical core):

Number of functions supported. This may configure how the host address decoder is built. The size and speed of the address decoder is dependent on the number of functions to be supported. The address decoder may use advanced techniques therefore the index map seen by the host may not be incremental. Address to function index maps may be defined.

Configuration of the platform memory banks. Memory banks may be connected directly to the FPGA or accessed via the local bus. The physical layer library may manage any specifics. The user may be able to configure which memory banks map to which functions and if the memory banks are shared or dedicated.

Type and buffering mode of the mailboxes.

Type and size of message queue to the host.

Common configuration options supported by the application layer library (used during the creation of a user core):

Index associated with a particular function.

Application Layer User Core Creation Interface

---
CoProcessorInitialiseSystem( UserCoreName
);
---

Parameters

UserCoreName

This should be a unique name for the user core. This name may be referenced by the physical core to make the necessary connection.

Remarks

This is pre-compiler macro, it should be used at global scope. It should be used after the header is included for the application layer library. It performs the necessary definitions and declarations required for the user core.

---
CoProcessorAssociateFunction( UserCoreName,
                              FunctionIndex,
                              FunctionPointer
);
---

Parameters

UserCoreName

This should be a unique name for the user core. This name may be referenced by the physical core to make the necessary connection.

FunctionIndex

This is the index that may be used by the host to transfer data to the function being configured.

FunctionPointer

This is a pointer to the user function that is being associated with the specified index.

Remarks

This is a Handel-C macro procedure. It should be called within the main function of a user core. It is used to assign an index to a function.

```
CoProcessorStart( UserCoreName
                );
```

Parameters

UserCoreName

This should be a unique name for the user core. This name may be referenced by the physical core to make the necessary connection.

Remarks

This is a Handel-C macro procedure. It should be the last call made to any of the co-processor system macros. It should be located in the main function of a user core. It may become the main handler for all physical core interaction. This macro may never return as it may contain a forever loop.

Application Layer User Function Interface

The majority of the application layer API is provided to a user function via a parameter passed to the user function when it is executed. The parameter is a structure. The structure may contain a set of function pointers. Passing a structure to a user function allow for forward compatibility. If at a later stage more functions need to be added to the API this can be done without effecting existing user functions.

The API may expect a user function prototype to look like this:

```
void UserFunctionName(   USER_API ParameterName
                     );
```

Remarks

UserFunctionNamne and ParameterName can be replaced with any legal C styled name.
This is the USER API structure:

Members

CoProcessorSetAddress

This function is used to initiate a memory data transfer. It allows an address to be set and the direction of the transfer to be configured. Memory access is pipe-lined and it takes more than one clock cycle for a transaction to be completed. Separation of the address and data phase allows burst mode transactions to be performed. The exact number of cycle it takes for a memory operation is dependent on the platform; to compensate for this CoProcessorDoTransfer may always ensure synchronization between the memory address phase and data transfer. The address phase is buffered to enable one address value to be written for every available memory address cycle. CoProcessorSetAddress may block if it has been called to many times before a call of CoProcessorDoTransfer. Memory address and data phases can be interleaved to provide a high memory bandwidth.

CoProcessorDoTransfer

This function is provided to handle the data phase of a memory access. It may block until a previous address phase has completed.

CoProcessorGetData

CoProcessorGetData gives a user function the ability to retrieve data from the host. This function may block until the host sends data.

CoProcessorSendData

CoProcessorSendData gives a user function the ability to send data to a host. This function may block until the host requests data from the function.

CoProcessorNotifyDataReady

This function is used by a user function to notify the host that data is ready. This may be used as required and is not restricted to only meaning data is ready.

CoProcessorCheckForPost

Used by a user function to test for the presence of post in the mailbox.

CoProcessorGetSendersAddress

Used to get the address of the sender of the data currently in the mailbox. This function should be called in parallel with or before CoProcessorDoPostDataRead.

CoProcessorSetPostAddress

Initiates the sending of mail. The address is configured for the sending and the next data to be sent may be forwarded to the address specified here.

CoProcessorDoPostDataRead

Gets data from the mailbox. This function may block if no data is waiting.

CoProcessorDoPostDataWrite

Sends data to a previously specified address. If an address has not been specified this function may block until an address is specified.

```
typedef struct{
    void (*CoProcessorSetAddress)(unsigned int 32 Address, unsigned int 1 ReadOrWrite);
    void (*CoProcessorDoTransfer)(unsigned int 32 *Data);
  void (*CoProcessorGetData)(unsigned int 32 *Data);
  void (*CoProcessorSendData)(unsigned int 32 Data);
  void (*CoProcessorNotifyDataReady)( );
  unsigned int 1 (*CoProcessorCheckForPost)( );
  unsigned int 32 (*CoProcessorGetSendersAddress)( );
  void (*CoProcessorSetPostAddress)(unsigned int 32 Address);
  void (*CoProcessorDoPostDataRead)(unsigned int 32 *Data);
  void (*CoProcessorDoPostDataWrite)(unsigned int 32 Data);
} USER_API;
```

Remarks

The only part of the user API that is not provided to functions through the structure is access to auxiliary I/O. Macros are used to establish the links between a user function and auxiliary I/O. This method is used to allow a function direct access to auxiliary I/O with no interference from the core of the client API. Access to auxiliary is deemed to be necessary as the nature of the devices connected to auxiliary is unknown to the API.

User API functions in detail:

```
void CoProcessorSetAddress(unsigned int 32 Address,
                           unsigned int 1 ReadOrWrite
                           );
```

Parameters
Address

The address parameter represents the memory location for the target operation.
ReadOrWrite Indicates the mode for the memory operation, an active high signal indicates a read operation.
Remarks CoProcessorSetAddress is used to initiate a memory access operation. Memory access operations are separated into the address phase and data phase. The phase separation allows the system to achieve maximum bandwidth utilization.

```
void CoProcessorDoTransfer(    unsigned int 32 *Data
                               );
```

Parameters
Data

A pointer to a register. The register may be loaded or read depending on the mode selected during the synchronized address phase. Synchronisation is performed by the system.
Remarks CoProcessorDotransfer is used to perform the data phase for a memory access operation. This function may automatically synchronize with the address phase.

```
void CoProcessorGetData(    unsigned int 32 *Data
                            );
```

Parameters
Data

A pointer to a register, the register is loaded with a data parameter sent by the host.
Remarks CoProcessorGetData may lock until data has been sent by the host and target for the user function using its copy of this function.

```
void CoProcessorSendData(    unsigned int 32 Data
                             );
```

Parameters
Data

The data that may be transferred to the host when it requests data from the user function.

Remarks

CoProcessorSendData may block until the host request data fro the user function using its copy of this function.

void CoProcessorNotifyDataReady( );
Remarks

A user function should use this function to notify the host that is wants to perform a data transfer operation. CoProcessorNotifyDataReady may send some form of interrupt to the host, the signal may be queued if other user functions are signaling at the same time.

unsigned int 1 CoProcessorCheckForPost( );
Return Value

The return value is active high to indicate that post is waiting.
Remarks

CoProcessorCheckForPost is used for testing the incoming mailbox for any contents.

unsigned int 32 CoProcessorGetSendersAddress( );
Return Value

The return value may be the function index of the function that sent the mail waiting in the mailbox.
Remarks The mailbox is only emptied by CoProcessorDoPostDataRead therefore repeated calls to CoProcessorGetSendersAddress may return the same result until the waiting mail has been retrieved. This function may block if there is no mail waiting in the mailbox.

```
void CoProcessorSetPostAddress(    unsigned int 32 Address
                                   );
```

Parameters
Address

The address parameter represents the user function index for the user function that may receive mail sent by the user of this function.
Remarks CoProcessorSetPostAddress configures the destination address for the mail to be sent. This function only needs to be used to set the destination at the beginning of a multi message transfer.

This should be called a clock cycle before writing the data intended for the address being programmed.

```
void                               unsigned int 32 *Data
CoProcessorDoPostDataRead(
                                   );
```

Parameters
Data

This is a pointer to a register. The data from the mailbox may be written to the pointed to register.
Remarks CoProcessorDoPostDataRead may send mail to the address that is currently configured. It is not necessary to set the address for every mail message sent, the previous address may be used.

```
void CoProcessorDoPostDataWrite( unsigned int 32 Data
                                 );
```

Parameters
Data
This may be sent to the addressed user functions mailbox.
Remarks
CoProcessorDoPostData Write may send mail to the address that is currently configured. It is not necessary to set the address for every mail message sent, the previous address may be used.

This function may block if the recipients mailbox is full. The capacity of the mailbox is platform dependent.

API User Function Interface (Auxiliary I/O)

Auxiliary I/O is provided to user functions to allow a user to take advantage of any platform features that are outside the scope of the application API. These features are represented as the pin connections that the external features/devices are connected to. The API may make no attempt to translate or shield the user from auxiliary I/O. Access to auxiliary is direct and provided on an 'as is' basis.

The application layer API provides access to auxiliary via a set of macros. Auxiliary I/O ports are named and may be platform specific. The definitions for auxiliary I/O is stored in the physical layer library. The auxiliary I/O section of the application layer API provides access to the physical layer library information. When physical layer libraries are created the details of auxiliary I/O should be published with the library. The application layer provides access to the physical library in this way in an attempt to reduce the amount of effort required to port user functions that are dependent on platform specific features.

Auxiliary I/O should only be used in a direct one to one relationship with a user function. If more than one user function requires access to a shared resource a service user function should be developed. Other user functions can then communicate with the service user function using the mail box system. This may make only the service function directly dependent on the auxiliary I/O, thus reducing the amount of effort required during porting.

These are the API auxiliary access macros:

| CoProcessorConnectReadAUX( | PortName |
| --- | --- |
| | ) |

Parameters
PortName
 This should be the name of an I/O port.
Remarks
 This is a pre-compiler macro and should be used at global scope. It declares a read port for auxiliary I/O. This macro may write a function that provides the functionality to read the named I/O port. Access to the function is provided by the CoProcessorAuxRead macro.

| CoProcessorConnectWriteAUX( | PortName |
| --- | --- |
| | ) |

Parameters
PortName
 This should be the name of an I/O port.
Remarks
 This is a pre-compiler macro and should be used at global scope. It declares a write port for auxiliary I/O. This macro may write a function that provides the functionality to write to the named I/O port. Access to the function is provided by the CoProcessorAuxWrite macro.

| CoProcessorConnectReadWriteAUX( | PortName |
| --- | --- |
| | ) |

Parameters
PortName
 This should be the name of an I/O port.
Remarks
 This is a pre-compiler macro and should be used at global scope. It declares a port for auxiliary I/O that is bi-directional. This macro may write functions that provide the functionality to read, write and set the output buffer mode for the named I/O port. Access to the function is provided by the CoProcessorAuxRead, CoProcessorAuxWrite and CoProcessorAuxSetEnable macros.

| CoProcessorAuxRead( | PortName, |
| --- | --- |
| | unsigned int *Data |
| | ) |

Parameters
PortName
 This should be the name of an I/O port.
Data
 This is a pointer to a register. The register may be loaded with the value currently on the I/O port.
Remarks
 This is a Handel-C macro expression. It is created when read functionality is required on an auxiliary P/O port. The bit width of Data may match the port width. The bit width of the port can be determined using the CoProcessorPortWidth macro.

| AuxSetWriteReg( | PortName, |
| --- | --- |
| | unsigned int *Data |
| | ) |

Parameters
PortName
 This should be the name of an I/O port.
Data
 Data should be a pointer to a register.
Remarks
 This is a Handel-C macro procedure. It is created when write functionality is required on an auxiliary I/O port. The bit width of Data may match the port width. The bit width of the port can be determined using the CoProcessorPortWidth macro. Data may become the output for the I/O port.

| CoProcessorAuxSetEnable( | PortName, |
| --- | --- |
| | unsigned int 1 Enable |
| | ) |

Parameters
PortName
 This should be the name of an I/O port.
Enable
 The enable signal is used to set the mode for the output buffers. If Enable is active the output buffers are set to a high impedance more.

Remarks

This is a Handel-C macro procedure. It is created when read and write across an auxiliary I/O port is required. This macro is used to access the enable function created when I/O is mapped.

---
CoProcessorPortWidth( PortName
)
---

Parameters
PortName
This should be the name of an I/O port.
Remarks
This is a pre-compiler macro that can be used anywhere. It is a utility macro that allows access to the width of an auxiliary I/O port. This is useful when defining variables that connect to a port.
Physical Layer Interface
A common interface for the physical layer is defined to ensure that all implementations of the physical layer are compatible with the application layer. The physical layer interface may allow the configuration and creation of the hardware necessary to manage:

Memory

Primary bus interface

System clock synchronization

Co-Processor Construction Macros
CoProcessorBuild( )
Remarks
This is a pre-compiler macro. It should only be used at global scope. It may construct the necessary connection to the local bus and any other platform specific definitions.
CoProcessorActivate( )
Remarks
This is a Handel-C macro procedure. It should only be used at local scope, preferable in a main function. It may activate any platform specific background handler tasks.

---
CoProcessorSetUserCoreClock( UserCoreName,
UserCoreClockSource
)
---

Parameters
UserCoreName
This may be the name given to a user core when it was created.
UserCoreClockSource
This may be one of the available clock sources defined for the platform.
Remarks
This is a pre-compiler macro. It should only be used at global scope. This macros may be used to configure the clock source for a user core. It may be possible for a user core to be clocked at a different rate to the physical core. This is only possible if the physical layer library for the target platform provides more than one clock source.

---
CoProcessorCreateUserFunctionPort( UserCoreName,
DesiredHostAddress,
UserCoreFunctionIndex,
InitialMemoryAccessController, -continued PostalAddress
)
---

Parameters
UserCoreName
This may be the name given to a user core when it was created.
DesiredHostAddress
This is the address that an external host may use to access the user function being setup.
UserCoreFunctionIndex
This is the unique index that is used internally by the user core to identify the user function.
InitialMemoryAccessController
This is the index of the memory access controller that may be initially associated with the user function.
PostalAddress
This is a unique identifier that other user functions can use to send messages to the user function being configured.
Remarks
Any user function that is to be used by a host may be setup using this macro.
Memory Bank Construction Macros
The memory ports are constructed in the physical core. This allows the memory access controllers to run faster than the user functions. Memory controllers are device specific and may be configured as dedicated or shared. When a memory bank is shared the number of ports to be created may be defined.

Memory management units may be constructed by referencing a banks name. The names given to the memory banks may be a platform constant and may be located in the physical layer library. Memory banks should be constructed before the system handlers are initiated.

---
CoProcessorBuildDedicatedMemoryController( BankName,
MemoryBankUniqueIdentifier
)
---

Parameters
BankName
The name of a memory bank.
MemoryBankUniqueIdentifier
This is a unique identifier for the memory bank. It may be required when configuring user functions.
Remarks
This macro is a pre-compiler macro. It should only be used in global scope. It constructs a set of functions that form a memory management unit for the named memory bank. The method of memory management used is single port exclusive therefore the MMU is a simple transaction sequencer.

---
CoProcessorBuildMultiPortMemoryController( BankName,
NumberOfPorts
)
---

Parameters
BankName
   The name of a memory bank.
NumberOfPorts
   The number of ports to generate. This represents the number of duplicate functions to create.
Remarks
   This macro is a pre-compiler macro. It should only be used in global scope. It constructs a set of functions that form a memory management unit for the named memory bank. A multi-port MMU is constructed that sequences memory requests and provides simple arbitration for the available ports. Semaphores are created and the access functions are constructed as an array of functions.

```
CoProcessorSetPortUniqueIdentifier(BankName,
                                   BankPortIndex,
                                   UniqueIdentifier
                                   )
```

Parameters
BankName
   This is the name of the bank that is being referred to.
BankPortIndex
   This refers to the particular port on the multi-port mem
UniqueIdentifier
Remarks

```
CoProcessorActivateMMU( BankName
                        )
```

Parameters
BankName
   The name of a memory bank.
Remarks
   This macro should be called within the main function of the physical core. It starts any background memory management functions that may be required.
Physical Layer, Connection to Host
   The actual data transfer between a host and an FPGA is platform specific and is beyond the scope of the specification for the API for a co-processor.
   The physical layer may not be restricted to using any particular method or protocol for communicating with a host. The only constraint is that the host may be capable of 'speaking the same language' as the FPGA co-processor.
   The link between a host and client may be capable of performing several basic signaling functions:
   An address should be associated with any data transferred.
   A client may be able to send a signal to a host to inform the host that the client is ready to perform some form of data transfer.
   In an environment where more than one host is present the client may be able to distinguish between each host and have the capability of signaling to a host exclusively and directly.
   If client mode host functionality is required the client may be able to request access to the data transfer medium.
Physical Layer, Shared Resources
   The API may provide management of the shared resources. This may primarily involve mutual-exclusion enforcement. Further extensions may provide features such as a static or a dynamic MMU. The auxiliary command system may provide access to features such as bank switching or a dynamic MMU.
   Auxiliary I/O may be provided via an I/O mapped system. User functions may use a set of macros to generate functions to access a given auxiliary I/O port. Auxiliary I/O ports may be defined in the header file provided for accessing the user function macros. When developing a new platform auxiliary I/O should be named and the ports defined in the physical library.
   When building a co-processor one step may be to configure the method used to access any available memory banks. This configuration step may usually only be done once for a platform unless the memory bank configuration needs to be changed. It may be possible to configure a memory bank as a dedicated bank or a multi-port bank. The option for a dedicated or multi-port RAM bank is given to allow a function to have exclusive access to a memory bank or to allow several functions to share access to a memory bank. When the library for a new platform is developed each memory bank may be given a unique name.
Getting Data From the Host
   A client is not capable of requesting data from the host. A client function can use the GetData function to wait for the host to send data. The GetData function may block until the host transfers data to the client function.
Sending Data to the Host
   A client cannot directly initiate a data transfer to the host. A client can notify the host that it has data ready to transfer. NotifyDataReady( ) is used to get the attention of the host. A client can never initiate a data transfer, using the notification function may signal to a host that one wants to transfer data. How the host interprets the signal is dependent on the host application.
   Use SendData to perform the actual transfer of data. This function may block until the provided data has been transferred. Data transfers are never initiated by the client. This function should normally only be used after sending a data ready notification.
Inter-Function Communication
   A function may be capable of sending a message to another function. To do this a function may need to know the address of the destination function. Inter function communication is achieved using mailboxes. A mailbox is a pair of registers. One register may be used for sending mail and the other for receiving mail. A flag may be used to indicate when new mail has arrived. A function should monitor the flag to determine when mail has arrived. The flag may be active when new mail is in the mailbox. If after a read of the mail box the flag is still high then new mail has already arrived i.e. the flag is an active high signal.
Client Mode Host Operations
   A user function can perform host type operations. The host operating mode is enabled using the mail delivery system. Posting a message to address zero may allow a function to execute a function as if it were a host. The data may represent the index of the function that may receive communication. This functionality may also allow the remote execution of a function; providing that the platform supports this type of operation. The MSB of the data is used to distinguish between internal and remote function executions. If the MSB is set then remote execution mode is selected. Once this posting has been sent the SendData and GetData functions may be re-directed to the specified function. To restore normal operation of the SendData and GetData functions a message should be posted to address zero with the data set to zero.

Co-Processor User Functions

A co-processor function may be self contained within the Handel-C function construct. A function may interact with the system via the client user API. Every user function may accept the same parameter. The parameter may be a pointer to a structure that contains pointers to the user API functions. The only exception may be auxiliary I/O access. For a function to gain access to auxiliary requires that the auxiliary I/O macros are used, the only part of the API that is publicly visible to a function.

FIG. 91 shows a typical execution flow 9100 for a function. Upon execution the function gathers its parameters in operation 9102, it then performs a processing operation 9104 and returns the results to the host in operation 9106. FIG. 91 is only an example since the functions do not have to execute in this manner.

Host and Client Interaction Specification

The particular protocol used when a host and client communicate is not constrained. What is specified is the meanings of the messages that are communicated between a host and a client.

Basic Message Format

A host may always be the master in a communication, therefore a host may always initiate a data transfer between a host and a client. All messages from a host to a client may consist of an address with some data. The only messages that a client can send to a host is an attention message[1], this message may carry no address or data. Host messages may be data read operations or data write operations. The host can use an address of zero and the address MSB to send auxiliary commands to a client (see 0).

Address Zero

Address zero is reserved for system use. Address zero is the only address that is reserved by the system and cannot be used as an index for a client user function. A host may use address zero to query the client when an attention message is received.

A host may send a read message with address zero to a client to retrieve the reason for the attention message sent by the client. The data read from the client may be an address, the MSB of the address is used as a modifier (see 0).

Address zero is used internally in a client to distinguish between function indexes and internal system requests.

A host can use address zero with the MSB modified (see 0) to represent an auxiliary command.

Address MSB

Typically the address MSB may be used as an address modifier bit. If a platform supports an alternative method of achieving the following then the address MSB can be used for regular use. The address MSB is used to modify the meaning of the address.

A host uses the MSB modifier (set to '1') in conjunction with address zero to distinguish between signal reason requests and auxiliary command.

A host does not use the MSB modifier in normal communications so the MSB should be set to '0'.

A client uses the MSB modifier internally to distinguish between internal (MSB set to '0') addresses and external (MSB set to '1') addresses.

DETAILED DESIGN

Host and Client Interaction

The communication protocol used to transfer between host and client is not constrained by this design. This design does constrain the meaning of the data transferred between host and client.

The actual method of data transfer used between a host and client may depend on the system platform.

The host may see the FPGA co-processor as an addressable device. An FPGA co-processor device may treat each available address as a data port. To interact with an FPGA co-processor device the host may read and write data to the available ports.

Basic requirements for host/client communication:

Address zero is reserved for system use.

An address may always be associated with data.

An address always refers to an existing function index or address zero.

The most significant 8 bits of the address is reserved by the system and is used as an address modifier bit.

Data Transfer Mechanism

To transfer or read data from a function a host should perform a read or write operation to the address it requires data from. Data should be streamed to an address as an address does not represent registers i.e. repeated reads or writes to the same address. Addresses should not be incremented when data is read or written as this would address other functions.

Parameters are passed to a function by performing a write operation to the functions index address. Data is returned from a function by reading from the functions index address. The amount of data transferred is dependent on the design of the co-processor function. The host may know how much data to transfer or use the data being transferred to indicate how much data may be transferred.

Read and write operations can be interrupted and resumed by the host at any time. This is possible due to the slave nature of a client device. Remote functions on the co-processor may wait while the transfer is suspended.

Host to Client Addressing Mechanism

The address space of an FPGA co-processor is used to stream data to the function residing on the co-processor. Each function on the co-processor may have a unique address assigned to it. The designation of the addresses it at the designers discretion. The only address that cannot be used for a function identifier is address zero. Address zero is reserved for system use.

Figure 92:
FIG. 92 shows a typical address packet, in accordance with one embodiment of the present invention.

FIG. 92 shows a typical address packet 9200. The most significant 8 bits of an address is ignored by the client address decoders and used as a command byte instead. The most significant 8 bits of an address packet are used as an address modifier. All other bits are available for use as function indexes. See Table 3.

TABLE 3

| Meaning | Value of Address Modifier | Interpretation of Data |
|---|---|---|
| Address Zero Commands (used when writing to address zero) | | |
| Set FIFO trigger level | 1 | Value for desired trigger level |
| Query function status | 2 | Function address |
| Set interrupt timeout timer | 3 | Time in µs |
| Address Zero Commands (used when reading from address zero) | | |
| Service required | 1 | Function address |
| Function available | 2 | Function address |
| Function busy | 3 | Function address |

Currently the address modifier is not used when using an address value other than zero. When using an address value other than zero the address modifier should be set to zero.

Address Zero

Address zero is reserved for system use. This is the only address that cannot be used for a user function index.

Address zero functionality:
  See Table 4.

TABLE 4

| Address Number | Host Mode | Description of address usage |
|---|---|---|
| 0 | Read | Read function status FIFO. The function status FIFO may contain messages from functions to the host. A message is a single double word; 32 bits of data. The messages from the client should be interpreted as an address packet using the status modifiers to interpret the address modifier data. |
| 0 | Write | The host can use the address modifier data to send command to the client. |

Arbitration in a Multiple Host Environment
Client Message Signal/Interrupt

The client has only one mechanism to signal to the host. This may be in the form of an interrupt. The client may use this interrupt to pass two different messages to a host. When a host receives the interrupt it may query the client to determine the reason for the interrupt.

The host queries the client by reading from address zero. This may read the client message FIFO. The data sent by the client may be in the form of address packets with the client to host interpretation of the address modifier bit. The client may transmit zero valued address packets when there is no more data to read from the client message FIFO. Messages from the client may either be data ready messages from functions or function available messages from the client.

Host API

The specification provides details about functional interfaces for the components of the host API.

Physical Component Library

The physical component library is platform and protocol dependent. A basic outline for a physical library implementation may be given here.

For a host to communicate with a client first requires that the client is first made to listen to the communication. This may be implemented by activating the co-processors chip select line or another alternative method. Once the co-processor is listening the host may transfer an address. Once a host has transmitted an address it may transfer data according to the host client interactions protocol.

Unique identifiers may be assigned to each function for progress monitoring.

API Public Interface Library
Deadline Scheduling of Communication Requests

It is possible to have several active data transfers at one time and it is possible to interrupt a transfer.

Client API
Physical Core and User Core Linkages

The co-processor construction libraries contain all the software needed to construct the framework of a co-processor. MPRAMs to allow fast data transfer between the physical core and user core(s) when running in different clock domains.

An exemplary floating and fixed point library will now be set forth along with information on waveform analysis.

Fixed and Floating Point Library

The Handel-C Floating Point Library provides floating-point support to applications written with the Handel-C development environment.

Features of the Floating Point Library according to a preferred embodiment include the following:

Zero-cycle addition, multiplication and subtraction.
Contains useful operators such as negation, absolute values, shifts and rounding.
Supports numbers of up to exponent width 15 and mantissa width 63.
Supports conversion to and from integers.
Provides square root functionality.

The Floating Point Library can be used to provide the following applications:

Floating precision DSP's.
Vector matrix computation.
'Real World' applications.
Any computation requiring precision.

In the Library, variables are kept in structures whose widths are defined at compile time. There are three parts to the structure; a single sign bit, exponent bits whose width is user defined upon declaration, and mantissa bits, also user defined. The 'real' value of the floating point number may be:

$(-1)^{sign} \cdot 2^{(exponent-bias)} \cdot (1.\text{mantissa})$

Where the bias depends on the width of the exponent.

In use, floating point variable widths are set by using declaration macros at compile time.

Illustrative declaration macros are set forth below.

The library is used by calling one of the zero cycle macro expressions.

a=FloatAdd(b, c);

Multi-cycle macros are called in a different way.

FloatDiv(b, c, a);

The macros are not inherently shared; they are automatically expanded where they are called. If extensive use of some of the macros is required, it is advisable to share them in the following manner.

For zero-Cycle macros:
  shared expr fmul_1(a, b)=FloatMult(a, b);
  shared expr fmul_2(a, b)=FloatMult(a, b);
For multi-cycle macros:

```
void fdiv1( FLOAT_TYPE *d, FLOAT_TYPE *n,
FLOAT_TYPE *q)
{
    FloatDiv(*d, *n, *q);
}
```

There will now be defined two zero-cycle multipliers and one divider. All the usual precautions on shared hardware may now be taken.

The following table, Table 5, provide performance statistics for various illustrative embodiments.

Altera Flex 10K30A FPGA.

TABLE 5

|  | Float Size (exp/mant) | CLB Slices | Max Clock Speed |
|---|---|---|---|
| FloatAdd | 6/16 | 1205 | 9.46 |
| FloatMult | 6/16 | 996 | 9.38 |
| FloatDiv | 6/16 | 390 | 22.02 |
| FloatSqrt | 6/16 | 361 | 18.21 |
| FloatAdd | 8/23 | 1328 | 6.53 |
| FloatMult | 8/23 | 1922 | 7.05 |
| FloatDiv | 8/23 | 528 | 16.80 |
| FloatSqrt | 8/23 | 505 | 13.47 |
| Xilinx Virtex V1000-6 FPGA. | | | |
| FloatAdd | 6/16 | 799 | 33.95 |
| FloatMult | 6/16 | 445 | 30.67 |
| FloatDiv | 6/16 | 348 | 39.61 |
| FloatSqrt | 6/16 | 202 | 32.93 |

TABLE 5-continued

| | Float Size (exp/mant) | CLB Slices | Max Clock Speed |
|---|---|---|---|
| FloatAdd | 8/23 | 1113 | 33.95 |
| FloatMult | 8/23 | 651 | 28.79 |
| FloatDiv | 8/23 | 459 | 36.72 |
| FloatSqrt | 8/23 | 273 | 38.31 |

The program files that make up this Library and their purpose are set forth below.

| Filename | Purpose |
|---|---|
| Float.h | Prototypes the macros to the user |
| Float.lib | Stores the functionality of the library |

Illustrative macros that may be defined in the Handel-C code are presented in the following table.

| Macro Name | Type | Purpose |
|---|---|---|
| FLOAT | # define | Sets the widths of a Floating-point variable |
| FloatAbs | Macro expression | Returns absolute value of a Floating-point number |
| FloatNeg | Macro expression | Returns negation of a Floating-point number |
| FloatLeftShift | Macro expression | Left shifts a Floating-point number |
| FloatRightShift | Macro expression | Right shifts a Floating-point number |
| FloatRound | Macro expression | Rounds the mantissa of a Floating-point number |
| FloatConvert | Macro expression | Changes a Floating-point number's width |
| FloatMult | Macro expression | Multiplies two Floating-point numbers together |
| FloatAdd | Macro expression | Adds two Floating-point numbers together |
| FloatSub | Macro expression | Subtracts two Floating-point numbers from each other |
| FloatDiv | Macro procedure | Divides two Floating-point numbers |
| FloatSqrt | Macro procedure | Finds the square root of a Floating-point number |
| FloatToUInt | Macro expression | Converts a Floating-point number to an unsigned integer |
| FloatToInt | Macro expression | Converts a Floating-point number to a signed integer |
| FloatFromUInt | Macro expression | Converts an unsigned integer to a Floating-point number |
| FloatFromInt | Macro expression | Converts a signed integer to a Floating-point number |

Software Development for the Floating-Point Library

This section specifies in detail the performance and functional specification of the design. It also documents tests that can be used to verify that each macro functions correctly and that they integrate to work as one complete library.

The purpose of this design is to update an existing library to enable the user to perform arithmetic operations and integer to floating point conversions on floating point numbers in Handel-C.
About the macros
Representation of a floating point number.

A floating-point number is represented as a structure in the macros. The structure has three binary sections as to the IEEE 754 specifications.

Sign bit (unsigned mt x.Sign)
Exponent (unsigned int x.Exponent)
Mantissa (unsigned int x.Mantissa)
In the library the structure of a floating-point number, say x, may be as follows:
x={x.Sign, x.Exponent, x.Mantissa}
This represents the number:
$(-1)^{x.Sign}*(1.(x.Mantissa))*2^{(x.Exponent-bias)}$
This expression can represent any decimal number within a range restricted by the exponent and mantissa width. Below is an example of how a floating-point number is defined.

```
#include <Float.h>
set clock = external "P1";
typedefFLOAT(4, 6) Float_4_6;
void main( )
{
  Float_4_6x;
  x = {0,9,38};
}
```

First a structure type is chosen by stating the widths of the exponent and mantissa. The exponent is chosen to be of width 4 and the mantissa to be of width 6. This structure is named Float__4__6 and x is defined to be of this type.
x.Sign=0
This means that the number is positive.
x.Exponent=9
x.Exponent is unsigned but represents a signed number. To do this the exponent needs a correcting bias which is dependent on it's width.

$Bias = 2^{(Width\ of\ exponent-1)} - 1$

In this case as the exponent width is 4 then the bias is $(2^3-1)=7$. The number 9 therefore means the multiplying factor is $2^{(9-7)}=2^2=4$.
x.Mantissa=38

The mantissa represents the decimal places of the number. As x.Mantissa=38=100110 then this represents the binary number 1.100110 in the equation. In decimal this is 1.59375. The one added to this number is known as a hidden 1.

The floating point number represented by {0,9,38} is:

$(-1)^0(1.59375)(4)=6.375$

IEEE Width Specifications.

The widths of the exponent and mantissa have certain set specifications.
IEEE 754 Single Precision
Exponent is 8 bits and has a bias of 127
Mantissa is 23 bits not including the hidden 1.
IEEE 754 Double Precision
Exponent is 11 bits and has a bias of 1023
Mantissa is 52 bits not including the hidden 1.
IEEE 754 Extended Precision
Exponent is 15 bits and has a bias of 32767
Mantissa is 64 bits not including the hidden 1.
The precision types can be requested by specifying these Exponent and Mantissa widths for the floating point number.
Valid Floating-point Numbers.

For the purposes of this section a valid floating-point number is one of Exponent width less than 16 and Mantissa width less than 64. The Exponent and Mantissa are any bit pattern inside those widths which includes the special bit patterns. This library is tested up to this level.

Single Cycle Expressions.

Most of the library utilities are zero cycle macro expressions and so use a single cycle when part of an assignment. They allow input variables of any width (up to a maximum mantissa width of 63). They may however only be tested up to a precision which is 1 sign bit, 15 exponent bits and 63 mantissa bits.

An example of a single cycle expression is the subtraction utility. This macro takes two floating-point numbers, f1 and f2 of the same structure type.

result=FloatSub(f1, f2);

Result would then be a floating-point number with the same structure type as f1 and f2.

Division and Square Root Macros.

The only utilities implemented as macro procedures (which are not single cycle expressions) are the division and square-root macros. These are called in a slightly different manner, with one of the input parameters eventually holding the result value. For example, the division macro is defined as:

FloatDiv(N, D, Q);

The parameters for all these functions are:

N floating point numerator.

D floating point divisor.

Q floating point quotient (the result value).

N and D are unchanged after the macro is completed.

Special Values.

Special bit patterns are recognized in the library. These are referred to as Not a Number (NaN) and infinity.

NaN

NaN is represented by all 1's in the exponent and any non-zero pattern in the mantissa. Following is an example of a single precision NaN in binary.

x.Sign=0 x.Exponent=11111111 x.Mantissa=00000000000000000000001

Infinity

Infinity is represented by all 1's in the exponent and all 0's in the mantissa. This is the only way the single precision infinity can be represented in binary.

x.Sign=0 x.Exponent=11111111 x.Mantissa=00000000000000000000000

Output when Errors Occur.

When an error occurs in the calculation a special bit pattern is output as error messages. The bit pattern that is produced depends on the situation. Several illustrative bit patterns are set forth below. Underflow is not strictly an error, but it is included below in Table 6 for reference.

TABLE 6

| Problem number | Problem | Where problem occurs | Output |
|---|---|---|---|
| 1 | Input Infinity | Input | Infinity |
| 2 | Overflow | Result | Infinity |
| 3 | x/0, x != 0 | Input | Infinity |
| 4 | Input NaN | Input | NaN (Mantissa: Same as input) |
| 5 | 0 * Infinity | Input | NaN (Mantissa: 1) |
| 6 | 0/0 | Input | NaN (Mantissa: 2) |
| 7 | sqrt(x), x < 0 | Input | NaN (Mantissa: 3) |
| 8 | Infinity + (−Infinity) | Input | NaN (Mantissa: 4) |
| 9 | Infinity/Infinity | Input | NaN (Mantissa: 5) |

TABLE 6-continued

| Problem number | Problem | Where problem occurs | Output |
|---|---|---|---|
| 10 | Underflow | Result | 0 |
| 11 | sqrt(−0) | Input | −0 |

For each of the following macros all input and result floating-point numbers have the same structure type.

Structure

ID: Structure 1

Prototype: #define FLOAT(ExpWidth, MantWidth) float_Name

Description.

Defines a structure called float_Name with an unsigned integer part called Sign (of width 1), unsigned integer part called Exponent (of width ExpWidth) and unsigned integer part called Mantissa (with width MantWidth). Note Table 7.

TABLE 7

| Parameters | Description | Range |
|---|---|---|
| ExpWidth | The width of the exponent | (1 . . . 15) |
| MantWidth | The width of the mantissa | (1 . . . 63) |

Absolute value.

ID:Function 1

Prototype:FloatAbs(x)

Description.

Returns the absolute (positive) value of a floating point number.

Possible error.

None. Note Table 8.

TABLE 8

| Parameters | Description | Range |
|---|---|---|
| x | Floating-point Number | Any valid F.P. number |

Negation.

ID:Function 2

Prototype:FloatNeg(x)

Description.

Returns the negated value of a floating point number.

Possible error.

Negating zero returns a zero. Note Table 9.

TABLE 9

| Parameters | Description | Range |
|---|---|---|
| x | Floating-point Number | Any valid F.P. number |

Left shift.

ID:Function 3

Prototype:FloatLeftShift(x, v)

Description.

Shifts a floating-point number by v places to the left. This macro is equivalent to << for integers.

Possible error.

1,2 & 4.

EXAMPLE

Single precision representation of 6 left shifted by 4.

$$(-1)^0(1+0.5)*2^{(129-127)}<<4=(-1)^0(1+0.5)*2^{(133-127)}$$

The result is the representation of 96 or **6\*2⁴**. Note Table 10.

TABLE 10

| Parameters | Description | Range |
| --- | --- | --- |
| x | Floating-point Number | Any valid F.P. number |
| v | Amount to shift by. | Unsigned integer (0 ... width(x)) |

Right Shift.
ID:Function 4
Prototype:FloatRightShift(x, v)
Description.
  Shifts a floating-point number by v places to the right. This macro is equivalent to >> for integers.
Possible error.
  1, 4 & 10. Note Table 11.

TABLE 11

| Parameters | Description | Range |
| --- | --- | --- |
| x | Floating-point Number | Any valid F.P. number |
| v | Amount to shift by. | Unsigned integer (0 ... width(x)) |

Nearest Rounding.
ID:Function 5
Prototype:FloatRound(x, MantWidth)
Description.
  Rounds a floating-point number to have mantissa width Mantwidth. The value MantWidth may be less than the original mantissa width or else the macro won't compile.
Possible errors.
  1 & 4. Note Table 12.

TABLE 12

| Parameters | Description | Range |
| --- | --- | --- |
| x | Floating-point number of any width | Any valid F.P. number |
| MantWidth | Mantissa width of the result | Unsigned integer (1 ... 63) |

Conversion Between Widths.
ID:Function 6
Prototype:FloatConvert(x, ExpWidth, MantWidth)
Description.
  Converts a floating-point number to a float of exponent width ExpWidth and mantissa width MantWidth.
Possible errors.
  1, 2 & 4. Note Table 13.

TABLE 13

| Parameters | Description | Range |
| --- | --- | --- |
| x | Floating-point number of any width | Any valid F.P. number |
| ExpWidth | Exponent width of the result | Unsigned integer (1 ... 15) |

TABLE 13-continued

| Parameters | Description | Range |
| --- | --- | --- |
| MantWidth | Mantissa width of the result | Unsigned integer (1 ... 63) |

Multiplier.
ID:Function 7
Prototype:FloatMult(x1, x2)
Description.
  Multiplies two floating point numbers of matching widths.
Possible Errors.
  1, 2, 4, 5 & 10. Note Table 14.

TABLE 14

| Parameters | Description | Range |
| --- | --- | --- |
| x1, x2 | Floating-point numbers | Any valid F.P. number |

Addition.
ID:Function 8
Prototype:FloatAdd(x1, x2)
Description.
  Adds two floating point numbers of matching widths.
Possible Errors.
  1, 2, 4 & 8. Note Table 15.

TABLE 15

| Parameters | Description | Range |
| --- | --- | --- |
| x1, x2 | Floating-point numbers | Any valid F.P. number |

Subtraction.
ID:Function 9
Prototype:FloatSub(x1, x2)
Description.
  Subtracts two floating-point numbers of matching widths (x1-x2).
Possible Errors.
  1, 2, 4 & 8. Table 16.

TABLE 16

| Parameters | Description | Range |
| --- | --- | --- |
| x1, x2 | Floating-point numbers | Any valid F.P. number |

Division.
ID:Function 10
Prototype:FloatDiv(N, D, Q)
Description.
  Divides two floating-point numbers of matching widths and outputs the quotient. N/D=Q
Possible Errors.
  1, 2, 3, 4, 6, 9 & 10. Table 17.

| Parameters | Description | Range |
| --- | --- | --- |
| N, D | Input floating-point numbers | Any valid F.P. number |
| Q | Output floating-point number = N/D | Any valid F.P. number |

Square root.
ID:Function 11
Prototype:FloatSqrt(R, Q)
Description.
  Square roots a floating-point number. Sqrt(R)=Q
Possible errors.
  1, 4, 7, 10 & 11. Table 18.

TABLE 18

| Parameters | Description | Range |
|---|---|---|
| R | Input floating-point number | Any valid F.P. number |
| Q | Output floating-point number = Sqrt(R) | Any valid F.P. number |

Floating Point to Unsigned Integer Conversion.
ID:Function 12
Prototype:FloatToUInt(x, wi)
Description.
  Converts a floating-point number into an unsigned integer of width wi using truncation rounding. If the number is negative a zero is returned.
Possible Errors.
  1 & 4. Table 19.

TABLE 19

| Parameters | Description | Range |
|---|---|---|
| x | Floating-point number | Any valid F.P. number |
| wi | Total width of the result | Any unsigned integer |

Floating Point to Signed Integer Conversion.
ID:Function 13
Prototype:FloatToInt(x, wi)
Description.
  Converts a floating point number into a signed integer of width wi using truncation rounding.
Possible Errors.
  1 & 4.

TABLE 20

| Parameters | Description | Range |
|---|---|---|
| x | Floating-point number | Any valid F.P. number |
| wi | Total width of the result | Any unsigned integer |

Unsigned Integer to Floating Point Conversion.
ID:Function 14
Prototype:FloatFromUInt(U, ExpWidth, MantWidth)
Description.
  Converts an unsigned integer into a floating point number of exponent width ExpWidth and mantissa width MantWidth using truncation rounding.
Possible Errors.
  2. See Table 21.

TABLE 21

| Parameters | Description | Range |
|---|---|---|
| u | Unsigned integer | Any unsigned integer |
| ExpWidth | Exponent width of the result | Unsigned integer (1 ... 63) |

TABLE 21-continued

| Parameters | Description | Range |
|---|---|---|
| MantWidth | Mantissa width of the result | Unsigned integer (1 ... 15) |

Signed Integer to Floating Point Conversion.
ID:Function 15
Prototype:FloatFromInt(i, ExpWidth, MantWidth)
Description.
  Converts a signed integer into a floating point number of exponent width ExpWidth and mantissa width MantWidth using truncation rounding.
Possible Errors.
  2. Note Table 22.

TABLE 22

| Parameters | Description | Range |
|---|---|---|
| i | Integer | Any integer |
| ExpWidth | Exponent width of the result | Unsigned integer (1 ... 63) |
| MantWidth | Mantissa width of the result | Unsigned integer (1 ... 15) |

Detailed Design
  The following subsections describe design specifications for practicing various embodiments of the present invention.
Interface Design
Structure 1—FLOAT(ExpWidth, MantWidth) Float Name
Description.
  Defines a structure called Float_Name with an unsigned integer part called Sign (of width 1), an unsigned integer part called Exponent (of width ExpWidth) and an unsigned integer part called Mantissa (with width MantWidth).
Valid Floating-point Numbers.
  For the purposes of this section, a valid floating-point number is one of ExpWidth less than 16 and MantWidth less than 65. The Exponent and Mantissa are any bit pattern inside those widths including the special bit patterns. The library may be tested up to this level.
Input.
  ExpWidth—The width of the exponent.
  MantWidth—The width of the mantissa.
Output.

```
struct
{
  unsigned int 1 Sign;
  unsigned int ExpWidth Exponent;
  unsigned int MantWidth Mantissa;
}float_Name;
```

Component Detail Design
Explanation of the Detailed Description.
  If a variable isn't mentioned then it is the same on output as input. For ease of understanding, the operations on each component have each been provided with a header.
  Each macro tests if the input is infinity or NaN before it does the stated calculations. If the input is invalid the same floating-point number is output. This can be done by:

```
           if Exponent = −1
           {
             x = x
           }
           else
           {
             x = Calculation
           }
```

Some of the library macros call upon other macros unseen by the user. These are listed in each section along with a brief description as to their use under the title "Dependencies".

Function 1—FloatAbs(x)
Description.
  Returns the absolute (positive) value of a floating point number.
Input.
  x—Floating point number of width up to {1, 15, 63}.
Output.
  Floating point number of same width as input.
Detailed description.
  Sign
  x.Sign=0.
Function 2—FloatNeg(x)
Description.
  Returns the negated value of a floating point number.
Input.
  x—Floating point number of width up to {1, 15, 63}.
Output.
  Floating point number of same width as input.
Detailed Description.
  Sign
  if Exponent@Mantissa=0.
  {
  x.Sign=0, Exponent=0, Mantissa=0
  }
  else
  {
  x.Sign=!Sign
  }
Function 3—FloatLeftShift(x, v)
Description.
  Shifts a floating-point number by v places to the left. This macro is equivalent to << for integers.
Input.
  x—Floating point number of width up to {1, 15, 63 }.
  v—Unsigned integer to shift by. This is not larger than ExpWidth.
Output.
  Floating point number of same width as input.
Detailed Description.

```
           if Exponent + v > The maximum exponent for the width
           {
             x = infinity
           }
           else
           {
             Exponent
             if x = 0
             {
               x = x
             }
             else
             {
               x.Exponent = Exponent + v
             }
           }
```

Function 4—FloatRightShift(x,v)
Description.
  Shifts a floating-point number by v places to the right. This macro is equivalent to >> for integers.
Input.
  x—Floating point number of width up to {1, 15, 63 }.
  v—Unsigned integer to shift by. This is not larger than ExpWidth.
Output.
  Floating point number of same width as input.
Detailed Description.

```
           if Exponent − v < The minimum Exponent for the width
           {
             x = 0
           }
           else
           {
             Exponent
             if x = 0
             {
               x = x
             }
             else
             {
               x.Exponent = Exponent − v
             }
           }
```

Function 5—FloatRound(x,MantWidth)
Description.
  Rounds a floating-point number to one with mantissa width MantWidth.
Input.
  x—Floating point number of width up to {1, 15, 63}.
  MantWidth—Round to unsigned mantissa width MantWidth.
Output.
  Floating point number of same exponent width as input and mantissa width MantWidth.
Dependencies.
  RoundUMant—extracts mantissa as an unsigned integer (with hidden 1)
  RoundRndMant—Rounds mantissa to MantWidth +2
Detailed Description.
Mantissa
  if the next least significant bit and any of the other less significant bits after the cut off point are 1

```
           {
             x.Mantissa = The MantWidth most significant bits of Mantissa + 1
           }
           else
           {
             x.Mantissa = The MantWidth most significant bits of Mantissa
           }
           Exponent
```

-continued
```
    if Mantissa overflows during rounding
    {
        x.Exponent = Exponent + 1
    }
    else
    {
        x.Exponent = Exponent
    }
```

Function 6—FloatConvert(x, ExpWidth, MantWidth)
Description.
  Converts a floating-point number to a float of exponent width ExpWidth and mantissa width MantWidth.
Input.
  x—Floating point number of width up to {1, 15, 63}.
  ExpWidth—Convert to unsigned exponent width ExpWidth.
  MantWidth—Convert to unsigned mantissa width MantWidth.
Output.
  Floating point number of exponent width ExpWidth and mantissa width MantWidth.
Detailed Description.

```
    if (Exponent - old bias) > new bias
    {
        x = infinity
    }
    else
    {
        Exponent
        x.Exponent = Exponent - old bias + new bias
        Mantissa
        if new width is greater than old width
        {
            x.Mantissa = Extended mantissa
        }
          else
          {
            x.Mantissa = Most significant width bits
          }
    }
```

Function 7—FloatMult(x1, x2)
Description.
  Multiplies two floating point numbers.
Input.
  x1, x2—Floating point numbers of width up to {1, 15, 63}
Output.
  Floating point number of same width as input.
Dependencies.
  MultUnderflowTest—Tests exponent for underflow.
  MultOverflowTest—Tests exponent for overflow.
  MultSign—Multipies the Signs.
  GetDoubleMantissa—Pads the Mantissa with mantissa width zeros.
  MantissaMultOverflow—Tests mantissa for overflow.
  AddExponents—Adds exponents.
  MultMantissa—Multiplies mantissa and selects the right bits.
Detailed Description.

```
Test for exponent underflow
if underflow is true { x = 0 }
else
```

```
{
    Test for exponent overflow
    if overflow is true { x = Infinity }
    else
    {
        Sign
        x.Sign = x1.Sign or x2.Sign
        Exponent
        if mantissa overflows
        {
            x.Exponent = x1.Exponent + x2.Exponent + 1
        }
        else
        {
            x.Exponent = x1.Exponent + x2.Exponent
        }
        Mantissa
        Both mantissas are padded below with zeros
        Mantissa = x1.Mantissa * x2.Mantissa
        x.Mantissa = top input width mantissa bits
        }
}
```

Function 8—FloatAdd(x1, x2)
Description.
  Adds two floating point numbers.
Input.
  x1, x2—Floating point numbers of width up to {1, 15, 63}.
Output.
  Floating point number of same width as input.
Dependencies.
  SignedMant—Extracts mantissa as a signed integer.
  MaxBiasedExp—determines the greater of two biased exponents.
  BiasedExpDiff—Gets the difference between two exponents (to 64).
  AddMant—Adds two mantissa.
  GetBiasedExp—Gets biased exponent of the result.
  GetAddMant—Gets the normalised mantissa of the result.
Detailed Description.

```
Test for overflow
if number overflows { x = infinity }
else
{
    Sign
    Adjust the mantissa to have same exponent
    Add them
    x.Sign = Sign of the result
    Exponent
    if addition = 0
    {
        x.Exponent = 0
    }
    else
    {
        x.Exponent = Max Exponent - Amount Mantissa adjusted by
    }
    Mantissa
    Adjust mantissa to have the same exponent
Mantissa = x1.Mantissa    + x2.Mantissa
    x.Mantissa = top width bits of mantissa
}
```

Function 9—FloatSub(x1,x2)
Description.
  Subtracts one float from another.
Input.
  x1,x2—Floating point numbers of width up to {1, 15, 63}.
Output.
  Floating point number (x1−x2) of same width as input.

Dependencies.
  FloatNeg—Negates number.
  FloatAdd—Adds two numbers.
Detailed Description.
  x=FloatAdd(x1,-x2)
Function 10—FloatDiv(N, D, Q)
Description.
  Divides two floats and outputs the quotient. Q=N/D.
Input.
  N, D, Q—Floating point numbers of width up to {1, 15, 63}
Output.
  None as it is a macro procedure.
Detailed Description.
  This division macro is based on the non-restoring basic division scheme for signed numbers. This scheme has the following routine:
  Set s=2* (1 concatenated to N.Mantissa)
  Set d=2* (1 concatenated to D.mantissa)
  Check to see if s is larger than d
  If so set exponent adjust to zero
  Else s=s/2 and set exponent adjust to one
  Then do the following procedure mantissa width +1 times.
  Check to see if first digit of (2* s)-d is 0
  If so s=(2* s)-d, q=(2* q)+1
  Else s=2* s, q=2* q
  The quotient Q is then
  Q.Sign=N.Sign or D.Sign
  Q.Exponent=N.Exponent-D.Exponent+the exponent adjust -1
  Q.Mantissa=The least significant mantissa width bits of q
Worked example—dividing 10 by -2.
  10=(1.25)*2^3={0, 0011, 01000}
  -2=-(1.0)*2^1={1, 0001 00000}
  So
  s=01010000
  d=01000000

Is s larger than d?Yes so
  s=00101000
  adj_e=1
Iteration 1.
  (2* s)-d=01010000-01000000=00010000
  The first digit is 0 so
  s=00010000
  q=1
Iteration 2.
  (2* s)-d=00100000-01000000=1010000
  The first digit is 1 so
  s=00100000
  q=10
Iteration 3.
  (2* s)-d=01000000-01000000=00000000
  The first digit is 0 so
  s=00000000
  q=101
Iteration 4.
  (2* s)-d=00000000-01000000=11000000
  The first digit is 1 so
  s=00000000
  q=1010
Iteration 5.
  (2* s)-d=00000000-01000000=11000000
  The first digit is 1 so
  s=00000000
  q=10100
The result is that q ends up as 10100000 after iteration 8.
The quotient Q is then:
  Q.Sign=0 or 1=1
  Q.Exponent=N.Exponent-D.Exponent+adj_e-1=3-1+1-1=2
  Q.Mantissa=01000
So Q is -5 as required.

```
if D = 0
{
        Sign = D Sign
        Exponent = -1
        Mantissa = 1
}
else
{
        if N Exponent = -1 { Q = N }
        else
        {
                if D Exponent = -1 { Q = D }
                else
                {
                        if N = 0 { s = 0 }
                        else
                        {
                                s = ( 1 @ N Mantissa << 1)
                        }
                        d = ( 1 @ N Mantissa <<1)
                        q = 0
                        i = 0
                                if most significant bit (s-d) == 0
                                {
                                        s = s >> 1
                                        adj = 1
                                }
                                else { adj = 0 }
```

-continued

```
            while i not equal to width of mantissa + 1
            {
                if most significant bit of ( s << 1) − d = 0
                {
                    s = ( s << 1) − d
                    q = (q << 1) +1
                }
                else
                {
                    s = s << 1
                    q = q << 1
                }
            }
        i = i + 1
            Q Sign = N Sign or D Sign
            if q = 0
            {
                Q Exponent = 0
            }
            else { Q Exponent = N Exponent − D Exponent + adj + Bias − 1 }
            Q Mantissa = bottom width bits of q
        }
    }
}
```

Function 11—FloatSqrt(R, Q)
Description
 Calculates the square root of the input. Q=Sqrt(R)
Input
 R, Q—Floating point numbers of width up to {1, 15, 63}
Output
 None as it is a macro procedure.
Dependencies.
 GetUnbiasedExp—Extracts unbiased exponent.
Detailed Description.
 This square root macro is based on the restoring shift/subtract algorithm. This scheme has the following routine:
 Set q=1
 Set i=0
 Check to see if exponent positive
 If so
  Set e=R.Exponent/2
  Set s=R.Mantissa
 Else
  Set e=R.Exponent −1
  Set s=2* R.Mantissa+2^(mantissa width)
 Then do the following procedure mantissa width +1 times.
 Check to see if first digit of (2* s)−(4*q+1)*2^(Mantissa width −1 −i) is 0
 If so s=(2* s)−(4*q+1)*2^(Mantissa width −1 −i), q=(2* q)+1
 Else s=2* s, q=2* q
 The square root Q is then
 Q.Sign=0
 Q.Exponent=e+bias
 Q.Mantissa=The least significant mantissa width bits of q
Worked example—Square rooting 36
 36=(1.125)*2^5={0, 0101 , 00100}
 So as exponent is odd
 e=0010
 s=2* mantissa+2^5=00001000+00100000=00101000
 q=1
Iteration 1.
 010100000−(000100+00000001)<<4=00000000 First digit is 0 so
 s=00000000
 q=11
 Iteration 2.
 00000000−(00001100−00000001)<<3=10011000 First digit is 1 so
 S=00000000
 q=110
Iteration 3.
 00000000−(00011000−00000001)<<2=1001100 First digit is 1 so
 s=00000000
 q=1100
 This continues until we have the answer
 Q.Sign=0
 Q.Exponent=2+bias (in this case bias is 7)
 Q.Mantissa=10000
 So Q is the integer 6.

```
if R Sign = 1
{
    Q Sign = R Sign
    Q Exponent = −1
    Q Mantissa = 2
}
else
{
    if R Exponent = −1
    {
        Q = R
    }
    else
    {
        if unbiased exponent even
        {
            e =( Unbiased exponent) /2
        s = R Mantissa
        }
        else
        {
            e = (Unbiased exponent − 1)/2
            s = ( R Mantissa << 1) + ewidth of Q
        }
```

```
q = 1
i = 0
while i not equal to width Mantissa + 1
{
    c = ((s << 1)-    ((4*q + 1) << width mantissa - 1 - i ) )
    if most significant bit of c = 1
    {
        s = c
        q = ( q << 1) + 1
    }
    else
    {
        s = s << 1
        q = q << 1
    }
    i = i + 1
}
if R not equal to 0
{
    Q Sign = 0
    Q Exponent = e + bias
    Q Mantissa = top width bits of q
}
else { Q = 0 }
}
}
```

Function 12—FloatToUInt(x, wi)
Description.
　　Converts a floating-point number into an unsigned integer of width wi using truncation rounding. If the number is negative a zero is returned.
Input.
　　x—Floating point number of width up to {1, 15, 63 }
　　wi—unsigned width of unsigned integer
Output.
　　Unsigned integer of width wi.
Dependencies.
　　GetMant—Gets mantissa for conversion to integer
　　ToRoundInt—Rounds to nearest integer
　　MantissaToInt—Converts mantissa to integer
Detailed Description.

```
if absolute value of float less than 0.5 or equal to 0
{
Output 0
}
else
{
Left shift mantissa by exponent places
Round to nearest integer
Output (unsigned) integer
}
```

Function 13—FloatToInt(x, wi)
Description.
　　Converts a floating point number into a signed integer of width wi using truncation rounding.
Input.
　　x—floating point number
　　wi—unsigned width of integer
Output.
　　Signed integer of width wi.
Dependencies.
　　GetMant—Gets mantissa for conversion to integer.
　　ToRoundInt—Rounds to nearest integer.
　　MantissaToInt—Converts mantissa to integer.

Detailed Description.
　　if absolute value of float less than 0.5 or equal to 0

```
if absolute value of float less than 0.5 or equal to 0
{
Output 0
}
else
{
Left shift mantissa by exponent places
Round to nearest integer
if sign = 0
{
Output integer
}
else
{
Output -integer
}
}
```

Function 14—FloatFromUInt(u, ExpWidth, MantWidth)
Description.
　　Converts an unsigned integer into a floating point number of exponent width ExpWidth and mantissa width MantWidth using truncation rounding.
Input.
　　u—unsigned integer
　　ExpWidth—unsigned width of output exponent
　　MantWidth—unsigned width of output mantissa
Output.
　　Floating point number of exponent width ExpWidth and mantissa width MantWidth.
Dependencies.
　　UIntToFloatExp—Gets signed integer to exponent
　　UIntToFloatNormalised—Gets signed integer to mantissa
Detailed Description.
　　When finding the left most bit of u the least significant bit is labeled 0 and the label numbering increases as the bits become more significant.
Sign
　　Sign=most significant binary integer bit
Exponent
　　if integer=0 {Exponent=0}
　　else {Exponent=position of left most bit+bias 3}
Mantissa

```
if integer = 0
{
Mantissa = 0
}
else
{
if width integer < width mantissa
{
    Mantissa = integer << ( width mant - position of left most bit of u)
}
else
{
    Mantissa = integer << ( width integer- position of left most bit of u)
}
}
```

Function 15—FloatFromInt(i, ExpWidth, MantWidth)
Description.
　　Converts a signed integer into a floating point number of exponent width ExpWidth and mantissa width MantWidth using truncation rounding.

Input.
  i—signed integer.
  ExpWidth—unsigned width of output exponent
  MantWidth—unsigned width of output mantissa
Output.
  Floating point number of exponent width ExpWidth and mantissa width MantWidth.
Dependencies.
  IntToFloatExp—Gets unsigned integer to exponent
  IntToFloatNormalised—Gets unsigned integer to mantissa
Detailed Description.
  When finding the left most bit of u the least significant bit is labelled 0 and the label numbering increases as the bits become more significant.
Sign
  Sign=most significant integer bit
Exponent
  if integer=0{Exponent=0}
  else{Exponent=position of left most bit+bias}
Mantissa

```
integer = absolute value of integer
if integer = 0
{
    Mantissa = 0
}
else
{
    if width integer < width mantissa
    {
        Mantissa = integer << ( width mant − left most bit of integer )
    }
    else
    {
        Mantissa = integer << ( width integer − left most bit of integer )
    }
}
```

Verification
  Testing method can be implemented with verification methods such as Positive (Pos), Negative (Neg), Volume and Stress (Vol), Comparison (Comp) and Demonstration (Demo) tests.
Positive Testing
  Valid floating point numbers are entered into the macro and the result is compared to the correct answer.
Negative Testing
  Invalid floating point numbers are entered into the macro and the resultant error is compared to the correct error.
Volume and Stress Testing
  Valid floating point numbers are repeatedly entered into the macro to see that it works in a correct and repeatable manner.
Comparison Testing
  Correct results are gained from a reliable source to compare the macro results to.
Demonstration Testing
  Behavior in representative circumstances is evaluated.
Fixed Point Library
Software Development for the Fixed-Point Library
  This section specifies in detail the performance and functional specification of the Fixed-Point Library design. It describes how requirements for implementation of the library are to be met. It also documents tests that are useful for verifying that each Handel-C and/or software unit functions correctly and that they integrate to work as one complete application.

The Handel-C Fixed-point Library contains a number of functions for the creation and manipulation of fixed-point numbers. It consists of a library (.lib) file, a header (.h) file and a function manual. The header prototypes the expressions available in the library.
  The Handel-C Fixed-point Library is constrained to adopt the design philosophy of Handel-C where numerical operators require matching types. Therefore the parameters of each function are of matching width and type and the result returned may be of matching width and type unless otherwise specified.
Number Structure
FIXED_SIGNED(intWidth, fracWidth)
  This creates a structure to hold a signed fixed-point number. intWidth sets the number of integer bits and fracWidth sets the number of fraction bits.
FIXED_UNSIGNED(intWidth, fracWidth)
  This creates a structure to hold an unsigned fixed-point number. intWidth sets the number of integer bits and fracWidth sets the number of fraction bits.
FIXED_ISSIGNED
  Defined to equal 1.
FIXED_ISUNSIGNED
  Defined to equal 0.
Bit Manipulation Operators
FixedLeftShift (fixed_Name, variable_Shift)
  Returns fixed_Name shifted left by variable_Shift number of bits. This produces a fixed-point number of the same type and width as fixed_Name with any bits shifted outside of its width being lost and any bits added being zero.
FixedRightShift(fixed_Name, variable_Shift)
  Returns fixed_Name shifted right by variable_Shift number of bits. This produces a fixed-point number of the same type as fixed_Name with any bits shifted outside of its width being lost. When shifting unsigned values the upper bits are padded with zeros. When shifting signed values, the upper bits are copies of the top bit of the original value. So signed numbers are sign extended in the same way as the Handel-C shift right function.
Arithmetic Operators
  Any attempt to perform one of these operations on two expressions of differing widths or types may result in a compiler error.
FixedNeg(fixed_Name)
  Returns the negative of the operand.
FixedAdd(fixed_Name1, fixed_Name2)
  Returns the sum of the operands.
Fixed Sub(fixed_Name1, fixed_Name2)
  Returns fixed_Name2 subtracted from fixed_Name1.
FixedMultSigned(fixed_Name1, fixed_Name2)
  Returns the product of the operands for signed numbers only.
FixedMultUnsigned(fixed_Name1, fixed_Name2)
  Returns the product of the operands for unsigned numbers only.
FixedDivSigned(fixed_Name1, fixed_Name2)
  Returns fixed_Name1 divided by fixed_Name2 for signed numbers only.
FixedDivUnsigned(fixed_Name1, fixed_Name2)
  Returns fixed_Name1 divided by fixed_Name2 for unsigned numbers only.
FixedAbs(fixed_Name)
  Returns the absolute value.
Relational Operators
  These operators compare values of the same width and return a single bit wide unsigned int value of 0 for false or 1 for true.
FixedEq(fixed_Name1, fixed_Name2)
  Returns true if the operands are equal.

FixedNEq(fixed_Name1, fixed_Name2)
Returns true if the operands are not equal.
FixedLT(fixed_Name1, fixed_Name2)
Returns true if fixed_Name1 is less than fixed_Name2.
FixedLTE(fixed_Name1, fixed_Name2)
Returns true if fixed_Name1 is less than or equal to fixed_Name2.
FixedGTE(fixed_Name1, fixed_Name2)
Returns true if fixed_Name1 is greater than fixed_Name2.
FixedGTE(fixed_Name1, fixed_Name2)
Returns true if fixed_Name1 is greater than or equal to fixed_Name2.

Bitwise Logical Operators

These operators perform bitwise logical operations on fixed-point numbers. Both operands may be of the same type and width:the resulting value may also be this type and width.
FixedNot(fixed_Name)
Returns bitwise not.
FixedAnd(fixed_Name1, fixed_Name2)
Returns bitwise and.
FixedOr(fixed_Name1, fixed_Name2)
Returns bitwise or.
FixedXor(fixed_Name1, fixed_Name2)
Returns bitwise exclusive or.

Conversion Operators

These operators are for the type conversion of fixed numbers.
FixedIntWidth(fixed_Name)
Returns the width of the integer part of fixed_Name as a compile time constant.
FixedFracWidth(fixed_Name)
Returns the width of the fraction part of fixed_Name as a compile time constant.
FixedLiteral(isSigned, intWidth, fracWidth, intBits, fracBits)
Returns a signed fixed-point number if isSigned is true and an unsigned fixed-point number if isSigned is false. This number has an integer part intBits of width intWidth and a fraction part fracBits of width fracWidth.
FixedToInt(fixed_Name)
Returns the integer part of the fixed-point number with the same type and width.
FixedToBool (fixed_Name)
Returns a single bit wide unsigned int value which is 0 for false if the operand equals 0 and 1 for true otherwise.
FixedToBits(fixed_Name)
Returns the integer and fraction bits of fixed_Name concatenated together. For a signed fixed-point number this may produce a signed integer of width intWidth+fracWidth. For an unsigned fixed-point number this may produce an unsigned integer of width intWidth+fracWidth.
FixedCastSigned (isSigned, intWidth, fracWidth, fixed_Name)
Casts any signed fixed-point number to the type and width specified.
FixedCastUnsigned (isSigned, intWidth, fracWidth, fixed_Name)
Casts any unsigned fixed-point number to the type and width specified.

Design

This section may describe the present invention according to a preferred embodiment.

Interface

This library can be accessed via a standard header file included in the client's programs by "#include <fixed.h>".

Shared Resources

Although the internal macros may be used by more than one public macro there can be no sharing conflicts as they are not defined as shared expressions and as such Handel-C may generate all the hardware required for every expression in the library every time it is used.

Note:

Handel-C arithmetic is used throughout the macros. This means that all operators return results of the same width as their operands and all overflow bits are dropped. For example:

```
#include "fixed.h"
set clock = external "P1";
typedef FIXED_UNSIGNED(4,4) MyFixed;
void main(void)
{
    MyFixed fixed1, fixed2, fixed3;
    // Assign the value 5 to fixed1
    fixed1 = FixedLiteral(FIXED_ISUNSIGNED, 4, 4, 5, 0) ;
    // Assign the value 5.5 to fixed2
    fixed2 = FixedLiteral(FIXED_ISSIGNED, 4, 4, 5, 8) ;
    // Multiply the numbers together
    fixed3 = FixedMultUnsigned(fixed1, fixed2) ;
}
```

This example results in fixed3 being set to 11.5:

fixed3. FixedIntBits=11;

fixed3. FixedFracBits=8;

The user is responsible for handling overflows explicitly and can use FixedCastSigned and FixedCastUnsigned to change the width of a fixed-point number.

Number Structure

The Handel-C data types used are signed and unsigned fixed-point numbers of user defined widths. The structures of the signed and unsigned fixed-point numbers are below. The widths of these fixed-point numbers are declared by the user. All the operations necessary to set, manipulate and extract the values of fixed_Name.FixedIntBits and fixed_Name.FixedFracBits are available in the library.

COMP 1.1 FIXED_SIGNED(intWidth, fracWidth)

Description

This creates a structure to hold a signed fixed-point number. intWidth sets the number of integer bits and fracWidth sets the number of fraction bits.

| Inputs | |
| --- | --- |
| intWidth | width of the integer part of the number |
| fracWidth | width of the fraction part of the number |

Output
Format of the Structure:

struct
{
signed intWidth FixedIntBits;
signed fracWidth FixedFracBits;
}

COMP 1.2 FIXED_UNSIGNED(intWidth, fracWidth)

Description

This creates a structure to hold an unsigned fixed-point number. intWidth sets the number of integer bits and fracWidth sets the number of fraction bits.

| Inputs | |
|---|---|
| intWidth | width of the integer part of the number |
| fracWidth | width of the fraction part of the number |

Output
Format of the Structure:
    struct
    {
    unsigned intWidth FixedIntBits;
    unsigned fracWidth FixedFracBits;
    }
COMP 1.3 FIXED_ISSIGNED
Description
    Defined to equal 1.
Inputs
    None
Output
    None
COMP 1.3 FIXED_ISUNSIGNED
Description
    Defined to equal 0.
Inputs
    None
Output
    None Bit Manipulation Operators
COMP 2.1 FixedLeftShift (fixed_Name, variable_Shift)
Description
    Returns fixed_Name shifted left by variable_Shift number of bits. This produces a fixed-point number of the same type and width as fixed_Name with any bits shifted outside of its width being lost and lower bits padded with zeros.

| Inputs | |
|---|---|
| fixed_Name | Fixed-point number of any type or width |
| variable_Shift | Unsigned integer number of bits to shift by. Width set by: width(variable_Shift)=log2ceil(fracWidth+intWidth+1) |

Output
    Fixed-point number of same type and width as fixed_Name
    Detailed Description
    Concatenate integer and fraction parts from fixed_Name into a single bit string
    Shift fixed_Name left by int_value number of bits
    Split result into integer and fraction parts of same type and width as fixed_Name
    Return as struct
COMP 2.2 FixedRightShift(fixed_Name, variable_Shift)
Description
    Returns fixed_Name shifted right by variable_Shift number of bits. This produces a fixed-point number of the same type as fixed_Name with any bits shifted outside of its width being lost. When shifting unsigned values the upper bits are padded with zeros. When shifting signed values, the upper bits are copies of the top bit of the original value. So signed numbers are sign extended in the same way as the Handel-C shift right function.

| Inputs | |
|---|---|
| fixed_Name | Fixed-point number of any type or width |
| variable_Shift | Unsigned integer number of bits to shift by. Width set by: width(variable_Shift)=log2ceil(fracWidth+intWidth+1) | width(variable_Shift)=log2ceil(fracWidth+intWidth+1)
Output
    Fixed-point number of same type and width as fixed_Name
    Detailed Description
    Concatenate integer and fraction parts from fixed_Name into a single bit string
    Shift fixed_Name right by int_value number of bits
    Split result into integer and fraction parts of same type and width as fixed_Name
    Return as struct
Arithmetic Operators
COMP 3.1 FixedNeg(fixed_Name)
Description
    Returns the negative of fixed_Name. The result of using this macro on an unsigned fixed-point structure is undefined.

| Inputs | |
|---|---|
| fixed_Name | Fixed-point number of any type and width |

Output
    Fixed-point number of same type and width as fixed_Name
    Detailed Description
    Concatenate integer and fraction parts from fixed_Name into a single bit string
    Negate the bit string
    Split result into integer and fraction parts of same type and width as fixed_Name
    Return as struct
COMP 3.2 FixedAdd(fixed_Name1, fixed_Name2)
Description
    Returns the fixed_Name1 and fixed_Name2 added together. The number returned is of the same width as the operands so any bits produced by the addition outside of this width overflow and are dropped.

| Inputs | |
|---|---|
| fixed_Name1 | Fixed-point number of any type or width |
| fixed_Name2 | Fixed-point number of the same type and width |

Output
    Fixed-point number of same type and width as fixed_Name1
Detailed Description
    At compile time check the operands are of the same width and if not give an assertion error
    Concatenate integer and fraction parts from fixed_Name1 into a single bit string
    Concatenate integer and fraction parts from fixed_Name2 into a single bit string Add the bit strings and drop any overflow bits Split result into integer and fraction parts of same type and width as fixed_Name Return as struct COMP 3.3 FixedSub(fixed_Name1, fixed_Name2)

Description

Returns fixed_Name2 subtracted from fixed_Name1. The number returned is of the same width as the operands so any bits produced by the subtraction outside of this width overflow and are lost.

| Inputs | |
|---|---|
| fixed_Name1 | Fixed-point number of any type or width |
| fixed_Name2 | Fixed-point number of the same type and width |

Output

Fixed-point number of same type and width as fixed_Name1

Detailed Description

At compile time check the operands are of the same width and if not give an assertion error Concatenate integer and fraction parts from fixed_Name1 into a single bit string Concatenate integer and fraction parts of same type and width as fixed_Name1

Return as struct

COMP 3.4 FixedMultSigned(fixed_Name1,fixed_Name2)

Description

Returns the product of the operands for signed numbers only. The number returned is of the same width as the operands so any bits produced by the multiplication outside of this width overflow and are lost.

| Inputs | |
|---|---|
| fixed_Name1 | Signed fixed-point number of any width |
| fixed_Name2 | Signed fixed-point number of the same width |

Output

Signed fixed-point number of same width as fixed_Name1

Detailed Description

At compile time check fixed_Name1 and fixed_Name2 are of the same width and signed type Concatenate integer and fraction parts from fixed_Name1 into a single bit string and sign extend the string by the width of the fraction part of fixed_Name1

Concatenate integer and fraction parts from fixed_Name2 into a single bit string and sign extend the string by the width of the fraction part of fixed_Name2

Multiply these bit strings together

Drop the fracWidth least significant bits of the result

Split result into integer and fraction parts of the same type and width as fixed_Name1

Return as struct

COMP 3.5 FixedMultUnsigned(fixed_Name1, fixed_Name2)

Description

Returns the product of the operands for unsigned numbers only. The number returned is of the same width as the operands so any bits produced by the multiplication outside of this width overflow and are lost.

| Inputs | |
|---|---|
| fixed_Name1 | Unsigned fixed-point number of any width |
| fixed_Name2 | Unsigned fixed-point number of the same width |

Output

Unsigned fixed-point number of same width as fixed_Name1

Detailed Description

At compile time check fixed_Name1 and fixed_Name2 are of same width and unsigned type Concatenate integer and fraction parts from fixed_Name1 into a single bit string and extend the string with zeros by the width of the fraction part off fixed_Name1

Concatenate integer and fraction parts from fixed_Name2 into a single bit string and extend the string with zeros by the width of the fraction part of fixed_Name2

Multiply these bit strings together

Drop the fracWidth least significant bits of the result

Split the result into integer and fraction parts of the same type and width as fixed_Name1

Return as struct

COMP 3.6 FixedDivSigned(fixed_Name1, fixed_Name2)

Description

Returns fixed_Name1 divided by fixed_Name2 for signed numbers only. The result for fixed_Name2=0 is undefined. The number returned is of the same width as the operands so any bits produced by the division outside of this width are lost.

| Inputs | |
|---|---|
| fixed_Name1 | Signed fixed-point number of any width |
| fixed_Name2 | Signed fixed-point number of the same width not equal to zero |

Output

Signed fixed-point number of same width as fixed_Name1

Detailed Description

At compile time check fixed_Name1 and fixed_Name2 are of the same width and signed type Concatenate together the integer and fraction parts of fixed_Name1, and zero with the same width as the fraction part, into a single bit string Concatenate integer and fraction parts from fixed_Name2 into a single bit string and sign extend the string by the width of the fraction part of fixed_Name2

Divide the first bit string by the second

Take the least significant bits of the result to make it the same length as the divided bit string Split result of func into integer and fraction parts of same type and width as fixed_Name1

Return as struct

COMP 3.7 FixedDivUnsigned(fixed_Name1, fixed_Name2)

Description

Returns fixed_Name1 divided by fixed_Name2 for unsigned numbers only. The result for fixed_Name2=0 is undefined. The number returned is of the same width as the operands so any bits produced by the division outside of this width are lost.

| Inputs | |
|---|---|
| fixed_Name1 | Unsigned fixed-point number of any width |
| fixed_Name2 | Unsigned fixed-point number of the same width. |

Output

Unsigned fixed-point number of same type and width as fixed_Name1

Detailed Description

At compile time check fixed_Name1 and fixed_Name2 are of the same width and unsigned type Concatenate together the integer and fraction parts of fixed_Name1, and zero with the same width as the fraction part, into a single bit string Concatenate integer and fraction parts from fixed_Name2 into a single bit string and extend the string by the width of the fraction part of fixed_Name2

Divide the first bit string by the second

Take the least significant bits of the result to make it the same length as the divided bit string Split result of func into integer and fraction parts of same type and width as fixed_Name1

Return as struct

COMP 3.8 FixedAbs(fixed_Name)

Description

Returns the absolute value. The result of using this macro on an unsigned fixed-point structure is undefined. Signed integers use 2's complement representation in Handel-C so abs(max positive number)<abs(min negative number)

This means the function gives the result:

abs(min negative number)=min negative number.

| Inputs | |
|---|---|
| fixed_Name | Fixed-point number of any type and width |

Output

Fixed-point number of same type and width as fixed_Name

Detailed Description

Concatenate integer and fraction parts from fixed_Name into a single bit string

Find the absolute value of the bit string

Split result into integer and fraction parts of same type and width as fixed_Name Return as struct Relational Operators The macros in this section rely on Handel-C's type and width checking.

COMP 4.1 FixedEq(fixed_Name1, fixed_Name2)

Description

Returns true if the operands are equal.

| Inputs | |
|---|---|
| fixed_Name1 | Fixed-point number of any type or width |
| fixed_Name2 | Fixed-point number of the same type and width |

Output

Single bit wide unsigned integer value with 0 as false and 1 as true

Detailed Description

Concatenate integer and fraction parts from fixed_Name1 into a single bit string Concatenate integer and fraction parts from fixed_Name2 into a single bit string True if the bit strings are equal Return result COMP 4.2 FixedNEq(fixed_Name1, fixed_Name2)

Description

Returns true if the operands are not equal.

| Inputs | |
|---|---|
| fixed_Name1 | Fixed-point number of any type or width |
| fixed_Name2 | Fixed-point number of the same type and width |

Output

Single bit wide unsigned integer value with 0 as false and 1 as true

Detailed Description

Concatenate integer and fraction parts from fixed_Name1 into a single bit string Concatenate integer and fraction parts from fixed_Name2 into a single bit string True if the bit strings are not equal Return result COMP 4.3 FixedLT(fixed_Name1, fixed_Name2)

Description

Returns true if fixed_Name1 is less than fixed_Name2.

| Inputs | |
|---|---|
| fixed_Name1 | Fixed-point number of any type or width |
| fixed_Name2 | Fixed-point number of the same type and width |

Output

Single bit wide unsigned integer value with 0 as false and 1 as true

Detailed Description

Concatenate integer and fraction parts from fixed_Name1 into a single bit string Concatenate integer and fraction parts from fixed_Name2 into a single bit string True if the first bit string is less than the second Return result COMP 4.4 FixedLTE(fixed_Name1, fixed_Name2)

Description

Returns true if fixed_Name1 is less than or equal to fixed_Name2.

| Inputs | |
|---|---|
| fixed_Name1 | Fixed-point number of any type or width |
| fixed_Name2 | Fixed-point number of the same type and width |

Output

Single bit wide unsigned integer value with 0 as false and 1 as true

Detailed Description

Concatenate integer and fraction parts from fixed_Name1 into a single bit string Concatenate integer and fraction parts from fixed_Name2 into a single bit string True if the first bit string is less than or equal to the second Return result COMP 4.5 FixedGT(fixed_Name1, fixed_Name2)

Description

Returns true if fixed_Name1 is greater than fixed_Name2.

| Inputs | |
|---|---|
| fixed_Name1 | Fixed-point number of any type or width |
| fixed_Name2 | Fixed-point number of the same type and width |

Output

Single bit wide unsigned integer value with 0 as false and 1 as true

Detailed Description

Return the result of FixedLT(fixed_Name2, fixed_Name1)

COMP 4.6 FixedGTE(fixed_Name1, fixed_Name2)

Description

Returns true if fixed_Name1 is greater than or equal to fixed_Name2.

| Inputs | |
|---|---|
| fixed_Name1 | Fixed-point number of any type or width |
| fixed_Name2 | Fixed-point number of the same type and width |

Output

Single bit wide unsigned integer value with 0 as false and 1 as true

Detailed Description

Return the result of FixedLTE(fixed_Name2, fixed_Name1)

Bitwise Logical Operators

The macros in this section rely on Handel-C's type and width checking.

COMP 5.1 FixedNot(fixed_Name)

Description

Returns bitwise not.

| Inputs | |
|---|---|
| fixed_Name | Fixed-point number of any type or width |

Output

Fixed-point number of same type and width as fixed_Name

Detailed Description

Concatenate integer and fraction parts from fixed_Name into a single bit string

Find the bitwise not of the bit string

Split result into integer and fraction parts of same type and width as fixed_Name Return as struct COMP 5.2 FixedAnd(fixed_Name1, fixed_Name2)

Description

Returns bitwise and.

| Inputs | |
|---|---|
| fixed_Name1 | Fixed-point number of any type or width |
| fixed_Name2 | Fixed-point number of the same type and width |

Output

Fixed-point number of same type and width as fixed_Name1

Detailed Description

Concatenate integer and fraction parts from fixed_Name1 into a single bit string Concatenate integer and fraction parts from fixed_Name2 into a single bit string Find the bitwise and of the bit strings Split result into integer and fraction parts of same type and width as fixed_Name1

Return as struct

COMP 5.3 FixedOr(fixed_Name1, fixed_Name2)

Description

Returns bitwise or.

| Inputs | |
|---|---|
| fixed_Name1 | Fixed-point number of any type or width |
| fixed_Name2 | Fixed-point number of the same type and width |

Output

Fixed-point number of same type and width as fixed_Name1

Detailed Description

Concatenate integer and fraction parts from fixed_Name1 into a single bit string Concatenate integer and fraction parts from fixed_Name2 into a single bit string Find the bitwise or of the bit strings Split result into integer and fraction parts of same type and width as fixed_Name1

Return as struct

COMP 5.4 FixedXor(fixed_Name1, fixed_Name2)
Description
Returns bitwise xor.

| Inputs | |
|---|---|
| fixed_Name1 | Fixed-point number of any type or width |
| fixed_Name2 | Fixed-point number of the same type and width |

Output
Fixed-point number of same type and width as fixed_Name1
   Detailed Description
   Concatenate integer and fraction parts from fixed_Name1 into a single bit string
   Concatenate integer and fraction parts from fixed_Name2 into a single bit string
   Find the bitwise xor of the bit strings
   Split result into integer and fraction parts of same type and width as fixed_Name1
   Return as struct
Conversion Operators
COMP 6.1 FixedIntWidth(fixed_Name)
Description
   Returns the width of the integer part of fixed_Name as a compile time constant.

| Inputs | |
|---|---|
| fixed_Name1 | Fixed-point number of any type or width |

Output
Compile time constant integer
Detailed Description
   Return the width of the integer part of fixed_Name
COMP 6.2 FixedFracWidth(fixed_Name)
Description
   Returns the width of the fraction part of fixed_Name as a compile time constant.

| Inputs | |
|---|---|
| fixed_Name1 | Fixed-point number of any type or width |

Output
Compile time constant integer
Detailed Description
   Return the width of the fraction part of fixed_Name
COMP 6.3 FixedLiteral(isSigned, intWidth, fracWidth, intBits, fracBits)
Description
   Returns a signed fixed-point number if isSigned is true and an unsigned fixed-point number if isSigned is false. This number has an integer part intBits of width intWidth and a fraction part fracBits of width fracWidth.

| Inputs | |
|---|---|
| isSigned | Compile time constant to indicate the type of fixed-point structure. FIXED_ISSIGNED represents signed and FIXED_ISUNSIGNED unsigned |
| intWidth | Compile time constant integer to set width of integer part |
| fracWidth | Compile time constant integer to set width of fraction part |
| intBits | Value to set integer part |
| fracBits | Value to set fraction part |

Output
   Signed or unsigned fixed-point number with widths and values specified
Detailed Description
   Selects signed or unsigned type to cast structure using isSigned
   Return a fixed-point number with an integer part of width intWidth and value intBits, and a fraction part of width fracWidth and value fracBits
COMP 6.4 FixedToInt(fixed_Name)
Description
   Returns the integer part of the fixed point number with the same type and width.

| Inputs | |
|---|---|
| fixed_Name | Fixed point number of any type or width |

Output
   Integer of same type and width as the integer part of the number is stored in the fixed point structure
   Detailed Description
   Return the integer part of the fixed point number
COMP 6.5 FixedToBool (fixed_Name)
Description
   Returns a single bit wide unsigned int value which is 0 for false if the operand equals 0 and 1 for true otherwise.

| Inputs | |
|---|---|
| fixed_Name | Fixed-point number of any type or width |

Output
   Single bit wide unsigned integer value with 0 as false and 1 as true
Detailed Description
   Return 1 if the fixed and the fraction parts of fixed_Name are both not equal to zero and 0 otherwise COMP 6.6 FixedToBits(fixed_Name)
Description
Returns the integer and fraction bits of fixed_Name concatenated together.

Inputs

| | |
|---|---|
| fixed_Name | Fixed-point number of any type or width |

Output
Integer of same type as the fixed-point structure and with width intWidth+fracWidth
Detailed Description
Return the integer part and the fraction part of the fixed-point number concatenated together COMP 6.7 FixedCastSigned(isSigned, intWidth, fracWidth, fixed_Name)
Description
Casts any signed fixed-point number to the type and widths specified.

Inputs

| | |
|---|---|
| isSigned | Compile time constant to indicate the type of fixed-point structure. FIXED_ISSIGNED represents signed and FIXED_ISUNSIGNED unsigned |
| intWidth | Width to cast the integer part of the number to |
| fracWidth | Width to cast the fraction part of the number to |
| fixed_Name | Fixed-point number of signed type and any width |

Output
Fixed-point number of the type specified
Detailed Description
Adjust the integer part of fixed_Name to a width of intWidth by either taking the intWidth least significant bits or sign extending.
Adjust the fraction part of fixed_Name to a width of fracWidth by either taking the fracWidth most significant bits or adding bits with value zero in after the number.
If isSigned is true then cast the integer and fraction parts of the floating point number as signed
If isSigned is false then cast the integer and fraction parts of the floating point number as unsigned
Return the result as a struct COMP 6.8 FixedCastUnsigned(isSigned, intWidth, fracWidth, fixed_Name)
Description
Casts any unsigned fixed-point number to the type and widths specified.

Inputs

| | |
|---|---|
| isSigned | Compile time constant to indicate the type of fixed-point structure. FIXED_ISSIGNED represents signed and FIXED_ISUNSIGNED unsigned |
| intWidth | Width to cast the integer part of the number to |
| fracWidth | Width to cast the fraction part of the number to |
| fixed_Name | Fixed-point number of unsigned type and any width |

Output
Fixed-point number of the type specified
Detailed Description
Adjust the integer part of fixed_Name to a width of intWidth by either taking the intWidth least significant bits or adding bits with value zero in front of the number.
Adjust the fraction part of fixed_Name to a width of fracWidth by either taking the fracWidth most significant bits or adding bits with value zero in after the number.
If isSigned is true then cast the integer and fraction parts of the floating point number as signed
If isSigned is false then cast the integer and fraction parts of the floating point number as unsigned
Return the result as a struct Verification
This section documents all of the tests necessary to verify that each macro functions correctly. It is important that the macros match their definitions in the subsections above. All of the macros available to the user can be tested for results and errors using black box testing.

Runtime Tests:
The type performed are:
Positive (P)
Negative (N)
Volume and Stress (V&S)
Comparison (C)
Demonstration (D)
The tests are performed only on 8 and 32 bit numbers apart from when it seems appropriate to use other widths also to fully test the macro, such as for FixedIntWidth. The tests are performed on signed and unsigned numbers apart from when this is not possible because the macro is only designed for one type. Generally the tests are aimed at:
Zero values (P, V&S, C, D)
Midrange values (P, V&S, C, D)
Overflow values (N, V&S, C, D)
The results expected for the comparison tests have been calculated using the Microsoft Calculator.

Error Tests:
These are tests which may produce non-severe errors from the compiler. They should be either standard Handel-C error messages directed at the functions used or assert errors defined in the library. Generally the tests performed may be:
inputting an integer into where there should be a fixed-point structure
inputting a signed fixed-point structures where there should be an unsigned fixed-point structure and vice versa
inputting two fixed-point structures of different types or width in the same macro
inputting an integer of incorrect width
inputting variables when a constant is required assigning fixed-point result to a fixed-point structure of incorrect type or width assigning integer result to a int of incorrect type or width Performance Tests:

All of the macros take just one clock cycle to run. In the case of the arithmetic operators, the number of SLICEs and maximum speed may be calculated to compare with the appropriate Handel-C operator.

Waveform Analsis

Trace/pattern Window

Figure 93:
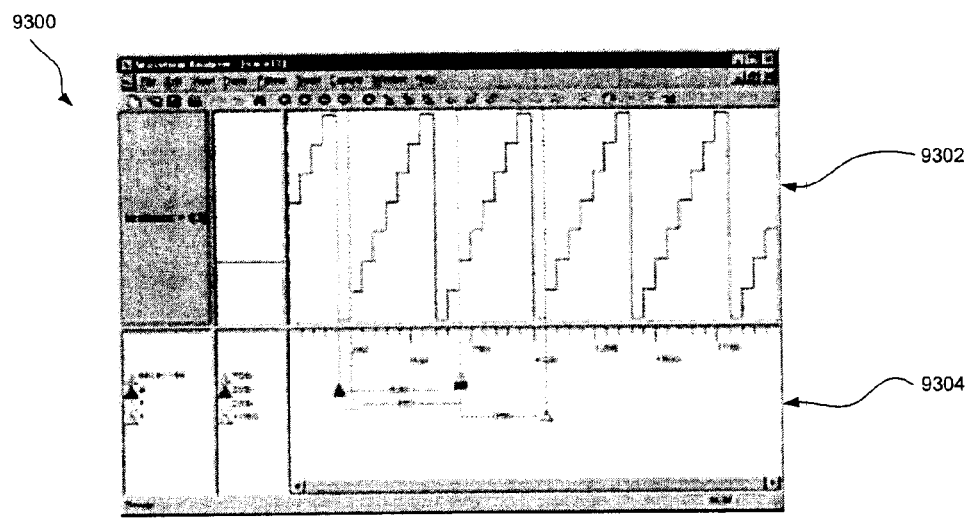
FIG. 93 illustrates a Trace and Pattern window, in accordance with one embodiment of the present invention.

FIG. 93 illustrates a Trace and Pattern window 9300. In the Trace and Pattern window, the top half 9302 of the window shows the trace or pattern details. The bottom half 9304 of the window shows the values and positions of marks that have been set on the trace or pattern. The marks are referred to as cursors and represented by colored triangles.

In an illustrative embodiment, the current trace is outlined with a green dashed line. The current cursor has a red underline. Right-clicking the trace waveform or the current value pane calls up a menu of possible display formats for that pane. Multiple traces or patterns in a single window, but they all use the same cursors, the same number of points and the same clock period.

Zooming

A user may zoom in and out of the active Trace or Pattern window using the zoom icons or the Zoom options from the View menu.

Set Advance Step Dialog

The Set Advance Step dialog (Capture>Set Advance Step) specifies the time in nanoseconds to advance all simulations by.

Capture menu

Several items of a capture menu according to an embodiment of the present invention include the following set forth in Table 23.

TABLE 23

| | |
|---|---|
| Run (F5) | Start reading traces from simulations and sending patterns to simulations. |
| Pause | Temporarily stop sending traces to simulations and reading patterns from simulations. This may also suspend all connected simulations. |
| Stop (Shift+F5) | Stop reading traces from simulations and sending patterns to simulations. Simulations may continue running after Waveform Analyzer has stopped. |
| Advance (Ctrl+F11) | Advance all simulations by the specified interval. |
| Set Advance Step | Specify the interval by which to advance simulations when 'Advance' is selected. Opens Set Advance Step dialog. |

Define Symbols Dialog Box

The Define symbols dialog box consists of a set of radio buttons which allow selection of how values are represented:

Binary

Octal

Decimal

Hexadecimal numbers

ASCII characters

User defined strings: The user may supply the filename of a file which associates symbols with values for the trace being defined. Each line of this file should contain a number (in binary, octal, decimal or hexadecimal, using the Handel-C syntax) followed by a symbol. The symbol should be separated from the number using a whitespace. Any values which may appear in the Trace and which do not have symbols associated with them may be represented using the '?' character. For example, if the trace is of width 3, is unsigned, and the user defined symbol file contains the following:

0b001 A

0b111 D

0b110 C

0b101 B the values 1,5,6 and 7 may be represented as A,B,C and D respectively. The values 0,2,3 and 4 may all be represented as question marks.

Edit Menu

Items in the Edit Menu include those set forth in Table 24.

TABLE 24

| | |
|---|---|
| Find (Ctrl+F) | Search for a specified sequence of data words in the selected trace or patten. The user is prompted for a PGL statement describing the sequence of words to search for, the search direction, and whether to scroll to the sequence if it is found. Searching starts at the position of the selected cursor. If there is no cursor, searching starts at the beginning of the selected trace or pattern. If the sequence is found, the selected cursor is positioned at the start of the sequence. If there is no cursor, a cursor is created at the start of the sequence. |
| Copy (Ctrl+C) | Copy the selected portion of the selected trace or pattern to the clipboard. |
| Paste (Ctrl+V) | Paste the contents of the clipboard into the selected portion of the selected pattern. |
| Save Selection As . . . | Save the selected portion of the selected trace or pattern to a file. The user is prompted for a filename and, if the file is a VCD file, a reference name to use for the signal in the VCD file. |

File Menu

Items in the Edit Menu include those set forth in Table 25.

TABLE 25

| | |
|---|---|
| New (Ctrl+N) | Open a new trace or pattern dialog. The user is prompted for the type of window, a filename for the window and the clock period and number of points for the window. The clock period and the number of points that the user specifies may be used for all traces or patterns in the window. |
| Open (Ctrl+O) | Open an existing trace or pattern file. |
| Close | Close the active trace or pattern window. |
| Save (Ctrl+S) | Save the active trace or pattern window. |
| Save As | Save the active trace or pattern window with a different name. |
| Save All | Save all open trace and pattern windows. |
| New Project | Create a new project. |
| Open Project | Open an existing project. |
| Close Project | Close the current project. |
| Save Project | Save the current project. |
| Print | Print the active trace or pattern window. |
| Print Setup | Setup the printer details. |
| Print Preview | Preview the active trace or pattern window. |
| Recent Files | A list of recently used trace or pattern files. |
| Recent Projects | A list of recently used projects. |
| Exit | Close all windows and exit the application. |

New Window Dialog

The New window dialog box (File>New) defines the default clock period and the number of points in the window. Elements include those set forth in Table 26.

TABLE 26

| | |
|---|---|
| Untitled box | Enter the window name |
| Default clock period | Enter the default clock period in nanoseconds |
| Default No. points | Enter the number of points recorded in the window |
| Filename and location | File where the window details are stored (use the browse button to choose a directory |

Pattern Menu
   Items in the Edit Menu include those set forth in Table 27.

TABLE 27

| | |
|---|---|
| New Pattern | Create a new pattern in the active pattern window. |
| Edit Pattern | Edit the selected pattern in the active pattern window. |
| Delete Pattern | Remove the selected pattern from the active pattern window. |

Pattern Properties Dialog Box
   The fields in the Pattern properties dialog box include those set forth in Table 28.

TABLE 28

| | |
|---|---|
| Name | Name to use for the pattern. The name is displayed in a box on the left of the Pattern window. The name may be a C-style identifier. |
| Width | Width of the data in the pattern in bits. |
| Type | Whether the pattern represents signed or unsigned data. |
| Points | Number of points in the pattern. This value was entered when the Pattern Window was created. It cannot be edited. |
| Clock Period | Rate at which data is read into the pattern. This value was entered when the Pattern window was created. It cannot be edited. |
| Source | The source for the pattern may be either a file or a script. Supported file formats are ASCII and VCD. The box to the right of the radio buttons is used to enter a script if the 'Script' radio button is checked, or a file name if the 'File' radio button is checked. |
| Variable | If the source is a VCD file, this box should be used to enter the reference name of the variable in the VCD file that may be used as the source for this pattern. |
| Destination | Expression of the form 'Terminal-Name(width)' as for the DK1Connect plugin |
| Trigger | Transmission of a pattern can be triggered by the occurrence of a specified sequence of words in any trace. This box is used to specify which sequences of words and which trace triggering should occur on If this box is empty, no trigger is used and all further trigger options are grayed out. |
| Delay | Specifies the trigger delay. For patterns, this may be positive. A delay of x means that transmission begins x time units after a trigger sequence occurs. |
| No trigger/Single/Auto | Choose the trigger mode. No trigger, triggering is disabled. Single, a pattern is transmitted once after a trigger sequence occurs. Auto, a pattern is transmitted after every occurrence of a trigger sequence. |
| Pause on Trigger | If this checkbox is ticked, capturing may automatically get paused after a trigger sequence has occurred and a pattern has been transmitted. |
| Interpolated Waveform/Stepped Waveform/Numeric Symbolic | This set of radio buttons is used to choose the display format for the pattern. |
| Define Symbols (gives dialog) | Select how values are represented |

Grouping Windows into Projects
   Trace Windows and Pattern Windows can be grouped together into projects. Only one project may be open at a time. The user may create a project if he or she wants to use a Pattern Generation Language Script file.
Creating a Project
   Open Waveform Analyzer and select New Project from the File menu. A dialog box appears asking the user to select a file name for the new project. Project filenames have an '.APJ' extension.

Script Menu
   The script menu includes the following item:

| | |
|---|---|
| Edit Script... | Edit the PGL script for the current project. |

Trace Dialog
   Fields in the Trace properties dialog box (Trace>New Trace) include the following set forth in Table 29.

TABLE 29

| Field | Function |
|---|---|
| Name | Name to use for the trace. This name may be displayed in a box on the left of the Trace window. The name can also be used as part of a trigger specification for this or any other trace. The name may be a C-style identifier. |
| Width | Width of the data in the trace in bits. |
| Type | Whether the trace represents signed or unsigned data. |
| Points | Number of points in the trace. This value was entered when the Trace window was created. It cannot be edited. |
| Clock Period | Rate at which data is read into the trace. This value was entered when the Trace window was created. It cannot be edited. |
| Expression | Port(s) the trace is connected to. The expression may be of the form 'Terminal-Name(width)' (as for the DK1Connect plugin) or a Handel-C expression with expressions of the form 'Terminal-Name(width)' in place of variables. |
| Dump File | Enter a filename to capture the trace to a file. Two file formats are supported: ASCII files and Verilog Value Change Dump files. If the filename ends in '.VCD', '.DMP' or '.DUMP' a Value Change Dump file may be produced otherwise an ASCII file may be produced. The Browse button may be used to select a filename. If no filename is entered, no dump file may be produced. |
| Variable | If the dump file is a Verilog Value Change Dump file, enter the name which may be used as the reference name of the signal in the VCD file. |
| Trigger | Specifies which sequences of words triggering should occur on If this box is empty, no trigger is used and all further trigger options are grayed out. |
| Delay | Specifies the trigger delay. This may be positive or negative. If a positive delay x is used, capturing begins x time units after a trigger sequence occurs. If a negative delay is used, capturing begins x time units before a trigger sequence occurs. |
| No trigger/Single/Auto | Select trigger mode. No trigger, triggering is disabled. Single, a trace is captured once after a trigger sequence occurs. Auto, a trace is captured after every occurrence of a trigger sequence. |
| Pause on Trigger | If this checkbox is ticked, capturing may automatically get paused after a trigger sequence has occurred and a trace has been captured. |
| Interpolated Waveform/Stepped Waveform/Numeric Symbolic | Select display format for trace. |
| Define Symbols (gives dialog) | Select how values are represented |

Trace Menu
   Fields in the trace menu include those set forth in Table 30.

TABLE 30

| | |
|---|---|
| New Trace | Create a new trace in the active Trace window. |
| Edit Trace | Edit the selected trace in the active Trace window. |
| Delete Trace | Remove the selected trace from the active Trace window. |

View Menu

Items available from the view menu include those set forth in Table 31.

TABLE 31

| | |
|---|---|
| Toolbar | Toggle the toolbar on/off. |
| Status Bar | Toggle the Status Bar on/off. |
| Zoom Max | Zoom in to the maximum extent at the centre of the active trace or pattern window. |
| Zoom In | Zoom in at the centre of the active trace or pattern window. |
| Zoom Out | Zoom out from the centre of the active trace or pattern window. |
| Zoom Min | Zoom out to the maximum extent from the centre of the active trace or pattern window. |
| Zoom on Cursor | Zoom in on the selected cursor in the active trace or pattern window. |
| Jump to Cursor | Scroll to the selected cursor in the active trace or pattern window. |
| New Cursor | Create a new cursor in the centre of the active trace or pattern window. |
| Delete Cursor | Delete the selected cursor from the active trace or pattern window. |

Toolbar Icons

Figure 94:
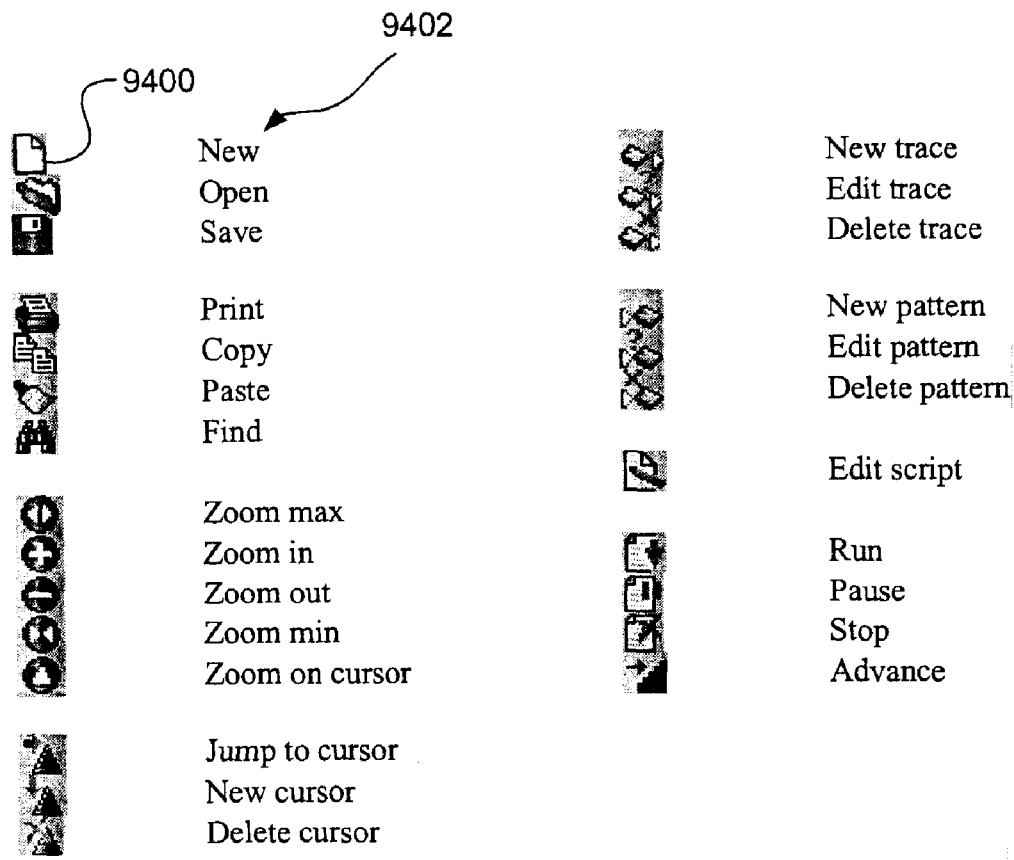
FIG. 94 illustrates several toolbar icons and their functions, in accordance with one embodiment of the present invention.

FIG. 94 illustrates several toolbar icons 9400 and their functions 9402.

Window Menu

Items in the window menu include those set forth in Table 32.

TABLE 32

| | |
|---|---|
| Cascade | Cascade all open windows. |
| Tile | Tile all open window. |
| Arrange Icons | Automatically arrange all minimized trace and pattern windows. |

Analyzer Interface

The waveform analyzer interface consists of:
menu bar
tool bar
workspace area
any trace or pattern windows open
log output window: used by the program to report errors to the user.

The user may group trace or pattern windows together in a project. Projects contain a number of trace or pattern windows (those open when during the last save of the project) and any scripts written in the project.

Menus
    File Menu
    New windows dialog (File>New)
    Edit Menu
    View Menu
    Trace Menu
    Trace dialog
    Pattern Menu
    Pattern properties dialog
    Define symbols dialog
    Script Menu
    Capture Menu
    Window Menu
    Help Menu Pattern Generation Language The Waveform Analyzer uses Pattern Generation Language (PGL) as a scripting language to generate patterns. PGL has a similar expressive power to regular expressions, but uses a C-like syntax.

The PGL can be used to trigger on a sequence of data and search for a sequence of data in a trace or pattern.

When executed, a PGL program generates a sequence of values. When used for triggering or searching, a program in PGL may match any sequence which it could generate, such as:

PGL statements
    PGL functions
    Wild-card matching
    Pattern Generation Language syntax Using the Waveform Analyzer The Waveform Analyzer connects to ports in Handel-C simulations. It displays outputs from Handel-C simulations as waveforms (traces). Thus a user can generate inputs to Handel-C simulations and display them as waveforms (patterns). The user can also manipulate the simulated inputs and outputs in the same way that input and output signals from a real piece of hardware can be manipulated with a waveform analyzer. A partial list of manners in which the waveform analyzer can be used follows.

Connecting traces to output ports in Handel-C simulations
    Connecting patterns to input ports in Handel-C simulations
    Connecting the Waveform Analyzer to ports connected to another simulation using the DK1Share plugin (connecting in parallel)
    Measuring the differences between values and times in traces or patterns using cursor marks.
    Creating patterns by writing scripts using a Pattern Generation Language, or by copying existing traces or patterns into a pattern window. Patterns can also be read from a file.
    Specifying triggers in the Pattern Generation Language
    Capturing traces or generate patterns when a specified trigger appears in a trace
    Finding a specified pattern in a trace or pattern window Functions in PGL PGL allows a user to define and call functions which can take parameters. Only functions in an open project can be defined. The functions are stored in the script. pg1 file associated with that project. The user may edit this file outside the Waveform Analyzer.

Defining Functions

To define functions, the project where the functions are to be used is opened. The 'Edit Script' icon on the toolbar is selected. Alternatively, Edit Script from the Script menu can be selected: the file script. pg 1 is opened in Notepad . This file resides in the same directory as the project file.

EXAMPLE

The following example defines two functions, one called rising_edge and the other called rectangular_wave.

```
rising_edge()
{0;1;}
rectangular_wave(hival,hicount,loval,locount,cycles)
{
loop (cycles)
{
    loop(hicount)
        hival;
    loop(locount)
        loval;
```

-continued

```
  }
}
```

The rectangular_wave function can be called with a statement like the following:

rectangular_wave(1,5,0,5,10);

Wild-Card Matching in Triggering or Searching

When a PGL program is used for triggering or searching, it may contain a '?' character in any place where a number or variable could go. This character stands for 'any value'. For example the compound statement {1;?;1;} would match against any 3 word sequence starting and ending with a 1.

If '?' is used as an actual parameter in a function call, when the function is called, the formal parameter which corresponds to the '?' has no value assigned to it.

If a variable is encountered which has no value assigned to it, it gets assigned a value according to the values encountered during matching.

Context-sensitive matches can be carried out in this way. For example, if a function is defined as follows:

count_fives(a)

{a; loop(a) 5;} and called using the statement 'count_fives(?);', it may match any sequence consisting of a number, followed by that number of fives (including the sequence '0'). This feature should be used carefully, since it is possible to use it write functions which take a very long time to match.

PGL Statements

The pattern generation language consists of one or more statements terminated by semi-colons. Statements can include numbers, identifiers and wild-cards. A PGL statement may be one of the following:

Expression Statement

For example:

1;

When an expression statement is executed, it generates the value of the expression.

An expression statement used for matching may also be of the form:

!1;

This statement may match any value except 1.

Compound Statement

For example: {0;1;}

The statements enclosed in the curly brackets get executed sequentially.

Loop Statement

For example: loop(3) {0;1;}

The body of this loop may get executed 3 times.

Conditional Statement

For example:

if(a==1) {0;1;} else {1;0;}

Here, the statements which get executed depend upon the value of the variable a.

A user can build Boolean tests using the following operators to use for the condition in a conditional statement:

| == | != | ! | \|\| | && |
|---|---|---|---|---|

Switch Statement

For example:

```
switch(a)
{
case 1:
        0; 1; break;
default:
        1; 0; break;
}
```

This switch statement achieves the same thing as the if-else statement described above.

Assert Statement

For example:

assert(a !=0);

This kind of statement can be used when matching to place constraints on matched variables.

Wild-card Matching in PGL

If a PGL program is used for triggering or searching, a '?' character can be used in any place where a number or variable could go. This character stands for 'any value'. For example the compound statement {1;?;1;} would match against any 3 word sequence starting and ending with a 1.

If '?' is used as an actual parameter in a function call, when the function is called, the formal parameter which corresponds to the '?' has no value assigned to it. If a variable is encountered which has no value assigned to it, it gets assigned a value according to the values encountered during matching.Context-sensitive matches can be carried out in this way. For example, a function defined as follows:

count_fives(a)

{a; loop(a) 5;}

If this is called using the statement 'count_fives(?);', it may match any sequence consisting of a number, followed by that number of fives. (Including the sequence '0'). This feature should be used carefully, since it is possible to use it write functions which take a very long time to match.

It is an error to use the '?' expression, expression statements starting with '!' and assert statements in PGL programs which are used to generate patterns.

Connecting in Parallel

If it is desired to connect the Waveform Analyzer to ports that are connected to another simulation, this may be done using the DK1Share.dll.

EXAMPLE

```
interface bus_out( ) seg7_output(unsigned 7 output1 = encode_out)
        with {extlib="DK1Share.d11",
            extinst=" \
                Share={extlib=<7segment.d11>, extinst=<A>,
        extfunc=<PlugInSet>} \
                Share={extlib=<DK1Connect.d11>, extinst=<SS(7)>,
        extfunc=<DK1ConnectGetSet>} \
                ",
                extfunc="DK1ShareGetSet"
        };
```

This example uses DK1Share.dll to share the output port seg7_output.output1 between the 7-segment display (connected to terminal A) and DK1Connect (connected to terminal SS(7)). A user can then trace the output going to the 7-segment display by using SS(7) as the expression in the Trace properties window Finding a Sequence of Data in a Trace or Pattern To find a sequence of data, the window that contains the trace or pattern to be searched is activated. If there are multiple traces or patterns in the window, the desired trace or pattern is selected. The Edit>Find menu item is selected. A PGL statement or function is entered in the 'Find what:' box in the Find dialog.

Generating Patterns

Generating a pattern from an Existing Trace or Pattern

Data is copied from a trace or pattern into the clipboard, and then the contents of the clipboard are pasted into a pattern. A region of a trace or pattern is selected, such as by dragging the mouse pointer over the region to select it. The region is copied to the clipboard by selecting Copy from the Edit menu or with the Copy icon on the toolbar. A pattern window is activated and either a region to paste over or a cursor is selected. Paste is selected from the Edit menu or the Paste icon on the toolbar is clicked on.

If a region has been selected, the clipboard contents are pasted into the selected pattern starting at the beginning of the selected region. If a cursor was selected, the clipboard contents are pasted into the window starting at the selected cursor location.

Generating a Pattern from a PGL Statement:

Script is selected as the pattern source in the Pattern Properties dialog. The PGL statement or function call is entered in the box to the right of the button.

Generating a Pattern from a File:

File is selected as the pattern source in the Pattern Properties dialog. The filename is entered in the box to the right of the button. The Browse button is used to browse for a file.

Pattern Generation Limitations

It is an error to use the '?' expression, expression statements starting with '!' and assert statements in PGL programs which are used to generate patterns.

Complex Pattern-generation

More complex patterns may require using a separate Handel-C program to perform pattern generation.

The cursor triangles are placed in the time pane of the trace or pattern window. If there is more than one cursor in the time pane, the time pane displays the differences in time between cursors. The bottom-centre pane displays the absolute position in time of all cursors. The differences in values between the cursors are displayed in the bottom-left pane.

If multiple traces or patterns are displayed in a window, the values given are those of the selected trace or pattern.

Creating Cursors

Click on the New cursor icon on the toolbar or select New Cursor from the View menu. The cursor may be added to the center of the time pane of the active trace or pattern window.

Moving Cursors

Drag the cursor across the time pane

Selecting Cursors

Double-click a cursor. A red bar may appear beneath it to show that it is selected. By default, the first cursor created is the selected cursor. Only one cursor can be selected at a time.

Deleting Cursors

Select the cursor to be deleted. Click the Delete Cursor icon on the toolbar or select Delete Cursor from the View menu.

Connecting a Pattern to a Port

To connect a pattern to a port, the following steps are performed:

1. write and compile Handel-C code to connect a Handel-C port to a terminal using the DK1Connect and the DK1Sync plugins.
2. set up a pattern window in the analyzer generating a signal to the named terminal.
3. simulate the Handel-C code and start transmitting the pattern Writing the Handel-C Program To write a program in Handel-C, open Handel-C, create a new project and enter the following program:

```
set clock = external "P1"
with {extlib = "DK1Sync.dll", extinst = "50", extfunc = "DK1SyncGetSet"};
interface bus_in(unsigned 1 in) ib1 ( )
with {extlib = "DK1Connect.dll", extinst = "t(1)", extfunc = "DK1ConnectGetSet"};
unsigned 5 count = 0;
void main(void)
{
    while(!count[4] || !count[2])
    {
        if (ib1.in == 0)
        {
            delay;
            if (ib1.in == 1)
                count++;
        }
        else
            delay;
    }
}
```

Note: this program uses the DK1Connect plugin to connect the port ib1.in to the terminal t(1). The program may only terminate when it has detected 20 rising edges from the port ib1.in.

Measuring Time and Value Differences in Windows

The user can measure the time between two events and the difference in the value of a signal at two different times by placing marks in Trace and Pattern Windows. These marks are represented by colored triangles and may be referred to as cursors. One cursor is always selected.

Set Up a Pattern Window

To set up a pattern window, the following general steps are performed:

1. Open Waveform Analyzer.
2. In Waveform Analyzer, select New from the File menu and create a new pattern with a filename, with 40 as the number of points and 50 as the clock period.

3. An empty Pattern window appears. Select New Pattern from the Pattern menu or from the toolbar and enter the following properties in the dialog box. Note Table 33.

TABLE 33

| Name: | testpattern |
|---|---|
| Width: | 1 |
| Type: | Unsigned |
| Source: | Select Script radio button. Enter loop(20) {0; 1;} in the box. |
| Variable: | Grayed out. |
| Destination: | t(1) |
| Trigger: | Leave box blank. Other settings should be grayed out. |
| Delay: | Grayed out with 0 as default |
| Display: | Check Stepped Waveform radio button |

4. Click OK.

Start Transmission

To start the transmission, tun the Handel-C simulation. Start transmission by clicking the Run icon on the toolbar, or by selecting Run from the Capture menu. The Handel-C program should terminate shortly after transmission is started. To stop capturing click on the stop icon on the toolbar or select Stop from the Capture menu.

Starting the Waveform Analyzer

To start the Waveform Analyzer:

Select Start>Programs>DK1 Design Suite>Waveform Analyzer or,

Double-click the icon for the analyzer.exe file in the DK1\Bin directory.

Connecting a Simulation to a Trace

To connect a simulation to a trace:

1. write and compile Handel-C code to connect a Handel-C port to a terminal using the DK1Connect and the DK1Sync plugins.
2. set up a trace window in the analyzer which reads the signal from the named terminal.
3. simulate the Handel-C code and start capturing Sample Handel-C Program

```
set clock = external "P1"
with {extlib = "DK1Sync.dll", extinst = "50", extfunc = "DK1SyncGetSet"};
unsigned 3 x = 0;
interface bus_out( ) ob1 (unsigned 3 out = x)
with {extlib = "DK1Connect.dll", extinst = "t(3)", extfunc = "DK1ConnectGetSet"};
void main(void)
{
    while(1) x++;
}
```

Note: this program uses the DK1Connect plugin to connect the port ob1.out to the terminal t(3). Compile the program but do not run it.

Set Up a Trace Window

To set up a trace window, open Waveform Analyzer. In Waveform Analyzer, select New from the File menu and create a new trace. Select the browse button to specify a filename and location. Set Default Clock Period to 50 and Default No. points to 40.

An empty Trace window should appear. Select New Trace from the Trace menu or from the toolbar and enter the following properties in the dialog box. Note Table 34.

TABLE 34

| Name: | testtrace |
|---|---|
| Width: | 3 |
| Type: | Unsigned |
| Expression: | t(3) |
| Dump File: | Leave blank |
| Variable: | Grayed out |
| Trigger: | Leave box blank. Other settings should be grayed out. |
| Delay: | Grayed out with 0 as default |
| Display: | Check the Stepped Waveform radio button. |
| Click OK. | |

Start Capturing

Start capturing by clicking the Run icon on the toolbar, or by selecting Run from the Capture menu. A red dashed line should appear jumping around all over the place). This line marks the current position in the trace. Run the Handel-C simulation. To stop capturing click on the stop button on the toolbar or select Stop from the Capture menu. The Handel-C simulation is stopped.

Using the Pattern Generation Language

The Pattern Generation Language (PGL) can be used to:

Generate patterns that are fed into a port

Identify a sequence of data in a trace to use as a trigger. The trigger can be used to start recording the trace or to start generating a pattern. If a trigger associated with a trace or pattern has been defined, it may be re-used as a trigger for other traces or patterns.

Find a sequence of data in a trace or a pattern

Entering PGL Statements

PGL is entered as a single PGL statement in the properties dialog for a trace or pattern. The PGL statement may be a compound statement or a function call. PGL functions may be written in the script.pg1 file associated with a project.

Complex Pattern-Matching and Pattern-Generation

A separate Handel-C program can be written to perform pattern generation or pattern matching. For triggering, a trigger signal can be output from this Handel-C program to Waveform Analyzer, and then a simple PGL statement can be used to trigger on this signal.

Using Triggers

A sequence of data to be used as a trigger can be specified. Alternatively, an existing specification canbe used.

When the trigger sequence occurs, the following are enabled:

Start capturing a trace before, at or after the specified trigger

Start generating a pattern at or after the specified trigger

Stop capturing a trace or generating a pattern.

To Specify a Trigger:

Open the Pattern or Trace Properties dialog. Enter trace name: in the Trigger box followed by a PGL statement. trace name is the name of a pre-defined trace (Note that it may be followed by a colon). The PGL statement may be matched against the named trace. For example:

b: {0;1;} would cause the pattern to be generated on a rising edge of trace b. The appropriate radio button is selected. Radio buttons include those set forth in Table 35.

TABLE 35

| | |
|---|---|
| No trigger: | No triggering |
| Single: | Transmit or capture the first time the trigger is received |
| Auto: | Transmit or capture each time the trigger is received. |

To re-use a specified trigger, "name is entered in the Trigger box, where name is the name of the trace or pattern that uses a trigger. Note that name may be preceded by a double-quote. For example:

"trace1 would cause the trace or pattern whose details are being entered to use the same trigger as the trace named trace1. The appropriate radio button is selected. Note Table 36.

TABLE 36

| | |
|---|---|
| No trigger: | No triggering |
| Single: | Transmit or capture the first time the trigger is received |
| Auto: | Transmit or capture each time the trigger is received. |

To Specify the Delay Between the Trigger and the Action

Specify a trigger and enter the number of time units in the Delay box on the Properties dialog. The delay is in the time units for that window. Delays can be positive or negative for a trace, (negative delays capture before the trigger, positive after) and positive or zero for a pattern.

To Pause on Trigger

Specify a trigger and check the Pause box.

File Formats

A preferred embodiment of the Waveform Analyzer supports two different file formats for storing waveform data. These can include, for example ASCII files, where data elements are written in ASCII and separated by whitespace; and Value Change Dump (VCD) files. This file format is specified in the IEEE 1364 standard.

A VCD file can contain any number of variables. If several traces are dumped to the same VCD file, simply enter the same VCD filename in the 'Dump File' box for every trace which should be written to that file. The 'Variable' box in the Trace dialog is used to enter a reference name which may be used in the VCD file for the signal.

When reading a pattern from a VCD file, the 'Variable' box in the Pattern dialog is used to enter the reference name of the variable in the VCD file which needs to be read. The file extension of a Dump File or Pattern source file determines the file format. If the extension is '.VCD', '.DMP' or '.DUMP' the file is a Value Change Dump file, otherwise it is an ASCII file.

Pattern Generation Language Syntax

The following are syntax statements used during programming:

```
subprogram_def : := identifier ( [parameter-list] )
                      compound-statement
parameter-list : := identifier
               |    identifier , parameter-list
statements : := statement
               |  statement statements
statement : := subprogram_call
             | compound-statement
             | loop-statement
             | if-statement
             | if-else-statement
             | switch-statement
             | break-statement
             | expression-statement
             | assert-statement
subprogram_call : := identifier ( [expression-parameter-list] ) ;
expression-parameter-list : := expression
               |    expression , expression-parameter-list
compound-statement : := { statements }
loop-statement : := loop ( expression ) statement
               |    loop forever statement
if-statement : := if ( boolean-expression ) statement
if-else-statement : := if ( boolean-expression ) statement else statement
switch-statement : := switch ( expression ) { case-list [default : statements] }
case-list : := case
             | case case-list
case : := case number : statements
break-statement : := break ;
expression-statement : := expression ;
               |      ! expression ;
assert-statement : := assert ( boolean-expression ) ;
boolean-expression : := expression == expression
               |       expression != expression
               |       expression
               |       boolean-expression && boolean-expression
```

```
            |        boolean-expression || boolean-expression
            |        ! boolean-expression
            |        ( boolean-expression )
    (here, && has higher precedence than || and both are left associative)
    expression : := ?
            |        number
            |        identifier
```

Numbers may be binary, octal, decimal or hexadecimal integers, and use the same syntax as Handel-C. (i.e. 0b . . . for binary numbers, 0. . . for octal numbers, 0x . . . for hex numbers, all other numbers are treated as decimals). Identifiers are C-style identifiers.

Time Units

Time units are not explicitly defined in Waveform Analyzer. Any Handel-C simulation to which the Waveform Analyzer is connected should use the DK1Sync plugin with the clock period for the simulation specified in an extinst string. When the clock period is entered for a trace or pattern window, the sample rate for the trace or patterns are determined in the window relative to the clock period specified for the Handel-C simulation. If the clock period for the trace or pattern is the same as the clock period specified in the extinst string in the Handel-C program, the trace or pattern may be sampled on every cycle of the Handel-C program. If the clock period for the trace or pattern is twice the clock period specified in the extinst string in the Handel-C program, the trace or pattern may be sampled on every other cycle of the Handel-C program and so on. It is a matter of convenience to make the clock periods correspond to the clock periods that may be used in the target hardware. Preferably, the VCD file reader/writer used by Waveform Analyzer assumes that the time units used are nanoseconds.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for using a dynamic object in a programming language, comprising the steps of:
    (a) defining an object with an associated first value and second value;
    (b) using the first value in association with the object during a predetermined clock cycle; and
    (c) using the second value in association with the object before or after the predetermined clock cycle.

2. A method as recited in claim 1, wherein the object is used to split up an expression into sub-expressions.

3. A method as recited in claim 2, wherein the sub-expressions are reused.

4. A method as recited in claim 1, wherein the first value is assigned to and read from the object during the predetermined clock cycle.

5. A method as recited in claim 1, wherein the programming language is adapted for programming a gate array.

6. A method as recited in claim 1, wherein the programming language includes Handel-C.

7. A computer program product for using a dynamic object in a programming language, comprising:
    (a) computer code for defining an object with an associated first value and second value;
    (b) computer code for using the first value in association with the object during a predetermined clock cycle; and
    (c) computer code for using the second value in association with the object before or after the predetermined clock cycle.

8. A computer program product as recited in claim 7, wherein the object is used to split up an expression into sub-expressions.

9. A computer program product as recited in claim 8, wherein the sub-expressions are reused.

10. A computer program product as recited in claim 7, wherein the first value is assigned to and read from the object during the predetermined clock cycle.

11. A computer program product as recited in claim 7, wherein the programming language is adapted for programming a gate array.

12. A computer program product as recited in claim 7, wherein the programming language includes Handel-C.

13. A system for using a dynamic object in a programming language, comprising:
    (a) logic for defining an object with an associated first value and second value;
    (b) logic for using the first value in association with the object during a predetermined clock cycle; and
    (c) logic for using the second value in association with the object before or after the predetermined clock cycle.

14. A system as recited in claim 13, wherein the object is used to split up an expression into sub-expressions.

15. A system as recited in claim 14, wherein the sub-expressions are reused.

16. A system as recited in claim 13, wherein the first value is assigned to and read from the object during the predetermined clock cycle.

17. A system as recited in claim 13, wherein the programming language is adapted for programming a gate array.

18. A system as recited in claim 13, wherein the programming language includes Handel-C.

\* \* \* \* \*

UNITED STATES PATENT AND TRADEMARK OFFICE
CERTIFICATE OF CORRECTION

PATENT NO.   : 6,691,301 B2
DATED        : February 10, 2004
INVENTOR(S)  : Bowen, Matt It is certified that error appears in the above-identified patent and that said Letters Patent is hereby corrected as shown below:

Drawings,
Insert the following Figs. 20A, 22A, 57A, 57A-1, 57A-2, 87B, 87C, 87D, 87E, 87F, 93 and 94 attached.

Signed and Sealed this

Seventh Day of March, 2006

JON W. DUDAS
*Director of the United States Patent and Trademark Office*